US008778235B2

(12) United States Patent
Ito et al.

(10) Patent No.: US 8,778,235 B2
(45) Date of Patent: Jul. 15, 2014

(54) COLORANT MULTIMER, COLORED CURABLE COMPOSITION, COLOR FILTER AND METHOD FOR PRODUCING THE SAME, AND SOLID-STATE IMAGE SENSOR, IMAGE DISPLAY DEVICE, LIQUID CRYSTAL DISPLAY DEVICE AND ORGANIC EL DISPLAY WITH THE COLOR FILTER

(75) Inventors: Junichi Ito, Haibara-gun (JP); Masaru Yoshikawa, Haibara-gun (JP); Yuki Mizukawa, Haibara-gun (JP); Kenta Ushijima, Haibara-gun (JP); Shinichi Kanna, Haibara-gun (JP); Haruki Inabe, Haibara-gun (JP); Yoshihiko Fujie, Haibara-gun (JP); Akiyoshi Goto, Haibara-gun (JP); Yushi Kaneko, Haibara-gun (JP); Hiroaki Idei, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/498,885

(22) PCT Filed: Sep. 28, 2010

(86) PCT No.: PCT/JP2010/067321
§ 371 (c)(1), (2), (4) Date: Mar. 28, 2012

(87) PCT Pub. No.: WO2011/040628
PCT Pub. Date: Apr. 7, 2011

(65) Prior Publication Data

US 2012/0187351 A1 Jul. 26, 2012

(30) Foreign Application Priority Data

| | | |
|---|---|---|
| Sep. 29, 2009 | (JP) | 2009-224960 |
| Sep. 30, 2009 | (JP) | 2009-228867 |
| Oct. 23, 2009 | (JP) | 2009-244465 |
| Nov. 26, 2009 | (JP) | 2009-269088 |
| Mar. 31, 2010 | (JP) | 2010-084604 |
| Jul. 30, 2010 | (JP) | 2010-172789 |
| Sep. 15, 2010 | (JP) | 2010-207215 |
| Sep. 21, 2010 | (JP) | 2010-210889 |

(51) Int. Cl.

| | |
|---|---|
| ***G02B 5/23*** | (2006.01) |
| ***C08F 2/50*** | (2006.01) |
| ***C09K 11/06*** | (2006.01) |
| ***C08F 220/60*** | (2006.01) |
| ***C08F 220/36*** | (2006.01) |
| ***C09B 69/10*** | (2006.01) |
| ***H05B 33/12*** | (2006.01) |
| ***G03F 7/00*** | (2006.01) |
| ***G03F 7/105*** | (2006.01) |
| ***C09B 57/10*** | (2006.01) |
| ***G02B 5/22*** | (2006.01) |
| *G03F 1/00* | (2012.01) |
| *G02F 1/1335* | (2006.01) |
| *H01L 27/32* | (2006.01) |
| *G03F 7/033* | (2006.01) |
| *G03F 7/027* | (2006.01) |

(52) U.S. Cl.
CPC . *C08F 2/50* (2013.01); *C09K 11/06* (2013.01); *C08F 220/60* (2013.01); *H01L 27/322* (2013.01); *G02F 1/133516* (2013.01); *C09K 2211/188* (2013.01); *C08F 220/36* (2013.01); *G03F 7/033* (2013.01); *G03F 7/027* (2013.01); *C09B 69/108* (2013.01); *H05B 33/12* (2013.01); *G03F 7/0007* (2013.01); *G03F 7/105* (2013.01); *C09K 2211/1408* (2013.01); *C09B 57/10* (2013.01); *G02B 5/22* (2013.01)
USPC ............ 252/586; 349/106; 430/7; 430/270.1; 430/281.1; 430/285.1; 526/241; 526/259; 526/265; 526/280; 526/312; 548/403

(58) Field of Classification Search
USPC ......... 252/586; 349/106; 430/7, 270.1, 281.1, 430/282.1, 285.1; 522/111; 524/606; 528/360; 548/402, 403; 525/165; 526/241, 259, 265, 280, 312
See application file for complete search history.

(56) References Cited

U.S. PATENT DOCUMENTS

| | | | | |
|---|---|---|---|---|
| 5,498,641 | A | 3/1996 | Urano et al. | |
| 6,106,999 | A | 8/2000 | Ogiso et al. | |
| 6,509,125 | B1 | 1/2003 | Ito et al. | |
| 2006/0210892 | A1 | 9/2006 | Sasamoto | |
| 2007/0112134 | A1* | 5/2007 | Seto | 525/165 |
| 2007/0117031 | A1 | 5/2007 | Mizukawa et al. | |
| 2008/0076044 | A1 | 3/2008 | Mizukawa et al. | |
| 2010/0055582 | A1* | 3/2010 | Mizukawa et al. | 430/7 |
| 2010/0233595 | A1 | 9/2010 | Takahashi et al. | |

FOREIGN PATENT DOCUMENTS

| | | | | |
|---|---|---|---|---|
| EP | 2 006 310 | A2 | 12/2008 | |
| JP | 6-75375 | A | 3/1994 | |
| JP | 11-352685 | A | 12/1999 | |
| JP | 11-352686 | A | 12/1999 | |
| JP | 2000-19729 | A | 1/2000 | |
| JP | 2000-19738 | A | 1/2000 | |
| JP | 3279035 | B2 | 4/2002 | |
| JP | 2002-134274 | * | 5/2002 | H05B 33/14 |
| JP | 2002-134274 | A | 5/2002 | |
| JP | 3309514 | B2 | 7/2002 | |
| JP | 2002-236360 | A | 8/2002 | |
| JP | 3324279 | B2 | 9/2002 | |
| JP | 2003-26950 | A | 1/2003 | |
| JP | 2005-284011 | A | 10/2005 | |
| JP | 2005-316012 | A | 11/2005 | |
| JP | 3736221 | B2 | 1/2006 | |
| JP | 2006-258916 | A | 9/2006 | |
| JP | 2007-138051 | A | 6/2007 | |
| JP | 2007-139906 | A | 6/2007 | |
| JP | 2010-37545 | A | 2/2010 | |

OTHER PUBLICATIONS

International Search Report for PCT/JP2010/067321 dated Dec. 7, 2010.

Office Action mailed on Nov. 19, 2013 from the Japanese Patent Office in Japanese Application No. 2009-224960.

Office Action dated Mar. 13, 2014 from the People's Republic of China Patent Office in a counterpart Chinese Application No. 201080043513.0.

Office Action dated May 13, 2014 in a counterpart Japanese Application No. 2010-210889.

Office Action dated May 13, 2014 in a counterpart Japanese Application No. 2010-207215.

* cited by examiner

*Primary Examiner* — Bijan Ahvazi

(74) *Attorney, Agent, or Firm* — Sughrue Mion, PLLC

(57) ABSTRACT

A colorant multimer includes, as a partial structure of a colorant moiety, a dipyrromethene metal complex compound or tautomer thereof obtained from:

(i) a dipyrromethene compound represented by the following Formula (M); and (ii) a metal or a metal compound:

Formula (M)

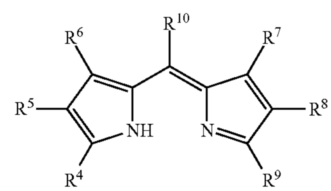

wherein in Formula (M), $R^4$, $R^5$, $R^6$, $R^7$, $R^8$, $R^9$, and $R^{10}$ each independently represent a hydrogen atom or a monovalent substituent.

12 Claims, 2 Drawing Sheets

COLORANT MULTIMER, COLORED CURABLE COMPOSITION, COLOR FILTER AND METHOD FOR PRODUCING THE SAME, AND SOLID-STATE IMAGE SENSOR, IMAGE DISPLAY DEVICE, LIQUID CRYSTAL DISPLAY DEVICE AND ORGANIC EL DISPLAY WITH THE COLOR FILTER

CROSS REFERENCE TO RELATED APPLICATIONS

This application is a National Stage of International Application No. PCT/JP2010/067321 filed Sep. 28, 2010, claiming priority based on Japanese Patent Application Nos. 2009-224960 filed Sep. 29, 2009, 2009-228867 filed Sep. 30, 2009, 2009-244465 filed Oct. 23, 2009, 2009-269088 filed Nov. 26, 2009, 2010-084604 filed Mar. 31, 2010, 2010-172789 filed Jul. 30, 2010, 2010-207215 filed Sep. 15, 2010, and 2010-210889 filed Sep. 21, 2010 the contents of all of which are incorporated herein by reference in their entirety.

TECHNICAL FIELD

The present invention relates to a colorant multimer, a colored curable composition, a color filter and a method for producing the same, and a solid-state image sensor, an image display device, a liquid crystal display device and an organic el display with the color filter.

BACKGROUND ART

In recent years, with the advancement of personal computers and wide-screen liquid crystal televisions, the demand for liquid crystal displays (LCDs), in particular for liquid crystal color displays has tended to increase. Further, due to the demand for much higher image quality, the popularization of organic EL displays has been eagerly awaited.

Meanwhile, the demand for solid-state image sensors such as CCD image sensors has been significantly growing in accordance with the popularization of digital cameras, camera-equipped mobile phones and the like. Color filters have been used as a key device of such displays or optical devices, and the demand for cost reduction of color filters has been increasing in conjunction with the demand for higher image quality.

A color filter used for an mage display device or a solid-state image sensor generally has a color pattern of three primary colors, red (R), green (G), and blue (B), and serves to color the transmitting light or separate it into the three primary colors.

Coloring agents used in the color filter are commonly required to have the following characteristics. That is, they are required to have preferable light absorption characteristics in view of color reproducibility, to exhibit no occurrence of optical disturbance such as light scattering responsible for lowering of contrast in liquid crystal displays or non-uniformity of an optical density responsible for color unevenness or rough feeling in solid-state image sensors, to have favorable resistance for the environmental conditions under which they are used, such as, for example, heat resistance, light fastness and resistance to moist heat, and to provide a large molar absorption coefficient and the possibility of thickness reduction.

Examples of the methods of manufacturing the color filter used for liquid crystal displays, solid-state image sensors, or the like include a pigment dispersing method. Specific examples of the pigment dispersing method include a method of manufacturing a color filter by the use of a photolithographic method using a colored radiation-sensitive composition, in which a pigment is dispersed in various photosensitive compositions. More specifically, a radiation-sensitive composition is coated on a substrate using a spin coater, a roll coater or the like, and is dried, thereby forming a coated film. The coated film is exposed in a pattern-wise manner and developed, thereby obtaining colored pixels. The operation is repeated in desired numbers of color hues, thereby manufacturing a color filter.

The above method has been widely used as a method of manufacturing a color filter for color displays or the like, because, in the method, the color filter, which is formed using a pigment, is stable against heat or light, and patterning is performed by a photolithographic method, so that positioning accuracy can sufficiently be secured.

Liquid crystal displays have been widely used as television screens, computer screens or other display devices, since liquid crystal displays are compact and achieve power-saving as display devices and have equivalent or better function compared with conventional display devices In recent years, the development of liquid crystal displays has expanded from application for computer screens or monitors, which have relatively small surface areas, to application for TV screens, which have large surface areas and require high image quality.

In the application for TV screens, higher image quality compared with conventional monitors, that is, improved contrast and color purity, has been demanded. In order to improve the contrast, photosensitive resin compositions for forming color filters are required to contain colorants (organic pigments or the like) having a smaller particle size. Furthermore, in order to improve color purity, it is important to increase the content of the colorants (organic pigments or the like) with respect to the solid content of the photosensitive resin compositions. However, conventional pigment dispersing methods are not sufficient for these requirements.

Furthermore, in recent years, higher definition in color filters for solid-state image sensors such as a CCD or the like has been demanded. Accordingly, micronization of pigments has been desired in order to suppress the color unevenness caused by coarse particles of pigments. Further, in a liquid crystal display, an organic EL display and the like, a color filter manufactured by the photolithographic method using a pigment dispersing method has the advantages that light fastness and heat resistance are excellent, but has the problems that a decrease in contrast or an increase in haze resulting from light scattering due to coarse particles of pigment arise. Therefore, in a color filter for a liquid crystal display, an organic EL display or the like, micronization of pigment particles has been desired.

However, since fine particles of a pigment are apt to aggregate, it is necessary to impart dispersibility to pigment. With an increase in definition, the size of a pattern tends to be micronized, but it is thought that it will be difficult to further micronize the pattern size, and to further enhance the resolution, by using the widely used pigment dispersing methods. One of the reasons for this is that, in a minute pattern, color unevenness is caused by coarse particles formed by aggregation of pigment particles. Accordingly, in recent years, a situation has been reached where the pigment dispersing methods, which have been widely used, are not necessarily suitable for use in, for example, solid-state image sensors requiring a minute pattern.

Under such circumstances, a technique using a dye in place of a pigment has been suggested (for example, see Japanese Patent Application Laid-Open (JP-A) No. 6-75375). When a dye is used in place of the pigment, color filters for solid-state image sensors are expected to achieve high resolution by solving the problems of color unevenness and rough feeling, whereas liquid crystal displays or organic EL displays are expected to achieve improvements in optical properties such as contrast or haze. In addition, the inkjet method using a dye generally has high jetting stability and is expected to achieve easy recovery of an ink jetting state by wiping or purging even when there is nozzle clogging associated with an increased ink viscosity or the like.

However, a dye-containing colored curable composition has other problems as follows.

(1) Dyes in a molecular dispersed state are generally poor in light fastness and heat resistance as compared to pigments forming molecular aggregates. In particular, there is a problem in that optical properties are changed due to a high-temperature process when forming a film of indium tin oxide (ITO) widely used as an electrode for liquid crystal displays or the like.

(2) Dyes in a molecular dispersed state are generally poor in solvent resistance as compared to pigments forming molecular aggregates.

(3) Dyes tend to inhibit a radical polymerization reaction, so there is difficulty in designing of a colored curable composition, for a system where radical polymerization is used as a curing means.

(4) Conventional dyes exhibit low solubility in an alkaline aqueous solution or organic solvent (hereinbelow, also referred to simply as "solvent"), and thus, it is difficult to obtain a colored curable composition with a desired spectrum.

(5) Dyes often exhibit interaction with other components in the colored curable composition, so it is difficult to control the solubility (developability) of the exposed parts and the non-exposed parts.

(6) When a molar absorption coefficient (∈) of the dye is low, a large amount of the dye needs to be added. Therefore, the amount of other components such as a polymerizable compound (monomer), a binder or photopolymerization initiator in the colored curable composition has to be relatively decreased, thereby reducing the curability, post-curing heat resistance, and developability of the composition.

Among these problems related to dyes, dipyrromethene metal complexes have been studied as dyes that solve the problems in item (1) above related to light fastness and heat resistance of dyes, and in item (6) above related to the molar absorption coefficient (∈) of dyes (for example, see U.S. Patent Publication No. 2008/0076044).

In a polymerizable composition that polymerizes with visible light, dipyrromethene metal complexes are used as a functional compound in addition to a sensitizer for a radical polymerization initiator (for example, see Japanese Patent Nos. 3279035, and 3324279, and JP-A Nos. 11-352685, 11-352686, 2000-19729, 2000-19738, and 2002-236360). It is reported that the dipyrromethene metal complexes have excellent light fastness and heat resistance, a high molar absorption coefficient (∈), and preferable light absorption characteristics in view of color reproducibility (for example, see U.S. Patent Application Publication No. 2008/0076044).

Because of these problems, it ha s been difficult hitherto to form a color pattern for high-definition color filters, which is composed of a fine thin film and has excellent resistance, using a dye. In addition, with regard to color filters for solid-state image sensors, a colored layer is required to be formed of a thin film having a thickness of 1 μm or less. Therefore, in order to achieve desired absorption, a large amount of the colorant needs to be added to the curable composition, consequently resulting in the aforementioned problems.

Further, with regard to a colored curable composition containing a dye, it has been pointed out that, when a heating treatment is applied after the formation of a film, color transfer readily occurs between adjacent differently color patterns or between stacked and overlapped layers. In addition to color transfer, pattern peeling readily takes place in a low-exposure dose region due to the decreased sensitivity, and a desired shape or color density cannot be obtained due to thermal sagging, elution upon development, or the like which is caused by the decrease in the relative amount of photosensitive components contributing to photolithographic properties.

As approaches to solve these problems, there have been conventionally proposed a variety of methods involving selecting the kind of initiators, increasing an addition amount of initiators, or the like (for example, see JP-A No. 2005-316012). Further, there has been disclosed a method of producing a color filter wherein a color pattern is formed, and then polymerization is carried out in an elevated exposure temperature state by irradiating light to the color pattern while heating a substrate, thus increasing a polymerization rate of the system (for example, see Japanese Patent No. 3309514). In addition, there has been disclosed a method of producing a color filter wherein light irradiation is carried out between a development treatment and a heating treatment, thereby preventing shape deformation of the color filter (for example, see JP-A No. 2006-258916).

Furthermore, the conventional dyes are problematic in that the dyes exhibit low developability in an alkaline solution, and thus a colored curable composition including such a dye exhibits low solubility (developability) in the non-exposed parts, which impairs pattern formation. As approaches to solve this problem, a method of polymerizing dyes by copolymerizing a monomer having a colorant group and a monomer having an alkali-soluble group in order to impart developability to a dye has been disclosed (for example, see JP-A Nos. 2007-139906 and 2007-138051, and Japanese Patent No 3736221).

SUMMARY OF INVENTION

The colored curable composition containing a dipyrromethene metal complex as a dye is required to have more excellent light fastness and heat resistance.

Further, as recited in the problem of item (2) above, it has been necessary to increase solvent resistance when a dye is used as a coloring component. Solvent resistance is a property whereby a colorant in a cured portion is held in a film without eluting in a solvent. When an RGB color filter is manufactured by a photolithographic method, in order to form each color pattern sequentially, a color pattern is covered with a resist liquid whose color hue is different from that of the color pattern. At this time, since the elution of the colorant component in a cured portion into a resist liquid for subsequent color causes the problem of color mixing, extremely high solvent resistance in the cured portion is required in the manufacturing process for a color filter. In this regard, dyes in a molecular dispersed state are inferior to pigments that form aggregates with strong intermolecular force in terms of the solvent resistance.

Further, in the manufacture of a color filter, since in some cases, after coating, exposure and development processes, a color pattern is subjected to a heat treatment in order to increase the curability in a cured portion, the fixability of the dye in the cured portion is also important. Since the dyes in a molecular dispersed state can move with relatively low thermal energy as compared to pigments that form molecular aggregates, color transfer of the dye readily occurs between adjacent differently colored patterns. Accordingly, the fixability of dyes in the cured portion has been a significant issue.

A first aspect of the present invention was made in view of the above circumstances, and is to achieve the following objects.

That is, a first object of the first aspect of the invention is to provide a colorant multimer that can form a cured film having excellent color purity, light fastness, heat resistance and solvent resistance, less color transfer, and favorable pattern formability.

A second object of the first aspect of the invention is to provide a colored curable composition that can form a cured film having excellent color purity, light fastness, heat resistance and solvent resistance, less color transfer, and favorable pattern formability.

A third object of the first aspect of the invention is to provide a color filter provided with a color pattern having excellent color purity, heat resistance and light fastness even in a thin film, and a method of manufacturing the color filter.

A second aspect of the invention was made in view of the above circumstances, and is to achieve the following objects.

That is, a first object of the second aspect of the invention is to provide a colored curable composition and a color resist that have excellent light fastness and heat resistance.

A second object of the second aspect of the invention is to provide a color filter having excellent heat resistance and light fastness, and a method of manufacturing the color filter.

A third object of the second aspect of the invention is to provide a solid-state image sensor and an image display device (such as a liquid crystal display or an organic EL display) that have a color filter having excellent heat resistance and light fastness.

As described above, the developability can be attained by using a copolymer of the monomer having a colorant group and a monomer having an alkali-soluble group. However, it was found that, when the copolymer is used in combination with a pigment dispersion in order to obtain the sufficient color density, light fastness and heat resistance, coating unevenness or color unevenness is caused. Further, in such a situation, when a pattern is formed, pattern shape is deteriorated or color unevenness is causes.

A third aspect of the invention provides a colored curable composition that can form a colored cured film in which color unevenness is suppressed.

Further, the third aspect of the invention provides a colored curable composition having favorable coating property and pattern formability when used in a photolithographic method.

The third aspect of the invention also provides a color filter in which color unevenness is suppressed, and a solid-state image sensor and an image display device, such as a liquid crystal display or an organic EL display, which have the color filter.

Moreover, the third aspect of the invention provides a color filter with favorable pattern shape, a method of manufacturing the color filter, and a solid-state image sensor and an image display device, such as a liquid display or an organic EL display, which have the color filter.

As the results of the intensive studies by the inventors, it has been found that dipyrromethene metal complex compounds having a specific structure have favorable hue and high absorption coefficient, and excellent solvent solubility and resistances such as heat resistance or light fastness. By introducing the dipyrromethene metal complex structure into a colorant multimer, specifically, by forming a colorant multimer as a polymerization component formed by introducing a polymerizable group into the dipyrromethene metal complex structure, a cured film that has high solvent resistance and can reduce color transfer can be obtained. Furthermore, as necessary, by introducing an alkali-soluble group into the colorant multimer, a cured film having excellent pattern formability (with less dependency on the concentration of alkaline developer) can be obtained. The first aspect of the invention was attained based on such findings.

The first aspect of the invention is as follows:

<1> A colorant multimer including, as a partial structure of a colorant moiety, a dipyrromethene metal complex compound or tautomer thereof obtained from:

(i) a dipyrromethene compound represented by the following Formula (M); and (ii) a metal or a metal compound:

Formula (M)

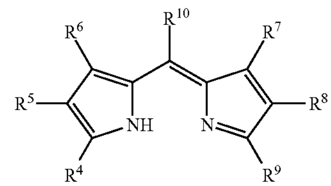

wherein in Formula (M) $R^4$, $R^5$, $R^6$, $R^7$, $R^8$, $R^9$, and $R^{10}$ each independently represent a hydrogen atom or a monovalent substituent.

<2> The colorant multimer according to <1>, wherein the dipyrromethene metal complex compound or tautomer thereof is represented by the following Formula (5) or (6):

Formula (5)

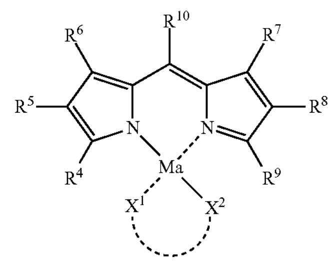

wherein in Formula (5), $R^4$ to $R^9$ each independently represent a hydrogen atom or a substituent; $R^{10}$ represents a hydrogen atom, a halogen atom, an alkyl group, an aryl group or a heterocyclic group; Ma represents a metal atom or a metal compound; $X^1$ represents a group that can be bonded to Ma; $X^2$ represents a group that neutralizes the charge of Ma; and $X^1$ and $X^2$ may be linked to each other to form a 5-, 6-, or 7-membered ring together with Ma:

Formula (6)

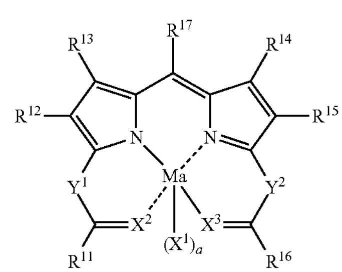

wherein in Formula (6), $R^{11}$ and $R^{16}$ each independently represent an alkyl group, an alkenyl group, an aryl group, a heterocyclic group, an alkoxy group, an aryloxy group, an alkylamino group, an arylamino group, or a heterocyclic amino group; $R^{12}$ to $R^{15}$ each independently represent a hydrogen atom or a substituent; $R^{17}$ represents a hydrogen atom, a halogen atom, an alkyl group, an aryl group, or a heterocyclic group; Ma represents a metal atom or a metal compound; $X^2$ and $X^3$ each independently represent NR' (wherein R' represents a hydrogen atom, an alkyl group, an alkenyl group, an aryl group, a heterocyclic group, an acyl group, an alkylsulfonyl group or an arylsulfonyl group), a nitrogen atom, an oxygen atom, or a sulfur atom; $Y^1$ and $Y^2$ each independently represent NR" (wherein R" represents a hydrogen atom, an alkyl group, an alkenyl group, an aryl group, a heterocyclic group, an acyl group, an alkylsulfonyl group, or an arylsulfonyl group), a nitrogen atom or a carbon atom; $R^{11}$ and $Y^1$ may be linked to each other to form a 5-, 6-, or 7-membered ring; $R^{16}$ and $Y^2$ may be linked to each other to form a 5-, 6-, or 7-membered ring; $X^1$ represents a group that can be bonded to Ma; and a represents 0, 1, or 2.

<3> The colorant multimer according to <1> or <2>, wherein the colorant multimer comprises at least one of constituent units represented by the following Formula (A), (B) or (C), or the colorant multimer is a colorant multimer represented by Formula (D):

Formula (A)

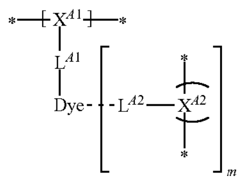

wherein in Formula (A), $X^{A1}$ represents a linking group formed by polymerization; $L^{A1}$ represents a single bond or a divalent linking group; "Dye" represents a colorant residue formed by removing any one to (m+1) hydrogen atoms from the dipyrromethene metal complex compound or tautomer thereof obtained from (i) the dipyrromethene compound represented by Formula (M) and (ii) a metal or a metal compound; $X^{A2}$ represents a linking group formed by polymerization; $L^{A2}$ represents a single bond or a divalent linking group; m represents an integer of from 0 to 3; and "Dye" and $L^{A2}$ may be linked to each other by a covalent bond, an ionic bond or a coordinate bond:

Formula (B)

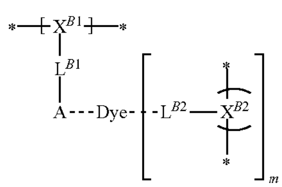

wherein in Formula (B), $X^{B1}$ represents a linking group formed by polymerization; $L^{B1}$ represents a single bond or a divalent linking group; A represents a group that can be bonded to "Dye" via an ionic bond or a coordinate bond; "Dye" represents a colorant residue having a group that can be bonded to A, via an ionic bond or a coordinate bond, on a substituent in the dipyrromethene metal complex compound or tautomer thereof obtained from (i) the dipyrromethene compound represented by Formula (M) and (ii) a metal or a metal compound; $X^{B2}$ represents a linking group formed by polymerization; $L^{B2}$ represents a single bond or a divalent linking group; m represents an integer of from 0 to 3; and "Dye" and $L^{B2}$ may be linked to each other by a covalent bond, an ionic bond or a coordinate bond:

$$*\!-\!\!\left[\text{Dye-}(L^{C1})n\right]\!\!-\!* \qquad \text{Formula (C)}$$

wherein in Formula (C), $L^{C1}$ represents a single bond or a divalent linking group; "Dye" represents a colorant residue formed by removing any two of hydrogen atoms from the dipyrromethene metal complex compound or tautomer thereof obtained from (i) the dipyrromethene compound represented by Formula (M) and (ii) a metal or a metal compound; and n represents an integer of from 1 to 4:

$$(L^{D1})\!\!-\!\!(\text{Dye})_m \qquad \text{Formula (D)}$$

wherein in Formula D, $L^{D1}$ represents an m-valent linking group; m represents an integer of from 2 to 100, and "Dye" represents a colorant residue formed by removing any one hydrogen atom from the dipyrromethene metal complex compound or tautomer thereof obtained from (i) the dipyrromethene compound represented by Formula (M) and (ii) a metal or a metal compound.

<4> The colorant multimer according to <3>, wherein the constituent unit represented by Formula (A) is derived from a colorant monomer represented by the following Formula (1):

Formula (1)

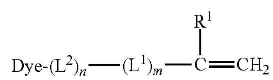

wherein in Formula (1), $R^1$ represents a hydrogen atom, a halogen atom, an alkyl group or an aryl group; $L^1$ represents —N($R^2$)C(═O)—, —OC(═O)—, —C(═O)N($R^2$)—, —C(═O)O—, a group represented by the following Formula (2), a group represented by the following Formula (3), or a group represented by the following Formula (4); $L^2$ represents a divalent linking group; m and n each independently represent 0 or 1; "Dye" represents a colorant residue formed by removing any one hydrogen atom from the dipyrromethene metal complex compound or tautomer thereof obtained from (i) the dipyrromethene compound represented by Formula (M) and (ii) a metal or a metal compound; and $R^2$ represents a hydrogen atom, an alkyl group, an aryl group or a heterocyclic group:

Formula (2)

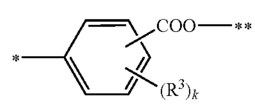

Formula (3)

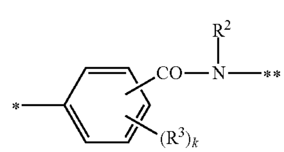

Formula (4)

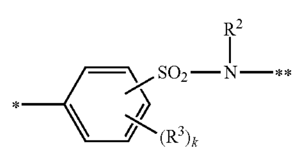

wherein, $R^2$ in Formulae (3) and (4) independently represents a hydrogen atom, an alkyl group, an aryl group or a heterocyclic group; $R^3$ in Formulae (2) to (4) independently represents a hydrogen atom or a substituent; k in Formulae (2) to (4) independently represents an integer of from 0 to 4; * in Formulae (2) to (4) independently represents a position to which the —C($R^1$)═$CH_2$ group in Formula (1) is linked; and ** in Formulae (2) to (4) independently represents a position to which $L^2$ or "Dye" (when n represents 0) in Formula (1) is linked.

<5> The colorant multimer according to <4>, further comprising, as a copolymerization component, a monomer having a terminal ethylenically unsaturated bond and having a structure different from that of the colorant monomer represented by Formula (1).

<6> The colorant multimer according to any one of <2> to <5>, wherein Ma in Formula (5) or Formula (6) is at least one of Zn, Co, V═O or Cu.

<7> The colorant multimer according to any one of <2> to <5>, wherein Ma in Formula (5) or Formula (6) is Zn.

<8> The colorant multimer according to any one of <1> to <7>, wherein the colorant multimer has an alkali-soluble group.

<9> The colorant multimer according to <8>, wherein at least one selected from the group consisting of the colorant multimer comprising at least one of the constituent units represented by Formula (A), (B) or (C), the colorant multimer represented by Formula (D), the colorant monomer represented by Formula (1), and the monomer having a terminal ethylenically unsaturated bond and having a structure different from that of the colorant monomer represented by Formula (1), has the alkali-soluble group.

<10> The colorant multimer according to <8> or <9>, wherein the colorant multimer comprising at least one of the constituent units represented by Formula (A), (B) or (C), the colorant multimer represented by Formula (D), or "Dye" in Formula (1), has the alkali-soluble group.

<11> A colored curable composition comprising the colorant multimer according to any one of <1> to <10>.

<12> A color filter formed by using the colored curable composition according to <11>.

<13> A method of manufacturing a color filter, comprising coating the colored curable composition according to <11> on a substrate, exposing the coated film through a mask, and developing the exposed film to form a pattern image.

Since the color filter according to the first aspect of the invention is formed using a colorant multimer that can form a cured film having excellent color purity, light fastness heat resistance, solvent resistance and pattern formability, in which color transfer is suppressed, the invention of the first aspect of the invention is particularly useful for forming a color filter for a solid-state image sensor in which a pixel pattern is formed in a thin film (for example, at a thickness of 1 μm or less), and high definition with a minute size of 2 μm or less (for example, a side length of the pixel pattern viewed from the substrate normal direction is from 0.5 to 2.0 μm) is required, and a favorable rectangular cross-sectional profile is required, or a color filter for a liquid crystal display device, in which sufficient color purity and weather fastness are required in a pixel pattern formed in a thin film.

Further, as the results of detailed studies on various colorants, it has found that a colorant multimer, in which a specific colorant was multimerized and a polymerizable group was further added, can provide a cured film that has excellent solvent solubility and resistances such as heat resistance or light fastness, has high resistance to solvent and can suppress color transfer, while maintaining favorable hue and high absorption coefficient, and that a cured film having favorable pattern formability (less dependency on the concentration of alkaline developer) can be provided by introducing an alkali-soluble group into the colorant multimer as necessary. The second aspect of the invention was attained based on such findings.

The second aspect of the invention are as follows:

<1> A colored curable composition comprising (A) a colorant multimer including a polymerizable group and a group derived from at least one of an azo colorant or a dipyrromethene colorant, and (B) a polymerizable compound.

<2> The colored curable composition according to <1>, wherein the colorant multimer comprises, as a repeating unit, a constituent unit including a polymerizable group and a constituent unit including a group derived from at least one of an azo colorant or a dipyrromethene colorant.

<3> The colored curable composition according to <1> or <2>, wherein the polymerizable group is an ethylenically unsaturated group.

<4> The colored curable composition according to any one of <1> to <3>, wherein the dipyrromethene colorant is a compound obtained by coordinating a compound represented by the following Formula (N) to a metal or a metal compound:

Formula (N)

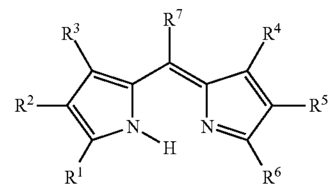

wherein in Formula (N), $R^1$ to $R^6$ each independently represent a hydrogen atom or a monovalent substituent; and $R^7$ represents a hydrogen atom, a halogen atom, an alkyl group, an aryl group or a heterocyclic group.

<5> The colored curable composition according to <4>, wherein the dipyrromethene colorant is a dipyrromethene colorant represented by the following Formula (a):

Formula (a)

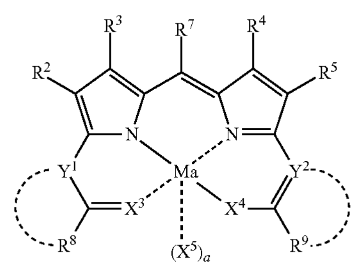

wherein in Formula (a), $R^2$ to $R^5$ each independently represent a hydrogen atom or a monovalent substituent; $R^7$ represents a hydrogen atom, a halogen atom, an alkyl group, an aryl group, or a heterocyclic group; Ma represents a metal or a metal compound; $X^3$ and $X^4$ each independently represent NR (wherein R represents a hydrogen atom, an alkyl group, an alkenyl group, an aryl group, a heterocyclic group, an acyl group, an alkylsulfonyl group, or an arylsulfonyl group), an oxygen atom or a sulfur atom; $Y^1$ represents NRc (wherein Rc represents a hydrogen atom, an alkyl group, an alkenyl group, an aryl group, a heterocyclic group, an acyl group, an alkylsulfonyl group, or an arylsulfonyl group), or a nitrogen atom;

$Y^2$ represents a nitrogen atom or a carbon atom; $R^8$ and $R^9$ each independently represent an alkyl group, an alkenyl group, an aryl group, a heterocyclic group, an alkoxy group, an aryloxy group, an alkylamino group, an arylamino group or a heterocyclic amino group; $R^8$ and $Y^1$ may be linked to each other to form a 5-, 6- or 7-membered ring; $R^9$ and $Y^2$ may be linked to each other to form a 5-, 6- or 7-membered ring; $X^5$ represents a group that can be bonded to Ma; and a represents 0, 1, or 2.

<6> The colored curable composition according to any one of <1> to <5>, further comprising (C) a polymerization initiator and (D) a solvent.

<7> A color resist comprising the colored curable composition according to any one of <1> to <6>, which is used for forming a color pixel by a photolithographic method.

<8> A color filter formed by using the colored curable composition according to any one of <1> to <6>.

<9> A method of manufacturing a color filter, comprising:

forming colored layer by coating the colored curable composition according to any one of <1> to <6> on a support;

exposing the colored layer in a pattern-wise manner through a mask to form a latent image; and developing the colored layer having the latent image therein to form a pattern.

<10> The method of manufacturing a color filter according to <9>, further comprising irradiating the formed pattern after the development with ultraviolet rays.

<11> A solid-state image sensor having the color filter according to <8>.

<12> An image display device having the color filter according to <8>.

Further, as the results of detailed studies on various colorants, it has found that the occurrence of color unevenness can be suppressed by using a colorant group-containing resin having a specific repeating unit and a pigment dispersion, and that the coating property and pattern formability can be improved in the manufacture of a color filter using a photolithographic method by using a colored curable composition containing the resin and the pigment dispersion. The third aspect of the invention is as follows:

<1> A colored curable composition comprising:

(A) a resin having a repeating unit represented by Formula (X) and a repeating unit by the Formula (Y);

(B) a pigment dispersion;

(C) a photopolymerization initiator; and (D) a polymerizable compound,

Formula (X)

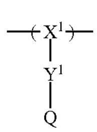

wherein in Formula (X), $X^1$ represents a polymer main chain; $Y^1$ represents a single bond or a divalent linking group; and Q represents a phthalocyanine colorant residue or a dipyrromethene colorant residue, Formula (Y)

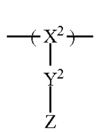

wherein in Formula (Y), $X^2$ represents a polymer main chain; $Y^2$ represents a divalent linking group; and Z represents an alkali-soluble group.

<2> The colored curable composition according to <1>, wherein a pigment contained in (B) the pigment dispersion is a pigment selected from a blue pigment, a violet pigment, or a mixture thereof.

<3> A color filter having a color pattern formed by using the colored curable composition according to <1> or <2>.

<4> A method of manufacturing a color filter, comprising:

forming colored layer by coating the colored curable composition according to <1> or <2> on a support;

exposing the colored layer in a pattern-wise manner through a mask; and developing the colored layer after exposure to form a pattern image.

<5> The method of manufacturing a color filter according to <4>, further comprising irradiating the color pattern after development with ultraviolet rays.

<6> A solid-state image sensor having the color filter according to <3>.

<7> An image display device having the color filter according to <3>.

<8> A liquid crystal display having the color filter according to <3>.

<9> An organic EL display having the color filter according to <3>.

According to the first aspect of the invention, there is provided a colorant multimer that has excellent color purity, light fastness, heat resistance and solvent resistance, has less color transfer, and can form a cured film having favorable pattern formability.

According to the first aspect of the invention, there is also provided a colored curable composition that has excellent color purity, light fastness, heat resistance and solvent resistance, has less color transfer, and can form a cured film having favorable pattern formability.

Furthermore, according to the first aspect of the invention, there is provided a color filter provided with a color pattern having excellent color purity, heat resistance and light fastness even in a thin film, and a method of manufacturing the color filter.

The color filter and the method of manufacturing the color filter can be provided using the colored curable composition containing the colorant multimer of the first aspect of the present invention.

According to the second aspect of the invention, there is provided a colored curable composition and a color resist that have excellent light fastness and heat resistance.

According to the second aspect of the invention, there is also provided a color filter having excellent heat resistance and light fastness, and a method of manufacturing the color filter.

In addition, according to the second aspect of the invention, there is provided a solid-state image sensor and an image display device (such as a liquid crystal display or an organic EL display) that have a color filter having excellent heat resistance and light fastness.

According to the third aspect of the invention, there is provided a colored curable composition that can form a colored cured film in which color unevenness is suppressed.

According to the third aspect of the invention, there is also provided a colored curable composition having favorable coating property and pattern formability when used in a photolithographic method.

In addition, according to the third aspect of the invention, there is provided a color filter in which color unevenness is suppressed, and a solid-state image sensor and an image display device, such as a liquid crystal display or an organic EL display, which have the color filter.

Moreover, according to the third aspect of the invention, there is provided a color filter with favorable pattern shape, a method of manufacturing the color filter, and a solid-state image sensor and an image display device, such as a liquid display or an organic EL display, which have the color filter.

MODES FOR CARRYING OUT THE INVENTION

First Aspect of the Invention

Figure 1:
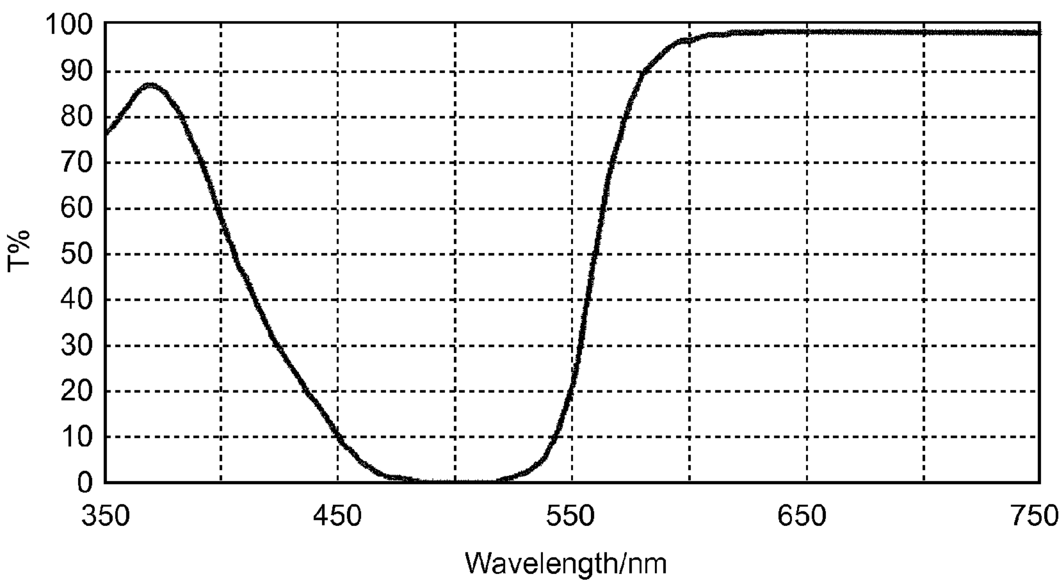
FIG. 1 shows an example of a solution transmission spectrum of a colorant monomer according to an Example of the second aspect of the present invention in ethyl acetate.

Hereinbelow, a colorant multimer, a colored curable composition, a color filter, and a method of manufacturing the color filter according to the first aspect of the invention are described in detail. Although the explanation of the constituent features described hereinbelow are made based on representative embodiments of the present invention, the present invention is not limited thereto. Further, the numeral range expressed by using "-" in the present specification represents a range including the numerical values described in front of and behind "-", as the minimum value and the maximum value.

Colorant Multimer

The colorant multimer of the first aspect of the invention is a colorant multimer that includes, as a partial structure, a colorant skeleton derived from a dipyrromethene metal complex compound described below. The method of introducing the colorant skeleton derived from a dipyrromethene metal complex compound into the colorant multimer of the first aspect of the invention can be arbitrary selected. Examples of the method include a method in which a multimer is obtained by polymerizing or copolymerizing a polymerizable monomer into which the colorant skeleton has been introduced, and a method in which, after a multimer is formed, the colorant skeleton is introduced into the multimer by a polymerization reaction or the like.

Preferable examples of the colorant multimer include a colorant multimer including at least one of the constituent units represented by Formula (A), (B) or (C); a colorant multimer represented by Formula (D); and a colorant multimer containing the colorant monomer represented by Formula (1) as a polymerizable component.

Preferable Properties of Colorant Multimer of the Invention

Since the colorant multimer of the invention can form a cured film having excellent color purity, light fastness, heat resistance and solvent resistance, less color transfer, and favorable pattern formability, the colorant multimer can be suitably used for colored curable composition for forming the color pattern of a color filter. Therefore, when the colorant multimer of the invention is used for a colored curable composition, the colorant multimer of the invention preferably has an alkali-soluble group in order to improve formability of the color pattern.

The method of introducing an alkali-soluble group into the colorant multimer of the invention is not particularly limited, and examples thereof include a method in which an alkali-soluble group is introduced by synthesizing a colorant multimer using a monomer having an alkali-soluble group, and a method in which an alkali-soluble group is introduced after synthesizing a colorant multimer.

When a colorant multimer is synthesized using the monomer having an alkali-soluble group, at least one of the multimer containing at least one of the constituent units represented by Formula (A), (B) or (C), the colorant multimer represented by Formula (D), the colorant monomer represented by Formula (1), or the monomer having a terminal ethylenically unsaturated bond and having a structure different from that of the colorant monomer represented by Formula (1), has an alkali-soluble group. When the constituent unit represented by Formula (A), Formula (B), or Formula (C), or the colorant monomer represented by Formula (1) is a monomer having an alkali-soluble group, the "Dye" moiety (colorant residue) may have the alkali-soluble group. From the viewpoint of synthesis suitability, it is preferable that at least one of monomers having ethylenically unsaturated bond contained as a copolymerization component has an alkali-soluble group, rather than the monomer that forms the constituent unit having the "Dye" moiety (colorant residue).

When the colorant multimer of the invention is used for a colored curable composition, from the viewpoint of formability of the color pattern, the colorant multimer preferably contains the alkali-soluble group such that the colorant multimer has an acid value of from 10 to 400 mgKOH/g, more preferably an acid value of from 30 to 300 mgKOH/g and still more preferably an acid value of from 50 to 200 mgKOH/g.

In the present invention, the acid value is determined by the method according to JIS Standard (JIS K 0070: 1992).

The solubility of the colorant multimer of the invention in an alkaline solution (pH of from 9 to 15) is preferably from 0.1% by mass to 80% by mass, more preferably from 0.5% by mass to 50% by mass, and still more preferably from 1% by mass to 30% by mass. When the solubility of the colorant multimer of the invention in an alkaline solution is within the above range, a suitable shape can be obtained and residues on a substrate can be reduced when the multimer of the invention is used for a color resist or the like, which requires alkali development.

It is preferable that the colorant multimer of the invention is soluble in an organic solvent. Examples of the organic solvent include esters (such as methyl 3-ethoxypropionate, ethyl 3-ethoxypropionate, ethyl lactate, butyl acetate or methyl 3-methoxypropionate); ethers (such as methyl cellosolve acetate, ethyl cellosolve acetate, propyleneglycol monomethyl ether or propyleneglycol monomethyl ether acetate); ketones (such as methyl ethyl ketone, cyclohexanone, 2-heptanone or 3-heptanone); and aromatic hydrocarbons (such as toluene or xylene). The colorant multimer is preferably soluble in the organic solvent at 1% by mass to 50% by mass, more preferably at 5% by mass to 40% by mass, and still more preferably at 10% by mass to 30% by mass. Within the above range, when the multimer of the invention is used for a color resist or the like, favorable coated surface can be obtained and reduction in concentration due to elution after coating a coating liquid for the other color can be suppressed.

The Tg (glass transition temperature) of the colorant multimer of the invention is preferably 50° C. or more, and more preferably 100° C. or more. A temperature determined by thermogravimetric analysis (TGA measurement) at which 5% of weight of the colorant multimer is lost is preferably 120° C. or more, more preferably 150° C. or more, and still more preferably 200° C. or more. When the temperature is within the above range, the change in the concentration due to heating when the multimer of the invention is used for a color resist or the like can be reduced.

The maximal absorption wavelength ($\lambda$max) of the colorant multimer of the inventions is preferably from 510 nm to 590 nm, more preferably from 530 nm to 570 nm, and still more preferably from 540 nm to 555 nm. When the λmax is within the above range, a color filter with favorable color reproducibility can be obtained when the multimer of the invention is used for a color resist or the like. The absorbance of the colorant multimer of the invention at the maximal absorption wavelength (λmax) is preferably 1,000 times or more the absorbance at 450 nm, more preferably 10,000 or more times the absorbance at 450 nm, and still more preferably 100,000 or more times the absorbance at 450 nm. When the absorbance is within the above range, a color filter with higher transmittance can be obtained when the multimer of the invention is used for a color resist or the like, particularly in a blue color filter.

The absorption coefficient per unit weight of the colorant multimer of the invention (hereinbelow, denoted as ∈'. ∈'=∈/average molecular weight; unit: L/g·cm) is preferably 30 or more, more preferably 60 or more, and still more preferably 100 or more. When the absorption coefficient per unit weight is within the above range, a color filter with favorable color reproducibility can be obtained when the multimer of the invention is used for a color resist or the like.

It is more preferable that the colorant multimer of the invention satisfies both the preferable range of the maximum absorption wavelength (λmax) and the preferable range of the absorption coefficient per unit weight.

Structure of the Colorant Multimer of the Invention

Hereinbelow, the structure of the colorant multimer of the invention is described in detail.

The colorant multimer of the invention includes a colorant skeleton derived from a dipyrromethene metal complex compound or tautomer thereof obtained from (i) the dipyrromethene compound represented by the following Formula (M) and (ii) a metal or a metal compound. Specifically, the colorant multimer of the invention preferably includes a colorant skeleton derived from the dipyrromethene metal complex compound represented by the following Formula (5) or the dipyrromethene metal complex compound represented by the following Formula (6).

Dipyrromethene Metal Complex Compound and Tautomer Thereof Obtained from (i) the Dipyrromethene Compound Represented by Formula (M) and (ii) a Metal or a Metal Compound An aspect of the colorant multimer of the invention is a colorant multimer that includes, as a colorant moiety, a complex (hereinbelow, sometime referred to as a specific complex of the present invention), in which a compound (dipyrromethene compound) represented by Formula (M) or tautomer thereof is coordinated to a metal or a metal compound. Here, the dipyrromethene metal complex compound according to the present invention includes tautomers thereof unless otherwise specified.

Formula (M)

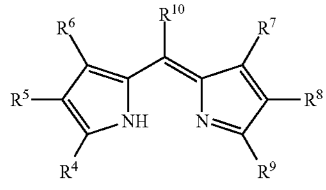

In Formula (M), $R^4$, $R^5$, $R^6$, $R^7$, $R^8$, $R^9$ and $R^{10}$ each independently represent a hydrogen atom or a monovalent substituent.

It is preferable that, in Formula (M), $R^4$ to $R^9$ each independently represent a hydrogen atom or a monovalent substituent, and $R^{10}$ represents a hydrogen atom, a halogen atom, an alkyl group, an aryl group or a heterocyclic group.

Examples of the monovalent substituent represented by $R^4$ to $R^9$ in Formula (M) include a halogen atom (such as a fluorine atom, a chlorine atom or a bromine atom), an alkyl group (a straight-chain, branched-chain or cyclic alkyl group having preferably 1 to 48, more preferably 1 to 24 carbon atoms, such as a methyl group, an ethyl group, a propyl group, an isopropyl group, a butyl group, a t-butyl group, a pentyl group, a hexyl group, a heptyl group, an octyl group, a 2-ethylhexyl group, a dodecyl group, a hexadecyl group, a cyclopropyl group, a cyclopentyl group, a cyclohexyl group, a 1-norbornyl group or a 1-adamantyl group), an alkenyl group (an alkenyl group having preferably 2 to 48, more preferably 2 to 18 carbon atoms, such as a vinyl group, an allyl group or a 3-buten-1-yl group), an aryl group (an aryl group having preferably 6 to 48, more preferably 6 to 24 carbon atoms, such as a phenyl group or a naphthyl group), a heterocyclic group (a heterocyclic group having preferably 1 to 32, more preferably 1 to 18 carbon atoms, such as a 2-thienyl group, a 4-pyridyl group, a 2-furyl group, a 2-pyrimidinyl group, a 1-pyridyl group, a 2-benzothiazolyl group, a 1-imidazolyl group, a 1-pyrazolyl group or a benzotriazol-1-yl group), a silyl group (a silyl group having preferably 3 to 38, more preferably 3 to 18 carbon atoms, such as a trimethylsilyl group, a triethylsilyl group, a tributylsilyl group, a t-butyldimethylsilyl group or a t-hexyldimethylsilyl group), a hydroxy group, a cyano group, a nitro group, an alkoxy group (an alkoxy group having preferably 1 to 48, more preferably 1 to 24 carbon atoms, such as a methoxy group, an ethoxy group, a 1-butoxy group, a 2-butoxy group, an isopropoxy group, a t-butoxy group, a dodecyloxy group, or a cycloalkyloxy group such as a cyclopentyloxy group or a cyclohexyloxy group), an aryloxy group (an aryloxy group having preferably 6 to 48, more preferably 6 to 24 carbon atoms, such as a phenoxy group or a 1-naphthoxy group), a heterocyclic oxy group (a heterocyclic oxy group having preferably 1 to 32, more preferably 1 to 18 carbon atoms, such as a 1-phenyltetrazole-5-oxy group or a 2-tetrahydropyranyloxy group), a silyloxy group (a silyloxy group having preferably 1 to 32, more preferably 1 to 18 carbon atoms, such as a trimethylsilyloxy group, a t-butyldimethylsilyloxy group or a diphenylmethylsilyloxy group), an acyloxy group (an acyloxy group having preferably 2 to 48, more preferably 2 to 24 carbon atoms, such as an acetoxy group, a pivaloyloxy group, a benzoyloxy group or a dodecanoyloxy group), an alkoxycarbonyloxy group (an alkoxycarbonyloxy group having preferably 2 to 48, more preferably 2 to 24 carbon atoms, such as an ethoxycarbonyloxy group, a t-butoxycarbonyloxy group, or a cycloalkyloxycarbonyloxy group such as a cyclohexyloxycarbonyloxy group), an aryloxycarbonyloxy group (an aryloxycarbonyloxy group having preferably 7 to 32, more preferably 7 to 24 carbon atoms, such as a phenoxycarbonyloxy group), a carbamoyloxy group (a carbamoyloxy group having preferably 1 to 48, more preferably 1 to 24 carbon atoms, such as an N,N-dimethylcarbamoyloxy group, an N-butylcarbamoyloxy group, an N-phenylcarbamoyloxy group or an N-ethyl-N-phenylcarbamoyloxy group), a sulfamoyloxy group (a sulfamoyloxy group having preferably 1 to 32, more preferably 1 to 24 carbon atoms, such as an N,N-diethylsulfamoyloxy group or an N-propylsulfamoyloxy group), an alkylsulfonyloxy group (an alkylsulfonyloxy group having preferably 1 to 38, more preferably 1 to 24 carbon atoms, such as a methylsulfonyloxy group, a hexadecylsulfonyloxy group or a cyclohexylsulfonyloxy group), an arylsulfonyloxy group (an arylsulfonyloxy group having preferably 6 to 32, more preferably 6 to 24 carbon atoms, such as a phenylsulfonyloxy group), an acyl group (an acyl group having preferably 1 to 48, more preferably 1 to 24 carbon atoms, such as a formyl group, an acetyl group, a pivaloyl group, a benzoyl group, a tetradecanoyl group or a cyclohexanoyl group), an alkoxycarbonyl group (an alkoxycarbonyl group having preferably 2 to 48, more preferably 2 to 24 carbon atoms, such as a methoxycarbonyl group, an ethoxycarbonyl group, an octadecyloxycarbonyl group, a cyclohexyloxycarbonyl group or a 2,6-di-tert-butyl-4-methylcyclohexyloxycarbonyl group), an aryloxycarbonyl group (an aryloxycarbonyl group having preferably 7 to 32, more preferably 7 to 24 carbon atoms, such as a phenoxycarbonyl group), a carbamoyl group (a carbamoyl group having preferably 1 to 48, more preferably 1 to 24 carbon atoms, such as a carbamoyl group, an N,N-diethylcarbamoyl group, an N-ethyl-N-octylcarbamoyl group, an N,N-dibutylcarbamoyl group, an N-propylcarbamoyl group, an N-phenylcarbamoyl group, a N-methyl-N-phenylcarbamoyl group or an N,N-dicyclohexylcarbamoyl group), an amino group (an amino group having preferably 32 or less, more preferably 24 or less carbon atoms, such as an amino group, a methylamino group, an N,N-dibutylamino group, a tetradecylamino group, a 2-ethylhexylamino group or a cyclohexylamino group), an anilino group (an anilino group having preferably 6 to 32, more preferably 6 to 24 carbon atoms, such as an anilino group or an N-methylanilino group), a heterocyclic amino group (a heterocyclic amino group having preferably 1 to 32, more preferably 1 to 18 carbon atoms, such as a 4-pyridylamino group), a carbonamido group (a carbonamido group having preferably 2 to 48, more preferably 2 to 24 carbon atoms, such as an acetamido group, a benzamido group, a tetradecanamido group, a pivaloylamido group or a cyclohexaneamido group), an ureido group (an ureido group having preferably 1 to 32, more preferably 1 to 24 carbon atoms, such as an ureido group, an N,N-dimethylureido group or an N-phenylureido group), an imido group (an imido group having preferably 36 or less, more preferably 24 or less carbon atoms, such as an N-succinimido group or an N-phthalimido group), an alkoxycarbonylamino group (an alkoxycarbonylamino group having preferably 2 to 48, more preferably 2 to 24 carbon atoms, such as a methoxycarbonylamino group, an ethoxycarbonylamino group, a t-butoxycarbonylamino group, an octadecyloxycarbonylamino group or a cyclohexyloxycarbonylamino group), an aryloxycarbonylamino group (an aryloxycarbonylamino group having preferably 7 to 32, more preferably 7 to 24 carbon atoms, such as an phenoxycarbonylamino group), a sulfonamido group (a sulfonamido group having preferably 1 to 48, more preferably 1 to 24 carbon atoms, such as a methanesulfonamido group, a butanesulfonamido group, a benzenesulfonamido group, a hexadecanesulfonamido group or a cyclohexanesulfonamido group), a sulfamoylamino group (a sulfamoylamino group having preferably 1 to 48, more preferably 1 to 24 carbon atoms, such as an N,N-dipropylsulfamoylamino group or an N-ethyl-N-dodecylsulfamoylamino group), an azo group (an azo group having preferably 1 to 32, more preferably 1 to 24 carbon atoms, such as a phenylazo group or a 3-pyrazolylazo group), an alkylthio group (an alkylthio group having preferably 1 to 48, more preferably 1 to 24 carbon atoms, such as a methylthio group, an ethylthio group, an octylthio group or a cyclohexylthio group), an arylthio group (an arylthio group having preferably 6 to 48, more preferably 6 to 24 carbon atoms, such as a phenylthio group), a heterocyclic thio group (a heterocyclic thio group having preferably 1 to 32, more preferably 1 to 18 carbon atoms, such as a 2-benzothiazolylthio group, a 2-pyridylthio group or a 1-phenyltetrazolylthio group), an alkylsulfinyl group (an alkylsulfinyl group having preferably 1 to 32, more preferably 1 to 24 carbon atoms, such as a dodecanesulfinyl group), an arylsulfinyl group (an arylsulfinyl group having preferably 6 to 32, more preferably 6 to 24 carbon atoms, such as a phenylsulfinyl group), an alkylsulfonyl group (an alkylsulfonyl group having preferably 1 to 48, more preferably 1 to 24 carbon atoms, such as a methylsulfonyl group, an ethylsulfonyl group, a propylsulfonyl group, a butylsulfonyl group, an isopropylsulfonyl group, a 2-ethylhexylsulfonyl group, a hexadecylsulfonyl group, an octylsulfonyl group or a cyclohexylsulfonyl group), an arylsulfonyl group (an arylsulfonyl group having preferably 6 to 48, more preferably 6 to 24 carbon atoms, such as a phenylsulfonyl group or a 1-naphthylsulfonyl group), a sulfamoyl group (a sulfamoyl group having preferably 32 or less, more preferably 24 or less carbon atoms, such as a sulfamoyl group, an N,N-dipropylsulfamoyl group, an N-ethyl-N-dodecylsulfamoyl group, an N-ethyl-N-phenylsulfamoyl group or an N-cyclohexylsulfamoyl group), a sulfo group, a phosphonyl group (a phosphonyl group having preferably 1 to 32, more preferably 1 to 24 carbon atoms, such as a phenoxyphosphonyl group, an octyloxyphosphonyl group or a phenylphosphonyl group) and a phosphinoylamino group (a phosphinoylamino group having preferably 1 to 32, more preferably 1 to 24 carbon atoms, such as a diethoxyphosphinoylamino group or an dioctyloxyphosphinoylamino group).

When the monovalent group represented by $R^4$ to $R^9$ is a group that may further be substituted, the monovalent group may further be substituted by any of the monovalent substituent groups in $R^4$ to $R^9$ above. When the monovalent group has two or more substituents, these substituents may be the same as or different from one another.

In Formula (M), $R^4$ and $R^5$ may be linked to each other to form a 5-membered 5 to 7-membered saturated ring or a 5-membered to 7-membered unsaturated ring; $R^5$ and $R^6$ may be linked to each other to form a 5-membered to 7-membered saturated ring or a 5-membered to 7-membered unsaturated ring; $R^7$ and $R^8$ may be linked to each other to form a 5-membered to 7-membered saturated ring or a 5-membered to 7-membered unsaturated ring; and $R^8$ and $R^9$ may be linked to each other to form a 5-, 6- or 7-membered saturated ring or a 5-, 6- or 7-membered unsaturated ring. When the 5-, 6- or 7-membered saturated or unsaturated ring has a substituent, the substituent may be any of the monovalent substituent groups in $R^4$ to $R^9$ above. When the 5-, 6- or 7-membered saturated or unsaturated ring has two or more substituents, these substituents may be the same as or different from one another.

Examples of the 5-, 6- or 7-membered saturated or unsaturated ring include unsubstituted 5-, 6- or 7-membered saturated or unsaturated rings include a pyrrole ring, a furan ring, a thiophene ring, a pyrazole ring, an imidazole ring, a triazole ring, an oxazole ring, a thiazole ring, a pyrrolidine ring, a piperidine ring, a cyclopentene ring, a cyclohexene ring, a benzene ring, a pyridine ring, a pyrazine ring or a pyridazine ring. Among these, a benzene ring and a pyridine ring are preferable.

In Formula (M), $R^{10}$ preferably represents a hydrogen atom, a halogen atom, an alkyl group, an aryl group or a heterocyclic group. Each of the hydrogen atom, the halogen atom, the alkyl group, the aryl group and the heterocyclic group has the same definition as the hydrogen atom, the halogen atom, the alkyl group, the aryl group and the heterocyclic group in $R^4$ to $R^9$ above, and has the same preferable definitions as the hydrogen atom, the halogen atom, the alkyl group, the aryl group and the heterocyclic group in $R^4$ to $R^9$ above.

When an alkyl group, an aryl group or a heterocyclic group represented by $R^{10}$ is a group that may further be substituted, the group may further be substituted by any of the monovalent substituent groups in $R^4$ to $R^9$ above. When the group has two or more substituents, these substituents may be the same as or different from one another.

Metal Atom or Metal Compound

The specific complex of the present invention is a complex in which the compound represented by Formula (M) or a tautomer thereof is coordinated to a metal atom or metal compound.

Here, the metal atom or metal compound may be any metal atom or metal compound as long as it may form a complex, and examples include bivalent metal atoms, bivalent metal oxides, bivalent metal hydroxides and bivalent metal chlorides. Specific examples thereof include Zn, Mg, Si, Sn, Rh, Pt, Pd, Mo, Mn, Pb, Cu, Ni, Co and Fe; metal chlorides such as $AlCl_3$, $InCl_3$, $FeCl_2$, $TiCl_2$, $SnCl_2$, $SiCl_2$ or $GeCl_2$; metal oxides such as TiO or VO; and metal hydroxides such as $Si(OH)_2$.

Among these, Fe, Zn, Mg, Si, Pt, Pd, Mo, Mn, Cu, Ni, Co, TiO and VO are preferable, Zn, Mg, Si, Pt, Pd, Cu, Ni, Co and VO are more preferable, and Zn is still more preferable in view of stability, spectral property, heat resistance, light fastness, and production suitability and the like of the complex.

A preferable embodiment of the specific complex including the compound represented by Formula (M) and the metal atom or the metal compound is described below.

Namely, it is preferable that, in Formula (M), $R^4$ and $R^9$ each independently represent a hydrogen atom, an alkyl group, an alkenyl group, an aryl group, a heterocyclic group, a silyl group, a hydroxy group, a cyano group, an alkoxy group, an aryloxy group, a heterocyclic oxy group, an acyl group, an alkoxycarbonyl group, a carbamoyl group, an amino group, an anilino group, a heterocyclic amino group, a carbonamido group, an ureido group, an imido group, an alkoxycarbonylamino group, an aryloxycarbonylamino group, a sulfonamido group, an azo group, an alkylthio group, an arylthio group, a heterocyclic thio group, an alkylsulfonyl group, an arylsulfonyl group or a phosphinoylamino group, $R^5$ and $R^8$ each independently represent a hydrogen atom, a halogen atom, an alkyl group, an alkenyl group, an aryl group, a heterocyclic group, a hydroxy group, a cyano group, a nitro group, an alkoxy group, an aryloxy group, a heterocyclic oxy group, an acyl group, an alkoxycarbonyl group, an aryloxycarbonyl group, a carbamoyl group, an imido group, an alkoxycarbonylamino group, a sulfonamido group, an azo group, an alkylthio group, an arylthio group, a heterocyclic thio group, an alkylsulfonyl group, an arylsulfonyl group or a sulfamoyl group, $R^6$ and $R^7$ each independently represent a hydrogen atom, a halogen atom, an alkyl group, an alkenyl group, an aryl group, a heterocyclic group, a silyl group, a hydroxy group, a cyano group, an alkoxy group, an aryloxy group, a heterocyclic oxy group, an acyl group, an alkoxycarbonyl group, a carbamoyl group, an anilino group, a carbonamido group, an ureido group, an imido group, an alkoxycarbonylamino group, a sulfonamido group, an azo group, an alkylthio group, an arylthio group, a heterocyclic thio group, an alkylsulfonyl group, an arylsulfonyl group, a sulfamoyl group or a phosphinoylamino group, and $R^{10}$ represents a hydrogen atom, a halogen atom, an alkyl group, an aryl group or a heterocyclic group; and the metal atom or the metal compound is Zn, Mg, Si, Pt, Pd, Mo, Mn, Cu, Ni, Co, TiO or VO.

It is more preferable that, in Formula (M), $R^4$ and $R^9$ each independently represent a hydrogen atom, an alkyl group, an alkenyl group, an aryl group, a heterocyclic group, a cyano group, an acyl group, an alkoxycarbonyl group, a carbamoyl group, an amino group, a heterocyclic amino group, a carbonamido group, an ureido group, an imido group, an alkoxycarbonylamino group, an aryloxycarbonylamino group, a sulfonamido group, an azo group, an alkylsulfonyl group, an arylsulfonyl group or a phosphinoylamino group, $R^5$ and $R^8$ each independently represent an alkyl group, an alkenyl group, an aryl group, a heterocyclic group, a cyano group, a nitro group, an acyl group, an alkoxycarbonyl group, an aryloxycarbonyl group, a carbamoyl group, an imido group, an alkylsulfonyl group, an arylsulfonyl group or a sulfamoyl group, $R^6$ and $R^7$ each independently represent a hydrogen atom, an alkyl group, an alkenyl group, an aryl group, a heterocyclic group, a cyano group, an acyl group, an alkoxycarbonyl group, a carbamoyl group, a carbonamido group, an ureido group, an imido group, an alkoxycarbonylamino group, a sulfonamido group, an alkylthio group, an arylthio group, a heterocyclic thio group, an alkylsulfonyl group, an arylsulfonyl group or a sulfamoyl group, and $R^{10}$ represents a hydrogen atom, a halogen atom, an alkyl group, an aryl group or a heterocyclic group; and the metal atom or the metal compound is Zn, Mg, Si, Pt, Pd, Cu, Ni, Co or VO.

It is still more preferable that, in Formula (M), $R^4$ and $R^9$ each independently represent a hydrogen atom, an alkyl group, an aryl group, a heterocyclic group, an amino group, a heterocyclic amino group, a carbonamido group, an ureido group, an imido group, an alkoxycarbonylamino group, a sulfonamido group, an azo group, an alkylsulfonyl group, an arylsulfonyl group or a phosphinoylamino group, $R^5$ and $R^8$ each independently represent an alkyl group, an aryl group, a heterocyclic group, a cyano group, an acyl group, an alkoxycarbonyl group, a carbamoyl group, an alkylsulfonyl group or an arylsulfonyl group, $R^6$ and $R^7$ each independently represent a hydrogen atom, an alkyl group, an aryl group or a heterocyclic group, and $R^{10}$ represents a hydrogen atom, an alkyl group, an aryl group or a heterocyclic group; and the metal atom or the metal compound is Zn, Cu, Co or VO.

In addition, a preferable embodiment of the specific complex includes a compound represented by Formula (5) or Formula (6) described in detail below.

Dipyrromethene Metal Complex Compound Represented by Formula (5)

One aspect of the colorant multimer of the invention includes a colorant multimer having a dye residue, in which any one hydrogen atom is removed from the dipyrromethene metal complex compound represented by the following Formula (5):

Formula (5)

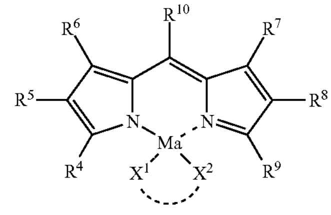

In Formula (5), $R^4$ to $R^9$ each independently represent a hydrogen atom or a substituent; $R^{10}$ represents a hydrogen atom, a halogen atom, an alkyl group, an aryl group or a heterocycle group; Ma represents a metal atom or a metal compound; $X^1$ represents a group that can be bonded to Ma; $X^2$ represents a group that neutralizes the charge of Ma; and $X^1$ and $X^2$ may be linked to each other to form a 5-, 6- or 7-membered ring together with Ma. Examples of the dipyrromethene metal complex represented by Formula (5) include tautomers thereof.

When the dipyrromethene metal complex compound represented by Formula (5) is introduced into the constituent unit represented by Formula (A), (B) or (C), the multimer represented by Formula (D) or the monomer represented by Formula (1), the position to be introduced is preferably, but not limited to, any one of $R^4$ to $R^9$, more preferably any one of $R^4$, $R^6$, $R^7$ and $R^9$, and still more preferably $R^4$ or $R^9$, in view of the synthetic suitability.

Examples of the method of introducing an alkali-soluble group into the colorant multimer of the invention include a method in which the alkali-soluble group is introduced into one, or two or more substituents of $R^4$ to $R^{10}$, and $X^1$, and $X^2$ of the dipyrromethene metal complex compound represented by Formula (5). The alkali-soluble group is preferably introduced into any one of $R^4$ to $R^9$ and $X^1$, more preferably any one of $R^4$, $R^6$, $R^7$ and $R^9$, and till more preferably one of $R^4$ or $R^9$.

The dipyrromethene metal complex compound represented by Formula (5) may have a functional group in addition to the alkali-soluble group, unless the effect of the invention is impaired.

$R^4$ to $R^9$ in Formula (5) have the same definitions as $R^4$ to $R^9$ in Formula (M), and have the same preferable definitions as Formula (M).

In Formula (5), Ma represents a metal atom or a metal compound. The metal atom or the metal compound may be any metal atom or metal compound, as long as the metal atom or metal compound can form a complex, and examples thereof include a divalent metal atom, a divalent metal oxide, a divalent metal hydroxide, and a divalent metal chloride.

Examples thereof include Zn, Mg, Si, Sn, Rh, Pt, Pd, Mo, Mn, Pb, Cu, Ni, Co, Fe, metal chlorides such as $AlCl_3$, $InCl_3$, $FeCl_2$, $TiCl_2$, $SnCl_2$, $SiCl_2$ or $GeCl_2$, metal oxides such as TiO or VO, and metal hydroxide such as $Si(OH)_2$.

Among these, from the viewpoint of the stability of the complex, spectrum characteristics, heat resistance, light fastness, manufacture suitability, and the like, Fe, Zn, Mg, Si, Pt, Pd, Mo, Mn, Cu, Ni, Co, TiO and VO are preferable, Zn, Mg, Si, Pt, Pd, Cu, Ni, Co and VO are more preferable, and Zn, Cu, Co and VO are still more preferable, and Zn is most preferable.

In Formula (5), $R^{10}$ represents a hydrogen atom, a halogen atom, an alkyl group, an aryl group or a heterocyclic group, and preferable represents a hydrogen atom.

$X^1$ in Formula (5) may be any group as long as it can be bonded to Ma, and specific examples thereof include water, alcohols (e.g., methanol, ethanol, propanol) and the like, and groups derived from the compounds described in "Metal Chelates" [1] Takeichi Sakaguchi and Kyohei Ueno (1995 Nankodo), "Metal Chelates" [2] (1996), "Metal Chelates" [3] (1997) and the like. Among these, in view of manufacturability, water, a carboxylic acid compound and alcohols are preferable, and water and a carboxylic acid compound are more preferable.

$X^2$ in Formula (5) is a group that neutralizes the charge of Ma, and examples thereof include a halogen atom, a hydroxy group, a carboxy group, a phosphoric acid group, and a sulfonic acid group. Among these, in view of manufacturability, a halogen atom, a hydroxy group, a carboxy group and a sulfonic acid group are preferable, and a hydroxy group and a carboxy group are more preferable.

$X^1$ and $X^2$ in Formula (5) may be linked to each other to form a 5-, 6- or 7-membered ring together with Ma. The 5-, 6- or 7-membered ring to be formed may be a saturated or unsaturated ring. The 5-, 6- or 7-membered ring may be formed from only carbon atoms and hydrogen atoms, or may be a heterocycle having at least one atom selected from a nitrogen atom, an oxygen atom and a sulfur atom.

In the preferable embodiment of the compound represented by Formula (5), $R^4$ to $R^9$ each independently has the same preferable definition as $R^4$ to $R^9$ in Formula (M); $R^{10}$ has the same preferable definition as $R^{10}$ in Formula (M); Ma is Zn, Cu, Co or VO; $X^1$ represents water or a carboxylic acid compound; $X^2$ represents a hydroxy group or a carboxy group; and $X^1$ and $X^2$ is linked to each other to form a 5- or 6-membered ring.

Dipyrromethene Metal Complex Compound Represented by Formula (6)

An aspect of the colorant multimer of the invention includes a colorant multimer having a dye residue, in which any one hydrogen atom from any one of the substituents of $R^{11}$ to $R^{17}$, $X^1$ and $Y^1$ to $Y^2$ of the dipyrromethene metal complex compound represented by the following Formula (6) is removed:

Formula (6)

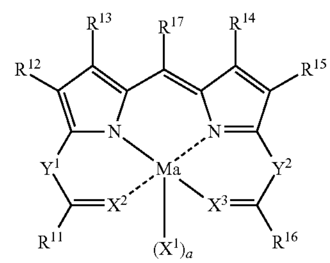

In Formula (6), $R^{11}$ and $R^{16}$ each independently represent an alkyl group, an alkenyl group, an aryl group, a heterocyclic group, an alkoxy group, an aryloxy group, an alkylamino group, an arylamino group or a heterocyclic amino group; $R^{12}$ to $R^{15}$ each independently represent a hydrogen atom or a substituent; $R^{17}$ represents a hydrogen atom, a halogen atom, an alkyl group, an aryl group or a heterocyclic group; Ma represents a metal atom or a metal compound; $X^2$ and $X^3$ each independently represent NR' (wherein R' represents a hydrogen atom, an alkyl group, an alkenyl group, an aryl group, a heterocyclic group, an acyl group, an alkylsulfonyl group or an arylsulfonyl group), a nitrogen atom, an oxygen atom or a sulfur atom; $Y^1$ and $Y^2$ each independently represent NR" (wherein R" represents a hydrogen atom, an alkyl group, an alkenyl group, an aryl group, a heterocyclic group, an acyl group, an alkylsulfonyl group or an arylsulfonyl group), a nitrogen atom or a carbon atom; $R^{11}$ and $Y^1$ may be linked to each other to form a 5-, 6- or 7-membered ring; $R^{16}$ and $Y^2$ may be linked to each other to form a 5-, 6- or 7-membered ring; $X^1$ represents a group capable of combining with Ma; and a represents 0, 1 or 2. Here, when a represents 2, each $X^1$ may be the same as or different from each other. Examples of the dipyrromethene metal complex compounds represented by Formula (6) include tautomers thereof.

The position of the colorant multimer of the invention, into which the dipyrromethene metal complex compound represented by Formula (6) is introduced, is not particularly limited as long as the effect of the invention is not impaired, but is preferably any one of $R^{11}$ to $R^{17}$, $X^1$, $Y^1$ and $Y^2$. In view of the synthetic suitability, the dipyrromethene metal complex compound is preferably introduced into any one of $R^{11}$ to $R^{16}$ and $X^1$, more preferably any one of $R^{11}$, $R^{13}$, $R^{14}$ and $R^{16}$, and still more preferably $R^{11}$ or $R^{16}$.

When the colorant monomer or constituent unit having an alkali-soluble group is used, examples of the method of introducing an alkali-soluble group into the colorant multimer of the invention includes a method in which the alkali-soluble group can be introduced into one, or two more of the substituents of $R^{11}$ to $R^{17}$, $X^1$, $Y^1$ and $Y^2$ of the dipyrromethene metal complex compound represented by Formula (6). The alkali-soluble group is preferably introduced into any one of $R^{11}$ to $R^{16}$ and $X^1$, more preferably any one of $R^{11}$, $R^{13}$, $R^{14}$ and $R^{16}$, and still more preferably one of $R^{11}$ or $R^{16}$.

The dipyrromethene metal complex compound represented by Formula (6) may have a functional group in addition to the alkali-soluble group, unless the effect of the invention is impaired.

$R^{12}$ to $R^{15}$ have the same definitions as $R^5$ to $R^8$ in Formula (M), respectively, and have the same preferable definitions as Formula (M) respectively. $R^{17}$ has the same definition as $R^{10}$ of in Formula (M), and has the same preferable definition as Formula (M). Ma has the same definition as t Ma in Formula (M), and has the same preferable definition as Ma in Formula (M).

More specifically, in $R^{12}$ to $R^{15}$ in Formula (6), it is preferable that $R^{12}$ and $R^{15}$ each independently represent an alkoxycarbonyl group, an aryloxycarbonyl group, a carbamoyl group, an alkylsulfonyl group, an arylsulfonyl group, a nitrile group, an imido group or a carbamoyl sulfonyl group; it is more preferable that $R^{12}$ and $R^{15}$ each independently represent an alkoxycarbonyl group, an aryloxycarbonyl group, a carbamoyl group, an alkylsulfonyl group, a nitrile group, an imido group or a carbamoyl sulfonyl group; it is still more preferable that $R^{12}$ and $R^{15}$ each independently represent an alkoxycarbonyl group, an aryloxycarbonyl group, a carbamoyl group, a nitrile group, an imido group or a carbamoyl sulfonyl group; and it is even more preferable that $R^{12}$ and $R^{15}$ each independently represent an alkoxycarbonyl group, an aryloxycarbonyl group or a carbamoyl group.

It is preferable that $R^{13}$ and $R^{14}$ each independently represent a substituted or unsubstituted alkyl group, a substituted or unsubstituted aryl group or a substituted or unsubstituted heterocyclic group; and it is more preferable that $R^{13}$ and $R^{14}$ each independently represent a substituted or unsubstituted alkyl group or a substituted or unsubstituted aryl group. Here, specific examples of the preferable alkyl, aryl, and heterocyclic groups include the specific examples for $R^6$ and $R^7$ in Formula (M).

In Formula (6), $R^{11}$ and $R^{16}$ each independently represent an alkyl group (a straight-chain, branched-chain or cyclic alkyl group having preferably 1 to 36, more preferably 1 to 12 carbon atoms, such as a methyl group, an ethyl group, a propyl group, an isopropyl group, a butyl group, an isobutyl group, a t-butyl group, a hexyl group, a 2-ethylhexyl group, a dodecyl group, a cyclopropyl group, a cyclopentyl group, a cyclohexyl group or a 1-adamantyl group), an alkenyl group (an alkenyl group having preferably 2 to 24, more preferably 2 to 12 carbon atoms, such as a vinyl group, an allyl group or a 3-buten-1-yl group), an aryl group (an aryl group having preferably 6 to 36, more preferably 6 to 18 carbon atoms, such as a phenyl group or a naphthyl group), a heterocyclic group (a heterocyclic group having preferably 1 to 24, more preferably 1 to 12 carbon atoms, such as a 2-thienyl group, a 4-pyridyl group, a 2-furyl group, a 2-pyrimidinyl group, a 2-pyridyl group, a 2-benzothiazolyl group, a 1-imidazolyl group, a 1-pyrazolyl group or a benzotriazol-1-yl group), an alkoxy group (an alkoxy group having preferably 1 to 36, more preferably 1 to 18 carbon atoms, such as a methoxy group, an ethoxy group, a propyloxy group, a butoxy group, a hexyloxy group, a 2-ethylhexyloxy group, a dodecyloxy group or a cyclohexyloxy group), an aryloxy group (an aryloxy group having preferably 6 to 24, more preferably 1 to 18 carbon atoms, such as a phenoxy group or a naphthyloxy group), an alkylamino group (an alkylamino group having preferably 1 to 36, more preferably 1 to 18 carbon atoms, such as a methylamino group, an ethylamino group, a propylamino group, a butylamino group, a hexylamino group, a 2-ethylhexylamino group, an isopropylamino group, a t-butylamino group, a t-octylamino group, a cyclohexylamino group, an N,N-diethylamino group, an N,N-dipropylamino group, an N,N-dibutylamino group or an N-methyl-N-ethylamino group), an arylamino group (an aryl amino group having preferably 6 to 36, more preferably 6 to 18 carbon atoms, such as a phenylamino group, a naphthylamino group, an N,N-diphenylamino group or an N-ethyl-N-phenylamino group), or a heterocyclic amino group (a heterocyclic amino group having preferably 1 to 24, more preferably 1 to 12 carbon atoms, such as a 2-aminopyrrole group, a 3-aminopyrazole group, a 2-aminopyridine group or a 3-aminopyridine group).

Among these, it is preferable that $R^{11}$ and $R^{16}$ each independently represent an alkyl group, an alkenyl group, an aryl group, heterocyclic group, an alkylamino group, an arylamino group or a heterocyclic amino group; it is more preferable that $R^{11}$ and $R^{16}$ each independently represent an alkyl group, an alkenyl group, an aryl group or a heterocyclic group; it is still more preferable that $R^{11}$ and $R^{16}$ each independently represent an alkyl group, an alkenyl group or an aryl group; and it is even more preferable that $R^{11}$ and $R^{16}$ each independently represent an alkyl group.

In Formula (6), when the alkyl group, alkenyl group, aryl group, heterocyclic group, alkoxy group, aryloxy group, alkylamino group, arylamino group or heterocyclic amino group represented by $R^8$ or $R^9$ is a group that may further be substituted, it may be substituted by any of the substituents in $R^1$ of Formula (1) described below, and when it is substituted by two or more substituents, the substituents may be the same as or different from one another.

In Formula (6), $X^2$ and $X^3$ each independently represent NR', a nitrogen atom, an oxygen atom or a sulfur atom, wherein R' represents a hydrogen atom, an alkyl group (a straight-chain, branched-chain, or cyclic alkyl group having preferably 1 to 36, more preferably 1 to 12 carbon atoms, such as a methyl group, an ethyl group, a propyl group, an isopropyl group, a butyl group, an isobutyl group, a t-butyl group, a hexyl group, a 2-ethylhexyl group, a dodecyl group, a cyclopropyl group, a cyclopentyl group, a cyclohexyl group, a 1-adamantyl group), an alkenyl group (an alkenyl group having preferably 2 to 24, more preferably 2 to 12 carbon atoms, such as a vinyl group, an allyl group or a 3-buten-1-yl group), an aryl group (an aryl group having preferably 6 to 36, more preferably 6 to 18 carbon atoms, such as a phenyl group or a naphthyl group), a heterocyclic group (a heterocyclic group having preferably 1 to 24, more preferably 1 to 12 carbon atoms, such as a 2-thienyl group, a 4-pyridyl group, a 2-furyl group, a 2-pyrimidinyl group, a 1-pyridyl group, a 2-benzothiazolyl group, a 1-imidazolyl group, a 1-pyrazolyl group or a benzotriazol-1-yl group), an acyl group (an acyl group having preferably 1 to 24, more preferably 2 to 18 carbon atoms, such as an acetyl group, a pivaloyl group, a 2-ethylhexyl group, a benzoyl group or a cyclohexanoyl group), an alkylsulfonyl group (an alkylsulfonyl group having preferably 1 to 24, more preferably 1 to 18 carbon atoms, such as a methylsulfonyl group, a ethylsulfonyl group, a isopropylsulfonyl group or a cyclohexylsulfonyl group), or an arylsulfonyl group (an arylsulfonyl group having preferably 6 to 24, more preferably 6 to 18 carbon atoms, such as a phenylsulfonyl group or a naphthylsulfonyl group).

The alkyl group, alkenyl group, aryl group, heterocyclic group, acyl group, alkylsulfonyl group or arylsulfonyl group represented by R' may further be substituted by any of the substituents in $R^1$ of Formula (1) described below, and when it is substituted by two or more substituents, the substituents may be the same as or different from one another.

In Formula (6), $Y^2$ and $Y^3$ each independently represent NR", a nitrogen atom, a carbon atom; and R" has the same definition as R' in $X^2$ and $X^3$ above, and has the same preferable definition as R' in $X^2$ and $X^3$ above.

In Formula (6), $R^{11}$ and $Y^1$ may be linked to each other to form, with a carbon atom, a 5-membered ring (e.g., cyclopentane, pyrrolidine; tetrahydrofuran, dioxolane, tetrahydrothiophene, pyrrole, furan, thiophene, indole, benzofuran or benzothiophene), a 6-membered ring (e.g., cyclohexane, piperidine, piperazine, morpholine, tetrahydropyran, dioxane, pentamethylenesulfide, dithiane, benzene, piperidine, piperazine, pyridazine, quinoline or quinazoline) or a 7-membered ring (e.g., cycloheptane or hexamethyleneimine).

In Formula (6), $R^{161}$ and $Y^2$ may be linked to each other to form, with a carbon atom, a 5-membered ring (e.g., cyclopentane, pyrrolidine, tetrahydrofuran, dioxolane, tetrahydrothiophene, pyrrole, furan, thiophene, indole, benzofuran or benzothiophene), a 6-membered ring (e.g., cyclohexane, piperidine, piperazine, morpholine, tetrahydropyran, dioxane, pentamethylenesulfide, dithiane, benzene, piperidine, piperazine, pyridazine, quinoline or quinazoline) or a 7-membered ring (e.g., cycloheptane or hexamethyleneimine).

In Formula (6), when the 5-, 6- or 7-membered ring formed by the linking of $R^{11}$ and $Y^1$ or $R^{16}$ and $Y^2$ is a ring that may further be substituted, it may be substituted by any of the substituents in $R^1$ of Formula (1) described below, and when it is substituted by two or more substituents, the substituents may be the same as or different from one another.

In Formula (6), $X^1$ represents a group that can be bonded to Ma. Specific examples thereof include the same groups as defined for $X^1$ in Formula (5). $X^1$ in Formula (6) has the same preferable definitions as $X^1$ in Formula (5).

In Formula (6), a represents 0, 1 or 2. Here, when a represents 2, each $X^1$ may be the same as or different from each other.

A preferable embodiment of the compound represented by Formula (6) is as follows.

Namely, in a preferable embodiment, $R^{12}$ to $R^{15}$ each independently have the same preferable definitions as $R^5$ to $R^8$ in Formula (5), respectively; $R^{17}$ has the same preferable definition as $R^{10}$ in Formula (5); Ma represents Zn, Cu, Co or VO; $X^2$ represents NR' (wherein R' represents a hydrogen atom or an alkyl group), a nitrogen atom or an oxygen atom; $X^3$ represents NR' (wherein R' represents a hydrogen atom or an alkyl group) or an oxygen atom; $Y^1$ represents NR" (wherein R" represents a hydrogen atom or an alkyl group), a nitrogen atom or a carbon atom; $Y^2$ represents a nitrogen atom or a carbon atom; $R^{11}$ and $R^{16}$ each independently represent an alkyl group, an aryl group, a heterocyclic group, an alkoxy group or an alkylamino group; $X^1$ represents a group that binds via an oxygen atom; and a represents 0 or 1. $R^{11}$ and $Y^1$ may be linked to each other to form a 5- or 6-membered ring; and $R^{16}$ and $Y^2$ may be linked to each other to form a 5- or 6-membered ring.

In a more preferable embodiment, $R^{12}$ to $R^{15}$ each independently have the same preferable definitions as $R^5$ to $R^8$ in Formula (5), respectively; $R^{17}$ has the same preferable definition as $R^{10}$ in Formula (5); Ma represents Zn; $X^2$ and $X^3$ represents an oxygen atom; $Y^1$ represents NH; $Y^2$ represents a nitrogen atom; $R^{11}$ and $R^{16}$ each independently represent an alkyl group, an aryl group, a heterocyclic group, an alkoxy group or an alkylamino group; $X^1$ represents a group that binds via an oxygen atom; and a represents 0 or 1. $R^{11}$ and $Y^1$ may be linked to each other to form a 5- or 6-membered ring; and $R^{16}$ and $Y^2$ may be linked to each other to form a 5- or 6-membered ring.

It is preferable that the mol absorption coefficient of the dipyrromethene metal complex compounds represented by Formulae (5) and (6) is as high as possible in view of film thickness. The maximum absorption wavelength λmax is preferably from 520 nm to 580 nm, more preferably from 530 nm to 570 nm in view of color purity. The maximum absorption wavelength and mol absorption coefficient are measured by a spectrophotometer (trade name: UV-2400PC, manufactured by Shimadzu Corporation).

It is preferable that the melting point of the dipyrromethene metal complex compounds represented by Formulae (5) and (6) is not too high in view of solubility.

The dipyrromethene metal complex compounds represented by Formulae (5) and (6) may be synthesized by the methods described in U.S. Pat. Nos. 4,774,339 and 5,433,896, JP-A Nos. 2001-240761 and 2002-155052, Japanese Patent No. 3614586, Aust. J. Chem, 1965, 11, 1835-1845, J. H. Boger et al, Heteroatom Chemistry, Vol. 1, No. 5, 389 (1990), and the like.

Specifically, the method described in the paragraphs [0131] to [0157] of JP-A No. 2008-292970 may be applied.

The colorant multimer of the invention having a preferable colorant skeleton is explained. Examples of the colorant multimer having the colorant skeleton derived from the dipyrromethene metal complex compound include: the multimer including at least one of the constituent units represented by the following Formula (A), (B) or (C); the colorant multimer represented by the following Formula (D); and the colorant multimer including the colorant monomer represented by the following Formula (1) as a polymerization component. Hereinbelow, these colorant multimer are explained.

Constituent Unit Represented by Formula (A)

Formula (A)

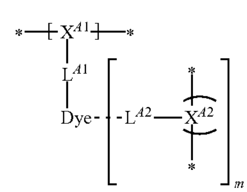

In Formula (A), $X^{A1}$ represents a linking group formed by polymerization; $L^{A1}$ represents a single bond or a divalent linking group; "Dye" represents a colorant residue formed by removing any one to (m+1) hydrogen atoms from the dipyrromethene metal complex compound obtained from (i) the dipyrromethene compound represented by Formula (M) and (ii) a metal or a metal compound; $X^{A2}$ represents a linking group formed by polymerization; $L^{A2}$ represents a single bond or a divalent linking group; and "Dye" and $L^{A2}$ may be linked to each other by a covalent bond, an ionic bond or a coordinate bond.

In Formula (A), m represents an integer of from 0 to 3. When m represents 2 or 3, each $X^{A2}$ may be the same as or different from one another. When m represents 2 or 3, each $L^{A2}$ may be the same as or different from one another.

In Formula (A), $X^{A1}$ and $X^{A2}$ each independently represent a linking group formed by polymerization. That is, $X^{A1}$ and $X^{A2}$ each represent a moiety that forms a repeating unit corresponding to the main chain formed by the polymerization reaction. The moieties between two * positions correspond to a repeating unit. Examples of $X^{A1}$ and $X^{A2}$ include a linking group formed by the polymerization of substituted or unsubstituted ethylenically unsaturated groups, and a linking group formed by the ring-opening polymerization of cyclic ether. Preferable examples of $X^{A1}$ and $X^{A2}$ include a linking group formed by the polymerization of ethylenically unsaturated groups. Specific examples thereof include the following linking groups, but the invention is not particularly limited to these examples.

In the following (X-1) to (X-15), $L^{A1}$ or $L^{A2}$ is connected at the position represented by *.

(X-1)

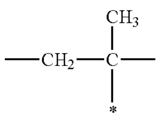

(X-2)

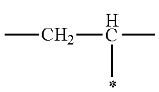

(X-3)

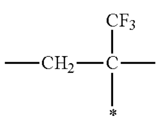

(X-4)

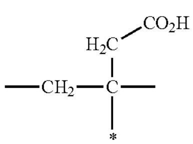

(X-5)

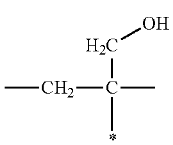

(X-6)

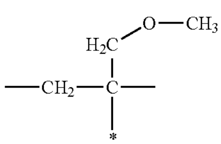

(X-7)

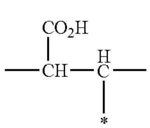

(X-8)

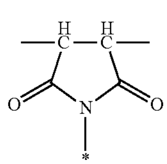

-continued (X-9)

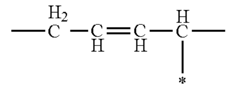

(X-10

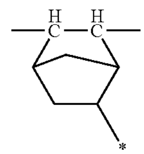

(X-11)

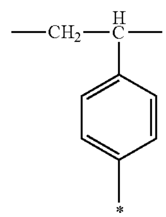

(X-12)

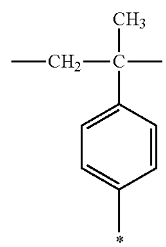

(X-13)

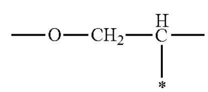

(X-14)

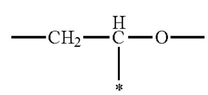

(X-15)

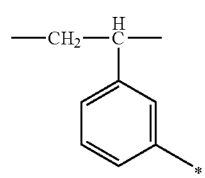

In Formula (A), $L^{A1}$ and $L^{A2}$ each independently represent a single bond or a divalent linking group. When $L^{A1}$ or $L^{A2}$ represents a divalent linking group, examples of the divalent linking group include a substituted or unsubstituted straight-chained, branched or cyclic alkylene group having 1 to 30 carbon atoms (such as a methylene group, an ethylene group, a trimethylene group, a propylene group or a butylene group); a substituted or unsubstituted arylene group having 6 to 30 carbon atoms (such as a phenylene group or a naphthalene group); a substituted or unsubstituted heterocyclic linking group; —$CH_2$═$CH_2$—, —O—, —S—, —NR—, —C(═O)—, SO—, —$SO_2$—; a linking group represented by the following Formula (2); a linking group represented by the following Formula (3); a linking group represented by the following Formula (4); and a linking group formed by connecting two or more of these groups such as —N(R)C(═O)—, —OC(═O)—, —C(═O)N(R)—, —C(═O)O— (here, each R independently represents a hydrogen atom, an alkyl group, an aryl group or a heterocyclic group). However, the divalent linking group in Formula (A) is not limited to these groups, as long as the divalent linking group exerts the effect of the invention.

In Formula (A), "Dye" represents a dipyrromethene metal complex compound obtained from (i) the dipyrromethene compound represented by Formula (M) and (ii) a metal or a metal compound, preferably represents a colorant residue obtained by removing any one to (m+1) hydrogen atoms hydrogen atoms from the dipyrromethene metal complex compound represented by Formula (5) or Formula (6).

Formula (2)

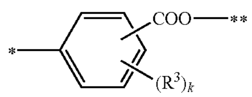

Formula (3)

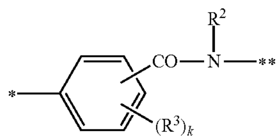

-continued

Formula (4)

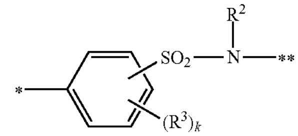

Here, $R^2$ in Formulae (3) and (4) independently represents a hydrogen atom, an alkyl group, an aryl group, or a heterocyclic group; $R^3$ in Formulae (2) to (4) independently represents a hydrogen atom or a substituent; k in Formulae (2) to (4) independently represents an integer of from 0 to 49; * in Formulae (2) to (4) independently represents a position to which —C($R^1$)═$CH_2$— group in Formula (1) is linked; and ** in Formulae (2) to (4) independently represents a position to which $L^2$ or "Dye" (in the case of n=0) in Formula (1) is linked.

Examples of the constituent units represented by Formula (A) include the following, but the invention is not particularly limited to these examples.

(A-1)

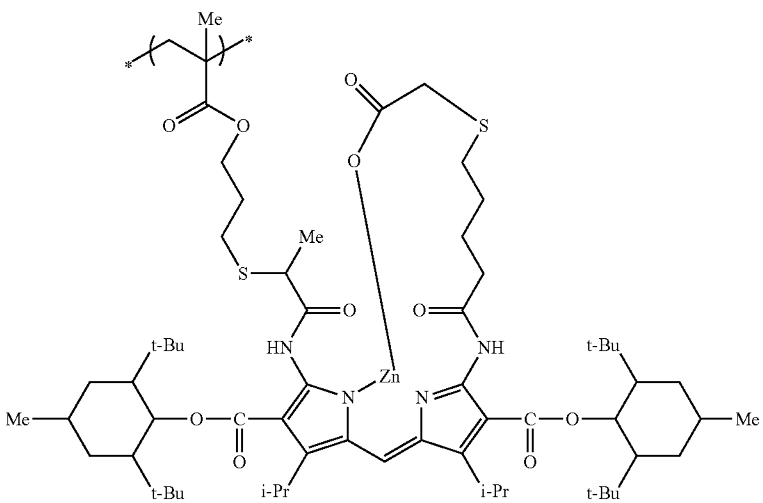

(A-2)

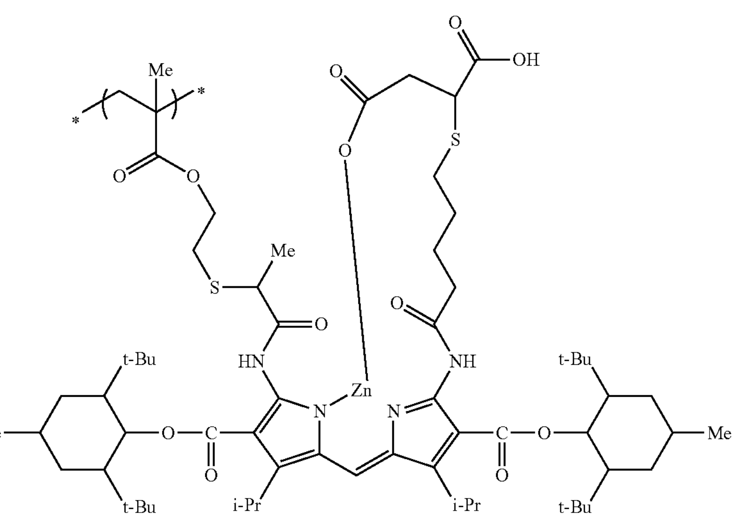

-continued
(A-3)
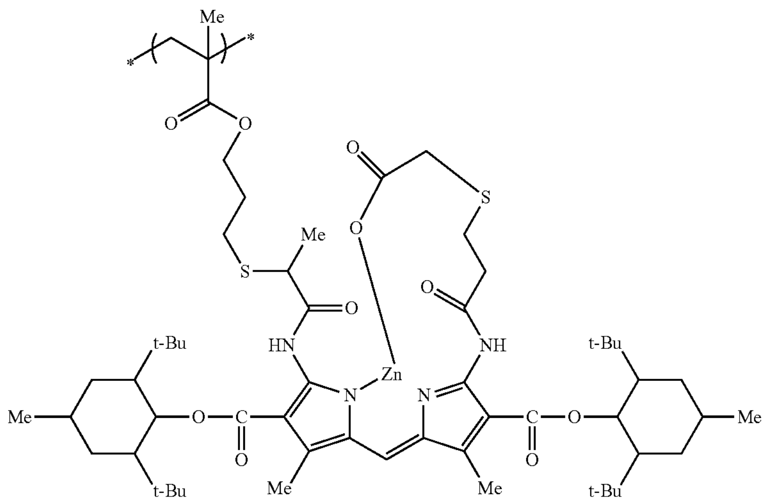
(A-4)
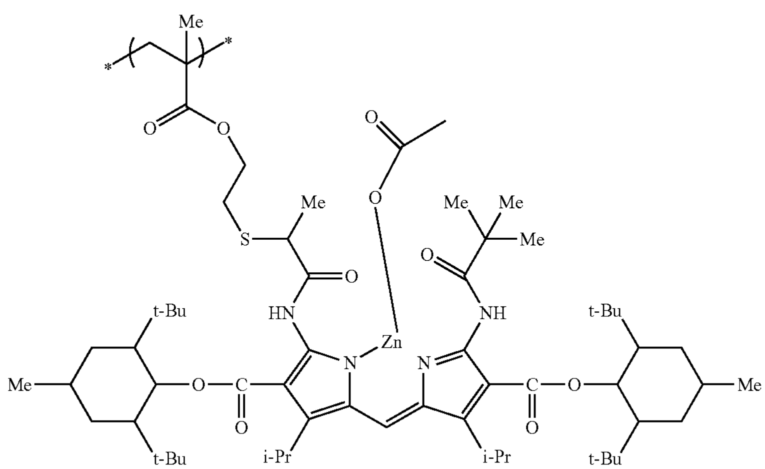
(A-5)
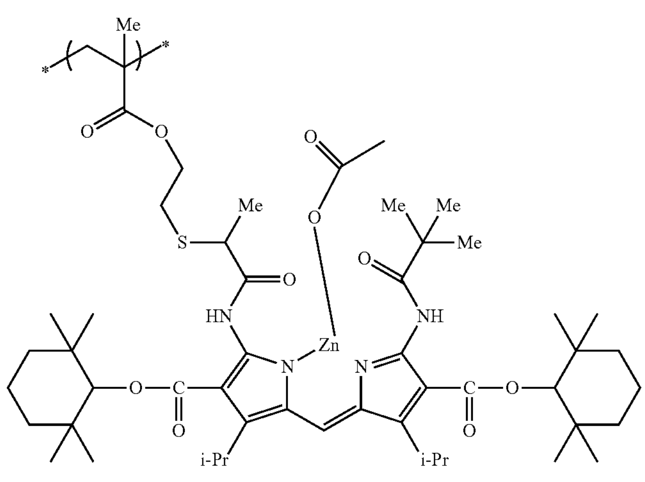

-continued
(A-6)
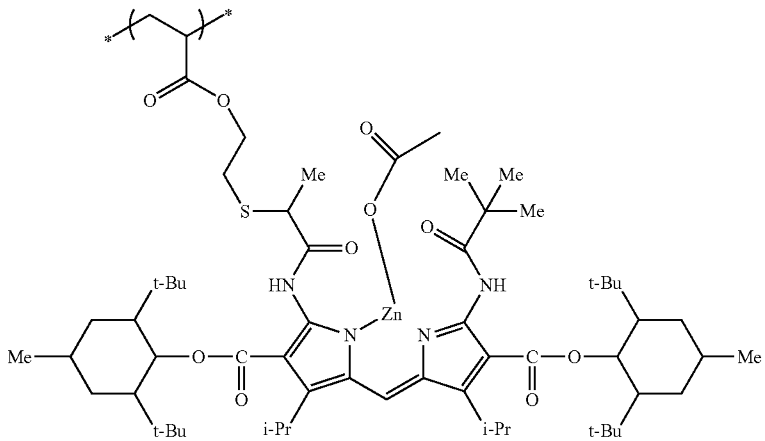
(A-7)
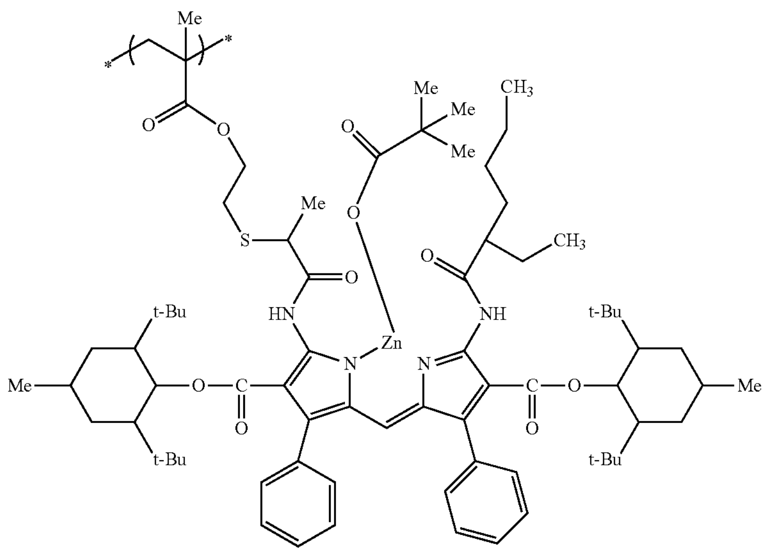
(A-8)
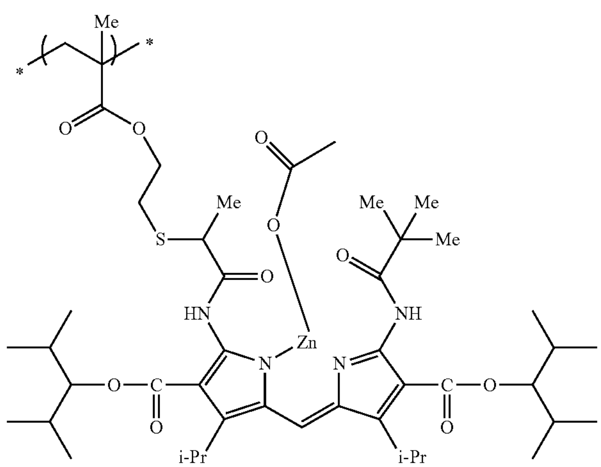

-continued
(A-9)
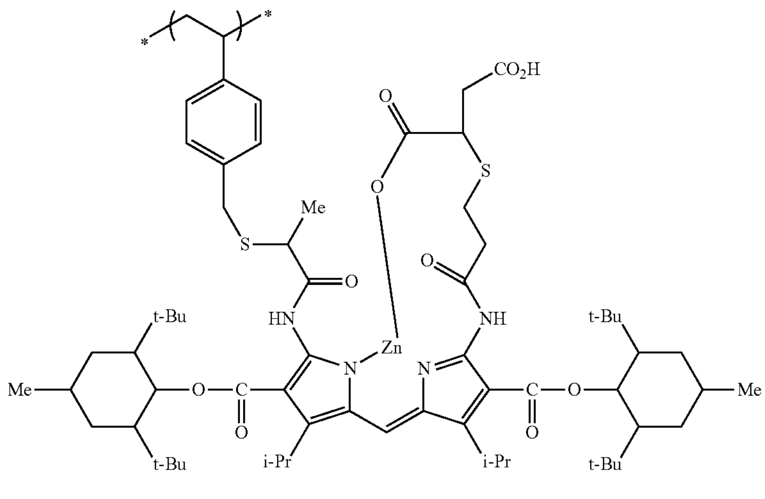
(A-10)
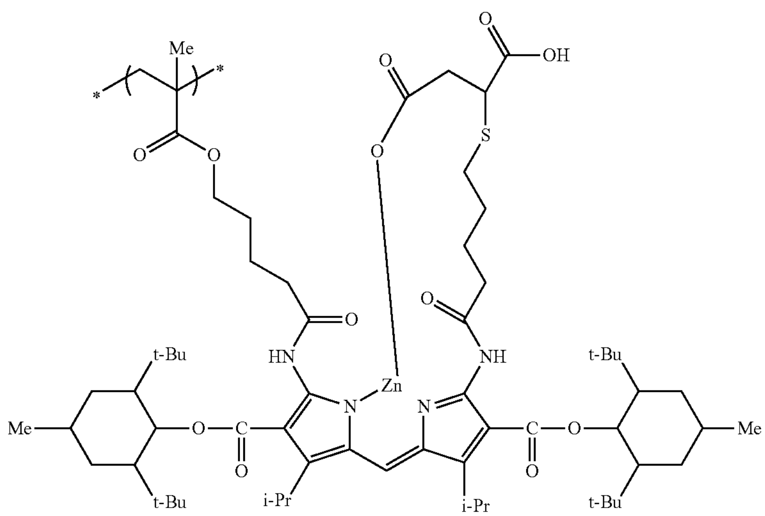
(A-11)
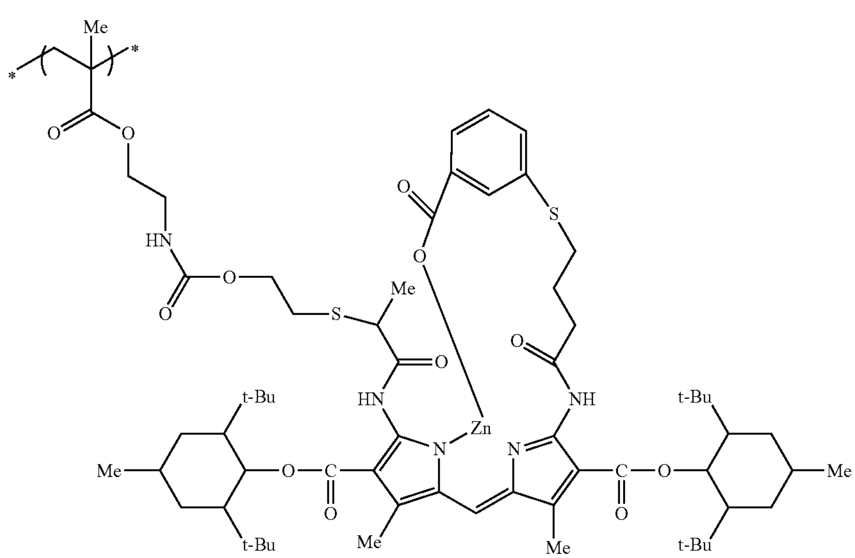

-continued
(A-12)
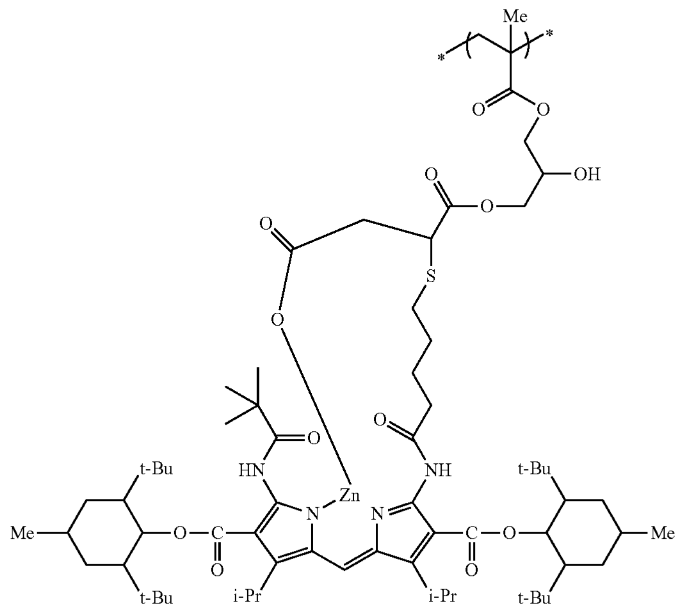
(A-13)
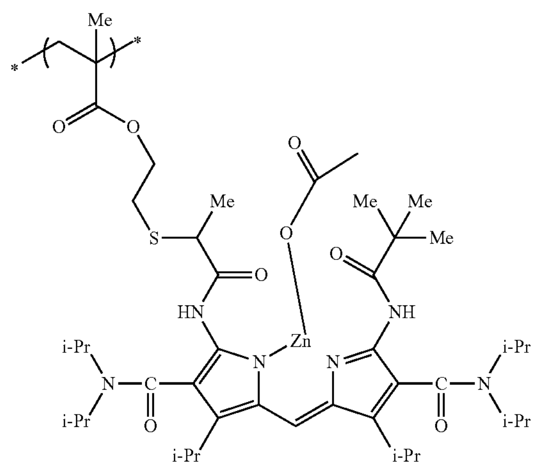
(A-14)
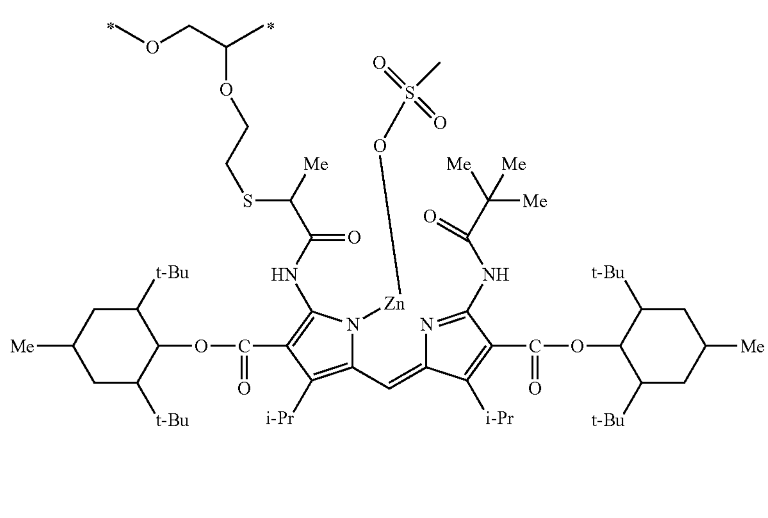

-continued
(A-15)
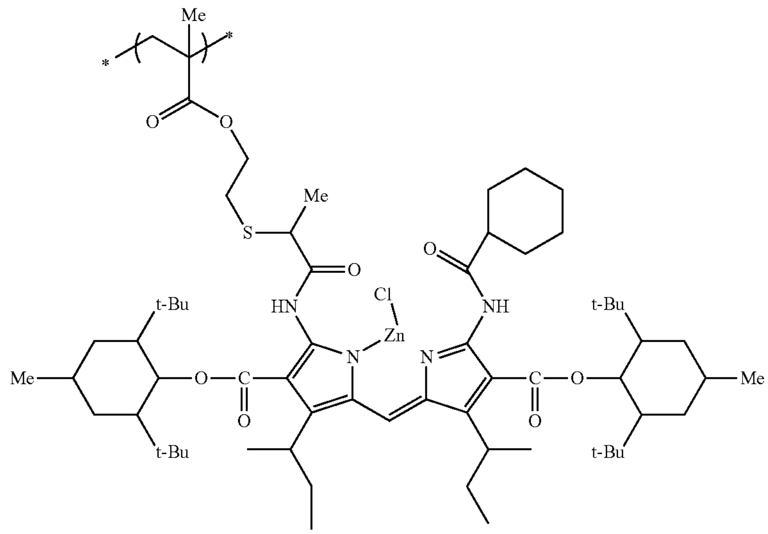
(A-16)
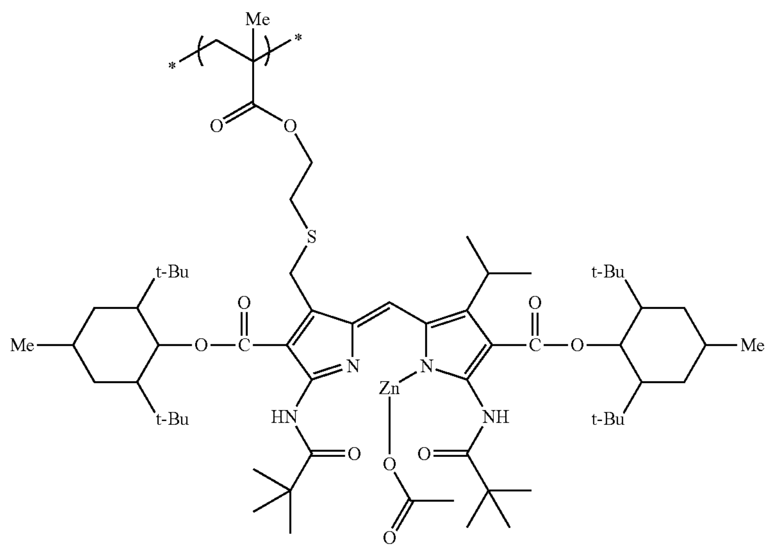
(A-17)
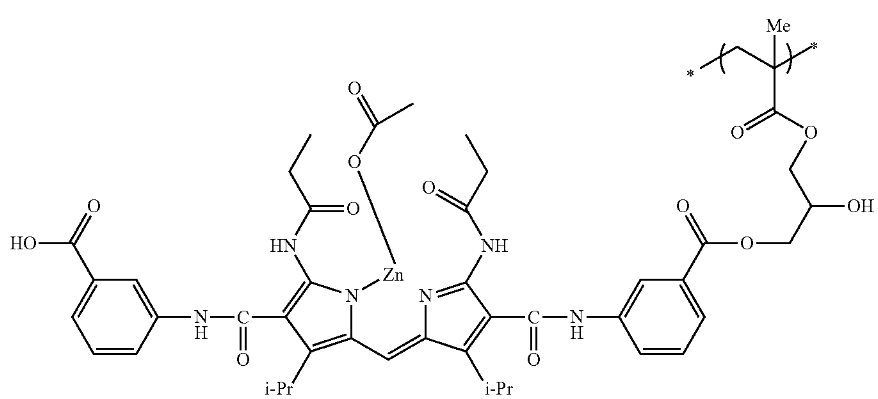

-continued
(A-18)
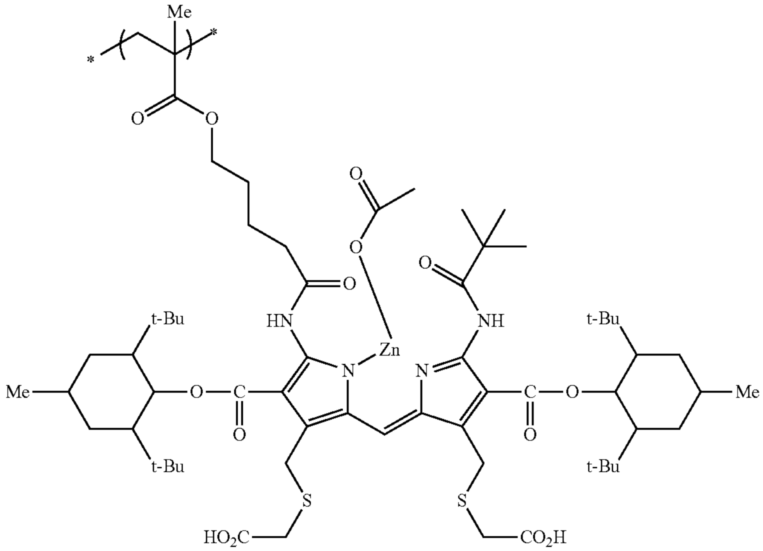
(A-19)
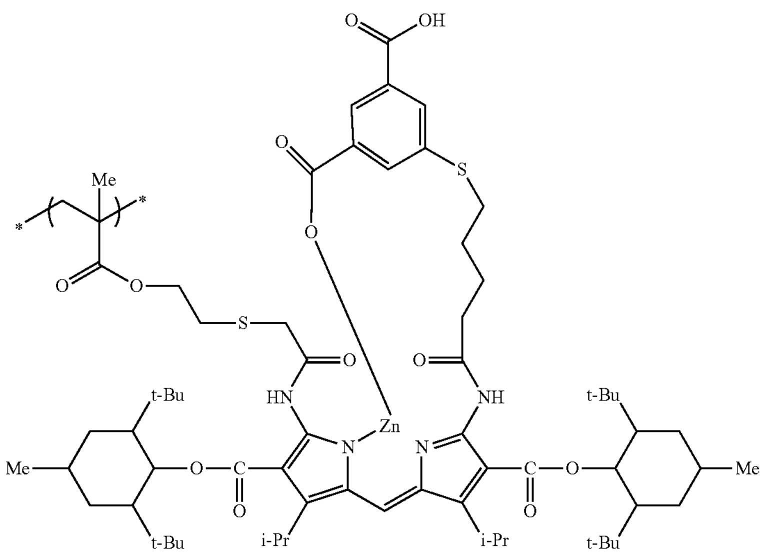
(A-20)
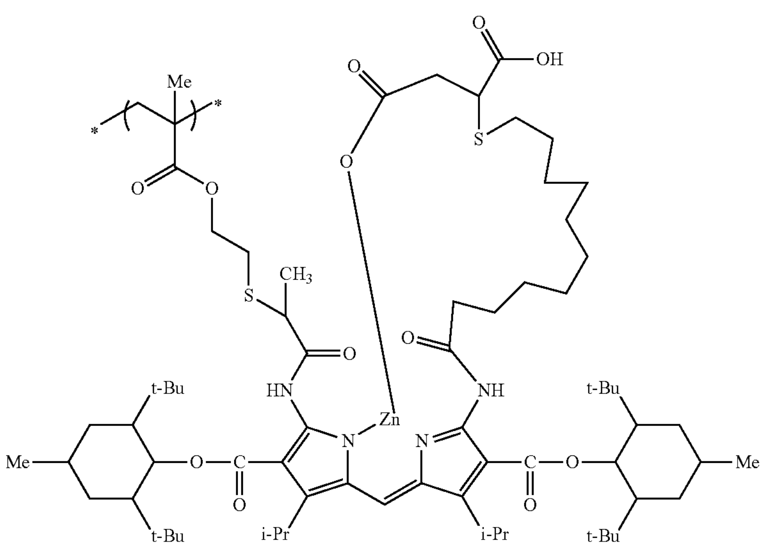

-continued
(A-21)
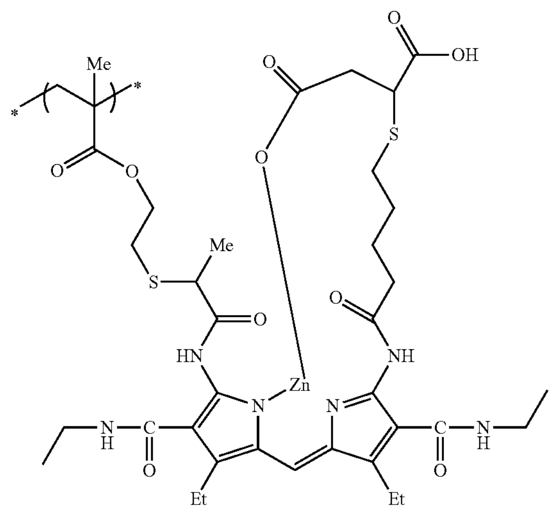
(A-21)
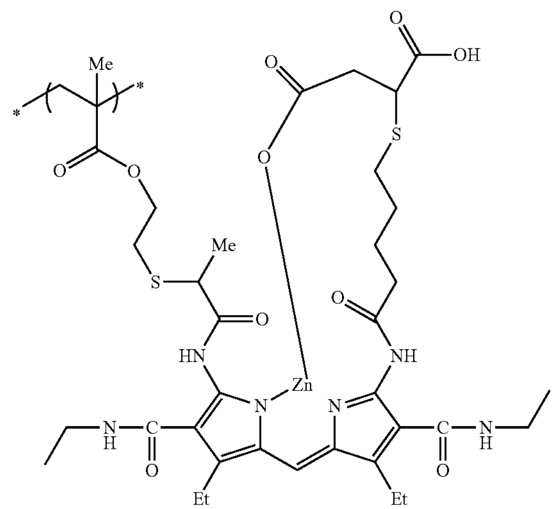
(A-22)
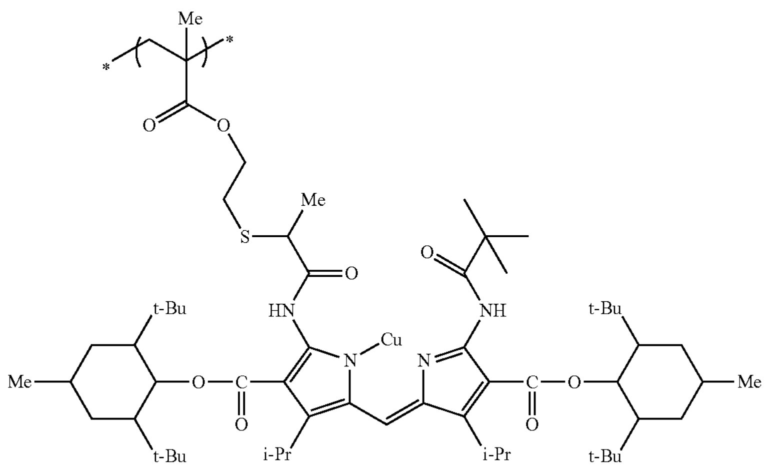
(A-23)
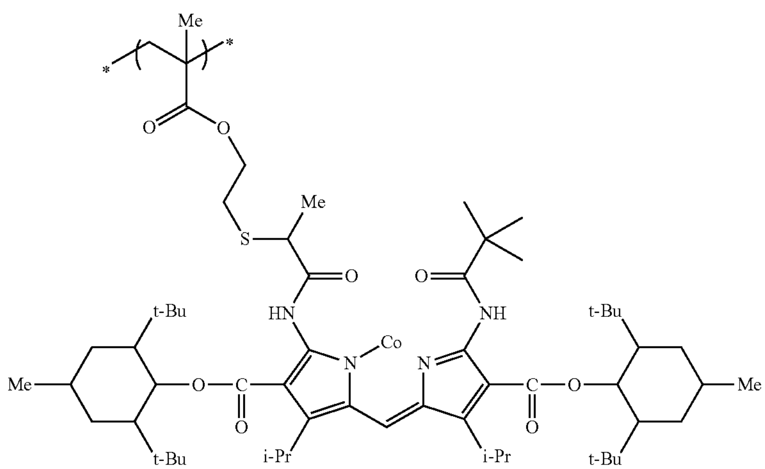

-continued
(A-24)
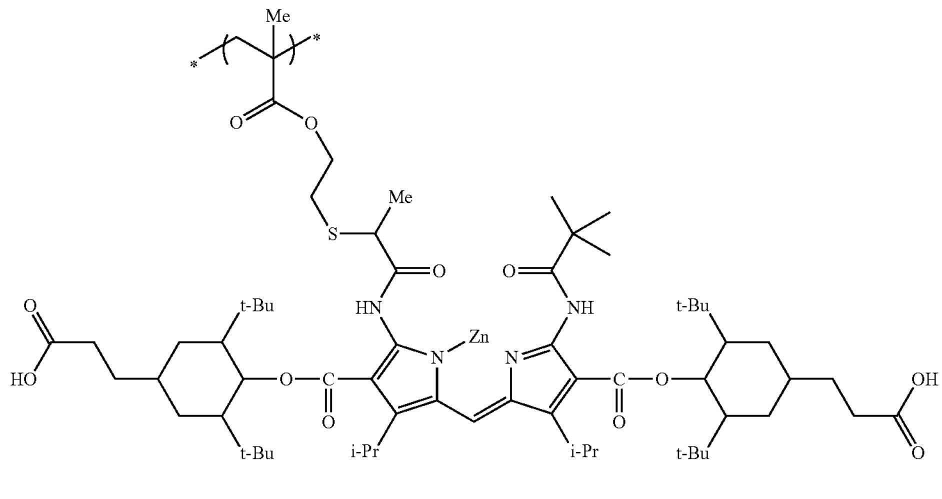
(A-25)
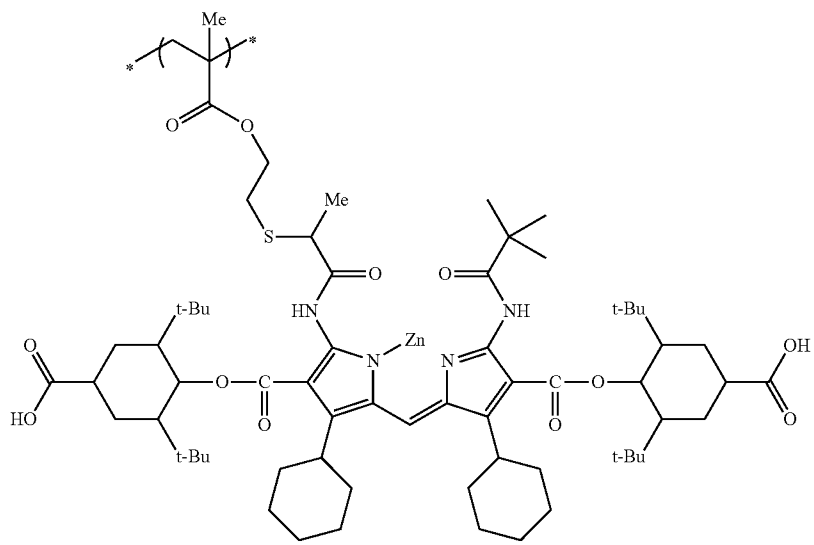
(A-26)
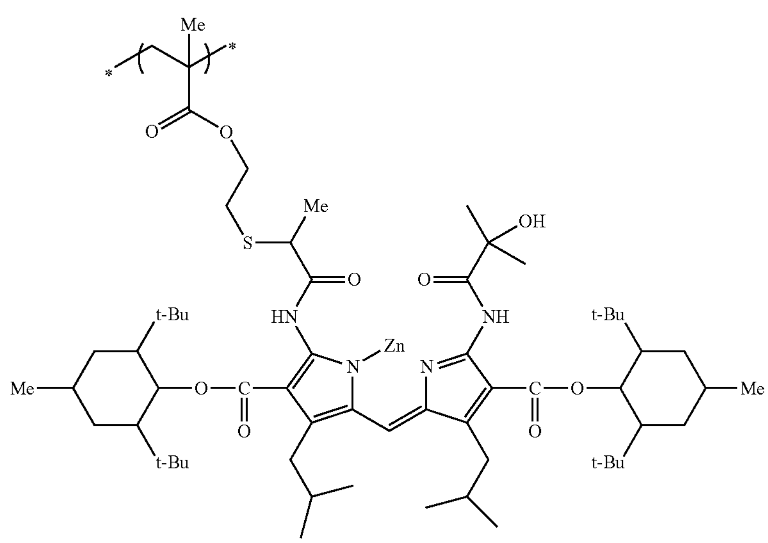

-continued
(A-27)
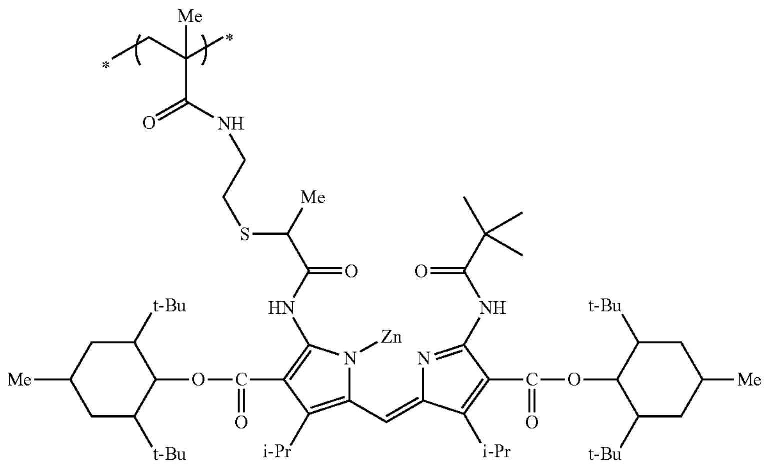
(A-28)
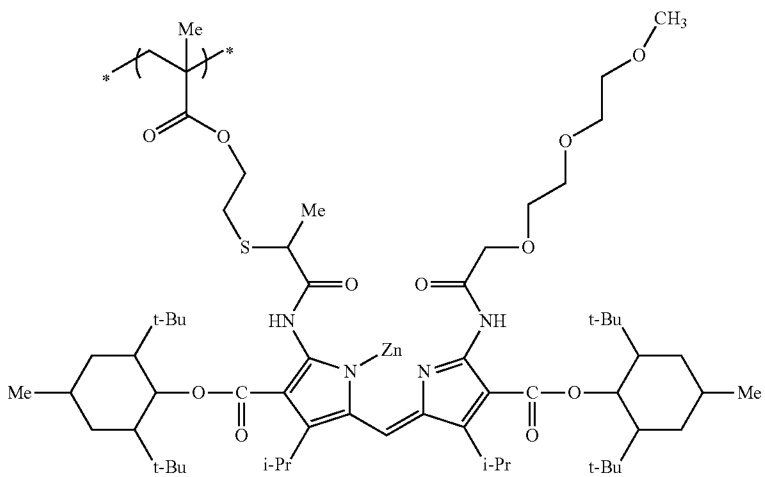
(A-29)
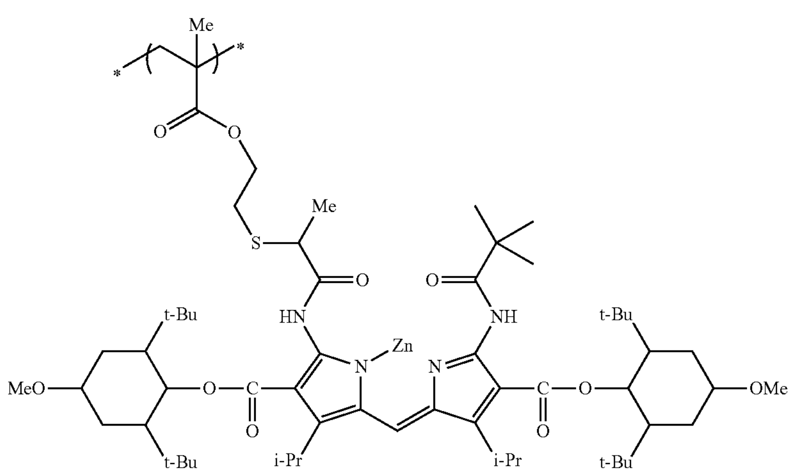

-continued
(A-30)
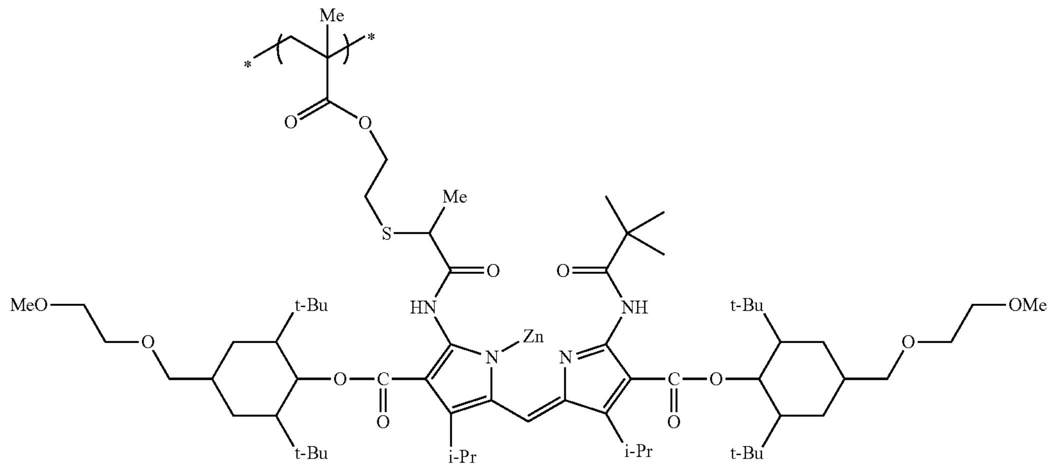
(A-31)
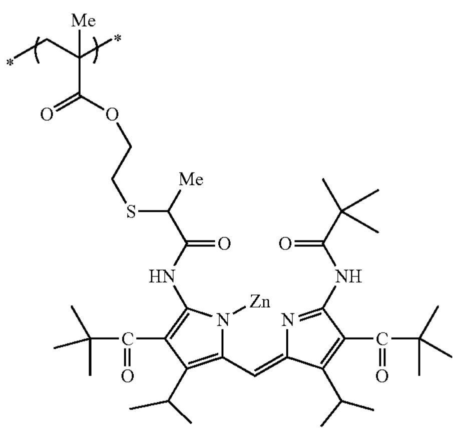
(A-32)
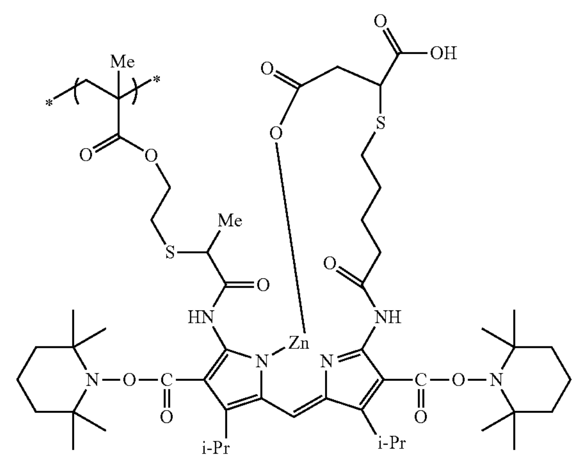
(A-33)
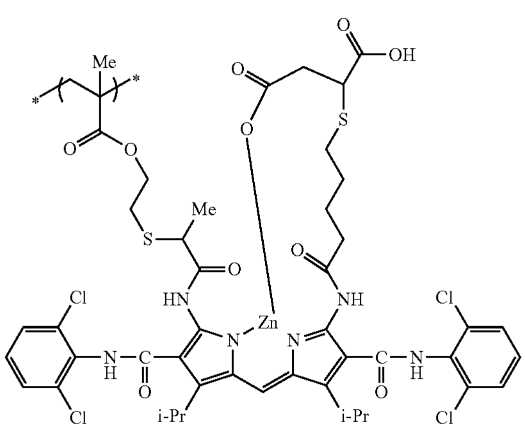
(A-34)
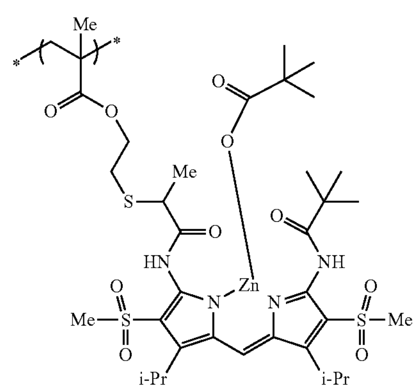

-continued
(A-35)
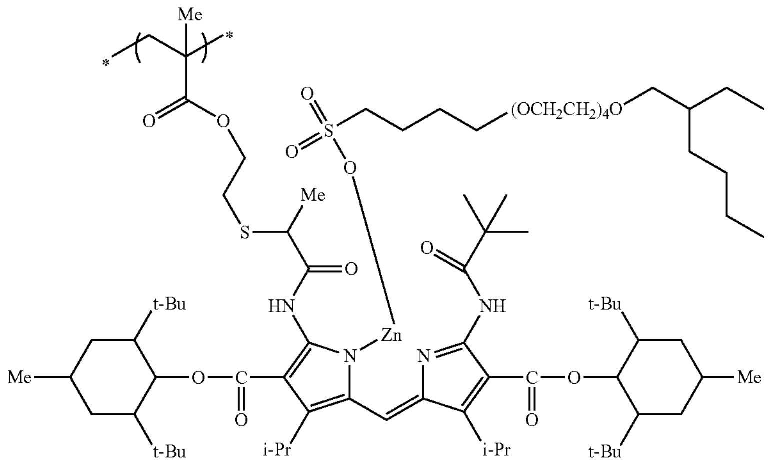
(A-36)
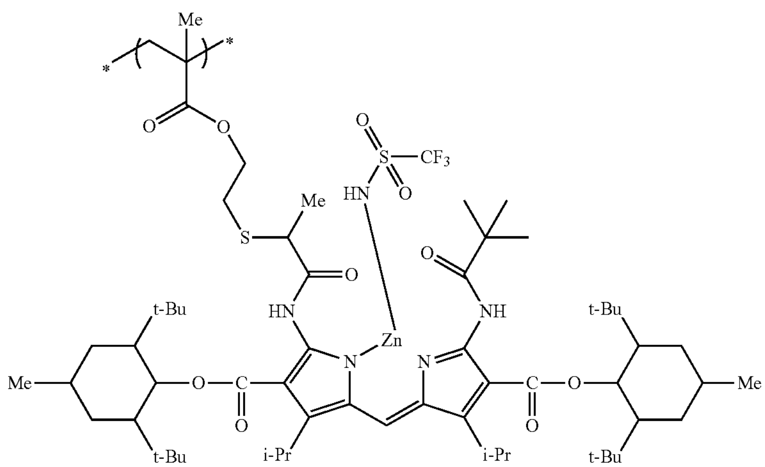
(A-37)
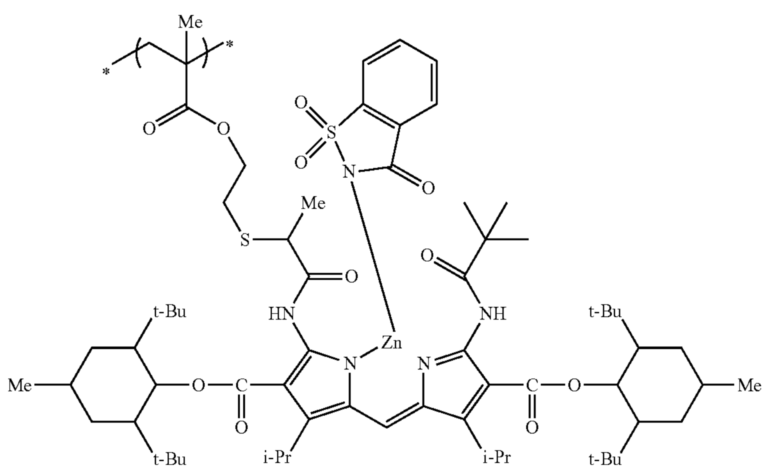

-continued (A-38)

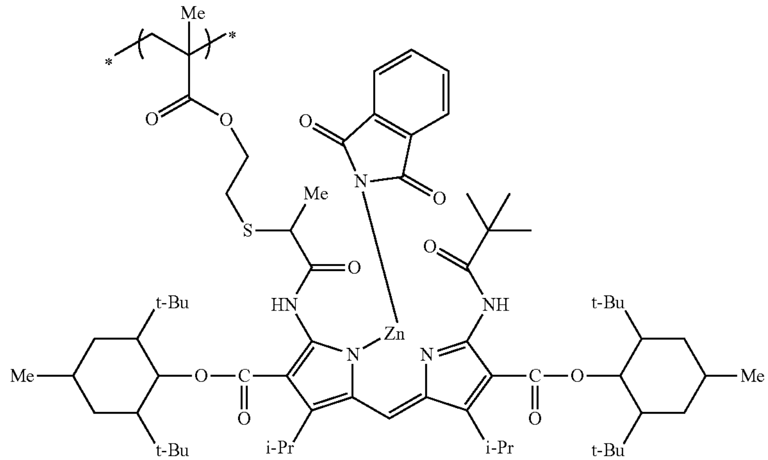

(A-39)

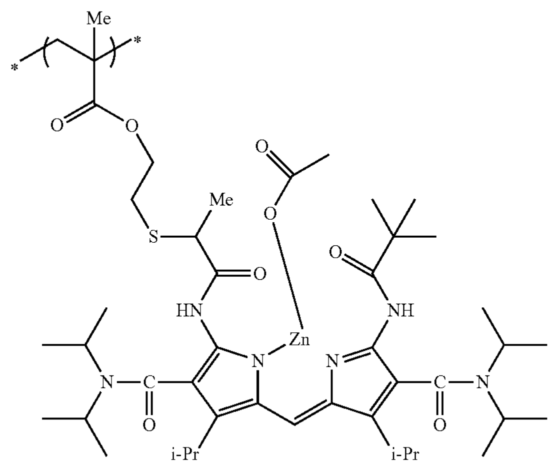

Constituent Unit Represented by Formula (B)

Hereinbelow, the details of the constituent units represented by Formula (B) are explained.

Formula (B)

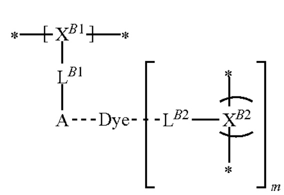

In Formula (B), $X^{B1}$ represents a linking group formed by polymerization; $L^{B1}$ represents a single bond or a divalent linking group; A represents a group that can be bonded to "Dye" via an ionic bond or a coordinate bond; "Dye" represents a colorant residue having a group that can be bonded to A, via an ionic bond or a coordinate bond, on a substituent in the dipyrromethene metal complex compound obtained from (i) the dipyrromethene compound represented by Formula (M) and a metal or (ii) a metal compound; $X^{B2}$ represents a linking group formed by polymerization; $L^{B2}$ represents a single bond or a divalent linking group; m represents an integer of from 0 to 3; and "Dye" and $L^{B2}$ may be linked to each other by a covalent bond, an ionic bond or a coordinate bond.

In Formula (B), m represents an integer of from 0 to 3. When m represents 2 or 3, each $X^{B2}$ may be the same as or different from one another. When m represents 2 or 3, each $L^{B2}$ may be the same as or different from one another.

In Formula (B), the group represented by $X^{B1}$ and $X^{B2}$, and the group represented by $L^{B1}$ and $L^{B2}$ have the same definition as $X^{A1}$ and $X^{A2}$, and $L^{A1}$ and $L^{A2}$ in Formula (A), respectively, and have the same preferable definition as $X^{A1}$ and $X^{A2}$, and $L^{A1}$ and $L^{A2}$ in Formula (A), respectively.

The group represented by A in Formula (B) is any group as long as the group can be bonded to the "Dye" group via an ionic bond or a coordinate bond. Examples of the group that can be bonded to the "Dye" group via an ionic bond may be an anionic group or a cationic group. Examples of the anionic group include an anionic group having a pKa of 12 or less, preferably a pKa of 7 or less, more preferably a pKa of 5 or less, such as a carboxy group, a phosphonic acid group, a sulfonic acid group, an acyl sulfonamido group or a sulfonimido group. The anionic group may be linked with Ma or a heterocyclic group in the "Dye" via an ionic bond or a coordinate bond, and is preferably linked with Ma via an ionic bond. Preferable examples of the anionic groups include the following, but the invention is not particularly limited to these examples. In the anionic groups shown below, each R independently represents a hydrogen atom, an alkyl group, an aryl group or a heterocyclic group.

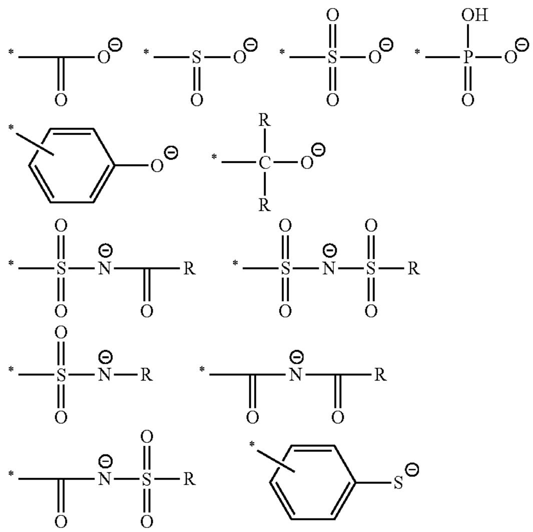

-continued

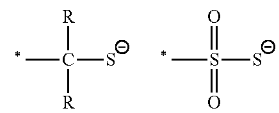

The cationic group represented by A in Formula (B) is preferably a substituted or unsubstituted onium cation (such as a substituted or unsubstituted ammonium group, a substituted or unsubstituted pyridinium group, a substituted or unsubstituted imidazolium group, a substituted or unsubstituted sulfonium group, or a substituted or unsubstituted phosphonium group), and more preferably a substituted ammonium group.

Specific examples of the constituent unit represented by Formula (B) include the following, but the invention is not particularly limited to these examples.

(B-1)

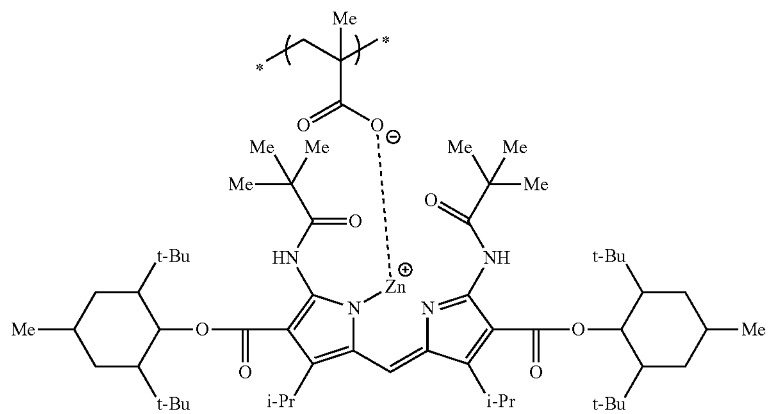

(B-2)

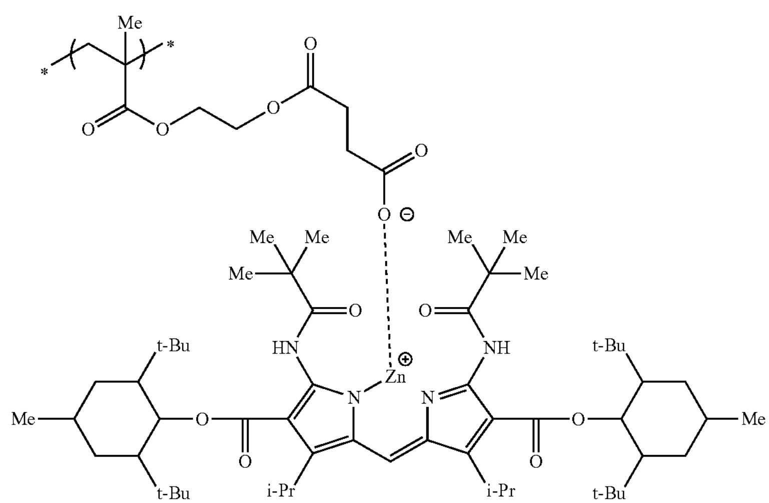

-continued
(B-3)
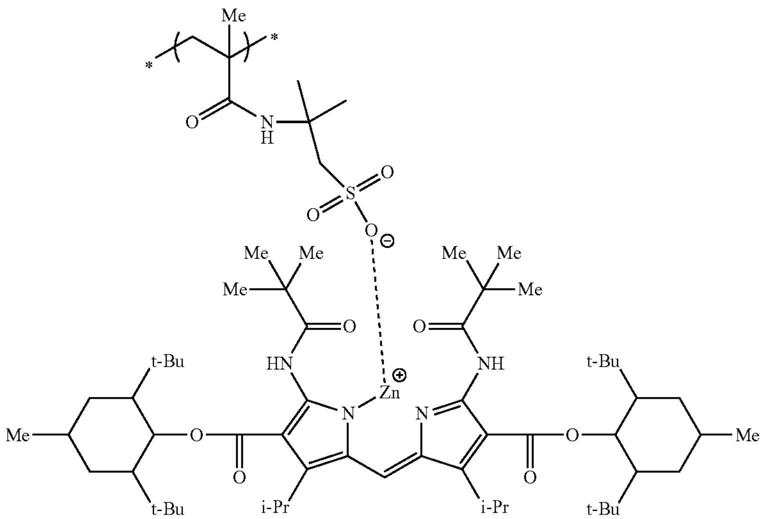
(B-4)
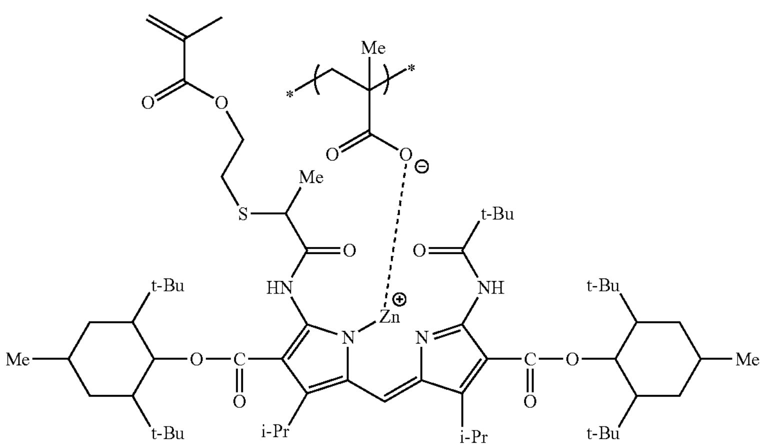
(B-5)
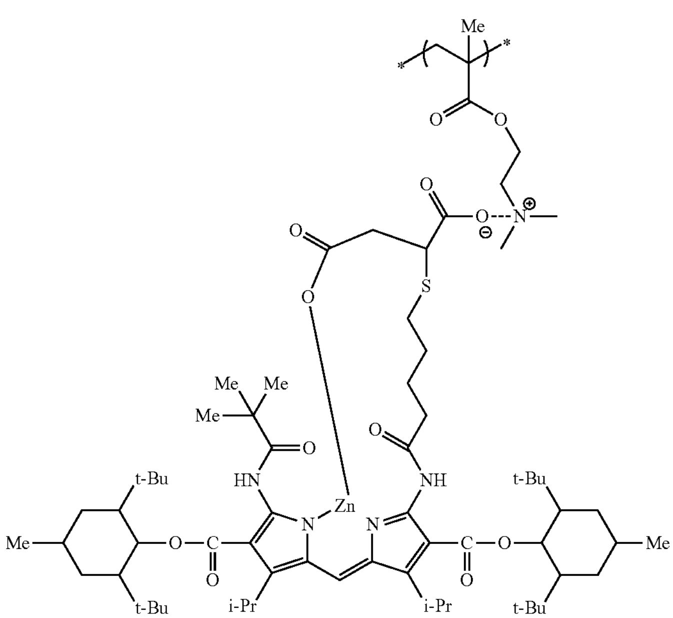

-continued (B-6)

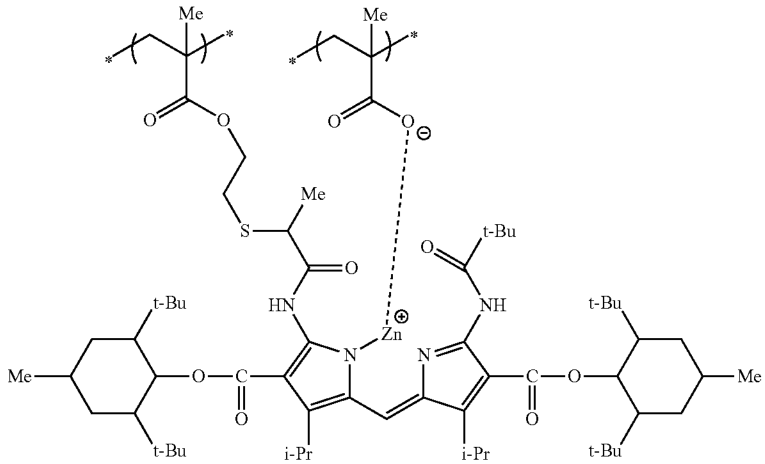

(B-7)

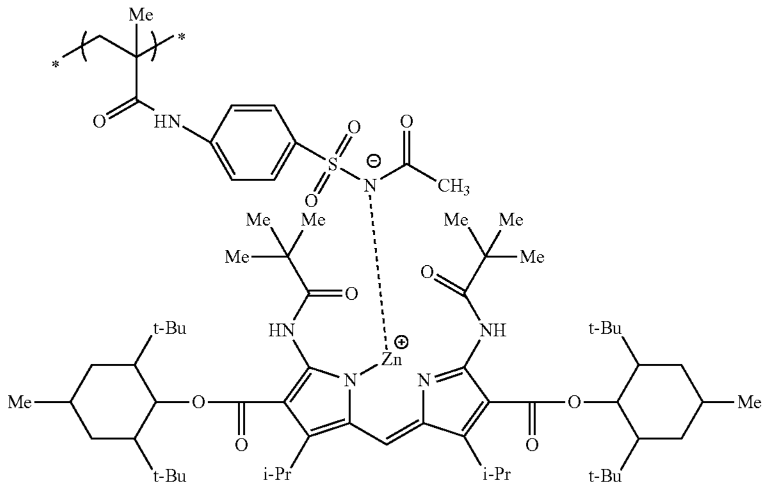

(B-8)

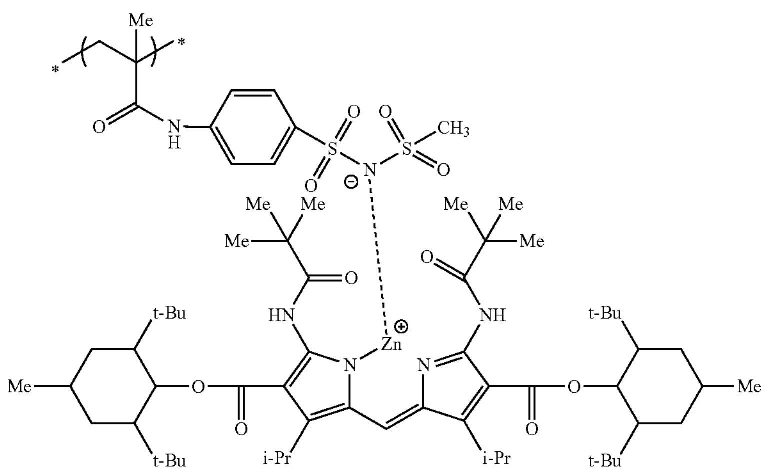

Constituent Unit Represented by Formula (C)

Hereinbelow, the details of the constituent unit represented by Formula (C) are described.

$$*\text{-[-Dye-}(L^{C1})n\text{-]-}*\qquad \text{Formula (C)}$$

In Formula (C), $L^{C1}$ represents a single bond or a divalent linking group; and "Dye" represents a colorant residue formed by removing any two of hydrogen atoms from the dipyrromethene metal complex compound obtained from (i) the dipyrromethene compound represented by Formula (M) and (ii) a metal or a metal compound. "Dye" preferably represents a colorant residue formed by removing any two hydrogen atoms from the dipyrromethene metal complex compound represented by Formula (5) or Formula (6). n represents an integer of from 1 to 4. When n represents an integer of 2 or more, each $L^{C1}$ may be the same as or different from one another.

In Formula (C), examples of the divalent linking group represented by $L^{C1}$ include a substituted or unsubstituted straight-chain, branched-chain or cyclic alkylene group having 1 to 30 carbon atoms (such as a methylene group, an ethylene group, a trimethylene group, a propylene group or a butylene group); a substituted or unsubstituted arylene group having 6 to 30 carbon atoms (such as a phenylene group or a naphthalene group); a substituted or unsubstituted heterocyclic linking group; —$CH_2$═$CH_2$—, —O—, —S—, —NR—, —C(═O)—, —SO—, —$SO_2$—; and a linking group formed by linking two or more of these groups such as —N(R)C(═O)—, —OC(═O)—, —C(═O)N(R)—, —C(═O)O—, or —N(R)C(═O)N(R)— (here, each R independently represents a hydrogen atom, an alkyl group, an aryl group or a heterocyclic group).

Preferable examples of the divalent linking group represented by $L^{C1}$ in Formula (C) includes the followings, but $L^{C1}$ is not limited to these examples.

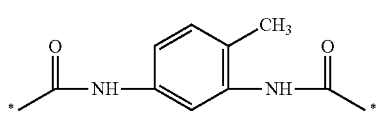

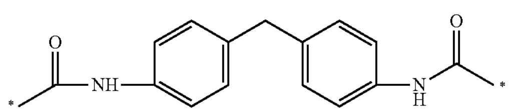

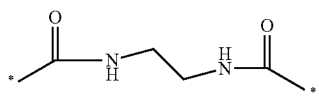

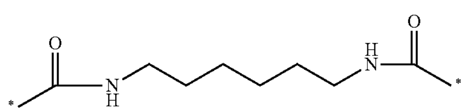

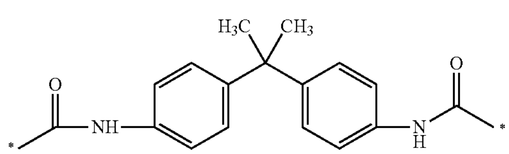

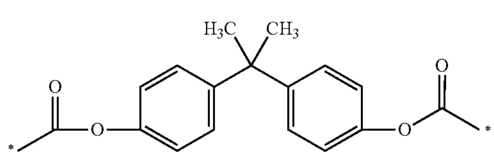

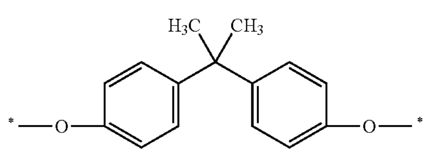

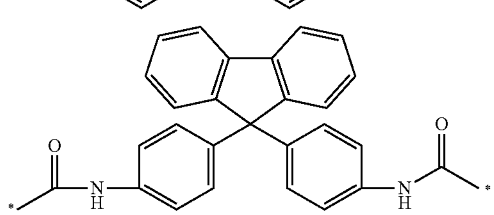

-continued

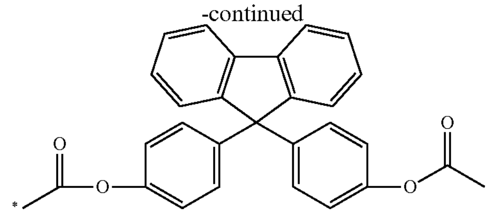

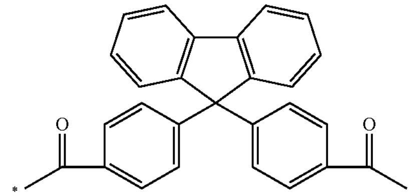

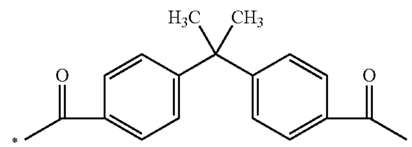

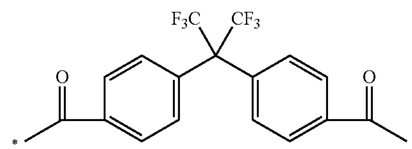

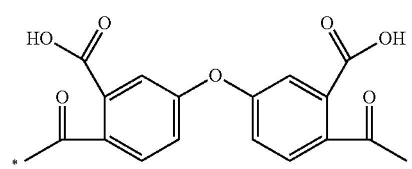

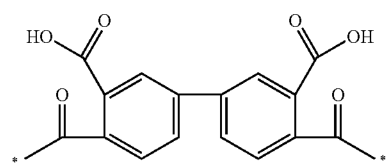

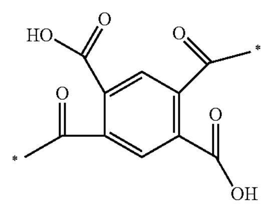

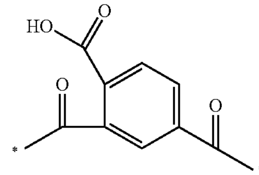

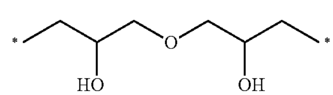

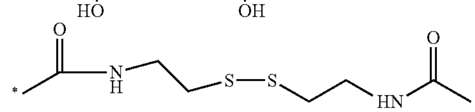

Specific examples of the constituent units represented by Formula (C) include the following, but the invention is not particularly limited to these examples.

(C-1)
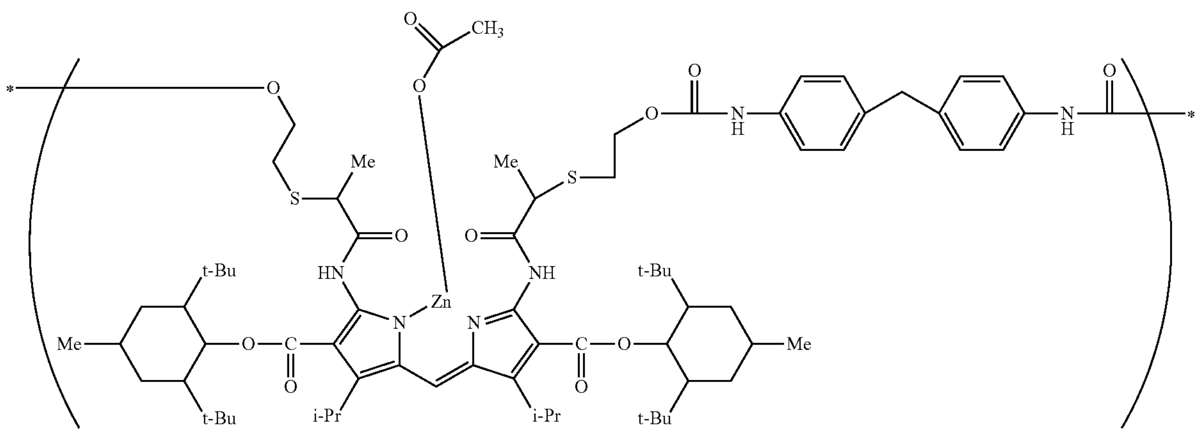
(C-2)
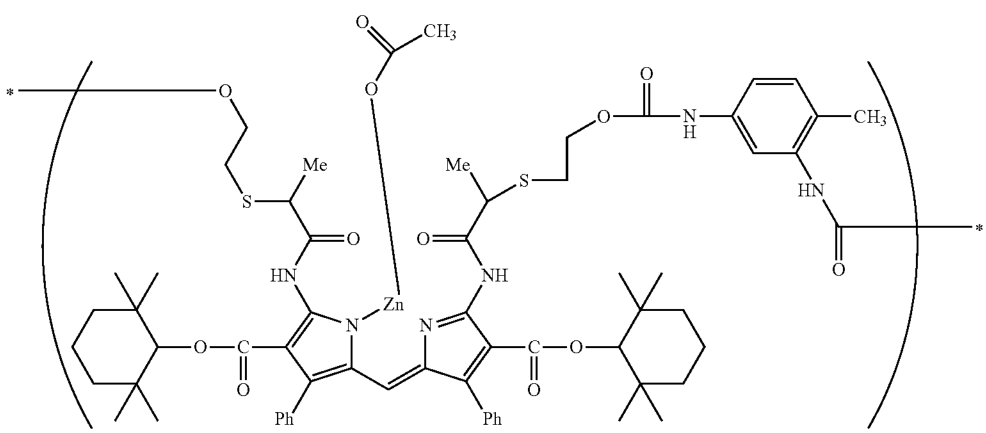
(C-3)
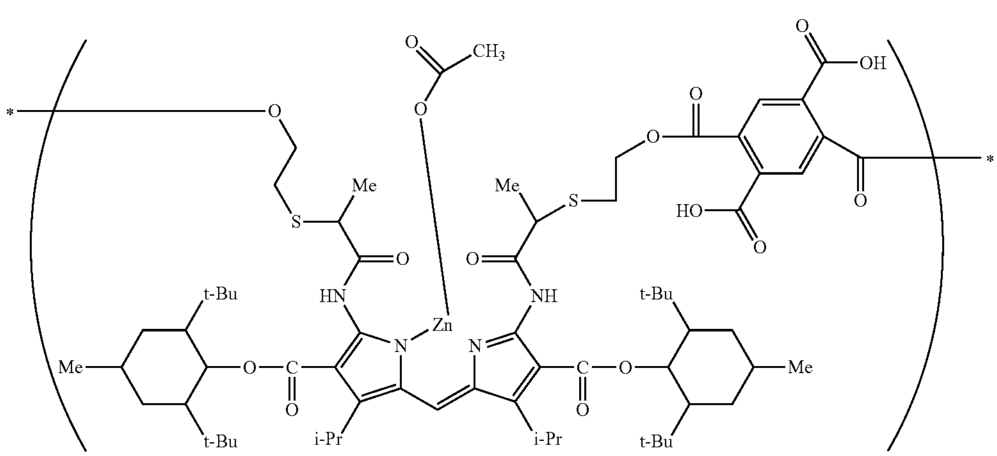

-continued (C-4)

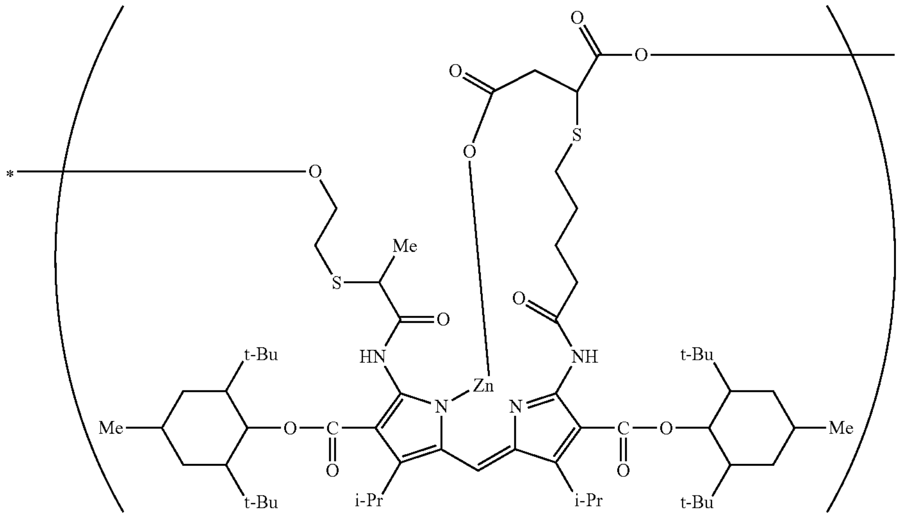

(C-5)

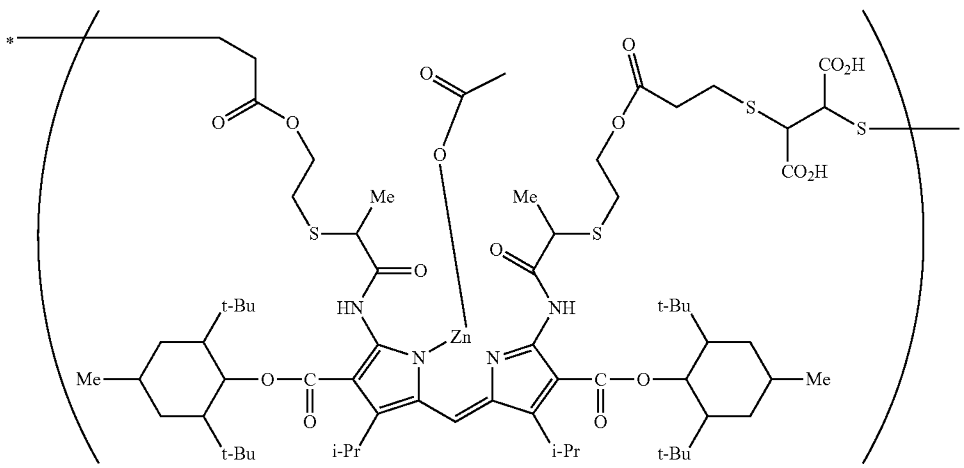

Copolymerization Component

The colorant multimer of the invention may be formed only by the constituent units represented by Formula (A), Formula (B) and/or Formula (C), but may be multimerized with other constituent units. Preferable examples of the other units include the following constituent units. Specific examples thereof are shown below, but the invention is not particularly limited to these examples.

(H-1)

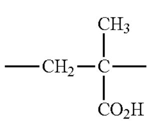

(H-2)

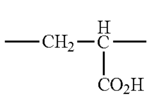

(H-3)

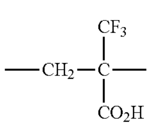

-continued (H-4)

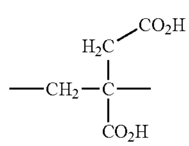

(H-5)

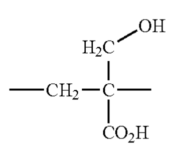

(H-6)

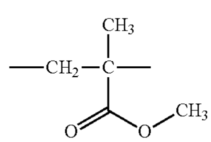

(H-7)

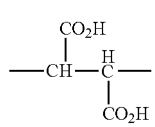

-continued
(H-8)
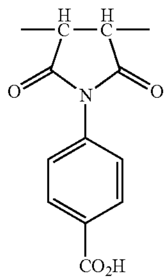
(H-9)
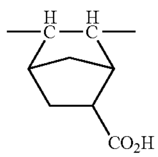
(H-10)
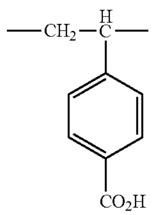
(H-11)
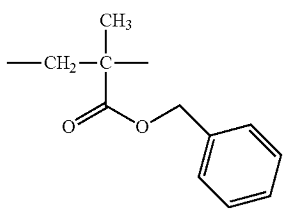
(H-12)
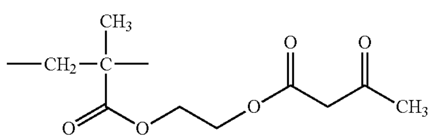
(H-13)
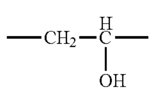
(H-14)
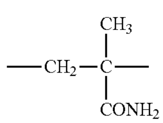
(H-15)
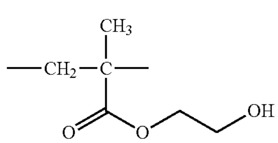
(H-16)
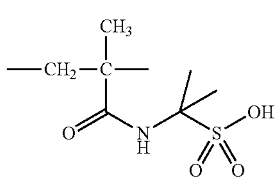
-continued
(H-17)
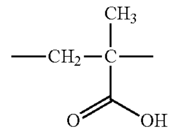
(H-18)
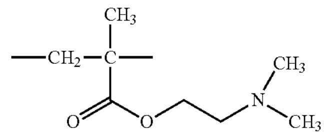
(H-19)
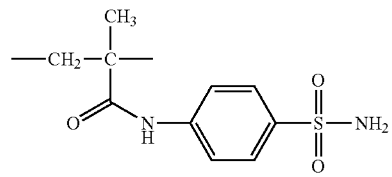
(H-20)
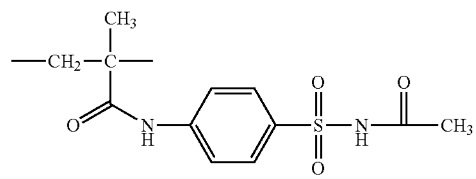
(H-21)
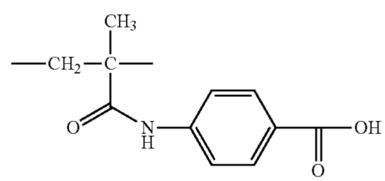
(H-22)
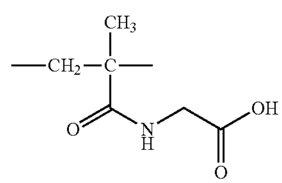
(H-23)
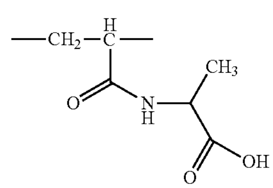
(H-24)
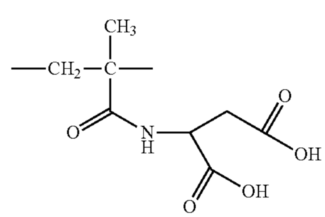

-continued (H-24)

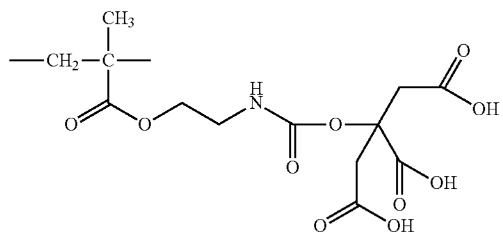

(H-25)

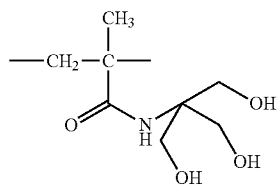

Colorant Multimer Represented by Formula (D)

The details the colorant multimer represented by Formula (D) are explained below.

$$(L_{D1}) \!-\!\!(\text{Dye})_m \qquad \text{Formula (D)}$$

In Formula (D), $L^{D1}$ represents an m-valent linking group; m represents an integer of from 2 to 100; and "Dye" represents a colorant residue formed by removing any one hydrogen atom from the dipyrromethene metal complex compound obtained from (i) the dipyrromethene compound represented by Formula (M) and (ii) a metal or a metal compound. "Dye" preferably represents a colorant residue formed by removing any one hydrogen atom from the dipyrromethene metal complex compound represented by Formula (5) or Formula (6).

In Formula (D), m preferably represents an integer of from 2 to 80, more preferably from 2 to 40, and still more preferably from 2 to 10. Each colorant residue ("Dye") bonded to the linking group represented by $L^{D1}$ may be the same as or different from one another. In view of synthesis suitability, it is preferable that each "Dye" is the same as one another.

In Formula (D), when m represents 2, preferable examples of the divalent linking group represented by $L^{D1}$ include a substituted or unsubstituted straight-chain, branched-chain or cyclic alkylene group having 1 to 30 carbon atoms (such as a methylene group, an ethylene group, a trimethylene group, a propylene group or a butylene group); a substituted or unsubstituted arylene group having 6 to 30 carbon atoms (such as a phenylene group or a naphthalene group); a substituted or unsubstituted heterocyclic linking group; —$CH_2$═$CH_2$—, —O—, —S—, —NR—, —C(═O)—, —SO—, —$SO_2$—; and a linking group formed by linking two or more of these groups such as —N(R)C(═O)—, —OC(═O)—, —C(═O)N(R)—, —C(═O)O—, or —N(R)C(═O)N(R)— (here, each R independently represents a hydrogen atom, an alkyl group, an aryl group, or a heterocyclic group).

When m represents an integer of 3 or more, examples of an m-valent linking group include a substituted or unsubstituted arylene group (such as a 1,3,5-phenylene group, a 1,2,4-phenylene group or a 1,4,5,8-naphthalene group), a heterocyclic linking group (such as a 1,3,5-triazine group), and a linking group formed by the substitution of an alkylene linking group or the like as a mother skeleton by the divalent linking group described above.

Specific examples of the colorant multimer represented by Formula (D) include the following, but the invention is not particularly limited to these examples.

(D-1)

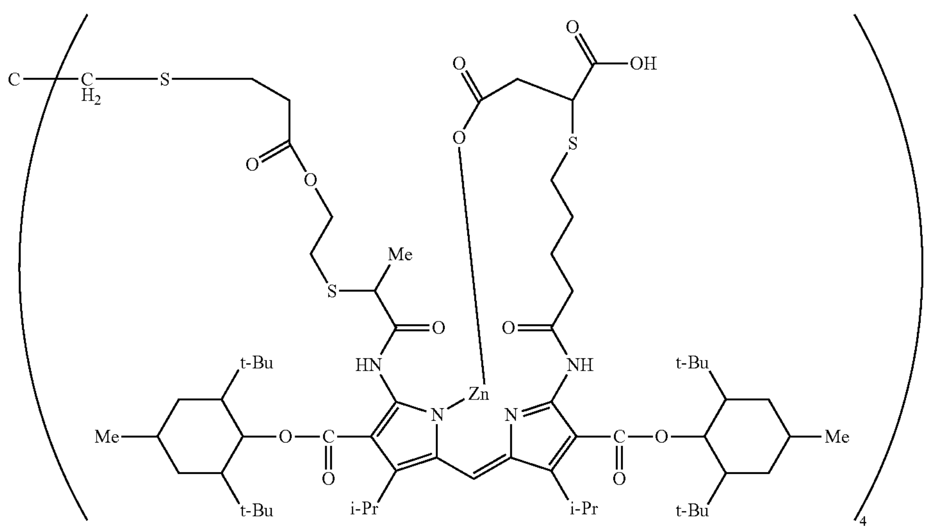

(D-2)

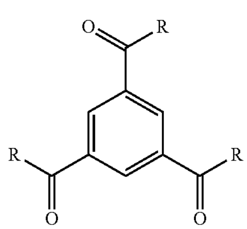

-continued
R:
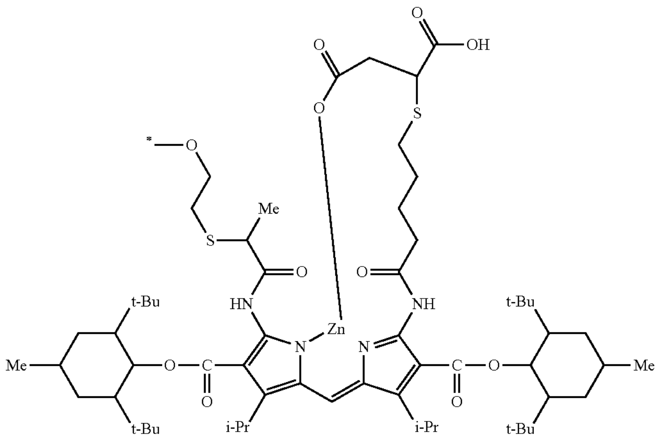
(D-3)
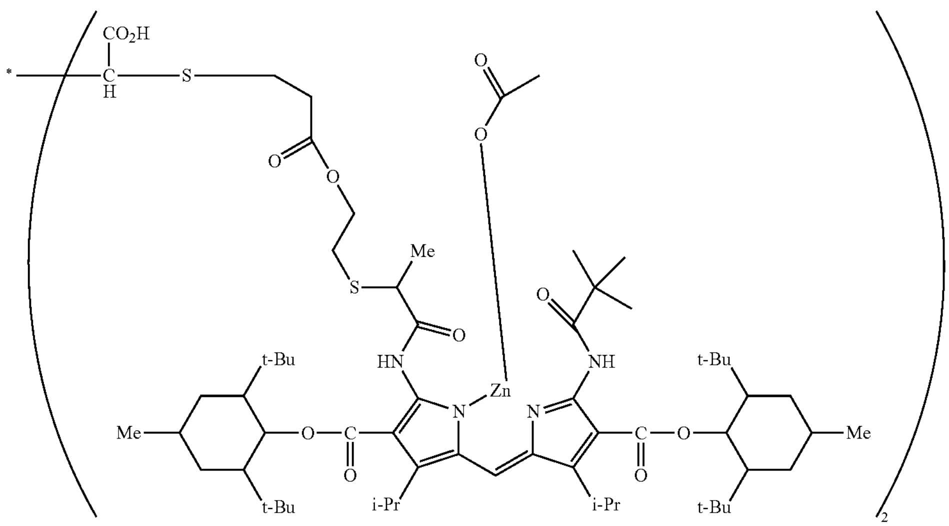
(D-4)
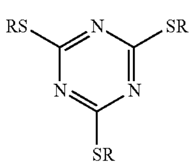
R:
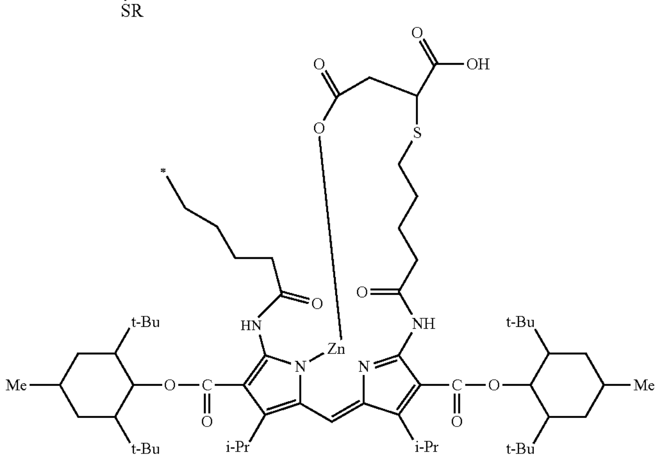

-continued
(D-5)
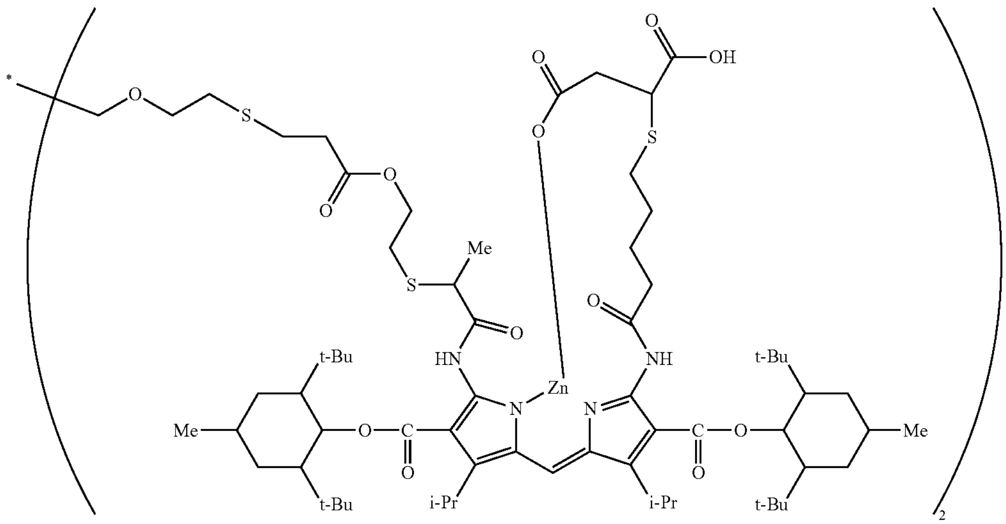
(D-6)
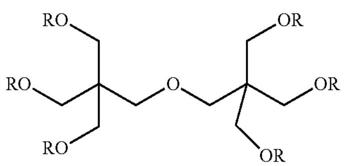
R:
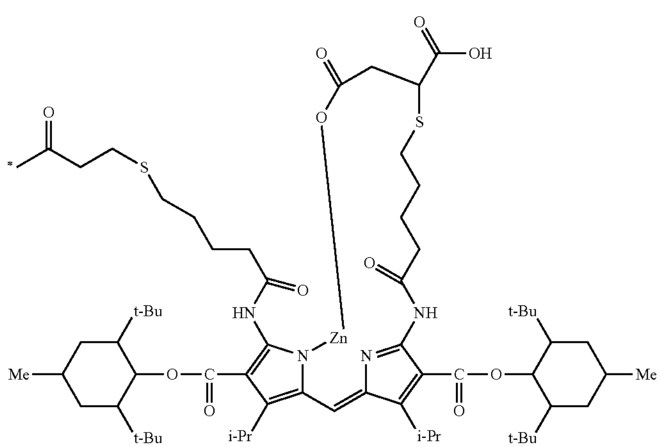
(D-7)
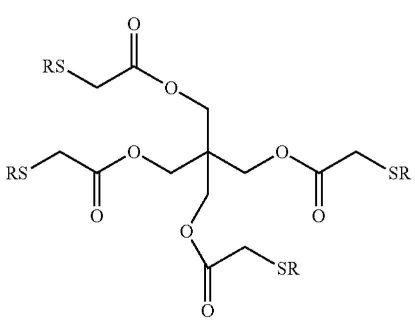

-continued

R:

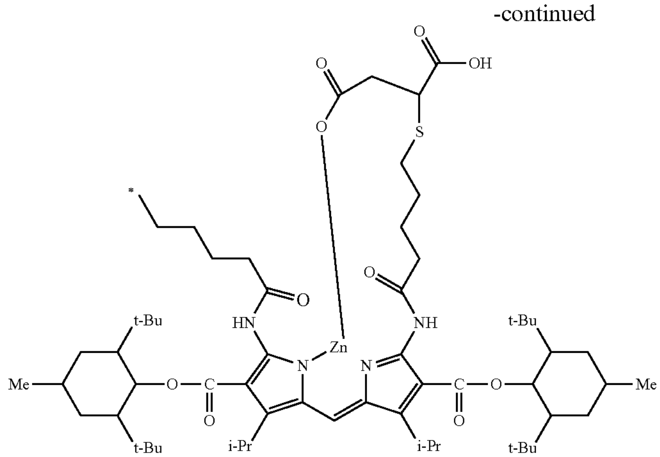

Hereinbelow, preferable examples of the colorant multimer of the first aspect of the invention are shown in the following Table 1 with a constituent unit (the constituent unit described above), a copolymerization molar ratio, a weight average molecular weight, and a degree of dispersion thereof.

TABLE 1

| | Constituent unit 1 | | Constituent unit 2 | | Constituent unit 3 | | Weight average molecular weight | Degree of dispersion |
|---|---|---|---|---|---|---|---|---|
| | Type | wt % | Type | wt % | Type | wt % | Mw | Mw/Mn |
| S-1 | A-1 | 88 | H-1 | 12 | — | — | 7700 | 1.8 |
| S-2 | A-2 | 100 | — | — | — | — | 7800 | 2.1 |
| S-3 | A-2 | 88 | H-1 | 12 | — | — | 4500 | 1.9 |
| S-4 | A-2 | 88 | H-1 | 12 | — | — | 8100 | 1.8 |
| S-5 | A-2 | 88 | H-1 | 12 | — | — | 12000 | 1.9 |
| S-6 | A-2 | 88 | H-1 | 12 | — | — | 18000 | 1.9 |
| S-7 | A-2 | 82 | H-1 | 12 | H-3 | 6 | 8000 | 2.1 |
| S-8 | A-2 | 82 | H-1 | 12 | H-12 | 6 | 9000 | 2.5 |
| S-9 | A-2 | 82 | H-1 | 12 | H-20 | 6 | 7500 | 1.8 |
| S-10 | A-3 | 88 | H-1 | 12 | — | — | 8000 | 1.7 |
| S-11 | A-4 | 88 | H-1 | 12 | — | — | 7800 | 2.1 |
| S-12 | A-7 | 88 | H-1 | 12 | — | — | 6900 | 2.0 |
| S-13 | A-15 | 88 | H-1 | 12 | — | — | 7200 | 1.9 |
| S-14 | B-1 | 88 | H-1 | 12 | — | — | 7800 | 2.5 |
| S-15 | B-1 | 82 | H-1 | 12 | H-6 | 6 | 8000 | 1.8 |
| S-16 | B-4 | 82 | H-1 | 12 | H-6 | 6 | 8200 | 1.8 |
| S-17 | B-5 | 82 | H-1 | 12 | H-18 | 6 | 7500 | 1.9 |
| S-18 | B-6 | 88 | H-1 | 12 | | | 8600 | 1.6 |
| S-19 | B-6 | 82 | A-6 | 6 | H-1 | 12 | 9000 | 1.8 |
| S-20 | C-1 | 100 | — | — | — | — | 5200 | 1.2 |
| S-21 | C-5 | 100 | — | — | — | — | 6000 | 1.3 |
| S-22 | D-1 | 100 | — | — | — | — | 4800 | 1.2 |
| S-23 | D-2 | 100 | — | — | — | — | 3900 | 1.4 |
| S-24 | D-4 | 100 | — | — | — | — | 4100 | 1.2 |
| S-25 | D-6 | 100 | — | — | — | — | 5900 | 1.2 |
| S-26 | D-7 | 100 | — | — | — | — | 6800 | 1.1 |

The colorant multimer of the invention preferably includes, as a partial structure, at least one of the constituent unit represented by Formula (A), (B) or (C). The colorant multimer of the invention more preferably includes the constituent unit represented by Formula (A).

Further, the constituent unit represented by Formula (A) is preferably formed with the colorant monomer represented by the following Formula (1) as a polymerization component.

Hereinbelow, the details of the colorant monomer represented by Formula (1) are described.

Colorant Monomer Represented by Formula (1)

The colorant monomer'contained in the colorant multimer of the invention as a polymerization component, that is a compound represented by the following Formula (1), is explained in detail.

Formula (1)

$$\text{Dye-}(L^2)_n\text{—}(L^1)_m\text{—}\underset{}{\overset{R^1}{\overset{|}{C}}}\text{=}CH_2$$

In Formula (1), $R^1$ represents a hydrogen atom, a halogen atom, an alkyl group or an aryl group; $L^1$ represents —N($R^2$)C(=O)—, —OC(=O)—, —C(=O)N($R^2$)—, —C(=O)O—, a group represented by the following Formula (2), a group represented by the following Formula (3), or a group represented by the following Formula (4); $L^2$ represents a divalent linking group; m and n each independently represent 0 or 1; "Dye" represents a colorant residue formed by removing any one hydrogen atom from the dipyrromethene metal complex compound or tautomer thereof obtained from (i) the dipyrromethene compound represented by Formula (M) and (ii) a metal or a metal compound, preferably represents a colorant residue formed by removing any one hydrogen atom from the dipyrromethene metal complex compound represented by Formula (5) or a colorant residue formed by removing one hydrogen atom from any one of the substituents of $R^{11}$ to $R^{17}$, $X^1$, $Y^1$ and $Y^2$ in the dipyrromethene metal complex compound represented by Formula (6); and $R^2$ represents a hydrogen atom, an alkyl group, an aryl group or a heterocyclic group;

Formula (2)

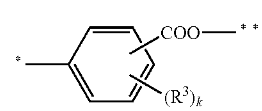

Formula (3)

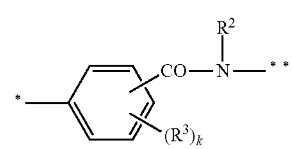

-continued

Formula (4)

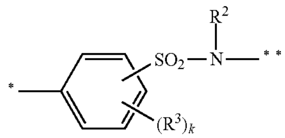

wherein, $R^2$ in Formulae (3) and (4) independently represents a hydrogen atom, an alkyl group, an aryl group or a heterocyclic group; $R^3$ in Formulae (2) to (4) independently represents a hydrogen atom or a substituent; k in Formulae (2) to (4) independently represents an integer of from 0 to 4; * in Formulae (2) to (4) independently represents a position to which the —C($R^1$)═$CH_2$ group in Formula (1) is linked; and ** in Formulae (2) to (4) independently represents a position to which $L^2$ or "Dye" (when n represents 0) in Formula (1) is linked.

Formula (5)

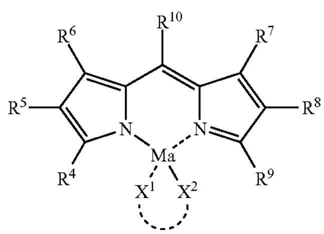

In Formula (5), $R^4$ to $R^9$ each independently represent a hydrogen atom or a substituent; $R^{10}$ represents a hydrogen atom, a halogen atom, an alkyl group, an aryl group or a heterocyclic group; Ma represents a metal atom or a metal compound; $X^1$ represents a group that can be bonded to Ma; $X^2$ represents a group that neutralizes the charge of Ma; and $X^1$ and $X^2$ may be linked to each other to form a 5-, 6-, or 7-membered ring together with Ma. Examples of the dipyrromethene metal complex compound represented by Formula (5) also include tautomers thereof.

Formula (6)

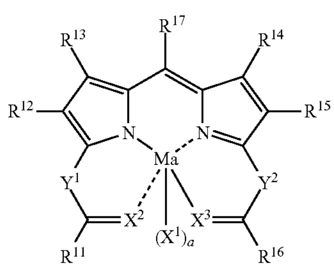

In Formula (6), $R^{11}$ and $R^{16}$ each independently represent an alkyl group, an alkenyl group, an aryl group, a heterocyclic group, an alkoxy group, an aryloxy group, an alkylamino group, an arylamino group or a heterocyclic amino group; $R^{12}$ to $R^{15}$ each independently represent a hydrogen atom or a substituent; $R^{17}$ represents a hydrogen atom, a halogen atom, an alkyl group, an aryl group or a heterocyclic group; Ma represents a metal atom or a metal compound; $X^2$ and $X^3$ each independently represent NR' (wherein R' represents a hydrogen atom, an alkyl group, an alkenyl group, an aryl group, a heterocyclic group, an acyl group, an alkylsulfonyl group or an arylsulfonyl group), a nitrogen atom, an oxygen atom or a sulfur atom; $Y^1$ and $Y^2$ each independently represent NR" (wherein R" represents a hydrogen atom, an alkyl group, an alkenyl group, an aryl group, a heterocyclic group, an acyl group, an alkylsulfonyl group or an arylsulfonyl group), a nitrogen atom or a carbon atom; $R^{11}$ and $Y^1$ may be linked to each other to form a 5-, 6-, or 7-membered ring; $R^{16}$ and $Y^2$ may be linked to each other to form a 5-, 6-, or 7-membered ring; $X^1$ represents a group that can be bonded to Ma; and a represents 0, 1, or 2. Here, when a represents 2, each $X^1$ may be the same as or different from each other. Examples of the dipyrromethene metal complex compound represented by Formula (6) also include tautomers thereof.

That is, the colorant monomer represented by Formula (1) is a compound in which the polymerizable group represented by -$(L^2)_n$-$(L^1)_m$—C($R^1$)═$CH_2$ in Formula (1) is introduced into the dipyrromethene metal complex compound represented by Formula (5) or Formula (6).

When both m and n represent 0, the —C($R^1$)═$CH_2$ group is directly introduced into the dipyrromethene metal, complex compound. Here, $L^1$, $L^2$, and $R^1$ have the same definitions as $L^1$, $L^2$, and $R^1$ in Formula (1), respectively.

In the dipyrromethene metal complex compound represented by Formula (5), the position into which the polymerizable group is introduced is not particularly limited, but is preferably introduced into any one of $R^4$ to $R^9$, more preferably any one of $R^4$, $R^6$, $R^7$, and $R^9$, and still more preferably $R^4$ or $R^9$ in view of the synthetic suitability.

In the dipyrromethene metal complex compound represented by Formula (6), the position into which the polymerizable group is introduced is any one of $R^{11}$ to $R^{17}$, $X^1$, $Y^1$ and $Y^2$. In view of the synthetic suitability, the polymerizable group is preferably introduced into any one of $R^{11}$ to $R^{16}$ and $X^1$, more preferably any one of $R^{11}$, $R^{13}$, $R^{14}$ and $R^{16}$, and still more preferably $R^{11}$ or $R^{16}$.

In Formula (1), $R^1$ represents a hydrogen atom, a halogen atom, an alkyl group, or an aryl group. When $R^1$ represents an alkyl group or an aryl group, the alkyl group or the aryl group may be unsubstituted or substituted.

When $R^1$ is represents an alkyl group, the alkyl group is preferably a substituted or unsubstituted straight-chain, branched-chain or cyclic alkyl group having 1 to 36, more preferably 1 to 6 carbon atoms. Examples of the alkyl group include a methyl group, an ethyl group, a propyl group, a butyl group, an octyl group, an isopropyl group and a cyclohexyl group.

When $R^1$ represents an aryl group, the aryl group is preferably a substituted or unsubstituted aryl group having 6 to 18, more preferably 6 to 14, and still more preferably 6 to 12 carbon atoms. Examples of the aryl group include a phenyl group and a naphthyl group.

When $R^1$ represents a substituted alkyl group or a substituted aryl group, examples of the substituent include a halogen atom (such as a fluorine atom, a chlorine atom, a bromine atom or an iodine atom), an alkyl group (an alkyl group having preferably 1 to 24, more preferably 1 to 12 carbon atoms, such as a methyl group, an ethyl group, a propyl group, a butyl group, an isopropyl group, a t-butyl group, a 2-ethylhexyl group, a dodecyl group, a cyclopropyl group, a cyclopentyl group, a cyclohexyl group or an adamantly group), an aryl group (an aryl group having preferably 6 to 24, more preferably 6 to 12 carbon atoms, such as a phenyl group or a naphthyl group), a heterocyclic group (a heterocyclic group having preferably 1 to 24, more preferably 1 to 12 carbon atoms, such as a 2-thienyl group, a 4-pyridyl group, a 2-furyl group, a 2-pyrimidinyl group, a 1-pyridyl group, a 2-benzothiazolyl group, a 1-imidazolyl group, a 1-pyrazolyl group or a benzotriazol-1-yl group), a silyl group (a silyl group having preferably 3 to 24, more preferably 3 to 12 carbon atoms, such as a trimethylsilyl group, a triethylsilyl group, a tributylsilyl group, a t-butyldimethylsilyl group or a t-hexyldimethylsilyl group), a hydroxy group, a cyano group, a nitro group, a sulfonic acid group, a phosphonic acid group, a carboxy group, an alkoxy group (an alkoxy group having preferably 1 to 24, more preferably 1 to 12, still more preferably 1 to 6 carbon atoms, such as a methoxy group, an ethoxy group, a 1-butoxy group, a 2-butoxy group, isopropoxy group, a t-butoxy group, a dodecyloxy group, or a cycloalkyloxy group such as a cyclopentyloxy group or a cyclohexyloxy group), an aryloxy group (an aryloxy group having preferably 6 to 24, more preferably 6 to 12 carbon atoms, such as a phenoxy group or a 1-naphthoxy group), a heterocyclic oxy group (an alkoxy group having preferably 1 to 24, more preferably 1 to 12 carbon atoms, such as a 1-phenyltetrazole-5-oxy group or a 2-tetrahydropyranyloxy group), a silyloxy group (a silyloxy group having preferably 1 to 24, more preferably 1 to 12 carbon atoms, such as a trimethylsilyloxy group, a t-butyldimethylsilyloxy group or a diphenylmethylsilyloxy group), an acyloxy group (an acetoxy group having preferably 2 to 24, more preferably 2 to 12 carbon atoms, such as an acetoxy group, a pivaloyloxy group, a benzoyloxy group or a dodecanoyloxy group), an alkoxycarbonyloxy group (an alkoxycarbonyloxy group having preferably 2 to 24, more preferably 2 to 12, sill more preferably 2 to 6 carbon atoms, such as an ethoxycarbonyloxy group, a t-butoxycarbonyloxy group, or a cycloalkyloxycarbonyloxy group such as a cyclohexyloxycarbonyloxy group), an aryloxycarbonyloxy group (an aryloxycarbonyl oxy group having preferably 7 to 24, more preferably 7 to 12 carbon atoms, such as a phenoxycarbonyloxy group), a carbamoyloxy group (a carbamoyloxy group having preferably 1 to 24, more preferably 1 to 12, still more preferably 1 to 6 carbon atoms, such as an N,N-dimethylcarbamoyloxy group, an N-butylcarbamoyloxy group, an N-phenylcarbamoyloxy group or an N-ethyl-N-phenylcarbamoyloxy group), a sulfamoyloxy group (sulfamoyloxy group having preferably 1 to 24, more preferably 1 to 12, still more preferably 1 to 6 carbon atoms, such as an N,N-diethylsulfamoyloxy group or an N-propylsulfamoyloxy group), an alkylsulfonyloxy group (an alkylsulfonyloxy group having preferably 1 to 24, more preferably 1 to 12, still more preferably 1 to 6 carbon atoms, such as a methylsulfonyloxy group, a hexadecylsulfonyloxy group or a cyclohexylsulfonyloxy group), an arylsulfonyloxy group (an arylsulfonyloxy group having preferably 6 to 24, more preferably 6 to 12 carbon atoms, such as a phenylsulfonyloxy group), an acyl group (an acyl group having preferably 1 to 24, more preferably 1 to 12 carbon atoms, such as a formyl group, an acetyl group, a pivaloyl group, a benzoyl group, a tetradecanoyl group or a cyclohexanoyl group);

an alkoxycarbonyl group (an alkoxycarbonyl group having preferably 2 to 24, more preferably 2 to 12, still more preferably 2 to 6 carbon atoms, such as a methoxycarbonyl group, an ethoxycarbonyl group, an octadecyloxycarbonyl group or a cyclohexyloxycarbonyl group), an aryloxycarbonyl group (an aryloxycarbonyl group having preferably 7 to 24, more preferably 7 to 12 carbon atoms, such as a phenoxycarbonyl group), a carbamoyl group (a carbamoyl group having preferably 1 to 24, more preferably 1 to 12 carbon atoms, such as a carbamoyl group, an N,N-diethylcarbamoyl group, an N-ethyl-N-octylcarbamoyl group, an N,N-dibutylcarbamoyl group, an N-propylcarbamoyl group, an N-phenylcarbamoyl group, a N-methyl-N-phenylcarbamoyl group or an N,N-dicyclohexylcarbamoyl group), an amino group (an amino group having preferably 24 or less, more preferably 12 or less carbon atoms, such as an amino group, a methylamino group, an N,N-dibutylamino group, a tetradecylamino group, a 2-ethylhexylamino group or a cyclohexylamino group), an anilino group (an anilino group having preferably 6 to 24, more preferably 6 to 12 carbon atoms, such as an anilino group or an N-methylanilino group), a heterocyclic amino group (a heterocyclic amino group having preferably 1 to 24, more preferably 1 to 12 carbon atoms, such as a 4-pyridylamino group), a carbonamido group (a carbonamido group having preferably 2 to 24, more preferably 2 to 12-carbon atoms, such as an acetamido group, a benzamido group, a tetradecanamido group, a pivaloylamido group or a cyclohexanamido group), an ureido group (an ureido group having preferably 1 to 24, more preferably 1 to 12 carbon atoms, such as an ureido group, an N,N-dimethylureido group or an N-phenylureido group), an imido group (an imido group having preferably 20 or less, more preferably 12 or less carbon atoms, such as an N-succinimido group or an N-phthalimido group), an alkoxycarbonylamino group (an alkoxycarbonylamino group having preferably 2 to 24, more preferably 2 to 12 carbon atoms, such as a methoxycarbonylamino group, an ethoxycarbonylamino group, a t-butoxycarbonylamino group, an octadecyloxycarbonylamino group or a cyclohexyloxycarbonylamino group), an aryloxycarbonylamino group (an aryloxycarbonylamino group having preferably 7 to 24, more preferably 7 to 12 carbon atoms, such as an phenoxycarbonylamino group), a sulfonamido group (a sulfonamido group having preferably 1 to 24, more preferably 1 to 12 carbon atoms, such as a methanesulfonamido group, a butanesulfonamido group, a benzenesulfonamido group, a hexadecanesulfonamido group or a cyclohexanesulfonamido group), a sulfamoylamino group (a sulfamoylamino group having preferably 1 to 24, more preferably 1 to 12 carbon atoms, such as an N,N-dipropylsulfamoylamino group or an N-ethyl-N-dodecylsulfamoylamino group), an azo group (an azo group having preferably 1 to 24, more preferably 1 to 12 carbon atoms, such as a phenylazo group or a 3-pyrazolylazo group), an alkylthio group (an alkylthio group having preferably 1 to 24, more preferably 1 to 12 carbon atoms, such as a methylthio group, an ethylthio group, an octylthio group or a cyclohexylthio group), an arylthio group (an arylthio group having preferably 6 to 24, more preferably 6 to 12 carbon atoms, such as a phenylthio group), a heterocyclic thio group (a heterocyclic thio group having preferably 1 to 24, more preferably 1 to 12 carbon atoms, such as a 2-benzothiazolylthio group, a 2-pyridylthio group or a 1-phenyltetrazolylthio group), an alkylsulfinyl group (an alkylsulfinyl group having preferably 1 to 24, more preferably 1 to 12 carbon atoms, such as a dodecanesulfinyl group);

an arylsulfinyl group (an arylsulfinyl group having preferably 6 to 24, more preferably 6 to 12 carbon atoms, such as a phenylsulfinyl group), an alkylsulfonyl group (an alkylsulfonyl group having preferably 1 to 24, more preferably 1 to 12 carbon atoms, such as a methylsulfonyl group, an ethylsulfonyl group, a propylsulfonyl group, a butylsulfonyl group, an isopropylsulfonyl group, a 2-ethylhexylsulfonyl group, a hexadecylsulfonyl group, an octylsulfonyl group or a cyclohexylsulfonyl group), an arylsulfonyl group (an arylsulfonyl group having preferably 6 to 24, more preferably 6 to 12 carbon atoms, such as a phenylsulfonyl group or a 1-naphthylsulfonyl group), a sulfamoyl group (a sulfamoyl group having preferably 24 or less, more preferably 16 or less carbon atoms, such as a sulfamoyl group, an N,N-dipropylsulfamoyl group, an N-ethyl-N-dodecylsulfamoyl group, an N-ethyl-N-phenylsulfamoyl group or an N-cyclohexylsulfamoyl group), a sulfo group, a phosphonyl group (a phosphonyl group having preferably 1 to 24, more preferably 1 to 12 carbon atoms, such as a phenoxyphosphonyl group, an octyloxyphosphonyl group or a phenylphosphonyl group) and a phosphinoylamino group (a phosphinoylamino group having preferably 1 to 24, more preferably 1 to 12 carbon atoms, such as a diethoxyphosphinoylamino group or an dioctyloxyphosphinoylamino group).

Among these substituents, a halogen atom, an alkyl group, an aryl group, a hydroxy group, a sulfonic acid group, a phosphonic acid group, a carboxy group, an alkoxy group, an aryloxy group, an alkoxycarbonyloxy group, a cycloalkyl carbonyloxy group, an aryloxycarbonyloxy group, a carbamoyloxy group, a sulfamoyloxy group, an alkylsulfonyloxy group, an arylsulfonyloxy group, an acyl group, an alkoxycarbonyl group, an aryloxycarbonyl group, a carbamoyl group, a carbonamido group, an imido group, a sulfonamido group, a sulfamoylamino group, and a sulfamoyl group are preferable;

an alkyl group, an aryl group, a hydroxy group, a sulfonic acid group, a phosphonic acid group, a carboxy group, an alkoxy group, an aryloxy group, an alkoxycarbonyloxy group, an aryloxycarbonyloxy group, a carbamoyloxy group, a sulfamoyloxy group, an alkylsulfonyloxy group, an arylsulfonyloxy group, an acyl group, and an alkoxycarbonyl group, an aryloxycarbonyl group, a carbamoyl group, a carbonamido group, a sulfonamido group, a sulfamoylamino group, and a sulfamoyl group are more preferable;

a hydroxy group, a sulfonic acid group, a phosphonic acid group, a carboxy group, an alkoxy group, an aryloxy group, an alkoxycarbonyloxy group, an aryloxycarbonyloxy group, a carbamoyloxy group, a sulfamoyloxy group, an alkylsulfonyloxy group, an arylsulfonyloxy group, an acyl group, an alkoxycarbonyl group, and an aryloxycarbonyl group are still more preferable; and a hydroxy group, a sulfonic acid group, a carboxy group, an alkoxy group, an alkoxycarbonyloxy group, a carbamoyloxy group, a sulfamoyloxy group, an alkylsulfonyloxy group, an acyl group, and an alkoxycarbonyl group are even more preferable.

Among these preferable substituents, a sulfonic acid group, a carboxy group, an alkoxy group, an alkoxycarbonyloxy group, an alkylsulfonyloxy group, and an alkoxycarbonyl group is more preferable; a sulfonic acid group, a carboxy group, an alkoxy group, and an alkoxycarbonyl group are still more preferable; and a sulfonic acid group, a carboxy group, and an alkoxy group are even more preferable.

$R^1$ represents preferably a hydrogen atom, an alkyl group or an aryl group, and more preferably a hydrogen atom or an alkyl group.

When the substituted alkyl group or the substituted aryl group represented by $R^1$ is a group that may further be substituted, the substituted alkyl or aryl group may further be substituted by any of the substituents described above. When the substituted alkyl or aryl group has two or more substituents, these substituents may be the same as or different from one another.

In Formula (1), $L^1$ represents —N($R^2$)C(═O)—, —OC(═O)—, —C(═O)N($R^2$)—, —C(═O)O—, the group represented by the following Formula (2), the group represented by the following Formula (3), or the group represented by the following Formula (4). Here, $R^2$ represents a hydrogen atom, an alkyl group, an aryl group, or a heterocyclic group.

$R^2$ represents an alkyl group, an aryl group or a heterocyclic group. Examples of the alkyl, aryl and heterocyclic group represented by $R^2$ include the alkyl, aryl and heterocyclic groups of the substituents in the substituted alkyl or aryl group represented by $R^1$ above, respectively. The alkyl group, the aryl group and the heterocyclic group represented by $R^2$ have the same preferable definition as the alkyl, aryl and heterocyclic groups of the substituents in the substituted alkyl or aryl group represented by $R^1$, respectively.

The alkyl group, the aryl group or the heterocyclic group represented by $R^2$ may be substituted by any of the substituents for $R^1$. When the aryl group or the heterocyclic group represented by $R^2$ has two or more substituents, these substituents may be the same as or different from one another.

Hereinbelow, the group represented by Formula (2), the group represented by Formula (3), and the group represented by Formula (4), which are represented by $L^1$ in Formula (1), are explained.

Formula (2)

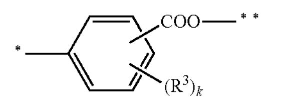

Formula (3)

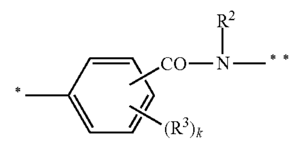

Formula (4)

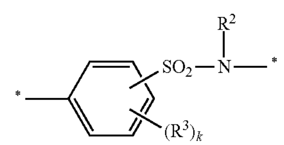

Here, $R^2$ in Formulae (3) and (4) independently represents a hydrogen atom, an alkyl group, an aryl group or a heterocyclic group; $R^3$ in Formulae (2) to (4) independently represents a hydrogen atom or a substituent; k in Formulae (2) to (4) independently represents an integer of from 0 to 4; * in Formulae (2) to (4) independently represents a position to which the —C($R^1$)═$CH_2$ group in Formula (1) is linked; and ** in Formulae (2) to (4) independently represents a position to which $L^2$ or "Dye" (when n represents 0) in Formula (1) is linked.

$R^2$ in Formulae (3) and (4) has the same definition as $R^2$ in Formula (1), and has the same preferable definition as $R^2$ in Formula (1).

$R^3$ in Formulae (2) to (4) represents a hydrogen atom or a substituent, and examples of the substituent represented by $R^3$ include the substituents for the substituted alkyl or aryl group represented by $R^1$. The substituent represented has the same preferable definition as the substituents for the substituted alkyl or aryl group represented by $R^1$. k in Formulae (2) to (4) represents 0, 1, 2, 3 or 4. When k represents 2, 3, or 4, each $R^3$ may be the same as or different from one another.

When the substituent represented by $R^3$ in Formulae (2) to (4) is a group that may further be substituted, the substituents represented by $R^3$ may be substituted by any of the substituents for the substituted alkyl or aryl group represented by $R^1$. When the substituent represented by $R^3$ has two or more substituents, these substituents may be the same as or different from one another.

In view of synthetic suitability, $L^1$ preferably represents —N($R^2$)C(═O)—. —OC(═O)—, —C(═O)N($R^2$)— or —C(═O)O—, more preferably —OC(═O)—, —C(═O)N($R^2$)— or —C(═O)O—, and still more preferably —C(═O)N($R^2$)— or —C(═O)O—.

Hereinbelow, $L^2$ in Formula (1) is explained.

$L^2$ represents a divalent linking group that links $L^1$ or —C($R^1$)═$CH_2$ (when m represents 0), with "Dye".

Preferable examples of $L^2$ include an alkylene group, an aralkylene group, an arylene group, —O—, —C(═O)—, —OC(═O)—, —OC(═O)O—, —$OSO_2$—, —OC(═O)N($R^{50}$)—, —N($R^{50}$)—, —N($R^{50}$)C(═O)—, —N($R^{50}$)C(═O)O—, —N($R^{50}$)C(═O)N($R^{51}$)—, —N($R^{50}$)$SO_2$—, —N($R^{50}$)$SO_2$N($R^{51}$)—, —S—, —S—S—, —SO—, —$SO_2$—, —$SO_2$N($R^{50}$)—, and —$SO_2$O—. Two or more of these divalent linking groups may be linked to one another to form a divalent linking group.

$R^{50}$ and $R^{51}$ each independently represent a hydrogen atom, an alkyl group, an aryl group or a heterocyclic group. Examples of the alkyl, aryl and heterocyclic groups represented by $R^{50}$ or $R^{51}$ include the alkyl, aryl and heterocyclic groups of the substituents for $R^1$, respectively. The alkyl, aryl and heterocyclic groups represented by $R^{50}$ or $R^{51}$ have the same preferable definitions as the alkyl, aryl and heterocyclic groups of the substituents for $R^1$, respectively. The alkyl, aryl, or heterocyclic group represented by $R^{50}$ or $R^{51}$ may be substituted with any of the substituents for $R^1$, respectively. When the alkyl, aryl or heterocyclic group represented by $R^{50}$ and $R^{51}$ has two or more substituents, these substituents may be the same as or different from one another.

When $L^2$ represents an alkylene group, an aralkylene group or an arylene group, these groups may be unsubstituted or substituted. When these groups are substituted, these groups may be substituted by any of the substituent for $R^1$. When an alkylene group, an aralkylene group or an arylene group represented by $L^2$ has two or more substituents, these substituents may be the same as or different from one another.

When $L^2$ represents an alkylene group, an aralkylene group or an arylene group, it is preferable that $L^2$ represents an alkylene group having 1 to 12 carbon atoms, an aralkylene group having 6 to 18 carbon atoms, or an arylene group having 6 to 18 carbon atoms, it is more preferable that $L^2$ represents an alkylene group having 1 to 8 carbon atoms, an aralkylene group having 6 to 16 carbon atoms, or an arylene group having 6 to 12 carbon atoms, and it is still more preferable that $L^2$ represents an alkylene group having 1 to 6 carbon atoms or an aralkylene group having 6 to 12 carbon atoms.

As the combination of $L^1$ and $L^2$, it is preferable that $L^1$ represents —N($R^2$)C(═O)—, —OC(═O)—, —C(═O)N($R^2$)—, or —C(═O)O—, and $L^2$ represents an alkylene group having 1 to 12 carbon atoms, an aralkylene group having 6 to 18 carbon atoms, an arylene group having 6 to 18 carbon atoms, an alkyl thioether group having 2 to 18 carbon atoms, an alkyl carbonamido group having 2 to 18 carbon atoms, or an alkyl aminocarbonyl group having 2 to 18 carbon atoms. It is more preferable that $L^1$ represents —OC(═O)—, —C(═O)N($R^2$)—, or —C(═O)O—, and $L^2$ represents an alkylene group having 1 to 8 carbon atoms, an aralkylene group having 6 to 16 carbon atoms, an arylene group having 6 to 12 carbon atoms, an alkyl thioether group having 2 to 12 carbon atoms, an alkyl carbonamido group having 2 to 12 carbon atoms, or an alkyl aminocarbonyl group having 2 to 12 carbon atoms. It is still more preferable that $L^1$ represents —C(═O)N($R^2$)— or —C(═O)O—, and $L^2$ represents an alkylene group having 1 to 6 carbon atoms, an aralkylene group having 6 to 12 carbon atoms, an alkyl thioether group having 2 to 6 carbon atoms, an alkyl carbonamido group having 2 to 6 carbon atoms, or an alkyl aminocarbonyl group having 2 to 6 carbon atoms.

Examples of the polymerizable group represented by $-(L^2)_n-(L^1)_m$—C($R^1$)═$CH_2$ in Formula (1) include the following. However, the invention is not particularly limited to these examples.

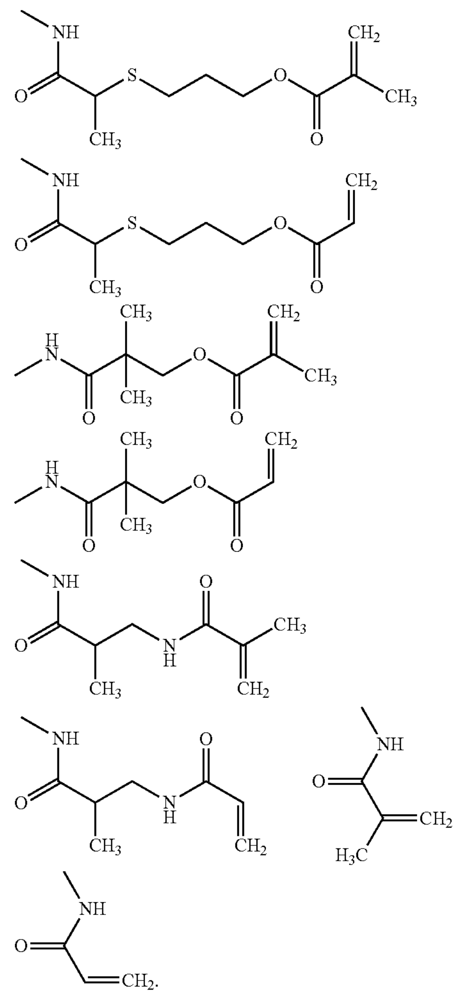

Dipyrromethene Metal Complex Compound

The colorant monomer represented by Formula (1) has a colorant residue formed by removing any one hydrogen atom from the dipyrromethene metal complex compound represented by Formula (5), or a colorant residue formed by removing one hydrogen atom from any one of the substituents represented by $R^{11}$ to $R^{17}$, $X^1$, $Y^1$ and $Y^2$ in the dipyrromethene metal complex compound represented by Formula (6). That is, the colorant monomer represented by Formula (1) is a compound in which the polymerizable group represented by $-(L^2)_n-(L^1)_m$—C($R^1$)═$CH_2$ is introduced into the dipyrromethene metal complex compound represented by Formula (5) or Formula (6). When both m and n represents 0, the —C($R^1$)═$CH_2$ group is directly introduced into the dipyrromethene metal complex compound.

The dipyrromethene metal complex compound introduced into Formula (1) is the above described dipyrromethene metal complex compound represented by Formula (5) or Formula (6).

Examples of Colorant Monomer

Examples of colorant monomer represented by Formula (1) and the example of the synthetic method of the colorant monomer are shown below, but the invention is not particularly limited to these examples.

Exemplary compound a-9 was synthesized according to the following synthetic scheme.

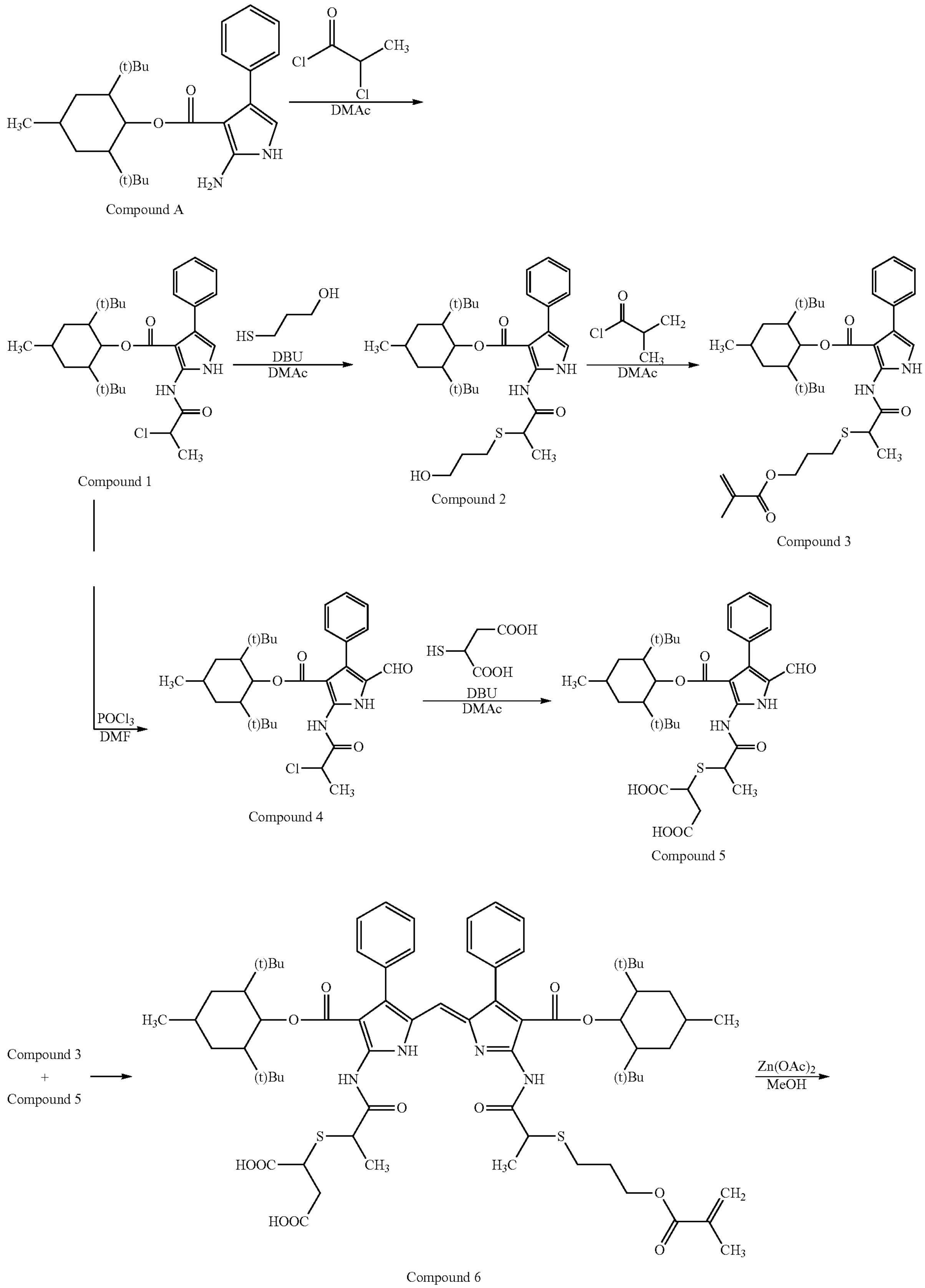
Compound A
DMAc
Compound 1
DBU
DMAc
Compound 2
DMAc
Compound 3
POCl3
DMF
Compound 4
DBU
DMAc
Compound 5
Compound 3
+
Compound 5
Compound 6
Zn(OAc)2
MeOH -continued

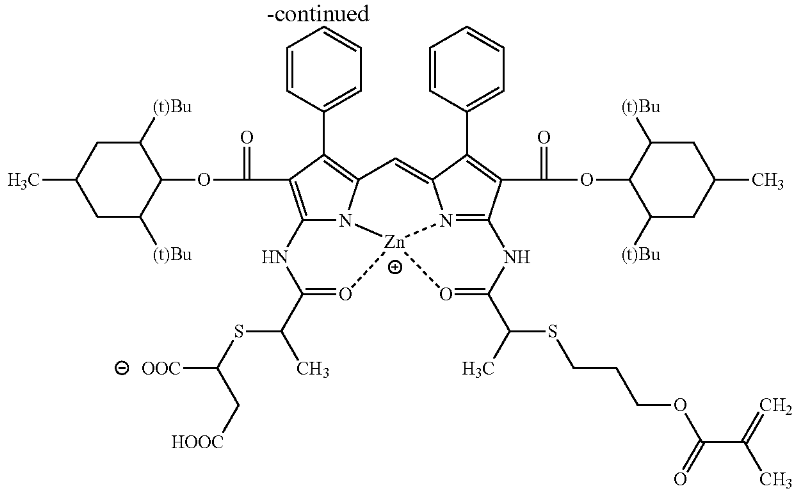

Exemplary compound a-9

Synthetic Method of Compound 1

4.11 g of 2-aminopyrrole compound (compound A) was stirred in acetonitrile at room temperature, and 1.33 g of 2-chloropropionyl chloride was dropped therein and the mixture was stirred for 30 minutes. The precipitated crystal was filtered and separated, and washed with 5 mL of acetonitrile, thereby obtaining 2.22 g of Compound 1.

Compound 1: $^{1}$H-NMR, 400 MHz, δ($CDCl_3$) ppm: 0.45-1.58 (28H, m), 1.83-1.85 (3H, d), 4.57-4.6 (1H, q), 5.89 (1H, s), 6.35 (1H, s), 7.28-7.38 (5H, m), 10.78-10.82 (1H, br), 11.47-11.51 (1H, br).

Synthetic Method of Compound 2

5 g of Compound 1 and 1.2 g of 3-mercapto-1-propanol were dissolved in 15 mL of dimethyl acetamide, and then the solution was stirred at room temperature. 1.82 g of 1,8-diazabicyclo[5,4,0]-7-undecene (DBU) was dropped into the mixture, and the resultant mixture was stirred at the room temperature for 1 hour. Thereafter, the reaction liquid was poured into 200 mL of aqueous hydrochloric acid solution, and the mixture was extracted with 50 mL of ethyl acetate. The organic phase was then dehydrated with 5 g of magnesium sulfate, and was filtered. The filtrate was concentrated to dryness. The residue was dispersed and washed with acetonitrile, and a solid was filtered and separated. The solid was washed with 5 mL of acetonitrile, thereby obtaining 3.51 g of Compound 2.

Compound 2: $^{1}$H-NMR, 400 MHz, δ($CDCl_3$) ppm: 0.45-1.29 (28H, m), 1.55-1.61 (3H, d), 1.84-1.92 (2H, m), 2.76-2.82 (2H, t), 3.56-3.71 (1H, q), 3.73-3.8 (2H, q), 5.89 (1H, s), 6.33 (1H, s), 7.27-7.38 (5H, m), 10.78-10.82 (1H, br), 11.36-11.42 (1H, br).

Synthesis of Compound 3

30 g of Compound 2 and 0.1 g of nitrobenzene were dissolved in 30 mL of dimethyl acetamide, and 14.1 g of methacrylic acid chloride was dropped therein and the mixture was stirred at room temperature for 4 hours. The reaction liquid was added to 1.2 L of water, and was neutralized with 30 g of sodium hydrogencarbonate. The resultant liquid was extracted with 500 mL of ethyl acetate. The organic phase was then dehydrated with 30 g of magnesium sulfate, and was filtered. The filtrate was concentrated to dryness. The residue was dispersed and washed with 100 mL of acetonitrile, and a solid was filtered and separated. The solid was washed with 30 mL of acetonitrile, thereby obtaining 24.6 g of Compound 3.

Compound 3: $^{1}$H-NMR, 400 MHz, δ($CDCl_3$) ppm: 0.47-1.27 (28H, m), 1.57-1.59 (3H, d), 1.9-1.93 (3H, s), 1.93-2.06 (2H, m), 2.66-2.76 (2H, m), 3.55-3.71 (1H, q), 4.2-4.25 (2H, t), 5.52 (1H, s), 5.89 (1H, s), 6.08 (1H, s), 6.33 (1H, s), 7.27-7.38 (5H, m), 10.78-10.82 (1H, br), 11.38-11.42 (1H, br).

Synthesis of Compound 4

5.5 mL of phosphorous oxychloride was dropped into 50 mL of dimethyl formamide while stirring the dimethyl formamide at 0° C. and the mixture was stirred for 10 minutes. 15 g of Compound 1 was added thereto and the mixture was stirred at room temperature for 2.5 hours. The reaction liquid was poured into 1.5 L of water, and then the resultant liquid was neutralized with 7.2 g of sodium hydroxide. 150 mL of methanol was then poured therein, and the mixture was stirred for 2 hours. The crystal was filtered once, and was dispersed and washed with 150 mL of methanol again, thereby obtaining 8 g of Compound 4.

Compound 4: $^{1}$H-NMR, 400 MHz, δ($CDCl_3$) ppm: 0.45-1.57 (28H, m), 1.81-1.83 (3H, d), 4.44-4.5 (1H, q), 5.88 (1H, s), 7.28-7.37 (5H, m), 9.06 (1H, s), 10.78-10.82 (1H, br), 11.47-11.51 (1H, br).

Synthesis of Compound 5

19.6 g of Compound 4 and 8.34 g of thiomalic acid were added to 150 mL of dimethyl acetamide, and the mixture was stirred at room temperature. 28 g of DBU was then dropped therein, and the mixture was stirred at room temperature for 2 hours. The reaction liquid was poured into 1.5 L of water, and the obtained crystal was filtered and separated, and was dried under deduced pressure, thereby obtaining 17.5 g of Compound 5.

Compound 5: $^{1}$H-NMR, 400 MHz, δ($CDCl_3$) ppm: 0.45-1.59 (28H, m), 1.81-1.83 (3H, d), 1.84-1.87 (2H, d), 2.93-2.97 (1H, t), 4.56-4.61 (1H, q), 5.91 (1H, s), 7.28-7.37 (5H, m), 9.06 (1H, s), 10.92-10.96 (1H, br), 11.12-11.19 (1H, br).

Synthesis of Compound 6

12.9 g of Compound 5 and 50 mL of acetic anhydride were stirred at room temperature, and then 11.4 g of trifluoroacetic acid was dropped therein. Subsequently, 12.5 g of Compound 3 was added thereto, and the reaction solution was stirred at room temperature for 4 hours. 1 L of water, 60 g of sodium hydrogencarbonate and ethyl acetate were stirred at room temperature, and the reaction solution was slowly poured therein to neutralize the reaction liquid. The organic phase was made acidic with an aqueous hydrochloric acid, and washed with saturated sodium chloride solution. The organic phase was then dried with sodium sulfate, and concentrated under reduced pressure. The residue was purified with column chromatography, and concentrated under reduced pressure, thereby obtaining 8.7 g of Compound 6.

Compound 6: $^{1}$H-NMR, 400 MHz, δ (DMSO-$d_6$) ppm: 0.92-4.09 (76H, m), 5.24-5.28 (2H, br), 5.6 (1H, s), 5.98 (1H, s), 6.57 (1H, s), 7.28-7.45 (10H, m), 10.62-10.86 (2H, br), 12.02-12.15 (1H, m).

Synthesis of Exemplary Compound a-9

17.6 g of Compound 6 and 200 mL of methanol were stirred at room temperature, 3.25 g of zinc acetate dihydrate was added thereto, and then the mixture was stirred for 2.5 hours. Thereafter, 200 mL of water was added to the reaction liquid. The precipitated crystal was filtered and dried, thereby obtaining 16.3 g of Exemplary Compound a-9.

Exemplary Compound a-9: $^{1}$H-NMR, 400 MHz, δ (DMSO-$d_6$) ppm: 0.88-4.41 (76H, m), 5.72-5.8 (2H, br), 5.82 (1H, s), 6.04 (1H, s), 6.88 (1H, s), 7.28-7.58 (10H, m), 10.41-10.49 (2H, br).

Specific examples of the colorant monomers represented by Formula (1) include the following.

(a-1)

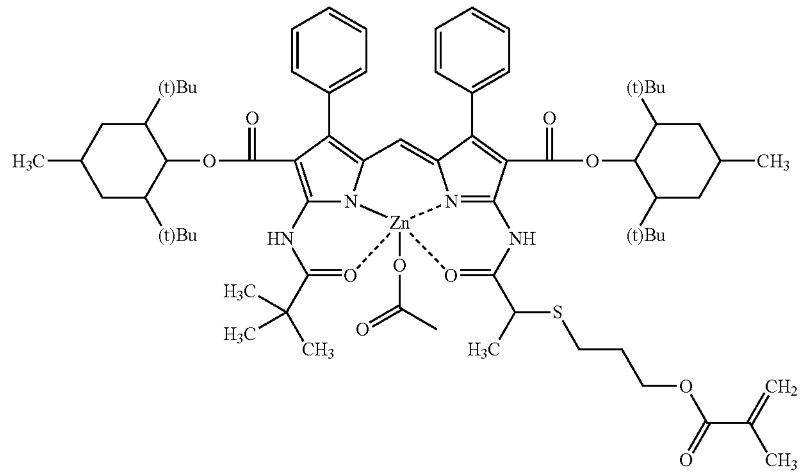

(a-2)

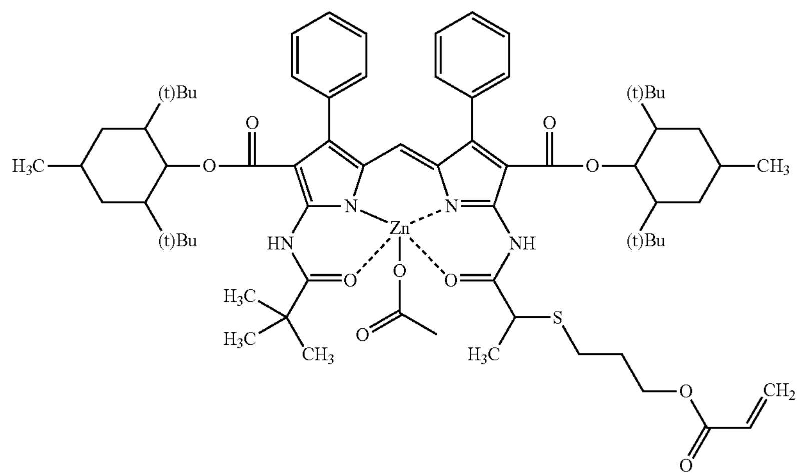

(a-3)

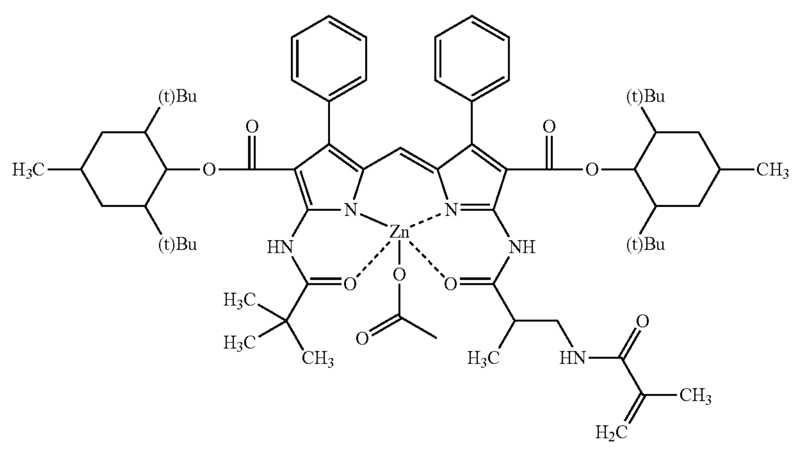

-continued
(a-4)
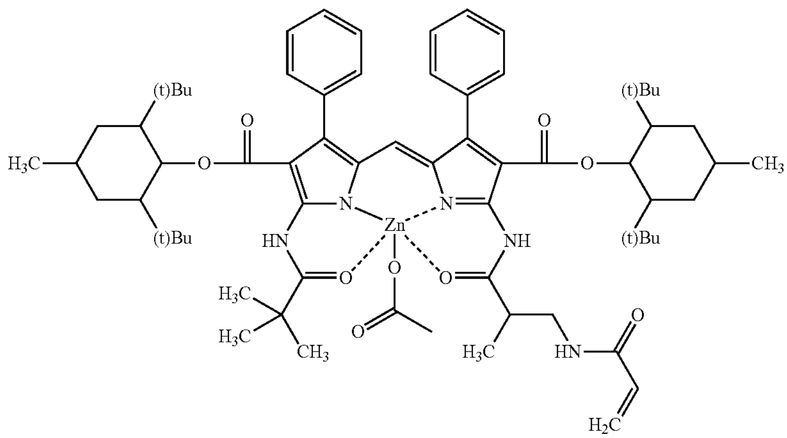
(a-5)
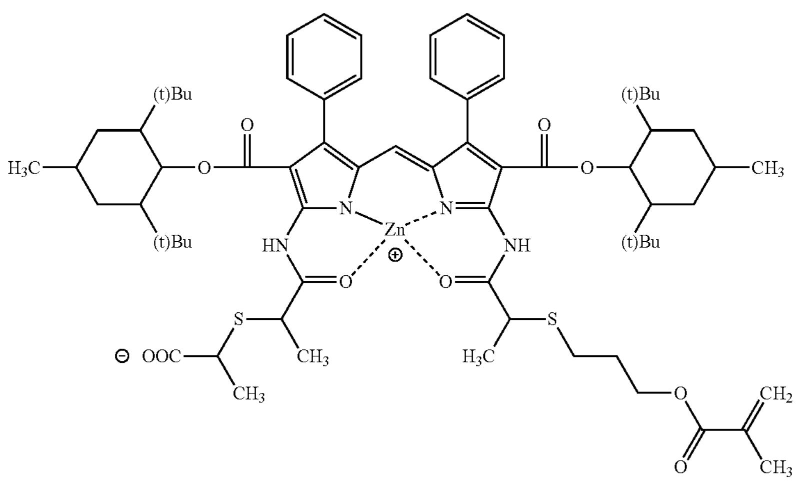
(a-6)
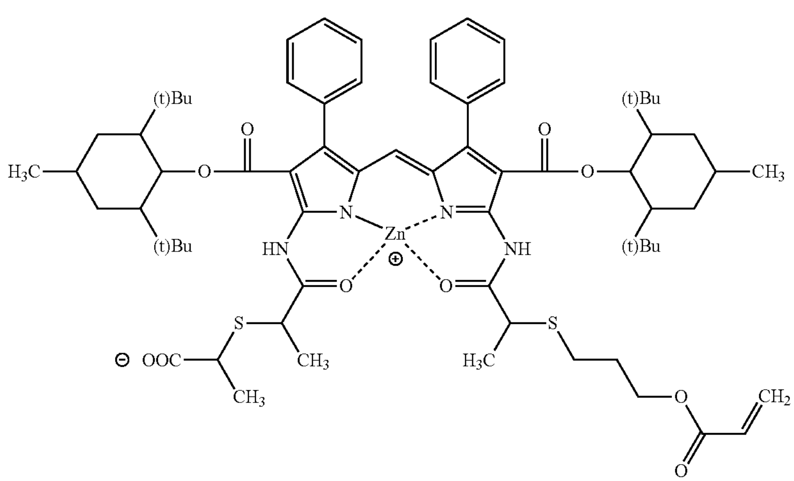

-continued
(a-7)
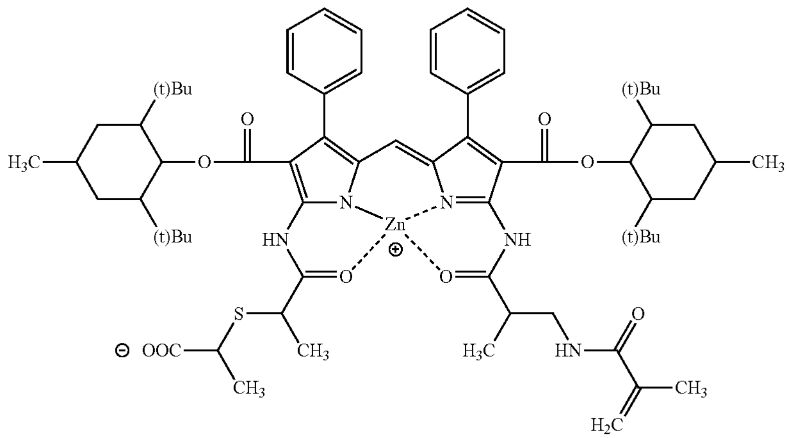
(a-8)
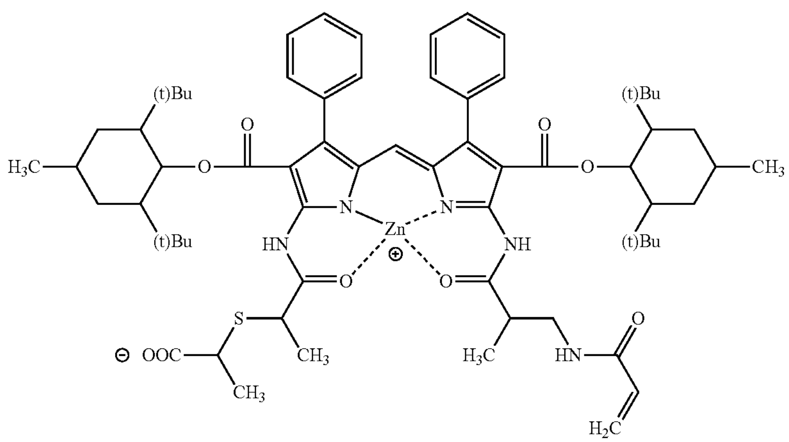
(a-9)
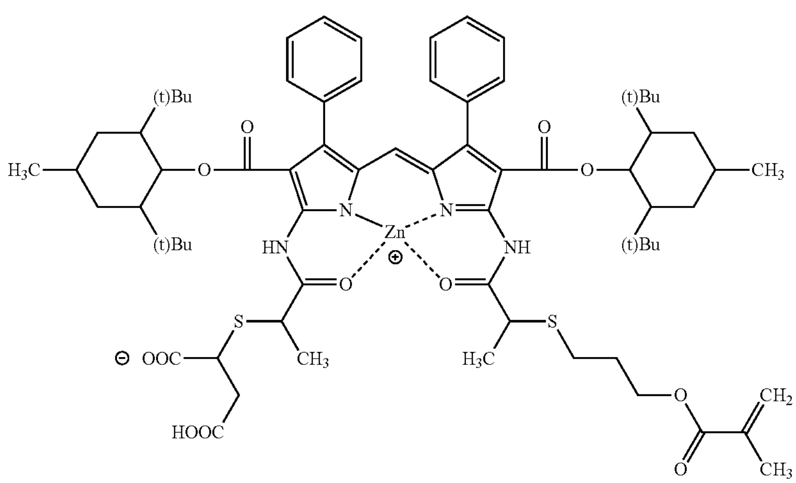

-continued
(a-10)
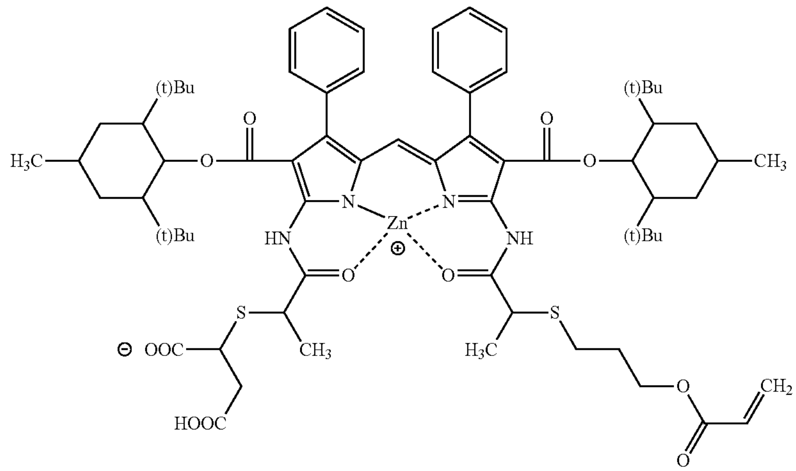
(a-11)
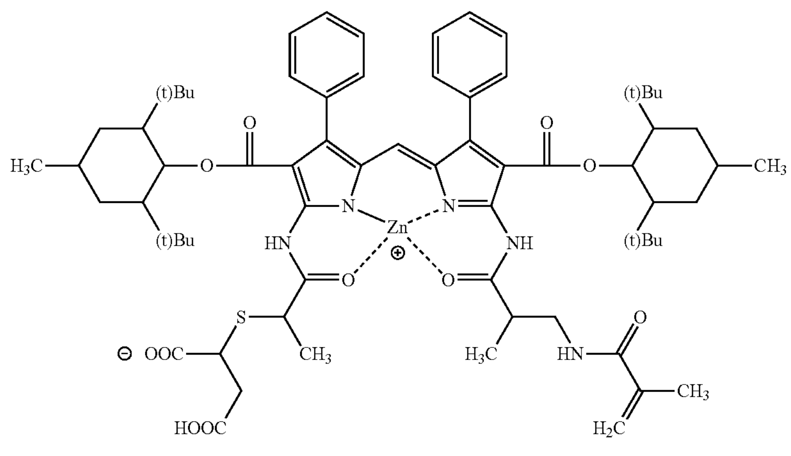
(a-12)
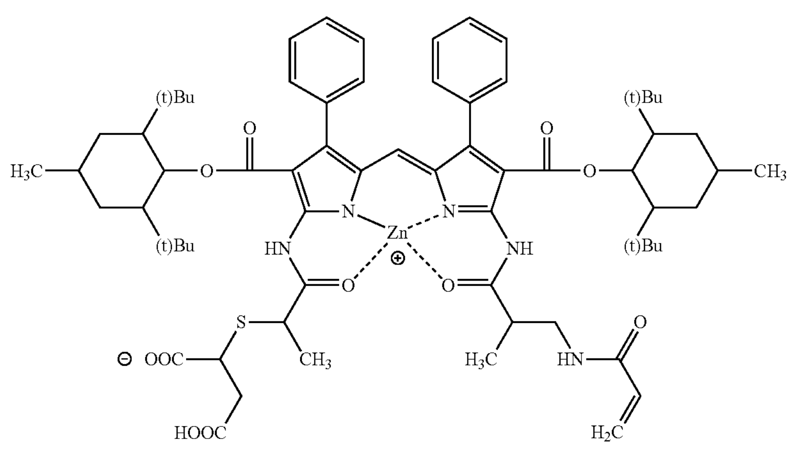

-continued
(a-13)
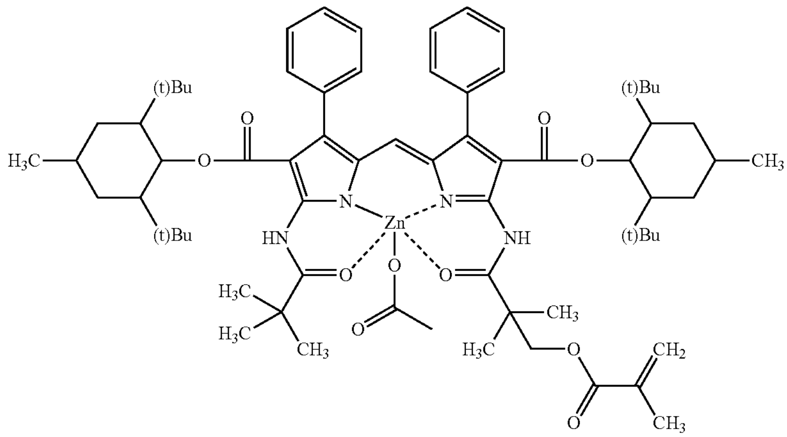
(a-14)
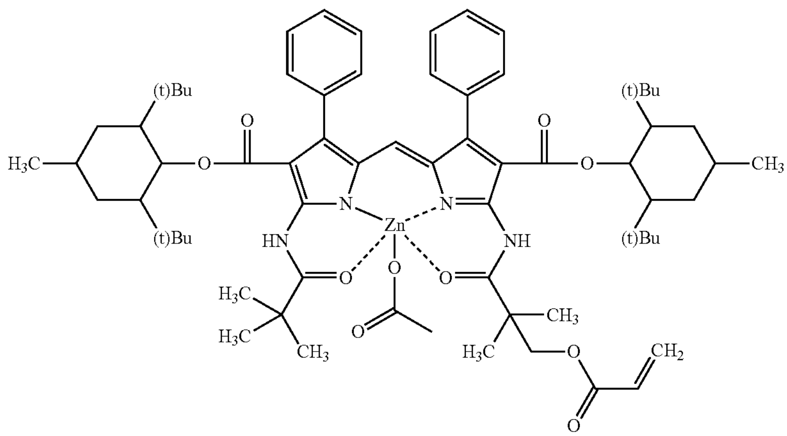
(a-15)
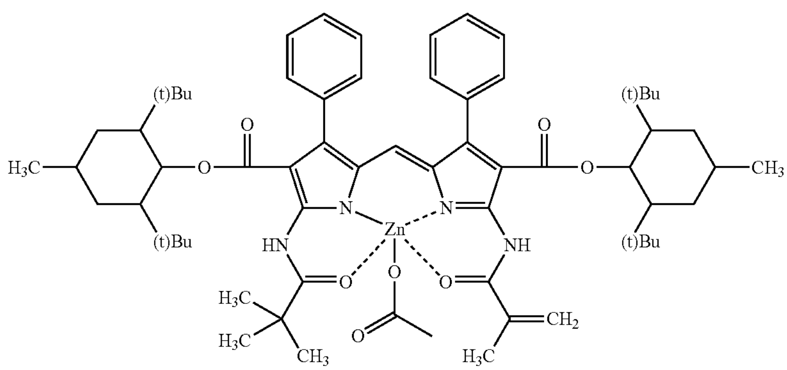
(a-16)
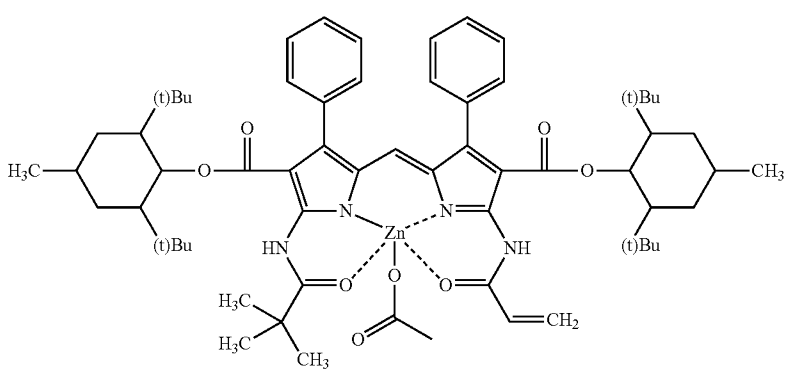

-continued
(a-17)
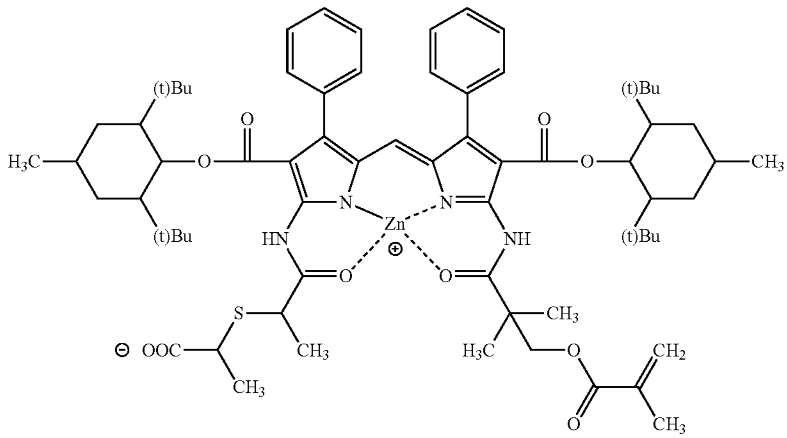
(a-18)
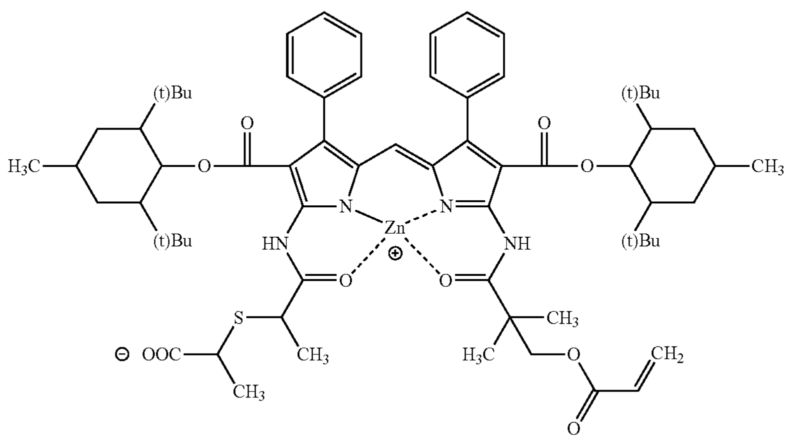
(a-19)
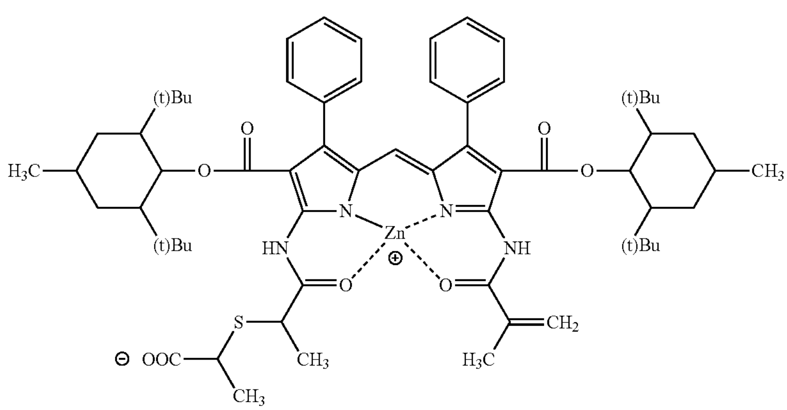

-continued
(a-20)
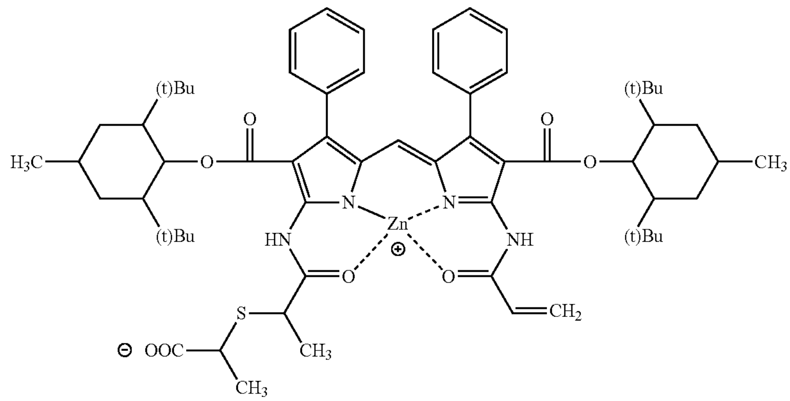
(a-21)
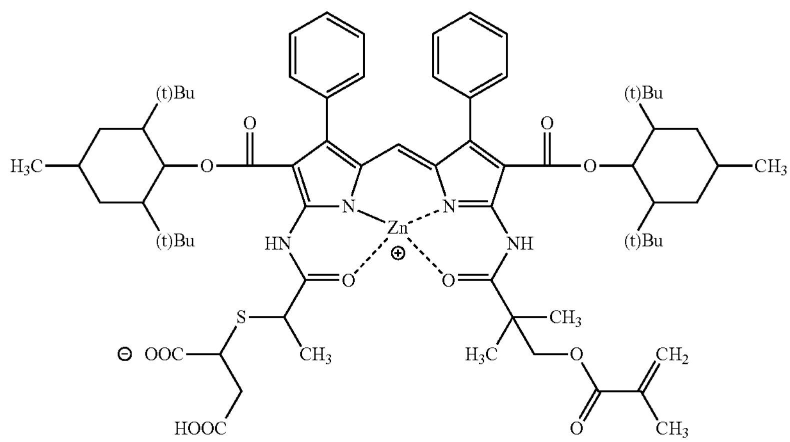
(a-22)
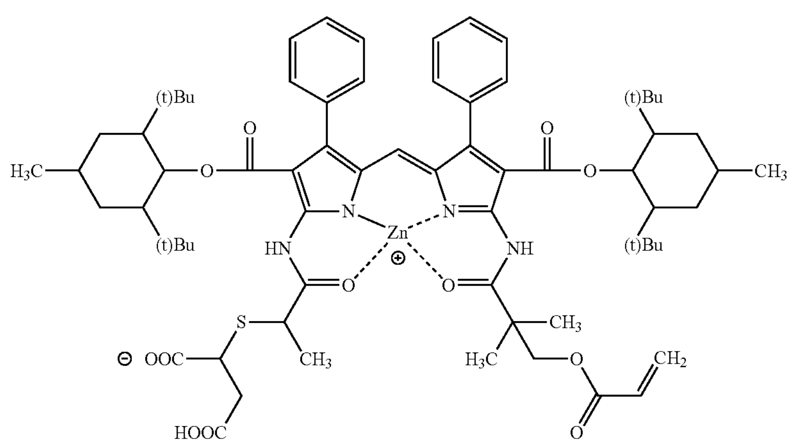

-continued (a-23)

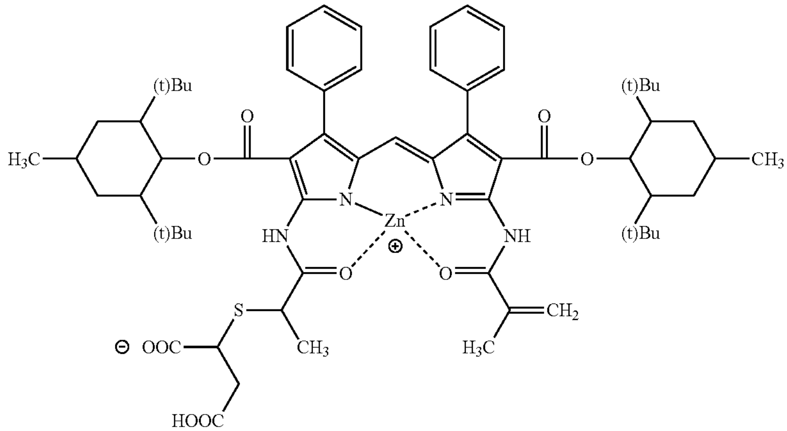

(a-24)

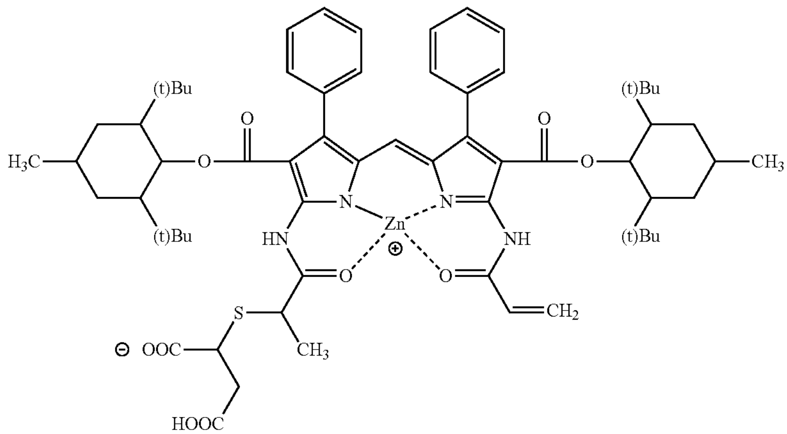

Exemplary Compound a-1

$^1$H-NMR, 400 MHz, δ ($CDCl_3$) ppm: 0.2-2.1 (78H, m), 3.7-3.8 (1H, q), 4.15-4.28 (2H, t), 5.52 (1H, s), 5.85 (2H, br), 6.08 (1H, s), 6.25 (1H, s), 7-7.32 (10H, m), 11.49 (2H, s).

Exemplary Compound a-2

$^1$H-NMR, 400 MHz, δ ($CDCl_3$) ppm: 0.2-2.4 (75H, m), 3.7-3.8 (1H, q), 3.87-3.91 (1H, m), 4.15-4.28 (2H, t), 5.52 (1H, d), 5.8 (2H, m), 6.03 (1H, d), 6.4 (1H, s), 7.02-7.42 (10H, m), 10.77 (2H, s).

Exemplary Compound a-3

$^1$H-NMR, 400 MHz, δ ($CDCl_3$) ppm: 0.21-2.33 (74H, m), 3.2-3.4 (1H, q), 3.58-3.64 (2H, d), 5.81 (1H, s), 6.11 (2H, br), 6.2 (1H, s), 7.03-7.39 (10H, m), 10.66 (2H, br).

Exemplary Compound a-4

$^1$H-NMR, 400 MHz, δ ($CDCl_3$) ppm: 0.19-2.29 (71H, m), 3.12-3.34 (1H, q), 3.62-3.64 (2H, d), 3.88-3.9 (1H, m), 5.66-5.69 (1H, d), 6.11 (2H, s), 6.35-6.38 (1H, d), 7.03-7.39 (10H, m), 10.01 (2H, br).

Exemplary Compound a-5

$^1$H-NMR, 400 MHz, δ ($CDCl_3$) ppm: 0.2-4.7 (78H, m), 5.57 (1H, s), 5.85 (2H, br), 6.1 (1H, s), 6.25 (1H, s), 7-7.41 (10H, m), 11.32 (2H; s).

Exemplary Compound a-6

$^1$H-NMR, 400 MHz, δ ($CDCl_3$) ppm: 0.2-4.7 (75H, m), 4.78-4.81 (1H, m), 5.21 (1H, m), 5.79 (1H, m), 5.8 (2H, br), 6.41 (1H, s), 7-7.39 (10H, m), 11.76 (2H, s).

Exemplary Compound a-7

$^1$H-NMR, 400 MHz, δ ($CDCl_3$) ppm: 0.21-4.12 (73H, m), 5.73 (1H, s), 6.19 (2H, br), 6.33 (1H, s), 7.03-7.39 (10H, m), 10.51-10.55 (2H, br).

Exemplary Compound a-8

$^1$H-NMR, 400 MHz, δ ($CDCl_3$) ppm: 0.21-4.59 (71H, m), 5.43 (1H, d), 6.19 (2H, br), 6.59 (1H, d), 7.03-7.35 (10H, m), 10.6-10.64 (2H, br).

Exemplary Compound a-10

$^1$H-NMR, 400 MHz, δ ($CDCl_3$) ppm: 0.21-4.63 (74H, m), 5.67-5.71 (2H, br), 5.74-5.76 (1H, m), 6.11 (1H, s), 6.37-6.39 (1H, m), 7.27-7.53 (10H, m), 10.9-10.95 (2H, br).

Exemplary Compound a-11

$^1$H-NMR, 400 MHz, δ ($CDCl_3$) ppm: 0.21-4.09 (70H, m), 5.81 (1H, s), 6.06 (2H, br), 6.25 (1H, s), 6.51 (1H, s), 7.23-7.42 (10H, m), 10.31-10.65 (2H, br).

Exemplary Compound a-12

$^1$H-NMR, 400 MHz, δ ($CDCl_3$) ppm: 0.19-4.35 (68H, m), 4.92-4.94 (1H, m), 5.66-5.69 (1H, m), 6.02-6.04 (2H, br), 6.39-6.41 (1H, m), 7.28-7.37 (10H, m), 10.43-10.49 (2H, br).

Exemplary Compound a-13

$^1$H-NMR, 400 MHz, δ ($CDCl_3$) ppm: 0.22-4.78 (76H, m), 5.84 (1H, s), 6.26 (2H, br), 6.27 (1H, s), 6.47 (1H, s), 7.24-7.44 (10H, m), 10.32-10.37 (2H, br).

Exemplary Compound a-14

$^1$H-NMR, 400 MHz, δ ($CDCl_3$) ppm: 0.2-4.98 (74H, m), 5.02-5.05 (1H, m), 5.81-5.84 (1H, m), 6.02-6.04 (2H, br), 6.79-6.81 (1H, br), 7.28-7.45 (10H, m), 10.78-10.81 (2H, br).

Exemplary Compound a-15

$^1$H-NMR, 400 MHz, δ ($CDCl_3$) ppm: 0.21-3.19 (68H, m), 5.81 (1H, s), 6.15-6.17 (2H, br), 6.24 (1H, s), 6.54 (1H, s), 7.03-7.39 (10H, m), 10.46-48 (2H, br).

Exemplary Compound a-16

$^{1}$H-NMR, 400 MHz, δ ($CDCl_3$) ppm: 0.19-2.29 (56H, m), 3.88-3.9 (1H, m), 5.69-5.71 (1H, m), 6.24 (2H, br), 6.35-6.38 (1H, m), 6.69 (1H, s), 7.25-7.47 (10H, m), 10.82-7.85 (2H, br).

Exemplary Compound a-17

$^{1}$H-NMR, 400 MHz, δ ($CDCl_3$) ppm: 0.2-4.7 (78H, m), 5.57 (1H, s), 5.85 (2H, br), 6.1 (1H, s), 6.25 (1H, s), 7-7.41 (10H, m), 11.32 (2H, s).

Exemplary Compound a-18

$^{1}$H-NMR, 400 MHz, δ ($CDCl_3$) ppm: 0.21-4.45 (72H, m), 4.93-4.95 (1H, m), 5.21-5.22 (1H, m), 5.69-5.71 (1H, m), 5.83-5.85 (2H, br), 6.89 (1H, s), 7.24-7.41 (10H, m), 10.76-10.79 (2H, s).

Exemplary Compound a-19

$^{1}$H-NMR, 400 MHz, δ ($CDCl_3$) ppm: 0.21-4.56 (67H, m), 5.98 (1H, s), 6.03-6.05 (2H, br), 6.34 (1H, s), 6.47 (1H, s), 7.03-7.39 (10H, m), 10.66 (2H, br).

Exemplary Compound a-20

$^{1}$H-NMR, 400 MHz, δ ($CDCl_3$) ppm: 0.21-4.59 (65H, m), 5.71-5.73 (1H, m), 6.22-6.24 (2H, br), 6.45-6.47 (1H, m), 6.67 (1H, s), 7.23-7.51 (10H, m), 10.73-10.76 (2H, br).

Exemplary Compound a-21

$^{1}$H-NMR, 400 MHz, δ ($CDCl_3$) ppm: 0.2-4.73 (72H, m), 5.59 (1H, s), 5.75-5.77 (2H, br), 6.08 (1H, s), 6.22 (1H, s), 7.21-7.46 (10H, m), 11.32-11.36 (2H, br).

Exemplary Compound a-22

$^{1}$H-NMR, 400 MHz, δ ($CDCl_3$) ppm: 0.21-4.45 (73H, m), 5.03-5.06 (1H, m), 5.55-5.57 (1H, m), 5.84-5.86 (2H, br), 5.96-5.99 (1H, m), 6.79 (1H, s), 7.24-7.49 (10H, m), 11.04-11.07 (2H, br).

Exemplary Compound a-23

$^{1}$H-NMR, 400 MHz, δ ($CDCl_3$) ppm: 0.21-4.56 (66H, m), 6.21 (1H, s), 6.23-6.25 (2H, br), 6.69 (1H, s), 6.77 (1H, s), 7.02-7.46 (10H, m), 10.31-35 (2H, br).

Exemplary Compound a-24

$^{1}$H-NMR, 400 MHz, δ ($CDCl_3$) ppm: 0.21-4.96 (64H, m), 5.75-5.77 (1H, m), 6.21-6.24 (2H, br), 6.45-6.47 (1H, m), 6.5 (1H, s), 7.23-7.5 (10H, m), 10.7-10.74 (2H, br).

Synthesis Example of Colorant Multimer: Synthesis of Exemplary Compound J-1

Exemplary compound J-1 was synthesized according to the following synthetic scheme.

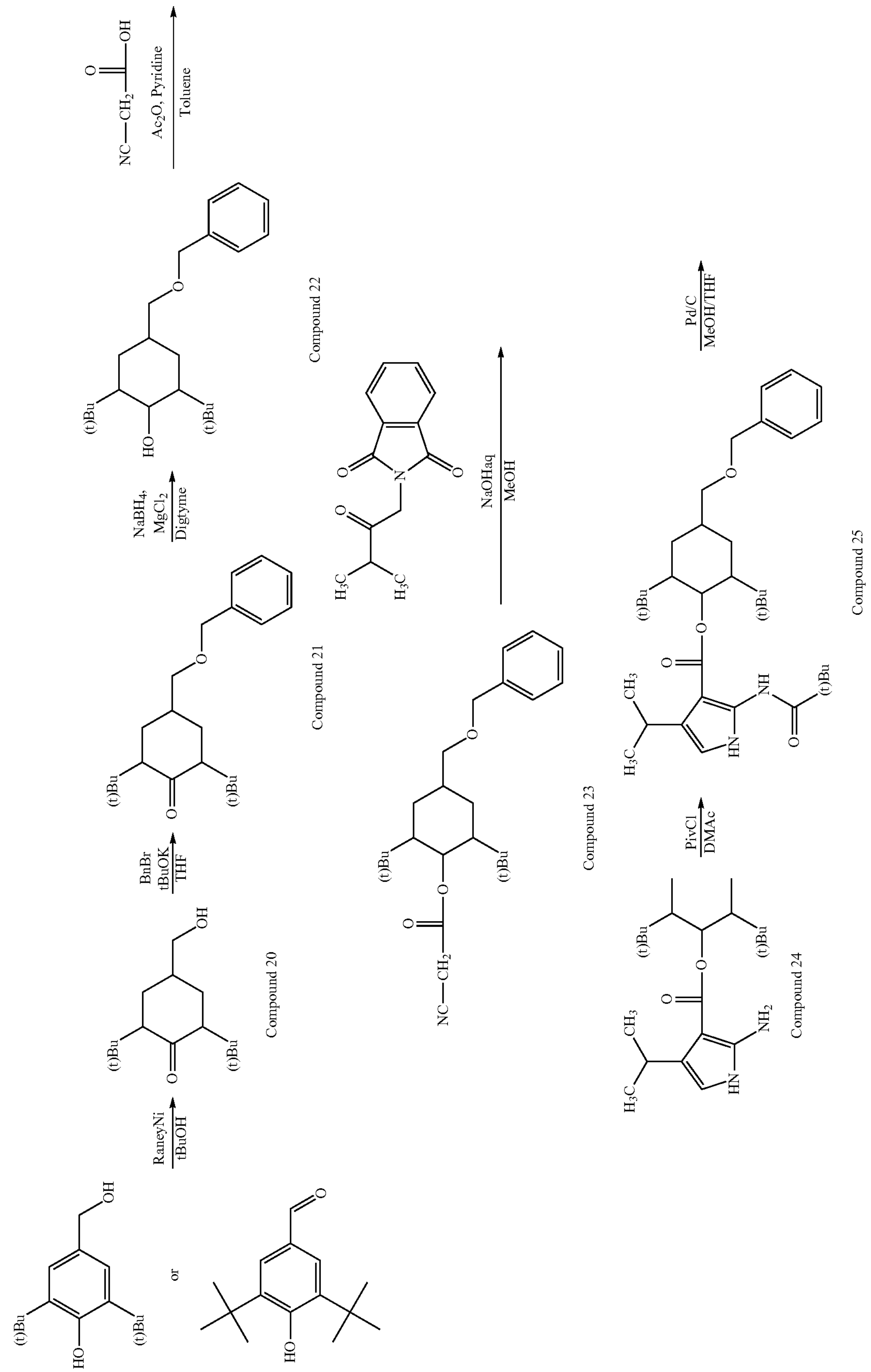
or
RaneyNi
tBuOH
Compound 20
BnBr
tBuOK
THF
Compound 21
NaBH4, MgCl2
Digtyme
Compound 22
NC—CH2—C(O)—OH
Ac2O, Pyridine
Toluene
Compound 23
NaOHaq
MeOH
Compound 24
PivCl
DMAc
Compound 25
Pd/C
MeOH/THF -continued
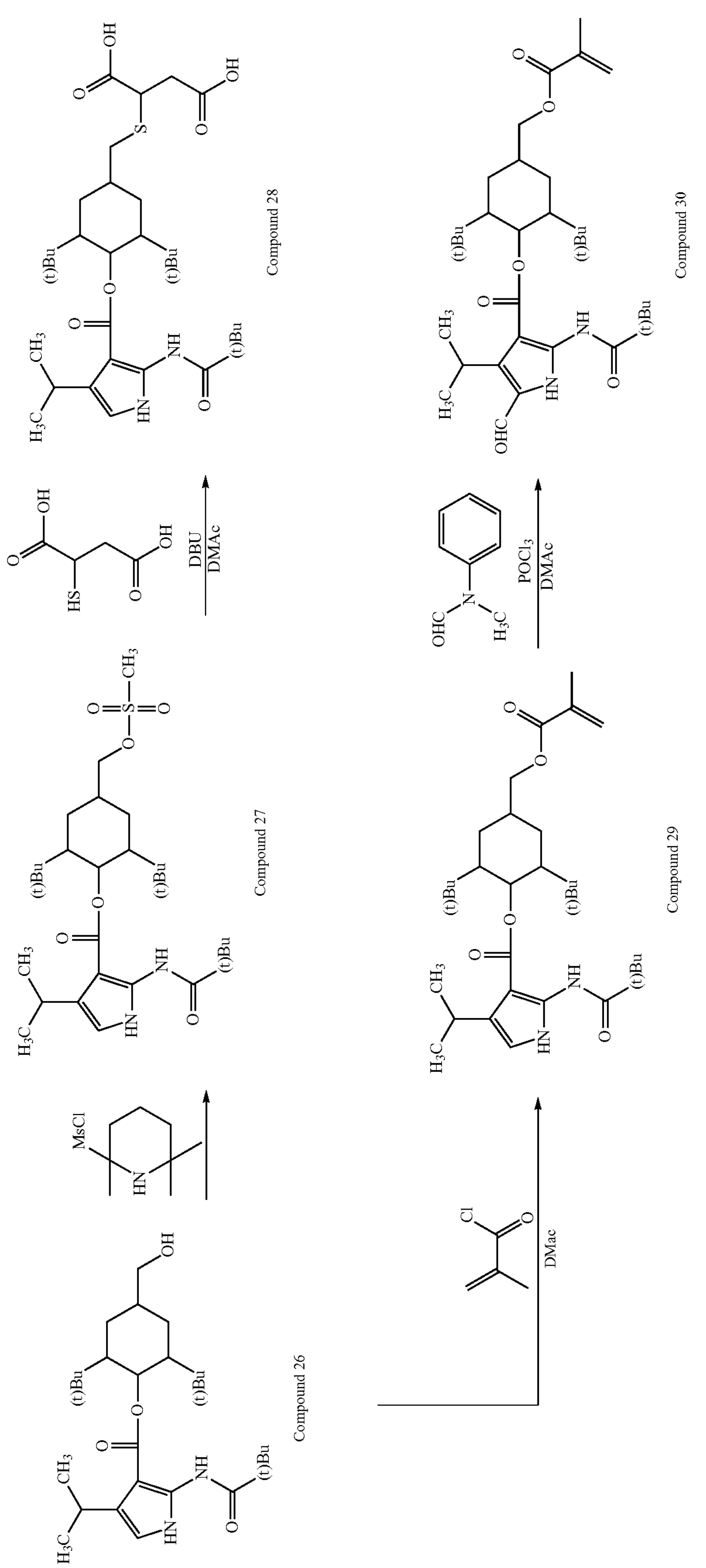
Compound 26
Compound 27
Compound 28
Compound 29
Compound 30

-continued
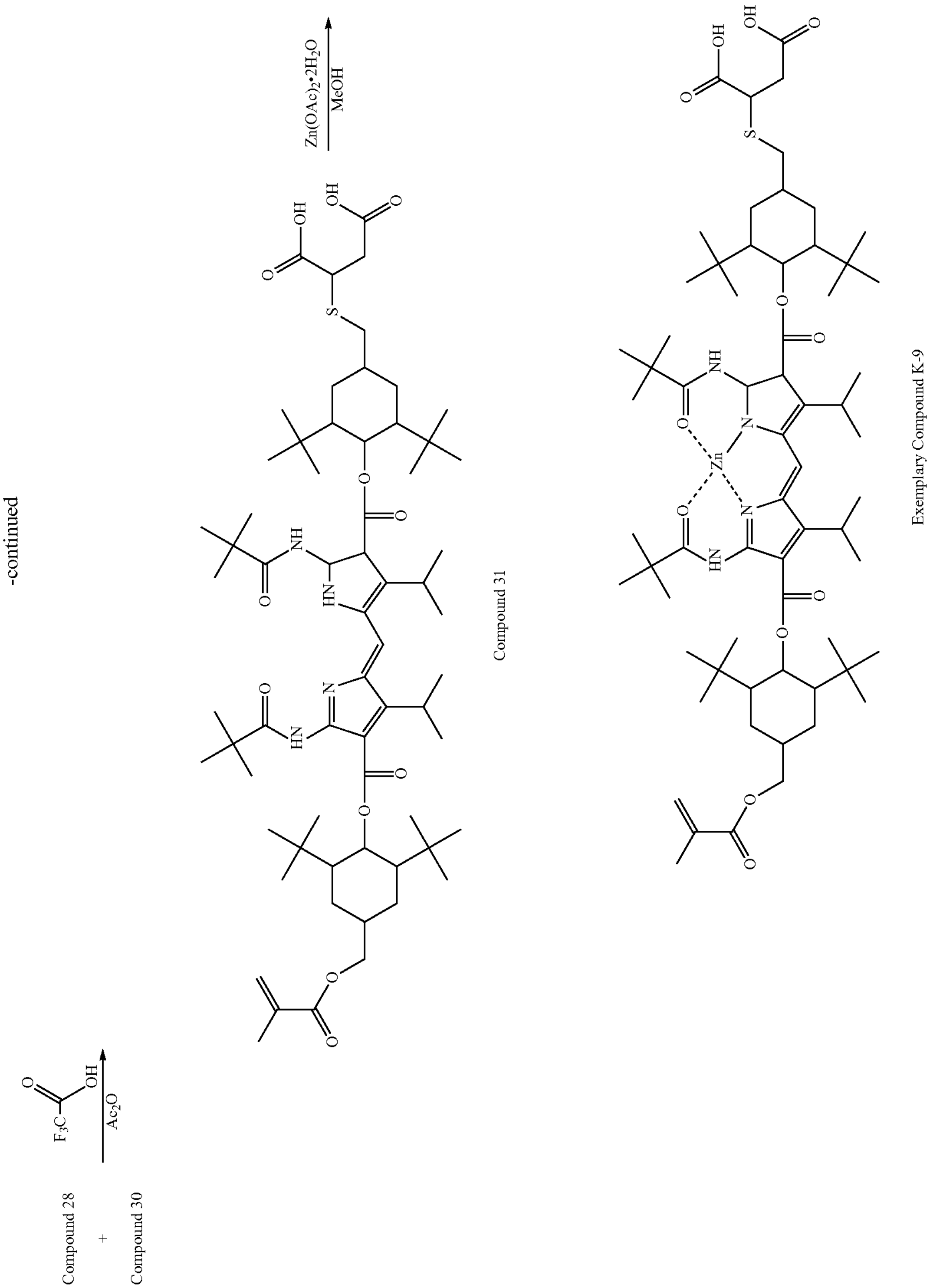
Compound 31
Exemplary Compound K-9

Synthesis of Compound 7

206.4 g of isopropyl methyl ketone was stirred in 1 L of methanol, and then 7 mL of hydrobromic acid (47% to 49% aqueous solution) was added thereto. Subsequently, bromine was dropped into the mixture at 30° C. to 34° C. over 3 hours. Thereafter, the reaction liquid was stirred at 30° C. for 30 minutes. The reaction liquid was neutralized with an aqueous solution of 124 g of sodium hydrogencarbonate in 1.3 L of water. An aqueous solution of 400 g of sodium chloride in 1.3 L of water was then added to the mixture, thereby isolating a liquid reaction product by phase separation.

The isolated reaction product was dropped into a water-cooled solution, in which 222 g of potassium phthalimide was dissolved while stirring in 800 mL of dimethyl acetamide (DMAc), and the mixture was stirred for 4 hours at room temperature. Thereafter, 720 mL of water was added to the resultant mixture with water-cooling and the precipitated crystal was filtered and separated. The obtained crystal was suspended in 1.5 L of toluene, insoluble substances were filtered off, and the filtrate was concentrated, thereby obtaining 100 g of Compound 7.

Compound 7: $^1$H-NMR, 400 MHz, δ ($CDCl_3$) ppm: 1.21-1.23 (6H, d), 2.74-2.79 (1H, m), 4.56 (2H, s), 7.72-7.74 (2H, d), 7.85-7.87 (2H, d).

Synthesis of Compound 8

Compound 8 was synthesized by the method described in Paragraph [0134] of JP-A No. 2008-292970.

Synthesis of Compound 9

293 g of Compound 8 and 231 g of Compound 7 were stirred in 1.4 L of methanol under nitrogen gas atmosphere. Thereafter, a solution of 88 g of sodium hydroxide in 400 mL of water was dropped therein at room temperature. The reaction mixture was then refluxed for 8 hours, and cooled to room temperature. The precipitated crystal was filtered and separated, and washed with 100 mL of methanol, thereby obtaining 299 g of Compound 9.

Compound 9: $^1$H-NMR, 400 MHz, δ ($CDCl_3$) ppm: 0.88-0.95 (18H, s), 1.00-1.03 (3H, d), 1.17-1.19 (6H, d), 1.20-1.66 (7H, m), 3.38-3.43 (1H, m), 5.19-5.24 (2H, br), 5.95 (1H, br), 6.00 (1H, s), 7.39-7.45 (1H, br).

Synthesis of Compound 10

80 g of Compound 9 was stirred in 250 mL of DMAc at room temperature, and then 29.2 g of 2-chloropropionyl chloride was dropped therein. The mixture was then stirred at room temperature for 3 hours. The reaction liquid was poured into a mixed liquid of 500 mL of ethyl acetate in 1 L of water, and washed with 500 mL of each of an aqueous saturated sodium bicarbonate solution, water, and saturated sodium chloride solution. The resultant was dried with magnesium sulfate, and concentrated under reduced pressure, thereby obtaining 89.4 g of Compound 10.

Compound 10: $^1$H-NMR, 400 MHz, δ ($CDCl_3$) ppm: 0.9 (18H, s), 0.96-1.01 (3H, d), 1.20-1.23 (2H, d), 1.26-1.38 (1H, q), 1.53-1.68 (6H, m), 1.8-1.82 (3H, d), 3.44-3.53 (1H, m) 4.5-4.57 (1H, q), 6.03 (1H, br), 6.27 (1H, s), 10.4-10.45 (1H, br), 11.31-11.42 (1H, br).

Synthesis of Compound 11

372.3 g of Compound 10 and 79.8 g of 3-mercapto-1-propanol were dissolved in 1 L of N-methylpyrrolidone (NMP), and the mixture was stirred at room temperature. 133.4 g of DBU was dropped into the mixture, and the resultant reaction liquid was stirred at room temperature for 2 hours. Thereafter, the reaction liquid was poured into a mixed liquid of 1.5 L of ethyl acetate and 1.5 L of water, and was washed with 1 L of each of a 1N hydrochloric acid, an aqueous saturated sodium bicarbonate solution, water, and saturated sodium chloride solution, and the organic phase was dehydrated with 50 g of magnesium sulfate. After filtration, the filtrate was evaporated to dryness. The residue was dispersed and washed, and the solid was filtered and separated. The resultant washed with 30 mL of acetonitrile, thereby obtaining 317 g of Compound 11.

Compound 11: $^1$H-NMR, 400 MHz, δ ($CDCl_3$) ppm: 0.9 (18H, s), 1.02-1.03 (3H, d), 1.21-1.22 (6H, d), 1.23-1.41 (5H, m), 1.56-1.57 (3H, d), 1.6-1.63 (2H, br), 1.79-1.89 (2H, m), 2.72-2.78 (2H, t), 3.43-3.47 (1H, m), 3.51-3.55 (1H, q), 3.78-3.73 (2H, q), 6.0 (1H, s), 6.23 (1H, s), 10.51-10.55 (1H, br), 11.21-11.29 (1H, br).

Synthesis of Compound 12

30 g of Compound 11 and 0.1 mL of nitrobenzene were dissolved in 250 mL of dimethyl acetamide, and 14.1 g of methacrylic acid chloride was dropped therein. The mixture was then stirred at room temperature for 2 hours. The reaction liquid was then added to a solution of 1.5 L of ethyl acetate and 1.5 L of water, and was extracted in an organic phase. The organic phase was washed twice with 400 mL of each of a 1 N hydrochloric acid, an aqueous saturated sodium bicarbonate solution, a saturated sodium chloride solution, and water. The organic phase was dehydrated with 30 g of magnesium sulfate, and was filtrated. The filtrate was concentrated to dryness, thereby obtaining 27.9 g of Compound 12.

Compound 12: $^1$H-NMR, 400 MHz, δ ($CDCl_3$) ppm: 0.9 (18H, s), 1.02-1.03 (3H, d), 1.21-1.22 (6H, d), 1.23-1.41 (5H, m), 1.56-1.57 (3H, d), 1.6-1.63 (2H, br), 1.9 (3H, s) 1.93-2.02 (2H, m), 2.6-2.73 (2H, t), 3.42-3.5 (1H, m), 3.51-3.56 (1H, q), 4.06-4.12 (1H, q), 4.14-4.23 (2H, t), 5.5 (1H, s), 6.11-6.15 (2H, m), 6.23 (1H, s), 10.42-10.48 (1H, br), 11.28-11.32 (1H, br).

Synthesis of Compound 13

263.6 g of Compound 9 was stirred in 800 mL of DMAc at room temperature, and then 108.5 g of 5-chlorovaleric acid chloride was dropped therein over 2 hours while cooling with ice. The reaction liquid was stirred at room temperature for 3 hours. The reaction liquid was poured into 18 L of water, and the precipitated crystal was filtered and separated. The obtained crystal was dispersed and washed with 1 L of acetonitrile, thereby obtaining 313 g of Compound 13.

Compound 13: $^1$H-NMR, 400 MHz, δ ($CDCl_3$) ppm: 0.9 (18H, s), 0.96-1.01 (3H, d), 1.20-1.75 (17H, m), 1.76-2.00 (2H, m), 2.41-2.53 (2H, m), 3.4-3.58 (1H, m), 3.54-3.60 (2H, m), 6.0 (1H, br), 6.22 (1H, s), 10.55 (2H, br).

Synthesis of Compound 14

75 g of phosphorous oxychloride kept at 5° C. or lower was dropped into a solution of 66.2 g of N-methylformanilide and 330 mL of acetonitrile while stirring at 0° C., and then the reaction liquid was stirred for one hour. Thereafter, 202 g of Compound 13 was added to the reaction liquid, stirred at a room temperature for 3 hours, and then stirred at 40° C. for one hour. The reaction liquid was then poured into 2 L of water, and the precipitated crystal was filtered. The resultant was rinse-washed with 500 mL of water and 500 mL of methanol, thereby obtaining 181 g of Compound 14.

Compound 14: $^1$H-NMR, 400 MHz, δ ($CDCl_3$) ppm: 0.9 (18H, s), 0.96-1.21 (3H, d), 1.22-1.76 (17H, m), 1.78-2.22 (2H, m), 2.45-2.55 (2H, m), 3.4-3.58 (1H, m), 3.54-3.60 (2H, m), 6.3 (1H, br), 9.88 (1H, s), 11.09 (1H, br), 11.47 (1H, br).

Synthesis of Compound 15

300 g of Compound 14 and 129 g of thiomalic acid were added to 3 L of dimethyl acetamide, and the mixture was stirred at room temperature. 434 g of DBU was then dropped into the mixture over 30 minutes with the temperature kept at 30° C. or below. Thereafter, the reaction liquid was stirred at 60° C. for 5 hours, and a solution of 103 g of sodium hydroxide in 600 mL of water was dropped into the reaction liquid over 10 minutes. The resultant mixture was cooled to room temperature, and the precipitated crystal was filtered. The resultant was rinse-washed with 1 L of ethyl acetate and then with 200 mL of methanol cooled to 5° C. The obtained crystal was dispersed in a solution of 1 L of ethyl acetate and 1 L of water, and then 220 mL of concentrated hydrochloric acid was added to the dispersion to dissolve the crystal in an organic phase. The organic phase was washed with 1 L of water twice, and 1 L of saturation sodium chloride solution once. The resultant was dried with 80 g of magnesium sulfate, and was filtered. The filtrate was concentrated under reduced pressure, thereby obtaining 255 g of Compound 15.

Compound 15: $^1$H-NMR, 400 MHz, δ ($CDCl_3$) ppm: 0.9 (18H, s), 0.96-1.21 (3H, d), 1.22-1.76 (17H, m), 1.78-2.22 (2H, m), 2.45-2.65 (4H, m), 3.35-3.61 (2H, m), 3.54-3.60 (2H, m), 6.3 (1H, br), 9.92 (1H, s), 11.11 (1H, br), 11.81 (1H, br).

Synthesis of Compound 16

8.27 g of Compound 12, 8.92 g of Compound 13 and 45 mL of acetic anhydride were stirred at room temperature, and then 5.39 mL of trifluoroacetic acid was dropped therein while cooling with ice. The resultant mixture was stirred at room temperature for 3 hours. The reaction liquid was dropped into an aqueous solution, which is obtained by stirring 400 mL of water, 60 g of sodium hydrogencarbonate and three drops of pyridine at room temperature, to be neutralized, and the mixture was stirred at room temperature for 3 hours. The precipitated crystal was filtered and separated, and then rinse-washed with water. The resultant was dried with an air blower, thereby obtaining 16 g of Compound 16.

Compound 16: $^1$H-NMR, 400 MHz, δ ($CDCl_3$) ppm: 0.92 (36H, s), 0.96-2.0 (44H, m), 2.04 (3H, s), 2.62-2.83 (3H, m), 2.97-3.56 (7H, m), 4.14-4.27 (1H, m), 5.0 (1H, br), 6.05 (3H, br), 7.52-7.56 (1H, br), 10.25-10.89 (1H, br), 11.34-11.56 (1H, br).

Synthesis of Exemplary Compound J-1

12.6 g of Compound 16, 150 mL of methanol, and 75 mL of tetrahydrofuran were stirred at room temperature, and then 2.2 g of zinc acetate dihydrate was added thereto and stirred for 2 hours. Thereafter, 500 mL of water was added to the reaction liquid, and the precipitated crystal was filtered. The resultant was dried with air blow, thereby obtaining 13 g of Exemplary Compound J-1.

Exemplary Compound J-1: $^1$H-NMR, 400 MHz, δ (DMSO-$d_6$) ppm: 0.97 (36H, s), 0.99-2.05 (47H, m), 2.07-3.05 (8H, m), 4.04-4.4 (3H, m), 5.53 (1H, br), 6.05-6.12 (3H, br), 8.8 (1H, s), 10.97-11.18 (1H, br), 11.91-12.01 (1H, br).

Synthesis Example of Colorant Multimer: Synthesis of Exemplary Compound K-9

Exemplary compound K-9 was synthesized according to the following synthetic scheme.

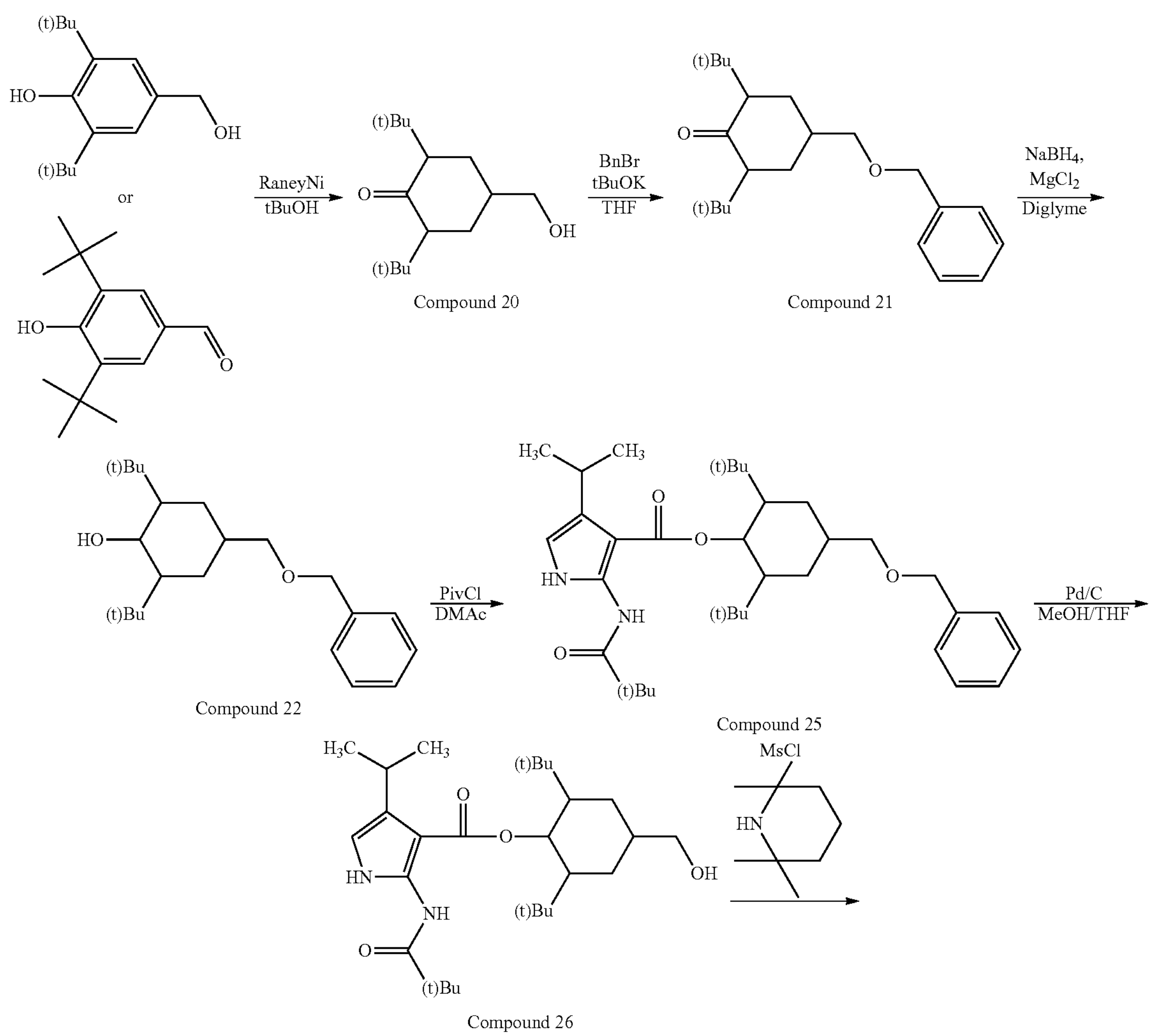

-continued
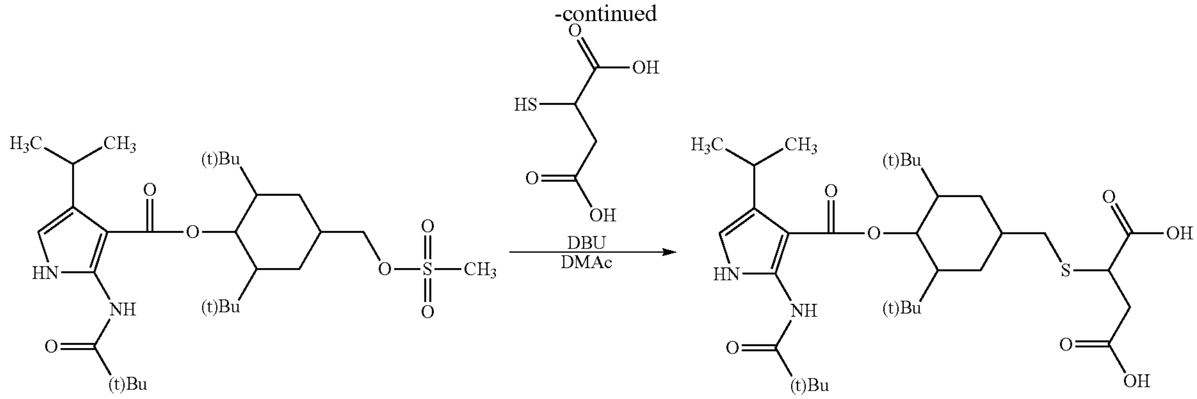
Compound 27
Compound 28
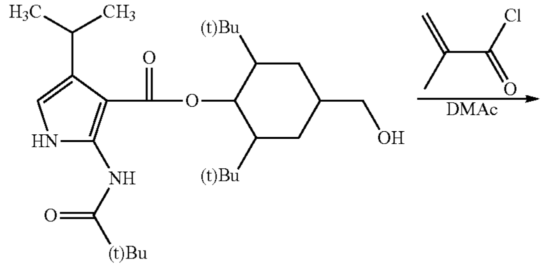
Compound 26
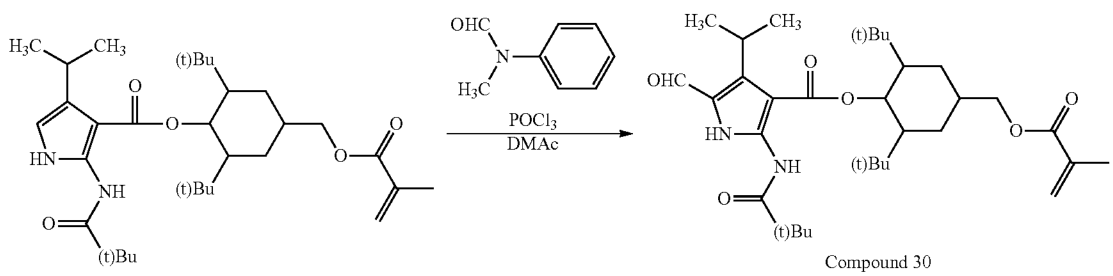
Compound 29
Compound 30
Compound 28
+
Compound 30
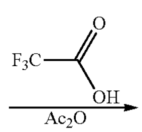
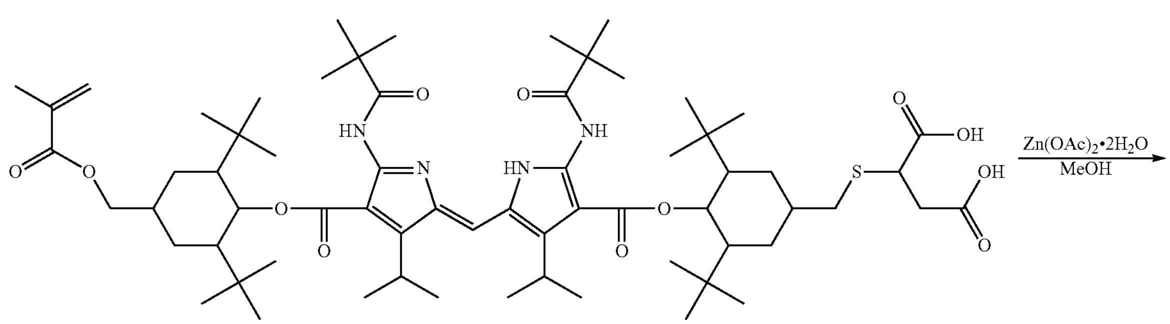
Compound 31

-continued

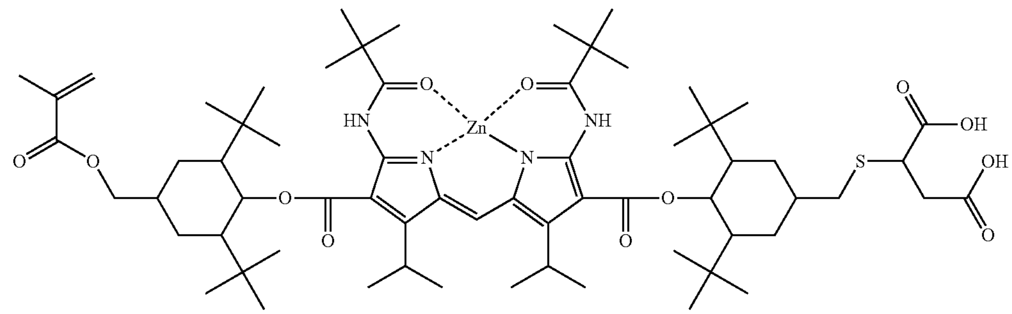

Exemplary compound K-9

Here, 2,6-di-tert-butyl-4-alkylcyclohexanols used for synthesizing the following Exemplary compounds K-1 to K-14 were obtained, for example, as described in Journal of American Chemistry, Vol. 79, (1957), pp 5019-5023, in which 2,6-di-tert-butylcyclohexanone obtained by catalytic hydrogenation of 2,6-di-tert-butylphenol using a nickel catalyst is further reduced with lithium aluminum hydride, thereby obtaining 2,6-di-tert-butylcyclohexanol; or as described in Japanese Patent No. 4065576, in which the reduction with sodium borohydride is conducted in the presence of diglyme as a reaction solvent and magnesium chloride or aluminum chloride.

Synthesis of Compound 20

73.6 g of 2,6-di-tert-butyl-4-(hydroxymethyl)phenol, 12.5 g of Raney nickel and 340 mL of tert-butyl alcohol were placed in a 1 L stainless-steel autoclave. The autoclave was then sealed and the atmosphere in the autoclave was displaced with hydrogen gas such that an initial hydrogen pressure is 86.7 kg/cm$^2$ at 25° C. Subsequently, the mixture was stirred for 1 hour and 50 minutes at 125° C.

The autoclave was cooled to a room temperature, and then the reaction product was collected and filtered to remove the catalyst. The obtained reaction product was quantified with a gas chromatography, thereby obtaining 74.8 g of Compound 20 having a purity of 90%. The structure of the Compound 20 was confirmed by NMR.

Compound 20: $^1$H-NMR, 400 MHz, δ ($CDCl_3$) ppm: 0.981 (18H, s), 1.18-1.3 (2H, m), 1.96-2.09 (1H, m), 2.17-2.27 (4H, m), 3.52-3.58 (2H, t).

In a manner similarly to the above, the Compound 20 can be obtained using 3,5-di-tert-butyl-4-hydroxymethyl benzaldehyde as a starting material.

Synthesis of Compound 21

74.8 g of the obtained Compound 20 was dissolved in 300 mL of tetrahydrofuran at 0° C. or lower, and then 38.4 g of tert-butoxypotassium was added thereto. Thereafter, 58.5 g of benzyl bromide was dropped into the mixture such that the temperature of the mixture is kept at 10° C. or lower, and the resultant was stirred for 1 hour in an ice bath. The completion of the reaction was confirmed with a thin-layer chromatography. Subsequently, 1 L of water was poured into the reaction liquid, and extracted with ethyl acetate. The organic phase was then dried with magnesium sulfate, and the filtrate was concentrated under reduced pressure. The residue was purified with column chromatography, thereby obtaining 95 g (yield: 92.4%) of Compound 21.

Compound 21: $^1$H-NMR, 400 MHz, δ ($CDCl_3$) ppm: 0.97 (18H, s), 1.19-1.3 (2H, m), 2.08-2.28 (5H, m), 3.31-3.35 (2H, d), 4.52 (2H, s), 7.33-7.41 (5H, m).

Synthesis of Compound 22

85 g (257 mmol) of the obtained Compound 21 was dissolved in 250 mL of diglyme, and then 9.7 g (257 mmol) of sodium borohydride was added thereto. Thereafter, 12.1 g (127 mmol) of magnesium chloride was added to the mixture at 25° C., and then the mixture was stirred for 11 hours at 100° C. The completion of the reaction was confirmed with a thin-layer chromatography, and then the reaction liquid was cooled to a room temperature.

Subsequently, 20 mL of ethyl acetate and 20 mL of methanol were slowly added to the reaction liquid, and then a solution obtained by diluting 40 mL of concentrated hydrochloric acid with 500 mL of water, and 300 mL of ethyl acetate were added thereto. The mixture was stirred for 6 hours to extract. The organic phase was then dried with magnesium sulfate, and the filtrate was concentrated under reduced pressure. The residue was purified with column chromatography, thereby obtaining 83 g of Compound 22.

Compound 22: $^1$H-NMR, 400 MHz, δ ($CDCl_3$) ppm: 0.97 (18H, s), 1.02-1.18 (2H, m), 1.57-1.77 (5H, m), 3.35-3.39 (2H, d), 4.4-4.44 (1H, br), 4.53-4.57 (2H, s), 7.33-7.43 (5H, m).

Synthesis of Compound 26

24 g (42.3 mmol) of Compound 25 was dissolved in 50 mL of methanol and 50 mL of tetrahydrofuran, and then 2.4 g of palladium-modified carbon (5%, wet type) manufactured by Wako Pure Chemical Industries, Ltd. was added thereto, displaced with hydrogen gas, and stirred for 2 hours at a room temperature. The completion of the reaction was confirmed with, a thin-layer chromatography. The catalyst was filtered using celite, and the resultant was concentrated under reduced pressure, thereby obtaining 18.5 g (yield: 92%) of Compound 26.

Compound 26: $^1$H-NMR, 400 MHz, δ ($CDCl_3$) ppm: 0.912-1.01 (20H, m), 1.12-1.47 (16H, m), 1.47-1.92 (4H, m), 3.32-3.54 (1H, m), 3.56-3.72 (2H, d), 6.02-6.12 (1H, s), 6.18-6.27 (1H, s), 10.48-10.63 (1H, br), 10.82-10.97 (1H, br).

Compounds 23 to 25, Compounds 27 to 31, and Exemplary Compound K-9 in the above scheme can be synthesized by utilizing reactions similar to those shown in the above scheme, and cab be obtained similarly to the above by reference to the above scheme and the synthesis methods of Compounds 20-22 and 26. Here, in the synthesis of the Compound 20, tert-butyl alcohol is used as a solvent for reaction. This is intended to obtain the effect of suppressing the hydrogenolysis caused by benzyl alcohol as described in "Catalytic hydrogenation reaction, Application for organic synthesis", Tokyo Kagaku Dojin, p255 (Bull. Chem. Soc. Jpn., 37, 887 (1964)). It is confirmed that the yield is improved and the reaction time is reduced when tert-butyl alcohol is used.

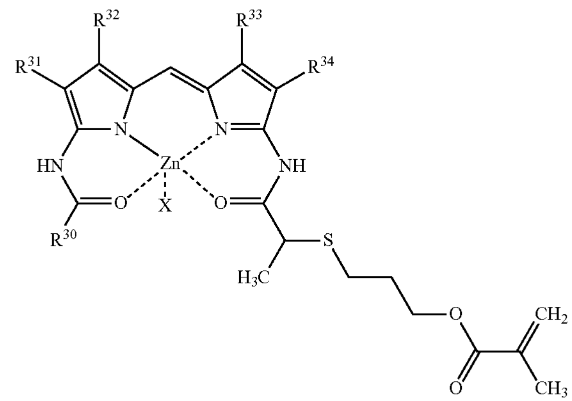
| Exemplary Compound | $R^{30}$ | $R^{31}$ | $R^{32}$ | $R^{33}$ | $R^{34}$ | X |
|---|---|---|---|---|---|---|
| A-1 | —$C_4H_9$(t) | 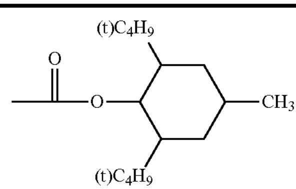 | 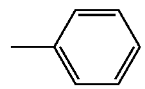 | 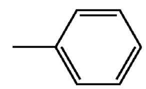 | 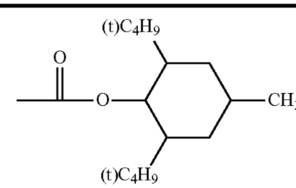 | 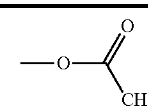 |
| A-2 | —$C_4H_9$(t) | 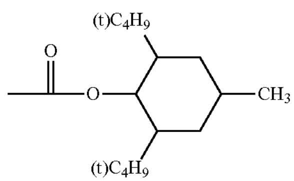 | 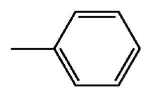 | 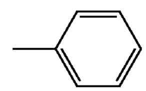 | 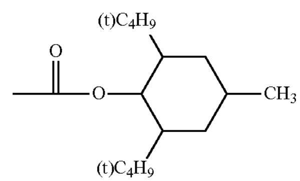 | —Cl |
| A-3 | —$C_4H_9$(t) | 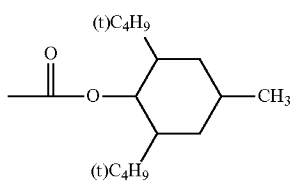 | 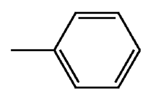 | 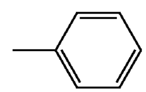 | 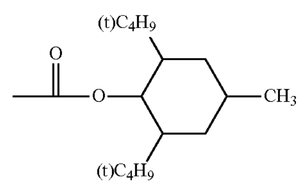 | 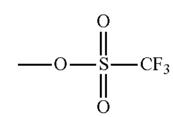 |

-continued
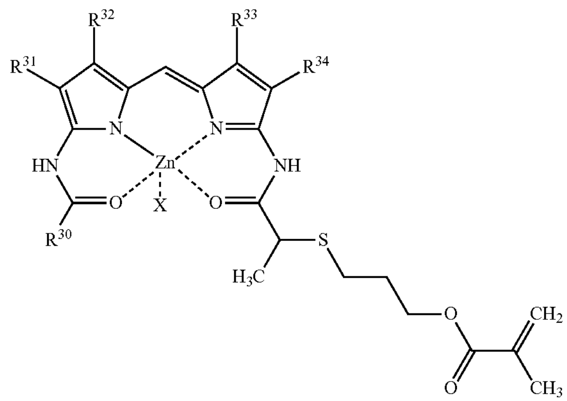
| Exemplary Compound | $R^{30}$ | $R^{31}$ | $R^{32}$ | $R^{33}$ | $R^{34}$ | X |
|---|---|---|---|---|---|---|
| A-4 | $—C_4H_9(t)$ | 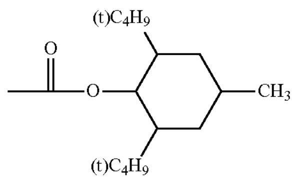 | 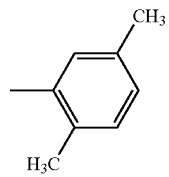 | 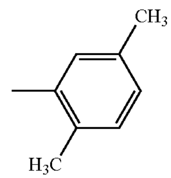 | 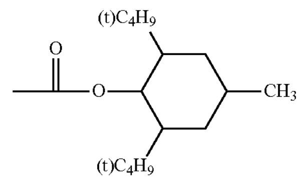 | 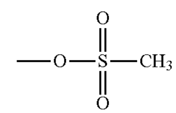 |
| A-5 | 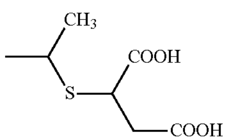 | 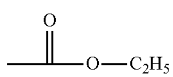 | 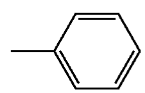 | 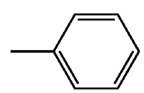 | 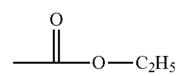 | —Cl |
| A-6 | 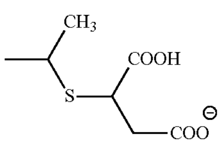 | 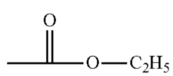 | 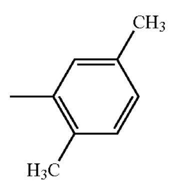 | 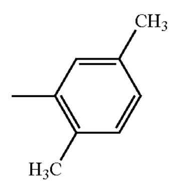 | 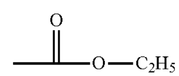 | |

-continued
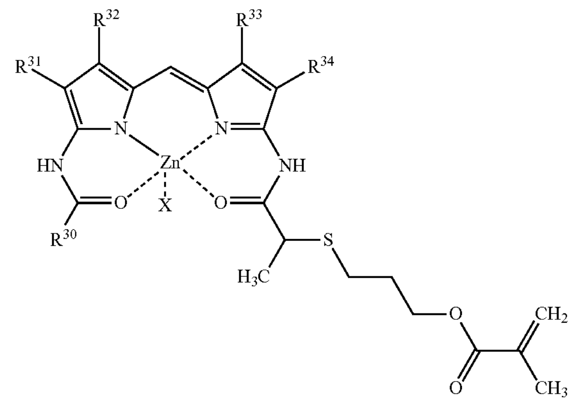
| Exemplary Compound | $R^{30}$ | $R^{31}$ | $R^{32}$ | $R^{33}$ | $R^{34}$ | X |
|---|---|---|---|---|---|---|
| A-7 | 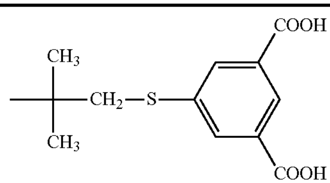 | 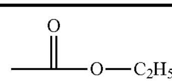 | 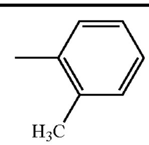 | 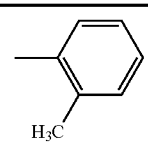 | 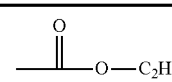 | 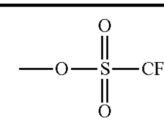 |
| A-8 | —$C_4H_9$(t) | 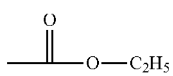 | 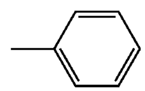 | 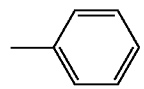 | 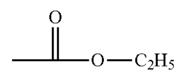 | —Cl |
| A-9 | —$C_4H_9$(t) | 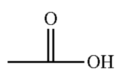 | 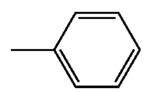 | 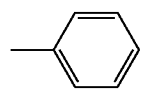 | 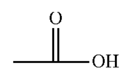 | —F |
| A-10 | —$C_4H_9$(t) | 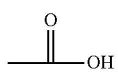 | 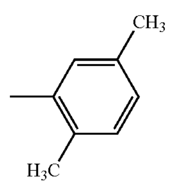 | 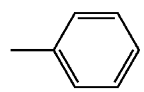 | 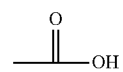 | —Br |

-continued
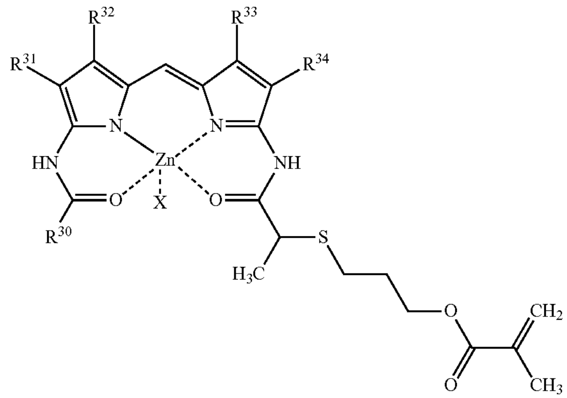
| Exemplary Compound | $R^{30}$ | $R^{31}$ | $R^{32}$ | $R^{33}$ | $R^{34}$ | X |
|---|---|---|---|---|---|---|
| A-11 | —$C_4H_9$(t) | 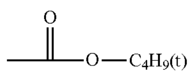 | 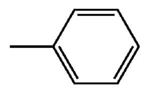 | 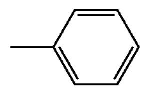 | 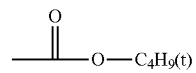 | 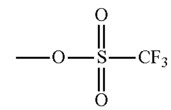 |
| A-12 | 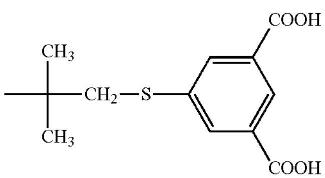 | 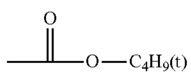 | 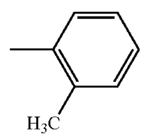 | 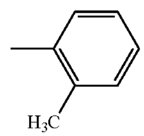 | 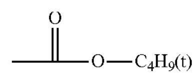 | —Cl |
| A-13 | 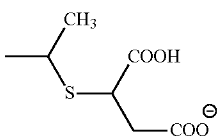 | 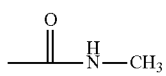 | 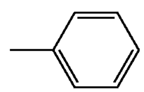 | 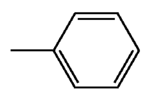 | 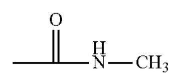 | |
| A-14 | 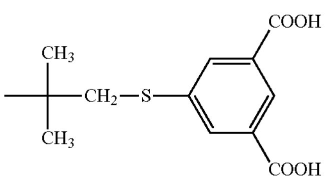 | 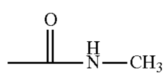 | 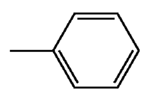 | 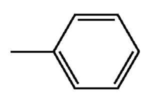 | 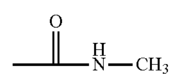 | 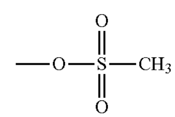 |

-continued
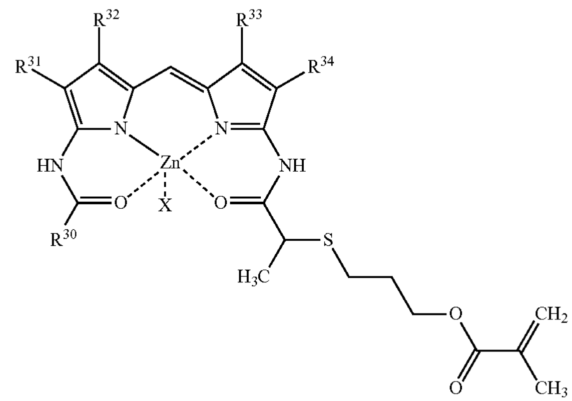
| Exemplary Compound | $R^{30}$ | $R^{31}$ | $R^{32}$ | $R^{33}$ | $R^{34}$ | X |
|---|---|---|---|---|---|---|
| A-15 | 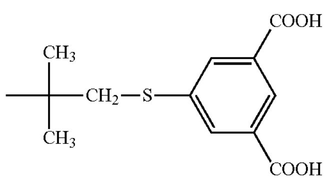 | 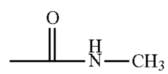 | 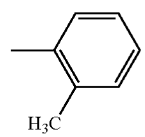 | 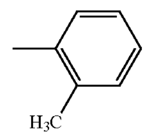 | 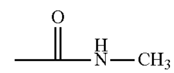 | 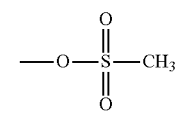 |
| A-16 | 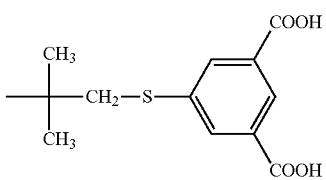 | 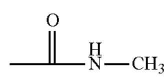 | 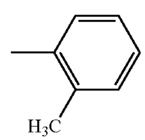 | 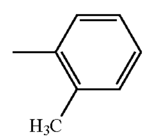 | 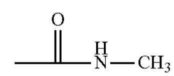 | 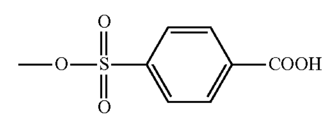 |
| A-17 | 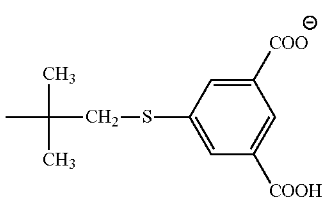 | 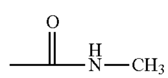 | 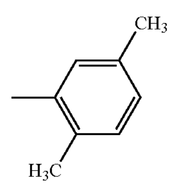 | 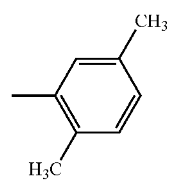 | 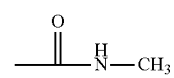 | |

-continued
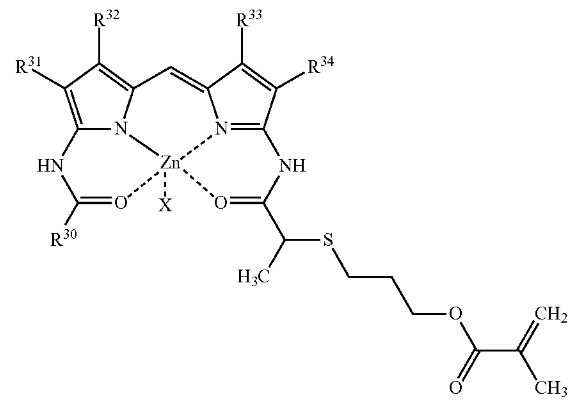
| Exemplary Compound | $R^{30}$ | $R^{31}$ | $R^{32}$ | $R^{33}$ | $R^{34}$ | X |
|---|---|---|---|---|---|---|
| A-18 | 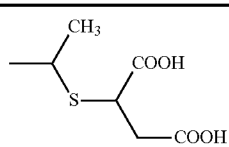 | 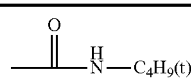 | 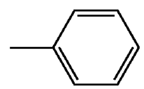 | 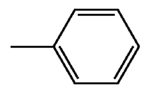 | 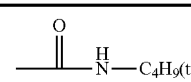 | —Cl |
| A-19 | —$C_4H_9$(t) | 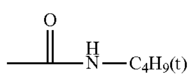 | 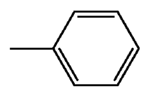 | 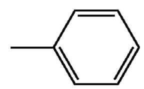 | 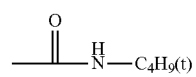 | —Cl |
| A-20 | —$C_4H_9$(t) | 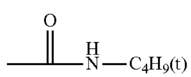 | 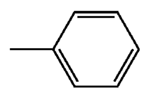 | 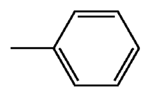 | 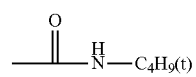 | 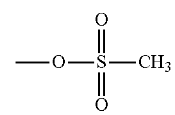 |

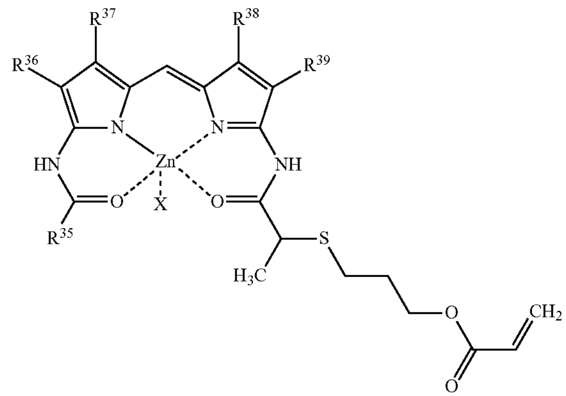
| Exemplary Compound | $R^{35}$ | $R^{36}$ | $R^{37}$ | $R^{38}$ | $R^{39}$ | X |
|---|---|---|---|---|---|---|
| B-1 | $—C_4H_9(t)$ | 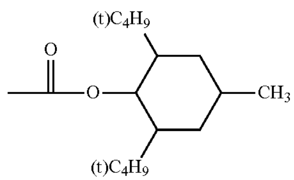 | 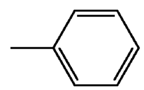 | 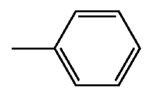 | 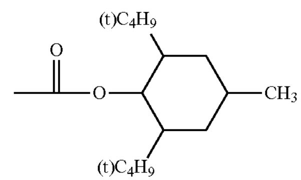 | 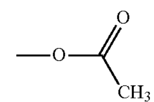 |
| B-2 | $—C_4H_9(t)$ | 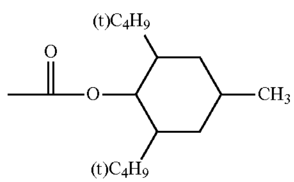 | 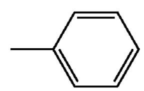 | 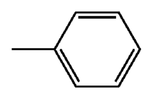 | 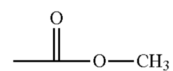 | —Cl |
| B-3 | $—C_4H_9(t)$ | 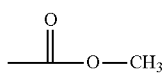 | 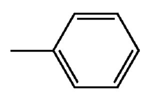 | 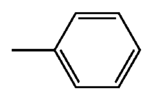 | 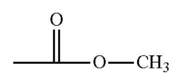 | 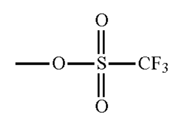 |

-continued
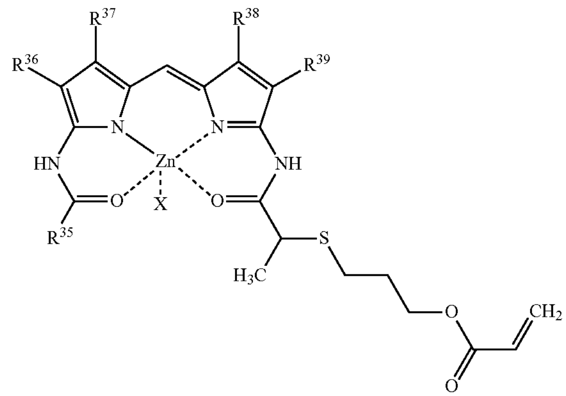
| Exemplary Compound | $R^{35}$ | $R^{36}$ | $R^{37}$ | $R^{38}$ | $R^{39}$ | X |
|---|---|---|---|---|---|---|
| B-4 | —$C_4H_9$(t) | 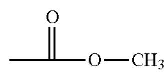 | 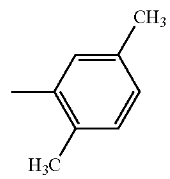 | 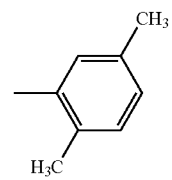 | 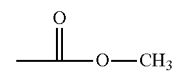 | 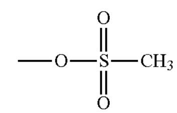 |
| B-5 | 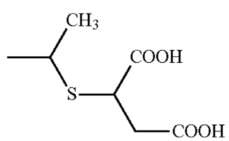 | 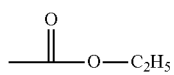 | 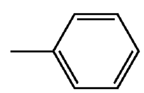 | 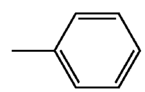 | 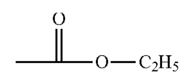 | —Cl |
| B-6 | 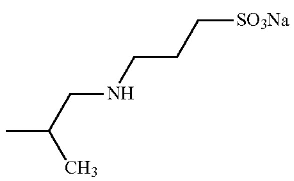 | 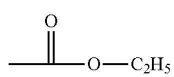 | 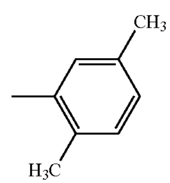 | 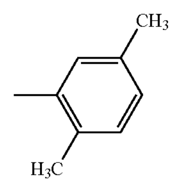 | 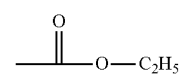 | 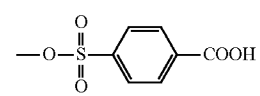 |

-continued
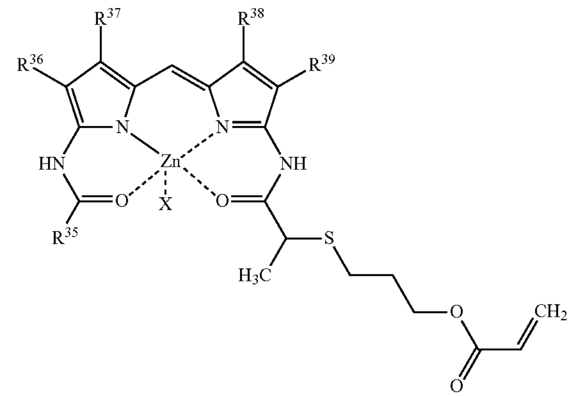
| Exemplary Compound | $R^{35}$ | $R^{36}$ | $R^{37}$ | $R^{38}$ | $R^{39}$ | X |
|---|---|---|---|---|---|---|
| B-7 | 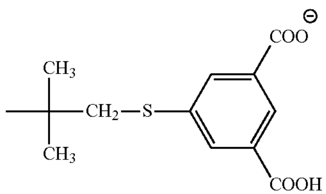 | 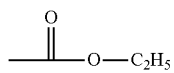 | 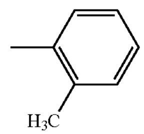 | 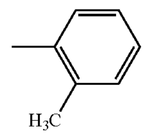 | 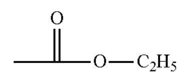 | |
| B-8 | —$C_4H_9$(t) | 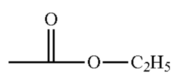 | 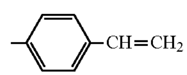 | 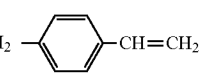 | 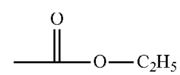 | —Cl |
| B-9 | —$C_4H_9$(t) | 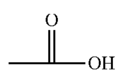 | 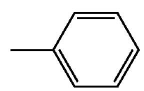 | 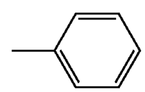 | 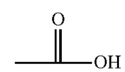 | —F |
| B-10 | —$C_4H_9$(t) | 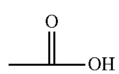 | 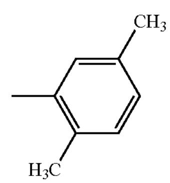 | 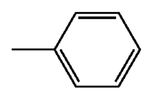 | 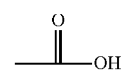 | —Br |

-continued
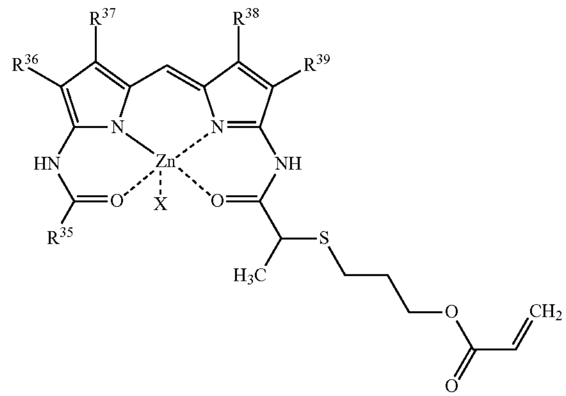
| Exemplary Compound | $R^{35}$ | $R^{36}$ | $R^{37}$ | $R^{38}$ | $R^{39}$ | X |
|---|---|---|---|---|---|---|
| B-11 | —$C_4H_9$(t) | 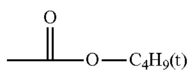 | 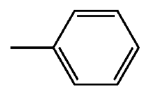 | 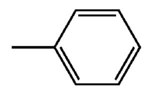 | 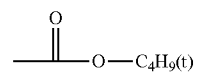 | 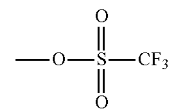 |
| B-12 | 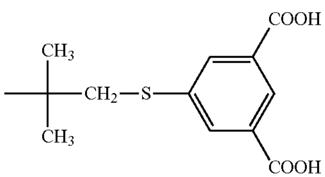 | 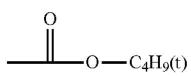 | 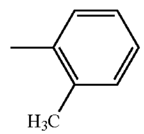 | 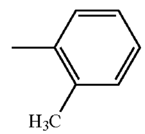 | 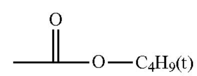 | 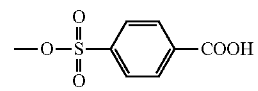 |
| B-13 | 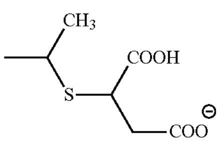 | 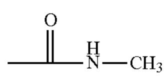 | 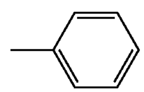 | 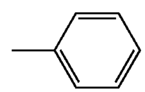 | 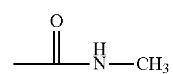 | |
| B-14 | —$C_4H_9$(t) | 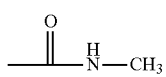 | 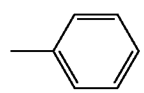 | 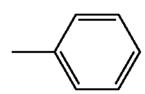 | 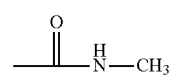 | 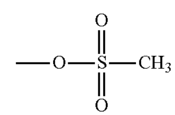 |

-continued
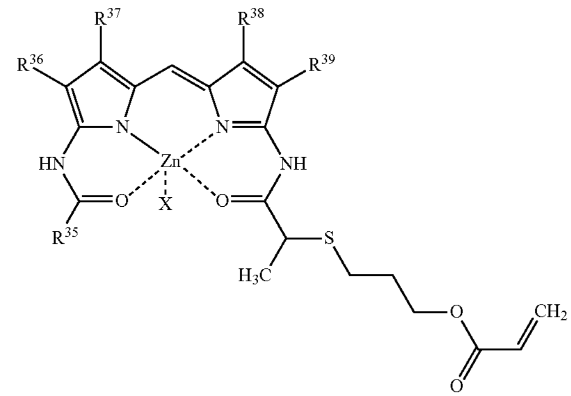
| Exemplary Compound | $R^{35}$ | $R^{36}$ | $R^{37}$ | $R^{38}$ | $R^{39}$ | X |
|---|---|---|---|---|---|---|
| B-15 | 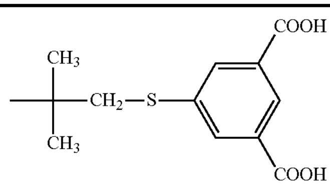 | 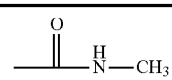 | 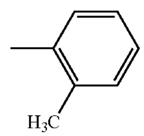 | 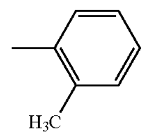 | 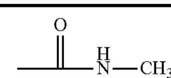 | 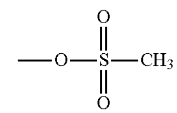 |
| B-16 | 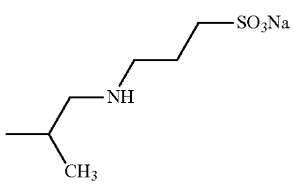 | 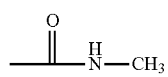 | 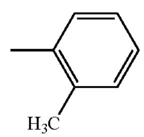 | 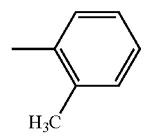 | 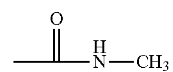 | —Cl |
| B-17 | 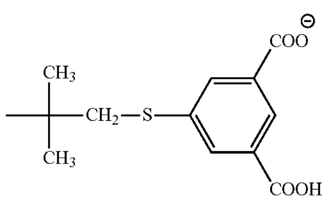 | 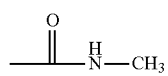 | 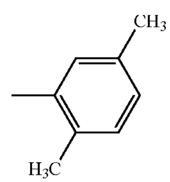 | 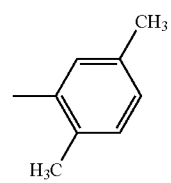 | 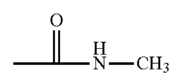 | |

-continued
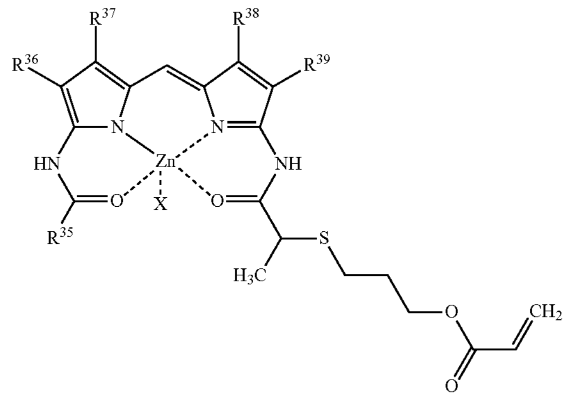
| Exemplary Compound | $R^{35}$ | $R^{36}$ | $R^{37}$ | $R^{38}$ | $R^{39}$ | X |
|---|---|---|---|---|---|---|
| B-18 | 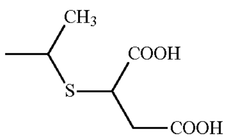 | 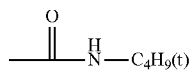 | 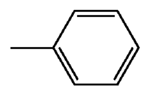 | 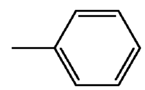 | 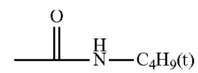 | —Cl |
| B-19 | $—C_4H_9(t)$ | 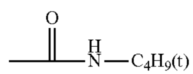 | 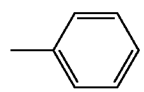 | 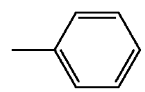 | 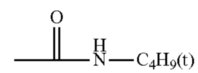 | —Cl |
| B-20 | $—C_4H_9(t)$ | 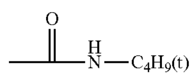 | 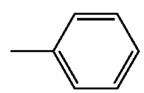 | 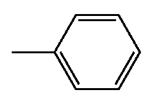 | 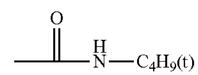 | 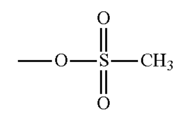 |

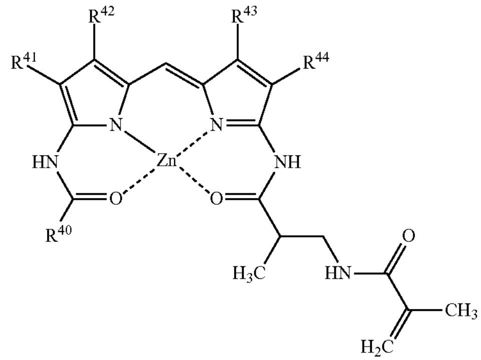
| Exemplary Compound | $R^{40}$ | $R^{41}$ | $R^{42}$ | $R^{43}$ | $R^{44}$ | X |
|---|---|---|---|---|---|---|
| C-1 | $-C_4H_9(t)$ | 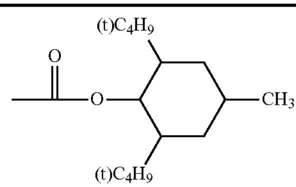 | 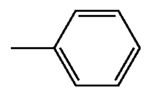 | 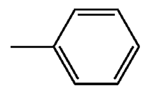 | 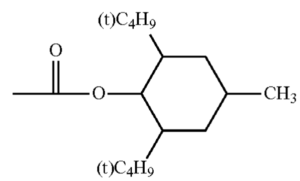 | 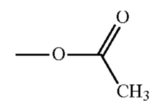 |
| C-2 | $-C_4H_9(t)$ | 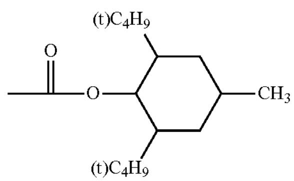 | 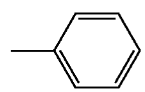 | 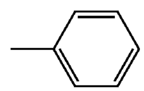 | 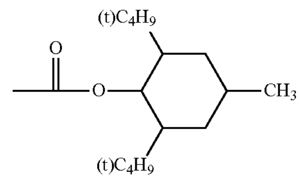 | $-Cl$ |
| C-3 | $-C_4H_9(t)$ | 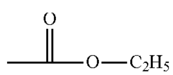 | 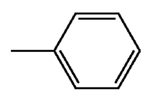 | 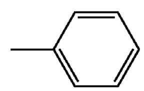 | 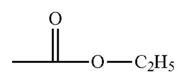 | 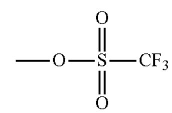 |
| C-4 | $-C_4H_9(t)$ | 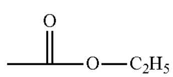 | 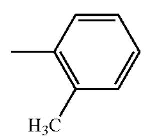 | 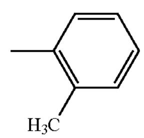 | 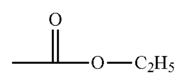 | $-Cl$ |

-continued
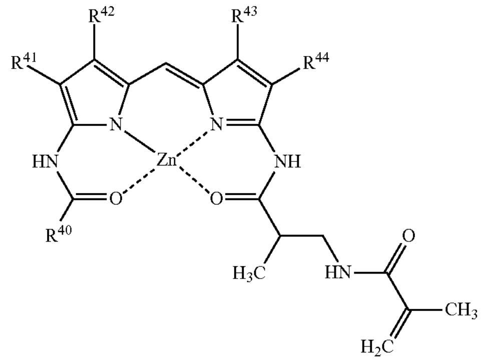
| Exemplary Compound | $R^{40}$ | $R^{41}$ | $R^{42}$ | $R^{43}$ | $R^{44}$ | X |
|---|---|---|---|---|---|---|
| C-5 | 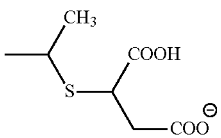 | 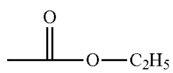 | 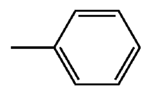 | 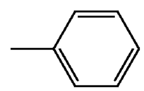 | 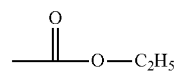 | |
| C-6 | 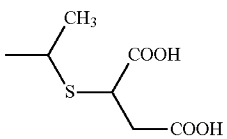 | 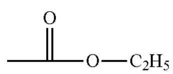 | 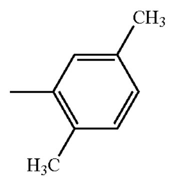 | 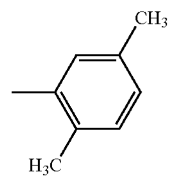 | 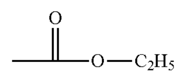 | —Cl |
| C-7 | 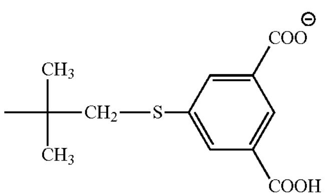 | 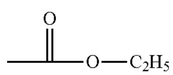 | 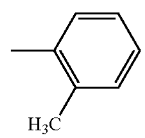 | 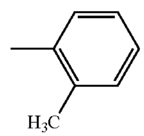 | 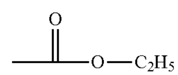 | |

-continued
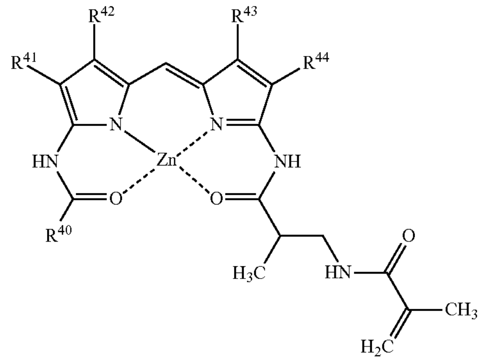
| Exemplary Compound | $R^{40}$ | $R^{41}$ | $R^{42}$ | $R^{43}$ | $R^{44}$ | X |
|---|---|---|---|---|---|---|
| C-8 | 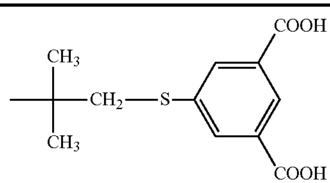 | 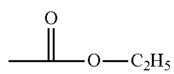 | 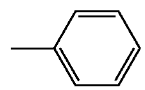 | 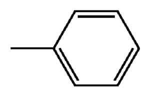 | 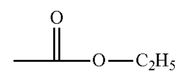 | —Cl |
| C-9 | $—C_4H_9(t)$ | 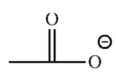 | 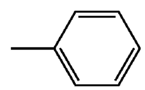 | 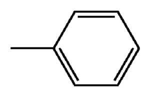 | 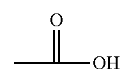 | |
| C-10 | $—C_4H_9(t)$ | 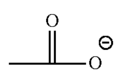 | 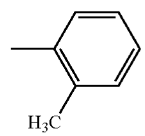 | 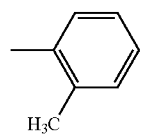 | 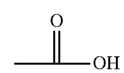 | |
| C-11 | $—C_4H_9(t)$ | 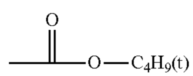 | 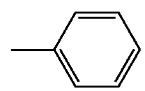 | 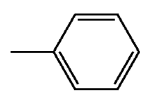 | 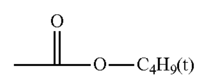 | —Cl |

-continued
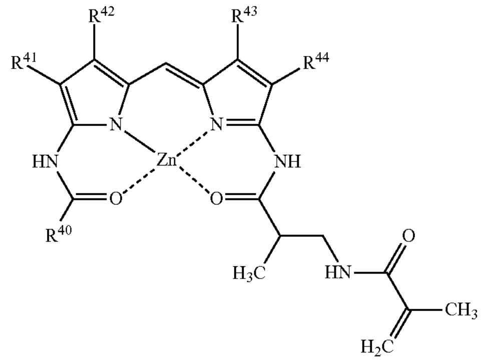
| Exemplary Compound | $R^{40}$ | $R^{41}$ | $R^{42}$ | $R^{43}$ | $R^{44}$ | X |
|---|---|---|---|---|---|---|
| C-12 | 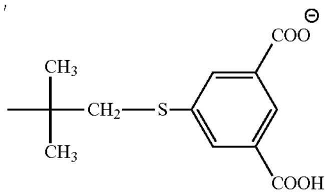 | 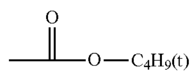 | 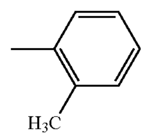 | 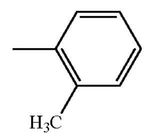 | 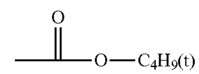 | |
| C-13 | 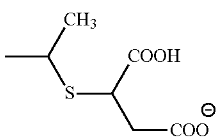 | 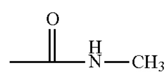 | 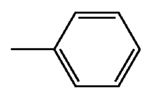 | 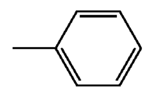 | 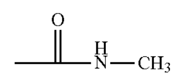 | |
| C-14 | 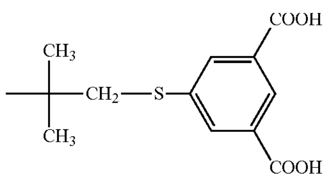 | 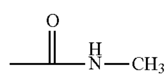 | 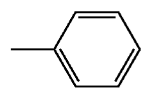 | 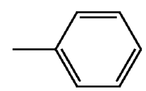 | 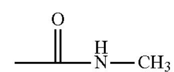 | —Cl |

-continued
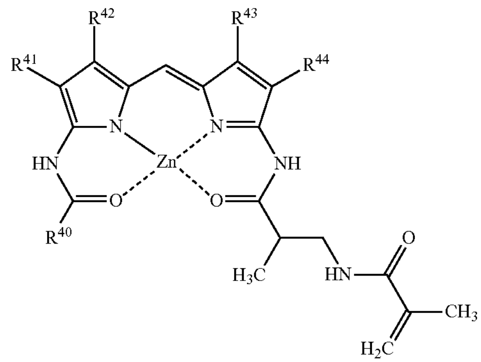
| Exemplary Compound | $R^{40}$ | $R^{41}$ | $R^{42}$ | $R^{43}$ | $R^{44}$ | X |
| --- | --- | --- | --- | --- | --- | --- |
| C-15 | 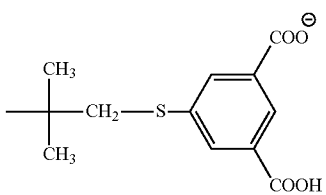 | 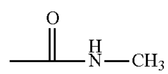 | 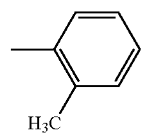 | 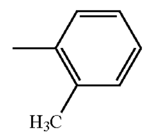 | 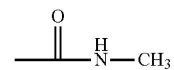 | |
| C-16 | 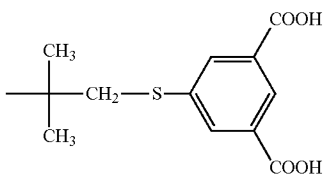 | 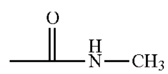 | 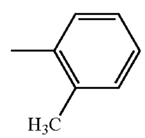 | 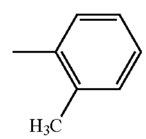 | 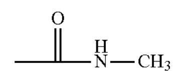 | —Cl |
| C-17 | 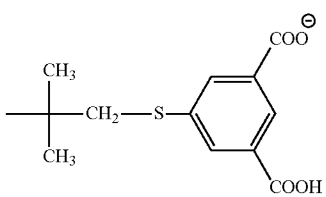 | 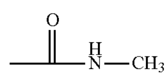 | 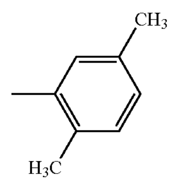 | 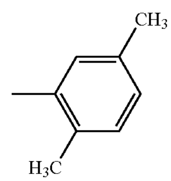 | 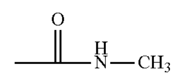 | |

-continued
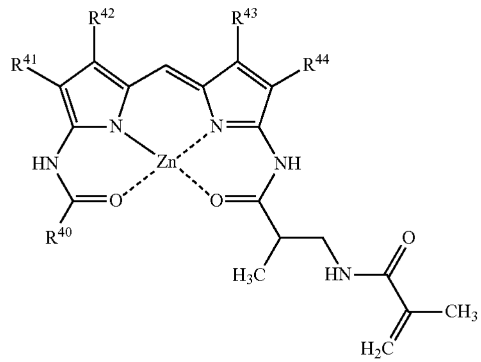
| Exemplary Compound | $R^{40}$ | $R^{41}$ | $R^{42}$ | $R^{43}$ | $R^{44}$ | X |
|---|---|---|---|---|---|---|
| C-18 | 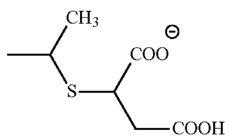 | 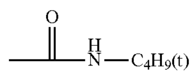 | 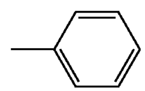 | 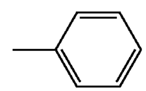 | 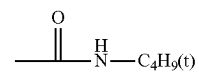 | |
| C-19 | —$C_4H_9$(t) | 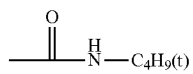 | 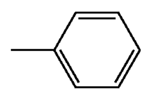 | 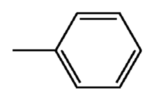 | 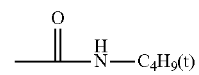 | —Cl |
| C-20 | —$C_4H_9$(t) | 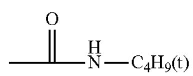 | 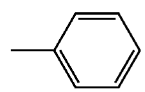 | 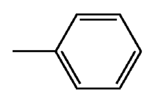 | 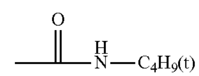 | 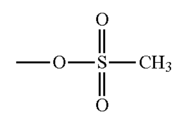 |

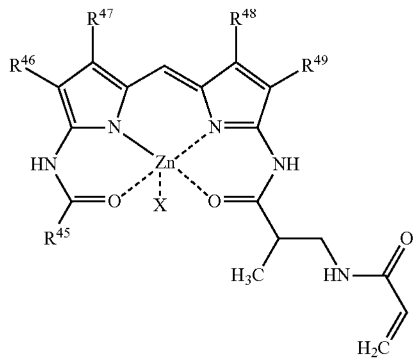
| Exemplary Compound | $R^{45}$ | $R^{46}$ | $R^{47}$ | $R^{48}$ | $R^{49}$ | X |
|---|---|---|---|---|---|---|
| D-1 | $—C_4H_9(t)$ | 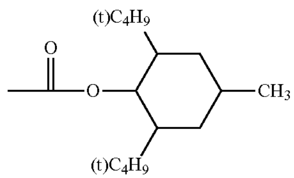 | 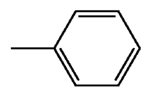 | 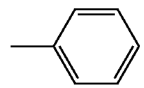 | 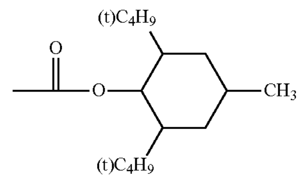 | 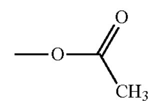 |
| D-2 | $—C_4H_9(t)$ | 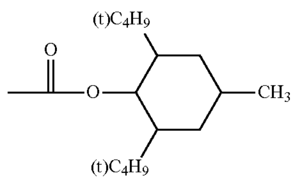 | 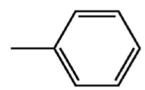 | 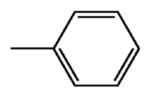 | 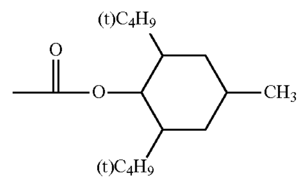 | —Cl |
| D-3 | 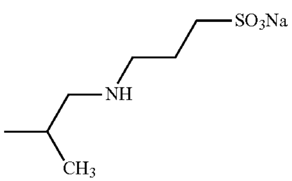 | 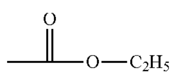 | 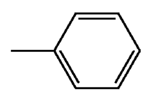 | 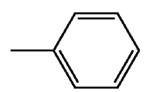 | 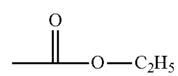 | 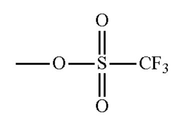 |

-continued
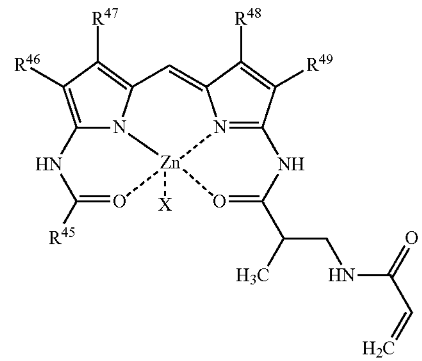
| Exemplary Compound | $R^{45}$ | $R^{46}$ | $R^{47}$ | $R^{48}$ | $R^{49}$ | X |
|---|---|---|---|---|---|---|
| D-4 | —$C_4H_9$(t) | 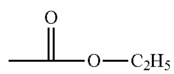 | 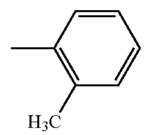 | 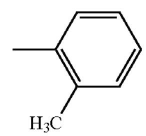 | 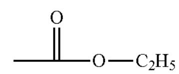 | —Cl |
| D-5 | 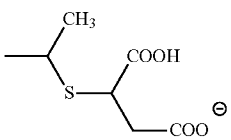 | 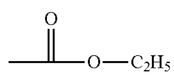 | 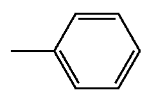 | 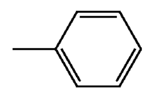 | 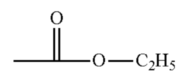 | |
| D-6 | 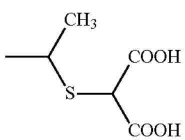 | 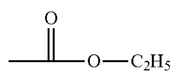 | 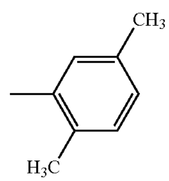 | 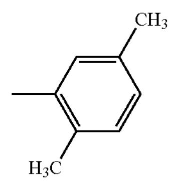 | 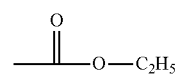 | —Cl |
| D-7 | 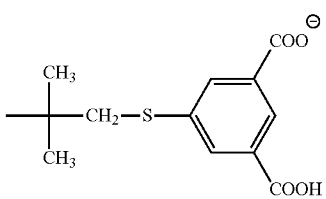 | 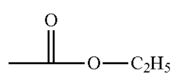 | 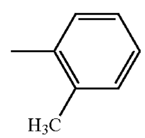 | 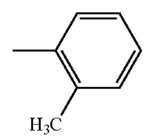 | 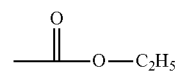 | |

-continued
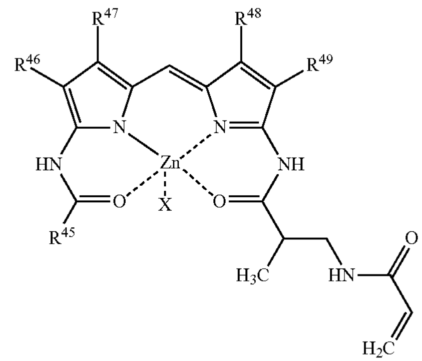
| Exemplary Compound | $R^{45}$ | $R^{46}$ | $R^{47}$ | $R^{48}$ | $R^{49}$ | X |
|---|---|---|---|---|---|---|
| D-8 | 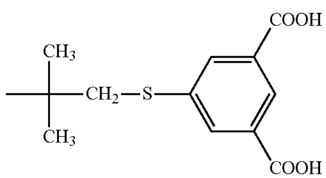 | 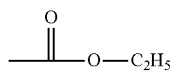 | 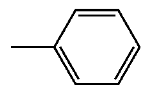 | 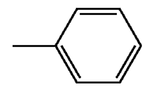 | 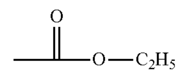 | —Cl |
| D-9 | $—C_4H_9(t)$ | 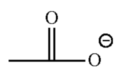 | 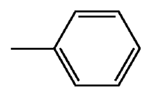 | 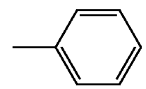 | 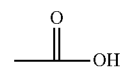 | |
| D-10 | $—C_4H_9(t)$ | 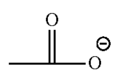 | 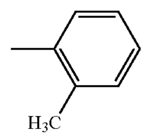 | 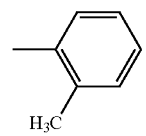 | 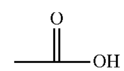 | |
| D-11 | $—C_4H_9(t)$ | 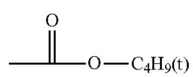 | 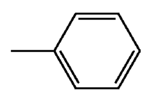 | 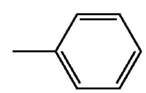 | 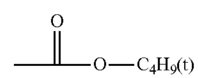 | —Cl |

-continued
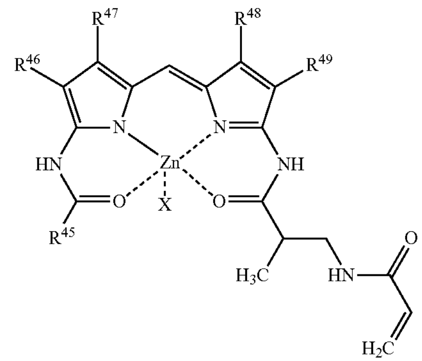
| Exemplary Compound | $R^{45}$ | $R^{46}$ | $R^{47}$ | $R^{48}$ | $R^{49}$ | X |
|---|---|---|---|---|---|---|
| D-12 | 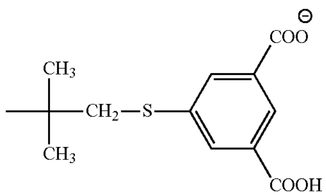 | 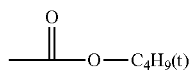 | 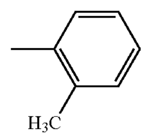 | 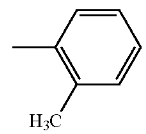 | 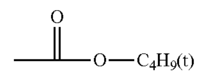 | |
| D-13 | 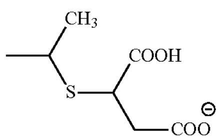 | 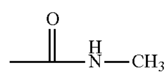 | 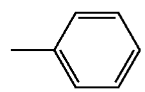 | 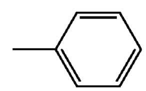 | 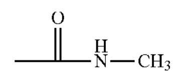 | |
| D-14 | 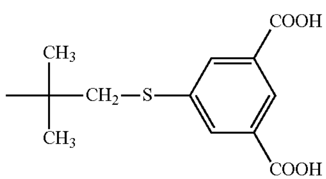 | 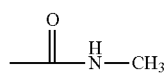 | 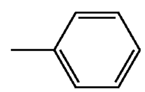 | 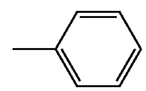 | 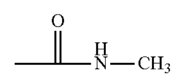 | —Cl |

-continued
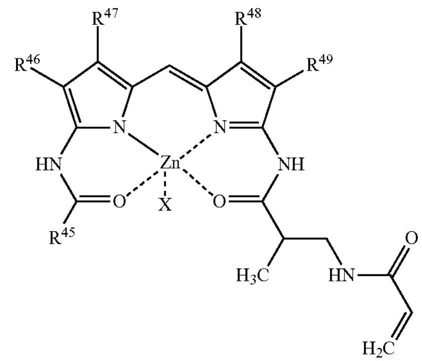
| Exemplary Compound | $R^{45}$ | $R^{46}$ | $R^{47}$ | $R^{48}$ | $R^{49}$ | X |
|---|---|---|---|---|---|---|
| D-15 | 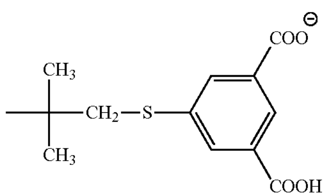 | 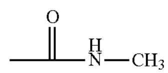 | 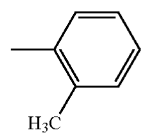 | 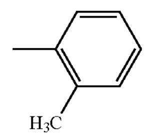 | 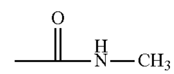 | |
| D-16 | 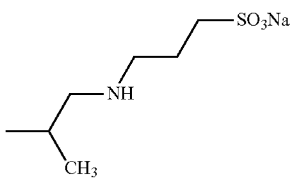 | 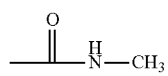 | 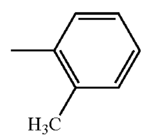 | 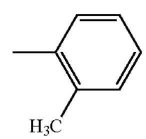 | 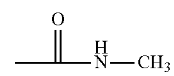 | —Cl |
| D-17 | 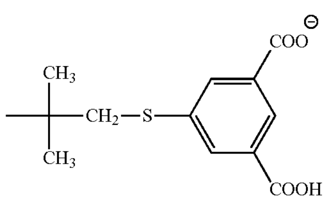 | 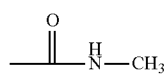 | 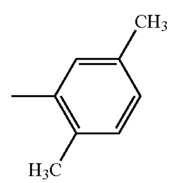 | 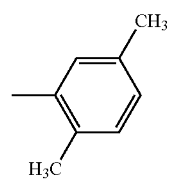 | 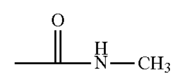 | |

-continued
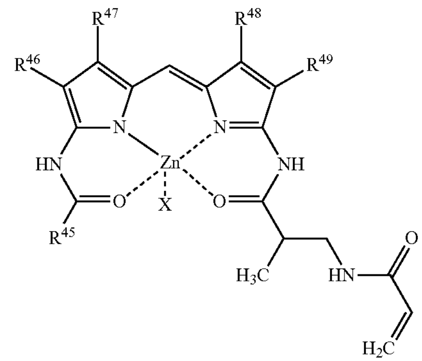
| Exemplary Compound | $R^{45}$ | $R^{46}$ | $R^{47}$ | $R^{48}$ | $R^{49}$ | X |
|---|---|---|---|---|---|---|
| D-18 | 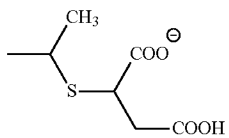 | 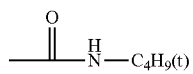 | 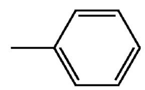 | 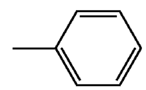 | 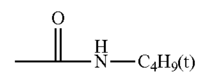 | |
| D-19 | —$C_4H_9$(t) | 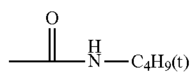 | 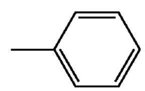 | 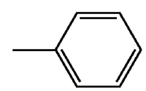 | 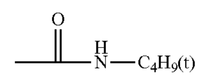 | —Cl |
| D-20 | —$C_4H_9$(t) | 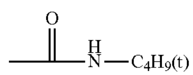 | 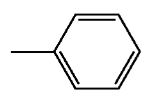 | 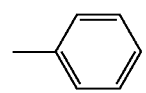 | 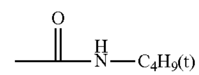 | 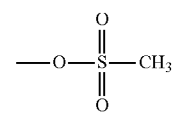 |

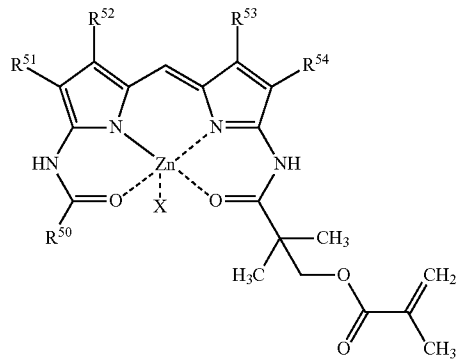
| Exemplary Compound | $R^{50}$ | $R^{51}$ | $R^{52}$ | $R^{53}$ | $R^{54}$ | X |
|---|---|---|---|---|---|---|
| E-1 | —$C_4H_9$(t) | 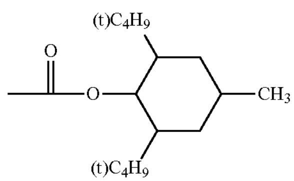 | 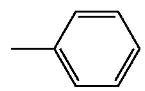 | 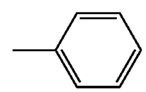 | 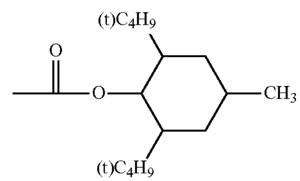 | 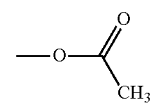 |
| E-2 | —$C_4H_9$(t) | 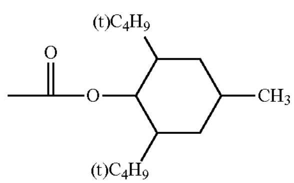 | 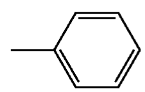 | 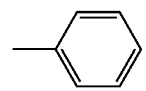 | 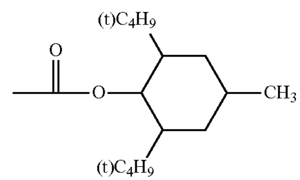 | —Cl |
| E-3 | —$C_4H_9$(t) | 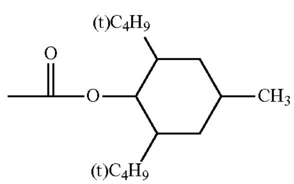 | 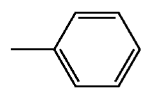 | 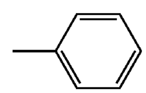 | 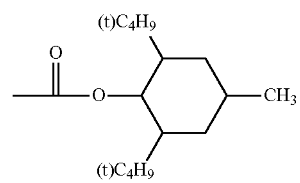 | 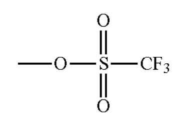 |

-continued
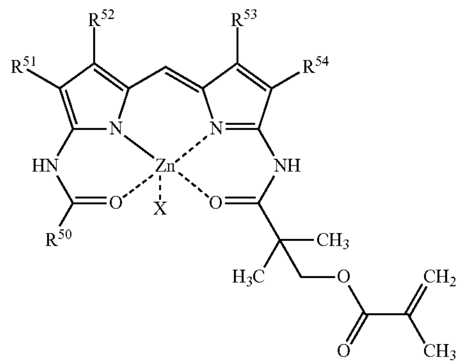
| Exemplary Compound | $R^{50}$ | $R^{51}$ | $R^{52}$ | $R^{53}$ | $R^{54}$ | X |
|---|---|---|---|---|---|---|
| E-4 | —$C_4H_9$(t) | 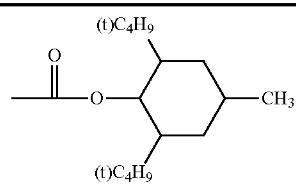 | 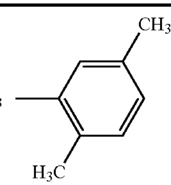 | 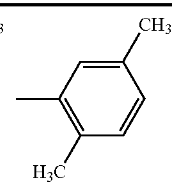 | 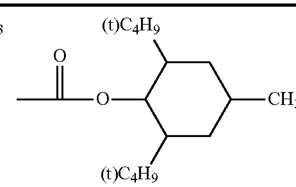 | 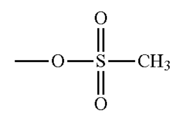 |
| E-5 | 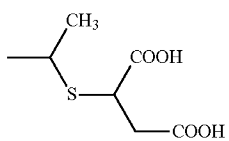 | 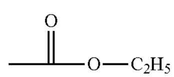 | 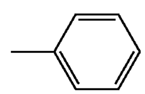 | 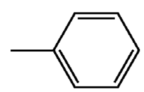 | 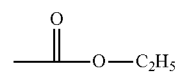 | —Cl |
| E-6 | 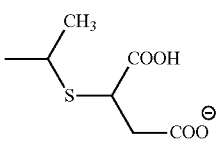 | 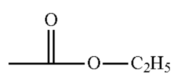 | 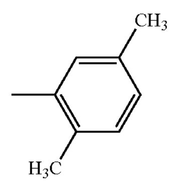 | 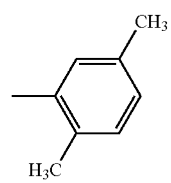 | 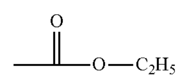 | |

-continued
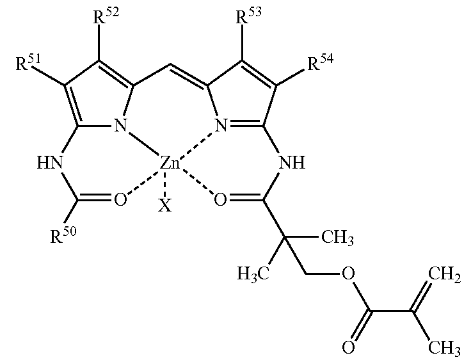
| Exemplary Compound | $R^{50}$ | $R^{51}$ | $R^{52}$ | $R^{53}$ | $R^{54}$ | X |
|---|---|---|---|---|---|---|
| E-7 | 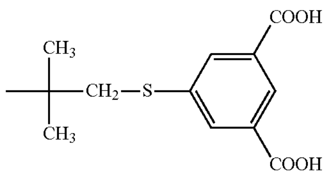 | 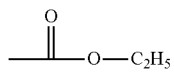 | 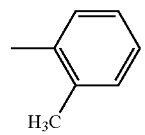 | 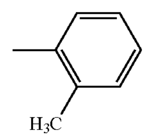 | 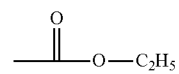 | 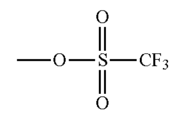 |
| E-8 | —$C_4H_9$(t) | 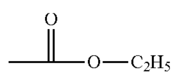 | 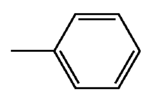 | 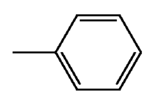 | 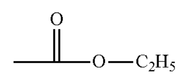 | —Cl |
| E-9 | —$C_4H_9$(t) | 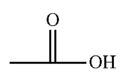 | 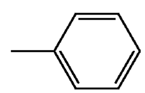 | 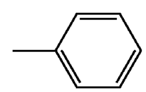 | 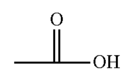 | —F |
| E-10 | —$C_4H_9$(t) | 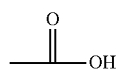 | 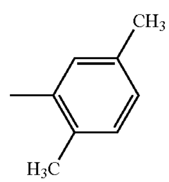 | 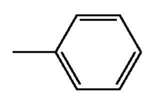 | 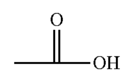 | —Br |

-continued
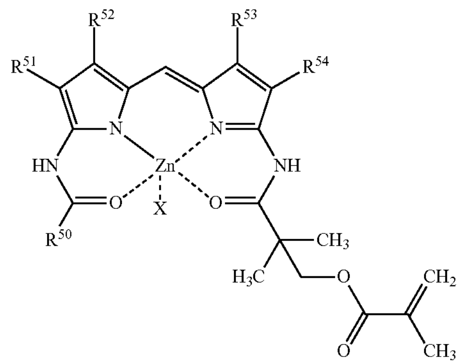
| Exemplary Compound | $R^{50}$ | $R^{51}$ | $R^{52}$ | $R^{53}$ | $R^{54}$ | X |
|---|---|---|---|---|---|---|
| E-11 | —$C_4H_9$(t) | 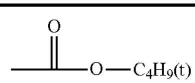 | 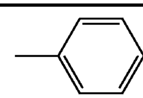 | 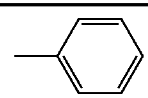 | 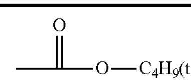 | 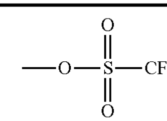 |
| E-12 | 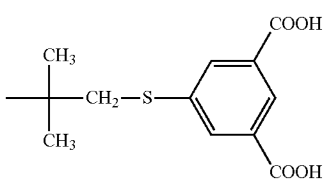 | 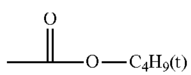 | 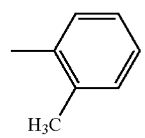 | 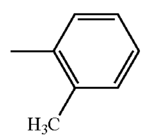 | 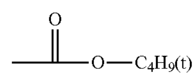 | —Cl |
| E-13 | 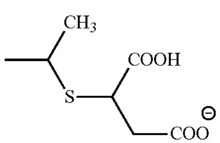 | 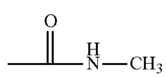 | 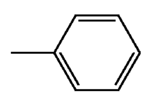 | 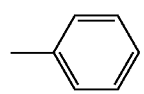 | 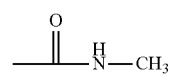 | |
| E-14 | 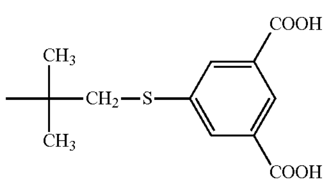 | 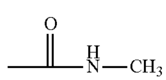 | 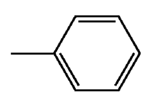 | 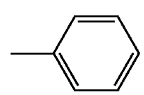 | 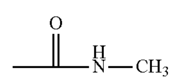 | 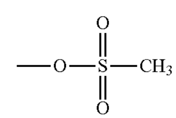 |

-continued
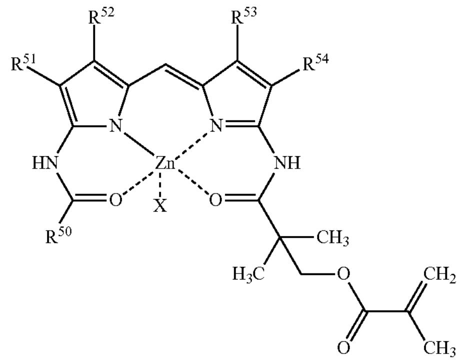
| Exemplary Compound | $R^{50}$ | $R^{51}$ | $R^{52}$ | $R^{53}$ | $R^{54}$ | X |
|---|---|---|---|---|---|---|
| E-15 | 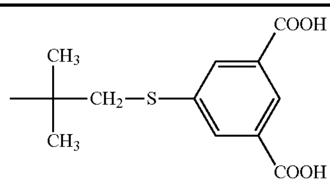 | 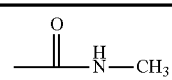 | 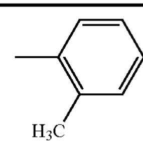 | 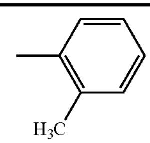 | 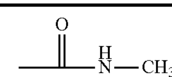 | 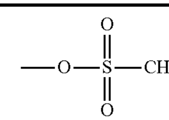 |
| E-16 | 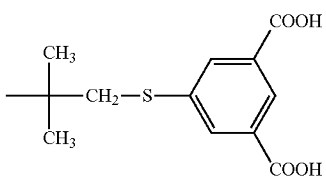 | 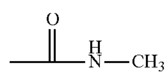 | 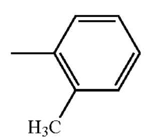 | 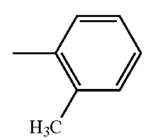 | 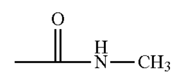 | 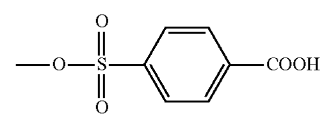 |
| E-17 | 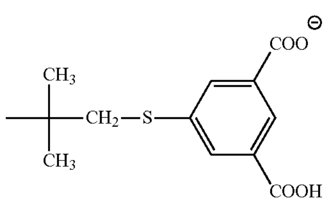 | 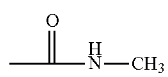 | 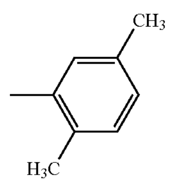 | 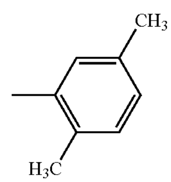 | 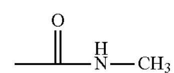 | |

-continued
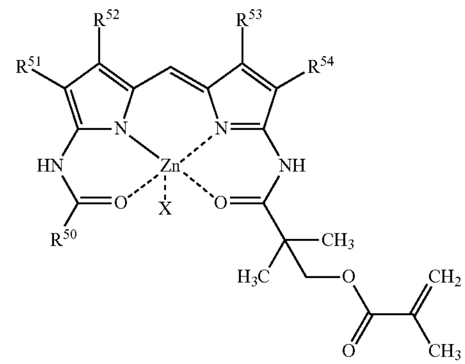
| Exemplary Compound | $R^{50}$ | $R^{51}$ | $R^{52}$ | $R^{53}$ | $R^{54}$ | X |
|---|---|---|---|---|---|---|
| E-18 | 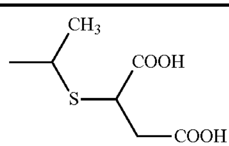 | 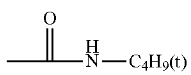 | 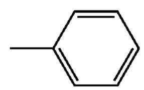 | 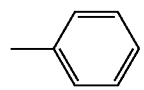 | 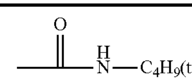 | —Cl |
| E-19 | $—C_4H_9(t)$ | 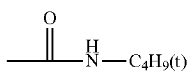 | 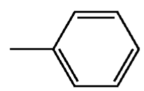 | 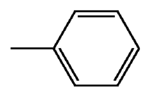 | 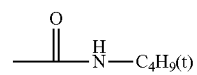 | —Cl |
| E-20 | $—C_4H_9(t)$ | 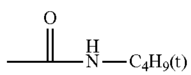 | 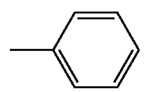 | 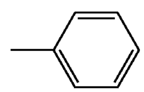 | 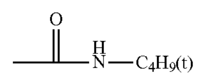 | 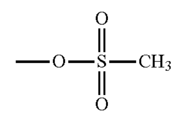 |

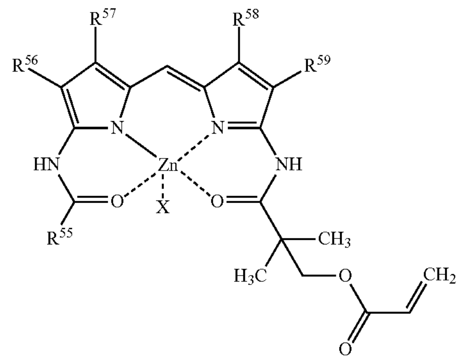
| Exemplary Compound | $R^{55}$ | $R^{56}$ | $R^{57}$ | $R^{58}$ | $R^{59}$ | X |
|---|---|---|---|---|---|---|
| F-1 | $—C_4H_9(t)$ | 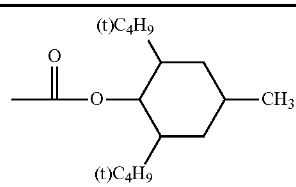 | 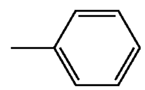 | 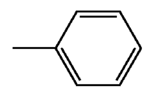 | 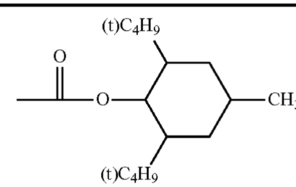 | 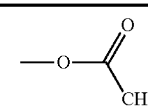 |
| F-2 | $—C_4H_9(t)$ | 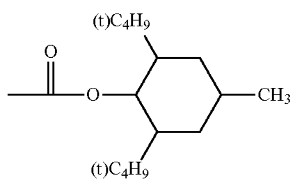 | 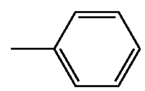 | 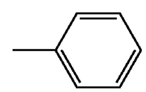 | 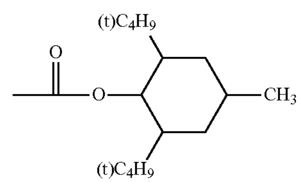 | —Cl |
| F-3 | 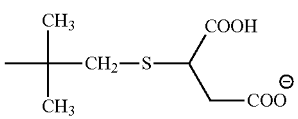 | 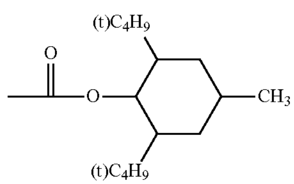 | 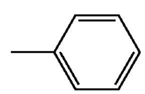 | 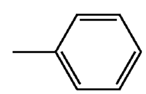 | 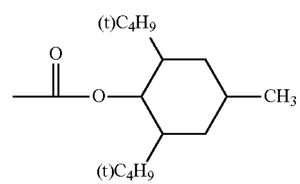 | |

-continued
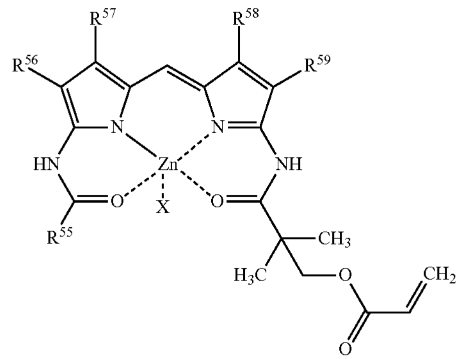
| Exemplary Compound | $R^{55}$ | $R^{56}$ | $R^{57}$ | $R^{58}$ | $R^{59}$ | X |
|---|---|---|---|---|---|---|
| F-4 | —$C_4H_9$(t) | 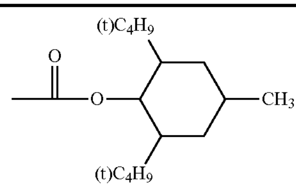 | 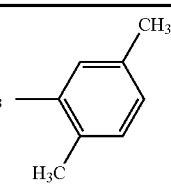 | 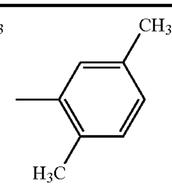 | 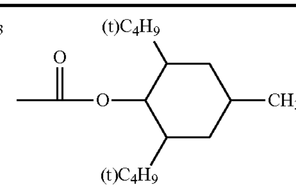 | 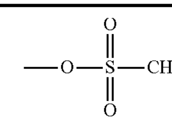 |
| F-5 | 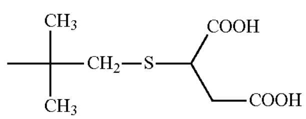 | 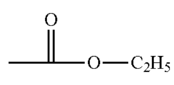 | 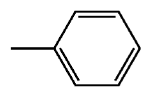 | 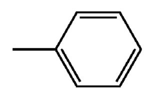 | 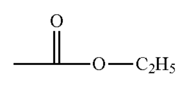 | —Cl |
| F-6 | 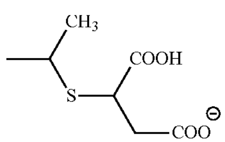 | 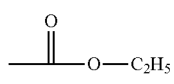 | 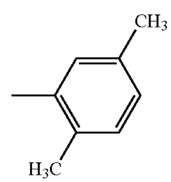 | 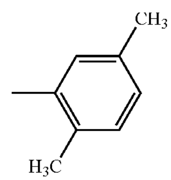 | 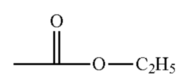 | |
| F-7 | 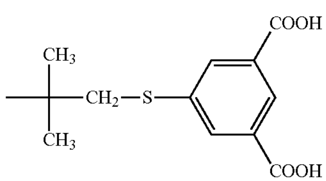 | 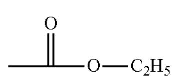 | 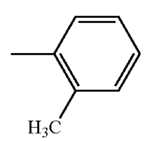 | 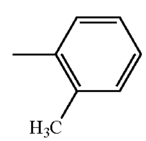 | 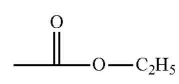 | 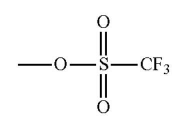 |

-continued
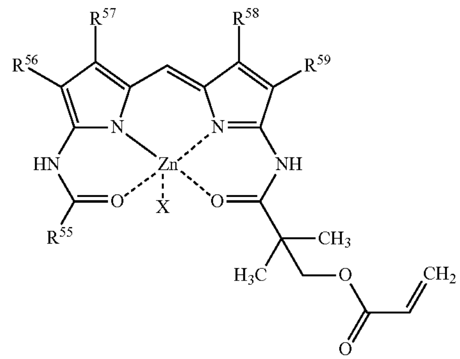
| Exemplary Compound | $R^{55}$ | $R^{56}$ | $R^{57}$ | $R^{58}$ | $R^{59}$ | X |
|---|---|---|---|---|---|---|
| F-8 | 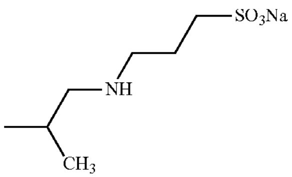 | 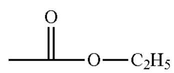 | 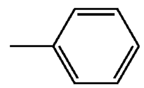 | 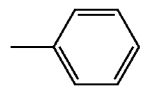 | 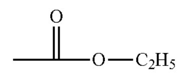 | —Cl |
| F-9 | $—C_4H_9(t)$ | 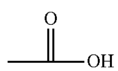 | 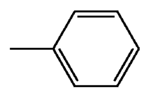 | 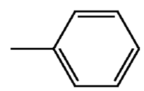 | 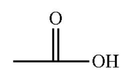 | —F |
| F-10 | $—C_4H_9(t)$ | 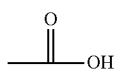 | 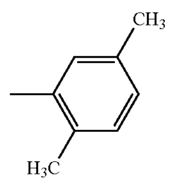 | 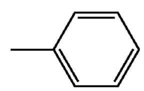 | 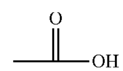 | —Br |
| F-11 | $—C_4H_9(t)$ | 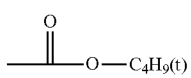 | 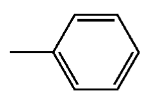 | 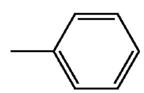 | 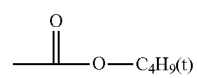 | 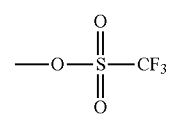 |

-continued
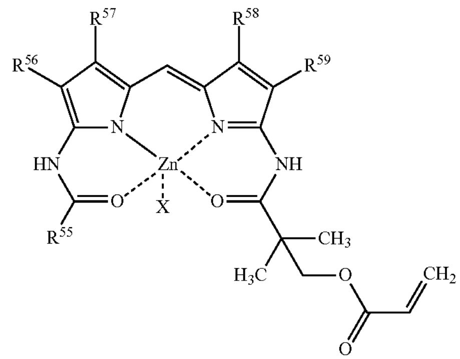
| Exemplary Compound | $R^{55}$ | $R^{56}$ | $R^{57}$ | $R^{58}$ | $R^{59}$ | X |
|---|---|---|---|---|---|---|
| F-12 | 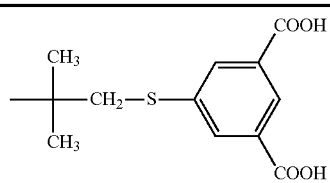 | 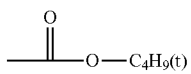 | 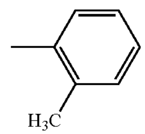 | 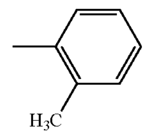 | 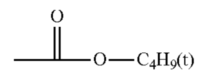 | —Cl |
| F-13 | 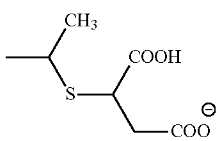 | 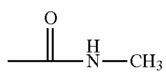 | 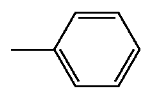 | 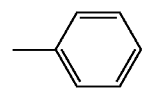 | 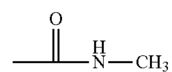 | |
| F-14 | 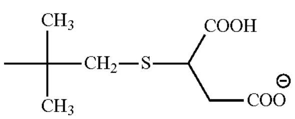 | 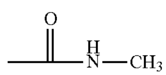 | 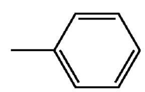 | 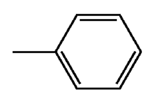 | 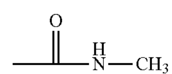 | |
| F-15 | 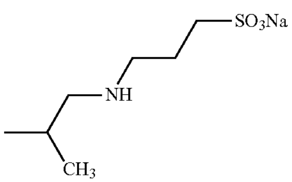 | 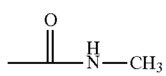 | 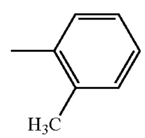 | 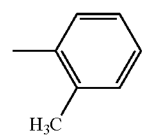 | 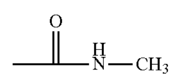 | 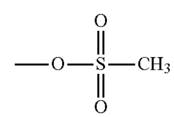 |

-continued
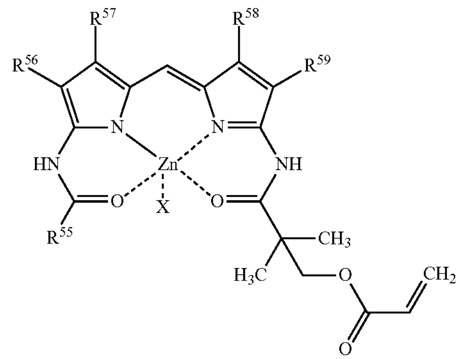
| Exemplary Compound | $R^{55}$ | $R^{56}$ | $R^{57}$ | $R^{58}$ | $R^{59}$ | X |
|---|---|---|---|---|---|---|
| F-16 | 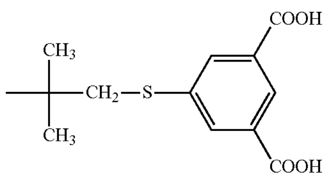 | 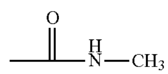 | 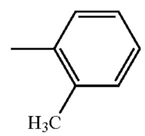 | 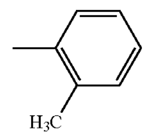 | 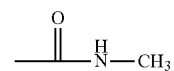 | 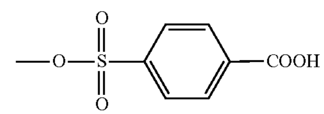 |
| F-17 | 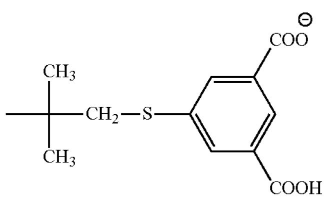 | 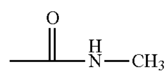 | 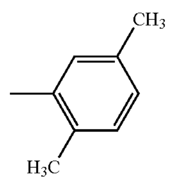 | 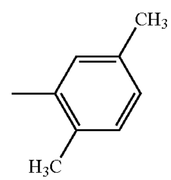 | 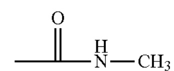 | |
| F-18 | 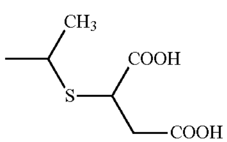 | 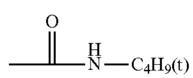 | 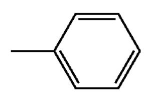 | 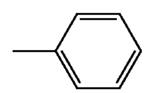 | 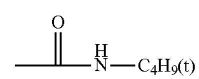 | —Cl |
| F-19 | $—C_4H_9(t)$ | 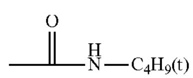 | 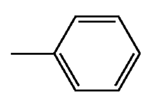 | 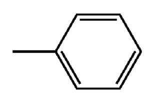 | 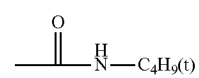 | —Cl |

-continued
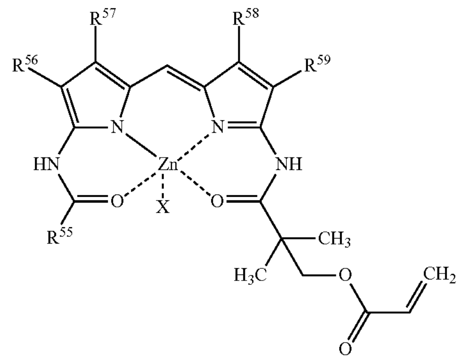
| Exemplary Compound | $R^{55}$ | $R^{56}$ | $R^{57}$ | $R^{58}$ | $R^{59}$ | X |
|---|---|---|---|---|---|---|
| F-20 | 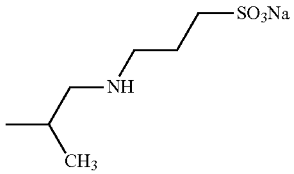 | 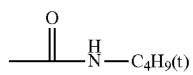 | 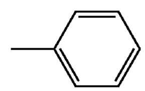 | 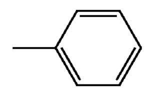 | 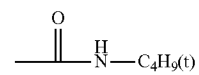 | 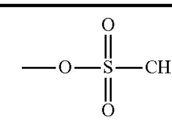 |

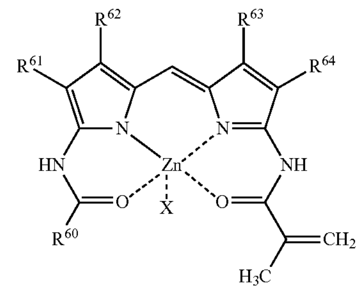
| Exemplary Compound | $R^{60}$ | $R^{61}$ | $R^{62}$ | $R^{63}$ | $R^{64}$ | X |
|---|---|---|---|---|---|---|
| G-1 | —$C_4H_9$(t) | 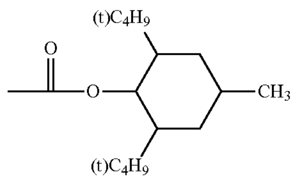 | 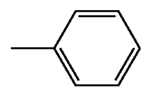 | 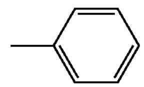 | 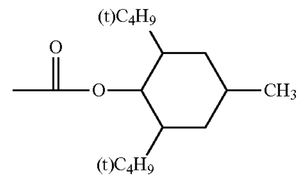 | 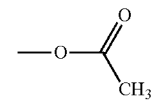 |
| G-2 | —$C_4H_9$(t) | 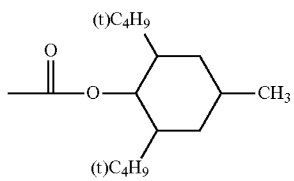 | 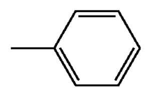 | 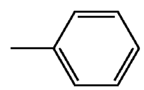 | 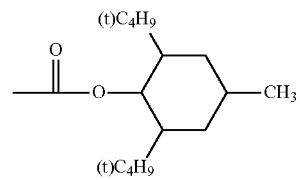 | —Cl |
| G-3 | —$C_4H_9$(t) | 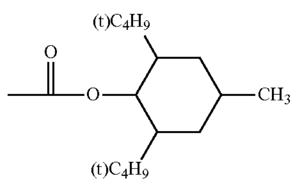 | 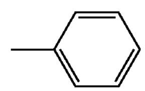 | 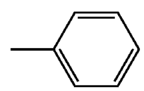 | 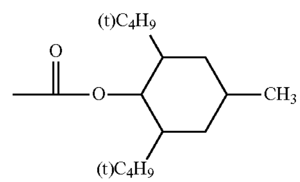 | 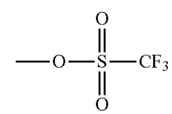 |

-continued
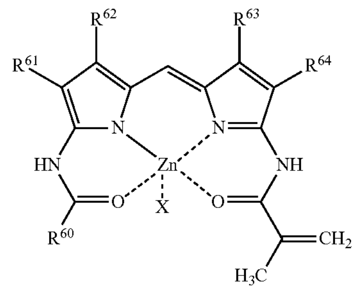
| Exemplary Compound | $R^{60}$ | $R^{61}$ | $R^{62}$ | $R^{63}$ | $R^{64}$ | X |
|---|---|---|---|---|---|---|
| G-4 | $—C_4H_9(t)$ | 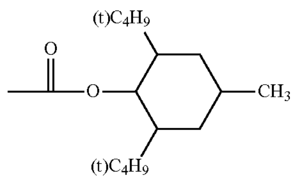 | 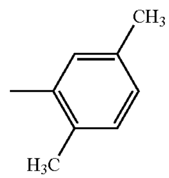 | 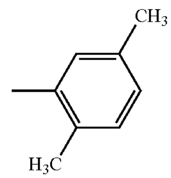 | 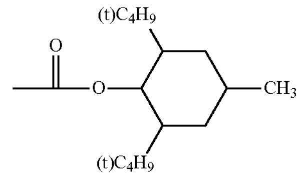 | 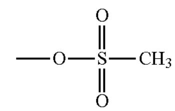 |
| G-5 | 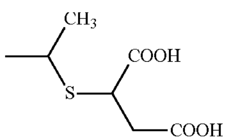 | 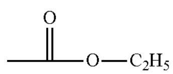 | 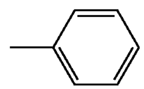 | 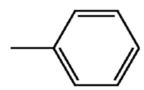 | 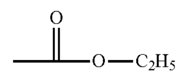 | —Cl |
| G-6 | 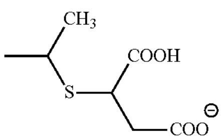 | 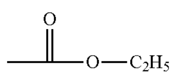 | 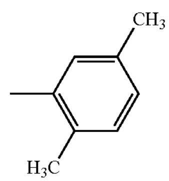 | 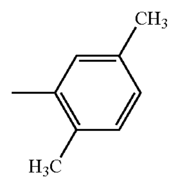 | 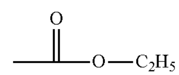 | |
| G-7 | 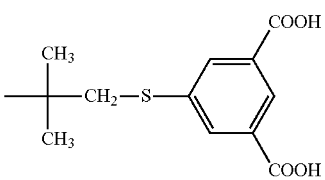 | 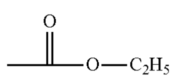 | 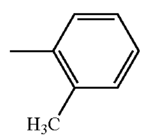 | 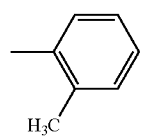 | 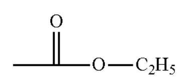 | 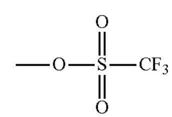 |

-continued
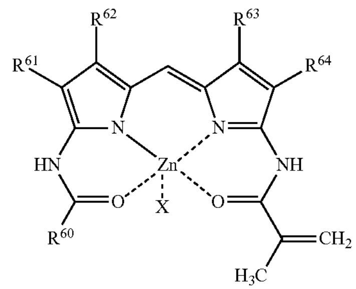
| Exemplary Compound | $R^{60}$ | $R^{61}$ | $R^{62}$ | $R^{63}$ | $R^{64}$ | X |
|---|---|---|---|---|---|---|
| G-8 | $—C_4H_9(t)$ | 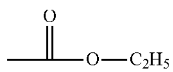 | 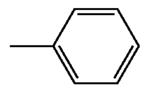 | 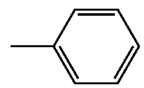 | 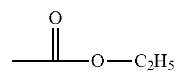 | —Cl |
| G-9 | $—C_4H_9(t)$ | 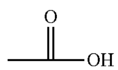 | 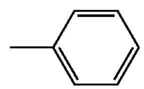 | 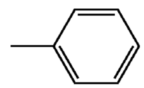 | 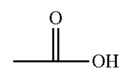 | —F |
| G-10 | $—C_4H_9(t)$ | 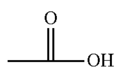 | 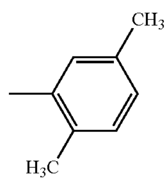 | 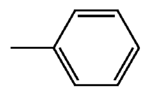 | 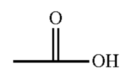 | —Br |
| G-11 | $—C_4H_9(t)$ | 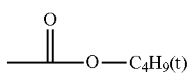 | 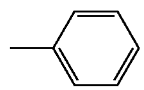 | 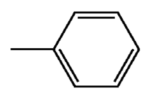 | 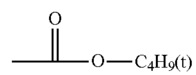 | 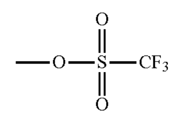 |
| G-12 | 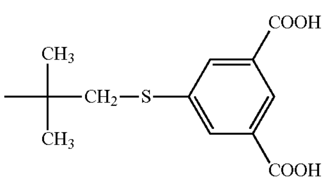 | 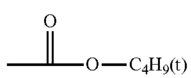 | 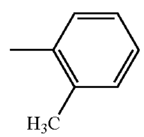 | 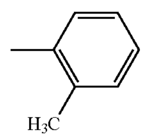 | 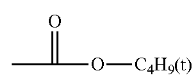 | —Cl |

-continued
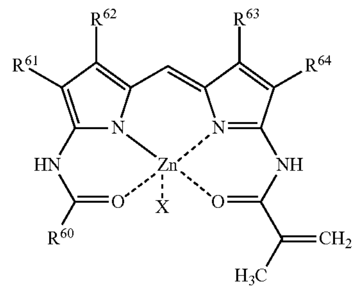
| Exemplary Compound | $R^{60}$ | $R^{61}$ | $R^{62}$ | $R^{63}$ | $R^{64}$ | X |
|---|---|---|---|---|---|---|
| G-13 | 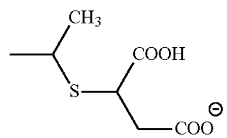 | 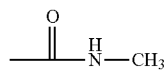 | 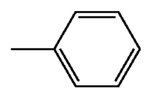 | 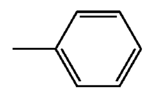 | 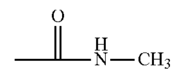 | |
| G-14 | 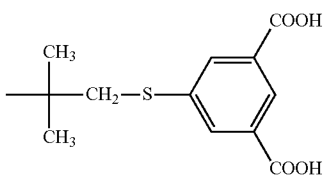 | 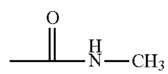 | 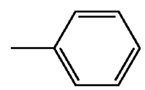 | 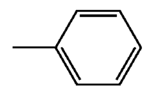 | 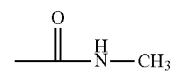 | 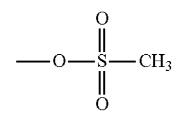 |
| G-15 | 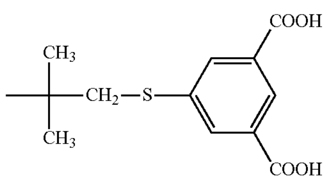 | 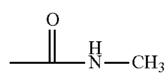 | 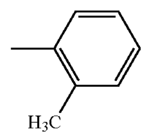 | 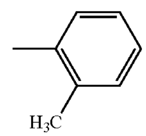 | 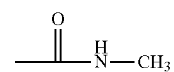 | 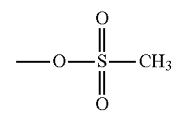 |
| G-16 | 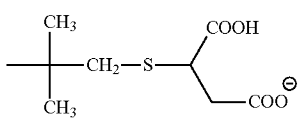 | 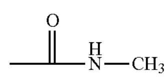 | 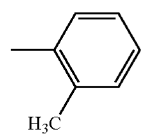 | 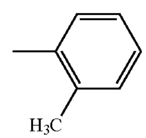 | 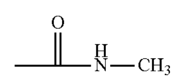 | |

-continued
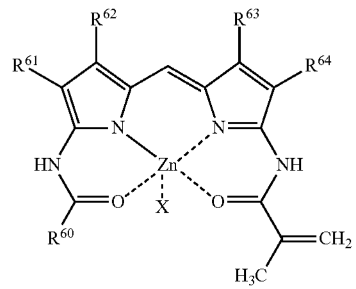
| Exemplary Compound | $R^{60}$ | $R^{61}$ | $R^{62}$ | $R^{63}$ | $R^{64}$ | X |
|---|---|---|---|---|---|---|
| G-17 | 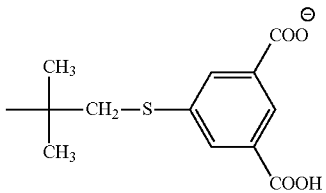 | 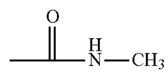 | 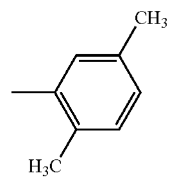 | 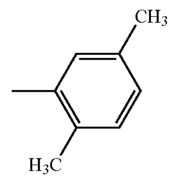 | 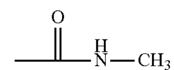 | |
| G-18 | 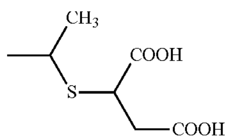 | 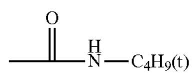 | 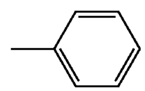 | 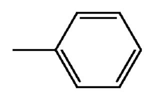 | 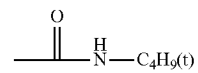 | —Cl |
| G-19 | 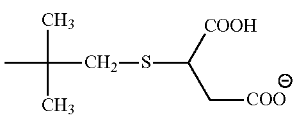 | 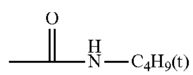 | 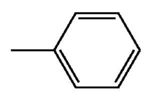 | 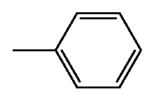 | 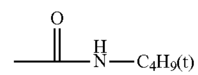 | |
| G-20 | 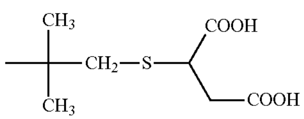 | 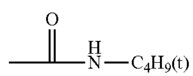 | 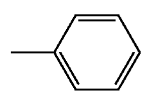 | 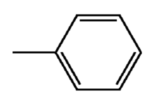 | 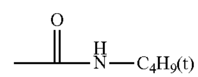 | 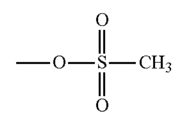 |

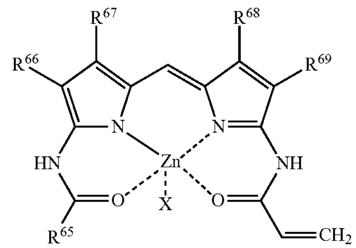
| Exemplary Compound | $R^{65}$ | $R^{66}$ | $R^{67}$ | $R^{68}$ | $R^{69}$ | X |
|---|---|---|---|---|---|---|
| H-1 | —$C_4H_9$(t) | 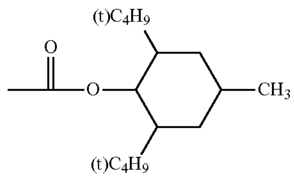 | 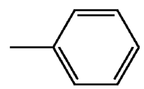 | 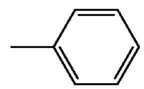 | 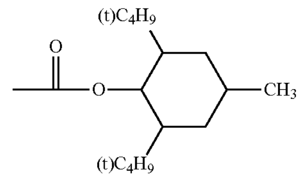 | 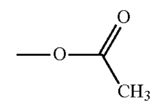 |
| H-2 | —$C_4H_9$(t) | 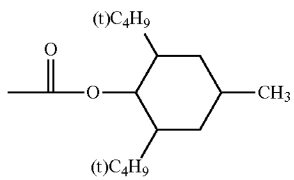 | 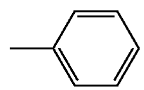 | 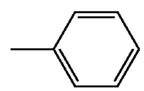 | 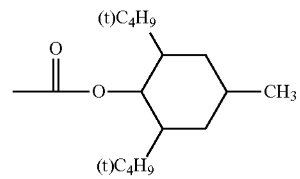 | —Cl |
| H-3 | —$C_4H_9$(t) | 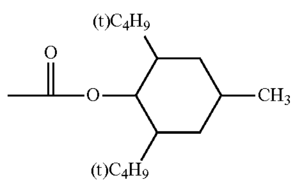 | 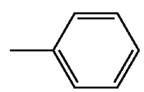 | 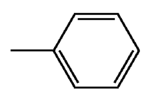 | 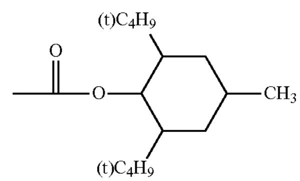 | 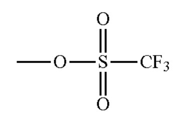 |
| H-4 | —$C_4H_9$(t) | 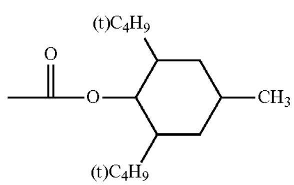 | 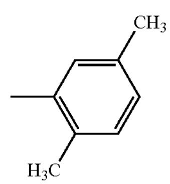 | 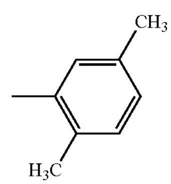 | 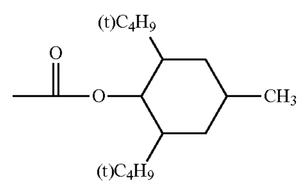 | 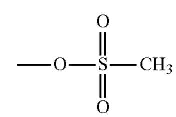 |

-continued
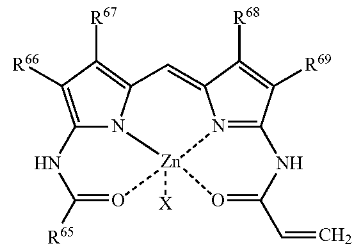
| Exemplary Compound | $R^{65}$ | $R^{66}$ | $R^{67}$ | $R^{68}$ | $R^{69}$ | X |
|---|---|---|---|---|---|---|
| H-5 | 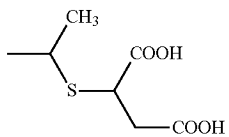 | 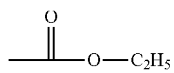 | 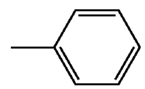 | 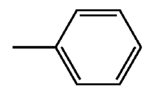 | 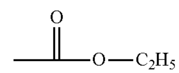 | —Cl |
| H-6 | 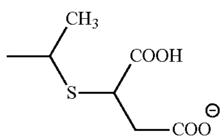 | 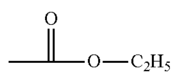 | 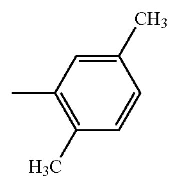 | 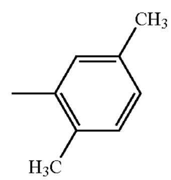 | 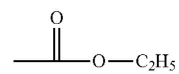 | |
| H-7 | 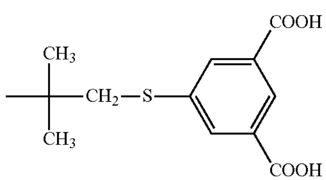 | 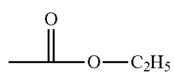 | 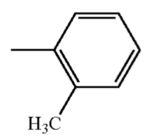 | 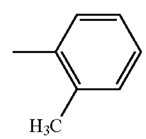 | 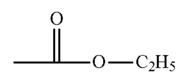 | 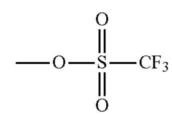 |
| H-8 | —$C_4H_9$(t) | 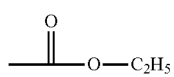 | 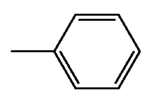 | 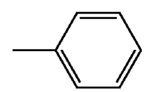 | 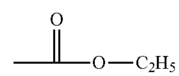 | —Cl |
| H-9 | —$C_4H_9$(t) | 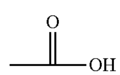 | 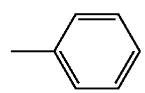 | 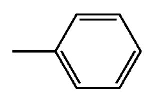 | 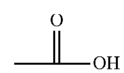 | —F |

-continued
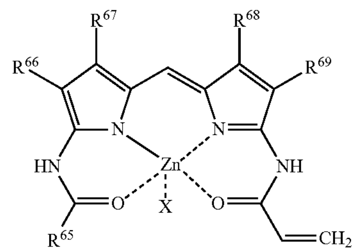
| Exemplary Compound | $R^{65}$ | $R^{66}$ | $R^{67}$ | $R^{68}$ | $R^{69}$ | X |
| --- | --- | --- | --- | --- | --- | --- |
| H-10 | —$C_4H_9$(t) | 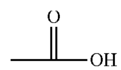 | 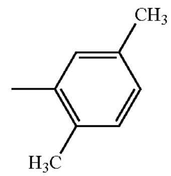 | 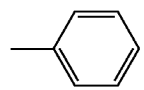 | 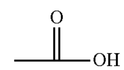 | —Br |
| H-11 | —$C_4H_9$(t) | 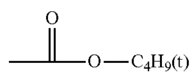 | 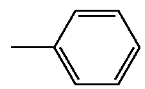 | 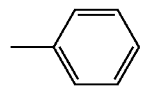 | 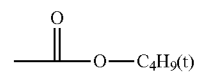 | 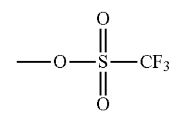 |
| H-12 | 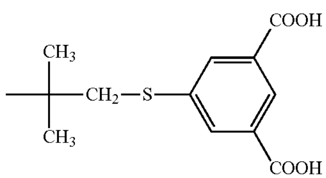 | 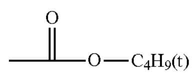 | 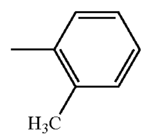 | 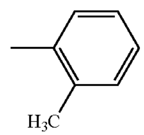 | 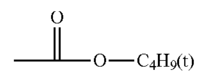 | —Cl |
| H-13 | 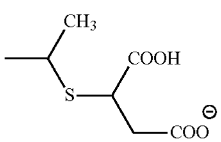 | 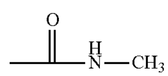 | 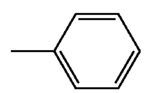 | 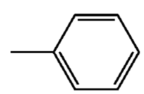 | 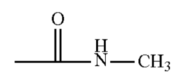 | |

-continued
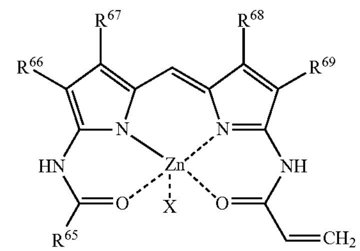
| Exemplary Compound | $R^{65}$ | $R^{66}$ | $R^{67}$ | $R^{68}$ | $R^{69}$ | X |
|---|---|---|---|---|---|---|
| H-14 | 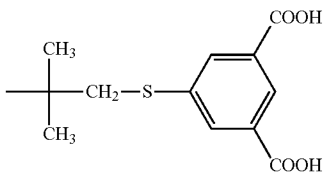 | 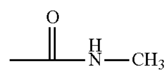 | 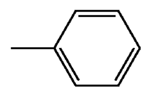 | 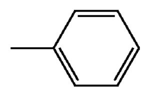 | 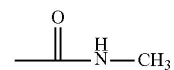 | 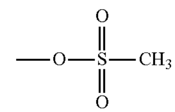 |
| H-15 | 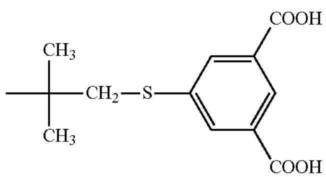 | 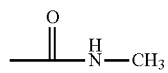 | 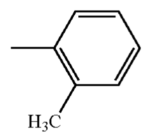 | 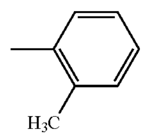 | 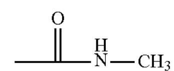 | 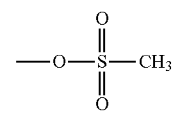 |
| H-16 | 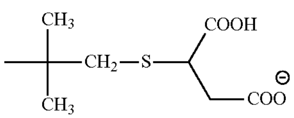 | 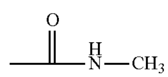 | 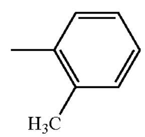 | 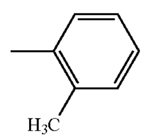 | 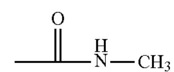 | |
| H-17 | 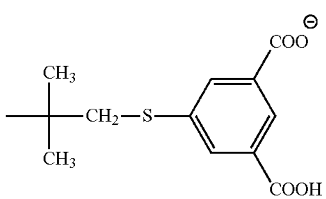 | 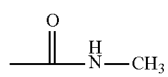 | 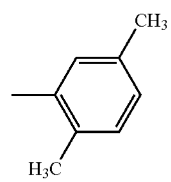 | 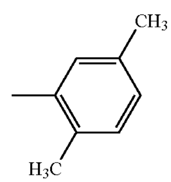 | 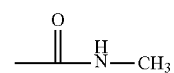 | |

-continued
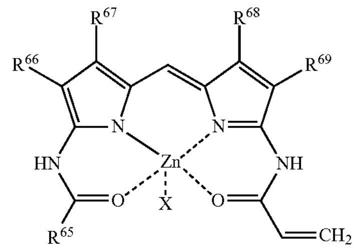
| Exemplary Compound | $R^{65}$ | $R^{66}$ | $R^{67}$ | $R^{68}$ | $R^{69}$ | X |
|---|---|---|---|---|---|---|
| H-18 | 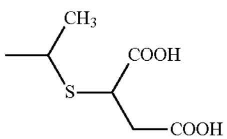 | 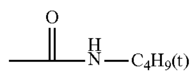 | 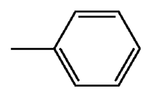 | 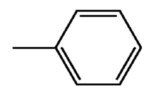 | 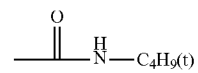 | —Cl |
| H-19 | 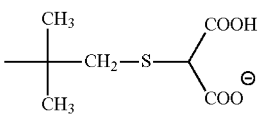 | 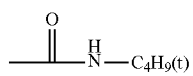 | 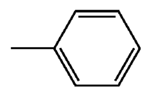 | 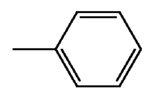 | 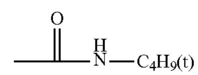 | |
| H-20 | 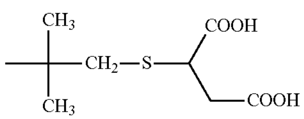 | 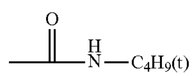 | 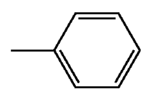 | 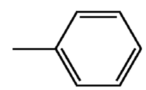 | 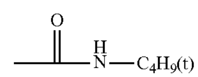 | 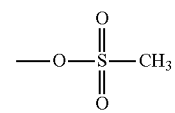 |

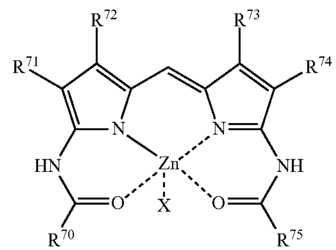
| Exemplary Compound | $R^{70}$ | $R^{71}$ | $R^{72}$ | $R^{73}$ | $R^{74}$ | $R^{75}$ | X |
|---|---|---|---|---|---|---|---|
| I-1 | $—C_4H_9(t)$ | 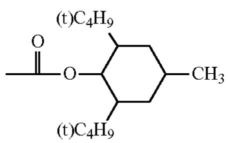 | 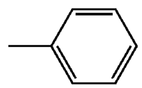 | 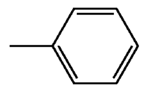 | 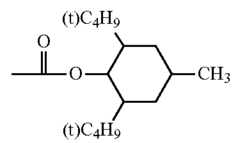 | $—C_4H_9(t)$ | 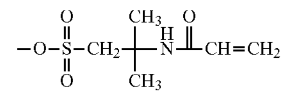 |
| I-2 | $—C_4H_9(t)$ | 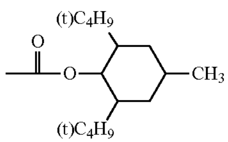 | 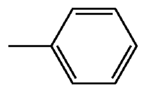 | 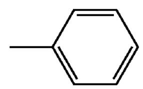 | 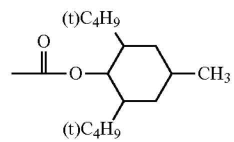 | $—C_4H_9(t)$ | 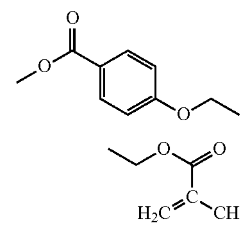 |
| I-3 | 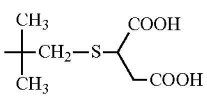 | 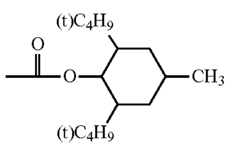 | 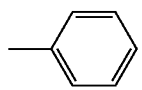 | 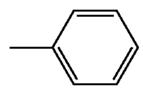 | 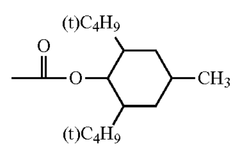 | $—C_4H_9(t)$ | 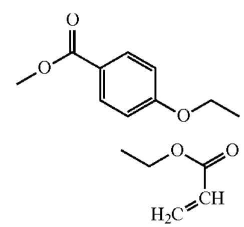 |

-continued
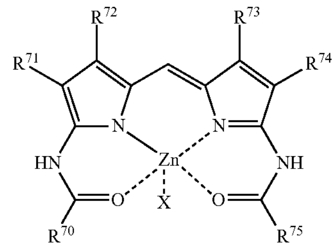
| Exemplary Compound | $R^{70}$ | $R^{71}$ | $R^{72}$ | $R^{73}$ | $R^{74}$ | $R^{75}$ | X |
|---|---|---|---|---|---|---|---|
| I-4 | —$C_4H_9$(t) | 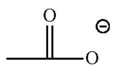 | 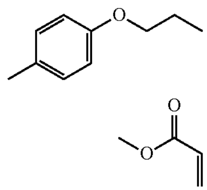 | 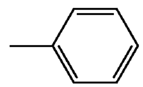 | 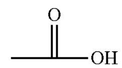 | —$C_4H_9$(t) | |
| I-5 | 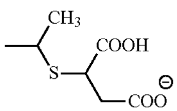 | 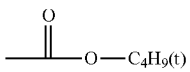 | 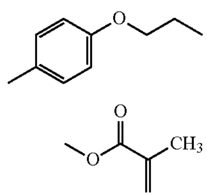 | 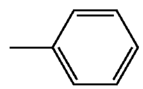 | 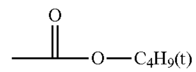 | —$C_4H_9$(t) | |
| I-6 | 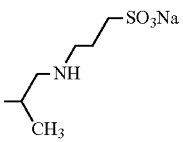 | 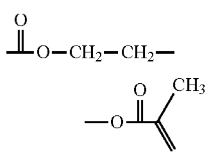 | 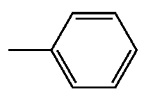 | 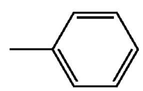 | 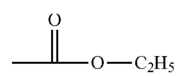 | 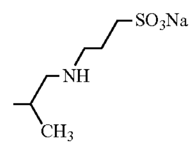 | —Cl |
| I-7 | 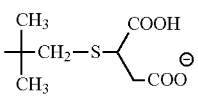 | 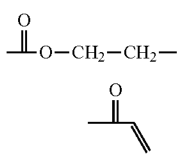 | 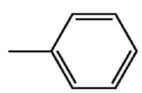 | 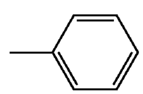 | 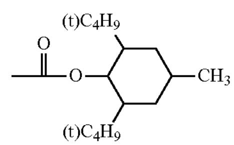 | —$C_4H_9$(t) | |

-continued
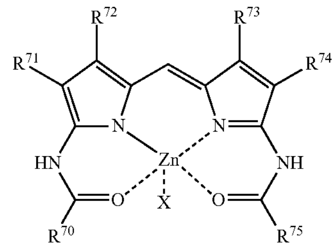
| Exemplary Compound | $R^{70}$ | $R^{71}$ | $R^{72}$ | $R^{73}$ | $R^{74}$ | $R^{75}$ | X |
|---|---|---|---|---|---|---|---|
| I-8 | 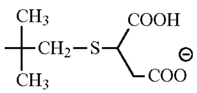 | 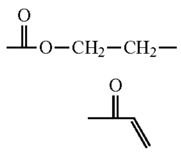 | 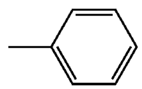 | 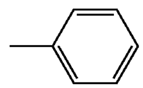 | 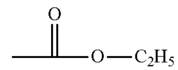 | $-C_4H_9(t)$ | |
| I-9 | 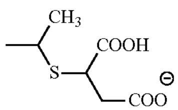 | 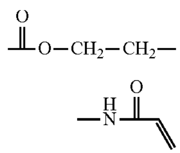 | 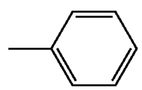 | 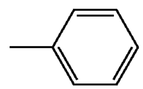 | 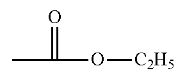 | $-C_4H_9(t)$ | |

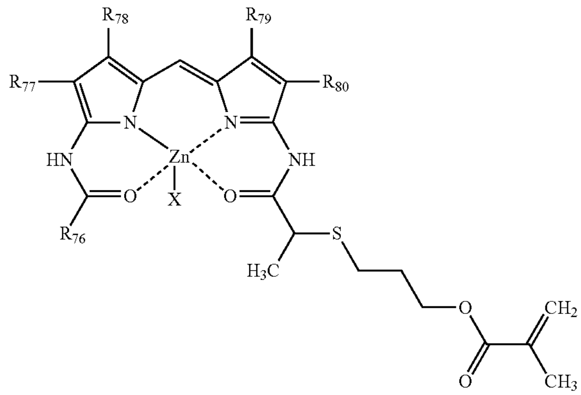
| Exemplary Compound | $R_{76}$ / $R_{77}$ / $R_{78}$ / $R_{79}$ / $R_{80}$ | X |
|---|---|---|
| J-1 | 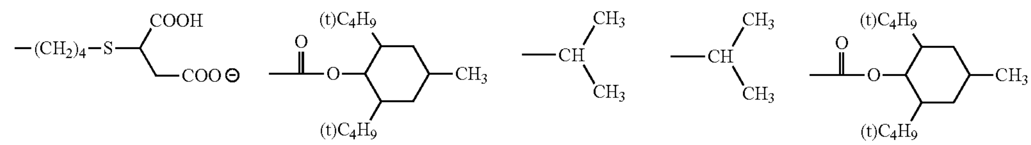 | |
| J-2 | 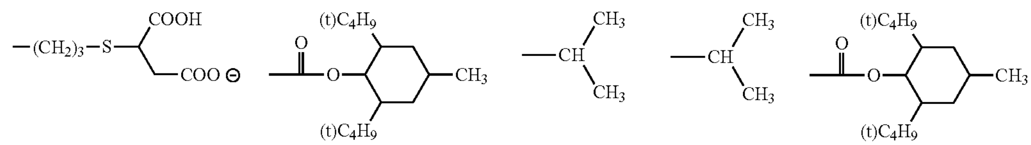 | |
| J-3 | 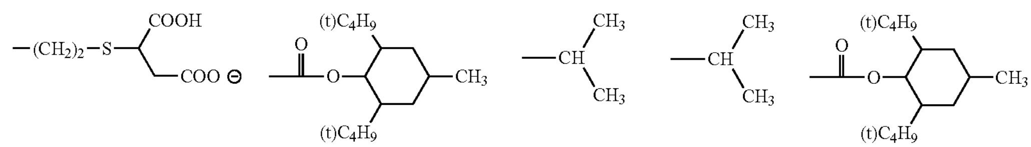 | |
| J-4 | 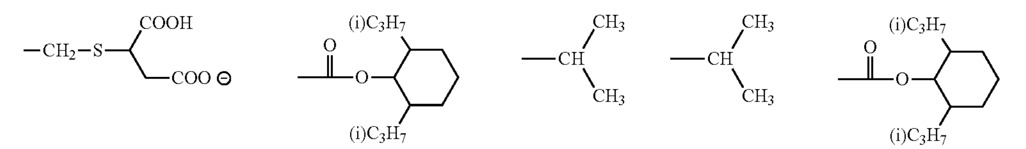 | |
| J-5 | 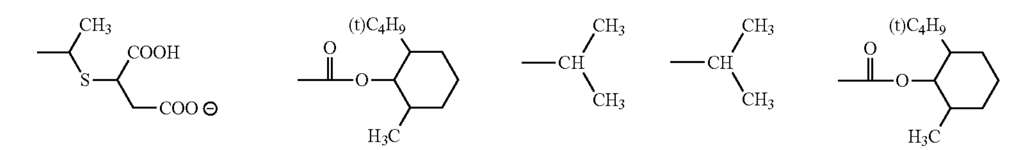 | |
| J-6 | 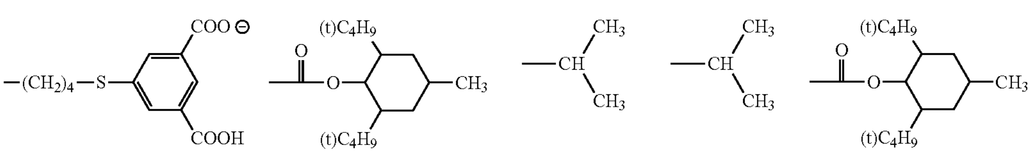 | |
| J-7 | 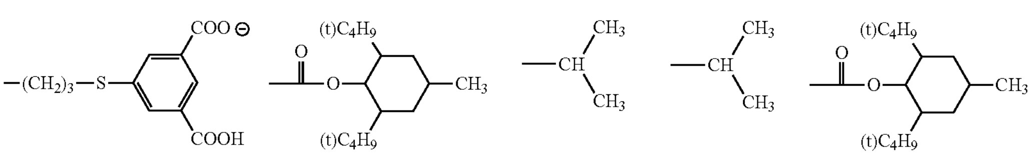 | |
| J-8 | 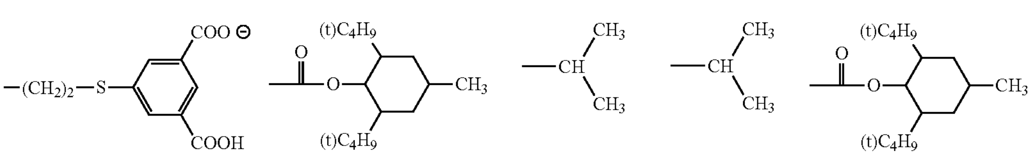 | |

-continued
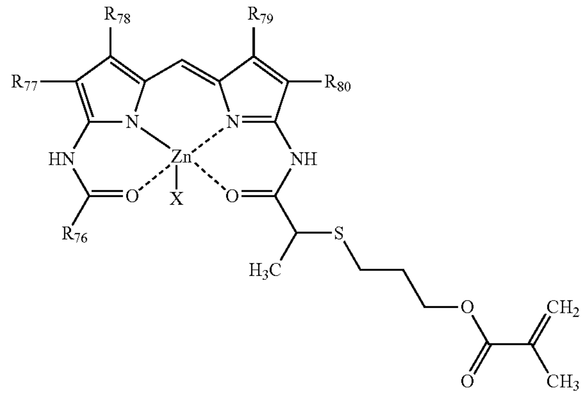
| | | | | | |
|---|---|---|---|---|---|
| J-9 | 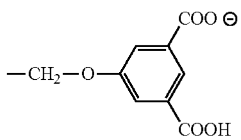 | 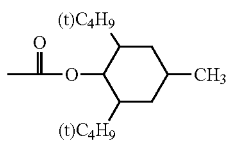 | 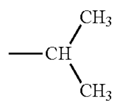 | 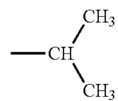 | 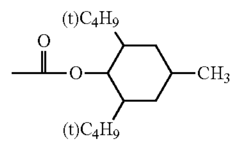 |
| J-10 | 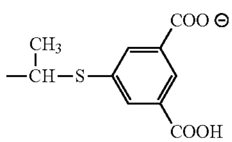 | 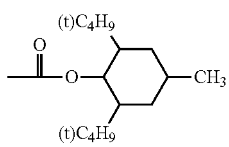 | 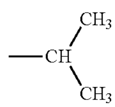 | 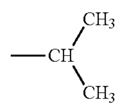 | 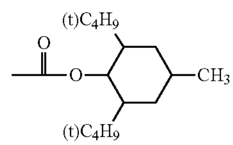 |
| J-11 | 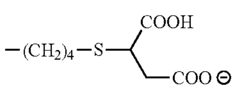 | 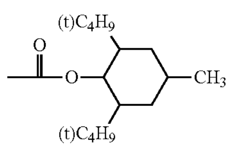 | $-CH_3$ | $-CH_3$ | 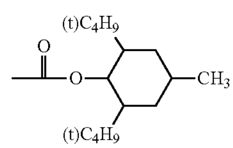 |
| J-12 | 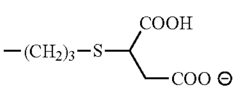 | 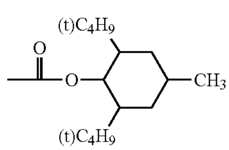 | $-CH_3$ | $-CH_3$ | 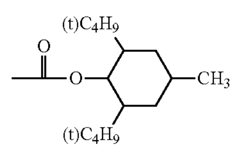 |
| J-13 | 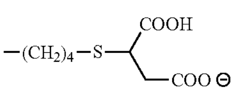 | 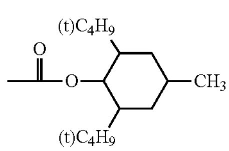 | $-CH_3$ | 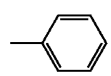 | 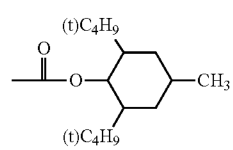 |
| J-14 | 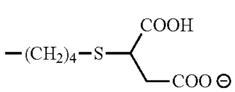 | 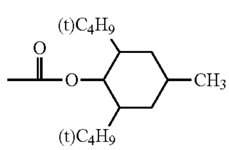 | 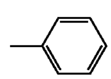 | $-CH_3$ | 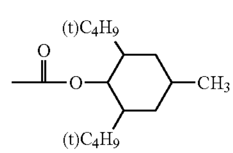 |
| J-15 | 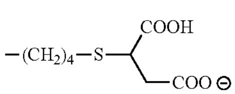 | 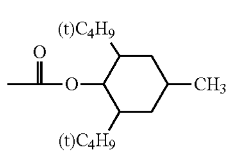 | 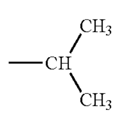 | 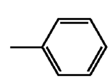 | 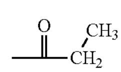 |
| J-16 | 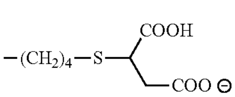 | 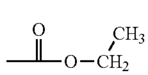 | 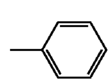 | 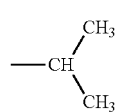 | 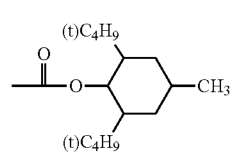 |

-continued
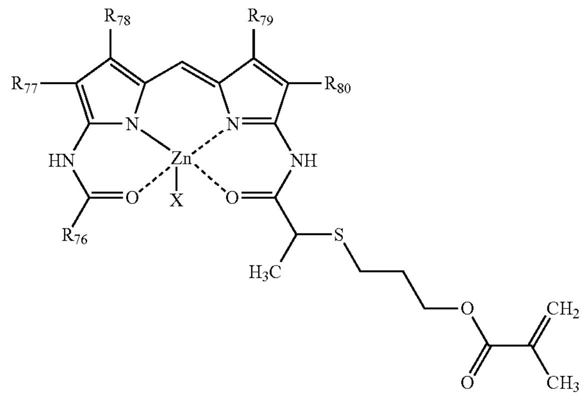
| Exemplary Compound | $R_{76}$ | $R_{77}$ | $R_{78}$ | $R_{79}$ | $R_{80}$ |
|---|---|---|---|---|---|
| J-17 | 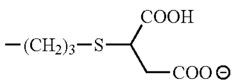 | 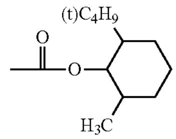 | 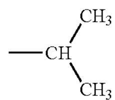 | 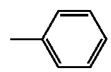 | 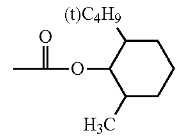 |
| J-18 | 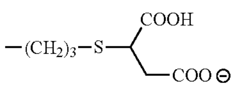 | 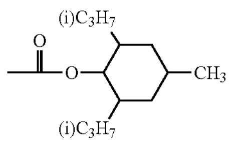 | 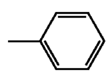 | 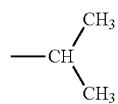 | 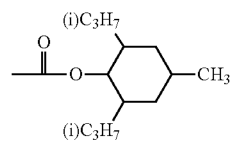 |
| J-19 | 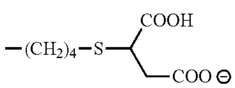 | 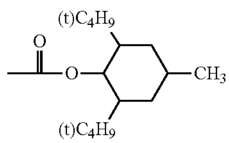 | $—CH_2—CH_3$ | 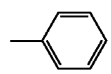 | 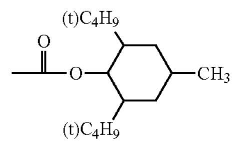 |
| J-20 | 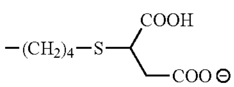 | 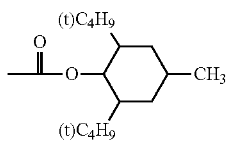 | 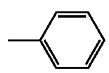 | $—CH_2—CH_3$ | 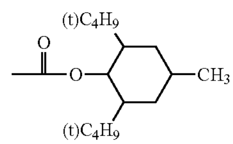 |
| J-21 | 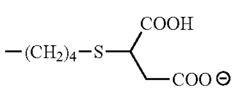 | 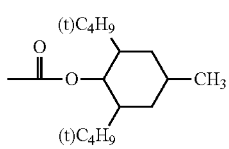 | 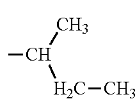 | 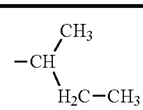 | 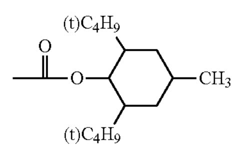 |
| J-22 | 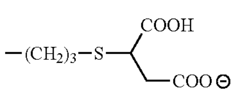 | 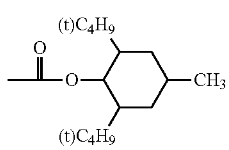 | 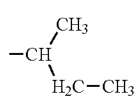 | 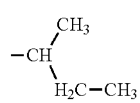 | 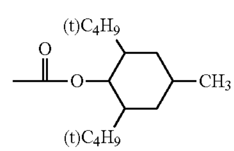 |
| J-23 | 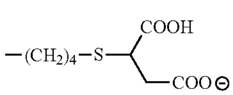 | 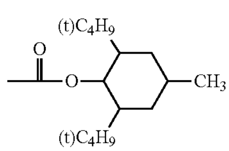 | 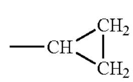 | 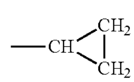 | 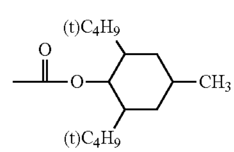 |

-continued
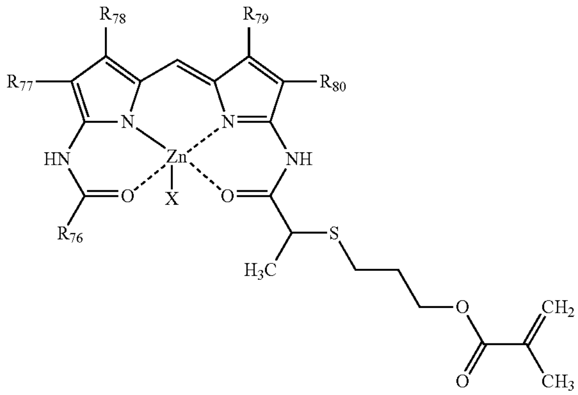
| | | | | | |
|---|---|---|---|---|---|
| J-24 | 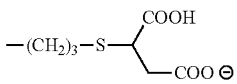 | 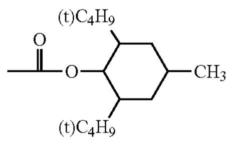 | 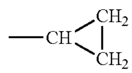 | 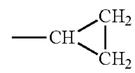 | 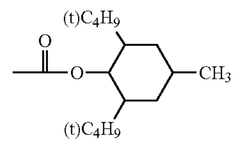 |
| J-25 | 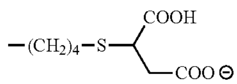 | 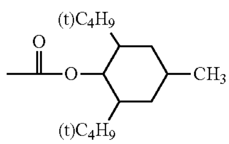 | —CH$_2$—CH$_3$ | —CH$_2$—CH$_3$ | 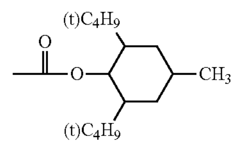 |
| J-26 | 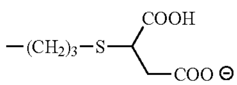 | 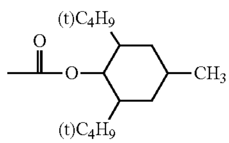 | —CH$_2$—CH$_3$ | —CH$_2$—CH$_3$ | 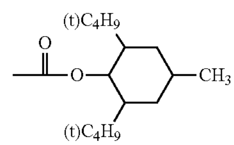 |
| J-27 | 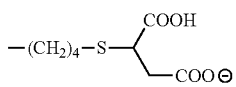 | 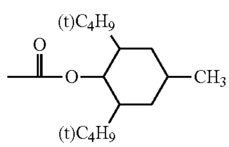 | —(CH$_2$)$_2$—CH$_3$ | —(CH$_2$)$_2$—CH$_3$ | 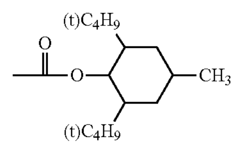 |
| J-28 | 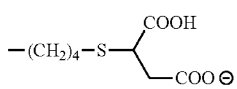 | 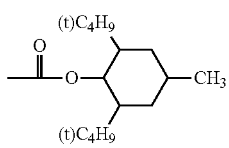 | 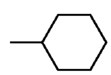 | 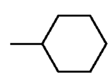 | 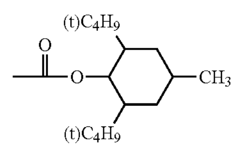 |
| J-29 | 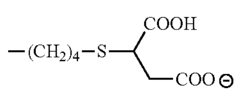 | 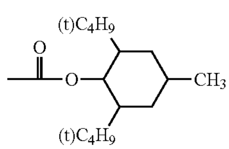 | 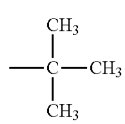 | 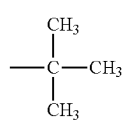 | 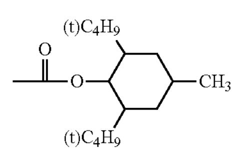 |
| J-30 | 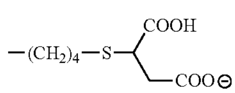 | 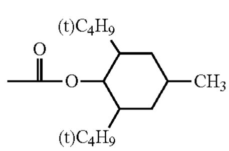 | 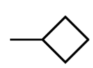 | 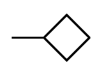 | 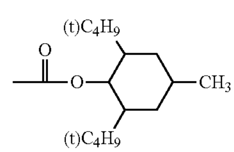 |

(K-1)
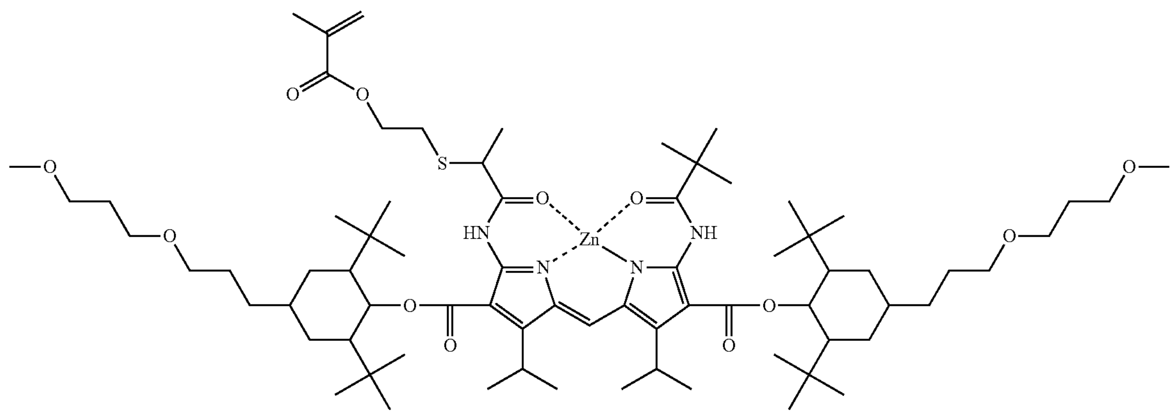
(K-2)
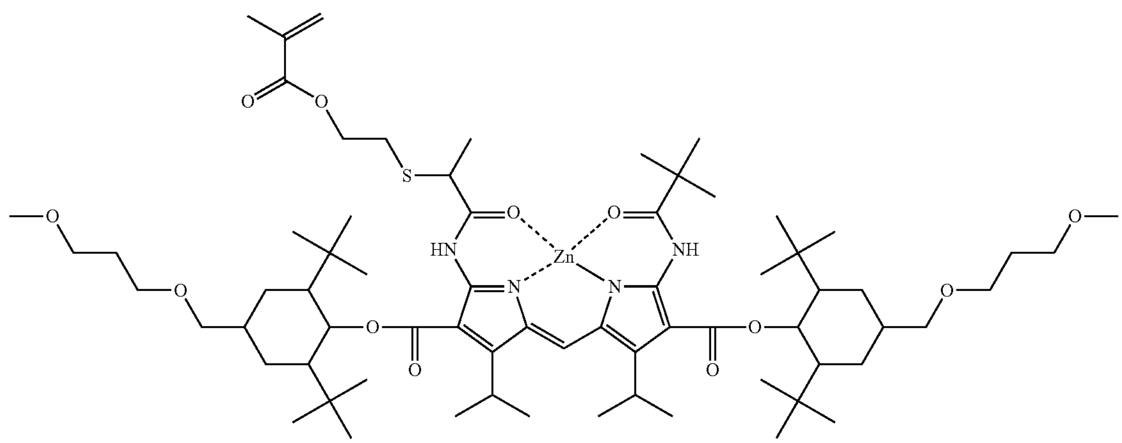
(K-3)
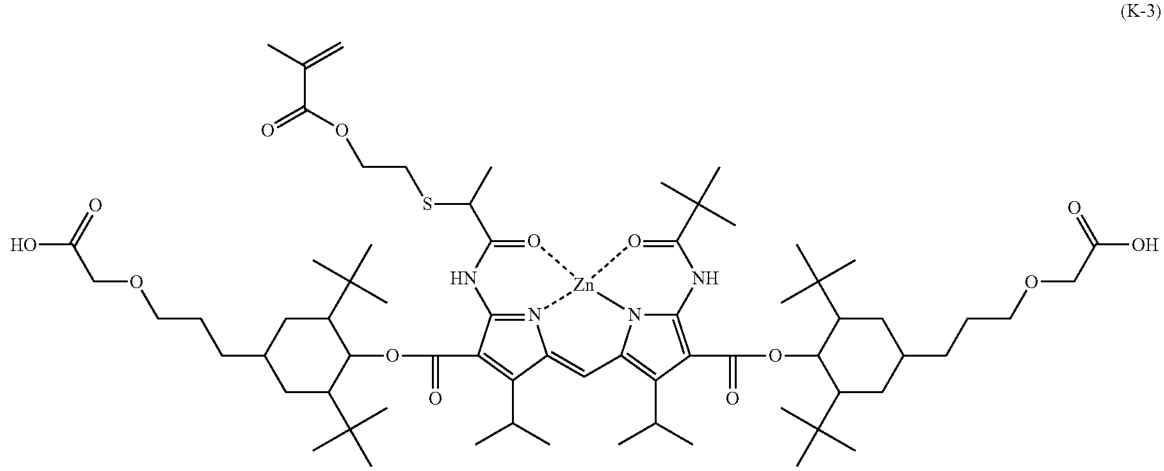

-continued
(K-4)
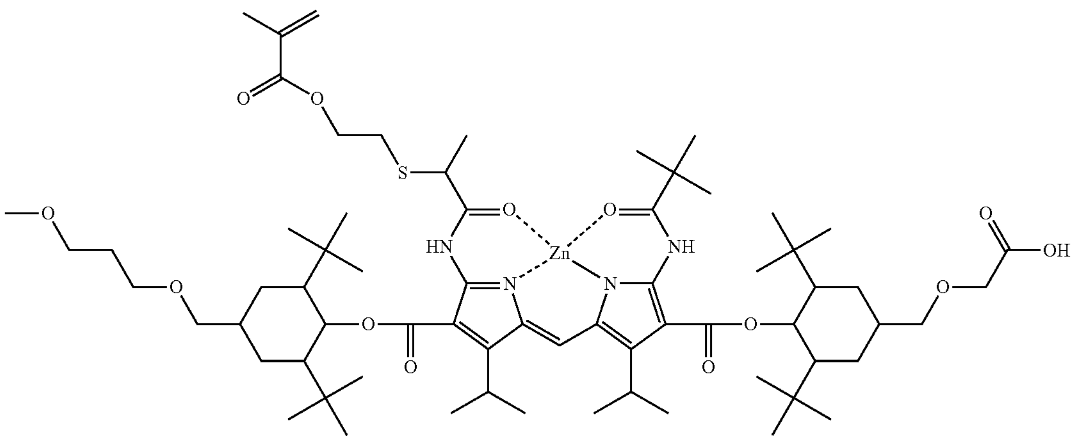
(K-5)
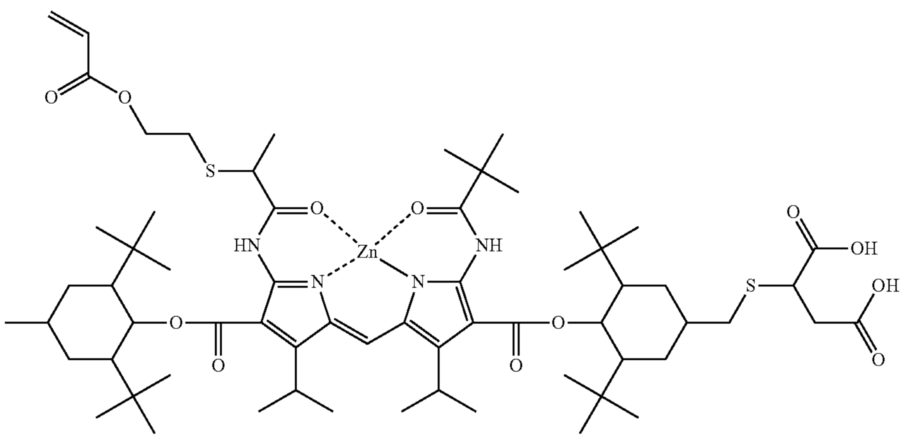
(K-6)
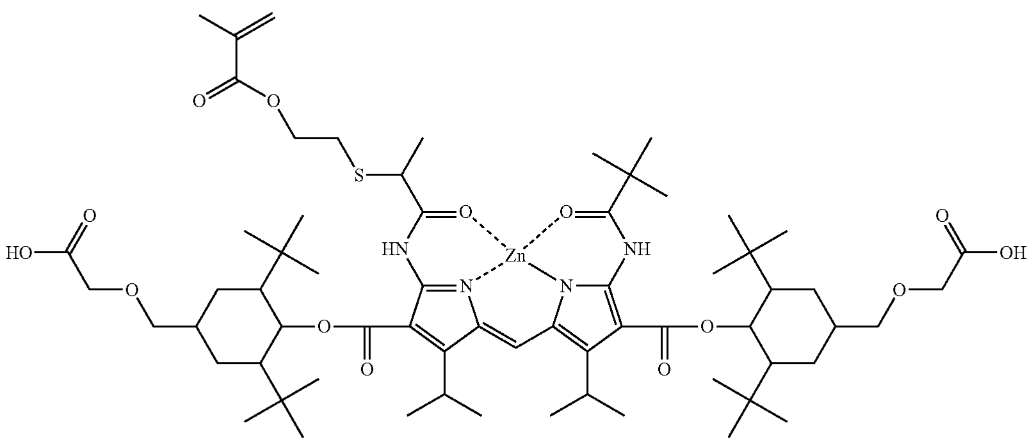
(K-7)
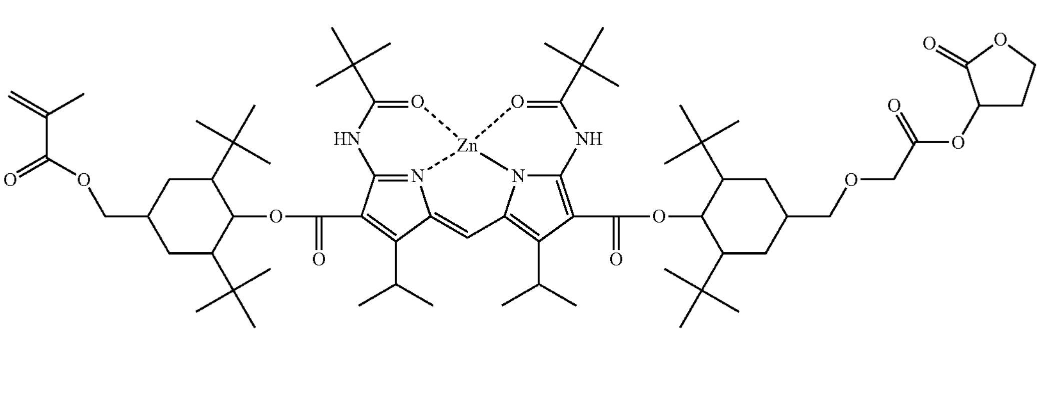

-continued
(K-8)
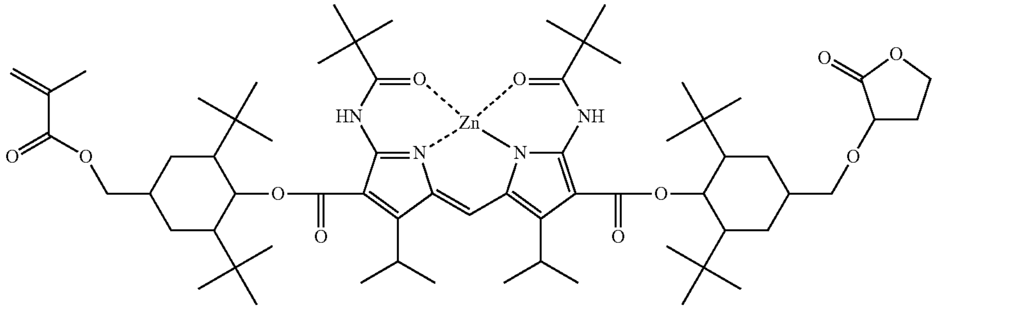
(K-9)
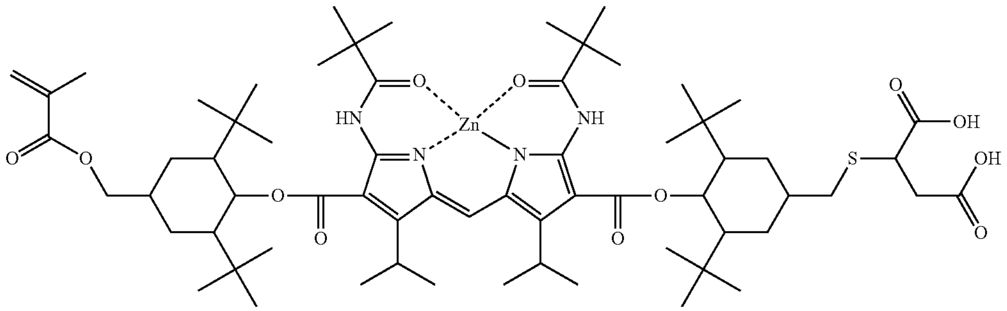
(K-10)
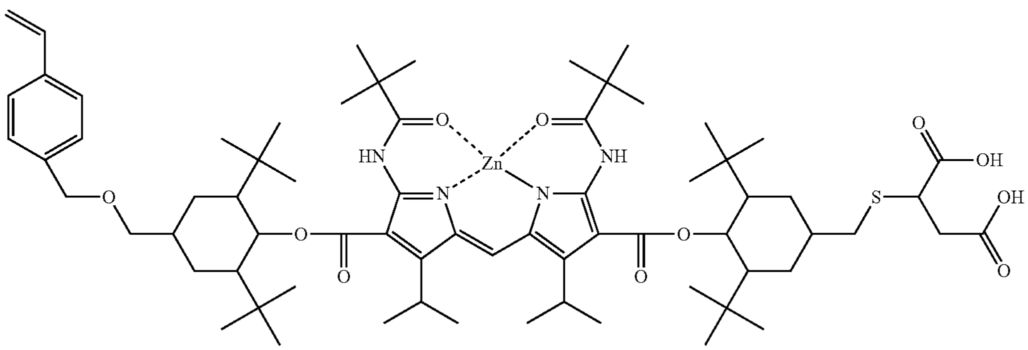
(K-11)
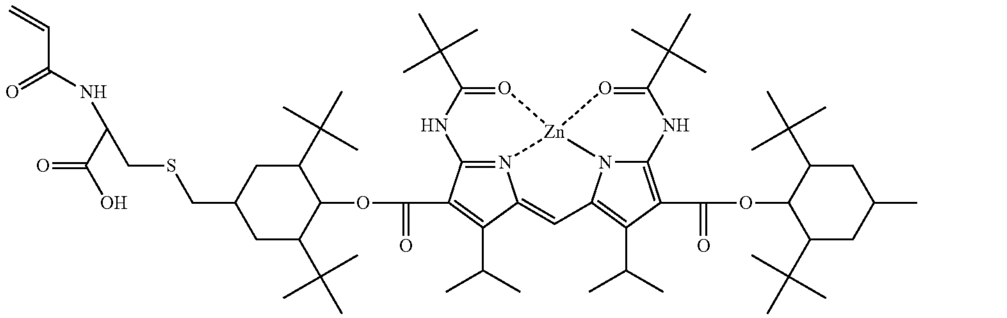
(K-12)
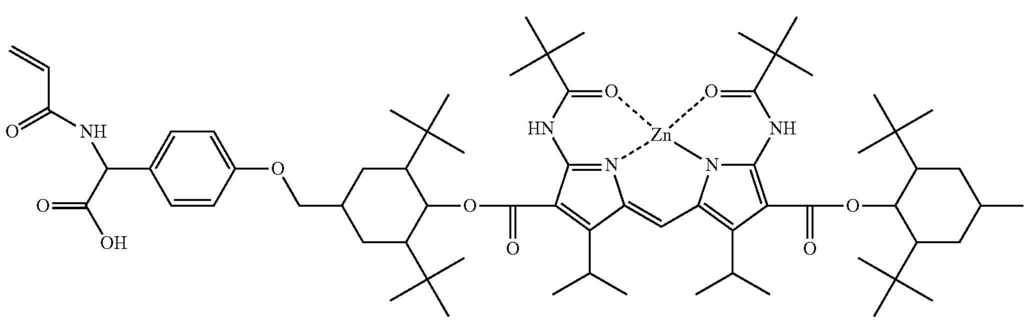

-continued (K-13)

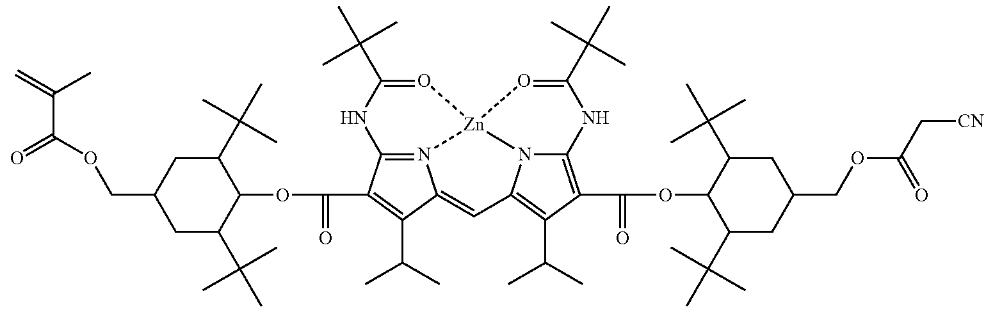

(K-14)

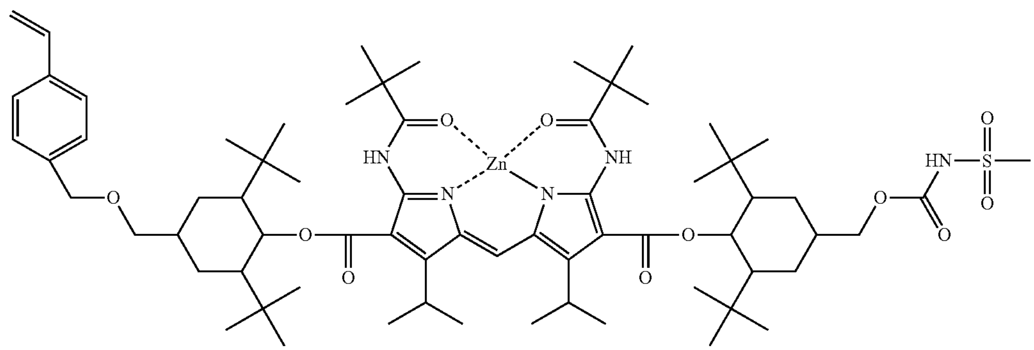

The colorant multimer of the invention may contain a single kind of the colorant monomer represented by Formula (1) as a polymerization component, or may contain two or more kinds thereof.

When the colorant multimer of the invention contains an additional monomer having an ethylenically unsaturated bond described below as a copolymerization component, the colorant multimer may contain a single kind of the additional monomer having an ethylenically unsaturated bond, or may contain two or more kinds thereof. When the colorant multimer of the invention further contains another monomer as a copolymerization component as necessary, the colorant multimer may contain a single kind of the monomer, or may contain two or more kinds thereof.

The colorant multimer of the invention may contain the constituent unit represented by Formula (A), (B) and/or (C), and/or the colorant monomer represented by Formula (1), which is a preferable monomer that can form the constituent unit represented by Formula (A), at a mass ratio (% by mass) of 100% by mass. That is, the colorant multimer of the invention may be formed by polymerizing the constituent units represented by Formula (A), (B), and/or (C). In view of the film thickness, the total content of the constituent units represented by Formulae (A), (B) and (C) is preferably from 10% by mass to 100% by mass %, more preferably from 20% by mass to 100% by mass %, and still more preferably from 30% by mass to 100% by mass %, in terms of the mass ratio (by mass %).

Monomer that has a Terminal Ethylenically Unsaturated Bond and has a Structure Different from that of the Colorant Monomer Forming the Constituent Unit Represented by Formula (A), (B) or (C)

In addition to the at least one of the constituent unit represented by Formula (A), (B) or (C), and/or the colorant monomer represented by Formula (1), which is the preferable example of the constituent unit, the colorant multimer of the invention may contain, as a polymerization component thereof, a monomer (hereinbelow, may be referred to as an "additional monomer having an ethylenically unsaturated bond") that has a terminal ethylenically unsaturated bond and has a structure different from that of the monomer which can form the constituent unit represented by Formula (A), (B) or (C). Furthermore, the colorant multimer of the invention may contain another monomer other than the above monomers as a copolymerization component.

That is, the colorant multimer of the invention may be a copolymer that contains at least one of the colorant monomer that can form the constituent unit represented by Formula (A), (B) or (C), or the colorant monomer represented by Formula (1), and the monomer having an ethylenically unsaturated bond that has a structure different from the structures of these colorant monomers. The copolymer may contain a single kind of the specific colorant monomer according to the invention, or may contain two or more kinds thereof. Further, the copolymer may contain a single kind of the monomer having an ethylenically unsaturated bond, or may contain two or more kinds thereof.

The additional monomer having an ethylenically unsaturated bond is not specifically limited, as long as the monomer has an ethylenically unsaturated bond at a terminal end thereof, and has a structure different from the structures of the colorant monomers that can form the constituent units represented by Formula (A), (B) or (C), or the structure of the colorant monomer represented by Formula (1).

When the colorant multimer of the invention is used for a colored curable composition, in order to improve the formability of the color pattern, the additional monomer having an ethylenically unsaturated bond is preferably a monomer having an alkali-soluble group in addition to the terminal ethylenically unsaturated bond.

Examples of the additional monomer having an alkali-soluble group together with an ethylenically unsaturated bond include: a vinyl monomer having a carboxy group, a vinyl monomer having a sulfonic acid group.

Examples of the vinyl monomer having a carboxy group include a (meth)acrylic acid, vinyl benzoic acid, maleic acid, monoalkyl maleate, fumaric acid, itaconic acid, crotonic acid, cinnamic acid, and an acrylic acid dimer. Examples further include, a vinyl monomer having a phosphoric acid group, an addition reaction products of a monomer having a hydroxy group such as 2-hydroxyethyl(meth)acrylate with a cyclic anhydride such as maleic anhydride, phthalic anhydride or cyclohexane dicarboxylic anhydride; and ω-carboxy-polycaprolactone mono(meth)acrylate. As a precursor of a carboxy group, an anhydride-containing monomer such as maleic anhydride, itaconic acid anhydride, or citraconic anhydride may be used. Among these, from the viewpoint of copolymerization property, cost, solubility and the like, (meth) acrylic acid is preferable.

Examples of the vinyl monomer having a sulfonic acid group include 2-acrylamide-2-methylpropanesulfonic acid. Examples of the vinyl monomer having a phosphoric acid group include mono(2-acryloyloxyethyl)phosphate and mono(1-methyl-2-acryloyloxyethyl)phosphate.

Among these vinyl monomers, the repeating unit derived from the vinyl monomer having an alkali-soluble group is preferably included in the colorant multimer of the invention. When the colorant multimer of the invention contains the above described repeating unit, favorable removability of a non-exposed area during development can be obtained when the colorant multimer of the invention is used for a colored curable composition.

When the colorant multimer of the invention contains the repeating unit derived from the vinyl monomer having an alkali-soluble group, the content thereof is preferably 50 mg KOH/g or more, and more preferably from 50 mg KOH/g to 200 mg KOH/g. That is, in order to suppress the generation of precipitates in the developer, the content of the repeating unit derived from the vinyl monomer having an alkali-soluble group is preferably 50 mg KOH/g or more. When a colored curable composition is formed the colorant multimer of the invention together with a pigment, in order to effectively suppress the formation of aggregates of primary particles of the pigment, that is, secondary aggregates, or in order to effectively weaken the cohesive force of the secondary aggregates, i the content of the repeating unit derived from the vinyl monomer having an alkali-soluble group is preferably from 50 mg KOH/g to 200 mg KOH/g.

The vinyl monomer that can be used for the copolymerization with the colorant monomer of the present invention is not specifically limited. Preferable examples thereof include (meth)acrylic acid esters, crotonic acid esters, vinyl esters, maleic acid diesters, fumaric acid diesters, itaconic acid diesters, (meth)acrylamides, vinyl ethers, vinyl alcohol esters, styrenes and (meth)acrylonitriles. Specific examples of the vinyl monomer include the following compounds. In the present specification, the term "(meth)acrylic" is used in some cases to collectively represent either of acrylic or methacrylic or both of acrylic and methacrylic.

Examples of (meth)acrylic acid esters include methyl (meth)acrylate, ethyl (meth)acrylate, n-propyl(meth)acrylate, isopropyl(meth)acrylate, n-butyl (meth)acrylate, isobutyl(meth)acrylate, t-butyl (meth)acrylate, n-hexyl(meth) acrylate, cyclohexyl(meth)acrylate, t-butyl cyclohexyl(meth) acrylate, 2-ethylhexyl (meth)acrylate, t-octyl(meth)acrylate, dodecyl(meth)acrylate, octadecyl(meth)acrylate, acetoxyethyl(meth)acrylate, phenyl(meth)acrylate, 2-hydroxyethyl (meth)acrylate, 2-methoxyethyl(meth)acrylate, 2-ethoxyethyl(meth)acrylate, 2-(2-methoxyethoxy)ethyl (meth) acrylate, 3-phenoxy-2-hydroxypropyl(meth)acrylate, benzyl (meth)acrylate, diethylene glycol monomethylether (meth) acrylate, diethylene glycol monoethylether (meth)acrylate, triethylene glycol monomethylether (meth)acrylate, triethylene glycol monoethylether (meth)acrylate, polyethylene glycol monomethylether (meth)acrylate, polyethylene glycol monoethylether (meth)acrylate, β-phenoxyethoxyethyl (meth)acrylate, nonyl phenoxy polyethylene glycol (meth) acrylate, dicyclopentenyl (meth)acrylate, dicyclopentenyloxyethyl(meth)acrylate, trifluoroethyl(meth)acrylate, octafluoropentyl(meth)acrylate, perfluorooctylethyl(meth) acrylate, dicyclopentanyl (meth)acrylate, tribromophenyl (meth)acrylate, and tribromophenyloxyethyl (meth)acrylate.

Examples of crotonic acid esters include butyl crotonate and hexyl crotonate.

Examples of vinyl esters include vinyl acetate, vinyl propionate, vinyl butyrate, vinyl methoxy acetate and vinyl benzoate.

Examples of maleic acid diesters include dimethyl maleate, diethyl maleate and dibutyl maleate.

Examples of fumaric acid diesters include dimethyl fumarate, diethyl fumarate and dibutyl fumarate.

Examples of itaconic acid diesters include dimethyl itaconate, diethyl itaconate and dibutyl itaconate.

Examples of (meth)acrylamides include (meth)acrylamide, N-methyl (meth)acrylamide, N-ethyl (meth)acrylamide, N-propyl(meth)acrylamide, N-isopropyl (meth)acrylamide, N-n-butyl (meth)acrylamide, N-t-butyl (meth) acrylamide, N-cyclohexyl (meth)acrylamide, N-(2-methoxyethyl)(meth)acrylamide, N,N-dimethyl (meth) acrylamide, N,N-diethyl(meth)acrylamide, N-phenyl(meth) acrylamide, N-benzyl (meth)acrylamide, (meth)acryloyl morpholine and diacetone acrylamide.

Examples of the vinyl ethers include methyl vinyl ether, butyl vinyl ether, hexyl vinyl ether and methoxyethyl vinyl ether.

Examples of the styrenes include styrene, methylstyrene, dimethylstyrene, trimethylstyrene, ethylstyrene, isopropylstyrene, butylstyrene, hydroxystyrene, methoxystyrene, butoxystyrene, acetoxystyrene, chlorostyrene, dichlorostyrene, bromostyrene, chloromethylstyrene, hydroxystyrene protected by a group deprotectable with an acidic substance (such as t-Boc), methyl vinyl benzoate and α-methylstyrene.

Hereinbelow, specific examples of the additional monomer having an ethylenically unsaturated bond include the following, but the invention is not particularly limited to these examples.

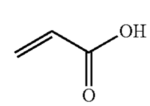

(b-1)

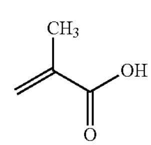

(b-2)

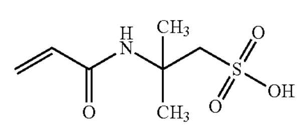

(b-3)

-continued (b-4)

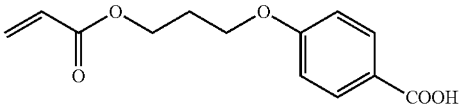

(b-5)

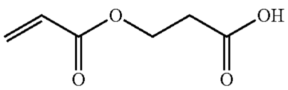

(b-6)

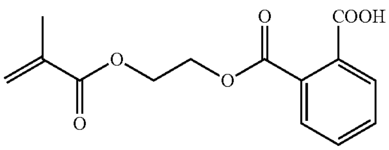

(b-7)

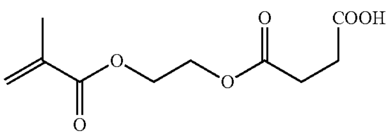

(b-8)

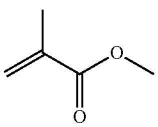

(b-9)

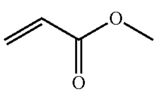

(b-10)

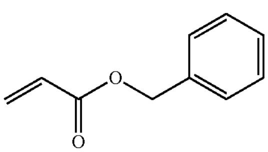

(b-11)

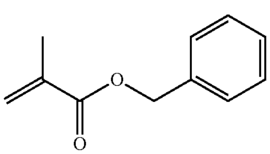

(b-12)

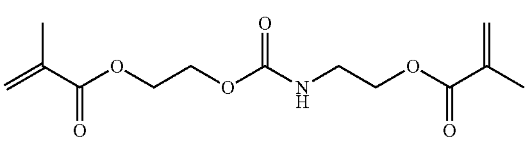

(b-13)

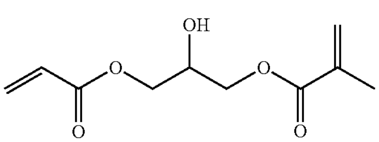

(b-14)

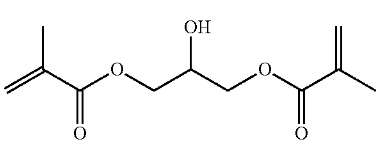

Examples of Colorant Multimer

Specific examples of the colorant multimer of the invention include the following, but the invention is not particularly limited to these examples. In Tables 2 to 9, the number of the "monomer a" corresponds to that of the specific examples of the above-described colorant monomers, and the number of the "monomer b" corresponds to that of the specific examples of the above-described monomer having an ethylenically unsaturated bond.

TABLE 2

| Exemplary compound | Monomer a | Weight ratio (wt %) | Monomer b | Weight ratio (wt %) | Molecular weight (Mw) | Mw/Mn |
|---|---|---|---|---|---|---|
| P1 | a-1 | 94 | b-2 | 6 | 16000 | 1.5 |
| P2 | a-1 | 69 | b-2 | 31 | 15000 | 1.6 |
| P3 | a-1 | 54 | b-2 | 46 | 12000 | 1.8 |
| P4 | a-1 | 85 | b-1 | 15 | 15000 | 1.5 |
| P5 | a-1 | 85 | b-1 | 15 | 22000 | 1.5 |
| P6 | a-1 | 65 | b-1 | 35 | 17000 | 1.4 |
| P7 | a-1 | 85 | b-3 | 15 | 17000 | 1.7 |
| P8 | a-1 | 70 | b-3 | 30 | 11000 | 1.7 |
| P9 | a-1 | 85 | b-4 | 15 | 12000 | 1.6 |
| P10 | a-1 | 85 | b-5 | 15 | 18000 | 1.9 |
| P11 | a-1 | 70 | b-5 | 30 | 13000 | 1.4 |
| P12 | a-1 | 65 | b-5 | 35 | 25000 | 2.1 |
| P13 | a-1 | 85 | b-6 | 15 | 16000 | 1.7 |
| P14 | a-1 | 85 | b-7 | 15 | 14000 | 1.9 |
| P15 | a-1 | 70 | b-7 | 30 | 9000 | 1.8 |
| P16 | a-2 | 69 | b-2 | 31 | 24000 | 2.2 |
| P17 | a-2 | 54 | b-2 | 46 | 20000 | 1.9 |
| P18 | a-2 | 85 | b-1 | 15 | 15000 | 1.6 |
| P19 | a-2 | 85 | b-1 | 15 | 13000 | 1.3 |
| P20 | a-3 | 90 | b-1 | 10 | 16000 | 1.1 |
| P21 | a-3 | 90 | b-2 | 10 | 13000 | 1.5 |
| P22 | a-3 | 85 | b-3 | 15 | 16000 | 1.7 |
| P23 | a-3 | 80 | b-7 | 20 | 19000 | 1.5 |
| P24 | a-4 | 90 | b-2 | 10 | 18000 | 2.5 |
| P25 | a-4 | 85 | b-5 | 15 | 15000 | 1.3 |

TABLE 3

| Exemplary compound | Monomer a | Weight ratio (wt %) | Monomer b | Weight ratio (wt %) | Molecular weight (Mw) | Mw/Mn |
|---|---|---|---|---|---|---|
| P26 | a-13 | 90 | b-2 | 10 | 10000 | 1.4 |
| P27 | a-13 | 85 | b-2 | 15 | 19000 | 1.3 |
| P28 | a-13 | 90 | b-1 | 10 | 24000 | 2.0 |
| P29 | a-13 | 85 | b-1 | 15 | 15000 | 1.5 |
| P30 | a-13 | 85 | b-5 | 15 | 17000 | 1.2 |
| P31 | a-13 | 85 | b-6 | 15 | 17000 | 1.4 |
| P32 | a-13 | 85 | b-7 | 15 | 11000 | 1.5 |
| P33 | a-13 | 90 | b-7 | 10 | 13000 | 1.7 |
| P34 | a-13 | 90 | b-3 | 10 | 9000 | 1.6 |
| P35 | a-13 | 85 | b-3 | 15 | 18000 | 1.9 |
| P36 | a-13 | 70 | b-3 | 30 | 13000 | 1.4 |
| P37 | a-14 | 90 | b-2 | 10 | 25000 | 1.8 |
| P38 | a-14 | 85 | b-2 | 15 | 8500 | 1.7 |
| P39 | a-14 | 85 | b-2 | 15 | 28000 | 1.7 |
| P40 | a-14 | 90 | b-1 | 10 | 10000 | 1.8 |
| P41 | a-14 | 85 | b-1 | 15 | 24000 | 2.2 |
| P42 | a-14 | 85 | b-1 | 15 | 13000 | 1.9 |
| P43 | a-14 | 85 | b-7 | 15 | 16000 | 1.5 |
| P44 | a-14 | 85 | b-7 | 15 | 14000 | 1.4 |
| P45 | a-14 | 90 | b-5 | 10 | 16000 | 1.2 |
| P46 | a-14 | 80 | b-5 | 20 | 15000 | 1.5 |
| P47 | a-15 | 90 | b-1 | 15 | 18000 | 1.4 |
| P48 | a-15 | 85 | b-1 | 20 | 19000 | 1.2 |
| P49 | a-16 | 90 | b-1 | 10 | 18000 | 1.3 |
| P50 | a-16 | 85 | b-1 | 15 | 15000 | 1.3 |

TABLE 4

| Exemplary compound | Monomer a | Weight ratio (wt %) | Monomer b | Weight ratio (wt %) | Molecular weight (Mw) | Mw/Mn |
|---|---|---|---|---|---|---|
| P51 | a-9 | 95 | b-2 | 5 | 16000 | 1.5 |
| P52 | a-9 | 90 | b-2 | 10 | 13000 | 1.1 |
| P53 | a-9 | 95 | b-1 | 5 | 17000 | 1.4 |
| P54 | a-9 | 90 | b-1 | 10 | 15000 | 1.5 |
| P55 | a-9 | 100 | — | — | 19000 | 1.9 |
| P56 | a-10 | 95 | b-2 | 5 | 16000 | 1.0 |
| P57 | a-10 | 90 | b-2 | 10 | 11000 | 1.6 |
| P58 | a-10 | 95 | b-1 | 5 | 12000 | 1.8 |
| P59 | a-10 | 90 | b-1 | 10 | 13000 | 2.1 |
| P60 | a-10 | 100 | — | — | 10000 | 1.6 |
| P61 | a-11 | 95 | b-2 | 5 | 11000 | 1.7 |
| P62 | a-11 | 90 | b-2 | 10 | 16000 | 1.6 |
| P63 | a-11 | 95 | b-1 | 5 | 12000 | 1.5 |
| P64 | a-11 | 90 | b-1 | 10 | 17000 | 1.8 |
| P65 | a-11 | 100 | — | — | 14000 | 1.3 |
| P66 | a-12 | 95 | b-2 | 5 | 9000 | 1.8 |
| P67 | a-12 | 90 | b-2 | 10 | 15000 | 1.0 |
| P68 | a-12 | 95 | b-1 | 5 | 12000 | 1.1 |
| P69 | a-12 | 90 | b-1 | 10 | 17000 | 1.9 |
| P70 | a-12 | 100 | — | — | 9000 | 1.6 |
| P71 | a-21 | 95 | b-2 | 5 | 14000 | 1.5 |
| P72 | a-21 | 90 | b-2 | 10 | 13000 | 1.4 |
| P73 | a-21 | 95 | b-1 | 5 | 19000 | 1.2 |
| P74 | a-21 | 90 | b-1 | 10 | 13000 | 1.2 |
| P75 | a-21 | 100 | — | — | 8000 | 1.9 |

TABLE 5

| Exemplary compound | Monomer a | Weight ratio (wt %) | Monomer b | Weight ratio (wt %) | Molecular weight (Mw) | Mw/Mn |
|---|---|---|---|---|---|---|
| P76 | a-22 | 95 | b-2 | 5 | 14000 | 1.3 |
| P77 | a-22 | 90 | b-2 | 10 | 16000 | 1.5 |
| P78 | a-22 | 95 | b-1 | 5 | 22000 | 1.9 |
| P79 | a-22 | 90 | b-1 | 10 | 14000 | 1.6 |
| P80 | a-22 | 100 | — | — | 9000 | 1.4 |
| P81 | a-23 | 95 | b-2 | 5 | 12000 | 1.1 |
| P82 | a-23 | 90 | b-2 | 10 | 19000 | 1.3 |
| P83 | a-23 | 95 | b-1 | 5 | 18000 | 1.9 |
| P84 | a-23 | 90 | b-1 | 10 | 18000 | 1.7 |
| P85 | a-23 | 100 | — | — | 13000 | 1.5 |
| P86 | a-24 | 95 | b-2 | 5 | 15000 | 1.9 |
| P87 | a-24 | 90 | b-2 | 10 | 13000 | 1.4 |
| P88 | a-24 | 95 | b-1 | 5 | 13000 | 1.5 |
| P89 | a-24 | 90 | b-1 | 10 | 12000 | 1.6 |
| P90 | a-24 | 100 | — | — | 10000 | 1.3 |
| P91 | a-5 | 90 | b-2 | 10 | 26000 | 1.2 |
| P92 | a-5 | 90 | b-1 | 10 | 17000 | 1.4 |
| P93 | a-6 | 90 | b-2 | 10 | 11000 | 1.9 |
| P94 | a-6 | 90 | b-1 | 10 | 16000 | 1.4 |
| P95 | a-7 | 90 | b-2 | 10 | 15000 | 1.5 |
| P96 | a-7 | 90 | b-1 | 10 | 19000 | 1.3 |
| P97 | a-8 | 90 | b-2 | 10 | 13000 | 1.7 |
| P98 | a-8 | 90 | b-1 | 10 | 15000 | 1.5 |
| P99 | a-17 | 90 | b-2 | 10 | 12000 | 1.6 |
| P100 | a-17 | 90 | b-1 | 10 | 13000 | 1.2 |

TABLE 6

| Exemplary compound | Monomer a | Weight ratio (wt %) | Monomer a | Weight ratio (wt %) | Monomer b | Weight ratio (wt %) | Molecular weight (Mw) | Mw/Mn |
|---|---|---|---|---|---|---|---|---|
| P101 | a-1 | 35 | a-9 | 55 | b-2 | 10 | 13000 | 1.3 |
| P102 | a-1 | 35 | a-10 | 45 | b-2 | 10 | 19000 | 1.5 |
| P103 | a-1 | 35 | a-21 | 45 | b-1 | 10 | 15000 | 1.5 |
| P104 | a-1 | 35 | a-22 | 45 | b-1 | 10 | 12000 | 1.4 |
| P105 | a-1 | 25 | a-21 | 75 | — | — | 9000 | 1.2 |
| P106 | a-2 | 35 | a-9 | 45 | b-2 | 10 | 16000 | 1.6 |
| P107 | a-2 | 35 | a-10 | 45 | b-2 | 10 | 17000 | 1.5 |
| P108 | a-2 | 35 | a-21 | 45 | b-1 | 10 | 14000 | 1.7 |
| P109 | a-2 | 35 | a-22 | 45 | b-1 | 10 | 13000 | 1.3 |
| P110 | a-2 | 25 | a-21 | 75 | — | — | 10000 | 1.1 |
| P111 | a-3 | 35 | a-9 | 45 | b-2 | 10 | 13000 | 1.9 |
| P112 | a-3 | 35 | a-10 | 45 | b-2 | 10 | 15000 | 1.6 |
| P113 | a-3 | 35 | a-21 | 45 | b-1 | 10 | 14000 | 1.5 |
| P114 | a-3 | 35 | a-22 | 45 | b-1 | 10 | 15000 | 1.3 |
| P115 | a-3 | 25 | a-21 | 75 | — | — | 11000 | 1.7 |
| P116 | a-13 | 35 | a-9 | 45 | b-2 | 10 | 16000 | 1.3 |
| P117 | a-13 | 35 | a-10 | 45 | b-1 | 10 | 11000 | 1.2 |
| P118 | a-13 | 35 | a-21 | 45 | b-2 | 10 | 12000 | 1.6 |
| P119 | a-13 | 35 | a-22 | 45 | b-1 | 10 | 18000 | 1.5 |
| P120 | a-13 | 25 | a-21 | 75 | — | — | 8000 | 1.7 |
| P121 | a-14 | 35 | a-9 | 45 | b-1 | 10 | 13000 | 1.8 |
| P122 | a-14 | 35 | a-10 | 45 | b-2 | 10 | 16000 | 1.7 |
| P123 | a-14 | 35 | a-21 | 45 | b-1 | 10 | 18000 | 1.2 |
| P124 | a-14 | 35 | a-22 | 45 | b-2 | 10 | 17000 | 1.4 |
| P125 | a-14 | 25 | a-21 | 75 | — | — | 13000 | 1.6 |

TABLE 7

| Exemplary compound | Monomer a | Weight ratio (wt %) | Monomer b | Weight ratio (wt %) | Monomer b | Weight ratio (wt %) | Molecular weight (Mw) | Mw/Mn |
|---|---|---|---|---|---|---|---|---|
| P126 | a-1 | 85 | b-1 | 10 | b-2 | 5 | 22000 | 1.8 |
| P127 | a-1 | 85 | b-1 | 10 | b-3 | 5 | 17000 | 1.3 |
| P128 | a-1 | 85 | b-2 | 10 | b-3 | 5 | 14000 | 1.5 |
| P129 | a-1 | 85 | b-2 | 10 | b-7 | 5 | 20000 | 1.4 |
| P130 | a-1 | 85 | b-2 | 10 | b-5 | 5 | 15000 | 1.6 |

TABLE 7-continued

| Exemplary compound | Monomer a | Weight ratio (wt %) | Monomer b | Weight ratio (wt %) | Monomer b | Weight ratio (wt %) | Molecular weight (Mw) | Mw/Mn |
|---|---|---|---|---|---|---|---|---|
| P131 | a-2 | 85 | b-1 | 10 | b-2 | 5 | 13000 | 1.9 |
| P132 | a-2 | 85 | b-1 | 10 | b-3 | 5 | 17000 | 1.3 |
| P133 | a-2 | 85 | b-2 | 10 | b-3 | 5 | 18000 | 1.7 |
| P134 | a-2 | 85 | b-2 | 10 | b-7 | 5 | 14000 | 1.8 |
| P135 | a-2 | 85 | b-2 | 10 | b-5 | 5 | 15000 | 1.9 |
| P136 | a-3 | 85 | b-1 | 10 | b-2 | 5 | 20000 | 2.5 |
| P137 | a-3 | 85 | b-1 | 10 | b-3 | 5 | 13000 | 1.7 |
| P138 | a-3 | 85 | b-2 | 10 | b-3 | 5 | 15000 | 1.4 |
| P139 | a-3 | 85 | b-2 | 10 | b-7 | 5 | 18000 | 1.5 |
| P140 | a-3 | 85 | b-2 | 10 | b-5 | 5 | 14000 | 1.6 |
| P141 | a-13 | 85 | b-1 | 10 | b-2 | 5 | 12000 | 1.8 |
| P142 | a-13 | 85 | b-1 | 10 | b-3 | 5 | 19000 | 1.4 |
| P143 | a-13 | 85 | b-2 | 10 | b-3 | 5 | 13000 | 1.7 |
| P144 | a-13 | 85 | b-2 | 10 | b-7 | 5 | 16000 | 1.2 |
| P145 | a-13 | 85 | b-2 | 10 | b-5 | 5 | 17000 | 1.8 |
| P146 | a-14 | 85 | b-1 | 10 | b-2 | 5 | 14000 | 1.6 |
| P147 | a-14 | 85 | b-1 | 10 | b-3 | 5 | 19000 | 1.7 |
| P148 | a-14 | 85 | b-2 | 10 | b-3 | 5 | 15000 | 1.3 |
| P149 | a-14 | 85 | b-2 | 10 | b-7 | 5 | 11000 | 1.6 |
| P150 | a-14 | 85 | b-2 | 10 | b-5 | 5 | 13000 | 1.8 |

TABLE 8

| Exemplary compound | Monomer a | Weight ratio (wt %) | Monomer b | Weight ratio (wt %) | Monomer b | Weight ratio (wt %) | Molecular weight (Mw) | Mw/Mn |
|---|---|---|---|---|---|---|---|---|
| P151 | a-9 | 90 | b-8 | 5 | b-2 | 5 | 15000 | 1.3 |
| P152 | a-9 | 90 | b-10 | 5 | b-2 | 5 | 17000 | 1.6 |
| P153 | a-9 | 90 | b-11 | 5 | b-2 | 5 | 19000 | 1.8 |
| P154 | a-9 | 90 | b-12 | 5 | b-2 | 5 | 14000 | 1.5 |
| P155 | a-9 | 90 | b-13 | 5 | b-2 | 5 | 16000 | 1.8 |
| P156 | a-10 | 90 | b-8 | 5 | b-2 | 5 | 13000 | 1.6 |
| P157 | a-10 | 90 | b-10 | 5 | b-2 | 5 | 19000 | 1.1 |
| P158 | a-10 | 90 | b-11 | 5 | b-2 | 5 | 12000 | 1.8 |
| P159 | a-10 | 90 | b-12 | 5 | b-2 | 5 | 15000 | 1.9 |
| P160 | a-10 | 90 | b-13 | 5 | b-2 | 5 | 14000 | 1.7 |
| P161 | a-11 | 90 | b-8 | 5 | b-2 | 5 | 19000 | 2.1 |
| P162 | a-11 | 90 | b-10 | 5 | b-2 | 5 | 7000 | 1.9 |
| P163 | a-11 | 90 | b-11 | 5 | b-2 | 5 | 15000 | 1.5 |
| P164 | a-11 | 90 | b-12 | 5 | b-2 | 5 | 16000 | 1.7 |
| P165 | a-11 | 90 | b-13 | 5 | b-2 | 5 | 12000 | 2.3 |
| P166 | a-21 | 90 | b-8 | 5 | b-2 | 5 | 17000 | 1.5 |
| P167 | a-21 | 90 | b-10 | 5 | b-2 | 5 | 15000 | 1.7 |
| P168 | a-21 | 90 | b-11 | 5 | b-2 | 5 | 14000 | 1.7 |
| P169 | a-21 | 90 | b-12 | 5 | b-2 | 5 | 18000 | 1.8 |
| P170 | a-21 | 90 | b-13 | 5 | b-2 | 5 | 15000 | 1.3 |
| P171 | a-22 | 90 | b-8 | 5 | b-2 | 5 | 17000 | 1.6 |
| P172 | a-22 | 90 | b-10 | 5 | b-2 | 5 | 15000 | 1.4 |
| P173 | a-22 | 90 | b-11 | 5 | b-2 | 5 | 11000 | 1.8 |
| P174 | a-22 | 90 | b-12 | 5 | b-2 | 5 | 18000 | 1.3 |
| P175 | a-22 | 90 | b-13 | 5 | b-2 | 5 | 14000 | 1.7 |

TABLE 9

| Exemplary compound | Monomer a | Weight ratio (wt %) | Monomer b | Weight ratio (wt %) | Initiator (mol %) | Molecular weight (Mw) | Mw/Mn |
|---|---|---|---|---|---|---|---|
| P176 | J-1 | 88.1 | b-2 | 11.9 | 20 | 8000 | 1.3 |
| P177 | J-1 | 88.1 | b-2 | 11.9 | 24 | 7000 | 1.3 |
| P178 | J-1 | 88.1 | b-2 | 11.9 | 18 | 9000 | 1.5 |
| P179 | J-1 | 88.1 | b-2 | 11.9 | 15 | 10000 | 1.2 |
| P180 | J-1 | 88.1 | b-2 | 11.9 | 12 | 12000 | 1.5 |
| P181 | J-1 | 88.1 | b-2 | 11.9 | 10 | 15000 | 1.4 |
| P182 | J-1 | 88.1 | b-2 | 11.9 | 8 | 17000 | 1.7 |
| P183 | J-1 | 88.1 | b-2 | 11.9 | 5 | 19000 | 1.3 |
| P184 | J-1 | 89.4 | b-2 | 10.6 | 10 | 9000 | 1.4 |

TABLE 9-continued

| Exemplary compound | Monomer a | Weight ratio (wt %) | Monomer b | Weight ratio (wt %) | Initiator (mol %) | Molecular weight (Mw) | Mw/Mn |
|---|---|---|---|---|---|---|---|
| P185 | J-1 | 90.8 | b-2 | 9.2 | 10 | 9000 | 1.4 |
| P186 | J-1 | 92.2 | b-2 | 7.8 | 10 | 10000 | 1.4 |
| P187 | J-1 | 93.7 | b-2 | 6.3 | 10 | 10000 | 1.4 |
| P188 | J-1 | 95.2 | b-2 | 4.8 | 16 | 8000 | 1.3 |
| P189 | J-1 | 96.7 | b-2 | 3.27 | 4 | 11000 | 1.4 |
| P190 | J-1 | 88 | b-7 | 12 | 20 | 10000 | 1.6 |
| P191 | J-1 | 88 | b-1 | 12 | 20 | 9000 | 1.3 |
| P192 | J-2 | 88.1 | b-2 | 11.9 | 20 | 10000 | 1.5 |
| P193 | J-6 | 88.1 | b-2 | 11.9 | 20 | 11000 | 1.2 |

TABLE 9-continued

| Exemplary compound | Monomer a | Weight ratio (wt %) | Monomer b | Weight ratio (wt %) | Initiator (mol %) | Molecular weight (Mw) | Mw/Mn |
|---|---|---|---|---|---|---|---|
| P194 | J-6 | 88.1 | b-7 | 11.9 | 5 | 8000 | 1.3 |
| P195 | J-11 | 88.1 | b-2 | 11.9 | 4 | 9000 | 1.3 |
| P196 | J-13 | 88.1 | b-7 | 11.9 | 20 | 15000 | 1.4 |
| P197 | J-21 | 88.1 | b-2 | 11.9 | 20 | 13000 | 1.5 |
| P198 | J-23 | 88.1 | b-2 | 11.9 | 10 | 9000 | 1.3 |
| P199 | J-24 | 88.1 | b-1 | 11.9 | 10 | 7000 | 1.2 |
| P200 | J-25 | 88.1 | b-2 | 11.9 | 10 | 10000 | 1.2 |

TABLE 10

| Exemplary compound | Monomer a | Weight ratio (wt %) | Monomer b | Weight ratio (wt %) | Initiator (mol %) | Molecular weight (Mw) | Mw/Mn |
|---|---|---|---|---|---|---|---|
| P201 | K-1 | 80.3 | b-2 | 19.7 | 6 | 8800 | 2.2 |
| P202 | K-1 | 84.5 | b-2 | 15.5 | 6 | 7000 | 2.8 |
| P203 | K-2 | 80.3 | b-2 | 19.7 | 6 | 8000 | 1.8 |
| P204 | K-2 | 84.5 | b-2 | 15.5 | 6 | 7000 | 1.5 |
| P205 | K-3 | 80.3 | b-2 | 19.7 | 6 | 12000 | 2 |
| P206 | K-3 | 84.5 | b-2 | 15.5 | 6 | 9000 | 1.7 |
| P207 | K-4 | 80.3 | b-2 | 19.7 | 6 | 86000 | 1.8 |
| P208 | K-4 | 84.5 | b-2 | 15.5 | 6 | 9500 | 1.5 |
| P209 | K-5 | 80.3 | b-2 | 19.7 | 6 | 10500 | 1.4 |
| P210 | K-5 | 84.5 | b-2 | 15.5 | 6 | 9000 | 2.2 |
| P211 | K-6 | 80.3 | b-2 | 19.7 | 6 | 7000 | 1.9 |
| P212 | K-6 | 84.5 | b-2 | 15.5 | 6 | 7500 | 1.9 |
| P213 | K-7 | 80.3 | b-2 | 19.7 | 6 | 8200 | 2.3 |
| P214 | K-7 | 84.5 | b-2 | 15.5 | 6 | 7800 | 1.8 |
| P215 | K-8 | 80.3 | b-2 | 19.7 | 6 | 6800 | 1.8 |
| P216 | K-8 | 84.5 | b-2 | 15.5 | 6 | 9100 | 1.8 |
| P217 | K-9 | 80.3 | b-2 | 19.7 | 6 | 8600 | 2.3 |
| P218 | K-9 | 84.5 | b-2 | 15.5 | 6 | 7300 | 1.7 |
| P219 | K-10 | 80.3 | b-2 | 19.7 | 6 | 7700 | 1.6 |
| P220 | K-10 | 84.5 | b-2 | 15.5 | 6 | 9000 | 1.6 |
| P221 | K-11 | 80.3 | b-2 | 19.7 | 6 | 6900 | 1.5 |
| P222 | K-11 | 84.5 | b-2 | 15.5 | 6 | 8900 | 1.9 |
| P223 | K-12 | 80.3 | b-2 | 19.7 | 6 | 11000 | 2 |
| P224 | K-12 | 84.5 | b-2 | 15.5 | 6 | 7900 | 1.8 |
| P225 | K-13 | 80.3 | b-2 | 19.7 | 6 | 9500 | 1.9 |
| P226 | K-13 | 84.5 | b-2 | 15.5 | 6 | 8100 | 1.7 |
| P227 | K-14 | 80.3 | b-2 | 19.7 | 6 | 7300 | 2.4 |
| P228 | K-14 | 84.5 | b-2 | 15.5 | 6 | 8200 | 1.9 |

Examples of the synthetic methods of some of the above-described, specific examples of the colorant multimers are shown below, but the invention is not particularly limited to these examples.

Synthesis of Exemplary Compound P2

3.45 g of monomer a-1, 1.55 g of monomer b-2 and 420 mg of n-dodecanethiol were dissolved in 28.3 mL of propyleneglycol monomethylether acetate (PGMEA). The mixture was stirred at 85° C. under nitrogen gas atmosphere, and then 478 mg of dimethyl-2,2'-azobis(2-methylpropionate) was added thereto. Thereafter, 478 mg of dimethyl-2,2'-azobis(2-methylpropionate) was added to the solution twice more after an interval of two hours each time, the reaction liquid was heated to 90° C., and was further stirred for 2 hours. After finishing the reaction, the reaction liquid was dropped into 400 mL of acetonitrile, and the obtained crystal was filtered, thereby obtaining 4.11 g of Exemplary compound P2.

Synthesis of Exemplary Compound P54

4.5 g of monomer a-9, 0.5 g of monomer b-1 and 210 mg of n-dodecanethiol were dissolved in 28.3 mL of propyleneglycol monomethylether acetate (PGMEA). The mixture was stirred at 85° C. under nitrogen gas atmosphere, and then 239 mg of dimethyl-2,2'-azobis(2-methylpropionate) was added thereto. Thereafter, 239 mg each of dimethyl-2,2'-azobis(2-methylpropionate) was added to the solution every two hours twice, the reaction liquid was heated to 90° C., and was further stirred for 2 hours. After finishing the reaction, the reaction liquid was dropped into 400 mL of acetonitrile, and the obtained crystal was filtered, thereby obtaining 3.21 g of Exemplary compound P54:

Synthesis of Exemplary Compound P63

4.75 g of monomer a-11, 0.25 g of monomer b-1 and 147 mg of n-dodecanethiol were dissolved in 28.3 mL of propyleneglycol monomethylether acetate (PGMEA). The mixture was stirred at 85° C. under nitrogen gas atmosphere, and then 167 mg of dimethyl-2,2'-azobis(2-methylpropionate) was added thereto. Thereafter, 167 mg each of dimethyl-2,2'-azobis(2-methylpropionate) was added to the solution every two hours twice, the reaction liquid was heated to 90° C., and was further stirred for 2 hours. After finishing the reaction, the reaction liquid was dropped into 400 mL of acetonitrile, and the obtained crystal was filtered, thereby obtaining 3.61 g of Exemplary Compound P63.

Synthesis of Exemplary Compound P67

4.5 g of monomer a-12, 0.5 g of monomer b-2 and 191 mg of n-dodecanethiol were dissolved in 28.3 mL of propyleneglycol monomethylether acetate (PGMEA). The mixture was stirred at 85° C. under nitrogen gas atmosphere, and then 218 mg of dimethyl-2,2'-azobis(2-methylpropionate) was added thereto. Thereafter, 218 mg each of dimethyl-2,2'-azobis(2-methylpropionate) was added to the solution every two hours twice, the reaction liquid was heated to 90° C., and was further stirred for 2 hours. After the termination of the reaction, the reaction liquid was dropped into 400 mL of acetonitrile, and the obtained crystal was filtered, thereby obtaining 2.75 g of Exemplary Compound P67.

Synthesis of Exemplary Compound P74

4.5 g of monomer a-21, 0.5 g of monomer b-1, and 212 mg of n-dodecanethiol were dissolved in 28.3 mL of propyleneglycol monomethylether acetate (PGMEA). The mixture was stirred at 85° C. under nitrogen gas atmosphere, and then 242 mg of dimethyl-2,2'-azobis(2-methylpropionate) was added thereto. Thereafter, 242 mg each of dimethyl-2,2'-azobis(2-methylpropionate) was added to the solution every two hours twice, the reaction liquid was heated to 90° C., and was further stirred for 2 hours. After finishing the reaction, the reaction liquid was dropped into 400 mL of acetonitrile, and the obtained crystal was filtered, thereby obtaining 3.78 g of Exemplary Compound P74.

Synthesis of Exemplary Compound P153

4.5 g of monomer a-9, 0.25 g of monomer b-11, 0.25 g of monomer b-2, and 157 mg of n-dodecanethiol were dissolved in 28.3 mL of propyleneglycol monomethylether acetate (PGMEA). The mixture was stirred at 85° C. under nitrogen gas atmosphere, and then 178 mg of dimethyl-2,2'-azobis(2-methylpropionate) was added thereto. Thereafter, 178 mg each of dimethyl-2,2'-azobis(2-methylpropionate) was added to the solution every two hours twice, the reaction liquid was heated to 90° C., and was further stirred for 2 hours. After finishing the reaction, the reaction liquid was dropped into 400 mL of acetonitrile, and the obtained crystal was filtered, thereby obtaining 4.39 g of Exemplary Compound P153.

Synthesis of Exemplary Compound P-176

11.7 g of Exemplary Compound J-1, 1.58 g of methacrylic acid, 0.56 g of dodecanethiol were dissolved in 75.0 g of propyleneglycol monomethylether acetate (PGMEA). To this solution, while stirring at 85° C., a solution of 23.3 g of Exemplary compound J-1, 3.16 g of methacrylic acid, 1.11 g of dodecanethiol, and 3.8 g of dimethyl-2,2'-azobis(2-methylpropionate) dissolved in 150 g of propyleneglycol monomethylether acetate (PGMEA), was dropped over 3 hours. 4 hours after the start of the dropping, 1.14 g of dimethyl-2,2'-azobis(2-methylpropionate) was added to this reaction liquid, and then the mixture was further stirred at 85° C. for 2 hours. Thereafter, 811 mL of PGMEA and 1081 mL of methanol were added to the reaction solution, and the reaction liquid was dropped into 4326 mL of acetonitrile while stirring. The precipitated crystal was filtered, and the obtained crystal was dried under reduced pressure, thereby obtaining 12.6 g of Exemplary Compound P-176.

Synthesis of Exemplary Compound S-4

The following Q-1 was synthesized in a manner similar to the synthesis of Exemplary Compound J-1, except that 3-mercapto-1-propanol used in the synthesis of Compound 11, which is an intermediate of Exemplary Compound J-1, was changed to 2-mercapto ethanol.

The structure of Q-1 was confirmed by $^1$H-NMR.

Exemplary Compound Q-1: $^1$H-NMR, 400 MHz, δ (DMSO-$d_6$) ppm: 0.91 (36H, s), 1.15 (6H, d), 1.21-2.17 (40H, m), 2.07-3.05 (6H, m), 3.61-3.84 (2H, m), 4.28-4.33 (3H, m), 5.56 (1H, br), 6.01-6.12 (3H, br), 7.78 (1H, s), 11.03 (1H, br), 11.83-12.25 (1H, br).

(Q-1)

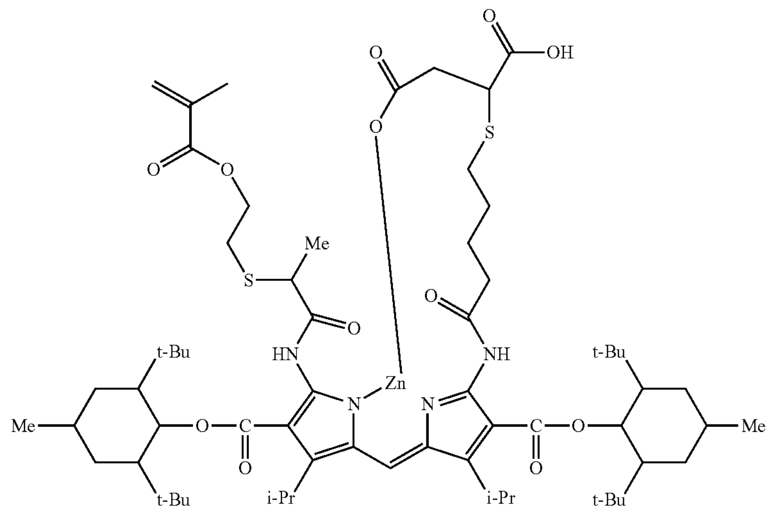

11.6 g of the obtained Q-1, 1.58 g of methacrylic acid, and 0.56 g of dodecane thiol were dissolved in 75.0 g of propyleneglycol monomethylether acetate (PGMEA). To this solution, while stirring at 85° C., a solution of 23.3 g of Q-1, 3.16 g of methacrylic acid, 1.11 g of dodecanethiol, and 3.8 g of dimethyl-2,2'-azobis(2-methylpropionate) dissolved in 150 g of propyleneglycol monomethylether acetate (PGMEA), was dropped over 3 hours. 4 hours after the start of the dropping, 1.14 g of dimethyl-2,2'-azobis(2-methylpropionate) was added to this reaction liquid, and the mixture was further stirred at 85° C. for 2 hours. 811 mL of PGMEA and 1081 mL of methanol were added to the reaction solution, and the reaction liquid was dropped into 4326 mL of acetonitrile while stirring. The precipitated crystal was filtered, and the obtained crystal was dried under reduced pressure, thereby obtaining 13.2 g of Exemplary Compound S-4.

The structure of S-4 was confirmed by $^1$H-NMR by the disappearance of the peak at 5.56-6.12, which corresponds to the polymerizable group moiety of Q-1, and confirmed by an acid value measurement by confirming the introduction of methacrylic acid.

Synthesis of Exemplary Compound S-16

The following Q-2 was synthesized in a manner similar to the synthesis of Exemplary Compound J-1, except that 3-mercapto-1-propanol used in the synthesis of Compound 11, which is an intermediate of Exemplary Compound J-1, was changed to 2-mercaptoethanol, and pivaloyl chloride was used in place of chlorovaleryl chloride for synthesizing the intermediate 13.

The structure of Q-2 was confirmed by $^1$H-NMR.

Exemplary Compound Q-2: $^1$H-NMR, 400 MHz, δ (DMSO-$d_6$) ppm: 0.88 (42H, s), 1.11-1.67 (45H, m), 2.97 (2H, m), 3.61-3.84 (2H, m), 4.27-4.36 (3H, m), 5.56 (1H, s), 6.02 (2H, s), 6.12 (1H, s), 7.78 (1H, s), 11.36-11.83 (2H, br).

1.8 g of a copolymer of methacrylic acid and methyl methacrylate (weight ratio is 2:1), which was synthesized separately, was dissolved in 100 g of N-methylpyrrolidone. 8.2 g of the obtained Q-2 was added to this solution, and the mixture was stirred at 40° C. for 1 hour. 500 mL of methanol was added to the reaction solution, and the reaction liquid was dropped into 800 mL of acetonitrile while stirring. The precipitated crystal was filtered, and the obtained crystal was dried under reduced pressure, thereby obtaining 8.8 g of Exemplary Compound S-16.

The structure of S-16 was confirmed by $^1$H-NMR by the disappearance of the peak of the polymerizable group moiety of Q-2 and the disappearance of the acetic acid ion being substituted, and confirmed by an acid value measurement by confirming the introduction of methacrylic acid.

(Q-2)

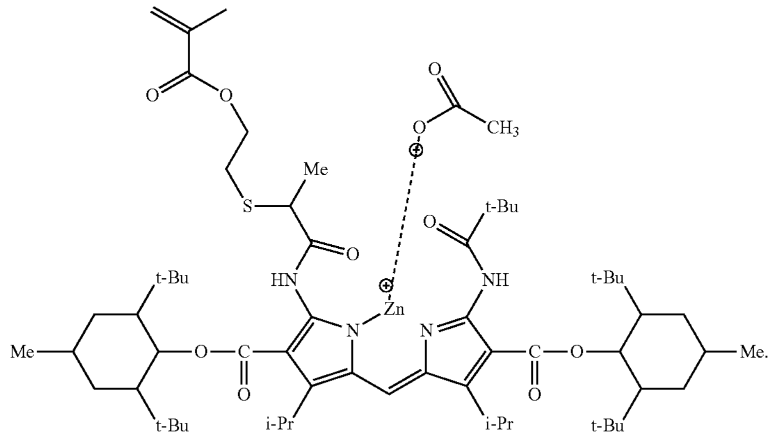

Synthesis of Exemplary Compound S-20

The following Q-3 was obtained by a method in which an alcohol obtained by using 3-mercapto-1-propanol instead of 2-mercapto ethanol in the synthesis of Compound 11 (an intermediate of Exemplary Compound J-1) is coupled with ethyl orthoformate and trifluoroacetic acid, and the coupled product was complexed with zinc acetate. 11.5 g of the obtained Q-3 and 2.5 g of a commercially available diisocyanate were mixed in 100 mL of N-methylpyrrolidone, and the mixture was stirred at 40° C. for 4 hours. Thereafter, 500 mL of methanol was added to the reaction solution, and the resultant liquid was dropped into 800 mL of acetonitrile while stirring. The precipitated crystal was filtered, and the obtained crystal was dried under reduced pressure, thereby obtaining 7.6 g of Exemplary Compound S-20.

Exemplary Compound J-1) and forming a complex with zinc, 1.1 g of a commercial tetramercapto compound Q-6, and 7.5 g of diazabicycloundecene (DBU) were mixed in 100 mL of N-methylpyrrolidone, and the mixture was stirred at 40° C. for 4 hours. Thereafter, 500 mL of methanol was added to the reaction solution, and the resultant liquid was dropped into 800 mL of acetonitrile while stirring. The precipitated crystal was filtered, and the obtained crystal was dried under reduced pressure, thereby obtaining 4.2 g of Exemplary Compound S-26.

The structure of the obtained S-26 was confirmed by $^{1}$H-NMR.

Exemplary compound S-26: $^{1}$H-NMR, 400 MHz, δ (DMSO-$d_6$) ppm: 0.88 (144H, s), 1.08-1.9 (144H, m), 2.1

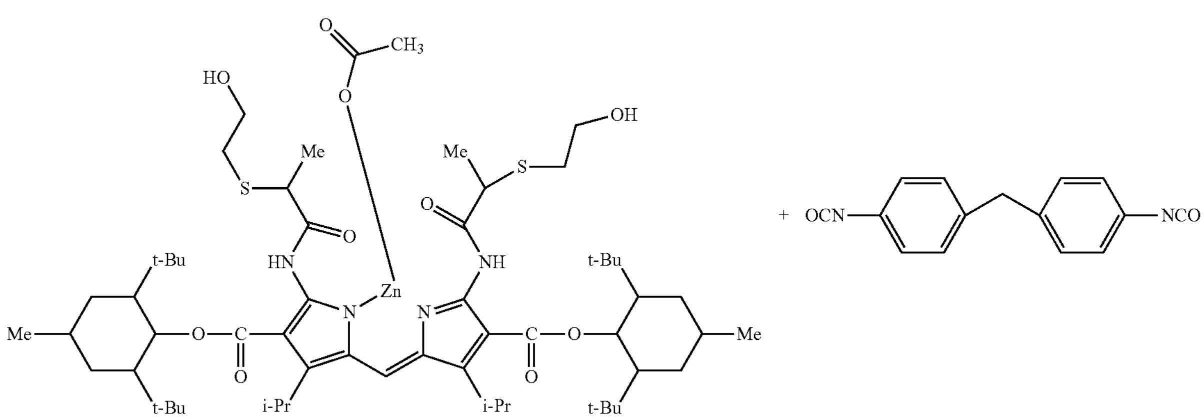

(Q-3) (Q-4)

Synthesis of Exemplary Compound S-26

11.7 g of Q-5 synthesized by coupling of Compound 13 with Compound 15 (both of which are intermediates of (36H, s), 2.3-3.2 (36H, m), 3.28 (4H, bs), 3.4-3.65 (4H, m), 4.23 (8H, bs), 6.03 (4H, s), 7.26 (4H, s), 7.53 (4H, s), 10.59-10.63 (8H, br).

(Q-5)

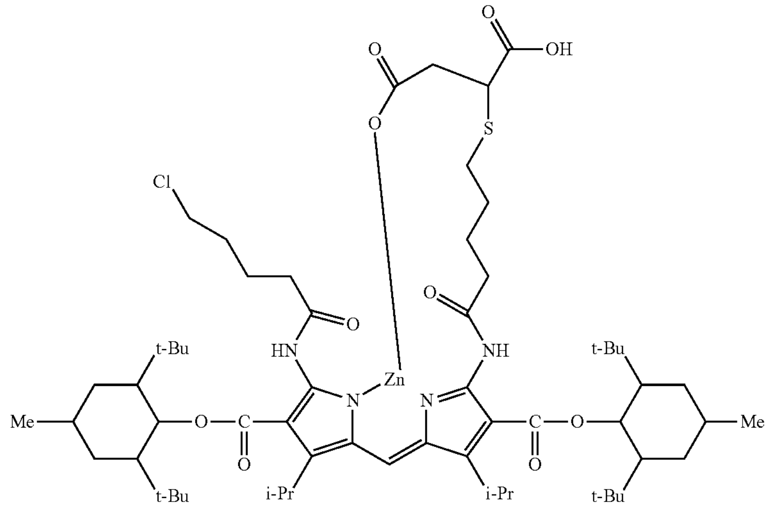

(Q-6)

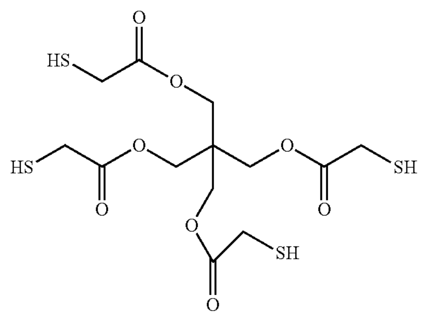

Among the above Exemplary Compounds, from the viewpoint of alkali developability, Exemplary Compounds P51 to P100 and P151 to P175, Exemplary Compounds S-1 to S-13, Exemplary Compounds K-3 to K-6 and K-9 and K-10 are preferable, and Exemplary Compounds P51 to P90 and P151 to P175, Exemplary Compounds S-1 to S-13, Exemplary, Compound K-3, K-5, K-6, K-9 and K-10 are more preferable.

The molecular weight of the colorant multimer of the invention is preferably in the range of from 5,000 to 30,000 in terms of the weight average molecular weight (Mw), and in the range of from 3,000 to 20,000 in terms of the number average molecular weight (Mn). The molecular weight of the colorant multimer of the invention is more preferably in the range of from 5,000 to 25,000 in terms of the weight average molecular weight (Mw), and in the range of from 3,000 to 17,000 in terms of the number average molecular weight (Mn). The molecular weight of the colorant multimer of the invention is still more preferably in the range of from 5,000 to 20,000 in terms of the weight average molecular weight (Mw), and in the range of from 3,000 to 15,000 in terms of the number average molecular weight (Mn).

From the viewpoint of the developability when the colorant multimer of the invention is used for a colored curable composition to manufacture a color filter, the weight average molecular weight (Mw) of the colorant multimer of the invention is preferably 20,000 or less.

Colored Curable Composition

The colored curable composition according to the first aspect of the invention contains at least one of the colorant multimers of the first aspect of the invention as a colorant. The colored curable composition according to the invention is characterized by being cured with heat, light, or the both of them, and may contain other components such as a polymerization initiator, a solvent, a binder, a crosslinking agent or the like, as necessary.

Due to the characteristics of the dipyrromethene metal complex compound having a specific structure contained in the structure of the colorant multimer of the invention, the colored curable composition according to the invention can form a pixel pattern in a thin film (for example, at a thickness of 1 μm or less). Accordingly, the colored curable composition according to the invention is preferable for forming a color filter for a solid-state image sensor in which high definition with a minute size of 2 μm or less (the edge length of the pixel pattern viewed from the line normal to the substrate is 0.5 μm to 2.0 μm, for example) is required, and a good rectangular cross-sectional profile is required.

In the colored curable composition according to the invention, the colorant multimer may be used singly, or two or more kinds thereof may be used in combination.

The content of the colorant multimer in the colored curable composition according to the invention varies depending on the molecular weight and the molar absorption coefficients of the colorant multimer, and the content of the colorant multimer is preferably from 10% by mass to 70% by mass, more preferably from 10% by mass to 50% by mass, and still more preferably from 15% by mass to 30% by mass, with respect to the total solid content of the colored curable composition.

The colored curable composition and the color filter using the colored curable composition according to the invention may contain a colorant other than the colorant multimer of the invention in addition to the colorant multimer, as long as the effect of the invention is not impaired. Examples of the colorant other than the colorant multimer of the invention include triarylmethane colorants having an absorption maximum in the wavelength region of from 550 nm to 650 nm (such as C.I. Acid Blue 7, C.I. Acid Blue 83, C.I. Acid Blue 90, C.I. Solent Blue 38, C.I. Acid Violet 17, C.I. Acid Violet 49 or C.I. Acid Green 3), and xanthene colorants having an absorption maximum in the wavelength range of from 500 nm to 600 nm such as C.I. Acid Red 289.

The content of the triarylmethane colorant is not specifically limited as long as the effect of the invention is not impaired, and preferably from 0.5% by mass to 50% by mass, with respect to the total solid content in the colored curable composition according to the invention.

In order to manufacture a blue filter array, it is preferable to use a mixture of at least one of the colorant multimers and a phthalocyanine.

Phthalocyanine Colorant

The phthalocyanine colorant used in the invention is not particularly limited so long as it is a colorant having a phthalocyanine backbone. The center metal included in the phthalocyanine colorant is not specifically limited, and may be any metal capable of constituting a phthalocyanine backbone. In particular, magnesium, titanium, iron, cobalt, nickel, copper, zinc and aluminium are preferably used as the center metal.

Specific examples of the phthalocyanine colorant according to the invention include C. I. Pigment Blue 15, C. I. Pigment Blue 15:1, C. I. Pigment Blue 15:2, C. I. Pigment Blue 15:3, C. I. Pigment Blue 15:4, C. I. Pigment Blue 15:5, C. I. Pigment Blue 15:6, C. I. Pigment Blue 16, C. I. Pigment Blue 17:1, C. I. Pigment Blue 75, C. I. Pigment Blue 79, C. I. Pigment Green 7, C. I. Pigment Green 36, C. I. Pigment Green 37, chloroaluminium phthalocyanine, hydroxyaluminium phthalocyanine, aluminium phthalocyanine oxide and zinc phthalocyanine. Among these, C. I. Pigment Blue 15, C. I. Pigment Blue 15:6, C. I. Pigment Blue 15:1 and C. I. Pigment Blue 15:2 are preferable, and C. I. Pigment Blue 15:6 is more preferable in view of light fastness and coloring property.

The content of the phthalocyanine colorant in the colored curable composition according to the invention is preferably from 10% by mass to 70% by mass, more preferably from 20% by mass to 60% by mass, and still more preferably from 35% by mass to 50% by mass with respect to the total solid contents of the colored curable composition.

With regard to the content ratio of the phthalocyanine colorant to the colorant multimer in terms of the dipyrromethene metal complex compound, the ratio of the phthalocyanine colorant to the dipyrromethene metal complex compound (the phthalocyanine colorant: the phthalocyanine colorant to the dipyrromethene metal complex compound) is preferably from 100:5 to 100:100, more preferably from 100:15 to 100:75, and still more preferably from 100:25 to 100:50).

Dispersant

When the colored curable composition according to the invention contains a colorant, the colored curable composition may further contain a dispersant.

As the dispersant, known colorant dispersants and surfactants may be used.

Examples of the dispersant include many kinds of compounds and specific examples thereof include phthalocyanine derivatives (for example, EFKA-745 (trade name), manufactured by EFKA), SOLSPERSE 5000 (trade name, available from Lubrizol Japan Ltd.); cationic surfactants such as KP341 (olgano-siloxane polymer) (trade name, manufactured by Shin-Etsu Chemical Co., Ltd.), POLYFLOW Nos. 75, 90, and 95 ((meth)acrylic acid-based (co)polymer) (trade name, all manufactured by Kyoeisha Chemical Co., Ltd.) and W001 (trade name, available from Yusho Co., Ltd.); nonionic surfactants such as polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate and sorbitan fatty acid esters; anionic surfactants such as W004, W005 and W017 (trade names, available from Yusho Co., Ltd.); high-molecular dispersants such as EFKA-46, EFKA-47, EFKA-47EA, EFKA POLYMER 100, EFKA POLYMER 400, EFKA POLYMER 401 and EFKA POLYMER 450 (trade names, manufactured by Morishita & Co., Ltd.); various SOLSPERSE dispersants such as SOLSPERSE 3000, 5000, 9000, 12000, 13240, 13940, 17000, 24000, 26000 and 28000 (trade names, available from Lubrizol Japan Ltd.); ADEKA PLURONIC L31, F38, L42, L44, L61, L64, F68, L72, P95, F77, P84, F87, P94, L101, P103, F108, L121 and P-123 (trade names, manufactured by Adeka Corporation), and ISONET S-20 (trade name, manufactured by Sanyo Chemical Industries, Ltd.).

The content of the dispersant in the colored curable composition according to the invention is preferably from 1% by mass to 80% by mass, more preferably from 5% by mass to 70% by mass, and most preferably from 10% by mass to 60% by mass with respect to the mass of the colorant.

Polymerizable Compound

The colored curable composition according to the invention may include a polymerizable compound. Examples of the polymerizable compound include an addition-polymerizable compound having at least one ethylenically unsaturated double bond. Specifically, the polymerizable compound is selected from compounds having at least one, preferably two or more terminal ethylenically unsaturated bonds. Such compounds are widely known in this industrial field, and may be used in the invention without specific limitation. These compounds may have any chemical form of, for example, a monomer, a prepolymer (i.e., a dimer, trimer or oligomer) or a mixture thereof, or a (co)polymer thereof.

Examples of the monomer or the (co)polymer thereof include the specific examples described in the paragraphs [0058] to [0065] of JP-A No. 2008-294982.

Preferable examples of the polymerizable compound include aliphatic alcohol esters such as those described in Japanese Examined Patent Publication (JP-B) No. 51-47334 and JP-A No. 57-196231, compounds having an aromatic backbone such as those described in JP-A Nos. 59-5240, 59-5241 and 2-226149, and compounds having an amino group such as those described in JP-A No. 1-165613.

More specifically, examples of the monomer or the (co)polymer thereof include unsaturated carboxylic acids (such as acrylic acid, methacrylic acid, itaconic acid, crotonic acid, isocrotonic acid and maleic acid), esters and amides thereof, and (co)polymers thereof. Preferable examples thereof include an ester of an unsaturated carboxylic acid and an aliphatic polyvalent alcohol compound, an amide of an unsaturated carboxylic acid and an aliphatic polyvalent amine compound, and (co)polymers thereof. Furthermore, an adduct of an unsaturated carboxylic acid ester or an amide having a nucleophilic substituent such as a hydroxy group, an amino group or a mercapto group with a monofunctional or multifunctional isocyanate or epoxy; a dehydration condensate of an unsaturated carboxylic acid ester or an amide with a monofunctional or multifunctional carboxylic acid and the like are preferably used. Moreover, an adduct of an unsaturated carboxylic acid ester or amide having an electrophilic substituent such as an isocyanate group or an epoxy group with a monofunctional or multifunctional alcohol, amine or thiol; and a substituted reaction product of an unsaturated carboxylic acid ester or amide having a detachable substituent such as a halogen group or a tosyloxy group with a monofunctional or multifunctional alcohol, amine or thiol are also preferable. Examples thereof further include compounds in which the unsaturated carboxylic acid is replaced with unsaturated phosphonic acid, styrene, vinyl ether or the like.

Specific examples thereof that can be used in the invention include compounds such as those described in paragraphs [0095] to [0108] of JP-A No. 2009-288705.

The polymerizable monomer is preferably a compound which has at least one addition-polymerizable ethylenically unsaturated group and which has a boiling point of 100° C. or higher at atmospheric pressure. Examples of the compound include a monofunctional acrylate or methacrylate such as polyethylene glycol mono(meth)acrylate, polypropylene glycol mono(meth)acrylate or phenoxyethyl (meth)acrylate; polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol (meth)acrylate, trimethylolpropane tri(acryloyloxypropyl)ether, tri(acryloyloxyethyl)isocyanurate; a compound formed by adding ethyleneoxide or propyleneoxide to a polyfunctional alcohol such as glycerin or trimethylolethane and (meth)acrylating the resultant adduct; urethane acrylates such as those described in JP-B Nos. 48-41708 and 50-6034 and JP-A No. 51-37193; polyester acrylates such as those described in JP-A No. 48-64183 and JP-B Nos. 49-43191 and 52-30490; and polyfunctional acrylates or methacrylates such as epoxy (meth)acrylates formed by reaction of an epoxy resin and (meth)acrylic acid; and mixtures thereof.

Examples of the compound which has at least one addition-polymerizable ethylenically unsaturated group and which has a boiling point of 100° C. or higher at atmospheric pressure also include compounds such as those described in paragraphs [0254] to [0257] of JP-A No. 2008-292970.

In addition to the above, radical polymerizable monomers represented by the following Formulae (MO-1) to (MO-5) can be suitably used. In Formulae (MO-1) to (MO-5), when T represents an oxyalkylene group, the carbon terminal (rather than the oxygen terminal) of the oxyalkylene group combines with R.

(MO-1)

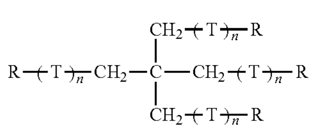

(MO-2)

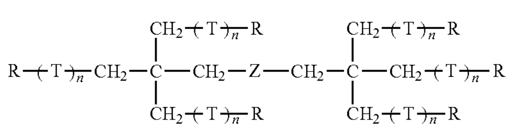

(MO-3)

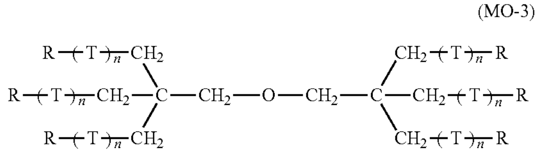

-continued (MO-4)

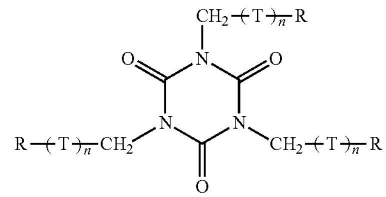

(MO-5)

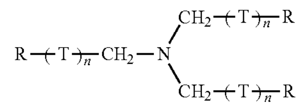

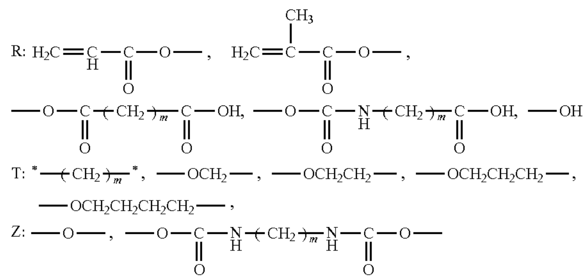

In Formulae (MO-1) to (MO-5), n represents an integer of from 0 to 14 and m represents an integer of from 1 to 8. Each R present in a molecule may be the same as or different from one another. Each T in a molecule may be the same as or different from one another.

In the radical polymerizable monomers represented by Formulae (MO-1) to (MO-5), at least one of R represents —OC(═O)CH═$CH_2$ or —OC(═O)C(CH3)═$CH_2$.

Specific examples of the radical polymerizable monomers represented by Formulae (MO-1) to (MO-5) that can be suitably used in the invention include compounds such as those described in paragraphs [0248] to [0251] of JP-A No. 2007-269779.

Details of how to use these polymerizable compounds, such as what structure is used, whether they are used alone or in combination, or what amount is added, may be freely determined depending on the desired performance of the colored curable composition. For example, they may be selected from the following viewpoints.

In view of sensitivity, the polymerizable compound preferably has a structure having a higher content of unsaturated groups per molecule, and bifunctional or higher functional structures are preferable in many cases. In order to increase the strength of an image area (cured film in an image area), the polymerizable compound preferably has a tri- or higher-functional structure. A method of using a combination of compounds having different numbers of functional groups and/or different types of polymerizable groups (for example, compounds selected from an acrylic ester, a methacrylic ester, a styrene compound, and a vinyl ether compound) is also effective for regulating both of sensitivity and strength. Furthermore, selection and usage mode of the polymerizable compound are also important factors affecting compatibility with other components (for example, a photopolymerization initiator, a colorant such as a pigment, or a binder polymer) contained in the colored curable composition. For example, compatibility may be improved by using a low-purity compound or by using two or more kinds of polymerizable compounds in combination. Further, a specific structure may be selected in order to improve adhesiveness to a hard surface of a substrate.

The content of the polymerizable compound (total content in case of two or more polymerizable compounds being used) in the total solid content of the colored curable composition is not specifically limited, and is preferably from 10% by mass to 80% by mass, more preferably from 15% by mass to 75% by mass, and still more preferably from 20% by mass to 60% by mass in order to obtain the effect of the invention more effectively.

Photopolymerization Initiator

The colored curable composition according to the invention may include a photopolymerization initiator.

The photopolymerization initiator is not specifically limited as long it may polymerize the polymerizable compound mentioned above, and is preferably selected in view of property, initiation efficiency, absorption wavelength, availability, cost and the like.

Examples of the photopolymerization initiator include at least one active halogen compound selected from halomethyloxadiazole compounds and halomethyl-s-triazine compounds; 3-aryl-substituted coumarin compounds; lophine dimmers; benzophenone compounds; acetophenone compounds and derivatives thereof; cyclopentadiene-benzene-iron complexes and salts thereof; and oxime compounds. Specific examples of the photopolymerization initiator include those described in the paragraphs [0070] to [0077] of JP-A No. 2004-295116. Among these, oxime compounds are preferable in view of rapid polymerization reaction and the like.

Examples of the oxime compound (hereinbelow also referred to as "oxime photopolymerization initiator") is not specifically limited, and specific examples thereof include oxime compounds described in, for example, JP-A No. 2000-80068, WO02/100903A1, and JP-A No. 2001-233842.

Specific examples of the oxime compounds include, but are not limited to, 2-(O-benzoyloxime)-1-[4-(phenylthio)phenyl]-1,2-butanedione, 2-(O-benzoyloxime)-1-[4-(phenylthio)phenyl]-1,2-pentanedione, 2-(O-benzoyloxime)-1-[4-(phenylthio)phenyl]-1,2-hexanedione, 2-(O-benzoyloxime)-1-[4-(phenylthio)phenyl]-1,2-heptanedione, 2-(O-benzoyloxime)-1-[4-(phenylthio)phenyl]-1,2-octanedione, 2-(O-benzoyloxime)-1-[4-(methylphenylthio)phenyl]-1,2-butanedione, 2-(O-benzoyloxime)-1-[4-(ethylphenylthio)phenyl]-1,2-butanedione, 2-(O-benzoyloxime)-1-[4-(butylphenylthio)phenyl]-1,2-butanedione, 1-(O-acetyloxime)-1-[9-ethyl-6-(2-methylbenzoyl)-9H-carbazol-3-yl]ethanone, 1-(O-acetyloxime)-1-[9-methyl-6-(2-methylbenzoyl)-9H-carbazol-3-yl]ethanone, 1-(O-acetyloxime)-1-[9-propyl-6-(2-methylbenzoyl)-9H-carbazol-3-yl]ethanone, 1-(O-acetyloxime)-1-[9-ethyl-6-(2-ethylbenzoyl)-9H-carbazol-3-yl]ethanone and 1-(O-acetyloxime)-1-[9-ethyl-6-(2-butylbenzoyl)-9H-carbazol-3-yl]ethanone.

Among these, oxime-O-acyl compounds including 2-(O-benzoyloxime)-1-[4-(phenylthio)phenyl]-1,2-octanedione and 1-(O-acetyloxime)-1-[9-ethyl-6-(2-methylbenzoyl)-9H-carbazol-3-yl]ethanone are preferable in view of that a pattern having a good shape (specifically, a rectangle shape of a pattern in case of a solid-state image sensor) may be obtained with smaller amount of exposure. Specific examples thereof include CGI-124 and CGI-242 (trade names, manufactured by BASF Japan Ltd.).

In the invention, the compound represented by the following Formulae (P) and (Q) are preferable as the oxime compound in view of sensitivity, stability over time and coloring during post-heating.

(P)

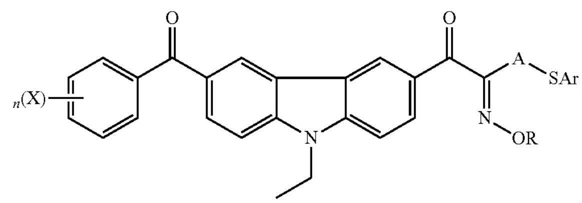

(Q)

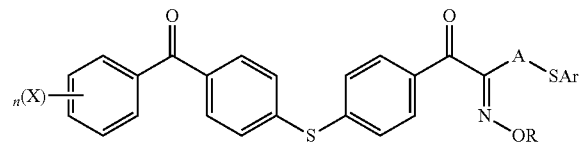

In Formulae (P) and (Q), R and X each independently represent a monovalent substituent, A represents a bivalent organic group, Ar represents an aryl group, and n represents an integer of from 1 to 5.

R Formulae (P) and (Q) preferably represents an acyl group in order to improve sensitivity. Specifically, R preferably represents an acetyl group, a propionyl group, a benzoyl group or a toluoyl group.

A in Formulae (P) and (Q) preferably represents an unsubstituted alkylene group, an alkylene group substituted by an alkyl group (such as a methyl group, an ethyl group, a tert-butyl group or a dodecyl group), an alkylene group substituted by an alkenyl group (such as a vinyl group or an allyl group), or an alkylene group substituted by an aryl group (such as a phenyl group, a p-tolyl group, a xylyl group, a cumenyl group, a naphthyl group, an anthryl group, a phenanthryl group or a styryl group), in order to improve sensitivity and suppress coloring by heating or storing over time.

Ar in Formulae (P) and (Q) preferably represents a substituted or unsubstituted phenyl group in order to improve sensitivity and suppress coloring by heating or storing over time. In case of the substituted phenyl group, preferable examples of the substituent include halogen groups such as a fluorine atom, a chlorine atom, a bromine atom and an iodine atom.

X in Formulae (P) and (Q) preferably represents an alkyl group which may have a substituent, an aryl group which may have a substituent, an alkenyl group which may have a substituent, an alkynyl group which may have a substituent, an alkoxy group which may have a substituent, an aryloxy group which may have a substituent, an alkylthioxy group which may have a substituent, an arylthioxy group which may have a substituent or an amino group which may have a substituent, in order to improve solubility in solvents and improve absorption efficiency in a long wavelength region.

In Formula (P), n preferably represents an integer of 1 or 2.

Hereinbelow specific examples of the compound represented by Formula (P) or Formula (Q) are shown, but the invention is not particularly limited to these examples.

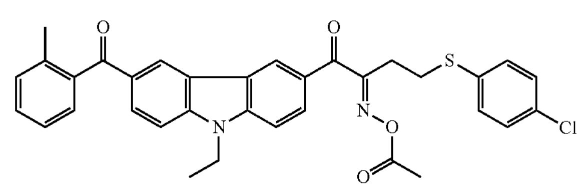

-continued

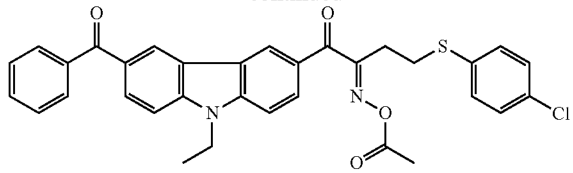

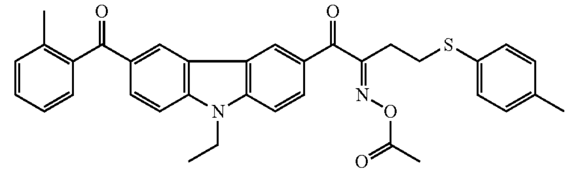

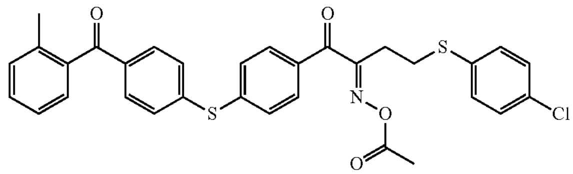

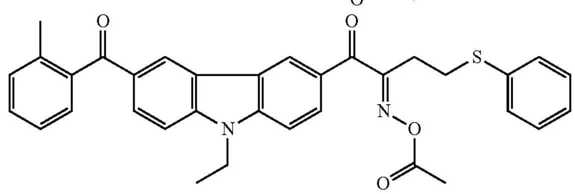

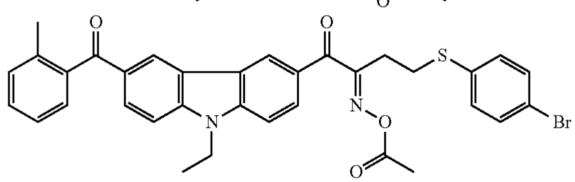

Besides the above-mentioned photopolymerization initiators, other known photopolymerization initiators described in the paragraph [0079] of JP-A No. 2004-295116 may be used for the colored curable composition according to the invention.

The photopolymerization initiator may be used singly or in combination of two or more kinds thereof. The content of the photopolymerization initiator (total content in case of two or more photopolymerization initiators being used) in the total solid components of the colored curable composition is preferably from 3% by mass to 20% by mass, more preferably from 4% by mass to 19% by mass, and still more preferably from 5% by mass to 18% by mass, in order to obtain the effect of the invention more effectively.

Organic Solvent

The colored curable composition according to the invention may include an organic solvent.

The organic solvent is not specifically limited so long as it may satisfy the solubility of the components existing together and the coating property of the colored curable composition, and is preferably selected in view of solubility of the binder, coating property and safety.

Examples of the organic solvent include esters including ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate and ethyl lactate; oxyacetate alkyl esters such as methyl oxyacetate, ethyl oxyacetate or butyl oxyacetate (specifically, methyl methoxyacetate, ethyl methoxyacetate, butyl methoxyacetate, methyl ethoxyacetate or ethyl ethoxyacetate); 3-oxypropionic acid alkyl esters such as methyl 3-oxypropionate or ethyl 3-oxypropionate (specifically, methyl 3-methoxypropionate, ethyl 3-methoxypropionate, methyl 3-ethoxypropionate or ethyl 3-ethoxypropionate); 2-oxypropionic acid alkyl esters such as methyl 2-oxypropionate, ethyl 2-oxypropionate or propyl 2-oxypropionate (specifically, methyl 2-methoxypropionate, ethyl 2-methoxypropionate, propyl 2-methoxypropionate, methyl 2-ethoxypropionate or ethyl 2-ethoxypropionate), methyl 2-oxy-2-methylpropionate or ethyl 2-oxy-2-methylpropionate (specifically, methyl 2-methoxy-2-methylpropionate or ethyl 2-ethoxy-2-methylpropionate); and methyl pyruvate, ethyl pyruvate, propyl pyruvate, methyl acetoacetate, ethyl acetoacetate, methyl 2-oxobutanate, and ethyl 2-oxobutanate.

Examples of the organic solvent include ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene'glycol monomethyl ether acetate, propylene glycol monoethyl ether acetate or propylene glycol monopropyl ether acetate.

Examples of the organic solvent include ketones such as methyl ethyl ketone, cyclohexanone, 2-heptanone or 3-heptanone.

Examples of the organic solvent include aromatic hydrocarbons such as toluene or xylene.

It is also preferable that two or more kinds of these organic solvents are used as a mixture in view of the solubility of the each components described above, and when an alkali soluble binder is included, in view of the solubility of the binder, improvement of the state of the surface to be coated, and the like. In this case, it is preferable to use a mixed solution of two or more kinds selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether and propylene glycol methyl ether acetate.

The content of the organic solvent in the colored curable composition is adjusted such that the concentration of the total solid content of the composition is preferably from 10% by mass to 80% by mass, more preferably from 15% by mass to 60% by mass.

Other Components

In addition to the above-mentioned components, the colored curable composition according to the invention may further include other components such as an alkali-soluble binder o a crosslinking agent to the extent that the effect of the invention is not deteriorated.

Alkali-Soluble Binder

The alkali-soluble binder is not specifically limited so long as it has alkali solubility, and may be preferably selected in view of heat resistance, developing property, availability and the like.

Preferable examples of the alkali-soluble binder include a linear organic high-molecular polymer that may be dissolved in an organic solvent and may be developed by a weak alkali aqueous solution. Examples of such linear organic high-molecular polymer include a polymer having a carboxylic acid at a side chain thereof such as a methacrylic acid copolymer, an acrylic acid copolymer, an itaconic acid copolymer, a crotonic acid copolymer, a maleic acid copolymer or a partially-esterified maleic acid copolymer as described in JP-A No. 59-44615, JP-B Nos. 54-34327, 58-12577 and 54-25957 and JP-A Nos. 59-53836 and 59-71048. An acidic cellulose derivative having a carboxylic acid at side chain thereof is also useful. Furthermore, a polymer obtained by polymerizing a compound having a specific structure such as a ether dimer of a 2-(hydroxyalkyl)acrylic ester (for example, a compound described in JP-A No. 2004-300203) is useful.

Examples of the alkali-soluble binder that can be used in the invention further includes an adducts of a polymers having hydroxy groups with acid anhydrides, polyhydroxystyrene resins, polysiloxane resins, poly(2-hydroxyethyl(meth) acrylate), polyvinyl pyrrolidone, polyethylene oxides and polyvinyl alcohols. The linear organic high-molecular polymer may be a copolymer with a hydrophilic monomer. Examples thereof include alkoxyalkyl(meth)acrylates, hydroxyalkyl(meth)acrylates, glycerol (meth)acrylates, (meth)acrylamides, N-methylolacrylamides, secondary or tertiary alkylacrylamides, dialkylaminoalkyl(meth)acrylates, morpholine (meth)acrylates, vinylpyrrolidone, vinyltriazole, methyl(meth)acrylates, ethyl(meth)acrylates, branched or straight-chain propyl(meth)acrylates, branched or straight-chain butyl (meth)acrylates, and phenoxyhydroxy propyl (meth)acrylates. Other examples of the hydrophilic monomer include monomers having a tetrahydrofurfuryl group, a phosphoric acid group, a phosphoric acid ester group, a quaternary ammonium salt group, an ethyleneoxy chain, a propyleneoxy chain, a sulfonic acid group or a group derived from a salt thereof, or a morpholinoethyl group.

The alkali-soluble binder may have a polymerizable group at a side chain thereof in order to improve crosslinking efficiency. For example, polymers having an allyl group, a (meth) acryl group or an allyloxyalkyl group at a side chain thereof are useful. Examples of the polymer having a polymerizable group include commercial products including KS RESIST-106 (trade name, manufactured by Osaka Organic Chemical Industry Ltd.) and CYCLOMER-P series (trade names, manufactured by Daicel Chemical Industries, Ltd.). In order to improve strength of cured films, alcohol soluble nylons and a polyether of 2,2-bis-(4-hydroxyphenyl)propane and epichlorohydrin are also useful.

Among these various alkali-soluble binders, polyhydroxystyrene resins, polysiloxane resins, acrylic resins, acrylamide resins and acryl-acrylamide copolymer resins are preferable in view of heat resistance, and acrylic resins, acrylamide resins and acryl-acrylamide copolymer resins are preferable in order to control developing property.

Preferable examples of the acrylic resin include copolymers formed with monomers selected from benzyl (meth) acrylate, (meth) acrylic acid, hydroxyethyl (meth)acrylate, (meth)acrylamide and the like, and commercial products such as KS RESIST-106 (trade name, manufactured by Osaka Organic Chemical Industry Ltd.) and CYCLOMER-P series (trade names, manufactured by Daicel Chemical Industries, Ltd.).

The alkali-soluble binder is a polymer having a weight average molecular weight (polystyrene-converted value measured by GPC) of preferably 1,000 to $2\times10^5$, more preferably 2,000 to $1\times10^5$, and specifically preferably 5,000 to $5\times10^4$, in view of developing property, liquid viscosity and the like.

Crosslinking Agent

The hardness of the colored cured film formed by curing the colored curable composition may further be improved by supplementarily using a crosslinking agent in the colored curable composition according to the invention.

The crosslinking agent is not specifically limited so long as it may cure a film by crosslinking reaction, and examples thereof include (a) an epoxy resin, (b) a melamine compound, a guanamine compound, a glycoluril compound or an urea compound substituted by at least one substituent selected from a methylol group, an alkoxymethyl group and an acyloxymethyl group, and (c) a phenol compound, a naphthol compound or a hydroxyanthracene compound substituted by at least one substituent selected from a methylol group, an alkoxymethyl group and an acyloxymethyl group. Among these, multifunctional epoxy resins are preferable.

With respect to the details of the specific examples of the crosslinking agent, the description on the paragraphs [0134] to [0147] of JP-A No. 2004-295116 may be referred.

Polymerization Inhibitor

It is preferable that the colored curable composition according to the invention includes a small amount of a heat polymerization inhibitor in order to prevent unnecessary heat polymerization of the polymerizable compound during manufacture or storage of the colored curable composition.

Examples of the polymerization inhibitor that can be used in the invention include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butyl phenol), and N-nitrosophenylhydroxyamine primary cerium salt.

The addition amount of the polymerization inhibitor is preferably from about 0.01% by mass to about 5% by mass with respect to the total mass of the colored curable composition.

Surfactant

The colored curable composition according to the invention may contain a surfactant in order to improve the coatability. Examples of the surfactant that can be used in the invention include various surfactants such as a fluorine-containing surfactant, a nonionic surfactant, a cationic surfactant, an anionic surfactant, and a silicone surfactant.

In particular, when the colored curable composition according to the invention contains a fluorine-containing surfactant, the liquid properties (in particular, fluidity) of the composition prepared as a coating liquid are improved, whereby the uniformity of the coating thickness and the liquid saving can be improved.

That is, when a colored curable composition including a fluorine-containing surfactant is used as a coating liquid to form a film, the wettability on the surface to be coated is improved due to decrease in the surface tension between the surface to be coated and the coating liquid, thereby improving the coatability on the surface to be coated. As a result, even when a thin film of several to several tens micrometers is formed with a small amount of the liquid, a film with uniform thickness may be suitably formed.

The fluorine content in the fluorine-containing surfactant is preferably from 3% by mass to 40% by mass, more preferably from 5% by mass to 30% by mass, and still more preferably from 7% by mass to 25% by mass. When the fluorine content of the fluorine-containing surfactant is within the above range, it is effective in terms of the uniformity of the coating film thickness and the liquid saving, and excellent solubility in the colored curable composition can be achieved.

Examples of the fluorine-containing surfactant include MEGAFAC F171, F172, F173, F176, F177, F141, F142, F143, F144, R30, F437, F475, F479, F482, F554, F780 and F781 (trade names, manufactured by DIC Corporation), FLUORAD FC430, FC431 and FC171 (trade names, manufactured by Sumitomo 3M Limited), SURFLON S-382, SC-101, SC-103, SC-104, SC-105, SC1068, SC-381, SC-383, 5393 and KH-40 (trade names manufactured by Asahi Glass Co., Ltd.), and SOLSPERSE 2000, (trade name, available form Lubrizol Japan Ltd.).

Examples of the cationic surfactant include a phthalocyanine derivative such as EFKA-745 (trade name, manufactured by Morishita & Co., Ltd.), an organosiloxane polymer such as KP341 (trade name, manufactured by Shin-Etsu Chemical Co., Ltd.), a (meth)acrylic acid based (co)polymer such as POLYFLOW No. 75, No. 90, No. 95 (trade names, manufactured by Kyoeisha Chemical Co., Ltd.), or W001 (trade name, available from Yusho Co., Ltd.).

Examples of the nonionic surfactant include polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, and sorbitan fatty acid ester such as PLURONIC L10, L31, L61, L62, 10R5, 17R2 and 25R2, and TETRONIC 304, 701, 704, 901, 904 and 150R1 (trade names, manufactured by BASF Japan Ltd.).

Examples of the anionic surfactant include W004, W005 and W017 (trade names, available from Yusho Co., Ltd.).

Examples of the silicone surfactant include TORAY SILICONE DC3PA, SH7PA, DC11PA, SH21PA, SH28PA, SH29PA, SH30PA and SH8400 (trade names, manufactured by Dow Corning Toray Co., Ltd.), TSF 44 60 and 4452 (trade names, manufactured by Momentive Performance Materials Inc.), KP341 (trade name, manufactured by Shin-Etsu Chemical Co., Ltd.), and BYK323 and 330 (trade names, manufactured by BYK Chemie).

The surfactant may be used singly or in combination of two or more kinds thereof.

The additive amount of the surfactant is preferably form 0.001% by mass to 2.0% by mass, and more preferably from 0.005% by mass to 1.0% by mass, with respect to the total mass of the colored curable composition.

Other Additives

As necessary, the colored curable composition may include various additives such as fillers, adhesion accelerating agents, antioxidants, ultraviolet absorbers or aggregation preventing agents. Examples of these additives include those described in the paragraphs [0155] to [0156] of JP-A No. 2004-295116 may be exemplified.

Further, the colored curable composition according to the invention may include a sensitizer or a light stabilizer such as those described in the paragraph [0078] of JP-A No. 2004-295116 or a heat polymerization inhibitor such as those described in the paragraph [0081] of JP-A No. 2004-295116.

In order to accelerate the alkali solubility of non-exposed areas and to further improve the developability of the colored curable composition, an organic carboxylic acid, preferably an organic carboxylic acid having a molecular weight of 1000 or less, may be added to the composition.

Specific examples of the organic carboxylic acid having a molecular weight of 1000 or less include aliphatic monocarboxylic acids such as formic acid, acetic acid, propionic acid, butyric acid, valeric acid, pivalic acid, caproic acid, diethyl acetate, enanthic acid or capric acid; aliphatic dicarboxylic acids such as oxalic acid, malonic acid, succinic acid, glutaric acid, adipic acid, pimelic acid, suberic acid, azelaic acid, sebacic acid, brassylic acid, methyl malonic acid, ethyl malonic acid, dimethyl malonic acid, methyl succinic acid, tetramethyl succinic acid or citraconic acid; aliphatic tricarboxylic acids such as tricarballylic acid, aconitic acid or camphoronic acid; aromatic monocarboxylic acids such as benzoic acid, toluic acid, cuminic acid, hemellitic acid or mesitylenic acid; aromatic polycarboxylic acids such as phthalic acid, isophthalic acid, terephthalic acid, trimellitic acid, trimesic acid, mellophanic acid or pyromellitic acid; and other carboxylic acids such as phenyl acetic acid, hydroatropic acid, hydrocinnamic acid, mandelic acid, phenylsuccinic acid, atropic acid, cinnamic acid, methyl cinnamate, benzyl cinnamate, cinnamylidene acetic acid, coumaric acid or umbellic acid.

Preparation Method of Colored Curable Composition

The colored curable composition according to the invention is prepared by mixing the above-mentioned components.

During the preparation of the colored curable composition, the components for the colored curable composition may be mixed at one time, or each of the components may be dissolved or dispersed in a solvent and then mixed successively. The order of addition during mixing and the operation condition are not specifically limited. For example, the composition may be prepared by simultaneously dissolving or dispersing all components in a solvent, or when needed, the components may be suitably prepared into two or more solutions or dispersion liquids that are mixed before use (at the time of coating) to prepare a composition.

The colored curable composition prepared as above may be filtered using a filter or the like having a pore diameter of preferably from about 0.01 μm to about 3.0 μm, more preferably from about 0.05 μm to about 0.5 μm, and subjected to use.

Since the colored curable composition according to the invention has excellent storage stability, and may form colored cured films having excellent light fastness, it may be used for forming colored pixels for color filters used for liquid crystal display devices (LCD) or solid-state image sensors (e.g., CCD, CMOS and the like), and for use in preparation of print ink, inkjet ink, paint and the like. Specifically, it may be used for forming colored pixels for solid-state image sensors including CCD and CMOS.

Color Filter and Production Method Therefor

Hereinbelow, a method for producing a color filter using the colored curable composition according to the invention (method for producing the color filter according to the invention) is explained.

In the method for producing the color filter according to the invention, the colored curable composition according to the invention as mentioned above is first applied onto a support by a coating process such as spin coating, casting coating, roll coating or the like to form a colored curable composition layer, and when needed, subjected to preliminary curing (pre-baking) to dry the colored curable composition layer (coating step).

Examples of the support used for the production method of the color filter according to the invention include soda glass, borosilicate glass (PYREX (registered trade name) glass) and quartz glass used for liquid crystal display devices and the like, and those glass materials on which a transparent electroconductive film has been adhered, photoelectronic conversion device substrates used for solid-state image sensors such as silicon substrates, and complementary metal oxide film semiconductor (CMOS) substrates. Black stripes for separating pixels may be formed on these substrates. When needed, an undercoat layer may be formed on these supports in order to improve adhesion to the upper layer, prevent diffusion of the materials, or planarize the surface.

When the colored curable composition is spin-coated on the support, the colored curable composition may conform well to the support by adding dropwise a suitable organic solvent and rotating prior to dropwise addition of the colored curable composition so as to decrease the amount of the liquid to be added dropwise.

In the coating process of the colored curable composition according to the invention, for example, even when the colored curable composition adheres to the nozzle of the ejection portion of the coating apparatus, the piping portion of the coating apparatus, or the inside of the coating apparatus, the colored curable composition can be easily cleaned and removed using a known cleaning liquid. In this case, in order to perform the cleaning and removal more efficiently, it is preferable to use the solvent described above as a solvent contained in the colored curable composition according to the invention as a cleaning liquid.

Further, cleaning liquids as recited in JP-A Nos. 7-128867, 7-146562, 8-278637, 2000-273370, 2006-85140, 2006-291191, 2007-2101, 2007-2102, and 2007-281523 can also be suitably used as a cleaning liquid for cleaning and removing the colored curable composition according to the invention.

The cleaning liquid is preferably an alkylene glycol monoalkyl ether carboxylate or an alkylene glycol monoalkyl ether.

These solvents that can be used as a cleaning liquid may be used singly or two or more kinds thereof may be used in combination.

When two or more kinds of solvents are used in combination, it is preferable to use a mixed solution of a solvent that has a hydroxy group and a solvent that does not have a hydroxy group. The mass ratio of the solvent that has a hydroxy group and the solvent that does not have a hydroxy group (the solvent that has a hydroxy group/the solvent that does not have a hydroxy group) is from 1/99 to 99/1, preferably from 10/90 to 90/10, and more preferably from 20/80 to 80/20.

The mixed solvent is preferably a mixed solvent of propyleneglycol monomethylether acetate (PGMEA) and propyleneglycol monomethyl ether (PGME) with a mixing ratio of PGMEA/PGME is 60/40.

In order to increase the permeability of the cleaning liquid into the colored curable composition, the cleaning liquid may contain a surfactant such as the above-described surfactant that can be contained in the colored curable composition.

The conditions for the pre-baking may include a condition in which heating is performed using a hot plate or an oven at 70° C. to 130° C. for about 0.5 minute to 15 minutes.

The thickness of the colored curable composition layer formed using the colored curable composition is suitably selected according to the purpose. Generally, the thickness of the colored curable composition layer is preferably from 0.2 μm to 5.0 μm, more preferably from 0.3 μm to 2.5 μm, and still more preferably from 0.3 μm to 1.5 μm. The thickness of the colored curable composition layer as used herein is a film thickness after pre-baking.

Next, in the production method of the color filter according to the invention, the colored curable composition layer formed on the support is exposed via a mask (exposure step).

The light or radiation that may be applied to this exposing is preferably g-ray, h-ray, i-ray, KrF ray or ArF ray, specifically preferably i-ray. When i-ray is used as irradiation light, it is preferable to irradiate at an exposure dose of 100 mJ/cm$^2$ to 10,000 mJ/cm$^2$.

The exposed colored curable composition layer may be heated using a hot plate or an oven at 70° C. to 130° C. for about 0.5 minute to 15 minutes prior to the subsequent developing treatment.

Furthermore, exposing may be performed while nitrogen gas is flowing in a chamber so as to suppress oxidation discoloration of the coloring material in the colored curable composition layer.

Subsequently, the exposed colored curable composition layer is developed using a developer (development step). In this manner, a negative-type or positive-type color pattern (resist pattern) may be formed.

A combination of various organic solvents or an alkaline aqueous solutions may be used as a developer so long as it dissolves uncured parts (unexposed areas) and does not dissolve cured parts (exposed areas) in the colored curable composition layer. When the developer is an alkaline aqueous solution, it is preferable to adjust the alkali concentration to preferably pH 11 to 13, more preferably pH 11.5 to 12.5. Specifically, an alkaline aqueous solution in which the concentration of tetraethylammonium hydroxide has been adjusted to 0.001% by mass to 10% by mass, preferably 0.01% by mass to 5% by mass may be used as a developer.

The developing time is preferably from 30 seconds to 300 seconds, more preferably from 30 seconds to 120 seconds. The developing temperature is preferably 20° C. to 40° C., more preferably 23° C.

Developing may be performed by using a paddle system, a shower system, a spray system or the like.

It is preferable that washing is performed by using water after developing using an alkali aqueous solution. A washing system is also suitably selected according to the purpose, and rinse treatment may be performed by rotating a support such as a silicon wafer at a revolution of 10 rpm to 500 rpm and supplying pure water in shower state from a spray nozzle from the above of the revolution center.

Thereafter, in the production method of the color filter according to the invention, the pattern (resist pattern) formed by developing may be subjected to post-heating and/or post-exposure to accelerate curing of the color pattern when needed (post-curing step).

Post-Exposure by Ultraviolet Radiation Irradiation

In post-exposure by ultraviolet radiation irradiation, the color pattern that has been subjected to a developing treatment as mentioned above is irradiated with ultraviolet light (UV light) having an irradiation light dose [mJ/cm$^2$] of 10 or more times as large as an exposure dose [mJ/cm$^2$] in the exposing treatment prior to the development. By irradiating the developed pattern (the pattern formed using a negative-working curable composition containing a colorant) with ultraviolet light (UV light) for a predetermined time period at between the developing treatment and the heat treatment in the pattern forming step, color transfer during the subsequent heating may be effectively prevented, and light fastness is improved.

As a light source for irradiating ultraviolet light, for example, an ultra high-pressure mercury lamp, a high-pressure mercury lamp, a low-pressure mercury lamp, a DEEP UV lamp or the like may be used. Among these, a light source that irradiates ultraviolet light including light at a wavelength of 275 nm or less, and can irradiate light in which an irradiation illuminance [mW/cm$^2$] of the light at a wavelength of 275 nm or less is 5% or more with respect to the integral irradiation illuminance of the light over the whole wavelengths range of the ultraviolet light is preferable. By adjusting the irradiation illuminance of the light at a wavelength of 275 nm or less in the ultraviolet light to 5% or more, effect of suppressing color transfer to the adjacent pixels and the upper and lower layers and effect of improving light fastness may be further improved.

From these viewpoints, it is preferable that the post-exposure by ultraviolet radiation irradiation is performed by using a light source that differs from the light source (such as i-ray) used in the exposing in the pattern forming step, specifically using a high-pressure mercury lamp, a low-pressure mercury lamp or the like. Among these, for the same reason as mentioned above, the irradiation illuminance [mW/cm$^2$] of the light at a wavelength of 275 nm or less is preferably 7% or more with respect to the integral irradiation illuminance of the light at whole wavelengths in the ultraviolet light. Furthermore, it is desirable that the upper limit of the irradiation illuminance of the light at a wavelength of 275 nm or less is 25% or less.

The integral irradiation illuminance refers to a sum (area) of illuminance of lights of wavelengths included in irradiated light when a curve is drawn by taking an illuminance for every spectral wavelength (radiation energy for passing through a unit area in a unit time period; [mW/m$^2$]) as a vertical axis and the wavelength [nm] of the light as a horizontal axis.

It is preferable that ultraviolet light is irradiated by an irradiation light dose [mJ/cm$^2$] of 10-fold or higher than the exposure dose [mJ/cm$^2$] in the exposure during the pattern forming step. When the irradiated light amount in the post-exposure step is lower than 10-fold the exposure dose in the exposure during the pattern forming step, color transfer to adjacent pixels and to upper and lower layers may not be prevented, and light fastness may be deteriorated.

Among these, the irradiation light dose of ultraviolet light is preferably 12-fold to 200-fold, more preferably 15-fold to 100-fold the exposure dose in the exposure during the pattern forming step.

In this case, the integral irradiation illuminance in the irradiated ultraviolet light is preferably 200 mW/cm$^2$ or more. When the integral irradiation illuminance is 200 mW/cm$^2$ or more, effect of suppressing color transfer to adjacent pixels and upper and lower layers and effect of improving light fastness may be improved more effectively. Among these, the integral irradiation illuminance is preferably from 250 mW/cm$^2$ to 2000 mW/cm$^2$, and more preferably from 300 mW/cm$^2$ to 1000 mW/cm$^2$.

This post-heat treatment is performed preferably at 100° C. to 300° C., more preferably at 150° C. to 250° C. by using, for example, a hot plate or an oven.

The heating time is preferably from 30 seconds to 30,000 seconds, more preferably from 60 seconds to 1,000 seconds.

The post-exposure may be performed by g-ray, h-ray, i-ray, KrF, ArF, UV light, electron beam or X-ray, preferably performed by g-ray, h-ray, i-ray or UV light, and more preferably performed by UV light. The irradiation by UV light (UV cure) is preferably performed at a low temperature such as from 20° C. to 50° C., preferably, from 25° C. to 40° C. It is preferable that the wavelength of UV light includes a wavelength of from 200 nm to 300 nm. As the light source for irradiating UV light, for example, a high-pressure mercury lamp or a low-pressure mercury lamp may be used. The irradiation time may be from 10 seconds to 180 seconds, preferably from 20 seconds to 120 seconds, more preferably from 30 seconds to 60 seconds.

Although either the post-exposure or post-heating may be performed first, it is preferable to perform the post-exposure prior to the post-heating. This is because deformation due to heat sagging and bottom spreading of the color pattern that are observed in the subsequent post-heating step may be prevented due to the acceleration of curing by the post-exposure.

The color pattern thus obtained constitutes pixels of the color filter.

In the preparation of a color filter having pixels of plural hues, the above-mentioned coating, exposure and development steps, and optionally post-curing step, may be repeated according to the desired numbers of colors.

The color filter obtained by the production method of the color filter according to the first aspect of the invention (the color filter according to the first aspect of the invention) is excellent in light fastness since the colored curable composition according to the first aspect of the invention is used.

Therefore, the color filter according to the first aspect of the invention may be used for liquid crystal display devices, and solid-state image sensors including CCD image sensors and CMOS image sensors, and camera systems using them. Among these, it is preferable for use in a solid-state image sensor in which a color pattern with a minute size is formed on a thin film and a good rectangular cross-sectional profile is required, specifically for uses in CCD devices, CMOS and the like having high resolutions of more than 1,000,000 pixels.

Solid-State Image Sensor

The solid-state image sensor according to the first aspect of the invention includes the color filter according to the first aspect of the invention. Since the color filter according to the invention has high light fastness, a solid-state image sensor including this color filter may provide excellent color reproducibility.

The configuration of the solid-state image sensor is not specifically limited so long as it is a configuration that includes the color filter according to the first aspect of the invention and acts as a solid-state image sensor, and examples may include the following configuration.

That is, it is a configuration including a support, plural photodiodes that constitute a light receiving area for a CCD image sensor (solid-state image sensor) and transfer electrodes including polysilicon or the like formed on the support, the color filter according to the first aspect of the invention formed thereon, and a microlense formed thereon.

Furthermore, it is desirable that the camera system including the color filter according to the first aspect of the invention includes a camera lens and an IR cut film that include dichroic-coated cover glass, microlense and the like in view of discoloration property of the coloring material, and that the materials therefor have an optical property to absorb a part or all parts of UV light of 400 nm or less. Furthermore, it is preferable that the structure of the camera system is a structure that decreases oxygen permeability to the color filter so as to suppress oxidation discoloration of the color material. For example, it is preferable that a part or all parts of the camera system is sealed with nitrogen gas.

Liquid Crystal Display Device

The color filter according to the invention can be used for liquid crystal display devices as well as solid-state image sensors. The color filter according to the invention can be suitably used for liquid crystal display devices. In the liquid crystal display device including the color filter according to the invention, which contains a metal complex pigment having excellent spectroscopic properties and heat resistance as a colorant, the orientation defect due to the reduction in specific resistance is suppressed. As a result, images having excellent color can be displayed and excellent display properties can be achieved.

Therefore, the liquid crystal display device having the color filter according to the invention can display high quality images having excellent color and excellent display properties.

Definition and explanation of display devices are given, for example, in "Electronic Display Device" (Akio Sasaki, Kogyo. Chosakai Publishing Co., Ltd., 1990), "Display Device" (Sumiaki Ibuki, Sangyo Tosho Publishing Co., Ltd., 1989) and the like. Liquid crystal display devices are described, for example, in "Next Generation Liquid Crystal Display Techniques" (Tatsuo Uchida, Kogyo Chosakai Publishing Co., Ltd., 1994). Liquid crystal display devices to which the color filter according to the invention may be applied are not particularly limited, and the color filter according to the invention may be used for various liquid crystal display devices such as those described, for example, in "Next Generation Liquid Crystal Display Techniques".

The color filter according to the invention can suitably be used in a color TFT liquid crystal display device. Details of color TFT liquid crystal display devices are described, for example, in "Color TFT Liquid Crystal Display" (Kyoritsu Shuppan Co., Ltd., 1996). Further, the color filter according to the invention may be applied to a liquid crystal display device with a wider view angle such as an in-plane switching (IPS) system or a multi-domain vertical alignment (MVA) system, or STN, TN, VA, OCS, FFS, R-OCB and the like.

The color filter according to the invention may also be applied to a COA (Color-filter On Array) system, which has high brightness and high definition. In the COA type liquid crystal display device, the color filter layer should satisfy the normal requirements mentioned above, and further requirements for an interlayer dielectric film such as low dielectric constant and resistance to a removal liquid. The color filter according to the invention, which is formed using a colorant multimer having exhibits excellent hue, exhibits excellent color purity and light transmittance and has a color pattern (pixels) with excellent color. Therefore, the color filter according to the invention is useful for the COA type liquid crystal display device with high definition and durability. In order to satisfy the requirement of low dielectric constant, a resin coating may be provided on the color filter layer.

These image display systems are described, for example, on page 43 of "EL, PDP, LCD Display—Trends in Techniques and Markets" (Research Study Division of Toray Research Center, Inc., 2001) and the like.

The liquid crystal display device according to the invention includes not only the color filter according to the invention but also various members such as an electrode substrate, a polarization film, a phase difference film, a back light, a spacer, and a view angle compensation film. The color filter according to the invention may be applied to a liquid crystal display device including these various known members.

These members are described, for example, in "'94 Market for Liquid Crystal Display Related Materials and Chemicals" (Kentaro Shima, CMC Publishing CO., LTD., 1994) and "2003 Current State and Outlook for Liquid Crystal Related Markets" (Ryokichi Omote, Fuji Chimera Research Institute, Inc., 2003).

Back lights are described, for example, in SID meeting Digest 1380 (2005) (A. Konno et. al) and Monthly Display, 2005 December, pages 18-24 (Hiroyasu Shima) and pages 25-30 (Takaaki Yagi).

When the color filter according to the invention is used in a liquid crystal display device, high-contrast display may be achieved in combination with a conventionally known three-wavelength cold-cathode tube. Furthermore, by using red, green and blue LED light sources (RGB-LED) as a back light, a liquid crystal display device having high brightness, high color purity, and good color reproducibility may be provided.

As described above, according to the present invention, a red to purple colorant for chromatic compensation having excellent spectroscopic properties, heat resistance, and light fastness, which contains a colorant multimer that includes, as a partial structure of a colorant moiety, a dipyrromethene metal complex compound or tautomer thereof obtained from a dipyrromethene compound and a metal or a metal compound, can be obtained. Furthermore, according to the present invention, the colored curable composition in which color mixing during the color filter manufacturing process is suppressed can be obtained. That is, a colored cured film obtained using the colored curable composition exhibit excellent solvent resistance and excellent resistance against color transfer during curing with heat. As a result, problems that have not been solved with a color resist using the conventional dye for chromatic compensation may be solved. Therefore, the colorant multimer of the invention is particularly useful for a color filter used in solid-state image sensors or display devices (such as liquid crystal display device and organic EL display devices).

The Second Aspect of the Invention

Hereinbelow, a colored curable composition, a color resist, a color filter, a method of manufacturing the color filter, a solid-state image sensor and an image display device according to the second aspect of the invention are described in detail. Although the explanation of the constituent features described hereinbelow are made based on representative embodiments of the present invention, the present invention is not limited thereto. Further, the numeral range expressed by using "-" in the present specification represents a range including the numerical values described in front of and behind "-", as the minimum value and the maximum value.

Colored Curable Composition

The colored curable composition according to the second aspect of the invention includes at least one (A) colorant multimer including a polymerizable group and a group derived from at least one of an azo colorant or a dipyrromethene colorant, and at least one (B) polymerizable compound.

The colored curable composition according to the second aspect of the invention is characterized by being cured with heat, light, or the both of them. The colored curable composition preferably contains (C) a polymerization initiator and (D) a solvent. As necessary, the colored curable composition may further contain other components such as a binder or a cross-linking agent.

(A) Colorant Multimer

The colored curable composition according to the second aspect of the invention contains at least one type of colorant multimer including a polymerizable group and a group derived from at least one of an azo colorant or a dipyrromethene colorant (hereinafter, may be simply referred to as a "colorant multimer containing a polymerizable group"). The colorant multimer containing a polymerizable group functions, for example, as a colorant in the colored curable composition according to the invention.

Since the colorant multimer of the second aspect of the invention is a colorant multimer including a group derived from at least one of an azo colorant or a dipyrromethene colorant, the colorant multimer has excellent color purity and high absorption coefficient. Therefore, a cured film having excellent color purity can be formed using the colored curable composition according to the invention, even when the film is formed as a thin layer.

The colorant multimer containing a polymerizable group may contain a single kind of the group derived from at least one of an azo colorant or a dipyrromethene colorant, or may contain two or more kinds thereof.

Further, since the colorant multimer containing a polymerizable group include a polymerizable group, a cured film having excellent light fastness, heat resistance and solvent resistance, reduced color transfer, and favorable pattern formability can be obtained using the colored curable composition according to the invention, even when the film is formed as a thin layer.

The colorant multimer containing a polymerizable group may contain a single kind of the polymerizable group, or may contain two or more kinds thereof.

Examples of the polymerizable group include an ethylenically unsaturated group (such as a methacrylic acid group, an acrylic acid group or a styryl group), a cyclic ether group (such as an epoxy group or an oxetanyl group). Among these, an ethylenically unsaturated group is preferable in view of the heat resistance and solvent resistance after polymerization.

The colorant multimer containing a polymerizable group preferably contains, as a repeating unit, a constituent unit including a polymerizable group and a constituent unit including a group derived from at lest one of an azo colorant or a dipyrromethene colorant (hereinafter, may be simply referred to as a "constituent unit having a group derived from a colorant").

Further, the colorant multimer containing a polymerizable group may include an additional constituent unit other than the constituent unit having a polymerizable group and the constituent unit having a group derived from a colorant.

The colorant multimer containing a polymerizable group contains the constituent unit having a group derived from a colorant preferably at the mass ratio of from 60% by mass to 99% by mass, more preferably from 70% by mass to 97% by mass, and still more preferably from 80% by mass to 95% by mass, in order to form a thin color filter.

In view of heat resistance and solvent resistance, the colorant multimer containing a polymerizable group contains the constituent unit having a polymerizable group preferably at the mass ratio of from 1% by mass to 40% by mass, more preferably from 3% by mass to 30% by mass, and still more preferably from 5% by mass to 20% by mass.

A constituent unit having a group derived from the colorant can be introduced into the colorant multimer containing a polymerizable group by, for example, radical-polymerizing a colorant compound obtained by introducing a polymerizable group (such as an acryloxy group, a methacryloxy group or a styryl group) into an azo colorant skeleton or a dipyrromethene colorant skeleton. Further, a constituent unit having a group derived from the colorant can be introduced into the colorant multimer containing a polymerizable group by reacting a colorant compound, in which a group for polycondensation or polyaddition reaction is introduced into an azo colorant skeleton or a dipyrromethene colorant skeleton, with a polyfunctional cross-linking agent.

The constituent unit having the polymerizable group can be introduced into the colorant multimer containing a polymerizable group, for example, by the following method.

For example, the constituent unit having the polymerizable group can be introduced into the colorant multimer containing a polymerizable group by a method, in which the colorant compound is copolymerized with a copolymerization component (such as methacrylic acid, acrylic acid or hydroxyethyl methacrylate) which does not have a colorant skeleton to form a multimer, and then a polymerizable compound (such as a glycidyl methacrylate or a methacryloxy ethyl isocyanate) having a group that can react with the constituent unit derived from the copolymerization component is added to the multimer.

When the colorant compound has a reactive group, a constituent unit that serves as both a constituting unit having a polymerizable group and a constituting unit having a group derived from a colorant can be obtained by reacting the colorant compound with a polymerizable compound having a group that can react with the constituent unit having a group derived from a colorant.

Alternatively, the colorant multimer containing a polymerizable group can be obtained by a method, in which a polymerizable group other than the polymerizable group relating to the multimerization of a colorant compound is introduced into the azo colorant skeleton or the dipyrromethene colorant skeleton of the colorant compound, and then the colorant compound is polymerized.

Furthermore, the constituent unit having a polymerizable group can be obtained by polymerization of a colorant compound to which a precursor of the polymerizable group has been introduced, or a copolymerization component which does not have a colorant skeleton, and thereafter conducting various reactions (such as a treatment with an alkaline solution) to form a polymerizable group from the precursor of the polymerizable group.

Hereinbelow, the azo colorant and dipyrromethene colorant, the constituent unit including a group derived from the colorant, and the constituent unit including a polymerizable group are explained in detail.

(1) Azo Colorant and Dipyrromethene Colorant

The azo colorant and the dipyrromethene colorant are not specifically limited, and preferable examples thereof include the following azo colorant and dipyrromethene colorant, respectively.

(1-1) Dipyrromethene Colorant

The dipyrromethene colorant obtained by coordinating a compound represented by Formula (N) to a metal or a metal compound is preferably used in view of light fastness and heat resistance.

Formula (N)

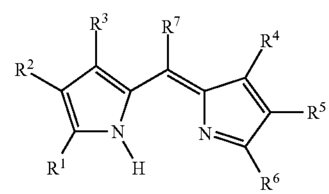

In Formula (N), $R^1$ to $R^6$ each independently represent a hydrogen atom or a monovalent substituent; and $R^7$ represents a hydrogen atom, a halogen atom, an alkyl group, an aryl group or a heterocyclic group.

$R^1$ to $R^6$ each independently represent a hydrogen atom or a monovalent substituent. Examples of the monovalent substituent include a halogen atom (such as a fluorine atom, a chlorine atom or a bromine atom), an alkyl group (a straight-chain, branched-chain or cyclic alkyl group having preferably 1 to 48, more preferably 1 to 24 carbon atoms, such as a methyl group, an ethyl group, a propyl group, an isopropyl group, a butyl group, a t-butyl group, a pentyl group, a hexyl group, a heptyl group, an octyl group, a 2-ethylhexyl group, a dodecyl group, a hexadecyl group, a cyclopropyl group, a cyclopentyl group, a cyclohexyl group, a 1-norbornyl group or a 1-adamantyl group), an alkenyl group (an alkenyl group having preferably 2 to 48, more preferably 2 to 18 carbon atoms, such as a vinyl group, an allyl group or a 3-buten-1-yl group), an aryl group (an aryl group having preferably 6 to 48, more preferably 6 to 24 carbon atoms, such as a phenyl group or a naphthyl group), a heterocyclic group (a heterocyclic group having preferably 1 to 32, more preferably 1 to 18 carbon atoms, such as a 2-thienyl group, a 4-pyridyl group, a 2-furyl group, a 2-pyrimidinyl group, a 1-pyridyl group, a 2-benzothiazolyl group, a 1-imidazolyl group, a 1-pyrazolyl group or a benzotriazol-1-yl group), a silyl group (a silyl group having preferably 3 to 38, more preferably 3 to 18 carbon atoms, such as a trimethylsilyl group, a triethylsilyl group, a tributylsilyl group, a t-butyldimethylsilyl group or a t-hexyldimethylsilyl group), a hydroxy group, a cyano group, a nitro group, an alkoxy group (an alkoxy group having preferably 1 to 48, more preferably 1 to 24 carbon atoms, such as a methoxy group, an ethoxy group, a 1-butoxy group, a 2-butoxy group, an isopropoxy group, a t-butoxy group, a dodecyloxy group, or cycloalkyloxy groups including a cyclopentyloxy group and a cyclohexyloxy group), an aryloxy group (an aryloxy group having preferably 6 to 48, more preferably 6 to 24 carbon atoms, such as a phenoxy group or a 1-naphthoxy group), a heterocyclic oxy group (a heterocyclic oxy group having preferably 1 to 32, more preferably 1 to 18 carbon atoms, such as a 1-phenyltetrazole-5-oxy group or a 2-tetrahydropyranyloxy group), a silyloxy group (a silyloxy group having preferably 1 to 32, more preferably 1 to 18 carbon atoms, such as a trimethylsilyloxy group, a t-butyldimethylsilyloxy group or a diphenylmethylsilyloxy group), an acyloxy group (an acyloxy group having preferably 2 to 48, more preferably 2 to 24 carbon atoms, such as an acetoxy group, a pivaloyloxy group, a benzoyloxy group or a dodecanoyloxy group), an alkoxycarbonyloxy group (an alkoxycarbonyloxy group having preferably 2 to 48, more preferably 2 to 24 carbon atoms, such as an ethoxycarbonyloxy group, a t-butoxycarbonyloxy group, or cycloalkyloxycarbonyloxy groups including a cyclohexyloxycarbonyloxy group), an aryloxycarbonyloxy group (an aryloxycarbonyloxy group having preferably 7 to 32, more preferably 7 to 24 carbon atoms, such as a phenoxycarbonyloxy group), a carbamoyloxy group (a carbamoyloxy group having preferably 1 to 48, more preferably 1 to 24 carbon atoms, such as an N,N-dimethylcarbamoyloxy group, an N-butylcarbamoyloxy group, an N-phenylcarbamoyloxy group or an N-ethyl-N-phenylcarbamoyloxy group), a sulfamoyloxy group (a sulfamoyloxy group including preferably 0 to 32, more preferably 1 to 24 carbon atoms, such as an N,N-diethylsulfamoyloxy group or an N-propylsulfamoyloxy group), an alkylsulfonyloxy group (an alkylsulfonyloxy group having preferably 1 to 38, more preferably 1 to 24 carbon atoms, such as a methylsulfonyloxy group, a hexadecylsulfonyloxy group or a cyclohexylsulfonyloxy group), an arylsulfonyloxy group (an arylsulfonyloxy group having preferably 6 to 32, more preferably 6 to 24 carbon atoms, such as a phenylsulfonyloxy group), an acyl group (an acyl group having preferably 1 to 48, more preferably 1 to 24 carbon atoms, such as a formyl group, an acetyl group, a pivaloyl group, a benzoyl group, a tetradecanoyl group or a cyclohexanoyl group), an alkoxycarbonyl group (an alkoxycarbonyl group having preferably 2 to 48, more preferably 2 to 24 carbon atoms, such as a methoxycarbonyl group, an ethoxycarbonyl group, an octadecyloxycarbonyl group, a cyclohexyloxycarbonyl group or a 2,6-di-tert-butyl-4-methylcyclohexyloxycarbonyl group), an aryloxycarbonyl group (an aryloxycarbonyl group having preferably 7 to 32, more preferably 7 to 24 carbon atoms, such as a phenoxycarbonyl group), a carbamoyl group (a carbamoyl group having preferably 1 to 48, more preferably 1 to 24 carbon atoms, such as a carbamoyl group, an N,N-diethylcarbamoyl group, an N-ethyl-N-octylcarbamoyl group, an N,N-dibutylcarbamoyl group, an N-propylcarbamoyl group, an N-phenylcarbamoyl group, a N-methyl-N-phenylcarbamoyl group or an N,N-dicyclohexylcarbamoyl group), an amino group (an amino group having preferably 32 or less, more preferably 24 or less carbon atoms, such as an amino group, a methylamino group, an N,N-dibutylamino group, a tetradecylamino group, a 2-ethylhexylamino group or a cyclohexylamino group), an anilino group (an anilino group having preferably 6 to 32, more preferably 6 to 24 carbon atoms, such as an anilino group or an N-methylanilino group), a heterocyclic amino group (a heterocyclic amino group having preferably 1 to 32, more preferably 1 to 18 carbon atoms, such as a 4-pyridylamino group), a carbonamido group (a carbonamido group having preferably 2 to 48, more preferably 2 to 24 carbon atoms, such as an acetamido group, a benzamido group, a tetradecanamido group, a pivaloylamido group or a cyclohexanamido group), an ureido group (an ureido group having preferably 1 to 32, more preferably 1 to 24 carbon atoms, such as an ureido group, an N,N-dimethylureido group or an N-phenylureido group), an imido group (an imido group having preferably 36 or less, more preferably 24 or less carbon atoms, such as an N-succinimido group or an N-phthalimido group), an alkoxycarbonylamino group (an alkoxycarbonylamino group having preferably 2 to 48, more preferably 2 to 24 carbon atoms, such as a methoxycarbonylamino group, an ethoxycarbonylamino group, a t-butoxycarbonylamino group, an octadecyloxycarbonylamino group or a cyclohexyloxycarbonylamino group), an aryloxycarbonylamino group (an aryloxycarbonylamino group having preferably 7 to 32, more preferably 7 to 24 carbon atoms, such as an phenoxycarbonylamino group), a sulfonamido group (a sulfonamido group having preferably 1 to 48, more preferably 1 to 24 carbon atoms, such as a methanesulfonamido group, a butanesulfonamido group, a benzenesulfonamido group, a hexadecanesulfonamido group or a cyclohexanesulfonamido group), a sulfamoylamino group (a sulfamoylamino group having preferably 1 to 48, more preferably 1 to 24 carbon atoms, such as an N,N-dipropylsulfamoylamino group or an N-ethyl-N-dodecylsulfamoylamino group), an azo group (an azo group having preferably 1 to 32, more preferably 1 to 24 carbon atoms, such as a phenylazo group or a 3-pyrazolylazo group), an alkylthio group (an alkylthio group having preferably 1 to 48, more preferably 1 to 24 carbon atoms, such as a methylthio group, an ethylthio group, an octylthio group or a cyclohexylthio group), an arylthio group (an arylthio group having preferably 6 to 48, more preferably 6 to 24 carbon atoms, such as a phenylthio group), a heterocyclic thio group (a heterocyclic thio group having preferably 1 to 32, more preferably 1 to 18 carbon atoms, such as a 2-benzothiazolylthio group, a 2-pyridylthio group or a 1-phenyltetrazolylthio group), an alkylsulfinyl group (an alkylsulfinyl group having preferably 1 to 32, more preferably 1 to 24 carbon atoms, such as a dodecanesulfinyl group), an arylsulfinyl group (an arylsulfinyl group having preferably 6 to 32, more preferably 6 to 24 carbon atoms, such as a phenylsulfinyl group), an alkylsulfonyl group (an alkylsulfonyl group having preferably 1 to 48, more preferably 1 to 24 carbon atoms, such as a methylsulfonyl group, an ethylsulfonyl group, a propylsulfonyl group, a butylsulfonyl group, an isopropylsulfonyl group, a 2-ethylhexylsulfonyl group, a hexadecylsulfonyl group, an octylsulfonyl group or a cyclohexylsulfonyl group), an arylsulfonyl group (an arylsulfonyl group having preferably 6 to 48, more preferably 6 to 24 carbon atoms, such as a phenylsulfonyl group or a 1-naphthylsulfonyl group), a sulfamoyl group (a sulfamoyl group having preferably 32 or less, more preferably 24 or less carbon atoms, such as a sulfamoyl group, an N,N-dipropylsulfamoyl group, an N-ethyl-N-dodecylsulfamoyl group, an N-ethyl-N-phenylsulfamoyl group or an N-cyclohexylsulfamoyl group), a sulfo group, a phosphonyl group (a phosphonyl group having preferably 1 to 32, more preferably 1 to 24 carbon atoms, such as a phenoxyphosphonyl group, an octyloxyphosphonyl group or a phenylphosphonyl group) and a phosphinoylamino group (a phosphinoylamino group having preferably 1 to 32, more preferably 1 to 24 carbon atoms, such as a diethoxyphosphinoylamino group or an dioctyloxyphosphinoylamino group).

When the above-mentioned monovalent substituent group is a group that may further be substituted, it may further be substituted by any of the above-mentioned groups. When the substituent group has two or more substituents, these substituents may be the same as or different from one another.

In Formula (N), $R^1$ and $R^2$, $R^2$ and $R^3$, $R^4$ and $R^5$, and $R^5$ and $R^6$ may be independently linked to each other to form a 5-, 6- or 7-membered ring. The 5-, 6- or 7-membered ring may be a saturated or unsaturated ring.

Examples of the 5-, 6- or 7-membered saturated or unsaturated ring include unsubstituted 5-, 6- or 7-membered saturated or unsaturated rings include a pyrrole ring, a furan ring, a thiophene ring, a pyrazole ring, an imidazole ring, a triazole ring, an oxazole ring, a thiazole ring, a pyrrolidine ring, a piperidine ring, a cyclopentene ring, a cyclohexene ring, a benzene ring, a pyridine ring, a pyrazine ring or a pyridazine ring. Among these, a benzene ring and a pyridine ring are preferable.

When the 5-, 6- or 7-membered saturated or unsaturated ring is a group that may further be substituted, it may further be substituted by any of the above-mentioned monovalent substituents represented by $R^1$ to $R^6$. When the 5-, 6- or 7-membered saturated or unsaturated ring has two or more substituents, these substituents may be the same as or different from one another.

In Formula (N), it is preferable that $R^1$ and $R^6$ each independently represent an alkylamino group, an arylamino group, a carbonamido group, an ureido group, an imido group, an alkoxycarbonylamino group or a sulfonamido group; it is more preferable that $R^1$ and $R^6$ each independently represent a carbonamido group, an ureido group, an alkoxycarbonylamino group or a sulfonamido group; and it is still more preferable that $R^1$ and $R^6$ each independently represent a carbonamido group or an ureido group.

In Formula (N), it is preferable that $R^2$ and $R^5$ each independently represent an alkoxycarbonyl group, an aryloxycarbonyl group, a carbamoyl group, an alkylsulfonyl group, an arylsulfonyl group, a nitrile group, an imido group or a carbamoyl sulfonyl group; it is more preferable that $R^2$ and $R^5$ each independently represent an alkoxycarbonyl group, an aryloxycarbonyl group, a carbamoyl group, an alkylsulfonyl group, a nitrile group, an imido group or a carbamoyl sulfonyl group; it is still more preferable that $R^2$ and $R^5$ each independently represent an alkoxycarbonyl group, an aryloxycarbonyl group, a carbamoyl group, a nitrile group, an imido group or a carbamoyl sulfonyl group; and it is even more preferable that $R^2$ and $R^5$ each independently represent an alkoxycarbonyl group, an aryloxycarbonyl group or a carbamoyl group.

In Formula (N), it is preferable that $R^3$ and $R^4$ each independently represent a substituted or unsubstituted alkyl group, a substituted or unsubstituted aryl group, or a substituted or unsubstituted heterocyclic group; and it is more preferable that $R^3$ and $R^4$ each independently represent a substituted or unsubstituted alkyl group, or a substituted or unsubstituted aryl group.

In Formula (N), when $R^3$ and $R^4$ each independently represent an alkyl group, the alkyl group is preferably a substituted or unsubstituted straight-chain, branched-chain, or cyclic alkyl group having 1 to 12 carbon atoms. Examples thereof include a methyl group, an ethyl group, a n-propyl group, an isopropyl group, a cyclopropyl group, a n-butyl group, an i-butyl group, a t-butyl group, a cyclobutyl group, a cyclopentyl group, a cyclohexyl group and a benzyl group. It is more preferable that $R^3$ and $R^4$ each independently represent a substituted or unsubstituted branched-chain or cyclic alkyl group having 1 to 12 carbon atoms such as an isopropyl group, a cyclopropyl group, an i-butyl group, a t-butyl group, a cyclobutyl group, a cyclopentyl group or a cyclohexyl group. It is still more preferable that $R^3$ and $R^4$ each independently represent a substituted or unsubstituted secondary or tertiary alkyl group having 1 to 12 carbon atoms such as an isopropyl group, a cyclopropyl group, an i-butyl group, a t-butyl group, a cyclobutyl group or a cyclohexyl group.

In Formula (N), when $R^3$ and $R^4$ each independently represent an aryl group, the aryl group is preferably a substituted or unsubstituted phenyl group, or a substituted or unsubstituted naphthyl group; and more preferably a substituted or unsubstituted phenyl group.

In Formula (N), when $R^3$ and $R^4$ each independently represent a heterocyclic group, the heterocyclic group is preferably a substituted or unsubstituted 2-thienyl group, a substituted or unsubstituted 4-pyridyl group, a substituted or unsubstituted 3-pyridyl group, a substituted or unsubstituted 2-pyridyl group, a substituted or unsubstituted 1-pyridyl group, a substituted or unsubstituted 2-furyl group, a substituted or unsubstituted 2-pyrimidinyl group, a substituted or unsubstituted 2-benzothiazolyl group, a substituted or unsubstituted 1-imidazolyl group, a substituted or unsubstituted 1-pyrazolyl group, or a substituted or unsubstituted benzotriazol-1-yl group, and more preferably a substituted or unsubstituted 2-thienyl group, a substituted or unsubstituted 4-pyridyl group, a substituted or unsubstituted 2-furyl group, a substituted or unsubstituted 2-pyrimidinyl group, or a substituted or unsubstituted 1-pyridyl group.

In Formula (N), $R^7$ represents a hydrogen atom, a halogen atom, an alkyl group (an alkyl group having preferably 1 to 24, more preferably 1 to 12 carbon atoms, such as a methyl group, an ethyl group, a propyl group, a butyl group, an isopropyl group, a t-butyl group, a 2-ethylhexyl group, a dodecyl group, a cyclopropyl group, a cyclopentyl group, a cyclohexyl group or an adamantly group), and an aryl group (an aryl group having preferably 6 to 24, more preferably 6 to 12 carbon atoms, such as a phenyl group or a naphthyl group), or a heterocyclic group (a heterocyclic group having preferably 1 to 24, more preferably 1 to 12 carbon atoms, such as a 2-thienyl group, a 4-pyridyl group, a 2-furyl group, a 2-pyrimidinyl group, a 1-pyridyl group, a 2-benzothiazolyl group, a 1-imidazolyl group, a 1-pyrazolyl group or a benzotriazol-1-yl group).

$R^7$ preferably represents a hydrogen atom, an alkyl group, an aryl group, or a hetero ring, more preferably a hydrogen atom or an alkyl group, and still more preferably a hydrogen atom.

The alkyl group, aryl group, or heterocyclic group represented by $R^7$ may be substituted with any of the monovalent substituents represented by $R^1$ to $R^6$. When the alkyl group, aryl group, or heterocyclic group represented by $R^7$ has two or more substituents, those substituents may be the same as or may be different from one another.

Hereinbelow, the metal atom or metal compound to which the compound represented by Formula (N) is coordinated to form the dipyrromethene colorant is explained.

Here, the metal atom or metal compound may be any metal atom or metal compound as long as it may form a complex, and examples include bivalent metal atoms, bivalent metal oxides, bivalent metal hydroxides and bivalent metal chlorides. Specific examples thereof include Zn, Mg, Si, Sn, Rh, Pt, Pd, Mo, Mn, Pb, Cu, Ni, Co, Fe and B; metal chlorides such as $AlCl_3$, $InCl_3$, $FeCl_2$, $TiCl_2$, $SnCl_2$, $SiCl_2$ or $GeCl_2$; metal oxides such as TiO or VO; and metal hydroxides such as $Si(OH)_2$.

Among these, Fe, Zn, Mg, Si, Pt, Pd, Mo, Mn, Cu, Ni, Co, TiO, B and VO are preferable, Fe, Zn, Mg, Si, Pt, Pd, Cu, Ni, Co, B and VO are more preferable, and Fe, Zn, Cu, Co, B and VO (V═O) are still more preferable, in view of stability, spectral property, heat resistance, light fastness, and production suitability and the like of the complex. In particularly, Zn is preferable.

A preferable embodiment of the dipyrromethene colorant in which the compound represented by Formula (N) coordinates to the metal atom or metal compound described the below.

Namely, it is preferable that $R^1$ and $R^6$ in Formula (N) each independently represent a hydrogen atom, an alkyl group, an alkenyl group, an aryl group, a heterocyclic group, a silyl group, a hydroxy group, a cyano group, an alkoxy group, an aryloxy group, a heterocyclic oxy group, an acyl group, an alkoxycarbonyl group, a carbamoyl group, an amino group, an anilino group, a heterocyclic amino group, a carbonamido group, an ureido group, an imido group, an alkoxycarbonylamino group, an aryloxycarbonylamino group, a sulfonamido group, an azo group, an alkylthio group, an arylthio group, a heterocyclic thio group, an alkylsulfonyl group, an arylsulfonyl group or a phosphinoylamino group, $R^2$ and $R^5$ in Formula (N) each independently represent a hydrogen atom, a halogen atom, an alkyl group, an alkenyl group, an aryl group, a heterocyclic group, a hydroxy group, a cyano group, a nitro group, an alkoxy group, an aryloxy group, a heterocyclic oxy group, an acyl group, an alkoxycarbonyl group, an aryloxycarbonyl group, a carbamoyl group, an imido group, an alkoxycarbonylamino group, a sulfonamido group, an azo group, an alkylthio group, an arylthio group, a heterocyclic thio group, an alkylsulfonyl group, an arylsulfonyl group or a sulfamoyl group, $R^3$ and $R^4$ in Formula (N) each independently represent a hydrogen atom, a halogen atom, an alkyl group, an alkenyl group, an aryl group, a heterocyclic group, a silyl group, a hydroxy group, a cyano group, an alkoxy group, an aryloxy group, a heterocyclic oxy group, an acyl group, an alkoxycarbonyl group, a carbamoyl group, an anilino group, a carbonamido group, an ureido group, an imido group, an alkoxycarbonylamino group, a sulfonamido group, an azo group, an alkylthio group, an arylthio group, a heterocyclic thio group, an alkylsulfonyl group, an arylsulfonyl group, a sulfamoyl group or a phosphinoylamino group, and $R^7$ in Formula (N) represents a hydrogen atom, a halogen atom, an alkyl group, an aryl group or a heterocyclic group; and the metal atom or the metal compound is Zn, Mg, Si, Pt, Pd, Mo, Mn, Cu, Ni, Co, TiO, B or VO.

It is more preferable that $R^1$ and $R^6$ in Formula (N) each independently represent a hydrogen atom, an alkyl group, an alkenyl group, an aryl group, a heterocyclic group, a cyano group, an acyl group, an alkoxycarbonyl group, a carbamoyl group, an amino group, a heterocyclic amino group, a carbonamido group, an ureido group, an imido group, an alkoxycarbonylamino group, an aryloxycarbonylamino group, a sulfonamido group, an azo group, an alkylsulfonyl group, an arylsulfonyl group or a phosphinoylamino group, $R^2$ and $R^5$ in Formula (N) each independently represent an alkyl group, an alkenyl group, an aryl group, a heterocyclic group, a cyano group, a nitro group, an acyl group, an alkoxycarbonyl group, an aryloxycarbonyl group, a carbamoyl group, an imido group, an alkylsulfonyl group, an arylsulfonyl group or a sulfamoyl group, $R^3$ and $R^4$ in Formula (N) each independently represent a hydrogen atom, an alkyl group, an alkenyl group, an aryl group, a heterocyclic group, a cyano group, an acyl group, an alkoxycarbonyl group, a carbamoyl group, a carbonamido group, an ureido group, an imido group, an alkoxycarbonylamino group, a sulfonamido group, an alkylthio group, an arylthio group, a heterocyclic thio group, an alkylsulfonyl group, an arylsulfonyl group or a sulfamoyl group, and $R^7$ in Formula (N) represents a hydrogen atom, a halogen atom, an alkyl group, an aryl group or a heterocyclic group; and the metal atom or the metal compound is Zn, Mg, Si, Pt, Pd, Cu, Ni, Co, B or VO.

Among the dipyrromethene colorant in which the compound represented by Formula (N) coordinates to the metal atom or metal compound, the dipyrromethene colorant represented by the following Formula (a) can be preferably used in view of light fastness and heat resistance.

Formula (a)

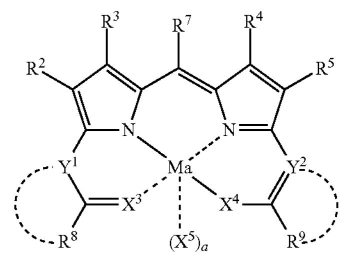

In Formula (a), $R^2$ to $R^5$ each independently represent a hydrogen atom or a monovalent substituent; $R^7$ represents a hydrogen atom, a halogen atom, an alkyl group, an aryl group or a heterocyclic group; Ma represents a metal atom or a metal compound; $X^3$ and $X^4$ each independently represent NR (wherein R represents a hydrogen atom, an alkyl group, an alkenyl group, an aryl group, a heterocyclic group, an acyl group, an alkylsulfonyl group or an arylsulfonyl group), an oxygen atom or a sulfur atom; $Y^1$ represents NRc (wherein Rc represents a hydrogen atom, an alkyl group, an alkenyl group, an aryl group, a heterocyclic group, an acyl group, an alkylsulfonyl group or an arylsulfonyl group), or a nitrogen atom; $Y^2$ represents a nitrogen atom or a carbon atom; $R^8$ and $R^9$ each independently represent an alkyl group, an alkenyl group, an aryl group, a heterocyclic group, an alkoxy group, an aryloxy group, an alkylamino group, an arylamino group or a heterocyclic amino group; $R^8$ and $Y^1$ may be linked to each other to form a 5-, 6- or 7-membered ring; $R^9$ and $Y^2$ may be linked to each other to form a 5-, 6- or 7-membered ring; $X^5$ represents a group that can be bonded to Ma; and a represents 0, 1, or 2. When a represents 2, each $X^5$ may be the same as or different from each other. Examples of the dipyrromethene colorant represented by Formula (a) further include tautomers thereof.

Hereinbelow, each of the substituent in Formula (a) is described in detail.

$R^2$ to $R^5$ in Formula (a) each have the same definitions as $R^2$ to $R^5$ in Formula (N), and have the same specific examples and preferable definitions as $R^2$ to $R^5$ in Formula (a)

When the above-mentioned monovalent substituent group is a group that may further be substituted, it may further be substituted by any of the above-mentioned monovalent substituent groups in Formula (N). When the substituent group has two or more substituents, these substituents may be the same as or different from one another.

Among these, it is preferable that $R^2$ and $R^5$ each independently represent a cyano group, an alkoxycarbonyl group, a carbamoyl group, an acyl group, or an alkylsulfonyl group; and it is more preferable that $R^2$ and $R^5$ each independently represent an alkoxycarbonyl group or a carbamoyl group. It is preferable that $R^3$ and $R^4$ each independently represent a substituted or unsubstituted alkyl group, or a substituted or unsubstituted aryl group; and it is more preferable that $R^3$ and $R^4$ each independently represent a substituted or unsubstituted alkyl group having 1 to 10 carbon atoms, or a substituted or unsubstituted phenyl group.

$R^7$ in Formula (a) has the same definitions as $R^7$ in Formula (N), and has the same specific examples and preferable definitions as $R^7$ in Formula (a)

In Formula (a), Ma represents a metal atom or a metal compound. The metal atom or metal compound as used herein may be any metal atom or metal compound so long as it may form a complex, and examples thereof include bivalent metal atoms, bivalent metal oxides, bivalent metal hydroxides and bivalent metal chlorides. For example, examples include Zn, Mg, Si, Sn, Rh, Pt, Pd, Mo, Mn, Pb, Cu, Ni, Co, Fe and B, metal chlorides such as $AlCl_3$, $InCl_3$, $FeCl_2$, $TiCl_2$, $SnCl_2$, $SiCl_2$ or $GeCl_2$, metal oxides including TiO and VO, and metal hydroxides such as $Si(OH)_2$. Among these, Fe, Zn, Mg, Si, Pt, Pd, Mo, Mn, Cu, Ni, Co, TiO, B and VO are preferable, Fe, Zn, Mg, Si, Pt, Pd, Cu, Ni, Co, B and VO are more preferable, and Fe, Zn, Cu, Co, B and VO (V═O) are still more preferable, in view of stability, spectral property, heat resistance, light fastness, and production suitability and the like of the complex. In particularly, Zn is preferable.

In Formula (a), $X^3$ and $X^4$ each independently represent NR, an oxygen atom or a sulfur atom. Here, R represents a hydrogen atom, an alkyl group (a straight-chain, branched-chain, or cyclic alkyl group having preferably 1 to 36, more preferably 1 to 12 carbon atoms, such as a methyl group, an ethyl group, a propyl group, an isopropyl group, a butyl group, an isobutyl group, a t-butyl group, a hexyl group, a 2-ethylhexyl group, a dodecyl group, a cyclopropyl group, a cyclopentyl group, a cyclohexyl group, a 1-adamantyl group), an alkenyl group (an alkenyl group having preferably 2 to 24, more preferably 2 to 12 carbon atoms, such as a vinyl group, an allyl group or a 3-buten-1-yl group), an aryl group (an aryl group having preferably 6 to 36, more preferably 6 to 18 carbon atoms, such as a phenyl group or a naphthyl group), a heterocyclic group (a heterocyclic group having preferably 1 to 24, more preferably 1 to 12 carbon atoms, such as a 2-thienyl group, a 4-pyridyl group, a 2-furyl group, a 2-pyrimidinyl group, a 1-pyridyl group, a 2-benzothiazolyl group, a 1-imidazolyl group, a 1-pyrazolyl group or a benzotriazol-1-yl group), an acyl group (an acyl group having preferably 1 to 24, more preferably 2 to 18 carbon atoms, such as an acetyl group, a pivaloyl group, a 2-ethylhexyl group, a benzoyl group or a cyclohexanoyl group), an alkylsulfonyl group (an alkylsulfonyl group having preferably 1 to 24, more preferably 1 to 18 carbon atoms, such as a methylsulfonyl group, a ethylsulfonyl group, a isopropylsulfonyl group or a cyclohexylsulfonyl group), or an arylsulfonyl group (an arylsulfonyl group having preferably 6 to 24, more preferably 6 to 18 carbon atoms, such as a phenylsulfonyl group or a naphthylsulfonyl group).

The alkyl group, alkenyl group, aryl group, heterocyclic group, acyl group, alkylsulfonyl group or arylsulfonyl group for R may further be substituted by any of the substituents described as a substituent represented by $R^2$ to $R^5$. When the group is substituted by plural substituents, the substituents may be the same as or different from one another.

In Formula (a), Y1 represents NRc or a nitrogen atom. Rc has the same definition as R for $X^3$ or $X^4$.

In Formula (a), $R^8$ and $R^9$ each independently represent an alkyl group (a straight-chain, branched-chain or cyclic alkyl group having preferably 1 to 36, more preferably 1 to 12 carbon atoms, such as a methyl group, an ethyl group, a propyl group, an isopropyl group, a butyl group, an isobutyl group, a t-butyl group, a hexyl group, a 2-ethylhexyl group, a dodecyl group, a cyclopropyl group, a cyclopentyl group, a cyclohexyl group or a 1-adamantyl group), an alkenyl group (an alkenyl group having preferably 2 to 24, more preferably 2 to 12 carbon atoms, such as a vinyl group, an allyl group or a 3-buten-1-yl group), an aryl group (an aryl group having preferably 6 to 36, more preferably 6 to 18 carbon atoms, such as a phenyl group or a naphthyl group), a heterocyclic group (a heterocyclic group having preferably 1 to 24, more preferably 1 to 12 carbon atoms, such as a 2-thienyl group, a 4-pyridyl group, a 2-furyl group, a 2-pyrimidinyl group, a 1-pyridyl group, a 2-benzothiazolyl group, a 1-imidazolyl group, a 1-pyrazolyl group or a benzotriazol-1-yl group), an alkoxy group (an alkoxy group having preferably 1 to 36, more preferably 1 to 18 carbon atoms, such as a methoxy group, an ethoxy group, a propyloxy group, a butoxy group, a hexyloxy group, a 2-ethylhexyloxy group, a dodecyloxy group or a cyclohexyloxy group), an aryloxy group (an aryloxy group having preferably 6 to 24, more preferably 1 to 18 carbon atoms, such as a phenoxy group or a naphthyloxy group), an alkylamino group (an alkylamino group having preferably 1 to 36, more preferably 1 to 18 carbon atoms, such as a methylamino group, an ethylamino group, a propylamino group, a butylamino group, a hexylamino group, a 2-ethylhexylamino group, an isopropylamino group, a t-butylamino group, a t-octylamino group, a cyclohexylamino group, an N,N-diethylamino group, an N,N-dipropylamino group, an N,N-dibutylamino group or an N-methyl-N-ethylamino group), an arylamino group (an aryl amino group having preferably 6 to 36, more preferably 6 to 18 carbon atoms, such as a phenylamino group, a naphthylamino group, an N,N-diphenylamino group or an N-ethyl-N-phenylamino group), or a heterocyclic amino group (a heterocyclic amino group having preferably 1 to 24, more preferably 1 to 12 carbon atoms, such as a 2-aminopyrrole group, a 3-aminopyrazole group, a 2-aminopyridine group or a 3-aminopyridine group).

Among these, it is preferable that $R^8$ and $R^9$ each independently represent a substituted or unsubstituted alkyl group, or a substituted or unsubstituted aryl group, and it is more preferable that $R^8$ and $R^9$ each independently represent a substituted or unsubstituted alkyl group having 1 to 15 carbon atoms, or a substituted or unsubstituted phenyl group having 6 to 15 carbon atoms.

When the alkyl group, alkenyl group, aryl group, heterocyclic group, alkoxy group, aryloxy group, alkylamino group, arylamino group or heterocyclic amino group represented by $R^8$ or $R^9$ is a group that may further be substituted, it may further be substituted by any of the above-mentioned substituent groups described as a substituent represented by $R^2$ to $R^5$. When the group is substituted by plural substituents, the substituents may be the same as or different from one another.

In Formula (a), $R^8$ and $Y^1$ may be linked to each other so that $R^8$, $Y^1$ and the carbon atom form a 5-membered ring (e.g., cyclopentane, pyrrolidine, tetrahydrofuran, dioxolane, tetrahydrothiophene, pyrrole, furan, thiophene, indole, benzofuran and benzothiophene), a 6-membered ring (e.g., cyclohexane, piperidine, piperazine, morpholine, tetrahydropyran, dioxane, pentamethylenesulfide, dithiane, benzene, piperidine, piperazine, pyridazine, quinoline and quinazoline) or a 7-membered ring (e.g., cycloheptane and hexamethyleneimine).

In Formula (a), $R^9$ and $Y^2$ may be linked to each other so that $R^9$, $Y^2$ and the carbon atom form a 5-membered ring (e.g., cyclopentane, pyrrolidine, tetrahydrofuran, dioxolne, tetrahydrothiophene, pyrrole, furan, thiophene, indole, benzofuran and benzothiophene), a 6-membered ring (e.g., cyclohexane, piperidine, piperazine, morpholine, tetrahydropyran, dioxane, pentamethylenesulfide, dithiane, benzene, piperidine, piperazine, pyridazine, quinoline and quinazoline) or a 7-membered ring (e.g., cycloheptane and hexamethyleneimine).

In Formula (a), when the 5-, 6- or 7-membered ring formed by the linking of $R^8$ and $Y^1$ or the linking of $R^9$ and $Y^2$ is a ring that may further be substituted, it may be substituted by any of the substituents represented by $R^2$ to $R^5$. When the 5-, 6- or 7-membered ring is substituted by two or more substituents, the substituents may be the same as or different from one another.

$X^5$ in Formula (a) may be any group so long as it is can be bonded to Ma, and examples include water, alcohols (e.g., methanol, ethanol, propanol) and the like, as well as groups derived from the compounds described in "Metal Chelates" [1] Takeichi Sakaguchi and Kyohei Ueno (1995 Nankodo), "Metal Chelates" [2] (1996), "Metal Chelates" [3] (1997) and the like. Among these, in consideration of manufacture, it is preferable that $X^5$ represents water, a carboxylic acid compound, a sulfonic acid compound or alcohol, and it is more preferable that $X^5$ represents water, a carboxylic acid compound or a sulfonic acid compound. a represents 0, 1 or 2. When a represents 2, each $X^5$ may be the same as or different from each other.

In the preferable embodiments of the compound represented by the Formula (a), $R^2$ to $R^5$ each independently represent one of the above-described preferable examples for $R^2$ to $R^5$, respectively; $R^7$ represents one of the above-described preferable examples for $R^7$; Ma represents Zn, Cu, Co, or VO; $X^3$ and $X^4$ each independently represent NR (wherein R represents a hydrogen atom or an alkyl group) or an oxygen atom; $Y^1$ represents NRc (wherein Rc represents a hydrogen atom or an alkyl group) or a nitrogen atom; $Y^2$ represents a nitrogen atom or a carbon atom; $R^8$ and $R^9$ each independently represent an alkyl group, an aryl group, a heterocyclic group, an alkoxy group, or an alkylamino group; $X^5$ represents a group that can bind via an oxygen atom; and a represents 0 or 1. $R^8$ and $Y^1$ may be linked to each other to form a 5- or 6-membered ring, or $R^9$ and $Y^2$ may be linked to each other to form 5- or 6-membered ring.

In the more preferable embodiment of the compound represented by Formula (a), $R^2$ and $R^5$ each independently represent an alkoxycarbonyl group or a carbamoyl group; $R^3$ and $R^4$ each independently represent a substituted or unsubstituted alkyl group or a substituted or unsubstituted phenyl group; $R^7$ represents a hydrogen atom or a methyl group; $R^8$ and $R^9$ each independently represent a substituted or unsubstituted alkyl group or a substituted or unsubstituted phenyl group; $X^3$ and $X^4$ each represent an oxygen atom; $Y^1$ represents NRc (wherein Rc represents a hydrogen atom or an alkyl group) or a nitrogen atom; $Y^2$ represents a nitrogen atom; Ma represents Zn; and $X^5$ represents a carboxylic acid compound or a sulfonic acid compound.

In Formula (a), the position to which a polymerizable group relating to the polymerization of the colorant (relating to the formation of the colorant multimer) is introduced is not particularly limited, but is preferably any one or two or more of $R^2$ to $R^5$, $R^8$, $R^9$ and $X^5$, more preferably any one or two or more of $R^3$, $R^4$, $R^8$ and $R^9$, still more preferably $R^8$ and/or $R^9$, in view of synthetic compatibility.

It is preferable that the molar absorption coefficient of the dipyrromethene colorant represented by Formula (a) is as high as possible in view of film thickness. The maximum absorption wavelength λmax is preferably from 520 nm to 580 nm, and more preferably from 530 nm to 570 nm in order to improve color purity. The maximum absorption wavelength and molar absorption coefficient are measured by a spectrophotometer (trade name: UV-2400PC, manufactured by Shimadzu Corporation).

It is preferable that the melting point of the dipyrromethene colorant represented by Formula (a) is not too high in view of solubility.

1-2. Azo Colorant

Magenta Colorant

It is preferable to use the azo colorant represented by the following Formula (b) as the magenta colorant for a red color resist or inkjet printing ink.

Formula (b)

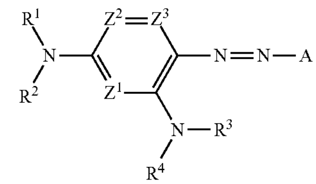

In Formula (b), $R^1$ to $R^4$ each independently represent a hydrogen atom, an alkyl group, an alkenyl group, an aryl group, a heterocyclic group, an acyl group, an alkoxycarbonyl group, an aryloxycarbonyl group, a carbamoyl group, an alkylsulfonyl group or an arylsulfonyl group; A represents an aryl group or an aromatic heterocyclic group; and $Z^1$ to $Z^3$ each independently represent —C($R^5$)═ or —N═ (wherein $R^5$ represents a hydrogen atom or a substituent).

Hereinbelow, each of the substituents in Formula (b) is described in detail.

in Formula (b), $R^1$ to $R^4$ each independently represent a hydrogen atom, an alkyl group (a straight-chain, branched-chain or cyclic alkyl group having preferably 1 to 36, more preferably 1 to 12 carbon atoms, such as a methyl group, an ethyl group, a propyl group, an isopropyl group, a butyl group, an isobutyl group, a t-butyl group, a hexyl group, a 2-ethylhexyl group, a dodecyl group, a cyclopropyl group, a cyclopentyl group, a cyclohexyl group or a 1-adamantyl group), an alkenyl group (an alkenyl group having preferably 2 to 24, more preferably 2 to 12 carbon atoms, such as a vinyl group, an allyl group or a 3-buten-1-yl group), an aryl group (an aryl group having preferably 6 to 36, more preferably 6 to 18 carbon atoms, such as a phenyl group or a naphthyl group), a heterocyclic group (a heterocyclic group having preferably 1 to 24, more preferably 1 to 12 carbon atoms, such as a 2-thienyl group, a 4-pyridyl group, a 2-furyl group, a 2-pyrimidinyl group, a 1-pyridyl group, a 2-benzothiazolyl group, a 1-imidazolyl group, a 1-pyrazolyl group or a benzotriazol-1-yl group), an acyl group (an acyl group having preferably 1 to 24, more preferably 2 to 18 carbon atoms, such as an acetyl group, a pivaloyl group, a 2-ethylhexyl group, a benzoyl group or a cyclohexanoyl group), an alkoxycarbonyl group (an alkoxycarbonyl group having preferably 1 to 10, more preferably 1 to 6 carbon atoms, such as a methoxycarbonyl group or an ethoxycarbonyl group), an aryloxycarbonyl group (an aryloxycarbonyl group having preferably 6 to 15, more preferably 6 to 10 carbon atoms, such as a phenoxycarbonyl group), a carbamoyl group (a carbamoyl group having preferably 1 to 8, more preferably 2 to 6 carbon atoms, such as a dimethylcarbamoyl group), an alkylsulfonyl group (an alkylsulfonyl group having preferably 1 to 24, more preferably 1 to 18 carbon atoms, such as a methylsulfonyl group, an ethylsulfonyl group, an isopropylsulfonyl group or a cyclohexylsulfonyl group), or an arylsulfonyl group (an arylsulfonyl group having preferably 6 to 24, more preferably 6 to 18 carbon atoms, such as a phenylsulfonyl group or a naphthylsulfonyl group).

It is preferable that $R^1$ and $R^3$ each independently represent an alkyl group, an alkenyl group, an aryl group or a heterocyclic group. It is preferable that $R^2$ and $R^4$ each independently represent a hydrogen atom or an alkyl group.

When the group represented by $R^1$ to $R^4$ is a group that may further be substituted, it may be substituted by any of the substituents represented by $R^1$ to $R^6$ in Formula (N). When the group represented by $R^1$ to $R^4$ is substituted by two or more substituents, the substituents may be the same as or different from one another.

$R^1$ and $R^2$ may be linked to each other to form a 5- or 6-membered ring. $R^1$ and $R^5$ (when $Z^1$ or $Z^2$ represents —C($R^5$)═) may be linked to each other to form a 5- or 6-membered ring. $R^3$ and $R^4$ may be linked to each other to form a 5- or 6-membered ring. R3[1] and $R^5$ (when $Z^1$ represents —C($R^5$)═) may be linked to each other to form a 5- or 6-membered ring.

$Z^1$ to $Z^3$ each independently represent —C($R^5$)═ or —N═, wherein $R^5$ represents a hydrogen atom or a substituent. Examples of the substituent represented by $R^5$ include substituents such as those represented by $R^1$ to $R^6$ in Formula (N). When the group represented by $R^5$ is a group that may further be substituted, it may be substituted by any of the substituents represented by $R^1$ to $R^6$ in Formula (N). When the group represented by $R^5$ is substituted by two or more substituents, the substituents may be the same as or different from one another.

It is preferable that $Z^1$ represents —N═, $Z^2$ represents —C($R^5$)═ or —N═, and $Z^3$ represents —C($R^5$)═. It is more preferable that $Z^1$ represents —N═ and $Z^2$ and $Z^3$ represent —C($R^5$)═.

A represents an aryl group or an aromatic heterocyclic group. The aryl group or the aromatic heterocyclic group represented by A may be further substituted by the group represented by $R^1$ to $R^6$ in Formula (N). When the group represented by A is substituted by two or more substituents, the substituents may be the same as or different from one another.

A preferably represents an aromatic heterocyclic group. It is more preferable that A represents an imidazole ring, a pyrazole ring, a triazole ring, a thiazole ring, a oxazole ring, 1,2,4-thiadiazole ring, 1,3,4-thiadiazole ring, a pyridine ring, a pyrimidine ring, a pyrazine ring, a benzopyrazole ring or a benzothiazole ring.

In Formula (b), the position to which a polymerizable group relating to the polymerization of the colorant (relating to the formation of the colorant multimer) is introduced is not particularly limited, but is preferably any one or two or more of $R^1$, $R^2$ and A, and more preferably $R^1$ and/or A, in view of synthetic compatibility.

The azo colorant represented by Formula (b) is preferably an azo colorant represented by the following formula (b').

Formula (b')

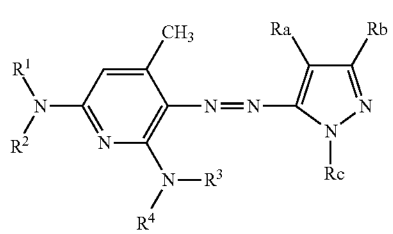

In Formula (b'), $R^1$ to $R^4$ each have the same definitions as $R^1$ to $R^4$ in Formula (b), and have the same preferable definitions as $R^1$ to $R^4$ in Formula (b). In Formula (b'), Ra represents an electron withdrawing group having a Hammett substituent constant σp of 0.2 or more; Rb represents a hydrogen atom or a substituent group; and Rc represents an alkyl group, an alkenyl group, an aryl group, a heterocyclic group, an acyl group, an alkoxycarbonyl group, a carbamoyl group, an alkylsulfonyl group or an arylsulfonyl group.

Examples of the substituent represented by Rb include substituents such as those represented by $R^1$ to $R^6$ in Formula (N).

It is also preferable that the azo colorant represented by the following Formula (c) is used as a magenta colorant for a red color resist or an inkjet printing ink.

Formula (c)

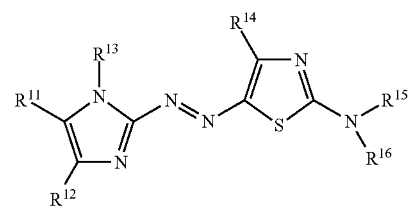

In Formula (c), $R^{11}$ to $R^{16}$ each independently represent a hydrogen atom or a monovalent substituent; $R^{11}$ and $R^{12}$ may be linked to each other to form a ring; and $R^{15}$ and $R^{16}$ may be linked to each other to form a ring.

Hereinbelow, each of the substituents in Formula (c) is described in detail.

In Formula (c), $R^{11}$ to $R^{16}$ each independently represent a hydrogen atom or a monovalent substituent. Examples of the monovalent substituent include a halogen atom, an alkyl group having 1 to 30 carbon atoms (indicating herein a saturated aliphatic group, such as a cycloalkyl group or a bicycloalkyl group), an alkenyl group having 2 to 30 carbon atoms (indicating herein an unsaturated aliphatic group having a double bond, such as a cycloalkenyl group or a bicycloalkenyl group), an alkynyl group having 2 to 30 carbon atoms, an aryl group having 6 to 30 carbon atoms, a heterocyclic group having 3 to 30 carbon atoms, a cyano group, an aliphatic oxy group having 1 to 30 carbon atoms, an aryloxy group having 6 to 30 carbon atoms, an acyloxy group having 2 to 30 carbon atoms, a carbamoyloxy group having 1 to 30 carbon atoms, an aliphatic oxycarbonyloxy group 2 to 30 carbon atoms, an aryloxycarbonyloxy group having 7 to 30 carbon atoms, an amino group having 0 to 30 carbon atoms (such as an alkylamino group, an anilino group or a heterocyclic amino group), an acylamino group having 2 to 30 carbon atoms, an aminocarbonylamino group having 1 to 30 carbon atoms, an aliphatic oxycarbonylamino group having 2 to 30 carbon atoms, an aryloxycarbonylamino group having 7 to 30 carbon atoms, a sulfamoylamino group having 0 to 30 carbon atoms, an alkylsulfonylamino or arylsulfonylamino group having 1 to 30 carbon atoms, an alkylthio group having 1 to 30 carbon atoms, an arylthio group having 6 to 30 carbon atoms, a sulfamoyl group having 0 to 30 carbon atoms, an alkyl sulfinyl or arylsulfinyl group having 1 to 30 carbon atoms, an alkyl sulfonyl or arylsulfonyl group having 1 to 30 carbon atoms, an acyl group having 2 to 30 carbon atoms, an aryloxycarbonyl group having 6 to 30 carbon atoms, an aliphatic oxycarbonyl group having 2 to 30 carbon atoms, a carbamoyl group having 1 to 30 carbon atoms, an aryl azo or heterocyclic azo group having 3 to 30 carbon atoms, and an imido group. Each of these substituents may further have a substituent.

It is preferable that $R^{11}$ and $R^{12}$ each independently represent a hydrogen atom, a heterocyclic group or a cyano group; and it is more preferable that $R^{11}$ and $R^{12}$ represent a cyano group.

It is preferable that $R^{13}$ and $R^{14}$ each independently represent a hydrogen atom, a substituted or unsubstituted alkyl group, or a substituted or unsubstituted aryl group; and it is more preferable that $R^{13}$ and $R^{14}$ each independently represent a substituted or unsubstituted alkyl group.

It is preferable that $R^{15}$ and $R^{16}$ each independently represent a hydrogen atom, a substituted or unsubstituted alkyl group, or a substituted or unsubstituted aryl group; and it is more preferable that $R^{15}$ and $R^{16}$ each independently represent a substituted or unsubstituted alkyl group.

In Formula (c), the position to which a polymerizable group relating to the polymerization of the colorant (relating to the formation of the colorant multimer) is introduced is not particularly limited, but is preferably any one or two or more of $R^{13}$, $R^{15}$ and $R^{16}$, more preferably $R^{13}$ and/or $R^{15}$, in view of synthetic compatibility.

Yellow Colorant

It is preferable to use the azo colorants represented by the following Formulae (d), (e) and (f) (including tautomers thereof) as the yellow colorant for a red or green color resist or inkjet printing ink.

Formula (d)

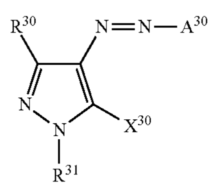

In Formula (d), $R^{30}$ represents a hydrogen atom or a substituent; $R^{31}$ represents a hydrogen atom, an alkyl group, an alkenyl group, an aryl group, a heterocyclic group, an acyl group, an alkoxycarbonyl group or a carbamoyl group; $X^{30}$ represents —OM, or —N($R^{32}$)($R^{33}$) (wherein, M represents a hydrogen atom, an alkyl group, or a metal atom or an organic base (cation) required for neutralization of an electric charge); $R^{32}$ and $R^{33}$ each independently represent a hydrogen atom, an alkyl group, an alkenyl group, an aryl group, a heterocyclic group, an acyl group, an alkoxycarbonyl group or a carbamoyl group; and $A^{30}$ represents an aryl group or an aromatic heterocyclic group.

Hereinbelow, each of the substituents in Formula (d) is described in detail.

$R^{30}$ represents a hydrogen atom or a substituent. Examples of the substituent include substituents such as those represented by $R^2$ to $R^5$ in Formula (a). Among these, $R^{30}$ preferably represents a substituted or unsubstituted alkyl group, a substituted or unsubstituted aryl group or a heterocyclic group, more preferably a substituted or unsubstituted alkyl group or a substituted or unsubstituted aryl group.

$R^{31}$ represents a hydrogen atom, an alkyl group (a straight-chain, branched-chain or cyclic alkyl group having preferably 1 to 36, more preferably 1 to 12 carbon atoms, such as a methyl group, an ethyl group, a propyl group, an isopropyl group, a butyl group, an isobutyl group, a t-butyl group, a hexyl group, a 2-ethylhexyl group, a dodecyl group, a cyclopropyl group, a cyclopentyl group, a cyclohexyl group or a 1-adamantyl group), an alkenyl group (an alkenyl group having preferably 2 to 24, more preferably 2 to 12 carbon atoms, such as a vinyl group, an allyl group or a 3-buten-1-yl group), an aryl group (an aryl group having preferably 6 to 36, more preferably 6 to 18 carbon atoms, such as a phenyl group or a naphthyl group), a heterocyclic group (a heterocyclic group having preferably 1 to 24, more preferably 1 to 12 carbon atoms, such as a 2-thienyl group, a 4-pyridyl group, a 2-furyl group, a 2-pyrimidinyl group, a 1-pyridyl group, a 2-benzothiazolyl group, a 1-imidazolyl group, a 1-pyrazolyl group or a benzotriazol-1-yl group), an acyl group (an acyl group having preferably 1 to 24, more preferably 2 to 18 carbon atoms, such as an acetyl group, a pivaloyl group, a 2-ethylhexyl group, a benzoyl group or a cyclohexanoyl group), an alkoxycarbonyl group (an alkoxycarbonyl group having preferably 1 to 6, more preferably 1 to 4 carbon atoms, such as a methoxycarbonyl group), or a carbamoyl group (a carbamoyl group having preferably 1 to 6, more preferably 1 to 4 carbon atoms, such as an N,N-dimethylcarbamoyl group).

$A^{30}$ has the same definition as A in Formula (b), and has the same preferable definition as A in Formula (b).

In Formula (d), the position to which a' polymerizable group relating to the polymerization of the colorant (relating to the formation of the colorant multimer) is introduced is not particularly limited, but is preferably $R^{31}$ and/or $A^{30}$, in view of synthetic compatibility.

Formula (e)

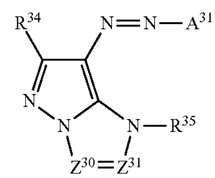

In Formula (e), $R^{34}$ represents a hydrogen atom or a substituent; $R^{35}$ represents a hydrogen atom, an alkyl group, an alkenyl group, an aryl group, a heterocyclic group, an acyl group, an alkoxycarbonyl group or a carbamoyl group; $Z^{30}$ and $Z^{31}$ each independently represent —C($R^{36}$)═ or —N═, wherein $R^{36}$ represents a hydrogen atom or a substituent; and $A^{31}$ represents an aryl group or an aromatic heterocyclic group.

Hereinbelow, each of the substituents in Formula (e) is described in detail. $R^{34}$ represents a hydrogen atom or a substituent. $R^{34}$ has the same definition as $R^{30}$ in Formula (d), and has the same preferable definition as $R^{30}$ in Formula (d).

$R^{35}$ represents a hydrogen atom, an alkyl group (a straight-chain, branched-chain or cyclic alkyl group having preferably 1 to 36, more preferably 1 to 12 carbon atoms, such as a methyl group, an ethyl group, a propyl group, an isopropyl group, a butyl group, an isobutyl group, a t-butyl group, a hexyl group, a 2-ethylhexyl group, a dodecyl group, a cyclopropyl group, a cyclopentyl group, a cyclohexyl group or a 1-adamantyl group), an alkenyl group (an alkenyl group having preferably 2 to 24, more preferably 2 to 12 carbon atoms, such as a vinyl group, an allyl group or a 3-buten-1-yl group), an aryl group (an aryl group having preferably 6 to 36, more preferably 6 to 18 carbon atoms, such as a phenyl group or a naphthyl group), a heterocyclic group (a heterocyclic group having preferably 1 to 24, more preferably 1 to 12 carbon atoms, such as a 2-thienyl group, a 4-pyridyl group, a 2-furyl group, a 2-pyrimidinyl group, a 1-pyridyl group, a 2-benzothiazolyl group, a 1-imidazolyl group, a 1-pyrazolyl group or a benzotriazol-1-yl group), an acyl group (an acyl group having preferably 1 to 24, more preferably 2 to 18 carbon atoms, such as an acetyl group, a pivaloyl group, a 2-ethylhexyl group, a benzoyl group or a cyclohexanoyl group), an alkoxycarbonyl group (an alkoxycarbonyl group having preferably 1 to 10, more preferably 1 to 6 carbon atoms, such as a methoxycarbonyl group or a ethoxycarbonyl group), or a carbamoyl group (a carbamoyl group having preferably 1 to 10, more preferably 1 to 6 carbon atoms, such as an N,N-dimethylcarbamoyl group).

$Z^{30}$ and $Z^{31}$ each independently represent —C($R^{36}$)═ or —N═, wherein $R^{36}$ represents a hydrogen atom or a substituent. Examples of the substituent represented by $R^{36}$ include substituents such as those represented by $R^1$ to $R^6$ in Formula (N). When the substituent represented by $R^{36}$ is a group that may further be substituted, it may be substituted by any of the substituents represented by $R^1$ to $R^6$ in Formula (N). When the substituent represented by $R^{36}$ has two or more substituents, the substituents may be the same as or different from one another.

It is preferable that $Z^{30}$ represents —N═ and $Z^{31}$ represents —C($R^{36}$)═.

$A^{31}$ has the same definition as A in Formula (b), and has the same preferable definition as A in Formula (b).

In Formula (e), the position to which a polymerizable group relating to the polymerization of the colorant (relating to the formation of the colorant multimer) is introduced is not particularly limited, but is preferably $R^{34}$ and/or $A^{31}$, in view of synthetic compatibility.

Formula (f)

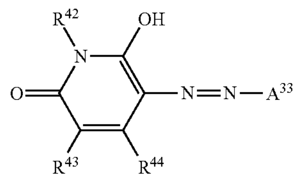

In Formula (f), $R^{42}$ represents a hydrogen atom, an alkyl group, an alkenyl group, an aryl group or a heterocyclic group; $R^{43}$ and $R^{44}$ each independently represent a hydrogen atom or a substituent; and $A^{33}$ represents an aryl group or an aromatic heterocyclic group.

Hereinbelow, each of the substituents in Formula (f) is described in detail.

$R^{42}$ represents a hydrogen atom, an alkyl group (a straight-chain, branched-chain or cyclic alkyl group having preferably 1 to 36, more preferably 1 to 12 carbon atoms, such as a methyl group, an ethyl group, a propyl group, an isopropyl group, a butyl group, an isobutyl group, a t-butyl group, a hexyl group, a 2-ethylhexyl group, a dodecyl group, a cyclopropyl group, a cyclopentyl group, a cyclohexyl group or a 1-adamantyl group), an alkenyl group (an alkenyl group having preferably 2 to 24, more preferably 2 to 12 carbon atoms, such as a vinyl group, an allyl group or a 3-buten-1-yl group), an aryl group (an aryl group having preferably 6 to 36, more preferably 6 to 18 carbon atoms, such as a phenyl group or a naphthyl group) or a heterocyclic group (a heterocyclic group having preferably 1 to 24, more preferably 1 to 12 carbon atoms, such as a 2-thienyl group, a 4-pyridyl group, a 2-furyl group, a 2-pyrimidinyl group, a 1-pyridyl group, a 2-benzothiazolyl group, a 1-imidazolyl group, a 1-pyrazolyl group or a benzotriazol-1-yl group).

$R^{43}$ and $R^{44}$ each independently represent a hydrogen atom or a substituent. Examples of the substituent represented by $R^{43}$ or $R^{44}$ include substituents such as those represented by $R^1$ to $R^6$ in Formula (N). When the substituent represented by $R^{43}$ or $R^{44}$ is a group that may further be substituted, it may be substituted by any of the substituents represented by $R^1$ to $R^6$ in Formula (N). When the substituent represented by $R^{43}$ or $R^{44}$ has two or more substituents, the substituents may be the same as or different from one another.

$A^{33}$ has the same definition as A in Formula (b), and has the same preferable definition as A in Formula (b).

In Formula (f), the position to which a polymerizable group relating to the polymerization of the colorant (relating to the formation of the colorant multimer) is introduced is not particularly limited, but is preferably $R^{42}$ and/or $A^{33}$, in view of synthetic compatibility.

Among the azo colorants described above, the azo colorant represented by Formula (f) is preferable as a yellow colorant in view of spectroscopic properties, and the azo colorant represented by Formula (d) as a yellow colorant in view of light fastness and heat resistance.

The azo colorant or the dipyrromethene colorant can be easily synthesized in accordance with the methods such as those described in JP-A Nos. 2005-189802, 2007-250224, 2006-124634, 2007-147784, 2007-277176, and 2008-292970, and U.S. Pat. No. 5,789,560.

Further, the azo colorant or the dipyrromethene colorant can be synthesized using known methods such as a method of multimerizing the colorant, or a method of introducing a polymerizable group into a colorant. Specific examples of the methods are described in Examples.

(2) Constituent Unit Having Group Derived from Colorant

The constituent unit having a group derived from a colorant preferably a constituent unit having a group derived from the above-described preferable colorant group. Hereinbelow, specific examples of the constituent units having a group derived from a colorant are shown, but the invention is not particularly limited to these examples.

Hereinbelow, the constituent unit having a group derived from a colorant may be referred to as a "colorant unit".

(1-1)

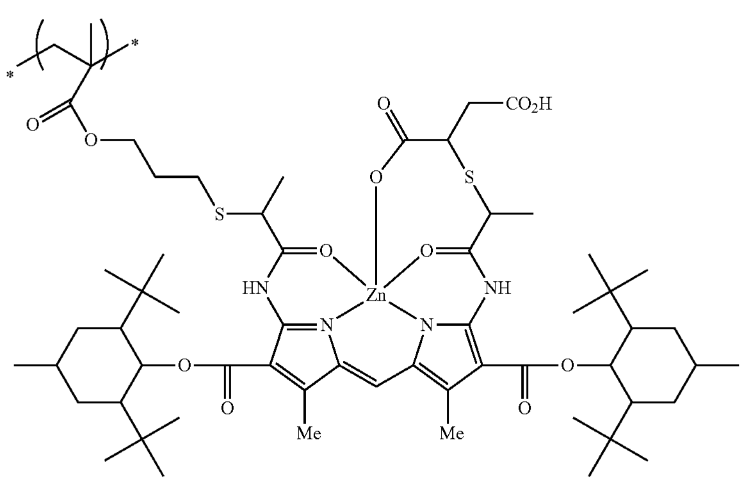

-continued
(1-2)
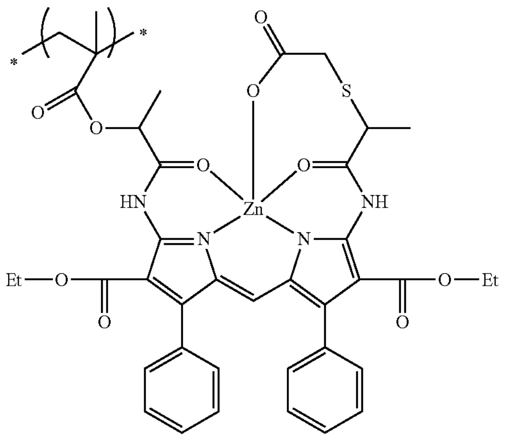
(1-3)
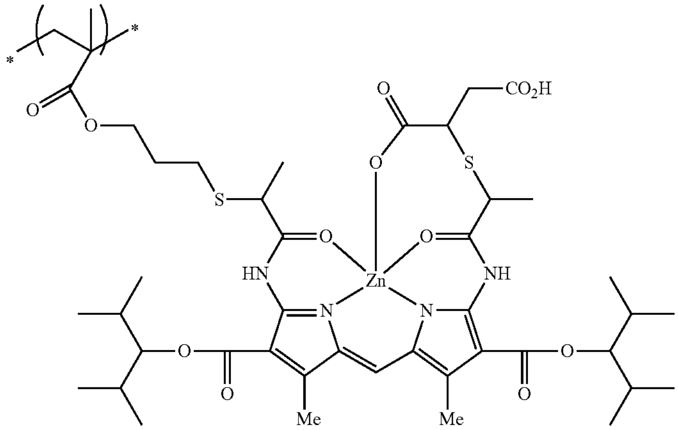
(1-4)
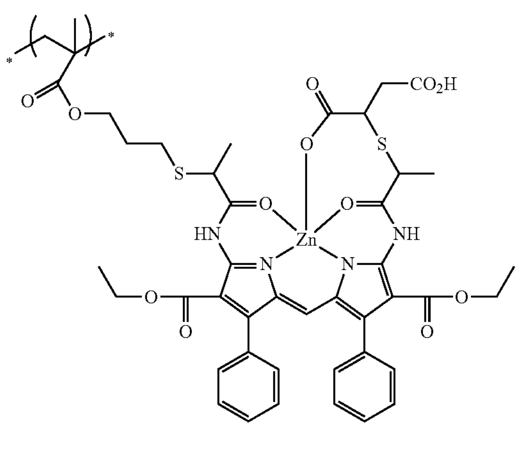
(1-5)
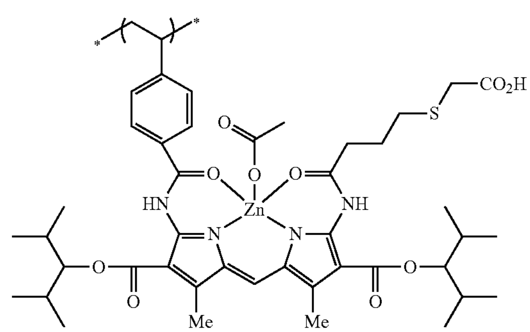

-continued
(1-6)
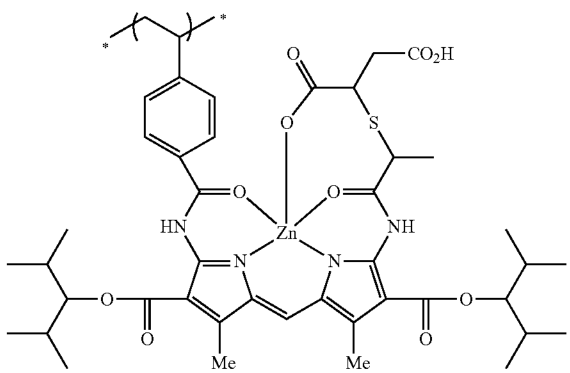
(1-7)
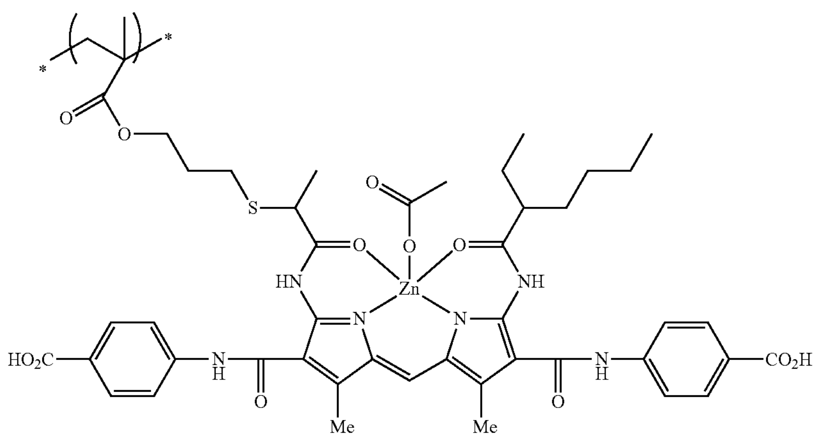
(1-8)
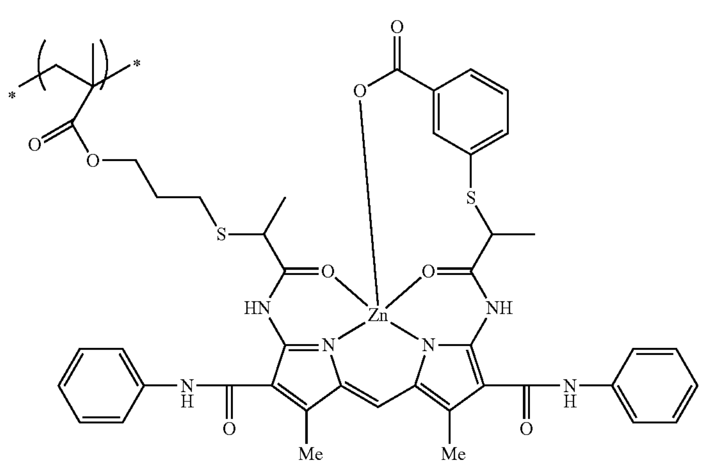

-continued
(2-1)
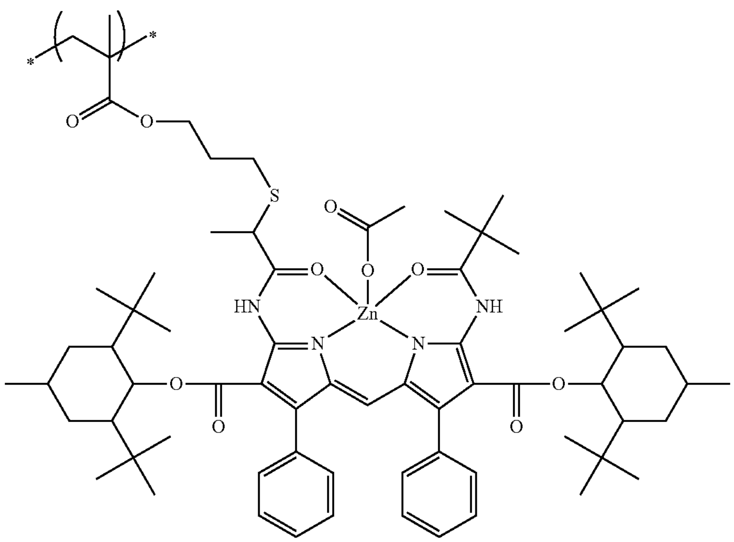
(2-2)
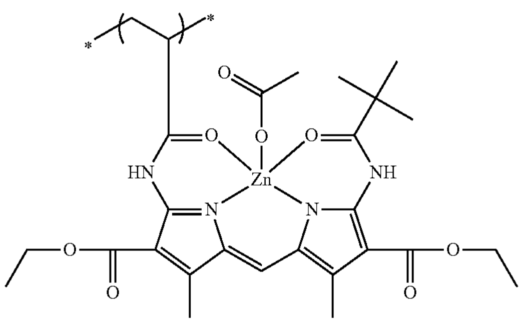
(2-3)
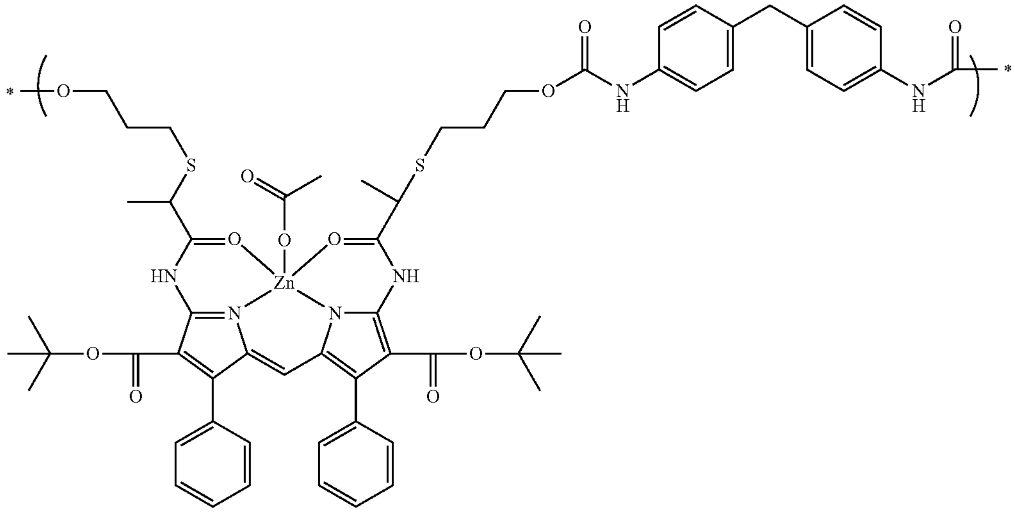

-continued
(2-4)
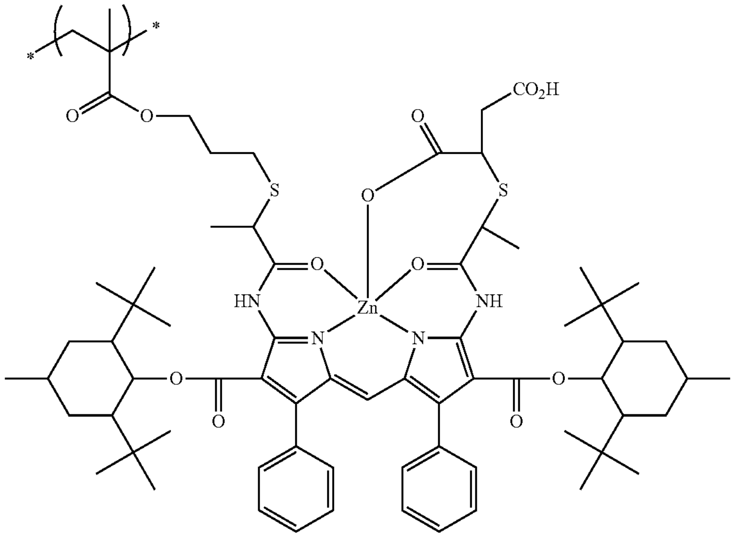
(2-5)
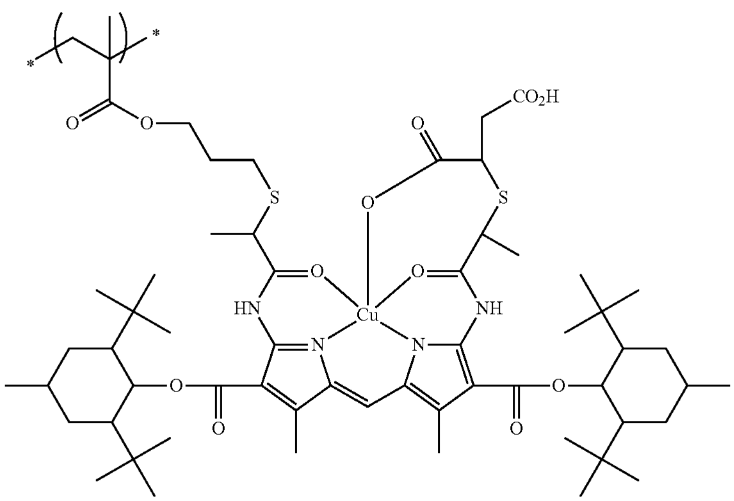
(2-6)
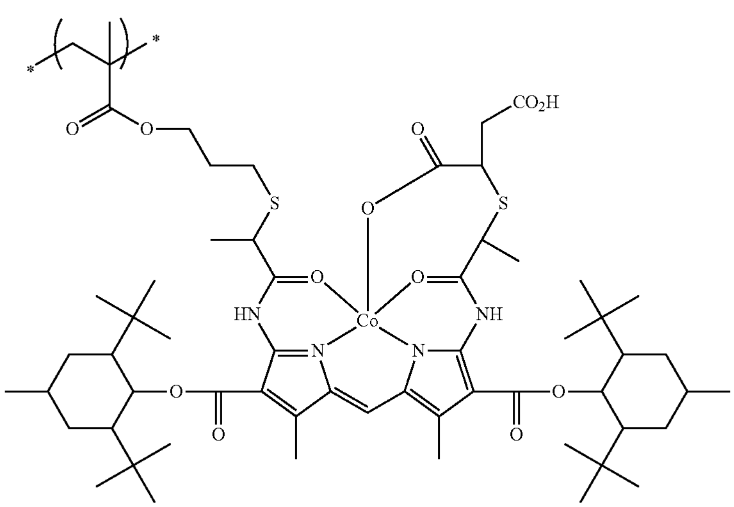

-continued
(2-7)
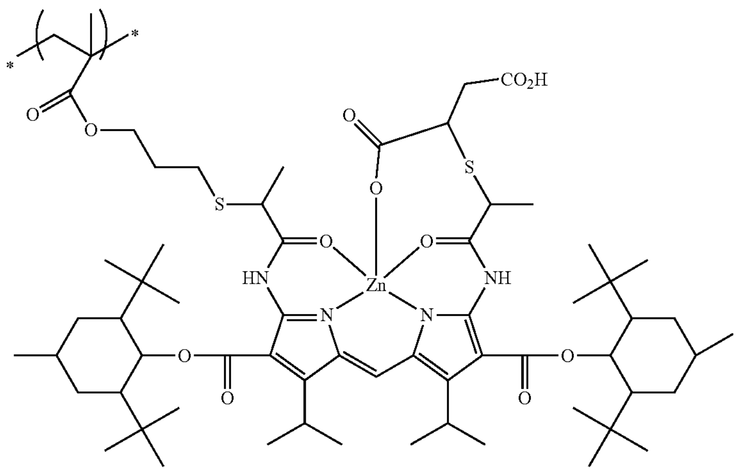
(2-8)
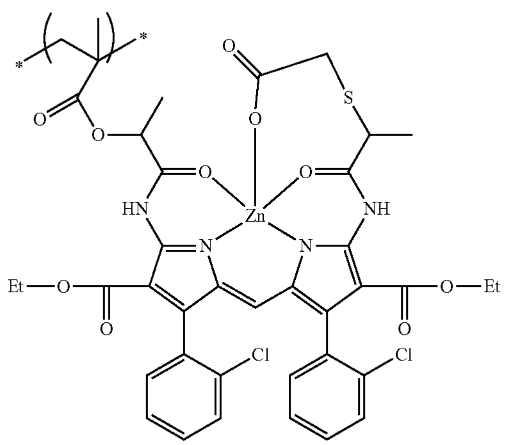
(2-9)
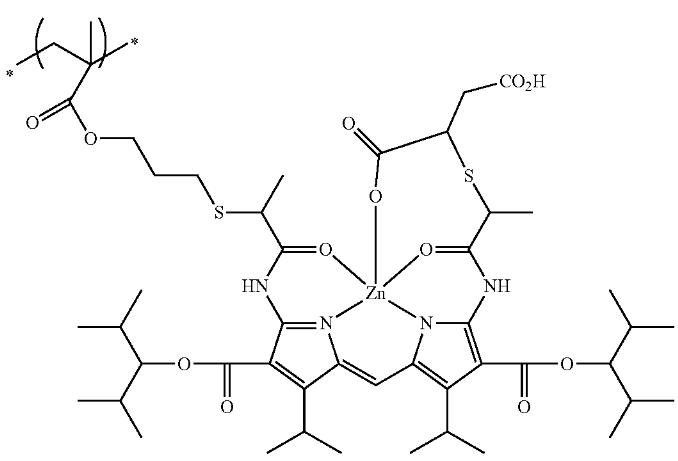

-continued
(2-10)
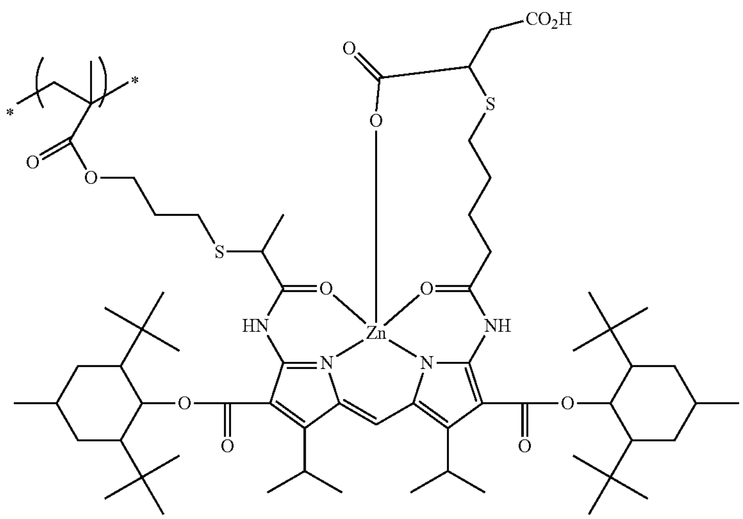
(2-11)
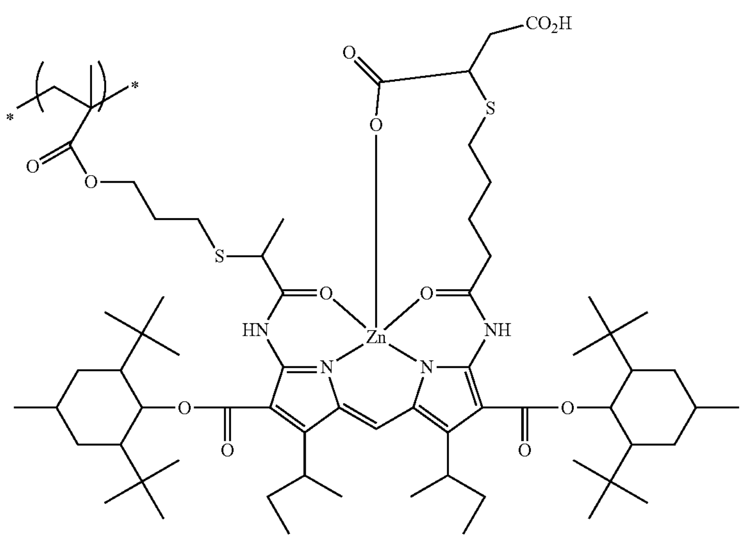
(2-12)
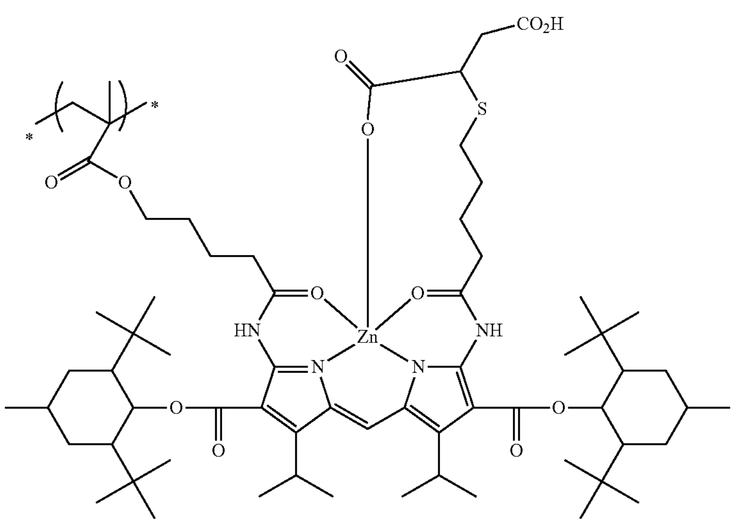

-continued
(2-13)
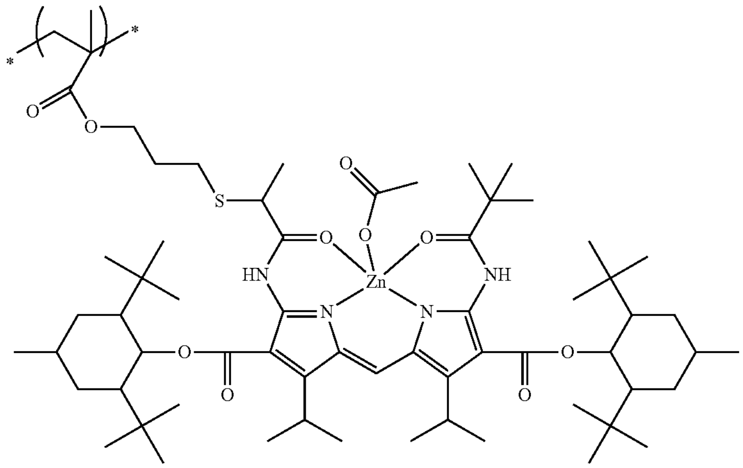
(2-14)
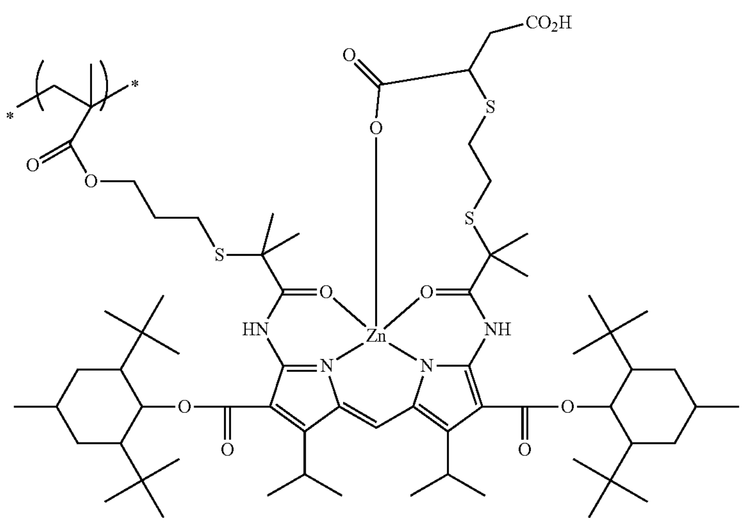
(2-15)
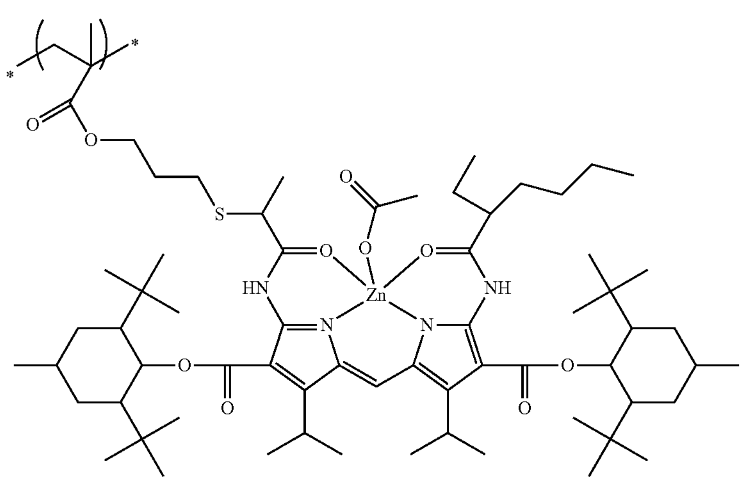

-continued
(2-16)
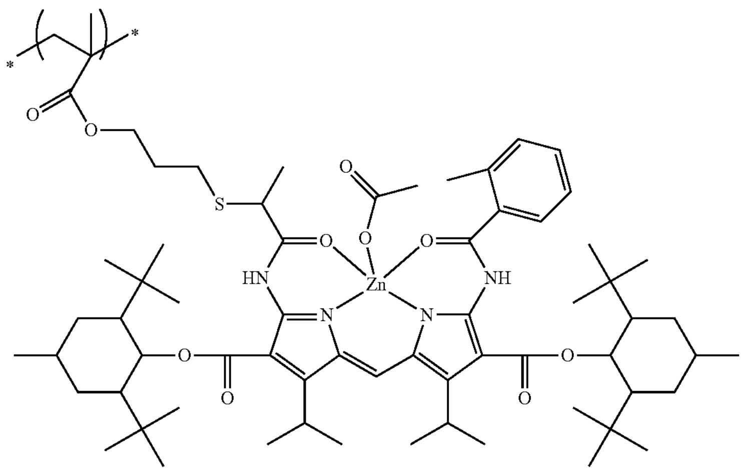
(2-17)
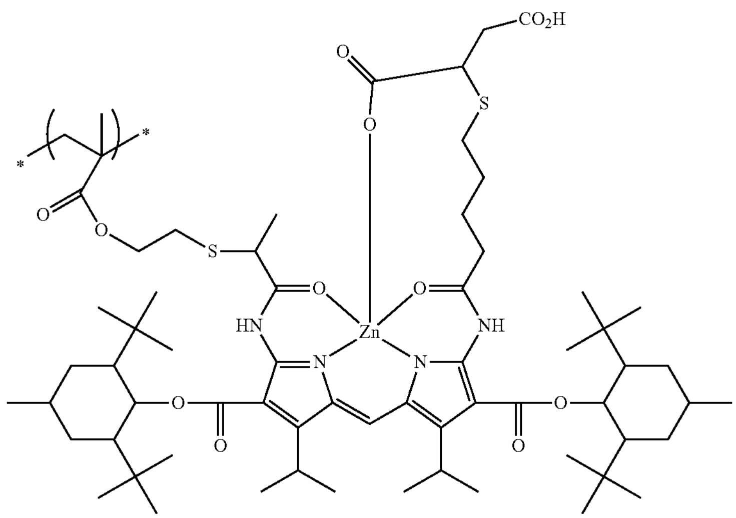
(2-18)
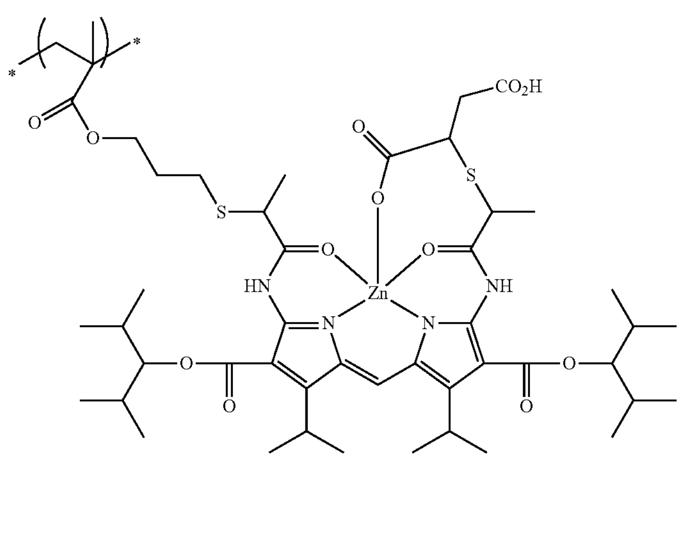

-continued
(2-19)
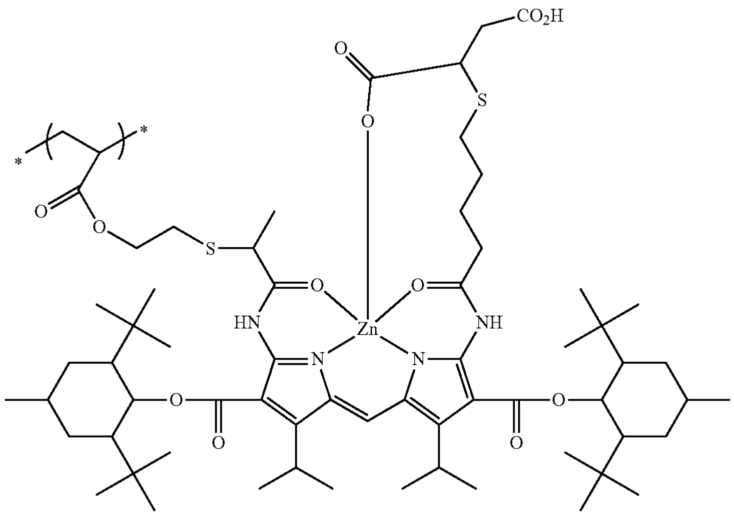
(2-20)
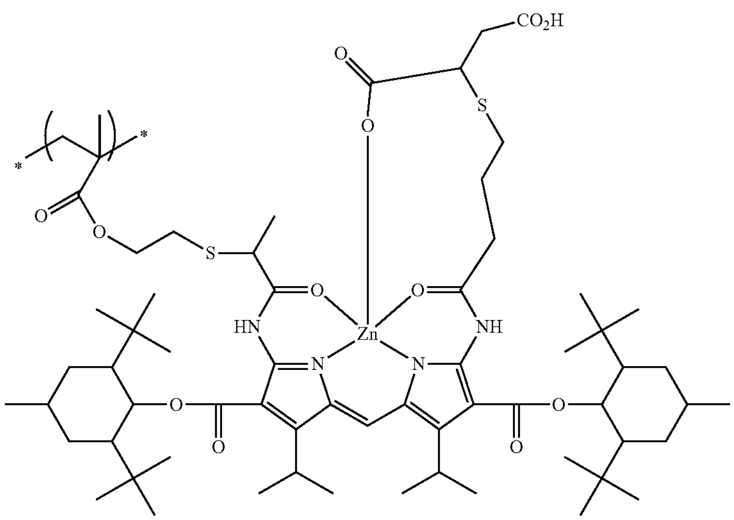
(2-21)
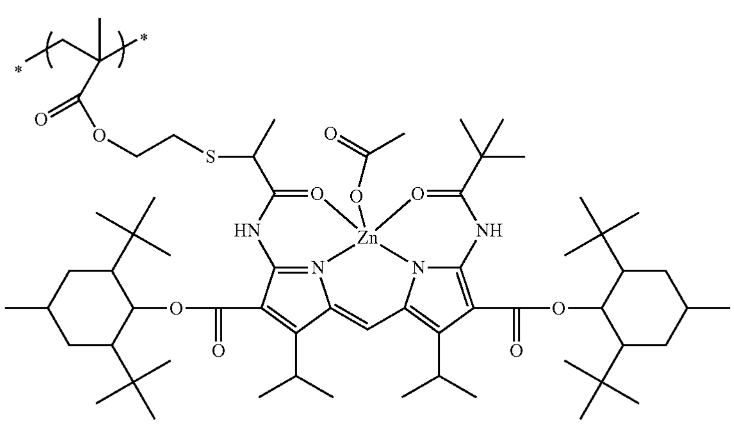

-continued (2-22)

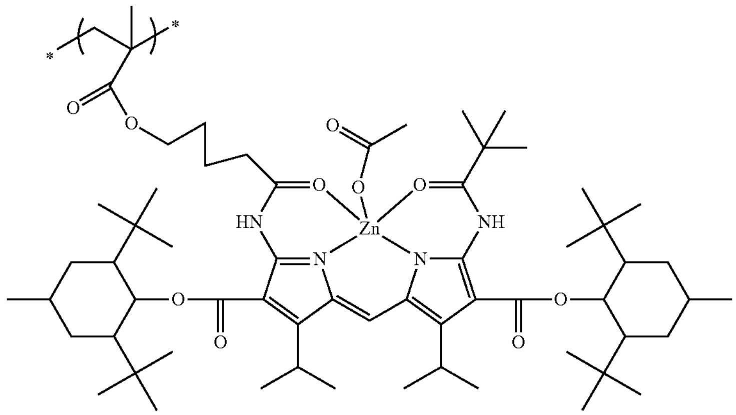

(2-23)

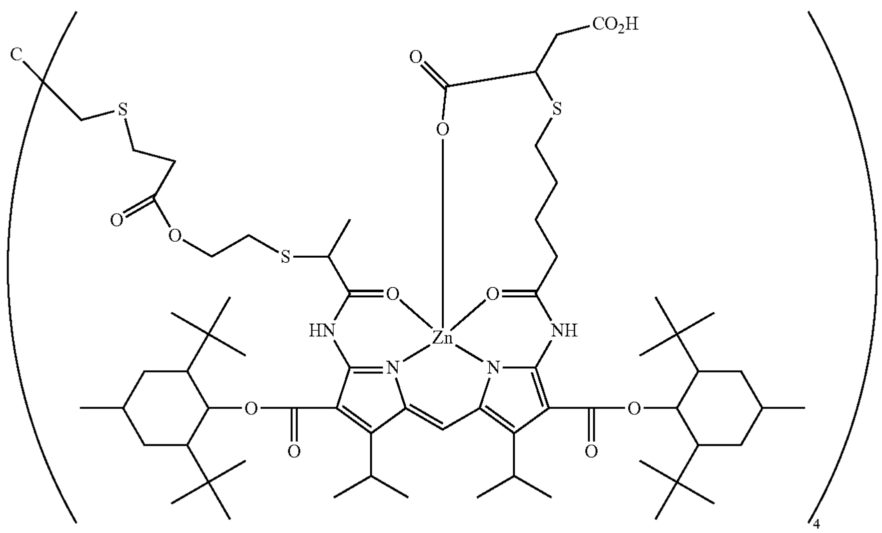

(2-24)

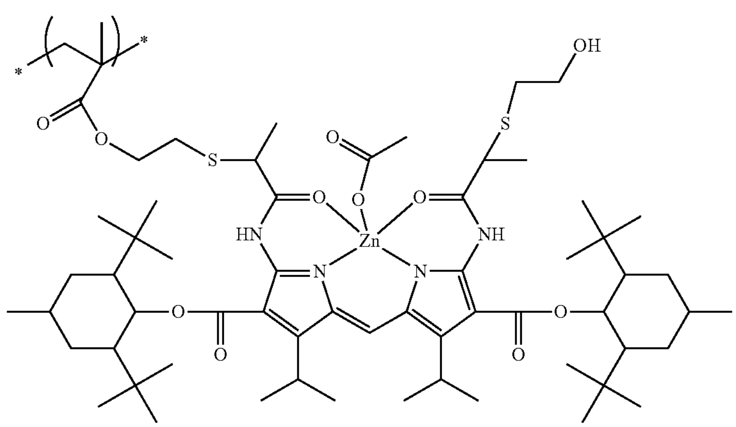

In the examples of the colorant unit above, when the colorant unit includes two or more carboxy groups, the examples of the colorant unit also include tautomers thereof obtained by an isomerization reaction between these carboxy groups and a metal atom (such as Zn, Cu or Co). Among the above examples, the colorant units 1-1, 1-3, 1-4, 1-6, 2-4, 2-5, 2-6, 2-7, 2-9, 2-10, 2-11, 2-12, 2-14, 2-17, 2-18, 2-19, 2-20 and 2-23 include two or more carboxy groups. For example, the colorant unit 2-7 also includes the colorant unit 2-7'.

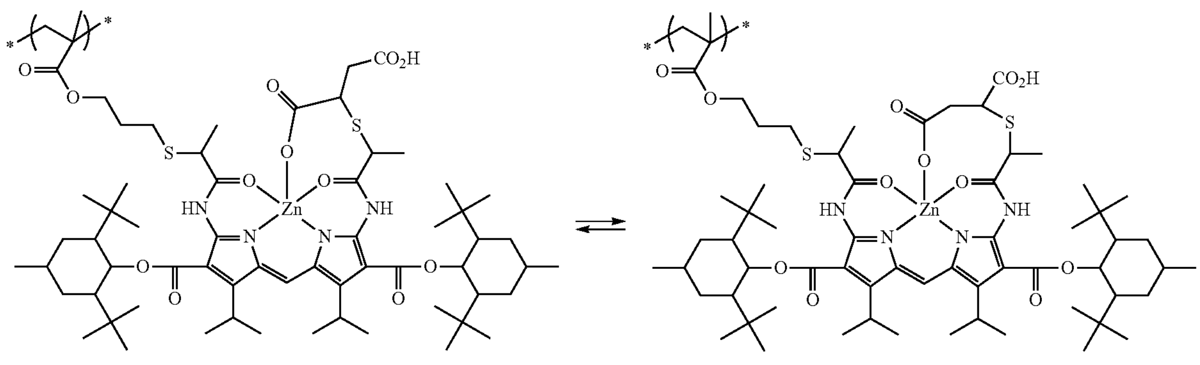
(2-7) (2-7')
Specific examples of the colorant unit further include the following.
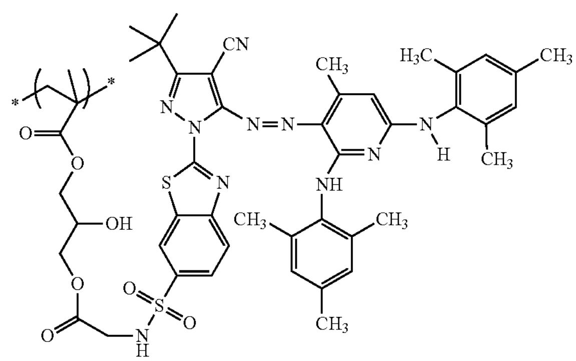
(3-1)
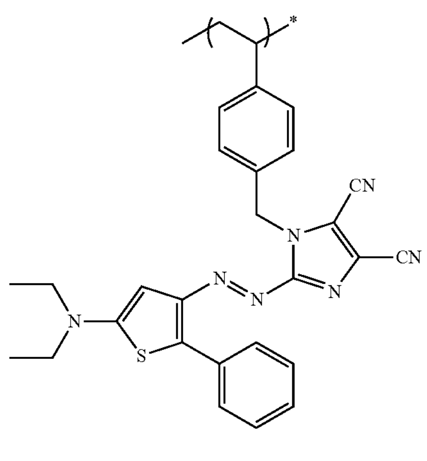
(3-2)
-continued
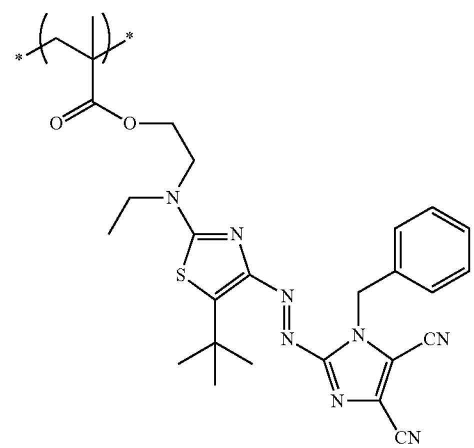
(3-3)
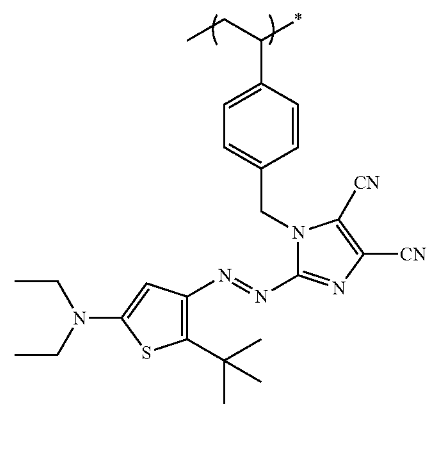
(3-4)

-continued (3-5)

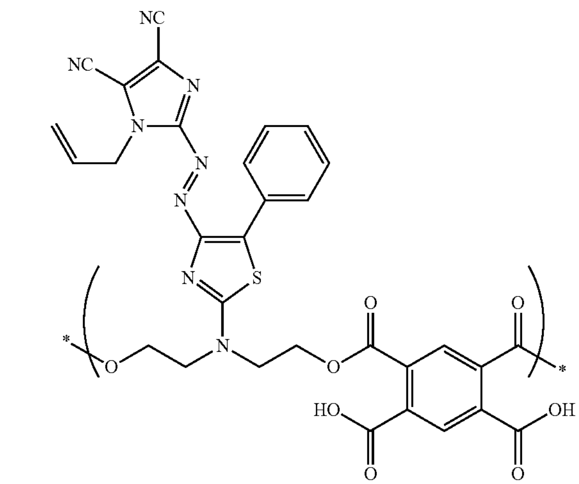

(3-6)

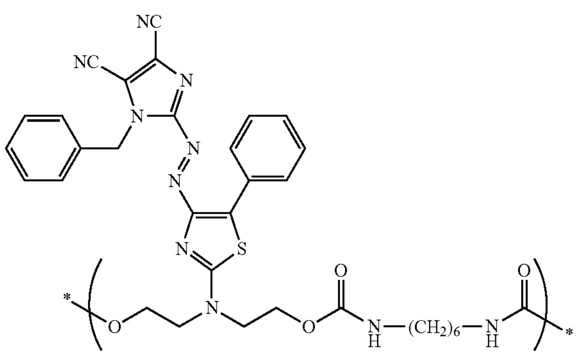

(3) Constituent Unit Having Polymerizable Group

Examples of the constituent unit having a polymerizable group included in the colorant multimer containing a polymerizable group of the invention include the following constituent units.

Specifically, examples thereof include constituent units that are formed by, to a constituent unit derived from the copolymerizable component (such as methacrylic acid, acrylic acid or hydroxyethyl methacrylate), which is formed by copolymerizing the above-described colorant compound, adding a polymerizable compound (such as glycidyl methacrylate or methacryloxy ethyl isocyanate) having a group that can react with the constituent unit.

When the colorant compound has a reactive group, a constituent unit that serves as both a constituent unit having a polymerizable and a constituent unit having a group derived from a colorant can be obtained by reacting the colorant compound with a polymerizable compound having a group that can react with the constituent unit having a group derived from a colorant.

Alternatively, the colorant multimer containing a polymerizable group can be obtained by a method, in which a polymerizable group other than the polymerizable group relating to the multimerization of a colorant compound is introduced into the azo colorant skeleton or the dipyrromethene colorant skeleton of the colorant compound, and then the colorant compound is polymerized.

Furthermore, the constituent unit having a polymerizable group can be obtained by polymerization of a colorant compound to which a precursor of the polymerizable group has been introduced, or a copolymerization component which does not have a colorant skeleton, and thereafter conducting various reactions (such as a treatment with an alkaline solution) to form a polymerizable group from the precursor of the polymerizable group.

Examples of the polymerizable group contained in the constituent unit having a polymerizable group (hereinafter, sometimes referred to as a "polymerizable unit") include, but not limited to, an ethylenically unsaturated group (such as a methacrylic acid group, an acrylic acid group or a styryl group), a cyclic ether group (such as an epoxy group or an oxetanyl group). Among these, an ethylenically unsaturated group is preferable, in view of heat resistance and solvent resistance.

Examples of the constituent units having a polymerizable group include the following examples. However, the invention is not particularly limited to these examples.

(G-1)

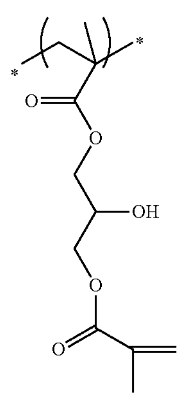

(G-2)

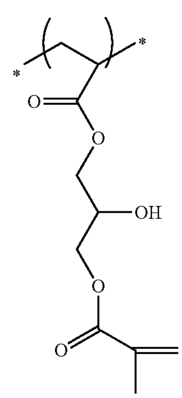

-continued
(G-3)
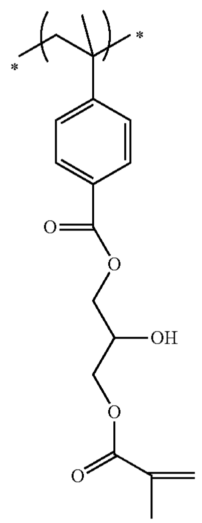
(G-4)
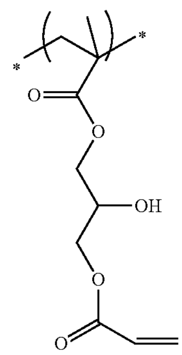
(G-5
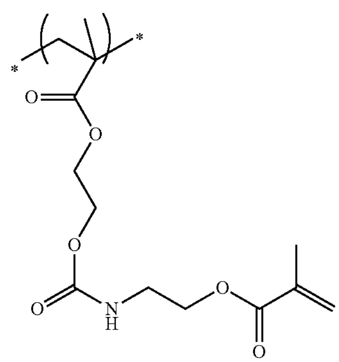
(G-6)
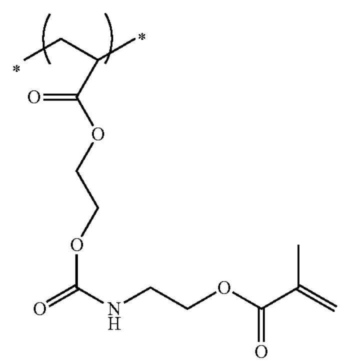
(G-7)
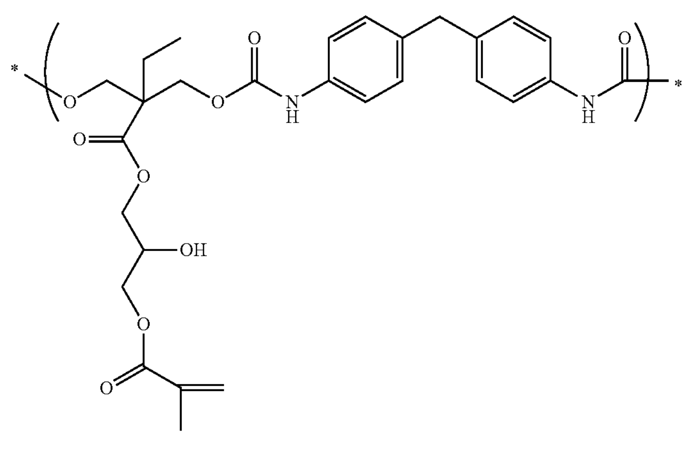

-continued
(G-8)
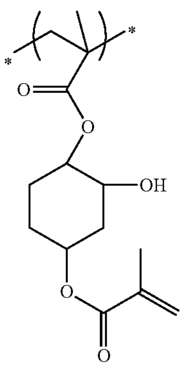
(G-9)
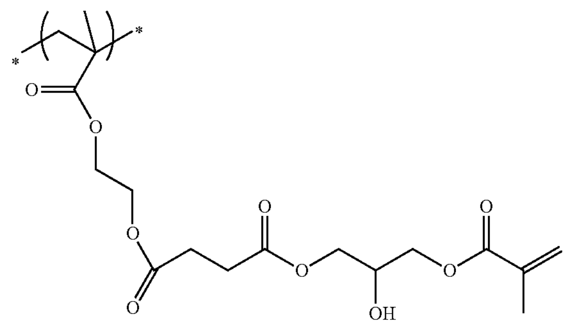
(G-10)
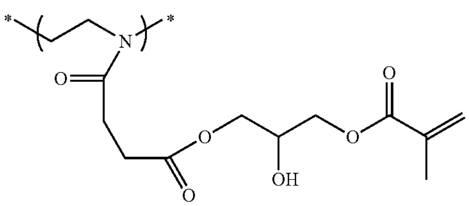
(G-11)
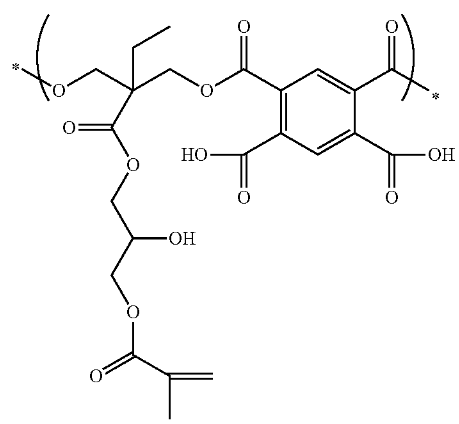
(G-12)
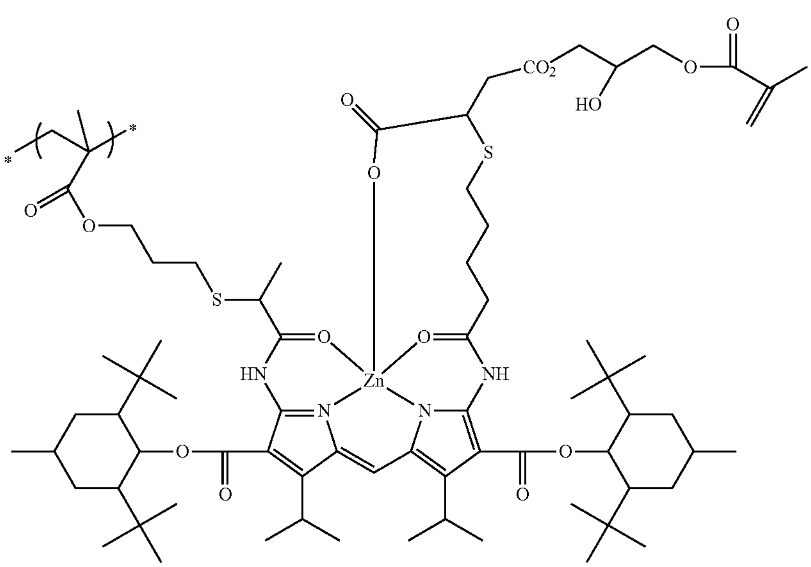

-continued
(G-13)
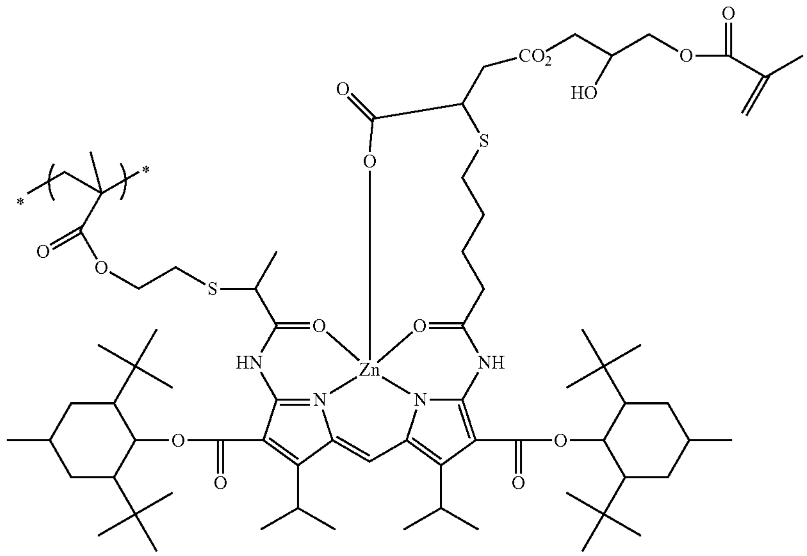
(G-14)
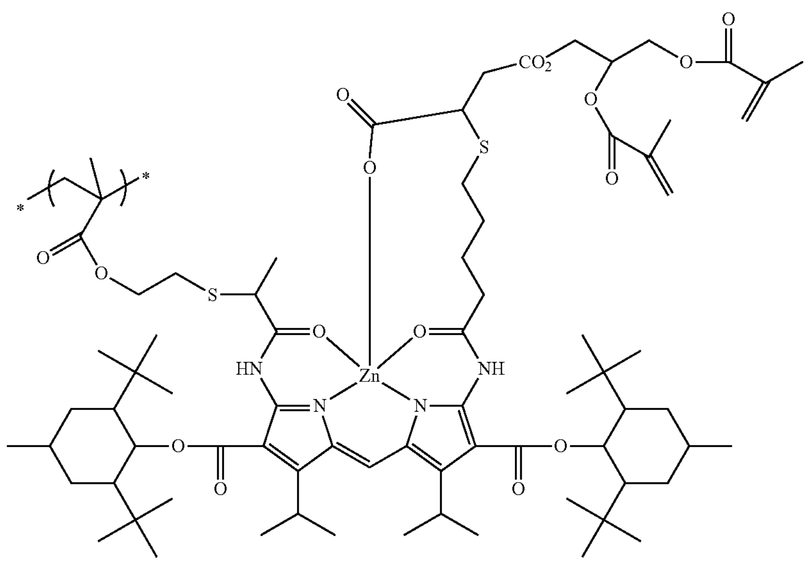
(G-15)
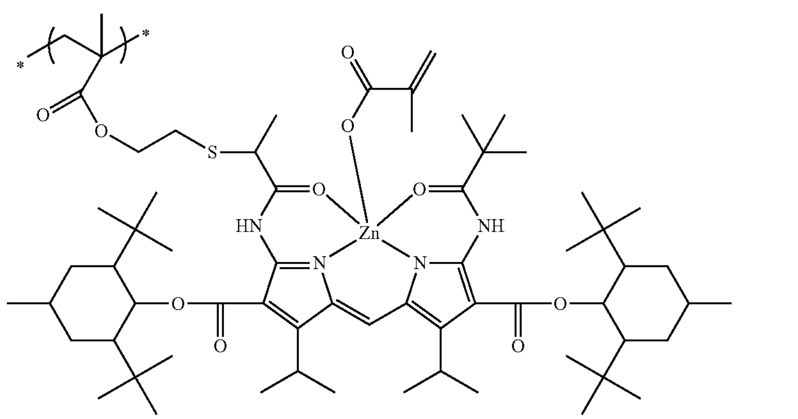

-continued (G-16)

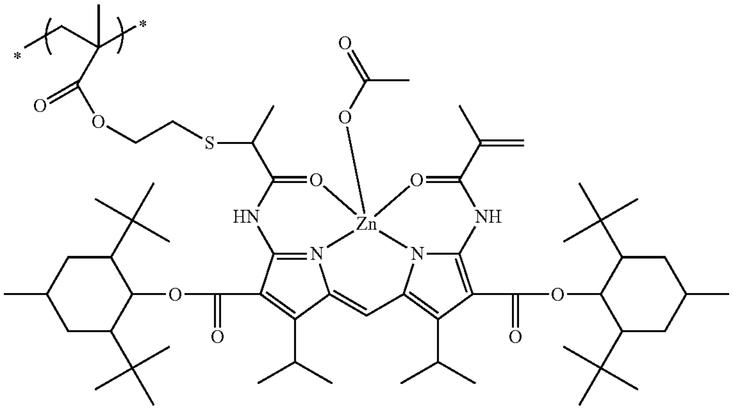

(G-17)

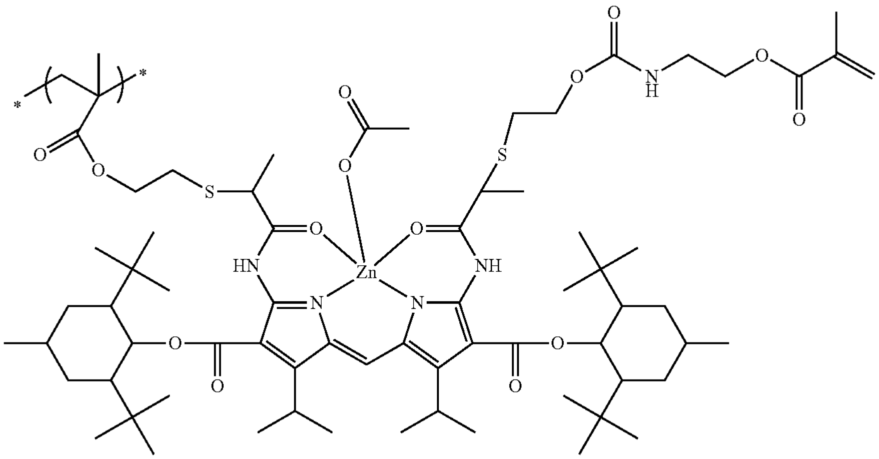

(G-18)

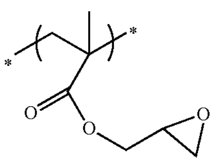

(G-19)

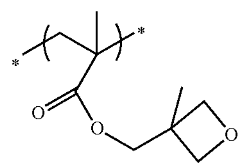

(G-20)

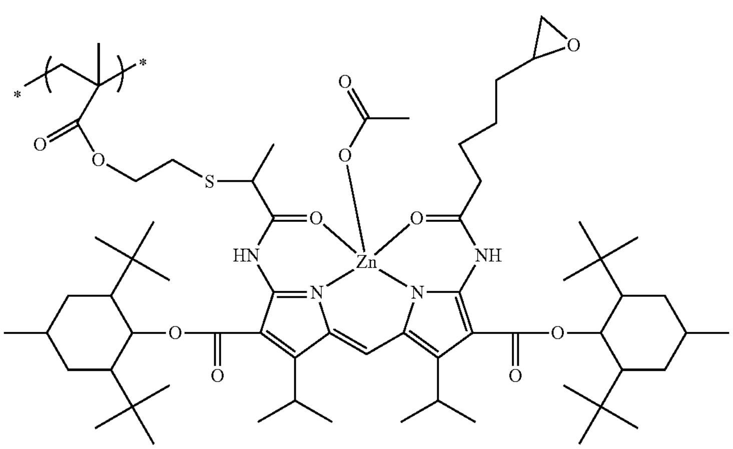

(4) Other Constituent Units

The colorant multimer having a polymerizable group may include other an additional copolymerizable component as a constituent unit, unless the effect of the invention is impaired. When the colorant multimer having a polymerizable group is synthesized by radical polymerization, the additional copolymerizable component may be a monomer having at least one ethylene group. Specific examples thereof include the following.

Examples of the copolymerizable monomer include acrylic acid, and α-chloroacrylic acid, α-alkyl acrylic acid (such as methacrylic acid or α-hydroxymethyl acrylic acid), salts, esters or amides derived from acrylic acid (such as sodium acrylate, tetramethyl ammonium methacrylate, sodium 2-acrylamido-2-methyl propanesulfonate, sodium 3-acryloyloxy propanesulfonate, acryl amide, methacrylamide, diacetone acrylamide, methyl acrylate, methyl methacrylate, ethyl methacrylate, n-butyl methacrylate, 2-ethylhexyl methacrylate, 2-hydroxyethyl methacrylate, 2-hydroxyethyl acrylate, 2-dimethylaminoethyl methacrylate or benzyl methacrylate), vinyl esters (such as vinyl acetate), acrylonitrile, aromatic vinyl compounds (such as styrene, p-styrene carboxylic acid or p-styrene sulfonic acid), vinylidene chloride, a vinyl alkyl ether (such as vinyl ethyl ether), maleates, itaconic acid, vinyl imidazole, vinyl pyridine, vinyl pyrrolidone, and vinyl carbazole.

Specific examples of the constituent unit obtained by polymerizing the polymerizable monomers include the following, but the invention is not particularly limited to these examples.

(H-1)

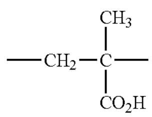

(H-2)

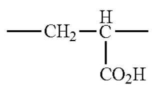

(H-3)

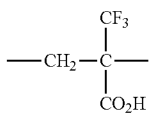

(H-4)

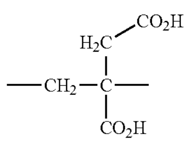

(H-5)

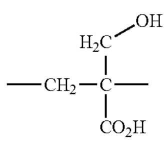

(H-6)

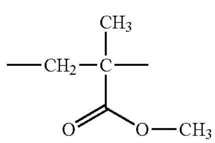

(H-7)

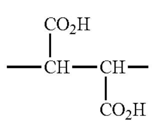

(H-8)

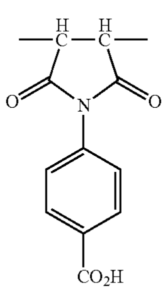

-continued (H-9)

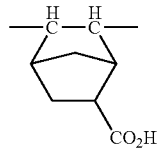

(H-10)

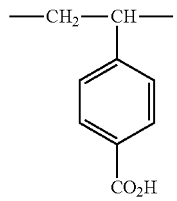

(H-11)

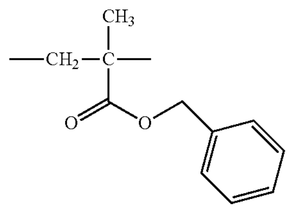

(H-12)

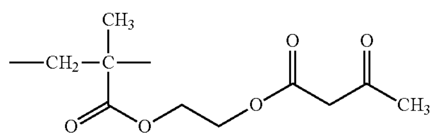

(H-13)

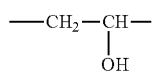

(H-14)

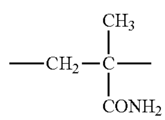

(H-15)

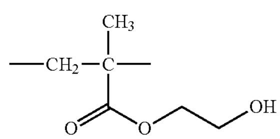

(H-16)

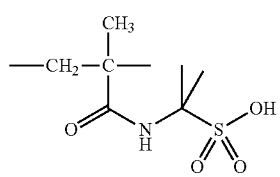

(H-17)

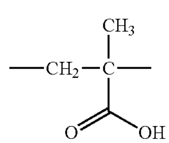

(H-18)

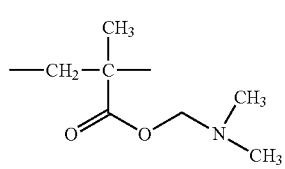

-continued (H-19)

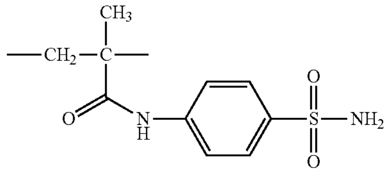

(H-20)

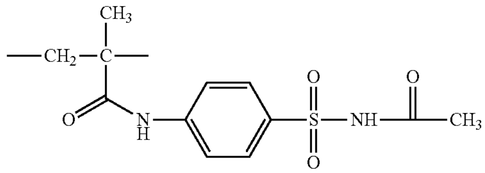

(H-21)

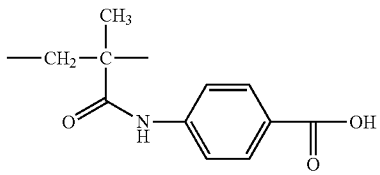

When the colorant multimer having a polymerizable group is synthesized by polycondensation or polyaddition (for example, polyester, polyurea, polyamide and polyamic acid), the copolymerizable monomer may be a monomer having at least two reactive groups (for example, alcohols such as 1,6-hexanediol or 2,2-bishydroxymethyl propanoic acid, isocyanates such as 1,3-tolyldiisocyanate or 1,6-hexanediisocyanate, amines such as ethylenediamine or trimethylene diamine, and acid anhydrides).

In order to improve the formability of the color pattern, the copolymerizable monomer is preferably a monomer having an alkali-soluble group such as methacrylic acid or acrylic acid.

The colorant multimer having a polymerizable group includes an alkali-soluble group preferably in an amount of 1% by mass to 40% by mass, more preferably in an amount of 3% by mass to 20% by mass, and still more preferably in an amount of 5% by mass to 15% by mass, in view of the formability of the color pattern when the colorant multimer having a polymerizable group is used for the colored curable composition.

Hereinbelow, in the colorant multimer having a polymerizable group, the constituent unit derived from the monomer having an alkali-soluble group may be referred to as an "alkali-soluble unit".

(5) Specific Examples of Colorant Multimer Having a Polymerizable Group

In the colorant multimer having a polymerizable group of the invention, the type, the combination and the content (% by mass) of each of the colorant unit, the polymerizable unit and other constituent units (preferably the alkali-soluble unit) are not specifically limited.

The preferable embodiment of the combination of these units is as follows: the dye unit is preferably a constituent unit having a group derived from one of the above-described preferable colorants, and more preferably a constituent unit having a group derived from the dipyrromethene colorant represented by Formula (a), or a constituent unit having a group derived from the azo colorant represented by Formula (c); the polymerizable unit is preferably a constituent unit having an ethylenically unsaturated group; and the alkali-soluble unit is preferably a constituent unit derived from methacrylic acid or acrylic acid.

Specific examples of the compounds of the colorant multimer having a polymerizable group of the invention are shown in the following Tables 11 and 12, but the invention is not particularly limited to these examples.

In Tables 11 and 12, the number of each unit corresponds to the number of an Exemplary Compound as described above, and the colorant unit (4-1) is a compound represented by the following formula:

(4-1)

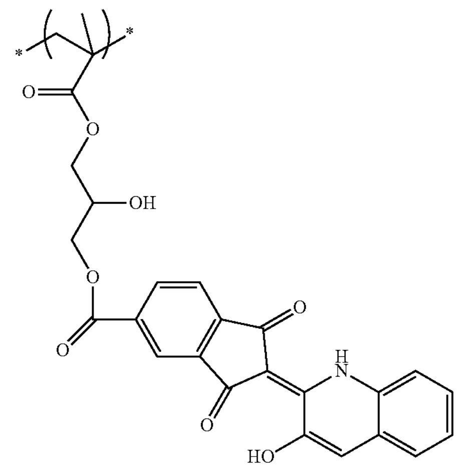

TABLE 11

| Exemplary compound | Colorant unit | Polymerizable unit | Alkali-soluble unit* | Content ratio of each unit (% by mass) |
|---|---|---|---|---|
| 101 | 1-1 | G-1 | Methacrylic acid | 85/10/5 |
| 102 | 2-1 | G-1 | — | 90/10 |
| 103 | 2-1 | G-1 | Methacrylic acid | 85/10/5 |
| 104 | 2-1 | G-1 | Acrylic acid | 85/10/5 |
| 105 | 2-3 | G-7 | — | 90/10 |
| 106 | 2-4 | G-1 | — | 90/10 |
| 107 | 3-2 | G-1 | Methacrylic acid | 85/10/5 |
| 108 | 3-4 | G-1 | — | 90/10 |
| 109 | 3-4 | G-1 | Methacrylic acid | 58/28/14 |
| 110 | 3-4 | G-1 | Styrene carboxylic acid | 85/10/5 |
| 111 | 3-5 | G-11 | — | 90/10 |
| 112 | 3-4, 4-1 | G-1 | Methacrylic acid | 85/10/5 |

*Alkali-soluble unit as a copolymerized monomer is shown

TABLE 12

| Exemplary compound | Colorant unit | Polymerizable unit | Unit having colorant and polymerizable group | Alkali-soluble unit | Content ratio of each unit (% by mass) |
|---|---|---|---|---|---|
| 113 | 2-10 | G-1 | — | H-1 | 85/10/—/5 |
| 114 | 2-10 | G-1 | G-12 | H-1 | 55/10/30/5 |
| 115 | 2-17 | G-1 | — | H-1 | 85/10/—/5 |
| 116 | 2-17 | G-1 | G-13 | H-1 | 55/10/30/5 |
| 117 | 2-17 | G-1 | G-13 | — | 55/15/30/— |
| 118 | 2-17 | — | G-13 | H-1 | 55/—/30/15 |
| 119 | 2-17 | G-1 | G-14 | H-1 | 55/10/30/5 |
| 120 | — | — | G-16 | H-1 | —/—/85/15 |
| 121 | 2-19 | G-2 | — | H-2 | 85/10/—/5 |
| 122 | 2-21 | G-1 | — | H-1 | 85/10/—/5 |
| 123 | 2-24 | — | G-17 | H-1 | 55/—/30/15 |
| 124 | 2-24 | G-5 | G-17 | H-15 | 55/10/30/5 |
| 125 | 2-15 | G-18 | — | H-1 | 85/10/—/5 |
| 126 | 2-15 | G-19 | — | H-1 | 85/10/—/5 |

The content of the colorant multimer having a polymerizable group in the colored curable composition according to the invention varies depending on the molecular weight and molar absorption coefficient thereof, and is preferably from 0.5% by mass to 80% by mass, more preferably from 0.5% by mass to 70% by mass, and still more preferably from 1% by mass to 70% by mass, with respect to the total solid content of the composition.

In the colored curable composition according to the present invention, the colorant multimer having a polymerizable group may be used in combination with a colorant having another structure. The colorant having another structure is not specifically limited. The colorant having another structure may be a dye or a pigment, and known colorant conventionally used for a color filter can be used. Examples thereof include colorants such as those described in JP-A Nos. 2002-14220, 2002-14221, 2002-14222, and 2002-14223, and U.S. Pat. Nos. 5,667,920 and 5,059,500.

Examples of the chemical structures of the colorant having another structure include a pyrazole azo colorant, an anilino azo colorant, a triphenylmethane colorant, an anthraquinone colorant, an anthrapyridone colorant, a benzylidene colorant, an oxonol colorant, a pyrazolotriazole azo colorant, a pyridone azo colorant, a cyanine colorant, a phenothiazine colorant, a pyrrolopyrazole azomethine colorant, a xanthene colorant, a phthalocyanine colorant, a benzopyran colorant and an indigo colorant.

(B) Polymerizable Compound

The polymerizable compound is polymerized or crosslinked by exposure to, for example, UV light of 400 nm or less or by heat, thereby insolubilizing the colored curable composition in a developer solution. In a photolithographic method, the exposed part and the non-exposed part can be distinguished to form a pattern.

Further, when the colored curable composition according to the invention is used in an inkjet method, cured colored pixels can be obtained using the polymerizable compound.

Specific examples of the polymerizable compound include a compound having at least one ethylenically unsaturated double bond, and preferably a compound having two or more ethylenically unsaturated double bonds. Such compounds are widely known in this industrial field, and may be used in the invention without specific limitation. These compounds may have any chemical form of, for example, a monomer, a prepolymer (that is, a dimer or trimer), an oligomer, or a mixture thereof, or a (co)polymer thereof. In the present invention, the polymerizable compound may be used singly, or in combination of two or more kinds thereof.

More specifically, examples of the monomer or the (co) polymer of the polymerizable compound include unsaturated carboxylic acids (such as acrylic acid, methacrylic acid, itaconic acid, crotonic acid, isocrotonic acid and maleic acid), esters and amides thereof, and (co)polymers thereof. Preferable examples thereof include an ester of an unsaturated carboxylic acid and an aliphatic polyvalent alcohol compound, an amide of an unsaturated carboxylic acid and an aliphatic polyvalent amine compound, and (co)polymers thereof. Furthermore, an adduct of an unsaturated carboxylic acid ester or an amide having a nucleophilic substituent such as a hydroxy group, an amino group or a mercapto group with a monofunctional or multifunctional isocyanate or epoxy; a dehydration condensate of an unsaturated carboxylic acid ester or an amide with a monofunctional or multifunctional carboxylic acid and the like are preferably used. Moreover, an adduct of an unsaturated carboxylic acid ester or amide having an electrophilic substituent such as an isocyanate group or an epoxy group with a monofunctional or multifunctional alcohol, amine or thiol; and a substituted reaction product of an unsaturated carboxylic acid ester or amide having a detachable substituent such as a halogen group or a tosyloxy group with a monofunctional or multifunctional alcohol, amine or thiol are also preferable. Examples thereof further include compounds in which the unsaturated carboxylic acid is replaced with unsaturated phosphonic acid, styrene, vinyl ether or the like.

Specific examples thereof that can be used in the invention include compounds such as those described in paragraphs [0095] to [0108] of JP-A No. 2009-288705.

The polymerizable monomer is preferably a compound which has at least one addition-polymerizable ethylenically unsaturated group and which has a boiling point of 100° C. or higher at atmospheric pressure. Examples of the compound include a monofunctional acrylate or methacrylate such as polyethylene glycol mono(meth)acrylate, polypropylene glycol mono(meth)acrylate or phenoxyethyl (meth)acrylate; polyethylene glycol di(meth)acrylate, trimethylolethane tri (meth)acrylate, neopentyl glycol di(meth)acrylate, pentaerythritol tri(meth)acrylate, pentaerythritol tetra(meth) acrylate, dipentaerythritol penta(meth)acrylate, dipentaerythritol hexa(meth)acrylate, hexanediol (meth) acrylate, trimethylolpropane tri(acryloyloxypropyl)ether, tri (acryloyloxyethyl)isocyanurate; a compound formed by adding ethyleneoxide or propyleneoxide to a polyfunctional alcohol such as glycerin or trimethylolethane and (meth) acrylating the resultant adduct; urethane acrylates such as those described in JP-B Nos. 48-41708 and 50-6034 and JP-A No. 51-37193; polyester acrylates such as those described in JP-A No. 48-64183 and JP-B Nos. 49-43191 and 52-30490; and polyfunctional acrylates or methacrylates such as epoxy (meth)acrylates formed by reaction of an epoxy resin and (meth)acrylic acid; and mixtures thereof.

Among these, an acryl compound having three or more acryloyl groups in the molecule is preferable.

Examples of the compound which has at least one addition-polymerizable ethylenically unsaturated group and which has a boiling point of 100° C. or higher at atmospheric pressure also include compounds such as those described in paragraphs to [0257] of JP-A No. 2008-292970, and paragraphs [0054] to [0068] of JP-A No. 2009-13206.

In addition to the above, radical polymerizable monomers represented by the following Formulae (MO-1) to (MO-5) can be suitably used.

(MO-1)

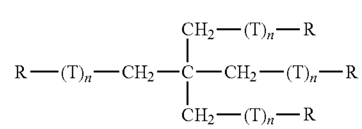

(MO-2)

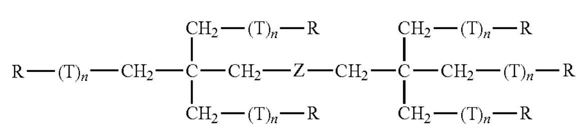

(MO-3)

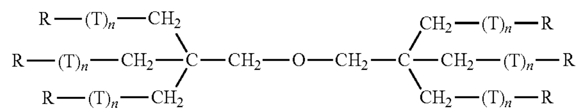

-continued (MO-4)

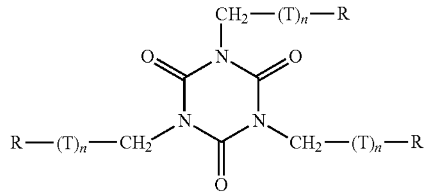

(MO-5)

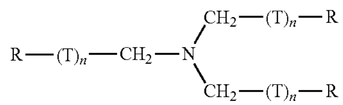

In Formulae (MO-1) to (MO-5), R, T and Z each independently represent the following substituent or linking group; and n represents an integer of from 0 to 14 and m represents an integer of from 0 to 14. In the following R, T and Z, m represents an integer of from 1 to 8. Each R present in a molecule may be the same as or different from one another. Each T in a molecule may be the same as or different from one another. When T represents an oxyalkylene group, the carbon terminal (rather than the oxygen terminal) of the oxyalkylene group combines with R.

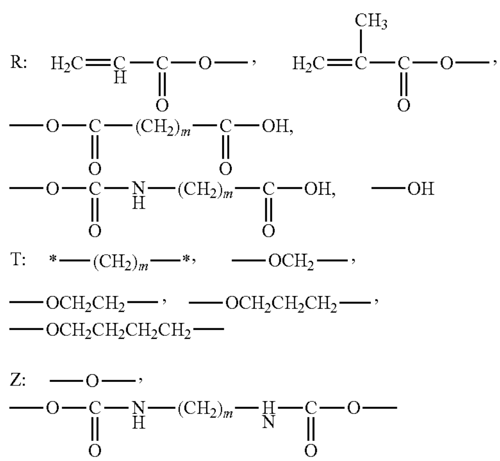

Specific examples of the radical polymerizable monomers represented by Formulae (MO-1) to (MO-5) that can be suitably used in the invention include compounds such as those described in paragraphs [0248] to [0251] of JP-A No. 2007-269779.

The content of the polymerizable compound in the colored curable composition according to the invention is preferably from 0.1% by mass to 90% by mass, more preferably from 1.0% by mass to 80% by mass, and still more preferably from 2.0% by mass to 70% by mass, with respect to the total solid content of the colored curable composition.

Specifically, when the composition according to the invention is used as an inkjet ink, the content of the polymerizable compound is preferably from 30% by mass to 80% by mass, and more preferably from 40% by mass to 80% by mass, with respect to the total solid content of colored curable composition When the amount of the polymerizable compound to be used is within the above range, a pixel portion is sufficiently polymerized, whereby defects in the pixel portion caused by lack of film strength is reduced, the occurrence of cracks or reticulations upon applying a transparent electroconductive film is suppressed, solvent resistance is improved when an orientation film is provided, and reduction in voltage holding ratio is suppressed.

Here, the solid content of the colored curable composition, which is used to determine the mixing ratio, includes all of the components except the solvent, and thus liquid polymerizable compound(s) and the like, if any, are also included in the solid content.

In the colored curable composition according to the present invention, the ratio of the content of (A) the colorant multimer having a polymerizable group and a group derived from an azo colorant or a dipyrromethene colorant to the content of (B) the polymerizable compound (A:B) (% by mass) is preferably 1:0.1 to 1:10, more preferably 1:0.5 to 1:5, in view of pattern formability.

(C) Polymerization Initiator

The colored curable composition according to the invention preferably contains at least one polymerization initiator that generated a radical or an acid, in order to accelerate the rate of curing reaction. When pixels are formed using the photolithographic method, the colored curable composition is required to include the polymerization initiator. When pixels are formed using the inkjet method, since the colored curable composition may be cured by heat treatment, the polymerization initiator is not necessarily included in the colored curable composition. However, in this case, it is preferable that the colored curable composition contains the polymerization initiator.

The colored curable composition according to the invention preferably contains a photopolymerization initiator as the polymerization initiator. The photopolymerization initiator is no particular limited as long as it can polymerize a polymerizable compound, and is preferably selected in consideration of characteristics, initiation efficiency, absorption wavelength, availability, costs, or the like.

Examples of the photopolymerization initiator include at least one active halogen compound selected from halomethyloxadiazole compounds and halomethyl-s-triazine compounds; 3-aryl-substituted coumarin compounds; lophine dimmers; benzophenone compounds; acetophenone compounds and derivatives thereof; cyclopentadiene-benzene-iron complexes and salts thereof; and oxime compounds. Specific examples of the photopolymerization initiator include those described in the paragraphs [0070] to [0077] of JP-A No. 2004-295116. Among these, oxime compounds are preferable in view of rapid polymerization reaction and the like.

Examples of the oxime compound (hereinbelow also referred to as "oxime photopolymerization initiator") is not specifically limited, and specific examples thereof include oxime compounds described in, for example, JP-A No. 2000-80068, WO02/100903A1, and JP-A No. 2001-233842.

Specific examples of the oxime compounds include, but are not limited to, 2-(O-benzoyloxime)-1,[4-(phenylthio)phenyl]-1,2-butanedione, 2-(O-benzoyloxime)-1-[4-(phenylthio)phenyl]-1,2-pentanedione, 2-(O-benzoyloxime)-1-[4-(phenylthio)phenyl]-1,2-hexanedione, 2-(O-benzoyloxime)-1-[4-(phenylthio)phenyl]-1,2-heptanedione, 2-(O-benzoyloxime)-1-[4-(phenylthio)phenyl]-1,2-octanedione, 2-(O-benzoyloxime)-1-[4-(methylphenylthio)phenyl]-1,2-butanedione, 2-(O-benzoyloxime)-1-[4-(ethylphenylthio)phenyl]-1,2-butanedione, 2-(O-benzoyloxime)-1-[4-(butylphenylthio)phenyl]-1,2-butanedione, 1-(O-acetyloxime)-1-[9-ethyl-6-(2-methylbenzoyl)-9H-carbazol-3-yl]ethanone, 1-(O-acetyloxime)-1-[9-methyl-6-(2-methylbenzoyl)-9H-carbazol-3-yl]ethanone, 1-(O-acetyloxime)-1-[9-propyl-6-

(2-methylbenzoyl)-9H-carbazol-3-yl]ethanone, 1-(O-acetyloxime)-1-[9-ethyl-6-(2-ethylbenzoyl)-9H-carbazol-3-yl] ethanone and 1-(O-acetyloxime)-1-[9-ethyl-6-(2-butylbenzoyl)-9H-carbazol-3-yl]ethanone.

Among these, oxime-O-acyl compounds including 2-(O-benzoyloxime)-1-[4-(phenylthio)phenyl]-1,2-octanedione and 1-(O-acetyloxime)-1-[9-ethyl-6-(2-methylbenzoyl)-9H-carbazol-3-yl]ethanone are preferable in view of that a pattern having a good shape (specifically, a rectangle shape of a pattern in case of a solid-state image sensor) may be obtained with smaller amount of exposure. Specific examples thereof include CGI-124 and CGI-242 (trade names, manufactured by BASF Japan Ltd.).

In the invention, the compound represented by the following Formulae (P) and (Q) are preferable as the oxime compound in view of sensitivity, stability over time and coloring during post-heating.

(P)

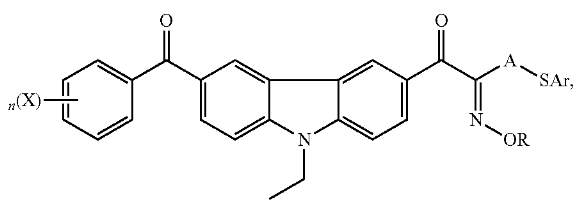

(Q)

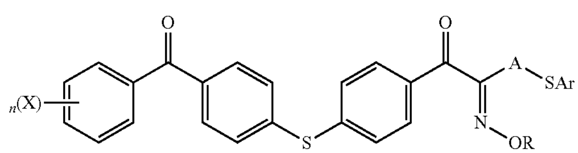

In Formulae (P) and (Q), R and X each independently represent a monovalent substituent, A represents a bivalent organic group, Ar represents an aryl group, and n represents an integer of from 1 to 5.

R Formulae (P) and (Q) preferably represents an acyl group in order to improve sensitivity. Specifically, R preferably represents an acetyl group, a propionyl group, a benzoyl group or a toluoyl group.

A in Formulae (P) and (Q) preferably represents an unsubstituted alkylene group, an alkylene group substituted by an alkyl group (such as a methyl group, an ethyl group, a tert-butyl group or a dodecyl group), an alkylene group substituted by an alkenyl group (such as a vinyl group or an allyl group), or an alkylene group substituted by an aryl group (such as a phenyl group, a p-tolyl group, a xylyl group, a cumenyl group, a naphthyl group, an anthryl group, a phenanthryl group or a styryl group), in order to improve sensitivity and suppress coloring by heating or storing over time.

Ar in Formulae (P) and (Q) preferably represents a substituted or unsubstituted phenyl group in order to improve sensitivity and suppress coloring by heating or storing over time. In case of the substituted phenyl group, preferable examples of the substituent include halogen groups such as a fluorine atom, a chlorine atom, a bromine atom and an iodine atom.

X in Formulae (P) and (Q) preferably represents an alkyl group which may have a substituent, an aryl group which may have a substituent, an alkenyl group which may have a substituent, an alkynyl group which may have a substituent, an alkoxy group which may have a substituent, an aryloxy group which may have a substituent, an alkylthioxy group which may have a substituent, an arylthioxy group which may have a substituent or an amino group which may have a substituent, in order to improve solubility in solvents and improve absorption efficiency in a long wavelength region.

In Formula (P), n preferably represents an integer of 1 or 2.

Hereinbelow specific examples of the compound represented by Formula (P) or Formula (Q) are shown, but the invention is not particularly limited to these examples.

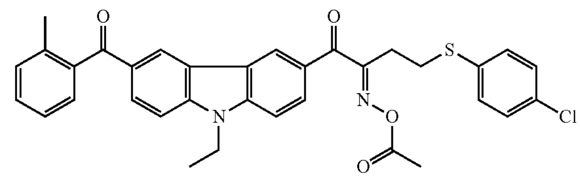

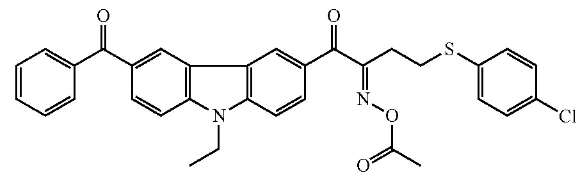

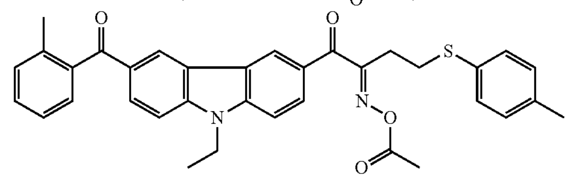

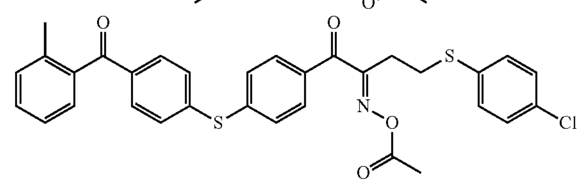

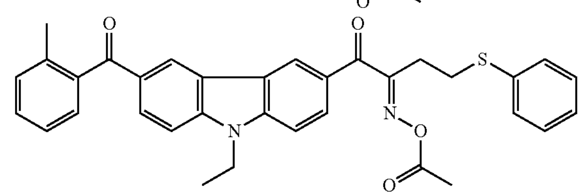

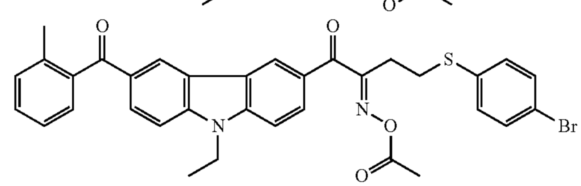

Besides the above-mentioned photopolymerization initiators, other known photopolymerization initiators described in the paragraph [0079] of JP-A No. 2004-295116 may be used for the colored curable composition according to the invention.

The content of the photopolymerization initiator in the colored curable composition is preferably from 0.01% by mass to 50% by mass, more preferably from 1% by mass to 30% by mass, and still more preferably from 1% by mass to 20% by mass, with respect to the solid content of the polymerizable compound. When the content of the photopolymerization initiator is within the above range, sufficient polymerization reaction can be achieved, and a film with favorable strength can be obtained.

(D) Solvent

When the colored curable composition according to the invention is prepared, it is preferable to use a solvent. The solvent to be used is not be specifically limited as long as the solubility of each component of the composition and the coating property of the colored curable composition are satisfied, and, specifically, the solvent is selected especially in consideration of the solubility of binder, coating property, and safety.

Examples of the solvent include solvents such as those described in paragraph of JP-A No. 2008-292970.

Among these solvents, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate are preferable.

It is also preferable that two or more kinds of these solvents are used as a mixture of two or more kinds thereof in view of the solubility of the ultraviolet absorber and an alkali soluble resin, improvement of the state of the surface to be coated, and the like. In this case, it is preferable to use a mixed solution of two or more kinds selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether and propylene glycol methyl ether acetate.

The content of the solvent in the colored curable composition according to the invention is not particularly limited, and is preferably from 20% by mass to 95% by mass, more preferably from 40% by mass to 90% by mass, and still more preferably from 60% by mass to 85% by mass, in view of stability and coating properties of the colored curable composition.

Binder

It is preferable that the colored curable composition according to the invention contains a binder. The binder is not specifically limited as long as it is alkali-soluble, and is preferably selected in consideration of heat resistance, developability, availability, or the like.

The alkali-soluble binder is preferably a linear organic high-molecular weight polymer which is soluble in an organic solvent and can be developed by a weak-alkali aqueous solution. Examples of the linear organic high-molecular weight polymer include polymers such as those described in paragraphs [0227] to [0234] of JP-A No. 2008-292970.

Examples of the alkali-soluble binder that can be used in the invention further includes an adducts of a polymers having hydroxy groups with acid anhydrides, polyhydroxystyrene resins, polysiloxane resins, poly(2-hydroxyethyl(meth) acrylate), polyvinyl pyrrolidone, polyethylene oxides and polyvinyl alcohols. The linear organic high-molecular polymer may be a copolymer with a hydrophilic monomer. Examples thereof include alkoxyalkyl(meth)acrylates, hydroxyalkyl(meth)acrylates, glycerol (meth)acrylates, (meth)acrylamides, N-methylolacrylamides, secondary or tertiary alkylacrylamides, dialkylaminoalkyl(meth)acrylates, morpholine (meth)acrylates, vinylpyrrolidone, vinyltriazole, methyl (meth)acrylates, ethyl (meth)acrylates, branched or straight-chain propyl(meth)acrylates, branched or straight-chain butyl (meth)acrylates, and phenoxyhydroxy propyl (meth)acrylates. Other examples of the hydrophilic monomer include monomers having a tetrahydrofurfuryl group, a phosphoric acid group, a phosphoric acid ester group, a quaternary ammonium salt group, an ethyleneoxy chain, a propyleneoxy chain, a sulfonic acid group or a group derived from a salt thereof, or a morpholinoethyl group.

The alkali-soluble binder may have a polymerizable group at a side chain thereof in order to improve crosslinking efficiency. For example, polymers having an allyl group, a (meth) acryl group or an allyloxyalkyl group at a side chain thereof are useful. Examples of the polymer having a polymerizable group include commercial products including DIANAL NR (tradename) series products (manufactured by MITSUBISHI RAYON CO. LTD.), PHOTOMER 6173 (polyurethane acrylic oligomer containing a COOH group) (trade name, manufactured by Diamond Shamrock Co. Ltd.), VISCOAT R-264 and KS RESIST-106 (tradenames, manufactured by OSAKA ORGANIC CHEMISTRY INDUSTRY LTD.), CYCLOMER P (tradename) series products and PLACCEL CF200 (tradename) series products (manufactured by DAICEL CHEMICAL INDUSTRIES LTD.), and EBECRYL 3800 (tradename, manufactured by DAICEL-CYTEC Company LTD).

In order to improve strength of cured films, alcohol soluble nylons and a polyether of 2,2-bis-(4-hydroxyphenyl)propane and epichlorohydrin are also useful.

It is also preferable that Polymer (a) obtained by polymerizing a compound (hereinbelow, sometimes referred to as an “ether dimer”) represented by the following Formula (Z) is used as the alkali-soluble binder.

(Z)

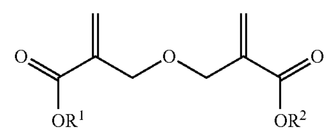

In Formula (Z) $R^1$ and $R^2$ each independently represent a hydrogen atom or a substituted or unsubstituted hydrocarbon group having 1 to 25 carbon atoms.

When the colored curable composition according to the invention includes Polymer (a), heat resistance and clarity of the cured film obtained using the colored curable composition can be improved.

The substituted or unsubstituted hydrocarbon group having 1 to 25 carbon atoms represented by $R^1$ and $R^2$ in Formula (Z) is not specifically limited, and examples thereof include a linear or branched alkyl group such as a methyl group, an ethyl group, an n-propyl group, an isopropyl group, an n-butyl group, an isobutyl group, a t-butyl group, a t-amyl group, a stearyl group, a lauryl group or a 2-ethyl hexyl group; an aryl group such as a phenyl group; an alicyclic group such as a cyclohexyl group, a t-butyl cyclohexyl group, a dicyclopentadienyl group, a tricyclodecanyl group, an isobornyl group, an adamantyl group or a 2-methyl-2-adamantyl group; an alkyl group substituted with an alkoxy group such as a 1-methoxyethyl group or a 1-ethoxyethyl group; and an alkyl group substituted with an aryl group such as a benzyl group.

Among these, a group containing a primary or secondary hydrocarbon group which is not readily removed by acid or heat, such as a methyl group, an ethyl group, a cyclohexyl group or a benzyl group, is preferred from the viewpoint of heat resistance. Here, $R^1$ and $R^2$ may be the same as or different from, each other.

Specific examples of the ether dimmer include: dimethyl-2,2'-[oxybis(methylene)]bis-2-propenoate, diethyl-2,2'-[oxybis(methylene)]bis-2-propenoate, di(n-propyl)-2,2'-[oxybis(methylene)]bis-2-propenoate, di(isopropyl)-2,2'-[oxybis(methylene)]bis-2-propenoate, di(n-butyl)-2,2'-[oxybis(methylene)]bis-2-propenoate, di(isobutyl)-2,2'-[oxybis(methylene)]bis-2-propenoate, di(t-butyl)-2,2'-

[oxybis(methylene)bis-2-propenoate, di(t-amyl-)-2,2'-[oxybis(methylene)]bis-2-propenoate, di(stearyl)-2,2'-[oxybis(methylene)]bis-2-propenoate, di(lauryl)-2,2'-[oxybis(methylene)]bis-2-propenoate, di(2-ethylhexyl)-2,2'-[oxybis(methylene)]bis-2-propenoate, di(1-methoxyethyl)-2,2'-[oxybis(methylene)]bis-2-propenoate, di(1-ethoxyethyl)-2,2'-[oxybis(methylene)]bis-2-propenoate, dibenzyl-2,2'-[oxybis(methylene)]bis-2-propenoate, diphenyl-2,2'-[oxybis(methylene)]bis-2-propenoate, dicyclohexyl-2,2'-[oxybis(methylene)]bis-2-propenoate, di(t-butylcyclohexyl)-2,2'-[oxybis(methylene)]bis-2-propenoate, di(dicyclopentadienyl)-2,2'-[oxybis(methylene)]bis-2-propenoate, di(tricyclodecanyl)-2,2'-[oxybis(methylene)]bis-2-propenoate, di(isobornyl)-2,2'-[oxybis(methylene)]bis-2-propenoate, diadamantyl-2,2'-[oxybis(methylene)]bis-2-propenoate, and di(2-methyl-2-adamantyl)-2,2'-[oxybis(methylene)]bis-2-propenoate. Among these, dimethyl-2,2'-[oxybis(methylene)bis-2-propenoate, diethyl-2,2' toxybis(methylene)]bis-2-propenoate, dicyclohexyl-2,2'-[oxybis(methylene)]bis-2-propenoate, and dibenzyl-2,2'-[oxybis(methylene)]bis-2-propenoate are preferable. The ether dimer may be used singly or in a combination of two or more kinds thereof.

It is also preferable that a polymer having an epoxy group is uses as the alkali-soluble binder.

An epoxy group can be introduced into the alkali-soluble binder, for example, by the polymerization using a monomer having an epoxy group (hereinbelow, sometimes referred to as a "monomer for introducing an epoxy group") as a monomer component. Examples of the monomer having an epoxy group include glycidyl (meth)acrylate, 3,4-epoxycyclohexyl methyl (meth)acrylate, and o-(m- or p-) vinylbenzyl glycidyl ether. The monomer for introducing an epoxy group may be used singly or in combination of two or more kinds thereof. When the monomer component from which the alkali-soluble binder is obtained also contains the monomer for introducing an epoxy group, the content of the monomer for introducing an epoxy group is not specifically limited, and preferably 5% by mass to 70% by mass, more preferably 10% by mass to 60% by mass, with respect to the total amount of the monomer component.

It is also preferable that a polymer having an acid group is uses as the alkali-soluble binder.

The acid group is not specifically limited, and examples thereof include a carboxy group, a phenolic hydroxy group, and a carboxylic acid anhydride group. The acid group may be used singly or in combination of two or more kinds thereof. An acid group can be introduced into the alkali-soluble binder, for example, by the polymerization using a monomer having an acid group or a monomer that can provide an acid group after polymerization (hereinbelow, sometimes referred to as a "monomer for introducing an acid group") as a monomer component.

When the monomer that can provide an acid group after polymerization is used as the monomer component to introduce the acid group, for example, the following treatment is required after polymerization to provide an acid group.

Examples of the acid group include a monomer having a carboxy group such as (meth)acrylic acid or itaconic acid, a monomer having a phenolic hydroxy group such as N-hydroxy phenyl maleimide, and a monomer having a carboxylic acid anhydride group such as maleic anhydride or itaconic anhydride. Among these, (meth)acrylic acid is preferable.

Examples of the monomer that can provide an acid group after polymerization include a monomer having a hydroxy group such as 2-hydroxyethyl(meth)acrylate, a monomer having an epoxy group such as glycidyl(meth)acrylate, and a monomer having an isocyanate group such as a 2-isocyanatoethyl(meth)acrylate. The monomer that can provide an acid group after polymerization may be used singly or in combination of two or more kinds thereof.

When the monomer that can provide an acid group after polymerization is used, examples of the treatment for providing an acid group after polymerization include denaturing a part of polar groups on a side chain of the polymer by the polymerization reaction.

Among these alkaline-soluble binder, polyhydroxystyrene resins, polysiloxane resins, acrylic resins, acrylamide resins, acryl-acrylamide copolymer resins are preferable in view of heat resistance, and acrylic resins, acrylamide resins and acryl-acrylamide copolymer resins are preferable in order to control developing property.

Preferable examples of the acrylic resin include copolymers formed with monomers selected from benzyl (meth) acrylate, (meth) acrylic acid, hydroxyethyl (meth)acrylate, (meth)acrylamide and the like, and commercial products such as KS RESIST-106 (trade name, manufactured by Osaka Organic Chemical Industry Ltd.) and CYCLOMER-P series (trade names, manufactured by Daicel Chemical Industries, Ltd.).

The content of the alkali-soluble binder in the colored curable composition is preferably from 0.1% by mass to 50% by mass, more preferably from 0.1% by mass to 40% by mass, and still more preferably from 0.1% by mass to 30% by mass, with respect to the total solid content of the colored curable composition.

Crosslinking Agent

It is preferable that the colored curable composition according to the invention contains crosslinking agent. The crosslinking agent is not specifically limited as long as it can induce film curing through a crosslinking reaction. Examples of the crosslinking agent include crosslinking agents such as those described in paragraphs [237] to [0253] of JP-A No. 2008-292970.

When the colored curable composition contains a crosslinking agent, the content of the crosslinking agent is preferably from 1% by mass to 70% by mass, more preferably from 5% by mass to 50% by mass, and particularly preferably from 7% by Mass to 30% by mass, with respect to the total solid content (mass) of the colored curable composition. When the content of the crosslinking agent is within the above range, a sufficient curing degree can be achieved and dissolution property of the unexposed parts can be maintained, whereby decrease in curing degree in the exposed parts or significant decrease in dissolution property of the unexposed parts can be suppressed.

Surfactant

The colored curable composition according to the invention may contain a surfactant in order to improve the coatability. Examples of the surfactant that can be used in the invention include various surfactants such as a fluorine-containing surfactant, a nonionic surfactant, a cationic surfactant, an anionic surfactant, and a silicone surfactant.

In particular, when the colored curable composition according to the invention contains a fluorine-containing surfactant, the liquid properties (in particular, fluidity) of the composition prepared as a coating liquid are improved, whereby the uniformity of the coating thickness and the liquid saving can be improved.

That is, when a colored curable composition including a fluorine-containing surfactant is used as a coating liquid to form a film, the wettability on the surface to be coated is improved due to decrease in the surface tension between the surface to be coated and the coating liquid, thereby improving the coatability on the surface to be coated. As a result, even when a thin film of several to several tens micrometers is formed with a small amount of the liquid, a film with uniform thickness may be suitably formed.

The fluorine content in the fluorine-containing surfactant is preferably from 3% by mass to 40% by mass, more preferably from 5% by mass to 30% by mass, and still more preferably from 7% by mass to 25% by mass. When the fluorine content of the fluorine-containing surfactant is within the above range, it is effective in terms of the uniformity of the coating film thickness and the liquid saving, and excellent solubility in the colored curable composition can be achieved.

Examples of the fluorine-containing surfactant include MEGAFAC F171, F172, F173, F176, F177, F141, F142, F143, F144, R30, F437, F475, F479, F482, F554, F780 and F781 (trade names, manufactured by DIC Corporation), FLUORAD FC430, FC431 and FC171 (trade names, manufactured by Sumitomo 3M Limited), SURFLON S-382, SC-101, SC-103, SC-104, SC-105, SC1068, SC-381, SC-383, S393 and KH-40 (trade names manufactured by Asahi Glass Co., Ltd.), and SOLSPERSE 2000, (trade name, available form Lubrizol Japan Ltd.).

Examples of the nonionic surfactant include glycerol, trimethylolpropane and trimethylolethane, and an ethoxylate or propoxylate product thereof (such as glycerol propoxylate or glycerin ethoxylate); polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, and sorbitan fatty acid esters such as PLURONIC L10, L31, L61, L62, 10R5, 17R2 and 25R2, and TETRONIC 304, 701, 704, 901, 904 and 150R1 (trade names, manufactured by BASF Japan Ltd.).

Examples of the cationic surfactant include a phthalocyanine derivative such as EFKA-745 (trade name, manufactured by Morishita & Co., Ltd.), an organosiloxane polymer such as KP341 (trade name, manufactured by Shin-Etsu Chemical Co., Ltd.), a (meth)acrylic acid based (co)polymer such as POLYFLOW No. 75, No. 90, No. 95 (trade names, manufactured by Kyoeisha Chemical Co., Ltd.), or W001 (trade name, available from Yusho Co., Ltd.).

Examples of the anionic surfactant include W004, W005 and W017 (trade names, available from Yusho Co., Ltd.).

Examples of the silicone surfactant include TORAY SILICONE DC3PA, SH7PA, DC11PA, SH21PA, SH28PA, SH29PA, SH30PA and SH8400 (trade names, manufactured by Dow Corning Toray Co., Ltd.), TSF-4440, 4300, 4445, 4460 and 4452 (trade names, manufactured by Momentive Performance Materials Inc.), KP341, KF6001, and KF6002 (trade names, manufactured by Shin-Etsu Chemical Co., Ltd.), and BYK307, 323 and 330 (trade'names, manufactured by BYK Chemie).

The surfactant may be used singly or in combination of two or more kinds thereof.

The additive amount of the surfactant is preferably form 0.001% by mass to 2.0% by mass, and more preferably from 0.005% by mass to 1.0% by mass, with respect to the total mass of the colored curable composition.

Polymerization Inhibitor

It is preferable that the colored curable composition according to the invention includes a small amount of a heat polymerization inhibitor in order to prevent unnecessary heat polymerization of the polymerizable compound during manufacture or storage of the colored curable composition.

Examples of the polymerization inhibitor that can be used in the invention include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butyl phenol), and N-nitrosophenylhydroxyamine primary cerium salt.

The addition amount of the polymerization inhibitor is preferably from about 0.01% by mass to about 5% by mass with respect to the total mass of the colored curable composition.

Various Additives

The colored curable composition according to the present invention may contain, as necessary, various additives, such as a filler, a high-molecular weight compound other than the above-mentioned one, an adhesion promoter, an antioxidant, an ultraviolet absorbent and an aggregation inhibitor. Examples of the additives include additives such as those described in paragraphs [0274] to [0276] of JP-A No. 2008-292970.

Preparation Method of Colored Curable Composition

In the preparation of the colored curable composition according to the present invention, the aforementioned respective components of the composition may be mixed at one time, or may be sequentially mixed after each of the components has dissolved in a solvent. Further, the addition order or operation conditions associated with the mixing of the components are not specifically limited. All of the components may be simultaneously dissolved in a solvent to prepare the composition. Alternatively, as necessary, respective components may be appropriately dissolved to make two or more solutions, and when used (coated), these solutions may be mixed to prepare the composition.

The composition thus prepared may be filtered through a filter preferably having a pore diameter of 0.01 μm to 3.0 μm, and more preferably a pore diameter of 0.05μm to 0.5 μm, to use for desired applications.

Color Filter and Method for Producing Color Filter

The color filter according to the second aspect of the invention is formed using the colored curable composition according to the invention.

The colored curable composition according to the second aspect of the invention can be suitably used in the formation of colored pixels of color filters for use in liquid crystal displays (LCDs), organic EL display devices, or solid-state image sensors (for example, CCD, CMOS, and the like). In particular, the colored curable composition according to the second aspect of the invention can be suitably used in the formation of color filters for solid-state image sensors such as CCD and CMOS.

The colored curable composition according to the second aspect of the invention is particularly suitable for forming a color filter for solid-state image sensors that require the formation of a colored pattern with a minute size in a thin film and with an excellent rectangular cross-sectional profile.

Specifically, when a pixel pattern constituting a color filter has a size (a side length of the pixel pattern viewed from the substrate normal direction) of 2 μm or less (for example, 0.5 μm to 2.0 μm), the content of the coloring agent is increased, and line width sensitivity is reduced, thus resulting in narrowing of the DOF margin, which consequently impairs pattern formability. Such a tendency is particularly pronounced when the pixel pattern size is from 1.0 μm to 1.7 μm (further pronounced when a pixel pattern size is from 1.2 μm to 1.5 μn). In addition, in the case of a thin film having a thickness of 1 μm or less, the amount of components (other than coloring agents) contributing to photolithographic properties relatively decreases in the film, the amount of other components is further decreased due to the increase in the amount of coloring agents, and the sensitivity is lowered, whereby separation of a pattern in a low-exposure region can easily occur.

In this case, when a heat treatment such as postbaking is applied, thermal sagging readily occurs. These phenomena are particularly remarkable when the film thickness is from 0.005 μm to 0.9 μM (and more remarkable when the film thickness is from 0.1 μm to 0.7 μm).

On the other hand, when the colored curable composition according to the second aspect of the invention is used, it is possible to prepare a color filter having excellent pattern formability and having a favorable cross section profile even when the pixel pattern has a size of 2 μm or less.

The method of producing a color filter by an inkjet method using the colored curable composition according to the second aspect of the invention is not particularly limited, and examples thereof include methods such as those described in paragraphs [0117] to [0128] of JP-A No. 2008-250188.

Examples of the support that can be used for the production method of the color filter according to the second aspect of the invention include soda glass, borosilicate glass (PYREX (registered trade name) glass) and quartz glass used for liquid crystal display devices or the like, and those glass materials on which a transparent electroconductive film has been adhered, substrates for photoelectronic conversion elements used for solid-state image pickup sensors including silicon substrates, and substrates for complementary metal oxide semiconductor (CMOS). Black stripes for separating pixels may be formed on these substrates. When needed, an under coating layer may be formed on these substrates in order to improve adhesion to the upper layer, prevent diffusion of the materials, or planarize the surface.

Pattern Formation Method Using Colored Curable Composition

A method of forming a color filter by a photolithographic method using the colored curable composition according to the present invention includes the processes of coating the colored curable composition on a substrate to form a colored layer, exposing the colored layer in a pattern-wise manner through a mask to form a latent image, and developing the colored layer on which the latent image is formed to form a pattern (hereinafter, these processes are sometimes collectively referred to as a "pattern forming process"). Specifically, examples of the method include methods such as those described in paragraphs [0277] to [0284] of JP-A No. 2008-292970.

Post-Curing Process

According to the present invention, after the process of forming a pattern by development of the colored layer, it is preferable to carried out a post-curing process for further curing the resulting pattern is preferably.

The post-curing process, which is carried out by heating and/or exposure (UV irradiation), further cures the resulting pattern, and can prevent dissolution of a pattern in a process of forming a colored layer for the formation of the next-color pattern or other processes, and can improve the solvent resistance of pixels of the resulting color filter.

The post-curing process is preferably carried out by UV irradiation.

In a UV irradiation process, ultraviolet light (UV light) is irradiated onto the pattern, which has undergone a development treatment in the pattern-forming process, at an irradiation dose [mJ/cm$^2$] of 10-fold or higher than the exposure dose [mJ/cm$^2$] in the exposure treatment before the development treatment. The irradiation of UV light onto the post-development pattern for a predetermined time between development treatment and the heating treatment described below effectively prevent color transfer which may occur during subsequent heating. It is preferable that the irradiation dose in this process is 10-fold or higher than the exposure dose in the exposure treatment before the development treatment, in that color transfer between colored pixels or color transfer between upper and lower layers is effectively prevented thereby.

The irradiation dose of UV light is preferably from 12-fold to 200-fold, and more preferably from 15-fold to 100-fold the exposure dose in the exposure treatment before the development treatment.

The post-exposure may be carried out by g-rays, h-rays, i-rays, KrF, ArF, UV light, an electron beam, X-rays, or the like, and is preferably carried out by g-rays, h-rays, i-rays, or UV light, and is more preferably carried out by UV light. When irradiation of UV light (UV curing) is carried out, the irradiation is preferably carried out at a low temperature of from 20° C. to 50° C. (preferably from 25° C. to 40° C.). The wavelength of UV light preferably includes a wavelength ranging from 200 nm to 300 nm. Examples of a light source include a high-pressure mercury lamp, and a low-pressure mercury lamp. An irradiation time may be from 10 seconds to 180 seconds, preferably from 20 seconds to 120 seconds, and more preferably from 30 seconds to 60 seconds.

Examples of the light source for irradiation of UV light include an ultra-high pressure mercury lamp, a high-pressure mercury lamp, a low-pressure mercury lamp, and a DEEP UV lamp. Among these, a light source which can irradiate light that includes light with a wavelength of 275 nm or less in the ultraviolet light to be irradiated and in which the irradiation illuminance [mW/cm$^2$] of light with a wavelength of 275 nm or less is 5% or more relative to the integrated irradiation illuminance of the entire wavelength range in the ultraviolet light. When the irradiation illuminance of light with a wavelength of 275 nm or less in the ultraviolet light is 5% or more, the inhibitory effects against color transfer between colored pixels or transfer between upper and lower layers, and the effects of improving light fastness, are effectively enhanced. In view of these facts, it is preferable to use a light source that is different from the light source such as i-rays used for exposure in the pattern forming process, and specific examples thereof include a high-pressure mercury lamp, and a low-pressure mercury lamp. Among these, for the same reason as above, the irradiation illuminance of light with a wavelength of 275 nm or less is preferably 7% or more relative to the integrated irradiation illuminance of the entire wavelength range in the ultraviolet light. The upper limit of the irradiation illuminance of light with a wavelength of 275 nm or less is preferably 25% or less.

Here, the term "integrated irradiation illuminance" refers to the sum (area) of the illuminance of light of each wavelength contained in the irradiation light when a curve is plotted wherein illuminance (radiation energy passing through a unit area per unit time; [mW/m$^2$]) for each spectral wavelength is put on the vertical axis and the wavelength [nm] of the light is put on the horizontal axis.

The integrated irradiation illuminance of the ultraviolet light to be irradiated in the UV irradiation process for post-exposure is preferably 200 mW/cm$^2$ or more. When the integrated irradiation illuminance is 200 mW/cm$^2$ or more, the inhibitory effects against color transfer between the colored pixels or between upper and lower layers and the effects of improving light fastness, can be effectively enhanced. Among these, the integrated irradiation illuminance is preferably from 250 mW/cm$^2$ to 2000 mW/cm$^2$, and more preferably from 300 mW/cm$^2$ to 1000 mW/cm$^2$.

Further, the post-heating is preferably carried out in a hot plate or oven at a temperature of from 100° C. to 300° C., and more preferably from 150° C. to 250° C. The post-heating time is preferably from 30 seconds to 30000 seconds, and more preferably from 60 seconds to 1000 seconds.

In the post-curing process, the post-exposure and post-heating may be carried out in combination. In this case, either of them may be carried out first, but it is preferable to carry out the post-exposure prior to the post-heating. This is because deformation of the shape due to thermal sagging or trailing of the pattern which may occur in the post-heating process may be prevented due to the acceleration of the curing by post-exposure.

The colored pattern thus obtained constitutes pixels in the color filter. In the case of preparation of a color filter having multi-colored pixels, a color filter consisting of a desired number of hues can be manufactured by repeating the pattern forming process (and post curing process, as necessary) several times in accordance with a desired number of hues.

The color filter according to the second aspect of the invention may further have an indium tin oxide (ITO) layer as a transparent conductive film. Examples of the method of forming the ITO layer include an in-line low temperature sputtering method, an in-line high temperature sputtering method, a batch-wise low-temperature sputtering method, a batch-wise high-temperature sputtering method, a vacuum deposition method, and a plasma CVD method. The low-temperature sputtering method is preferably used because damages to the color filter can be reduced.

Intended Use of Color Filter According to the Second Aspect of the Present Invention The intended use of the color filter according to the second aspect of the invention is not particularly limited, and examples of the intended use include image displays (particularly color image displays) such as liquid crystal displays, organic EL displays, liquid crystal projectors, displays for game machines, displays for portable terminals such as mobile phones, displays for digital cameras and displays for car navigators. The color filter according to the present invention can be suitably used as a color filter for solid-state image sensors such as CCD image sensors and CMOS image sensors used in digital cameras, digital video cameras, endoscopes, mobile phones, or the like. In particular, the color filter is suitable for CCD devices or CMOS devices of high resolution, which may contain more than one million pixels.

More specifically, a liquid crystal display device (panel) according to the second aspect of the invention can be obtained, for example, by forming an orientation film on the inner surface of the color filter, disposing the color filter such that the orientation film faces an electrode substrate, and filling the space therebetween with a liquid crystal to seal the configuration. The solid-state image sensor according to the second aspect of the invention can be obtained, for example, by forming a color filter on a light-receiving element.

Specific examples of the configuration of the solid-state image sensor include a configuration in which a photodiode constituting a light-receiving area and a transfer electrode formed of polysilicon or the like are provided on a substrate, a color filter layer is provided thereon, and then a microlense is stacked thereon.

From the viewpoint of light-induced discoloration of color material, a camera system with the color filter according to the present invention is preferably provided with a cover glass, a microlense, and the like on which a camera lens or an IR-cut film is dichroic-coated, and the materials thereof preferably have optical properties of partially or completely absorbing UV light of 400 nm or less. Further, in order to inhibit oxidative discoloration of the color material, a structure of the camera system is preferably configured to have a structure wherein oxygen permeability to the color filter is reduced. For example, the camera system is preferably partially or completely sealed with nitrogen gas.

Although the colored curable composition and the color resist, the color filter and the method for preparing the color filter, and the image display device and solid-state image sensor with the color filter according to the second aspect of the invention have been described in detail by way of various embodiments, the present invention is not limited to those embodiments, and it should be understood that various modifications and alterations are possible without departing from the scope of the invention.

The Third Aspect of the Invention

Hereinbelow, a colored curable composition, a color filter, and a method of manufacturing the color filter according to the third aspect of the invention are described in detail. Although the explanation of the constituent features described hereinbelow are made based on representative embodiments of the present invention, the present invention is not limited thereto. Further, the numeral range expressed by using "-" in the present specification represents a range including the numerical values described in front of and behind "-", as the minimum value and the maximum value.

Colored Curable Composition

The colored curable composition according to the third aspect of the invention contains (A) a resin (hereinbelow, sometimes referred to as (A) a specific resin) having a repeating unit represented by Formula (X) and a repeating unit represented by Formula (Y), and (B) a pigment dispersion.

The colored curable composition according to the third aspect of the invention is cured with light, and may further contain (C) a photopolymerization initiator and (D) a polymerizable compound, and as necessary, may be constituted by using other components such as a solvent, a binder, or a crosslinking agent. The colored curable composition according to the invention is cured at least with light, but may be cured with heat.

The colored curable composition according to the third aspect of the invention has the constitution as described above, and can suppress color unevenness of a colored cured film formed therefrom. Although the reason is not clear, it can be assumed as follows. That is, it can be assumed that since the substituent represented by Q in Formula (X) of (A) the specific resin has a high affinity with pigment contained in (B) the pigment dispersion, and since (A) the specific resin has the repeating unit represented by Formula (X) and the repeating unit represented by Formula (Y), the affinity of (A) the specific resin with (B) pigment dispersion and (D) the polymerizable compound, and (E) the solvent used as needed can be enhanced, thereby suppressing aggregation of the pigment particles and suppressing color unevenness.

The colored curable composition according to the third aspect of the invention has the above constitution, and favorable coating property and favorable pattern formability can be attained, when the colored curable composition is used for the manufacture of the color filter by the photolithographic method. It can be assumed that, as described above, since (A) the specific resin interacts with the pigment contained in (B) the pigment dispersion, (D) the polymerizable compound, and (E) the solvent used as needed, occurrence of the phase separation that deteriorates coating property and pattern formability can be suppressed, a uniform coating film can be formed, and excellent pattern formability can be achieved due to high affinity with the alkali developer associated with the structure of (A) the specific resin.

(A) Specific Resin of the Third Aspect of the Invention (A) The specific resin used in the third aspect of the invention is explained in detail.

(A) The specific resin used in the third aspect of the invention has the repeating unit represented by Formula (X) and the repeating unit represented by Formula (Y). Hereinbelow, Formula (X) and Formula (Y) are explained.

Repeating Unit Represented by Formula (X)

Formula (X)

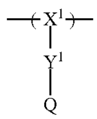

In Formula (X), $X^1$ represents a polymer main chain. Examples of the polymer main chain include known polymer main chains, and specific examples thereof include polymer main chains represented by the following Formulae ($X^1$-1) to ($X^1$-12). In view of manufacture suitability and polymerization properties, Formulae ($X^1$-1) to ($X^1$-3) and ($X^1$-10) to ($X^1$-12) are preferable, and Formulae ($X^1$-1) and ($X^1$-2) are more preferable.

(a-1)

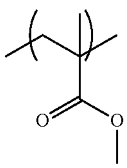

(a-2)

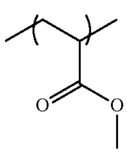

(a-3)

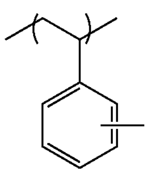

(a-4)

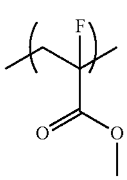

(a-5)

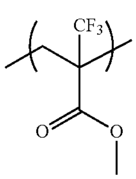

(a-6)

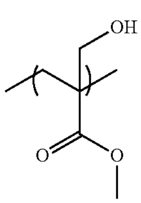

-continued (a-7)

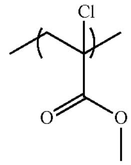

(a-8)

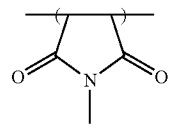

(a-9)

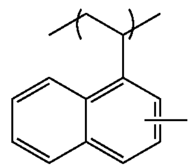

(a-10)

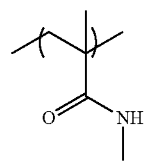

(a-11)

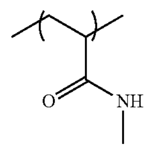

(a-12)

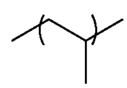

In Formula (X), $Y^1$ represents a single bond or a divalent linking group. The linking group is preferably an alkylene group or an arylene group, and more preferably an alkylene group having 1 to 10 carbon atoms.

The linking group may contain a hetero atom such as an oxygen atom or a sulfur atom may be contained in the carbon chain thereof, or may have a substituent such as a carboxy group. Examples of the hetero atom include an oxygen atom, a nitrogen atom, and a sulfur atom, and among these, an oxygen atom is preferable.

The linking group represented by $Y^1$ in Formula (X) is preferably a straight-chain alkylene group which does not contain a hetero atom.

Specific examples of the linking group represented by $Y^1$ in Formula (X) include the following linking groups:

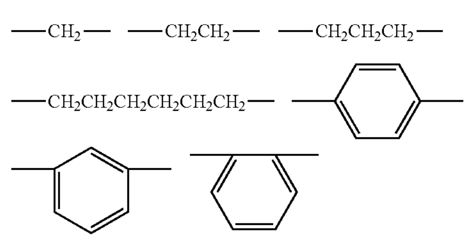

-continued

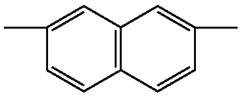

$—CH_2CH_2—O—CH_2CH_2—$ $—CH_2CH_2—S—CH_2CH_2—$

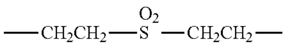

$—CH_2CH_2CMe_2—$

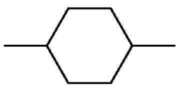

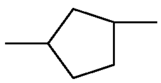

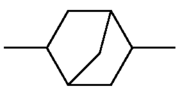

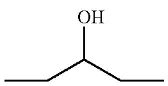

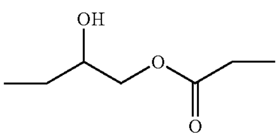

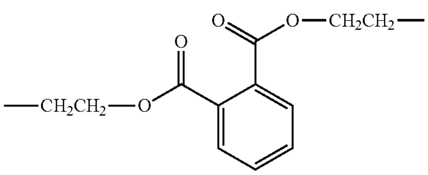

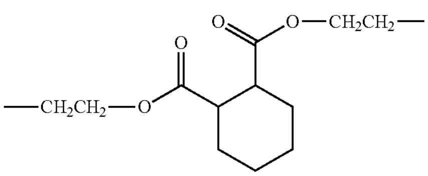

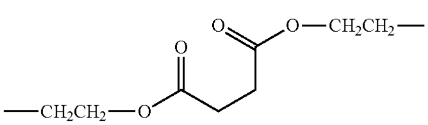

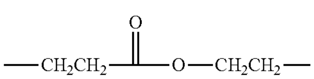

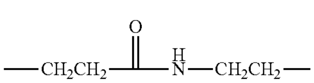

Among these specific examples of the linking group represented by $Y^1$ in Formula (X), $—CH_2—$, $—CH_2CH_2—$, $—CH_2CH_2CH_2—$, $—CH_2CH(OH)CH_2—$, and $—CH_2CH_2CMe_2$- are preferable.

In Formula (X), Q represents a residue formed by removing one hydrogen atom from a phthalocyanine colorant or a dipyrromethene colorant.

Hereinbelow, the phthalocyanine colorant residue is explained. Examples of the phthalocyanine colorant residue include the phthalocyanine colorant residue represented by the following Formula (i).

Formula (i)

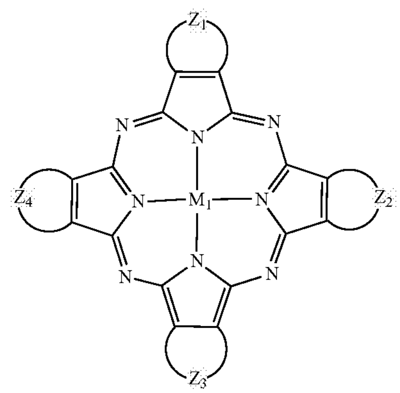

In Formula (i), $M^1$ represents a metal; and $Z^1$, $Z^2$, $Z^3$, and $Z^4$ each independently represent an atomic group required for forming a 6-membered ring formed by atoms selected from carbon atoms and nitrogen atoms. However, one hydrogen atom from one group selected from $Z^1$, $Z^2$, $Z^3$, and $Z^4$ is removed and link with $Y^1$ in Formula (X).

Hereinbelow, Formula (i) is explained in detail.

In Formula (i), examples of the metal represented by $M^1$ include metal atoms such as Zn, Mg, Si, Sn, Rh, Pt, Pd, Mo, Mn, Pb, Cu, Ni, Co or Fe, metal chloride such as $AlCl_3$, $InCl_3$, $FeCl_2$, $TiCl_2$, $SnCl_2$, $SiCl_2$ or $GeCl_2$, metal oxides such as TiO or VO, and metal hydroxide such as $Si(OH)_2$.

In Formula (i), $Z^1$, $Z^2$, $Z^3$, and $Z^4$ each independently represent an atomic group required for forming a 6-membered ring formed by atoms selected from carbon atoms and nitrogen atoms. The 6-membered ring may be a saturated ring or an unsaturated ring, and may be unsubstituted or may have a substituent. Specific examples of the substituent include a halogen atom (for example, a fluorine atom, a chlorine atom, a bromine atom and an iodine atom); an alkyl group (for example, an alkyl group having preferably 1 to 10, more preferably 1 to 5 the carbon atoms such as a methyl group, an ethyl group, a propyl group, an isopropyl group, a butyl group, an isobutyl group, a tert-butyl group, a pentyl group, a neopentyl group or an octyl group); an alkoxy group (for example, an alkoxy group having preferably 1 to 10, more preferably 1 to 5 carbon atoms, such as a methoxy group, an ethoxy group, a propoxy group, a butoxy group or a tert-butoxy group); an aryl group (for example, an aryl group having preferably 6 to 20, more preferably having 6 to 10 carbon atoms, such as a phenyl group or a naphthyl group); a sulfo group, a carboxy group, and a hydroxy group. When the 6-membered ring has two or more substituents, these substituents may be the same as, or may be different from one another. Furthermore, the 6-membered ring may be condensed with other 5- or 6-membered ring.

Examples of the 6-membered ring include a benzene ring, and a cyclohexane ring.

In the phthalocyanine colorant residue represented by Formula (i), the residue derived from the phthalocyanine colorant residue represented by the following Formula (i-1) is preferable.

Formula (i-1)

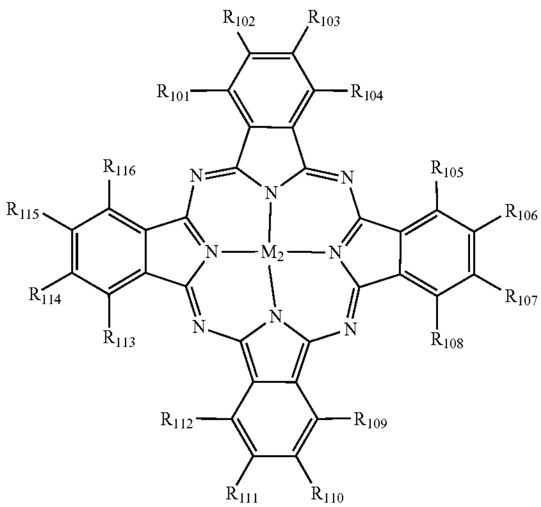

In Formula (i-1), $M^2$ has the same definition as $M^1$ in Formula (i), and has the same preferable examples as $M^1$.

In Formula (i-1), $R^{101}$ to $R^{116}$ each independently represent a hydrogen atom or a substituent. When the substituent represented by $R^{101}$ to $R^{116}$ is a group that can be further substituted, it may be substituted by any of the substituents for $Z^1$, $Z^2$, $Z^3$, and $Z^4$ in Formula (i). When the substituent represented by $R^{101}$ to $R^{116}$ has two or more substituents, the substituents may be the same as or different from one another. However, one hydrogen atom from one group selected from $R^{101}$ to $R^{116}$ is removed and link with $Y^1$ in Formula (X).

The substituent represented by $R^{101}$ to $R^{116}$ is preferably a halogen atom (a fluorine atom, a chlorine atom, a bromine atom, an iodine atom), an alkyl group having 1 to 5 carbon atoms, a sulfo group, a carboxy group, a hydroxy group.

Hereinbelow, the dipyrromethene colorant residue is explained. The dipyrromethene colorant residue is represented by Formula (ii).

Formula (ii)

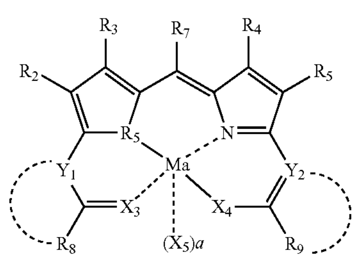

In Formula (ii), $R^2$ to $R^5$ each independently represent a hydrogen atom or a substituent. Specific examples of the substituent include the same substituents for Z $Z^2$, $Z^3$, and $Z^4$. Among these, it is preferable that $R^2$ and $R^5$ each independently represent an alkoxy carbonyl group, an amide group, or a cyano group; and it is preferable that $R^3$ and $R^4$ each independently represent an alkyl group, a cycloalkyl group, or an aryl group. $R^7$ represents a hydrogen atom, a halogen atom, an alkyl group, an aryl group, or a heterocyclic group. Among these, a hydrogen atom is preferable.

Ma represents a metal or a metal compound. Examples of the metal or the metal compound include the same metal or metal compound represented by $M^1$ above.

$X^3$ represent NR (wherein R represents a hydrogen atom, an alkyl group, an alkenyl group, an aryl group, a heterocyclic group, an acyl group, an alkyl sulfonyl group, or an aryl sulfonyl group), a nitrogen atom, an oxygen atom, or a sulfur atom; and $X^4$ represent NRa (wherein Ra represents a hydrogen atom, an alkyl group, an alkenyl group, an aryl group, a heterocyclic group, an acyl group, an alkyl sulfonyl group, or an aryl sulfonyl group), an oxygen atom, or a sulfur atom. $X^3$ and $X^4$ preferably represent an oxygen atom.

$Y^3$ and $Y^4$ each independently represent NRc (wherein Rc represents a hydrogen atom, an alkyl group, an alkenyl group, an aryl group, a heterocyclic group, an acyl group, an alkyl sulfonyl group, or an aryl sulfonyl group), a nitrogen atom or a carbon atom. $Y^3$ and $Y^4$ preferably represent NH.

$R^8$ and $R^9$ each independently represent an alkyl group, an alkenyl group, an aryl group, a heterocyclic group, an alkoxy group, an aryloxy group, an alkylamino group, an arylamino group, or a heterocyclic amino group. $R^8$ and $Y^3$ may be linked to each other to form a 5-, 6- or 7-membered ring. $R^9$ and $Y^4$ may be linked to each other to form a 5-, 6- or 7-membered ring. It is preferable that $R^8$ and $R^9$ each independently represent an alkyl group having 1 to 10 carbon atoms, or an aryl group having 6 to 20 carbon atoms, and it is more preferable that $R^8$ and $R^9$ each independently represent a branched alkyl group or a phenyl group. $R^8$ and $R^9$ may be substituted by an alkoxy group, an alkylthio group, an arylthio group, or the like.

$X^5$ represents a group that can be bonded to Ma; a represents 0, 1, or 2. Specific examples of the group represented by $X^5$ include an acetoxy group, 2-hydroxylpropanoyloxy group, a pivaloyloxy group, a mesyl group, and a tosyl group.

However, one hydrogen atom from one group selected from $R^2$ to $R^5$, $R^7$ to $R^9$, and $X^5$ is removed and link with $Y^1$ in Formula (X).

Specific examples of Formula (i) and Formula (ii) include the following, but the invention is not limited to these examples.

(A-1)

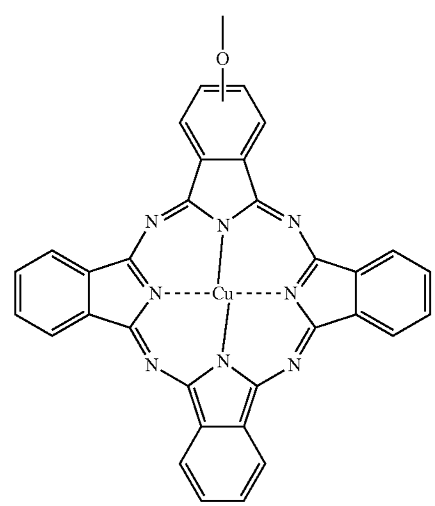

-continued
(A-2)
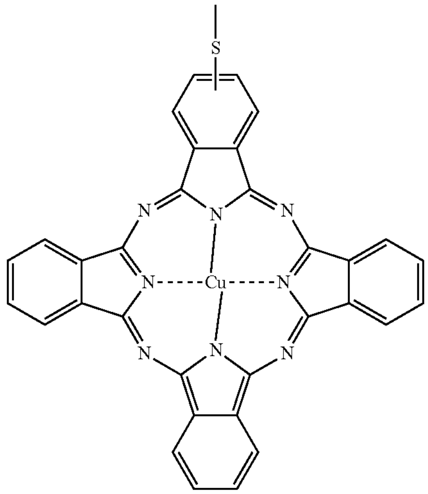
(A-3)
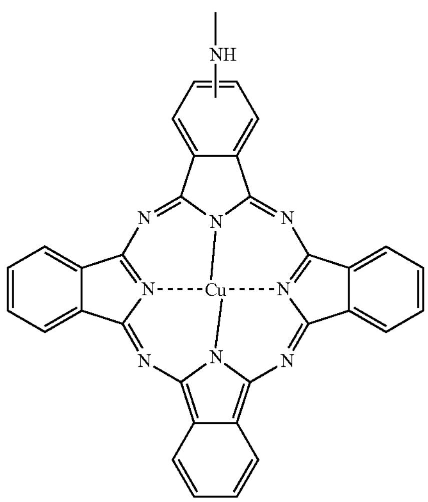
(B-1)
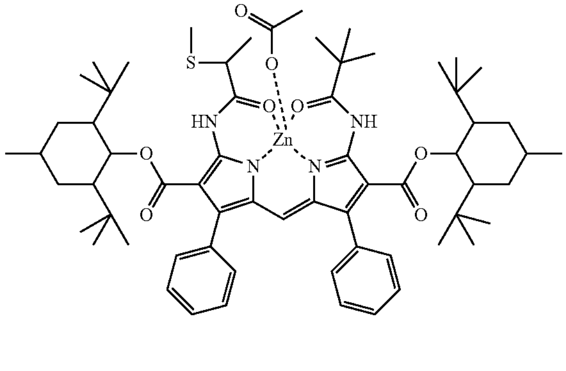
-continued
(B-2)
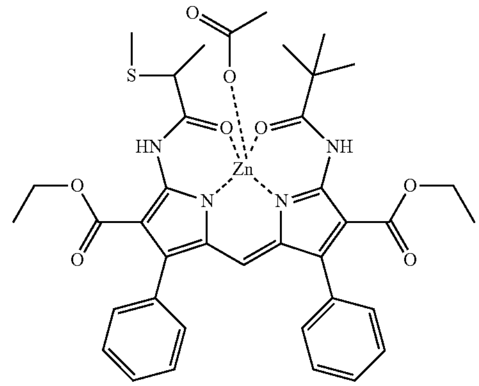
(B-3)
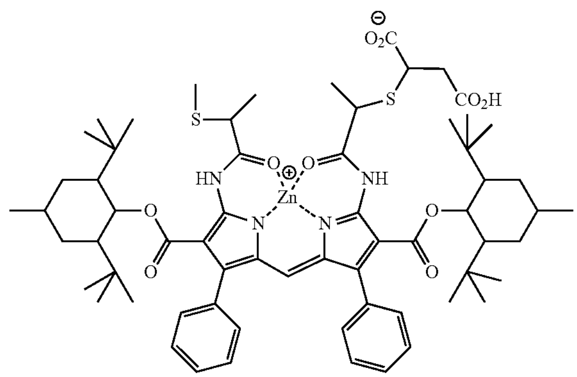
(B-4)
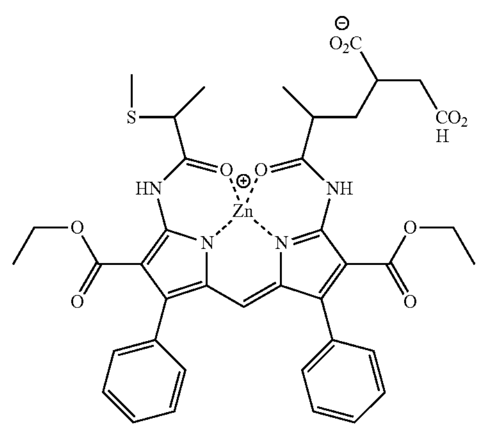
Specific examples of the repeating unit represented by Formula (X) include the following, but the invention is not limited to these examples.

-continued
(a-1)
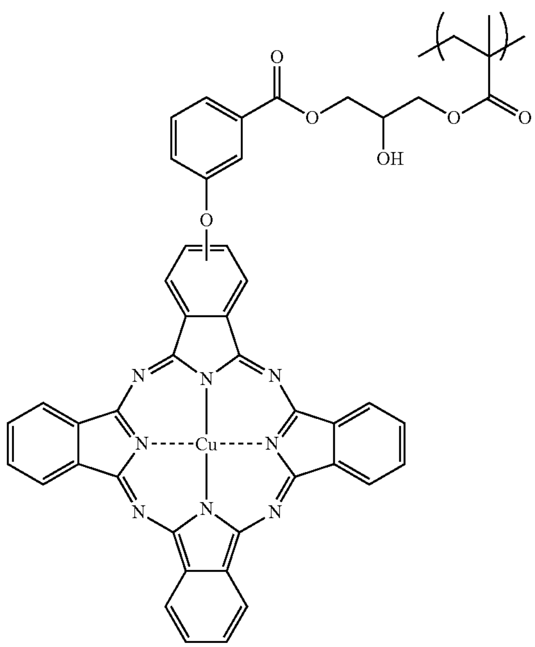
(a-2)
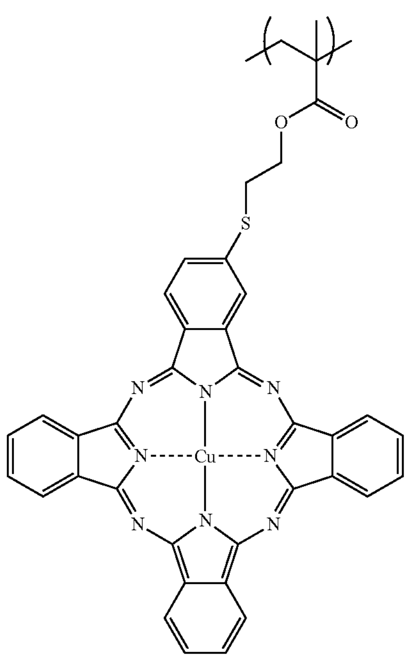
(a-3)
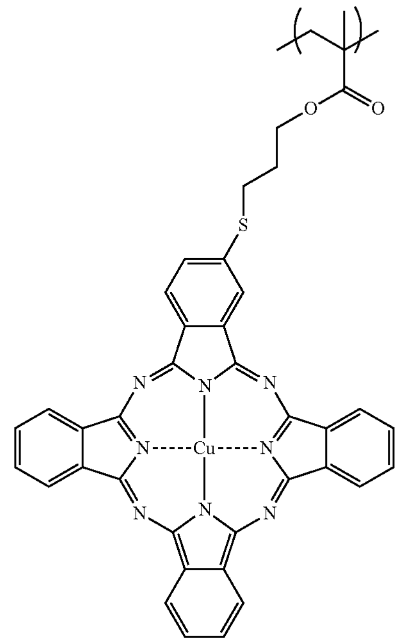
(a-4)
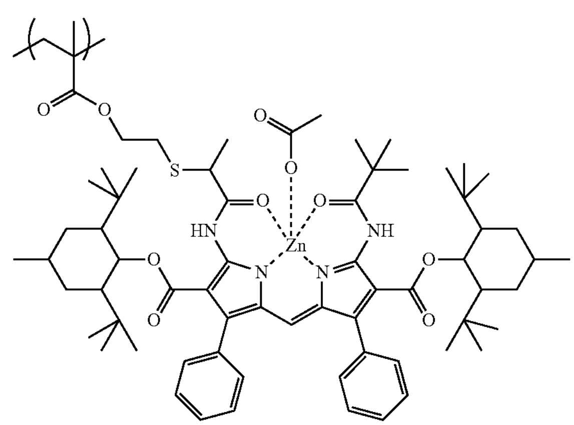
(a-5)
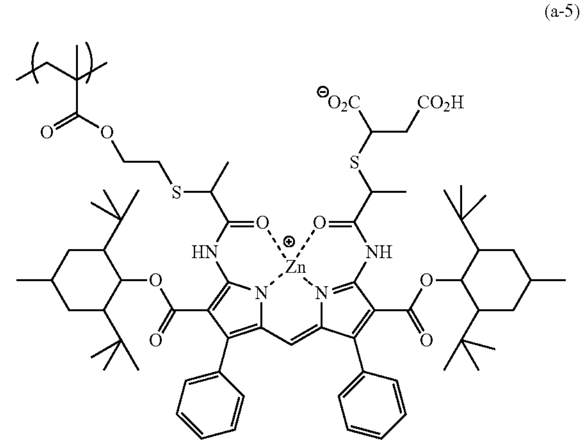

-continued (a-6)

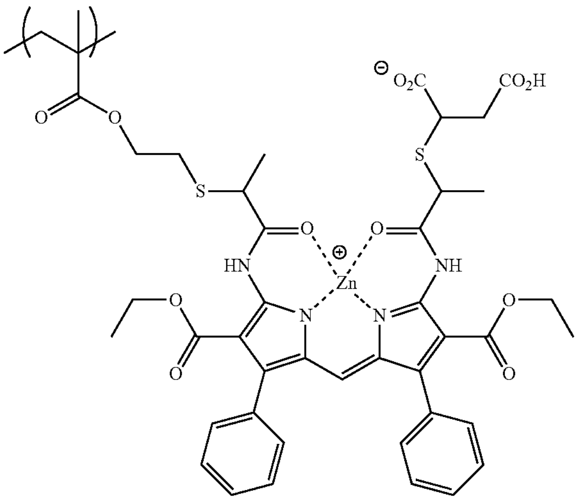

(a-7)

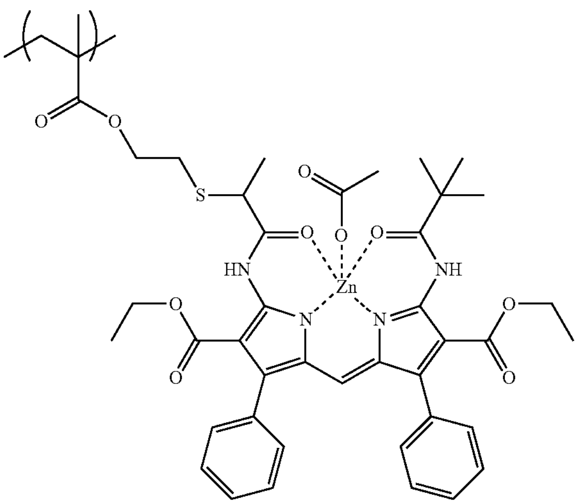

(a-8)

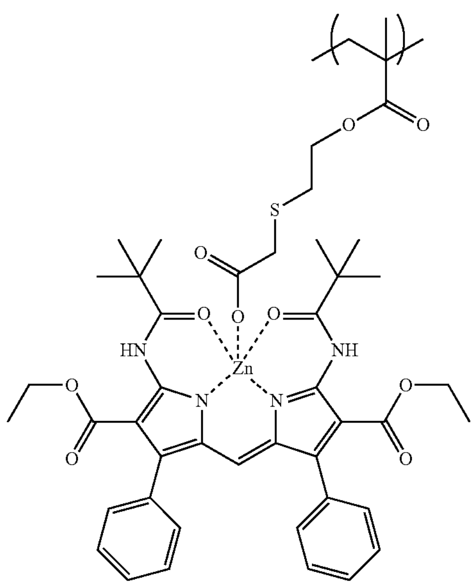

-continued (a-9)

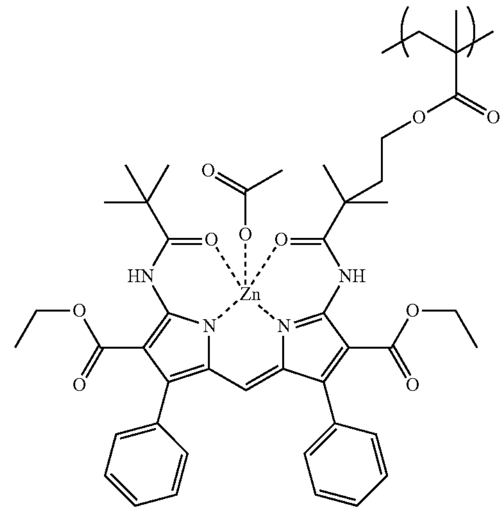

Repeating Unit Represented by Formula (Y)

Formula (Y)

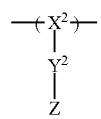

In Formula (Y), $X^2$ represents a polymer main chain. $X^2$ has the same definition and specific examples as $X^1$ in Formula (X). $Y^2$ represents a divalent linking group. $Y^2$ preferably represents an alkylene group or an arylene group. $Y^2$ may contain a hetero atom such as an oxygen atom or a sulfur atom in the carbon chain thereof, and may have a substituent such as a carboxy group. Specifically, $Y^2$ preferably represents the following linking group.

$$-(A\text{-}B)_n C\text{-} \qquad \text{Formula (Y')}$$

In Formula (Y'), A represents an alkylene group, a cycloalkylene group, or an arylene group. Among these, an alkylene group having 1 to 10 carbon atoms is preferable, and an alkylene group having 1 to 5 carbon atoms is more preferable. B represents —$CO_2$—, —$O_2C$—, —O—, —NH— or —S—. Among these, —$CO_2$—, —$O_2C$—, and —O— are preferable. C represents an alkylene group, a cycloalkylene group, or an arylene group. Among these, and an alkylene group having 1 to 10 carbon atoms, a cycloalkylene group having 5 to 8 carbon atoms, and a phenylene group are preferable. n represents an integer of from 0 to 10, and preferable represents an integer of from 0 to 5.

In Formula (Y), Z represents an alkali-soluble group. Among these, carboxylic acid, a phosphoric acid, and sulfonic acid are preferable, and a carboxylic acid is more preferable.

Preferable examples of the repeating unit represented by Formula (Y) include the following, but the invention is not limited to these examples.

(b-1)
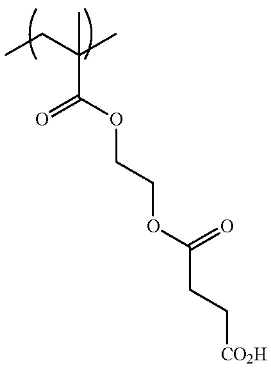
(b-2)
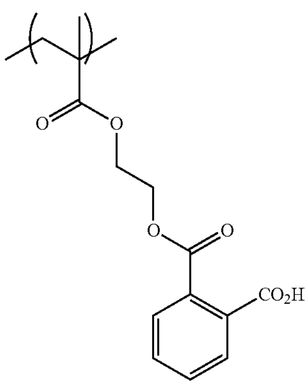
(b-3)
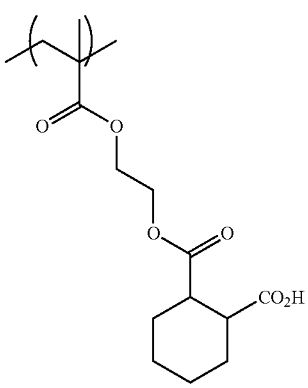
(b-4)
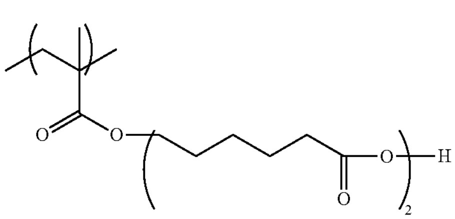
-continued
(b-5)
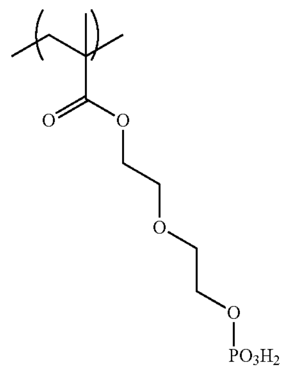
(b-6)
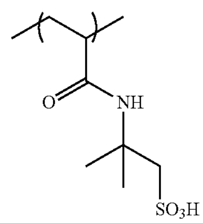
(b-7)
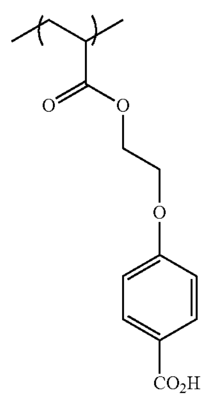
(b-8)
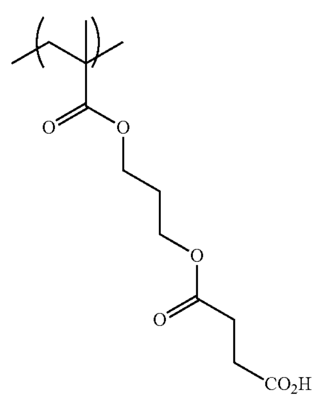
(b-9)
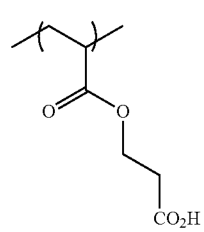

(A) The specific resin may further contain (c) an additional repeating unit, in order to control the curability and developability. Examples of (c) the additional repeating unit include an alkyl(meth)acrylate, an aralkyl(meth)acrylate, styrene, a monomer having an alkylene oxide (for example, BLEMER PE-200; trade name, manufactured by NOF corporation), a repeating unit having a polymerizable group (for example, an addition product of carboxylic acid and glycidyl methacrylate), N,N-dimethylacrylamide, and N-isopropylacrylamide. Preferable examples of (c) the additional repeating unit include the following, but the invention is not limited to these examples.

(C-1

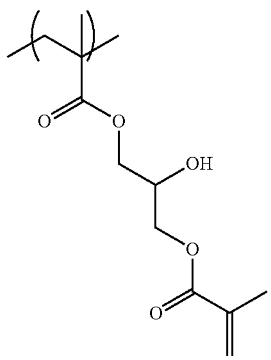

(C-2)

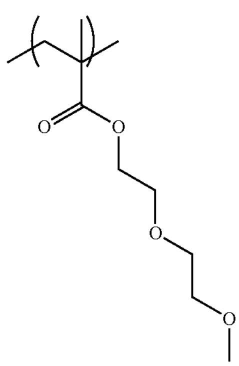

(C-3)

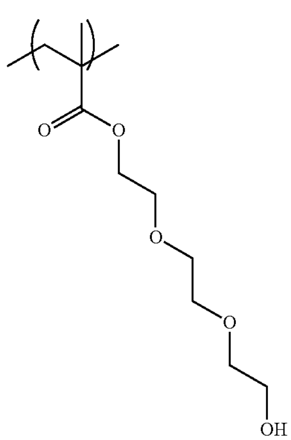

-continued (C-4)

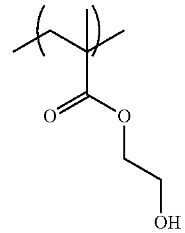

(C-5)

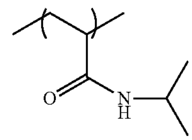

(C-6)

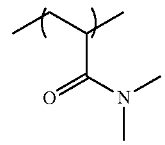

The content of the repeating unit represented by Formula (X) is preferably from 50% by mass to 95% by mass, more preferably from 60% by mass to 90% by mass, and still more preferably from 70% by mass to 90% by mass, with respect to the mass of (A) the specific resin. The content of the repeating unit represented by Formula (Y) is preferably from 5% by mass to 60% by mass, and more preferably from 10% by mass to 50% by mass, with respect to the mass of (A) the specific resin. The content of (c) the additional repeating unit is preferably from 0% by mass to 40% by mass.

The weight average molecular weight of (A) the specific resin of the invention measured by GPC is preferably from 4,000 to 50,000, and more preferably from 5,000 to 30,000.

Specific examples of (A) the specific resin of the invention include the following, but the invention is not limited to these examples. In addition, the ratio among (a), (b) and (c) (Ratio (a)/(b)/(c)) is indicated by the mass ratio.

TABLE 13

| (A) Specific resin | Repeating unit (a) | Repeating unit (b) | Repeating unit (c) | Ratio (a)/(b)/(c) | Mw | Mw/ Mn |
|---|---|---|---|---|---|---|
| 1 | (a-1) | (b-1) | — | 80/20 | 15000 | 1.9 |
| 2 | (a-2) | (b-1) | — | 80/20 | 14000 | 1.8 |
| 3 | (a-3) | (b-1) | — | 80/20 | 16000 | 2.1. |
| 4 | (a-4) | (b-1) | (c-1) | 80/10/10 | 15000 | 1.9 |
| 5 | (a-5) | (b-1) | — | 80/20 | 18000 | 1.8 |
| 6 | (a-6) | (b-1) | (c-2) | 80/10/10 | 12000 | 1.8 |
| 7 | (a-7) | (b-1) | — | 80/20 | 19000 | 1.7 |
| 8 | (a-8) | (b-1) | — | 80/20 | 11000 | 1.9 |
| 9 | (a-9) | (b-1) | — | 80/20 | 15000 | 1.8 |
| 10 | (a-5) | (b-2) | — | 80/20 | 14000 | 1.9 |
| 11 | (a-5) | (b-3) | — | 80/20 | 18000 | 1.8 |
| 12 | (a-5) | (b-4) | — | 80/20 | 17000 | 2.1 |
| 13 | (a-5) | (b-5) | — | 90/10 | 12000 | 1.9 |
| 14 | (a-5) | (b-6) | — | 80/20 | 15000 | 2.1 |
| 15 | (a-5) | (b-7) | — | 80/20 | 16000 | 1.7 |
| 16 | (a-5) | (b-8) | — | 80/20 | 17000 | 1.8 |
| 17 | (a-5) | (b-9) | — | 80/20 | 12000 | 1.9 |
| 18 | (a-5) | (b-1) | — | 80/20 | 5000 | 1.8 |
| 19 | (a-5) | (b-1) | — | 80/20 | 25000 | 2.2 |
| 20 | (a-5) | (b-1) | — | 80/20 | 40000 | 2.2 |

(B) Pigment Dispersion

The colored curable composition according to the invention includes (B) the pigment dispersion. The (B) the pigment dispersion according to the invention includes (B-1) a pigment and (B-2) a pigment dispersant. Hereinbelow, these components are described in detail.

(B-1) Pigment

Various known inorganic pigments or organic pigments can be used as (B) the pigment.

Considering that a high transmittance pigment is preferable, the size of the inorganic pigments or organic pigments is preferably as small as possible. In consideration of handling properties, the average primary particle diameter of (B) the pigment is preferably from 0.005 μm to 0.1 μm, and more preferably from 0.005 μm to 0.05 μm.

Examples of inorganic pigments that can be used in the colored curable composition according to the invention include metal compounds such as metal oxides or metal complex salts. Specific examples thereof include metal oxides such as iron oxides, cobalt oxides, aluminium oxides, cadmium oxides, lead oxides, copper oxides, titanium oxides, magnesium oxides, chromium oxides, zinc oxides and antimony oxides, and composite oxides of these metals.

Examples of organic pigments that can be used in the colored curable composition according to the invention include:

C. I. Pigment Yellow 1, 1:1, 2, 3, 4, 5, 6, 9, 10, 12, 13, 14, 16, 17, 24, 31, 32, 34, 35, 35:1, 36, 36:1, 37, 37:1, 40, 41, 42, 43, 48, 53, 55, 61, 62, 62:1, 63, 65, 73, 74, 75, 81, 83, 87, 93, 94, 95, 97, 100, 101, 104, 105, 108, 109, 110, 111, 116, 117, 119, 120, 126, 127, 127:1, 128, 129, 133, 134, 136, 138, 139, 142, 147, 148, 150, 151, 153, 154, 155, 157, 158, 159, 160, 161, 162, 163, 164, 165, 166, 167, 168, 169, 170, 172, 173, 174, 175, 176, 180, 181, 182, 183, 184, 185, 188, 189, 190, 191, 191:1, 192, 193, 194, 195, 196, 197, 198, 199, 200, 202, 203, 204, 205, 206, 207, and 208;

C. I. Pigment Orange 1, 2, 5, 13, 16, 17, 19, 20, 21, 22, 23, 24, 34, 36, 38, 39, 43, 46, 48, 49, 61, 62, 64, 65, 67, 68, 69, 70, 71, 72, 73, 74, 75, 77, 78, and 79;

C. I. Pigment Red 1, 2, 3, 4, 5, 6, 7, 8, 9, 12, 14, 15, 16, 17, 21, 22, 23, 31, 32, 37, 38, 41, 47, 48, 48:1, 48:2, 48:3, 48:4, 49, 49:1, 49:2, 50:1, 52:1, 52:2, 53, 53:1, 53:2, 53:3, 57, 57:1, 57:2, 58:4, 60, 63, 63:1, 63:2, 64, 64:1, 68, 69, 81, 81:1, 81:2 81:3 81:4, 83, 88, 90:1, 101, 101:1, 104, 108, 108:1, 109, 112, 113, 114, 122, 123, 144, 146, 147, 149, 151, 166, 168, 169, 170, 172, 173, 174, 175, 176, 177, 178, 179, 181, 184, 185, 187, 188, 190, 193, 194, 200, 202, 206, 207, 208, 209, 210, 214, 216, 220, 221, 224, 230, 231, 232, 233, 235, 236, 237, 238, 239, 242, 243, 245, 247, 249, 250, 251, 253, 254, 255, 256, 257, 258, 259, 260, 262, 263, 264, 265, 266, 267, 268, 269, 270, 271, 272, 273, 274, 275, and 276;

C. I. Pigment Violet 1, 1:1, 2, 2:2, 3, 3:1, 3:3, 5, 5:1, 14, 15, 16, 19, 23, 25, 27, 29, 31, 32, 37, 39, 42, 44, 47, 49, and 50;

C. I. Pigment Blue 1, 1:2, 9, 14, 15, 15:1, 15:2, 15:3, 15:4, 15:6, 16, 17, 19, 25, 27, 28, 29, 33, 35, 36, 56, 56:1, 60, 61, 61:1, 62, 63, 66, 67, 68, 71, 72, 73, 74, 75, 76, 78, 79, and C. I. Pigment Blue 79 in which the Cl substituent group has been substituted by OH;

C. I. Pigment Green 1, 2, 4, 7, 8, 10, 13, 14, 15, 17, 18, 19, 26, 36, 45, 48, 50, 51, 54, and 55;

C. I. Pigment Brown 23, 25, and 26;

C. I. Pigment Black 1 and 7; and carbon black, acetylene black, lamp black, bone black, graphite, iron black, aniline black, cyanine black, and titanium black.

In particular, pigments having a basic N atom in the structure thereof are preferably used in the invention. These pigments having a basic N atom exhibit good dispersibility in the colored curable composition according to the invention. While the reason for this has not been sufficiently clarified, it is thought that good affinity of a pigment with a photosensitive polymerizable component may influence dispersibility.

Examples of pigments that can preferably be used in the invention include blue pigments and violet pigments. Preferable examples thereof include the following. However, the invention is not limited to these examples.

C. I. Pigment Violet 19, 23 and 32; and

C. I. Pigment Blue 15:1, 15:3, 15:6, 16, 22, 60 and 66;

Among these, C. I. Pigment Blue 15:6 and C. I. Pigment Violet 23 are preferable in view of color properties. These pigments may be used singly, or may be used in combination. The mass ratio of the blue pigment and the violet pigment (violet pigment/blue pigment) is preferably from 0/100 to 100/100, and more preferably 10/100 or less.

(B-2) Dispersant

As (B-2) the dispersant, for example, a known pigment dispersant or surfactant may be appropriately selected for use.

More specifically, various kinds of compounds can be used as the dispersant. Specific examples of the dispersant include cationic surfactants such as KP341 (olgano-siloxane polymer) (trade name, manufactured by Shin-Etsu Chemical Co., Ltd.), POLYFLOW Nos. 75, 90, and 95 ((meth)acrylic acid-based (co)polymer) (trade name, all manufactured by Kyoeisha Chemical Co., Ltd.) and W001 (trade name, available from Yusho Co., Ltd.); nonionic surfactants such as polyoxyethylene lauryl ether, polyoxyethylene stearyl ether, polyoxyethylene oleyl ether, polyoxyethylene octylphenyl ether, polyoxyethylene nonylphenyl ether, polyoxyethylene glycol dilaurate, polyoxyethylene glycol distearate and sorbitan fatty acid ester; anionic surfactants such as W004, W005 and W017 (trade name, all available from Yusho Co., Ltd.); high-molecular dispersants such as EFKA-46, EFKA-47, EFKA-47EA, EFKA Polymer 100, EFKA Polymer 400, EFKA Polymer 401 and EFKA Polymer 450 (trade name, all manufactured by BASF Japan Ltd.); various SOLSPERSE dispersants such as SOLSPERSE 3000, 5000, 9000, 12000, 13240, 13940, 17000, 24000, 26000 and 28000 (trade name, all available form Lubrizol Japan Ltd.); ADEKA PLURONIC L31, F38, L42, L44, L61, L64, F68, L72, P95, F77, P84, F87, P94, L101, P103, F108, L121 and P-123 (trade name, all manufactured by ADEKA CORPORATION); IONET S-20 (trade name, manufactured by Sanyo Chemical Industries, Ltd.); and DISPER BYK 101, 103, 106, 108, 109, 111, 112, 116, 130, 140, 142, 162, 163, 164, 166, 167, 170, 171, 174, 176, 180, 182, 2000, 2001, 2050, and 2150 (trade name, all manufactured by BYK Chemie). Other examples include an oligomer or a polymer having a polar group at a molecular terminal thereof or at a side chain thereof such as an acrylic copolymer.

The content of (B) the dispersant is preferably from 10 parts by mass to 70 parts by mass, more preferably from 30 parts by mass to 60 parts by mass, with respect to 100 parts by mass of the pigment.

Pigment Derivative

It is preferable that the pigment dispersion according to the invention further contains a pigment derivative.

The pigment derivative preferably has a structure in which a part of an organic pigment, an anthraquinone or an acridone is substituted by an acid group, a basic group, or a phthalimidomethyl group. Examples of the organic pigment for forming the pigment derivative include diketopyrrolopyrrole pigments; azo pigments such as azo compounds, disazo compounds and polyazo compounds; phthalocyanine pigments such as copper phthalocyanines, halogenated copper phthalocyanines and metal-free phthalocyanines; anthraquinone pigments such as aminoanthraquinone, diaminodianthraquinone, anthrapyrimidine, flavanthrone, anthanthrone, indanthrone, pyranthrone and violanthrone; quinacridone pigments, dioxazine pigments, perynone pigments, perylene pigments, thioindigo pigments, isoindoline pigments, isoindolinone pigments, quinophthalone pigments, threne pigments, and metal complex pigments.

The acid group that the pigment derivative may have is preferably a sulfonic acid group, a carboxylic acid group, or quaternary ammonium salt group thereof. The basic group that the pigment derivative may have is preferably an amino group, and more preferably a tertiary amino group.

The amount of the pigment derivative to be used is not specifically limited, and is preferably from 5 parts by mass to 50 parts by mass, and more preferably from 10 parts by mass to 30 parts by mass, with respect to 100 parts by mass of the pigment.

Other Components

In addition to the above-described components, the pigment dispersion may contain a high-molecular compound such as an alkali-soluble resin, as necessary. The alkali-soluble resin has a polar group such as an acid group, and may be effective for dispersing the pigment and thus may be effective for improving the dispersion stability of the pigment dispersion.

In the colored curable composition according to the invention, the pigment dispersion may be used in combination of another colorant. The colorant is not specifically limited, and a known colorant conventionally used for a color filter can be used. Examples thereof include colorants such as those described in JP-A No. 2002-14220, JP-A No. 2002-14221, JP-A No. 2002-14222, JP-A No. 2002-14223, and U.S. Pat. Nos. 5,667,920 and 5,059,500.

Examples of the chemical structure of the colorant include pyrazole azo dyes, anilino azo dyes, triphenylmethane dyes, anthraquinone dyes, anthrapyridone dyes, benzylidene dyes, oxonol dyes, pyrazolotriazole azo dyes, pyridone azo dyes, cyanine dyes, phenothiazine dyes, pyrrolopyrazole azomethine dyes, xanthene dyes, phthalocyanine dyes, benzopyran dyes, and indigo dyes. The colorant may be a dye or a pigment.

The pigment dispersion may further contain a solvent as a dispersion medium.

The solvent is selected based on the solubility of each component contained in pigment dispersion, the coating property when the pigment dispersion is used for a curable composition, or the like. Examples of the solvent include esters, ethers, ketones, and aromatic hydrocarbons. Among these, 3-ethoxymethyl propionate, 3-ethoxyethyl propionate, ethyl cellosolve acetate, ethyl lactate, diethyleneglycol dimethyl ether, butyl acetate, 3-methoxy methyl propionate, 2-heptanone, cyclohexanone, diethyleneglycol monoethylether acetate, diethylene glycol monobutyl ether acetate, propylene glycol methyl ether, and propyleneglycol monomethylether acetate (PGMEA) are preferable.

The content of the solvent in the pigment dispersion is preferably from 50% by mass to 95% by mass, and more preferable from 70% by mass to 90% by mass.

(C) Photopolymerization Initiator

The colored curable composition according to the invention includes (C) the photopolymerization initiator in order to improve the sensitivity and pattern formability.

The photopolymerization initiator that can be used in the invention is decomposed by light, thereby initiating and accelerating polymerization of a polymerizable component such as (D) the polymerizable compound described below. The photopolymerization initiator preferably has an absorption in the wavelength region of from 300 nm to 500 nm. (C) the photopolymerization initiator may have the property of initiating polymerization by heat, in addition to the property of initiating polymerization by light.

The photopolymerization initiator may be used singly, or in combination of two or more kinds thereof.

Examples of (C) the photopolymerization initiator include organic halogenated compounds, oxadiazole compounds, carbonyl compounds, ketal compounds, benzoin compounds, acridine compounds, organic peroxide compounds, azo compounds, coumarin compounds, azide compounds, metallocene compounds, hexaarylbiimidazole compounds, organic borate compounds, disulfonic acid compounds, oxime compounds, onium salt compounds, acylphosphine (oxide) compounds and alkylamino compounds.

Hereinafter, each of these compounds is described in detail.

Specific examples of the organic halogenated compounds include the compounds described in Wakabayashi et al., “Bull. Chem. Soc. Japan” 42, 2924 (1969), U.S. Pat. No. 3,905,815, JP-B No. 46-4605, JP-A Nos. 48-36281, 55-32070, 60-239736, 61-169835, 61-169837, 62-58241, 62-212401, 63-70243 and 63-298339, and M. P. Hutt, “Journal of Heterocyclic Chemistry” Vol. 1, No. 3 (1970). Specific examples thereof include oxazole compounds substituted by a trihalomethyl group, and s-triazine compounds.

Preferable examples of the s-triazine compounds include a s-triazine derivative in which at least one monohalogen-substituted, dihalogen-substituted, or trihalogen-substituted methyl group is bonded to an s-triazine ring. Specific examples thereof include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-1-propyloxystyryl)-4,6-bis(trichloromethyl)-s-triazine, 2-(p-tolyl)-4,6-bis(trichloromethyl)-s-triazine, 2-(4-naphthoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, and 2-methoxy-4,6-bis(tribromomethyl)-s-triazine.

Examples of the oxadiazole compounds include 2-trichloromethyl-5-styryl-1,3,4-oxadiazole, 2-trichloromethyl-5-(cyanostyryl)-1,3,4-oxadiazole, 2-trichloromethyl-5-(naphth-1-yl)-1,3,4-oxadiazole, and 2-trichloromethyl-5-(4-styryl)styryl-1,3,4-oxadiazole.

Examples of the carbonyl compounds include benzophenone derivatives such as benzophenone, Michler’s ketone, 2-methylbenzophenone, 3-methylbenzophenone, 4-methylbenzophenone, 2-chlorobenzophenone, 4-bromobenzophenone and 2-carboxybenzophenone; acetophenone derivatives such as 2,2-dimethoxy-2-phenylacetophenone, 2,2-diethoxyacetophenone, 1-hydroxycyclohexylphenyl ketone, α-hydroxy-2-methylphenylpropanone, 1-hydroxy-1-methylethyl-(p-isopropylphenyl) ketone, 1-hydroxy-1-(p-dodecylphenyl)ketone, 2-methyl-(4'-(methylthio)phenyl)-2-morpholino-1-propanone, 1,1,1-trichloromethyl-(p-butylphenyl) ketone, and 2-benzyl-2-dimethylamino-4-morpholinobutyrophenone; thioxanthone derivatives such as thioxanthone, 2-ethylthioxantone, 2-isopropylthioxantone, 2-chlorothioxantone, 2,4-dimethylthioxantone, 2,4-diethylthioxantone, and 2,4-diisopropylthioxantone; and benzoic acid ester derivatives such as ethyl p-dimethylaminobenzoate and ethyl p-diethylaminobenzoate.

Examples of the ketal compounds include benzyl methyl ketal and benzyl-β-methoxyethyl ethyl acetal.

Examples of the benzoin compounds include m-benzoin isopropyl ether, benzoin isobutyl ether, benzoin methyl ether, and methyl o-benzoylbenzoate.

Examples of the acridine compounds include 9-phenylacridine and 1,7-bis(9-acridinyl)heptane.

Examples of the organic peroxide compounds include trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butyl hydroperoxide, cumene hydroperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoyl peroxide, succinic acid peroxide, benzoyl peroxide, 2,4-dichlorobenzoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl)peroxydicarbonate, tert-butyl peroxyacetate, tert-butyl peroxypivalate, tert-butyl peroxyneodecanoate, tert-butyl peroxyoctanoate, tert-butyl peroxylaurate, tercyl carbonate, 3,3',4,4'-tetra-(t-butylperoxycarbonyl)benzophenone, 3,3',4,4'-tetra-(t-hexylperoxycarbonyl)benzophenone, 3,3',4,4'-tetra-(p-isopropylcumylperoxycarbonyl)benzophenone, carbonyl di(t-butylperoxy dihydrogen diphthalate), and carbonyl di(t-hexylperoxy dihydrogen diphthalate).

Examples of the azo compounds include azo compounds such as those described in JP-A No. 8-108621.

Examples of the coumarin compounds include 3-methyl-5-amino-((s-triazin-2-yl)amino)-3-phenylcoumarin, 3-chloro-5-diethylamino-((s-triazin-2-yl)amino)-3-phenylcoumarin, and 3-butyl-5-dimethylamino-((s-triazin-2-yl)amino)-3-phenylcoumarin.

Examples of the azide compounds include organic azide compounds such as those described in U.S. Pat. Nos. 2,848,328, 2,852,379 and 2,940,853, and 2,6-bis-(4-azidobenzylidene)-4-ethylcyclohexanone (BAC-E).

Examples of the metallocene compounds include various titanocene compounds described in JP-A Nos. 59-152396, 61-151197, 63-041484, 2-000249 and 2-004705; dicyclopentadienyl-Ti-bis-phenyl, dicyclopentadienyl-Ti-bis-2,6-difluorophen-1-yl, dicyclopentadienyl-Ti-bis-2,4-difluorophen-1-yl, dicyclopentadienyl-Ti-bis-2,4,6-trifluorophen-1-yl, dicyclopentadienyl-Ti-bis-2,3,5,6-tetrafluorophen-1-yl, dicyclopentadienyl-Ti-bis-2,3,4,5,6-pentafluorophen-1-yl, dimethylcyclopentadienyl-Ti-bis-2,6-difluorophen-1-yl, dimethylcyclopentadienyl-Ti-bis-2,4,6-trifluorophen-1-yl, dimethylcyclopentadienyl-Ti-bis-2,3,5,6-tetrafluorophen-1-yl, dimethylcyclopentadienyl-Ti-bis-2,3,4,5,6-pentafluorophen-1-yl; and iron-arene complexes such as those described in JP-A Nos. 1-304453 and 1-152109.

Examples of the hexaarylbiimidazole compounds include various compounds such as those described, for example, in JP-B No. 6-29285, U.S. Pat. Nos. 3,479,185, 4,311,783, and 4,622,286. Specific examples thereof include 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl) biimidazole, 2,2'-bis(o,o'-dichlorophenyl)-4,4',5,5'-tetraphenylbiimidazole, tetraphenylbiimidazole, 2,2'-bis(o-methylphenyl)-4,4',5,5'-tetraphenylbiimidazole, and 2,2'-bis(o-trifluorophenyl)-4,4',5,5'-tetraphenylbiimidazole.

Specific examples of the organic borate compounds include organic boric acid salts such as those described in JP-A Nos. 62-143044, 62-150242, 9-188685, 9-188686, 9-188710, 2000-131837, 2002-107916, and 2002-116539, Japanese Patent No. 2764769, and Kunz, Martin, "Rad Tech '98, Proceedings, Apr. 19-22, 1998, Chicago"; organic boron-sulfonium complexes or organic boron-oxosulfonium complexes such as those described in JP-A Nos. 6-157623, 6-175564 and 6-175561; organic boron-iodonium complexes such as those described in JP-A Nos. 6-175554 and 6-175553; organic boron-phosphonium complexes such as those described in JP-A No. 9-188710; and organic boron-transition metal coordination complexes such as those described in JP-A Nos. 6-348011, 7-128785, 7-140589, 7-306527 and 7-292014.

Examples of the disulfonic acid compounds include compounds such as those described in JP-A Nos. 61-166544 and 2002-328465.

Examples of the oxime compounds include compounds such as those described in J. C. S. Perkin II (1979) 1653-1660, J. C. S. Perkin II (1979) 156-162, Journal of Photopolymer Science and Technology (1995) 202-232, and JP-A No. 2000-66385; and compounds such as those described in JP-A No. 2000-80068 and Japanese Patent Application National Publication (Laid-Open) No. 2004-534797.

Examples of the onium salt compound include diazonium salts such as those described in S. I. Schlesinger, Photogr. Sci. Eng., 18, 387 (1974) and T. S. Bal et al, Polymer, 21, 423 (1980), ammonium salts such as those described in U.S. Pat. No. 4,069,055 and JP-A No. 4-365049, phosphonium salts such as those described in U.S. Pat. Nos. 4,069,055 and 4,069,056, and iodonium salts such as those described in EP No. 104,143, U.S. Pat. Nos. 339,049 and 410,201 and JP-A Nos. 2-150848 and 2-296514.

Examples of the iodonium salts that can be used in the invention include a diaryl iodonium salt, which is preferably substituted by two or more electron-donating groups such as an alkyl group, an alkoxy group, or an aryloxy group, in consideration of stability. Another preferable diaryl iodonium salt is an iodonium salt having absorption at a wavelength of 300 nm or more in which one substituent of a triarylsulfonium salt has a coumarin structure or an anthraquinone structure.

Examples of sulfonium salts that can be used in the invention include sulfonium salts such as those described in EP Nos. 370,693, 390, 214, 233, 567, 297,443 and 297,442, U.S. Pat. Nos. 4,933,377, 161,811, 410,201, 339,049, 4,760,013, 4,734,444 and 2,833,827, and DE Nos. 2,904,626, 3,604,580 and 3,604,581. The sulfonium salt is preferably substituted by an electron-withdrawing group in consideration of stability and sensitivity. The electron-withdrawing group preferably has a Hammett value of larger than 0. Preferable examples of electron-withdrawing groups include a halogen atom and a carboxylic acid.

Preferable examples of the sulfonium salt further include a sulfonium salt having absorption at a wavelength of 300 nm or more in which one substituent of a triarylsulfonium salt has a coumarin structure or an anthraquinone structure. Furthermore, preferable examples of the sulfonium salt include a sulfonium salt having absorption at a wavelength of 300 nm or more in which a triarylsulfonium salt has an aryloxy group or an arylthio group as a substituent.

Examples of the onium salt compounds include selenonium salts such as those described in Macromolecules, 10(6), 1307 (1977) by J. V. Crivello et al. and J. Polymer Sci., Polymer Chem. Ed., 17, 1047 (1979) by J. V. Crivello et al.;

and arsonium salts such as those described in Teh, Proc. Conf. Rad. Curing ASIA, p. 478 Tokyo, October (1988) by C. S. Wen et al.

Examples of acyl phosphine (oxide) compounds include IRGACURE 819, DAROCUR 4265, and DAROCUR TPO (trade name, all manufactured by Ciba Specialty Chemicals Inc.).

Examples of the alkylamino compounds include a compound having a dialkylaminophenyl group and an alkylamine compound such as those described in paragraph [0047] of JP-A No. 9-281698, and in JP-A Nos. 6-19240 and 6-19249. Specific examples of the compounds having a dialkylaminophenyl group include ethyl p-dimethylaminobenzoate, and dialkylaminophenyl carbaldehyde such as p-diethylaminobenzcarbaldehyde or 9-julolidylcarbaldehyde. Specific examples of the alkylamine compounds include triethanolamine, diethanolamine and triethylamine.

As the (C) photopolymerization initiator that can be used in the invention, the above initiators can be appropriately used. In consideration of exposure sensitivity, it is preferable to use at least one of the following: triazine compounds of the organic halogenated compounds (s-triazine compounds); the ketal compounds; the benzoin compounds; the metallocene compounds; the hexaarylbiimidazole compounds; the oxime compounds; the acylphosphine (oxide) compounds; and the hexa-alkylamino compounds. It is more preferable to use at least one of the triazine compounds, the oxime compounds, the hexaarylbiimidazole compounds or the alkylamino compounds. It is still more preferable to use the oxime compounds.

When a colored curable composition according to the invention is used for the formation of colored pixels in color filters for solid-state image sensors, the pigment concentration in the colored curable composition is high due to the requirements for color filters for solid-state image sensors. Therefore, the concentration of a photopolymerization initiator in the colored curable composition is decreased and thus exposure sensitivity is reduced. When a stepper exposure is conducted using an initiator that generates a halogen-containing compound during the exposure such as triazine compounds, corrosion of the device may be caused. In consideration of these issues, oxime compounds are preferable as a photopolymerization initiator that can satisfy both exposure sensitivity and various properties, and oxime compounds having an absorption at a wavelength of 365 nm are more preferable.

In the invention, among the oxime compounds, a compound represented by the following Formula (Q) is preferable in consideration of exposure sensitivity, stability over time, and coloring at the time of post-heating. In addition, IRGACURE OXE-01 and OXE-02 (trade name, all manufactured by Ciba Specialty Chemicals Inc) are also preferable.

Formula (Q)

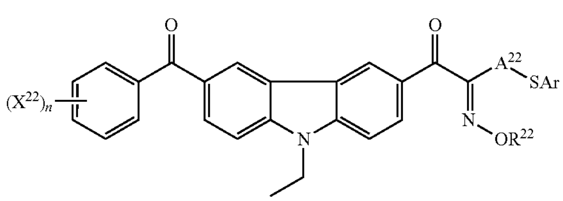

In Formula (Q), $R^{22}$ and $X^{22}$ each independently represent a monovalent substituent; $A^{22}$ represents a divalent organic group; Ar represents an aryl group; and n represents an integer of from 0 to 5.

In order to achieve high sensitivity, $R^{22}$ preferably represents an acyl group, and, specifically, an acetyl group, a propionyl group, a benzoyl group, and a toluoyl group are preferable.

In order to achieve high sensitivity and/or to suppress coloring caused by heating over time, $A^{22}$ preferably represents an unsubstituted alkylene group, an alkylene group substituted by an alkyl group (such as a methyl group, an ethyl group, a tert-butyl group, or a dodecyl group), an alkylene group substituted by an alkenyl group (such as a vinyl group or an allyl group) or an alkylene group substituted by an aryl group (such as a phenyl group, a p-tolyl group, a xylyl group, a cumenyl group, a naphthyl group, an anthryl group, a phenanthryl group, or a styryl group).

In order to achieve high sensitivity and/or to suppress coloring caused by heating over time, Ar preferably represents a substituted or unsubstituted phenyl group. Preferable examples of the substituent in the substituted phenyl group include a halogen group such as a fluorine atom, a chlorine atom, a bromine atom, or an iodine atom.

In order to improve solubility in solvents and to improve absorption efficiency in a long wavelength region, $X^{22}$ preferably represents a substituted or unsubstituted alkyl group, a substituted or unsubstituted aryl group, a substituted or unsubstituted alkenyl group, a substituted or unsubstituted alkynyl group, a substituted or unsubstituted alkoxy group, a substituted or unsubstituted aryloxy group, a substituted or unsubstituted alkylthioxy group, a substituted or unsubstituted arylthioxy group, and a substituted or unsubstituted amino group.

In Formula (Q), n preferably represents 1 or 2.

Specific examples of oxime compounds suitable for the colored curable composition according to the invention are shown below, but the invention is not limited to these examples.

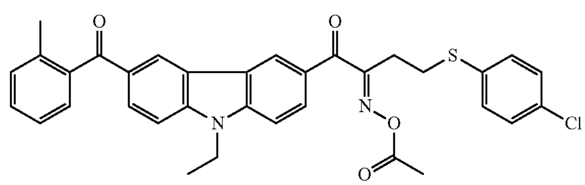

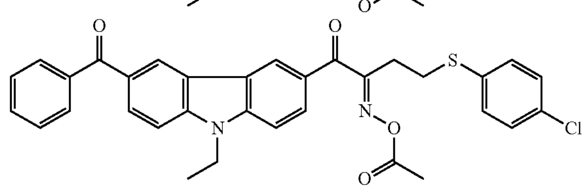

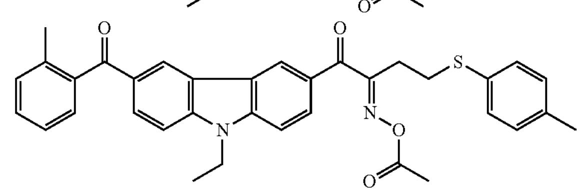

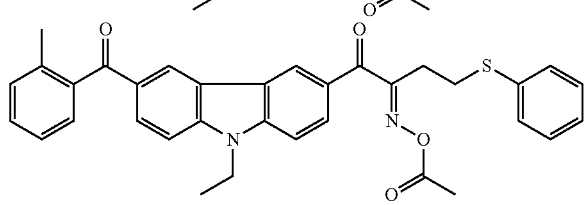

-continued

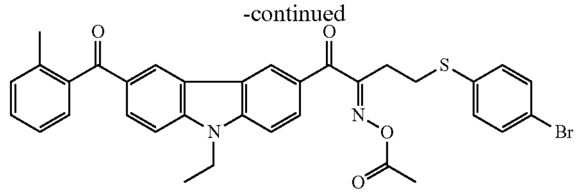

The content of (C) the photopolymerization initiator in the colored curable composition according to the invention is preferably from 0.1% by mass to 50% by mass, more preferably from 0.5% by mass to 30% by mass, and still more preferably from 1% by mass to 20% by mass, with respect to the total solid content of the colored curable composition. When the content of (C) the photopolymerization initiator is within the above range, excellent sensitivity and pattern forming property can be realized.

(D) Polymerizable Compound

The curable composition according to the invention contains (D) the polymerizable compound.

(D) The polymerizable compound that can be used in the invention is an addition-polymerizable compound having at least one ethylenically unsaturated double bond. The addition-polymerizable compound having at least one ethylenically unsaturated double bond may be selected from compounds each having at least one terminal ethylenically unsaturated bond, preferably having two or more terminal ethylenically unsaturated bonds.

Such a class of compounds is widely known in the relevant industrial field, and such compounds may be used in the invention without particular limitations.

Such compounds may be in the chemical form of a monomer or a prepolymer (such as a dimer, a trimer, or an oligomer), or a mixture of a monomer and a prepolymer, or a copolymer of a monomer and a prepolymer. Examples of the monomer and copolymers thereof include an unsaturated carboxylic acid (such as acrylic acid, methacrylic acid, itaconic acid, crotonic acid, isocrotonic acid, or maleic acid), and an esters or amides of the unsaturated carboxylic acid.

It is preferable to use an ester of an unsaturated carboxylic acid and an aliphatic polyhydric alcohol compound, or an amide of an unsaturated carboxylic acid and an aliphatic polyamine. Specific examples thereof include an addition reaction product of an unsaturated carboxylic acid ester or amide having a nucleophilic substituent such as a hydroxy group, an amino group or a mercapto group, with a monofunctional or polyfunctional, isocyanate or epoxy compound; and a dehydration condensation reaction product of such an unsaturated carboxylic acid ester or amide having a nucleophilic substituent with a monofunctional or polyfunctional carboxylic acid.

It is also preferable to use an addition reaction product of an unsaturated carboxylic acid ester or amide having an electrophilic substituent such as an isocyanate group or an epoxy group, with a monofunctional or polyfunctional alcohol, amine, or thiol, or substitution reaction product of an unsaturated carboxylic acid ester or amide having a halogen group or having a leaving substituent such as a tosyloxy group, with a monofunctional or polyfunctional alcohol, amine, or thiol.

Other examples include a compound obtained by replacing the unsaturated carboxylic acid in any of the above examples with an unsaturated phosphonic acid, styrene, vinyl ether, or the like.

Examples of the ester monomer of an aliphatic polyhydric alcohol compound and an unsaturated carboxylic acid include acrylic esters, methacrylic esters, itaconic esters, crotonic esters, isocrotonic esters, and maleic esters.

Examples of the acrylic esters include ethyleneglycol diacrylate, triethyleneglycol diacrylate, 1,3-butanediol diacrylate, tetramethyleneglycol diacrylate, propyleneglycol diacrylate, neopentylglycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethyleneglycol dicrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomers, and isocyanuric acid EO-modified triacrylate.

Examples of the methacrylic esters include tetramethyleneglycol dimethacrylate, triethyleneglycol dimethacrylate, neopentylglycol dimethacrylate, trimethylolpropane trimethacrylate, trimethylolethane trimethacrylate, ethyleneglycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, and bis[p-(methacryloxyethoxy)phenyl]dimethylmethane.

Examples of the itaconic esters include ethyleneglycol diitaconate, propyleneglycol diitaconate, 1,3-butanediol diitaconate, 1,4-butanediol diitaconate, tetramethylene glycol diitaconate, pentaerythritol diitaconate, and sorbitol tetraitaconate.

Examples of the crotonic esters include ethyleneglycol dicrotonate, tetramethylene glycol dicrotonate, pentaerythritol dicrotonate, and sorbitol tetradicrotonate.

Examples of the isocrotonic esters include ethyleneglycol diisocrotonate, pentaerythritol diisocrotonate, and sorbitol tetraisocrotonate.

Examples of the maleic esters include ethyleneglycol dimaleate, triethyleneglycol dimaleate, pentaerythritol dimaleate, and sorbitol tetramaleate.

Examples of esters further include aliphatic alcohol esters such as those described in JP-B No. 51-47334 and JP-A No. 57-196231, aromatic skeleton-containing compounds such as those described in JP-A Nos. 59-005240, 59-005241 and 02-226149, and amino group-containing compounds such as those described in JP-A No. 01-165613. A mixture of monomers selected from the ester monomers described above may be used.

A monomer having an acid group may be used as the compound having an ethylenically unsaturated double bond. Examples thereof include (meth)acrylic acid, pentaerythritol triacrylate monosuccinate, dipentaerythritol pentaacrylate monosuccinate, pentaerythritol triacrylate monomaleate, dipentaerythritol pentaacrylate monomaleate, pentaerythritol triacrylate monophthalate, dipentaerythritol pentaacrylate monophthalate, pentaerythritol triacrylate mono-tetrahydrophthalate, and dipentaerythritol pentaacrylate mono-tetrahydrophthalate. Among these, pentaerythritol triacrylate monosuccinate is preferable in terms of developability and sensitivity.

Examples of the amide monomer of an aliphatic polyamine compound and an unsaturated carboxylic acid include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide, and xylylene bismethacrylamide.

Examples of other preferable amide monomers include cyclohexylene structure-containing compounds such as those described in JP-B No. 54-21726.

Addition-polymerizable urethane compounds produced by an addition reaction of isocyanate with a hydroxy group are also preferably used. Examples thereof include vinyl urethane compounds such as those described in JP-B No. 48-41708, which have two or more polymerizable vinyl groups within a molecule thereof and which are produced by adding a compound represented by the following formula to a polyisocyanate compound having two or more isocyanate groups within a molecule thereof.

$$CH_2{=}C(R^{10})COOCH_2CH(R^{11})OH$$

Here, $R^{10}$ and $R^{11}$ each independently represent H or $CH_3$.

In addition, urethane acrylates such as those disclosed in JP-A No. 51-37193 and JP-B Nos. 2-32293 and 2-16765 and urethane compounds having an ethylene oxide skeleton such as those disclosed in JP-B Nos. 58-49860, 56-17654, 62-39417, and 62-39418 are preferable. In order to obtain a photopolymerizable composition with remarkably excellent photo-reactive rate, addition-polymerizable compounds having an amino structure and/or a sulfide structure in a molecule thereof, such as those disclosed in JP-A Nos. 63-277653, 63-260909, and 1-105238, are preferable.

Other examples include polyfunctional (meth)acrylates, such as polyester(meth)acrylates and epoxy(meth)acrylates obtained by reacting an epoxy resin and (meth)acrylic acid, such as those disclosed in JP-A No. 48-64183 and JP-B Nos. 49-43191 and 52-30490; specific unsaturated compounds such as those described in JP-B Nos. 46-43946, 1-40337, and 1-40336; and vinyl phosphonic acid compounds such as those described in JP-A No. 2-25493. In a certain case, a structure containing a perfluoroalkyl group such as those described in JP-A No. 61-22048 can be suitably used. Furthermore, substances that are described, as photosetting monomers and photosetting oligomers, in *Nihon Secchaku Kyoukai-Shi* (Journal of the Adhesion Society of Japan) Vol. 20, No. 7, pp. 300-308 (1984) can also be used.

Details of how to use (D) the polymerizable compound, such as what structure is used, whether they are used alone or in combination, or what amount is added, may be freely determined depending on the desired performance of the colored curable composition. For example, they may be selected from the following viewpoints.

In view of sensitivity, the polymerizable compound preferably has a structure having a higher content of unsaturated groups per molecule, and bifunctional or higher functional structures are preferable in many cases. In order to increase the strength of an image area (cured film in an image area), the polymerizable compound preferably has a tri- or higher-functional structure. A method of using a combination of compounds having different numbers of functional groups and/or different types of polymerizable groups (for example, compounds selected from an acrylic ester, a methacrylic ester, a styrene compound, and a vinyl ether compound) is also effective for regulating both of sensitivity and strength. In view of curing sensitivity, it is preferable to use a compound containing at least two (meth)acrylic acid ester structures, more preferably a compound containing at least three (meth)acrylic acid ester structures, and still more preferably a compound containing at least four (meth)acrylic acid ester structures. The polymerizable compound preferably contains a carboxylic acid group or an EO-modified structure from the viewpoint of curing sensitivity and developability of an unexposed area. The polymerizable compound is preferably a compound containing a urethane bond from the viewpoint of curing sensitivity and strength of an exposed area.

In addition, selection and usage mode of the polymerizable compound are important factors affecting the compatibility with other components contained in the colored curable composition (for example, a resin, a photopolymerization initiator and a colorant) and dispersibility. For example, the compatibility may be improved by using a low-purity compound or by using two or more polymerizable compounds in combination. Furthermore, a specific structure may be selected in order to improve the adhesiveness to a surface of a substrate.

From the above-mentioned viewpoints, preferable examples of (D) the polymerizable compound include bisphenol A diacrylate, a bisphenol A diacrylate EO-modified product, trimethylolpropane triacrylate, trimethylolpropane tri(acryloyloxypropyl)ether, trimethylolethane triacrylate, tetraethylene glycol diacrylate, pentaerythritol diacrylate, pentaerythritol triacrylate, pentaerythritol tetraacrylate, dipentaerythritol tetraacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, a pentaerythritol tetraacrylate EO-modified product, a dipentaerythritol hexaacrylate EO-modified product, and pentaerythritol triacrylate monosuccinate; and commercially available products, for example, urethane oligomers such as UAS-10 and UAB-140 (trade name, manufactured by Sanyo-Kokusaku Pulp Co., Ltd.); DPHA-40H (trade name, manufactured by Nippon Kayaku Co., Ltd.); UA-306H, UA-306T, UA-306I, AH-600, T-600 and AI-600 (trade name, manufactured by Kyoeisha Chemical Co., Ltd.) and UA-7200 (trade name, manufactured by Shin-Nakamura Chemical Co., Ltd.).

Of these, a bisphenol A diacrylate EO-modified product, pentaerythritol triacrylate, pentaerythritol tetraacrylate, dipentaerythritol pentaacrylate, dipentaerythritol hexaacrylate, tri(acryloyloxyethyl)isocyanurate, a pentaerythritol tetraacrylate EO-modified product, a dipentaerythritol hexaacrylate EO-modified product, and pentaerythritol triacrylate monosuccinate are more preferable, and, among these commercially available products, DPHA-40H (trade name, manufactured by Nippon Kayaku Co., Ltd.) and UA-306H, UA-306T, UA-306I, AH-600, T-600 and AI-600 (trade name, manufactured by Kyoeisha Chemical Co., Ltd.) are more preferable.

The content of (D) the polymerizable compound is preferably from 1% by mass to 90% by mass, more preferably from 5% by mass to 80% by mass, and still more preferably from 10% by mass to 70% by mass, with respect to the total solid content of the colored curable composition according to the invention.

(E) Solvent

The use of the colored curable composition according to the invention is not particularly limited to, but specifically, the colored curable composition is used for the manufacture of a color filter by a photolithographic method, the manufacture of a color filter by an inkjet method, and the like, as described below. (E) The solvent and/or other additives, which are described below, are suitably used in consideration of the use or the like, if needed.

First, the case where the colored curable composition according to the invention is used for the manufacture of a color filter by the photolithographic method is explained. The colored curable composition according to the invention used for the photolithographic method preferably contains (E) the solvent.

Examples of (E) the solvent include liquids selected from organic solvents such as those shown below. The solvent is selected in consideration of the solubility of each component contained in the pigment dispersion, the coating property when the solvent is used for a curable composition, and the like, and the solvent is not specifically limited as long as their intended physical properties are satisfied, but is preferably selected in consideration of safety.

Specific examples of the solvent include esters such as ethyl acetate, n-butyl acetate, isobutyl acetate, amyl formate, isoamyl acetate, butyl propionate, isopropyl butyrate, ethyl butyrate, butyl butyrate, methyl oxyacetate, ethyl oxyacetate, butyl oxyacetate, methyl methoxyacetate, ethyl methoxyacetate, butyl methoxyacetate, methyl ethoxyacetate, ethyl ethoxyacetate, methyl 3-oxypropionate, ethyl 3-oxypropionate, methyl 3-methoxypropionate, ethyl 3-methoxypropionate, methyl 3-ethoxypropionate, ethyl 3-ethoxypropionate, methyl 2-oxypropionate, ethyl 2-oxypropionate, propyl 2-oxypropionate, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, ethyl 2-ethoxy-2-methylpropionate, methyl pyruvate, ethyl pyruvate, propyl pyruvate, methyl acetoacetate, ethyl acetoacetate, methyl 2-oxobutanoate, and ethyl 2-oxobutanoate;

ethers, such as diethyleneglycol dimethyl ether, tetrahydrofuran, ethyleneglycol monomethyl ether, ethyleneglycol monoethyl ether, methyl cellosolve acetate(ethyleneglycol monomethyl ether acetate), ethyl cellosolve acetate(ethyleneglycol monoethyl ether acetate), diethyleneglycol monomethyl ether, diethyleneglycol monoethyl ether, diethyleneglycol monobutyl ether, diethyleneglycol monoethyl ether acetate, diethyleneglycol monobutyl ether acetate, propyleneglycol methyl ether, propyleneglycol monomethyl ether acetate, propyleneglycol ethyl ether acetate, and propyleneglycol propyl ether acetate;

ketones, such as methyl ethyl ketone, cyclohexanone, 2-heptanone, and 3-heptanone; and aromatic hydrocarbons, such as toluene and xylene.

Among these, methyl 3-ethoxypropionate, ethyl 3-ethoxypropionate, ethyl cellosolve acetate, ethyl lactate, diethyleneglycol dimethyl ether, n-butyl acetate, methyl 3-methoxypropionate, 2-heptanone, cyclohexanone, diethyleneglycol monoethyl ether acetate, diethyleneglycol monobutyl ether acetate, propyleneglycol methyl ether, and propyleneglycol monomethyl ether acetate (PGMEA) are more preferable.

The content of (E) the solvent in the colored curable composition according to the invention is preferably from 50% by mass to 90% by mass, more preferably from 60% by mass to 90% by mass, and still more preferably from 70% by mass to 90% by mass, with respect to the total mass of the colored curable composition. When the content of (E) the solvent is within the above range, generation of residual matter can be suppressed.

On the other hand, when the colored curable composition according to the invention is used for the manufacture of a color filter by the inkjet method, the content of (E) the solvent is preferably as small as possible in consideration of curing property as described below, and the colored curable composition may contain no (E) the solvent.

Various Additives

The colored curable composition according to the invention may contain, as necessary, various additives such as a filler, a high-molecular weight compound other than the above-mentioned one, a surfactant, an adhesion promoter, an antioxidant, an ultraviolet absorbent, and an aggregation inhibitor. Examples of such additives include additives such as those described in paragraphs [0274] to [0276] of JP-A No. 2008-292970.

Preparation Method of Colored Curable Composition

In the preparation of the colored curable composition according to the third aspect of the invention, the aforementioned respective components of the composition may be mixed at one time, or may be sequentially mixed after each of the components was dissolved in a solvent. Further, the addition order or operation conditions associated with mixing of the components are not specifically limited. All of the components may be simultaneously dissolved in a solvent to prepare a composition. Alternatively, as necessary, respective components may be appropriately dissolved to make two or more solutions, and when used (coated), these solutions may be mixed to prepare a composition.

The composition thus prepared may be filtered through a filter preferably having a pore diameter of 0.01 μm to 3.0 μm, and more preferably a pore diameter of 0.05 μm to 0.5 μm to use for desired applications.

The colored curable composition according to the third aspect of the invention can be suitably used in the formation of colored pixels of color filters for use in liquid crystal displays (LCDs) or solid-state image sensors (for example, CCD, CMOS, and the like). In particular, the colored curable composition according to the third aspect of the invention can be suitably used in the formation of color filters for solid-state image sensors such as CCD and CMOS.

When the colored curable composition according to the third aspect of the invention in used for the manufacture of a color filter by the photolithographic method, the colored curable composition is particularly suitable for forming a color filter for solid-state image sensors, which require the formation of a colored pattern with a minute size in a thin film and with an excellent rectangular cross-sectional profile Specifically, when a pixel pattern constituting a color filter has a size (a side length of the pixel pattern viewed from the substrate normal direction) of 2 μm or less (for example, 0.5 μm to 2.0 μm), the content of the coloring agent is increased, and line width sensitivity is reduced, thus resulting in narrowing of the DOF margin, which consequently impairs pattern formability. Such a tendency is particularly remarkable when the pixel pattern size is from 1.0 μm to 1.7 μm (and more remarkable when the pixel pattern size is from 1.2 μm to 1.5 μm). In addition, in the case of a thin film having a thickness of 1 μm or less, the amount of components (other than coloring agents) contributing to photolithographic properties relatively decreases in the film, the amount of other components is further decreased due to the increase in the amount of coloring agents, and the sensitivity is lowered, whereby separation of a pattern in a low-exposure region can easily occur. In this case, when a heat treatment such as postbaking is applied, thermal sagging readily occurs. These phenomena are particularly remarkable when the film thickness is from 0.005 μm to 0.9 μM (and more remarkable when the film thickness is from 0.1 μm to 0.7 μm).

On the other hand, when the colored curable composition according to the third aspect of the invention is used, it is possible to prepare a color filter having excellent pattern formability and having a favorable cross section profile even when the pixel pattern has a size of 2 μm or less.

Pattern Formation Method Using Colored Curable Composition

A method of forming a color filter by a photolithographic method using the colored curable composition according to the third aspect of the invention includes the processes of coating the colored curable composition on a substrate to form a colored layer, exposing the colored layer in a pattern-wise manner, and developing the colored layer after the exposure to form a pattern. Specific examples thereof include a method described in paragraphs [0277] to [0284] of JP-A No. 2008-292970.

Post-Curing Process

According to the present invention, after forming a pattern by development of the colored layer, it is preferable to perform a post-curing process for further curing the resulting pattern.

The post-curing process, which is carried out by heating (post-heating) and/or exposure (post-exposure such as ultraviolet light irradiation), further cures the resulting pattern, thereby preventing dissolution of a pattern in a process of forming a colored layer for the formation of the next-color pattern, and improving the solvent resistance of pixels of the resulting color filter.

The post-curing process is preferably carried out by ultraviolet light irradiation.

Post-Curing Process (Ultraviolet Light Irradiation Process)

In a ultraviolet light irradiation process, ultraviolet light (UV light) is irradiated onto the pattern, which has undergone a development treatment in the pattern-forming process, at an irradiation dose [mJ/cm$^2$] of 10-fold or higher than the exposure dose [mJ/cm$^2$] in the exposure treatment before the development treatment. The irradiation of UV light onto the post-development pattern for a predetermined time between development treatment and the heating treatment described below effectively prevent color transfer which may occur during subsequent heating. When the irradiation dose in this process is 10-fold or higher than the exposure dose in the exposure treatment before the development treatment, color transfer between colored pixels or color transfer between upper and lower layers may be prevented.

The irradiation dose of UV light is preferably from 12-fold to 200-fold, and more preferably from 15-fold to 100-fold the exposure dose in the exposure treatment before the development treatment.

The post-exposure may be carried out by g-rays, h-rays, i-rays, KrF, ArF, UV light, an electron beam, X-rays, or the like, and is preferably carried out by g-rays, h-rays, i-rays, or UV light, and is more preferably carried out by UV light. When irradiation of UV light (UV curing) is carried out, the irradiation is preferably carried out at a low temperature of from 20° C. to 50° C. (preferably from 25° C. to 40° C.). The wavelength of UV light preferably includes a wavelength ranging from 200 nm to 300 nm. Examples of a light source include a high-pressure mercury lamp, and a low-pressure mercury lamp. An irradiation time may be from 10 seconds to 180 seconds, preferably from 20 seconds to 120 seconds, and more preferably from 30 seconds to 60 seconds.

Examples of the light source for irradiation of UV light include an ultra-high pressure mercury lamp, a high-pressure mercury lamp, a low-pressure mercury lamp, and a DEEP UV lamp. Among these, a light source which can irradiate light that includes light with a wavelength of 275 nm or less in the ultraviolet light to be irradiated and in which the irradiation illuminance [mW/cm$^2$] of light with a wavelength of 275 nm or less is 5% or more relative to the integrated irradiation illuminance of the entire wavelength range in the ultraviolet light. When the irradiation illuminance of light with a wavelength of 275 nm or less in the ultraviolet light is 5% or more, the inhibitory effects against color transfer between colored pixels or transfer between upper and lower layers, and the effects of improving light fastness, are effectively enhanced. In view of these facts, it is preferable to use a light source that is different from the light source such as i-rays used for exposure in the pattern forming process, and specific examples thereof include a high-pressure mercury lamp, and a low-pressure mercury lamp. Among these, for the same reason as above, the irradiation illuminance of light with a wavelength of 275 nm or less is preferably 7% or more relative to the integrated irradiation illuminance of the entire wavelength range in the ultraviolet light. The upper limit of the irradiation illuminance of light with a wavelength of 275 nm or less is preferably 25% or less.

Here, the term "integrated irradiation illuminance" refers to the sum (area) of the illuminance of light of each wavelength contained in the irradiation light when a curve is plotted wherein illuminance (radiation energy passing through a unit area per unit time; [mW/m$^2$]) for each spectral wavelength is put on the vertical axis and the wavelength [nm] of the light is put on the horizontal axis.

The integrated irradiation illuminance of the ultraviolet light to be irradiated in the UV irradiation process for post-exposure is preferably 200 mW/cm$^2$ or more. When the integrated irradiation illuminance is 200 mW/cm$^2$ or more, the inhibitory effects against color transfer between the colored pixels or between upper and lower layers and the effects of improving light fastness, can be effectively enhanced. Among these, the integrated irradiation illuminance is preferably from 250 mW/cm$^2$ to 2000 mW/cm$^2$, and more preferably from 300 mW/cm$^2$ to 1000 mW/cm$^2$.

Further, the post-heating is preferably carried out in a hot plate or oven at a temperature of from 100° C. to 300° C., and more preferably from 150° C. to 250° C. The post-heating time is preferably from 30 seconds to 30000 seconds, and more preferably from 60 seconds to 1000 seconds.

In the post-curing process, the post-exposure and post-heating may be carried out in combination. In this case, either of them may be carried out first, but it is preferable to carry out the post-exposure prior to the post-heating. This is because deformation of the shape due to thermal sagging or trailing of the pattern which may occur in the post-heating process may be prevented due to the acceleration of the curing by post-exposure.

The colored pattern thus obtained constitutes pixels in the color filter. In the case of preparation of a color filter having multi-colored pixels, a color filter consisting of a desired number of hues can be manufactured by repeating the pattern forming process (and post curing process, as necessary) several times in accordance with a desired number of hues.

Colored Curable Composition Used for Inkjet Method

Hereinbelow, the case where the colored curable composition according to the third aspect of the invention is used for the manufacture of a color filter by the inkjet method is explained. Definitions and preferable examples of (A) the specific resin, (B) the pigment dispersion, (C) the photopolymerization initiator and (D) the polymerizable compound contained in the colored curable composition used for the manufacture of a color filter by the inkjet method is the same as the colored curable composition used for the manufacture of a color filter by photolithographic method. Therefore, the explanations for these components are omitted.

The colored curable composition used for an ink-jet method according to the present invention may contain (E) the solvent. In the present invention, the colored curable composition used for an ink-jet method that dose not contain (E) the solvent can be used. In the embodiment that the colored curable composition used for an ink-jet method dose not contain (E) the solvent, for example, (D) the polymerizable compound may serve as a solvent.

(E) The solvent is not particular limited as long as it satisfies the solubility of respective components or the boiling point of the solvent described below, and it is preferable that the solvent is selected particularly in consideration of solubility of the binder described below, coating properties, and safety. Specific examples of the solvent include solvents such as those described in paragraphs [0030] to [0040] of JP-A No. 2009-13206 can be exemplified.

A content of (E) the solvent is preferably from 30% by mass to 90% by mass, and more preferably from 50% by mass to 90%, with respect to the total mass of the colored curable composition. When a content of the solvent is 30% by mass or more, the amount of an ink provided within one pixel is maintained, whereby sufficient wet-spreading of the colored curable composition in the pixel is attained. When a content of the solvent is 90% by mass or less, the amount of the components in the colored curable composition other than the solvent serve to form a functional film (pixel or the like, for example) can be kept above a given amount. Accordingly, when a color filter is formed using the colored curable composition according to the invention, the amount of the colored curable composition required for each pixel is not excessively large, and, for example, when the colored curable composition is deposited in a recessed part separated with walls by using an ink-jet method, overflowing of the composition from the recessed part and color mixing with adjacent pixels can be inhibited.

When the colored curable composition used for an ink-jet method according to the third aspect of the invention contains the solvent, the solvent is preferably a solvent with a high boiling point, from the viewpoint of the jetting property of the colored curable composition from a nozzle and the wettability to the substrate. A solvent with a low boiling point may readily vaporizes even on an ink-jet head, which readily causes an increase in viscosity of the colored curable composition, precipitation of solids, or the like on the head, and causes degradation of the jetting property. In addition, when the colored curable composition wets and spreads on the substrate after reaching the substrate, the solvent vaporizes and increases viscosity of the colored curable composition at the edge of the wet-spreading region, whereby wet-spreading is inhibited due to a phenomenon known as "pinning" in some cases.

A boiling point of the solvent used in the colored curable composition for an ink-jet method according to the third aspect of the invention is preferably from 130° C. to 280° C. A boiling point of the solvent is higher than 130° C. is preferable from the view of the shape uniformity of pixels within the plane. A boiling point of the solvent is lower than 280° C. is preferable in view of removability of the solvent by prebaking. Here, the boiling point of the solvent means a boiling point under a pressure of 1 atm, and can be seen from physical characteristics tables of compound dictionaries (such as those published by Chapman & Hall) or the like. These solvents may be used singly or in combination of two or more kinds thereof.

As necessary, the colored curable composition for an ink-jet method according to the invention may contain a binder for the purpose of adjusting the viscosity, adjusting the ink hardness or the like. A binder that simply dries and solidifies may be used as the binder. For example, the binder may be composed of only a resin or resins having no polymerizability per se. However, in order to impart sufficient strength, durability, and adhesion to a coating film, it is preferable to use a binder that can cure a pixel through polymerization after the formation of a pattern of the pixel on the substrate by an ink-jet method. For example, a binder that can be cured by polymerization may be used, such as a photocurable binder that can be polymerized and cured by an action of visible light, UV light, electron beam or the like, and a thermosetting binder that can be polymerized and cured by heating.

The colored curable composition for an ink-jet method according to the third aspect of the invention may contain a crosslinking agent. As the crosslinking agent, it is preferable to use curing agents and accelerators described in Chapter 3 of "General Introduction to Epoxy Resins, Basic Edition I" (The Japan Society of Epoxy Resin Technology, published on Nov. 19, 2003). For example, a polyfunctional carboxylic acid anhydride or polyfunctional carboxylic acid can be used.

The colored curable composition for an ink-jet method according to the third aspect of the invention may further contain a surfactant. Suitable examples of the surfactant include surfactants described in paragraph [0021] of JP-A No. 7-216276, and in JP-A Nos. 2003-337424 and 11-133600. A content of the surfactant is preferably 5% by mass or less, with respect to the total amount of the colored curable composition.

The colored curable composition for an ink jet method according to the third aspect of the invention may contain other additives as necessary. Examples of the other additives include additives described in paragraphs [0058] to [0071] of JP-A No. 2000-310706.

The colored curable composition for an ink-jet method according to the third aspect of the invention can be prepared by a known method for producing an ink-jet ink.

In order to prepare a solution of (D) the polymerizable compound, when the solubility of a material to be used in the solvent is low, a treatment such as heating or ultrasonic treatment can be appropriately carried out as far as the polymerizable compound does not cause polymerization reaction.

Although the physical properties of the colored curable composition for an inkjet method according to the third aspect of the invention are not particularly limited as long as of the colored curable composition can be jetted through an ink-jet head, and the viscosity of the ink upon jetting thereof is preferably from 2 mPa·s to 30 mPa·s in order to attain stable jetting, and more preferably from 2 mPa·s to 20 mPa·s. In addition, when the colored curable composition is jetted by a machine, the temperature of the colored curable composition for an ink-jet method is preferably kept substantially constant in the range of from 20° C. to 80° C. When the temperature of the machine is high, the viscosity of the colored curable composition is lowered and jetting of a composition with a high viscosity is possible; however, a higher temperature may easily cause thermal denaturation and/or heat polymerization reaction of the colored curable composition in the head, or evaporation of the solvent on the surface of an ink-jetting nozzle, which easily leads to nozzle clogging. Therefore, the temperature of the machine is preferably in the range of from 20° C. to 80° C.

Here, the viscosity is measured with a commonly used E-type viscometer (for example, RE-80L E-type viscometer manufactured by Toki Sangyo Co., Ltd.), while the colored curable composition for an ink-jet method is kept at 25° C.

The surface tension (static surface tension) of the colored curable composition for an ink-jet method at 25° C. is preferably from 20 mN/m to 40 mN/m, and more preferably from 20 mN/m to 35 mN/m, in order to improve the wettability to the non-penetrative substrate and the jetting stability. When the colored curable composition is jetted by a machine, it is preferable to maintain the temperature of the colored curable composition for an ink-jet method substantially constant at from 20° C. to 80° C., and the surface tension at from 20 mN/m to 40 mN/m. In order to keep the temperature of the colored curable composition for an ink-jet method constant with a certain accuracy, the machine is preferably equipped with a device for detecting the temperature of the colored curable composition, a device for heating or cooling the colored curable composition, and a device for controlling heating or cooling in accordance with the detected temperature of the colored curable composition. The machine is preferably equipped with a device that regulates the energy applied to the device for jetting the composition in accordance with the temperature of the composition and reduces the influence from the change in characteristics of the composition.

Here, the surface tension of the colored curable composition is a value obtained by the Wilhermy method based on the measurement using a commonly used surface tension meter (for example, a surface tension meter FACE SURFACE TENSIOMETER CBVB-A3 manufactured by Kyowa Interface Science Co., Ltd.) at a liquid temperature of 25° C. and 60% RH.

In order to appropriately maintain the wet-spreading shape of the colored curable composition after impact on a substrate, it is preferable to maintain predetermined liquid properties of the colored curable composition after impact on the substrate. For this purpose, it is preferable to maintain a temperature of the substrate and/or the vicinity of the substrate within a predetermined range. It is also effective to reduce the influence from the change of the temperature by, for example, increasing the heat capacity of a table supporting the substrate.

When the colored curable composition according to the third aspect of the present invention is used for the manufacture of a color filter by an ink-jet method, excellent storage stability of the colored curable composition can be achieved and aggregation or decomposition of the colored curable composition can be inhibited. Further, even upon continuous and intermittent jetting of the colored curable composition, disorder of jetting such as non-jetting or flight bending of droplets does can be reduced, whereby excellent jetting stability can be achieved, and excellent recovery properties after a given period of a pause and upon the occurrence of non-jetting or the like can be obtained.

The method of producing a color filter by an ink-jet method using the colored curable composition according to the third aspect of the present invention is not particularly limited, and, for example, the method described in paragraphs [0114] to of JP-A No. 2008-250188 can be used.

Intended Use of Color Filter According to the Third Aspect of the Present Invention The color filter according to the third aspect of the invention may further have an indium tin oxide (ITO) layer as a transparent conductive film. Examples of the method of forming the ITO layer include an in-line low temperature sputtering method, an in-line high temperature sputtering method, a batch-wise low-temperature sputtering method, a batch-wise high-temperature sputtering method, a vacuum deposition method, and a plasma CVD method. The low-temperature sputtering method is preferably used because damages to the color filter can be reduced.

The intended use of the color filter according to the third aspect of the invention is not particularly limited, and examples of the intended use include image displays (particularly color image displays) such as liquid crystal displays, organic EL displays, liquid crystal projectors, displays for game machines, displays for portable terminals such as mobile phones, displays for digital cameras and displays for car navigators. The color filter according to the third aspect of the invention can be suitably used as a color filter for solid-state image sensors such as CCD image sensors and CMOS image sensors used in digital cameras, digital video cameras, endoscopes, mobile phones, or the like. In particular, the color filter is suitable for CCD devices or CMOS devices of high resolution, which may contain more than one million pixels.

The configuration of the solid-state image sensor is not specifically limited as long as it functions as a solid-state image sensor and includes the color filter according to the third aspect of the invention. For example, examples of the configuration of the solid-state image sensor include the following.

That is, specific examples of the configuration of the solid-state image sensor include a configuration in which a photodiode constituting a light-receiving area and a transfer electrode formed of polysilicon or the like are provided on a substrate, a color filter layer is provided thereon, and then a microlense is stacked thereon.

From the viewpoint of light-induced discoloration of color material, a camera system with the color filter according to the third aspect of the invention is preferably provided with a cover glass, a microlense, and the like on which a camera lens or an IR-cut film is dichroic-coated, and the materials thereof preferably have optical properties of partially or completely absorbing UV light of 400 nm or less. Further, in order to inhibit oxidative discoloration of the color material, a structure of the camera system is preferably configured to have a structure wherein oxygen permeability to the color filter is reduced. For example, the camera system is preferably partially or completely sealed with nitrogen gas.

Although the colored curable composition, the color filter and the method for preparing the color filter, and the image display device and solid-state image sensor with the color filter according to the third aspect of the invention have been described in detail by way of various embodiments, the present invention is not limited to those embodiments, and it should be understood that various modifications and alterations are possible without departing from the scope of the invention.

EXAMPLES

Hereinbelow, the first aspect of the invention is further illustrated below with reference to examples, but the first aspect of the invention is not limited to these examples unless departing from the scope of the invention. Unless otherwise specified, "part(s)" is expressed in terms of mass.

Example 1-1

(1) Preparation of Resist Solution A (Negative-Working Type)

The following components were mixed, and dissolved, thereby preparing a resist solution A.

| | |
|---|---|
| propyleneglycol monomethylether acetate | 5.20 parts |
| cyclohexanone | 52.60 parts |
| binder<br>(41% cyclohexanone solution of benzyl methacrylate/methacrylic acid/2-hydroxyethyl methacrylate copolymer (molar ratio of 60:20:20), average molecular weight in terms of the equivalent polystyrene molecular weight: 30,200) | 30.50 parts |
| dipentaerythritol hexaacrylate | 10.20 parts |
| polymerization inhibitor (p-methoxyphenol) | 0.006 part |
| fluorine-containing surfactant (trade name: F-475; manufactured by DIC Corporation) | 0.80 parts |
| photopolymerization initiator (4-benzoxolane-2,6-bis(trichloromethyl)-s-triazine; trade name: TAZ-107; manufactured by Midori Kagaku Co., Ltd.) | 0.58 parts |

(2) Preparation of Glass Substrate with Undercoat Layer

A glass substrate (trade name: Corning 1737; manufactured by Corning Inc.) was subject to the ultrasonic-cleaning using a 0.5% aqueous NaOH solution, washed with water, and subjected to a dehydration baking treatment (for 20 minute at 200° C.). Subsequently, the resist solution A obtained in item (1) above was coated on the cleaned glass substrate using a spin coater such that the obtained film after drying has a thickness of 2 μm, and then the glass substrate was heated and dried at 220° C. for 1 hour, thereby obtaining a glass substrate with an undercoat layer.

(3) Preparation of Colored Curable Composition (3-1) Preparation of Dispersion of C.I. Pigment Blue 15:6

The dispersion of C.I. Pigment Blue 15:6 was prepared as follows. That is, a mixed liquid containing 11.8 parts by mass of C.I. Pigment Blue 15:6 (average primary particle diameter of 55 nm), 5.9 parts by mass of a pigment dispersant BY-161 (trade name; manufactured by BYK Chemie GmbH), and 82.3 parts by mass of PGMEA was mixed and dispersed using a beads mill (using zirconia beads having a diameter of 0.3 mm) for 3 hours, thereby preparing a pigment dispersion. The pigment dispersion was subjected to a dispersion treatment under a pressure of 2,000 Kg/cm$^3$ at a flow rate of 500 g/minute using a high pressure dispersing machine equipped with a pressure-reducing system (NANO-3000-10; trade name; manufactured by Beryu Co., Ltd.). This dispersion treatment was repeated 10 times, thereby obtaining a pigment dispersion (C.I. Pigment Blue 15:6 dispersion). The average primary particle diameter of the pigment in the obtained pigment dispersion measured by a dynamic light scattering method using MICROTRAC NANOTRAC UP-A EX150 (trade name; manufactured by Nikkiso Co., Ltd.) was 24 nm.

(3-2) Preparation of Colored Curable Composition

The following components were mixed and dispersed, thereby obtaining a colored curable composition.

| | |
|---|---|
| cyclohexanone | 1.133 parts |
| copolymer of benzyl methacrylate/methacrylic acid (20% CyH solution) (molar ratio of 70:30, weight average molecular weight: 30,000) | 1.009 parts |
| SOLSPERSE 20000 (1% cyclohexane solution) (available form Lubrizol Japan Ltd.) | 0.125 parts |
| oxime photopolymerization initiator (compound having the structure as shown below) | 0.087 parts |
| colorant multimer (Exemplary Compound P21) | 0.183 parts |
| Pigment Blue 15:6 dispersion (solid content concentration of 17.70%, pigment concentration of 11.80%) | 2.418 parts |
| glycerol propoxylate (1% cyclohexane solution) | 0.048 parts |
| dipentaerythritol hexaacrylate | 0.225 parts |

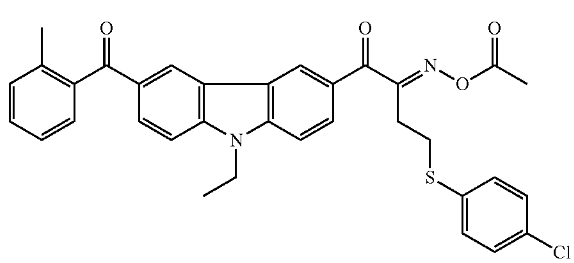 [SMILES: CCn1c2ccc(C(=O)/C(CCSc3ccc(Cl)cc3)=N/OC(C)=O)cc2c2cc(C(=O)c3ccccc3C)ccc21]

(4) Exposure and Development (Image Formation) of Colored Curable Composition

The colored curable composition obtained in item (3) above was coated on the undercoat layer of the glass substrate obtained in item (2) above using a spin coater such that the obtained film after drying has a thickness of 0.6 μm, and then the film was pre-baked at 100° C. for 120 seconds.

Subsequently, the coated film was irradiated with light having a wavelength of 365 nm through a mask having a pattern with a line width of 2 μm at an exposure dose of 200 mJ/cm$^2$ using an exposure machine UX3100-SR (trade name; manufactured by Ushio Inc.). After the exposure, the film was developed with a developer CD-2000 (trade name; manufactured by Fujifilm Electronic Materials Co., Ltd.) under the condition of at 25° C. for 40 seconds. Thereafter, the film was rinsed with running water for 30 seconds, spray dried, and post-baked at 200° C. for 15 minutes.

(5) Evaluation

The heat resistance and solvent resistance, and light fastness of the coated film obtained by applying the colored curable composition on the glass substrate were evaluated in the following manner. The evaluation results are shown in the following Table 14.

Heat Resistance

The glass substrate on which the colored curable composition obtained in item (3) above was coated was placed on a hot plate at 200° C. such that the bottom surface of the glass substrate comes into contact with the hot plate and was heated for 1 hour. The color difference (ΔE*ab value) of the colored curable composition before and after the heating was measured using a colorimeter (trade name: MCPD-1000; manufactured by Otsuka Electronics Co., Ltd.), and an index of the heat resistance was evaluated in accordance with the following evaluation criteria. A smaller ΔE*ab value indicates a better heat resistance. Here, the ΔE*ab value is a value calculated from the following color-difference formula according to CIE 1976 (L*, a*, b*) color space (Color Science Handbook (New edition in 1985); p. 266, edited by the Color Science Association of Japan).

$$\Delta E^*ab=\{(\Delta L^*)^2+(\Delta a^*)^2+(\Delta b^*)^2\}^{1/2}$$

Evaluation Criteria

A: ΔE*ab value is smaller than 3

B: ΔE*ab value is 3 or larger and smaller than 5

C: ΔE*ab value is from 5 to 15

D: ΔE*ab value is larger than 15

Solvent Resistance

The spectrum of the coated film after the post-baking obtained in item (4) above was measured (spectrum A). On this coated film, the resist solution A obtained in item (1) above was coated such that the obtained film had a thickness of 1 μm, and then the film was pre-baked. Thereafter, the film was developed with a developer CD-2000 (trade name; manufactured by Fujifilm Electronic Materials Co., Ltd.) under the condition of at 23° C. for 120 seconds, and the spectrum was measured again (spectrum B). As an index of solvent resistance, the colorant remaining ratio was calculated based on a difference between the spectrum A and the spectrum B. A value closer to 100% indicates a higher solvent resistance.

Evaluation Criteria

A: Colorant remaining ratio is more than 90%

B: Colorant remaining ratio is from 70% to 90%

C: Colorant remaining ratio is less than 70%

Light Fastness

The spectrum of the coated film after the post-baking obtained in item (4) above was measured (spectrum A). This coated film was irradiated with light with a xenon lamp at an irradiation dose of 100,000 lux for 20 hours (equivalent to 2,000,000 lux·hour). The color difference (ΔE*ab value) of the coated film before and after the irradiation was measured. The color difference was used as an index of light fastness. A smaller ΔE*ab value indicates a better light fastness. The evaluation criteria are as follows:

Evaluation Criteria

A: ΔE*ab value is smaller than 3

B: ΔE*ab value is 3 or larger and smaller than 5

C: ΔE*ab value is from 5 to 15

D: ΔE*ab value is larger than 15

Examples 1-2 to 1-59, and Comparative Examples 1-1 and 1-2

In Examples 1-2 to 1-59, and Comparative Examples 1-1 and 1-2, patterns were formed and evaluated similarly to Example 1-1 except that an equal amount of the respective colorants listed in the following Tables 14 to 17 were used in place of Exemplary Compound P21 in "(3) preparation of colored curable composition" in Example 1-1. The evaluation results are shown in Tables 14 to 17. The structures of Comparative Colorant 1 and Comparative Colorant 2 (C.I. Acid Red 87) in Table 14 are shown below.

TABLE 16

| | Colorant multimer | Heat resistance | Solvent resistance | Light fastness |
|---|---|---|---|---|
| Example 1-18 | S-1 | A | A | B |
| Example 1-19 | S-2 | A | A | A |
| Example 1-20 | S-3 | A | A | A |
| Example 1-21 | S-4 | A | A | A |
| Example 1-22 | S-5 | A | A | A |
| Example 1-23 | S-6 | A | A | A |
| Example 1-24 | S-7 | A | A | B |
| Example 1-25 | S-8 | B | A | B |
| Example 1-26 | S-9 | A | A | A |
| Example 1-27 | S-10 | B | A | C |
| Example 1-28 | S-11 | A | A | A |
| Example 1-29 | S-12 | A | A | A |
| Example 1-30 | S-13 | A | A | A |
| Example 1-31 | S-14 | A | B | A |
| Example 1-32 | S-15 | A | B | A |
| Example 1-33 | S-16 | B | B | B |
| Example 1-34 | S-17 | B | B | B |
| Example 1-35 | S-18 | B | B | B |

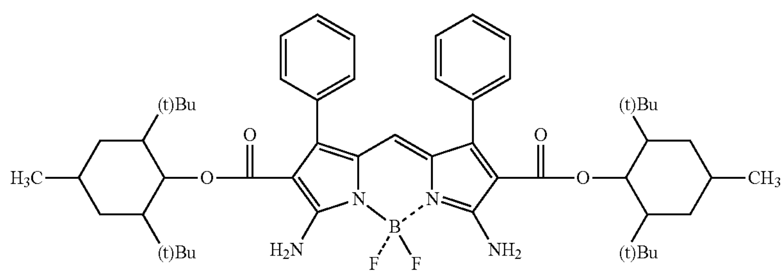

Comparative Colorant 1

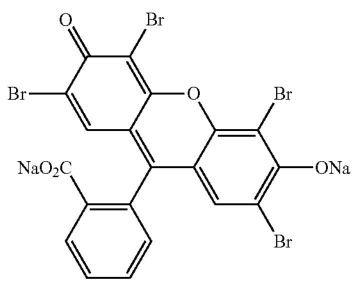

Comparative Colorant 2

TABLE 14

| | Colorant multimer | Heat resistance | Solvent resistance | Light fastness |
|---|---|---|---|---|
| Example 1-1 | P21 | B | A | B |
| Example 1-2 | P28 | B | A | B |
| Example 1-3 | P53 | B | A | A |
| Example 1-4 | P57 | B | A | A |
| Example 1-5 | P62 | A | A | A |
| Example 1-6 | P72 | A | A | B |
| Example 1-7 | P77 | A | A | B |
| Example 1-8 | P92 | B | A | B |
| Example 1-9 | P100 | B | A | B |
| Comparative Example 1-1 | Comparative Colorant 1 | D | C | D |
| Comparative Example 1-2 | Comparative Colorant 2 | C | B | D |

TABLE 15

| | Colorant multimer | Heat resistance | Solvent resistance | Light fastness |
|---|---|---|---|---|
| Example 1-10 | P176 | B | A | B |
| Example 1-11 | P179 | B | A | B |
| Example 1-12 | P183 | B | A | B |
| Example 1-13 | P184 | B | A | B |
| Example 1-14 | P185 | B | A | B |
| Example 1-15 | P192 | B | A | B |
| Example 1-16 | P193 | A | A | A |
| Example 1-17 | P197 | A | A | B |

TABLE 16-continued

| | Colorant multimer | Heat resistance | Solvent resistance | Light fastness |
|---|---|---|---|---|
| Example 1-36 | S-19 | A | A | A |
| Example 1-37 | S-20 | B | B | B |
| Example 1-38 | S-21 | B | B | B |
| Example 1-39 | S-22 | A | B | B |
| Example 1-40 | S-23 | A | B | B |
| Example 1-41 | S-24 | B | B | B |
| Example 1-42 | S-25 | A | B | B |
| Example 1-43 | S-26 | A | B | B |

TABLE 17

| | Colorant multimer | Heat resistance | Solvent resistance | Light fastness |
|---|---|---|---|---|
| Example 1-44 | P201 | A | A | B |
| Example 1-45 | P202 | A | A | B |
| Example 1-46 | P203 | A | A | B |
| Example 1-47 | P204 | A | A | B |
| Example 1-48 | P205 | B | B | B |
| Example 1-49 | P207 | B | A | B |
| Example 1-50 | P209 | A | A | A |
| Example 1-51 | P211 | A | B | B |
| Example 1-52 | P213 | A | A | B |
| Example 1-53 | P215 | A | A | B |
| Example 1-54 | P217 | A | A | B |
| Example 1-55 | P219 | A | B | B |
| Example 1-56 | P221 | B | A | B |
| Example 1-57 | P223 | A | A | B |
| Example 1-58 | P225 | A | A | C |
| Example 1-59 | P227 | B | B | C |

Examples 2-1 to 2-59, and Comparative Examples 2-1 to 2-2

The color filters of Examples 2-1 to 2-59, and Comparative Examples 2-1 to 2-2 were manufactured in the following procedures using the colored curable compositions used in Examples 1-1 to 1-59 and Comparative Example 1-1 to 1-2, respectively, and color transfer of the color filters was evaluated. The evaluation results are shown in the following Tables 18 to 21.

Manufacture of Monochromatic Color Filter

Each of the colored curable compositions used in Examples 1-1 to 1-59 and Comparative Examples 1-1 to 1-2 was coated on the glass substrate of Example 1-1 prepared in accordance with item (2) above using a spin coater such that the obtained film had a dry film thickness of 1 μm, and the glass substrate was pre-baked at 100° C. for 120 seconds to form a colored film thereon. The colored film was exposed through a mask having a 7.0 μm-square pattern arrayed over a 4 mm×3 mm area on a substrate at an exposure dose of 200 mJ/cm$^2$ and a illuminance of 1200 mW/cm$^2$ (integrated irradiation illuminance), using an i-line stepper (trade name: FPA-3000i5+; manufactured by Canon Inc.) After the exposure, the film was subjected to paddle development at 23° C. for 60 seconds using a developer CD-2000 (trade name; 60% solution, manufactured by Fujifilm Electronic Materials Co., Ltd.) to form a pattern. The pattern was then rinsed with running water for 20 seconds, and was spray dried. Thereafter, an ultraviolet irradiation treatment after exposure was conducted, in which the entire glass substrate on which the pattern has been formed was irradiated with ultraviolet rays at an exposure dose of 10000 mJ/cm$^2$ using a high pressure ultraviolet mercury lamp (trade name: UMA-802-HC552FFAL; manufactured by Ushio Inc.). After the irradiation, the substrate on which the pattern has been formed was post-baked at 220° C. for 300 seconds on a hot plate, thereby forming a colored pattern on the glass plate. Here, the irradiation illuminance [mW/cm$^2$] of the light at a wavelength of 275 nm or less is 10% with respect to the integral irradiation illuminance of the light over the whole wavelength range of the ultraviolet light.

Evaluation of Color Transfer

On the surface of the obtained color filter on which colored pattern has been formed, CT-2000L solution (transparent undercoating agent) (trade name; manufacture by Fujifilm Electronic Materials Co., Ltd.) was coated such that the obtained film had a dry film thickness of 1 μm, and the film was dried to form a transparent film. The transparent film was subjected to a heating treatment at 200° C. for 5 minutes. After finishing the heating treatment, the absorbance of the transparent film adjacent to the colored pattern was measured with a microspectrophotometer (LCF-1500M; trade name; manufactured by Otsuka Electronics Co. Ltd.). As an index of color transfer, the ratio (%) of the value of the absorbance of the obtained transparent film to that of the colored pattern measured before the heating was calculated.

Evaluation Criteria

The ratio (%) of color transfer to adjacent pixel

A: The ratio (%) of transfer to adjacent pixel is less than 1%

B: The ratio (%) of color transfer to adjacent pixel is 1% or more and less than 10%

C: The ratio (%) of color transfer to adjacent pixel is 10% or mole and less than 30%

D: The ratio (%) of color transfer to adjacent pixel is more than 30%

TABLE 18

| | Colorant multimer | Color transfer |
|---|---|---|
| Example 2-1 | P21 | B |
| Example 2-2 | P28 | B |
| Example 2-3 | P53 | A |
| Example 2-4 | P57 | A |
| Example 2-5 | P62 | B |
| Example 2-6 | P72 | A |
| Example 2-7 | P77 | A |
| Example 2-8 | P99 | B |
| Example 2-9 | P100 | B |
| Comparative Example 2-1 | Comparative Colorant 1 | D |
| Comparative Example 2-2 | Comparative Colorant 2 | C |

TABLE 19

| | Colorant multimer | Color transfer |
|---|---|---|
| Example 2-10 | P176 | B |
| Example 2-11 | P179 | B |
| Example 2-12 | P183 | A |
| Example 2-13 | P184 | B |
| Example 2-14 | P185 | B |
| Example 2-15 | P192 | B |
| Example 2-16 | P193 | B |
| Example 2-17 | P197 | B |

TABLE 20

| | Colorant multimer | Color transfer |
|---|---|---|
| Example 2-18 | S-1 | B |
| Example 2-19 | S-2 | A |
| Example 2-20 | S-3 | A |
| Example 2-21 | S-4 | A |
| Example 2-22 | S-5 | A |
| Example 2-23 | S-6 | A |
| Example 2-24 | S-7 | A |
| Example 2-25 | S-8 | B |
| Example 2-26 | S-9 | A |
| Example 2-27 | S-10 | B |
| Example 2-28 | S-11 | A |
| Example 2-29 | S-12 | A |
| Example 2-30 | S-13 | A |
| Example 2-31 | S-14 | A |
| Example 2-32 | S-15 | A |
| Example 2-33 | S-16 | B |
| Example 2-34 | S-17 | B |
| Example 2-35 | S-18 | B |
| Example 2-36 | S-19 | A |
| Example 2-37 | S-20 | B |
| Example 2-38 | S-21 | B |
| Example 2-39 | S-22 | A |
| Example 2-40 | S-23 | A |
| Example 2-41 | S-24 | B |
| Example 2-42 | S-25 | A |
| Example 2-43 | S-26 | A |

TABLE 21

| | Colorant multimer | Color transfer |
|---|---|---|
| Example 2-44 | P201 | B |
| Example 2-45 | P202 | C |
| Example 2-46 | P203 | B |
| Example 2-47 | P204 | C |
| Example 2-48 | P205 | A |
| Example 2-49 | P207 | B |
| Example 2-50 | P209 | B |
| Example 2-51 | P211 | A |
| Example 2-52 | P213 | B |
| Example 2-53 | P215 | B |
| Example 2-54 | P217 | B |

TABLE 21-continued

| | Colorant multimer | Color transfer |
|---|---|---|
| Example 2-55 | P219 | B |
| Example 2-56 | P221 | C |
| Example 2-57 | P223 | C |
| Example 2-58 | P225 | C |
| Example 2-59 | P227 | C |

As shown in Tables 14 to 17, in Examples 1-1 to 1-59 in which the colorant multimers of the invention are used, excellent solvent resistance, heat resistance and light fastness are exhibited.

Further, as shown in Tables 18 to 21, in the color filters of Examples 2-1 to 2-59 in which the colorant multimers of the invention are used, color transfer to adjacent pixel pattern are suppressed.

Hereinbelow, the second aspect of the invention is further illustrated below with reference to examples. The materials, reagents, ratio of materials, devices, operation methods in the following examples may be appropriately changed unless departing from the scope of the invention. Therefore, the second aspect of the invention is not limited to these examples. Unless otherwise specified, "%" and "part(s)" are expressed in terms of mass, and the molecular weight is expressed in terms of the weight average molecular weight.

Synthetic Example 1

Synthesis of Exemplary Compound 109

Exemplary Compound 109 of colorant multimer having a polymerizable group was synthesized by the method shown below.

First, a colorant monomer 2-4-A was synthesized by the method according to the following synthetic scheme.

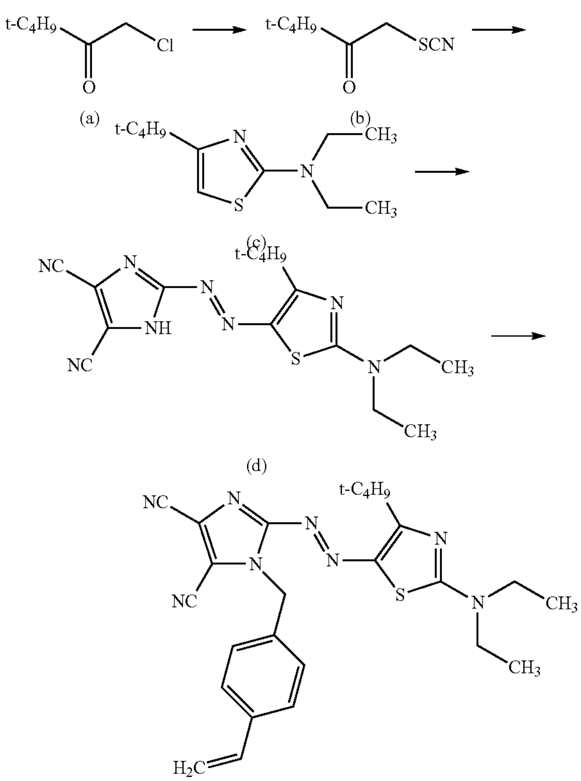

Synthesis of Intermediate (b)

Into a reaction vessel, 120.5 g (1.48 mol) of sodium thiocyanate and 280 mL of methanol were introduced, and the internal temperature of the vessel was raised to 55° C. To this mixture, 200 g (1.48 mol) of (a) 1-chloropinacolone was dropped over 30 minutes. After finishing the dropping, the reaction was continued for 2 hours with the internal temperature of the vessel kept at 55° C. After finishing the reaction, the internal temperature of the vessel was reduced to 10° C., and 250 mL of water was added thereto. The mixture was then stirred at 10° C. for 30 minutes. The crystal was then filtered and separated, thereby obtaining a white crystal of intermediate (b). The amount of the intermediate (b) was 218 g (yield 94%). Results of mass spectrometric analysis: (m/z)=158 ($[M+1]^+$, 100%).

Synthesis of Intermediate (c)

Into a reaction vessel, 157 g (1 mol) of intermediate (b), 800 mL of toluene and 28.6 mL of acetic acid were introduced, and the internal temperature of the vessel was raised to 80° C. To this mixture, 104 mL of diethylamine was slowly dropped over 30 minutes. After finishing the dropping, the reaction was continued for 3 hours with the internal temperature of the vessel kept at 80° C. After finishing the reaction, the internal temperature was reduced to 30° C., and 500 mL of water was added thereto. The toluene phase was then washed. The toluene phase was extracted twice with a 500 mL each of 1 N hydrochloric acid. The extract was neutralized with sodium hydroxide and then extracted with ethyl acetate. The extract was dried with magnesium sulfate and concentrated with a rotary evaporator, thereby obtaining a yellow liquid of intermediate (c). The amount of the obtained intermediate (c) was 106 g (yield 50%). Results of mass spectrometric analysis: (m/z)=212 ($M^+$, 100%).

Synthesis of Intermediate (d)

Synthesis of Diazonium Salt

Into a reaction vessel, 59.8 g (0.188 mol) of 40% nitrosylsulfuric acid, 100 mL of acetic acid and 75 mL of propionic acid were introduced, and the internal temperature of the vessel was reduced to 0° C. To this mixture, 25 g (0.188 mol) of 2-aminoimidazole-4,5-dicarbonitrile was added in batches, and the mixture was stirred for 2 hours at an internal temperature of 0° C. to 5° C.

Coupling Reaction

Separately, 39.9 g (0.188 mol) of intermediate (c), 350 mL of methanol, and 300 g of sodium acetate were placed in a flask, and the internal temperature of the flask was reduced to 0° C. To this mixture, the diazonium salt dispersion synthesized as described above was slowly dropped with the internal temperature kept at 10° C. or below. After finishing the dropping, the reaction was performed at an internal temperature of 0° C. to 5° C. for 1 hour, and at room temperature for further 1 hour. After finishing the reaction, 400 mL of water was added to the mixture, and was stirred for 60 minutes at room temperature. The crystal was then filtered and separated, and washed with warm water, thereby obtaining a red crystal of intermediate (d). The amount of the obtained intermediate (d) was 62 g (yield 93%). Results of mass spectrometric analysis: (m/z)=357 ($[M+1]^+$, 100%).

Synthesis of Colorant Monomer 2-4-A

In a 300 mL three-necked flask, 14.2 g (0.04 mol) of intermediate (d), 6.7 g (0.044 mol) of 4-vinyl benzyl chloride, 16.6 g (0.12 mol) of potassium carbonate, 18 g (0.12 mol) of sodium iodide, 100 mL of N,N-dimethyl acetamide, and 0.2 mL of nitrobenzene were introduced, and the reaction was performed for 2 hours at an internal temperature of the vessel of 50° C. After finishing the reaction, the reaction mixture was allowed to cool at room temperature, and 400 mL of water was added thereto. The resultant was extracted with 300 mL of ethyl acetate. The extract was washed with an aqueous sodium bicarbonate solution, and dried with magnesium sulfate. Thereafter, 5 mg of methoxy phenol was added to the mixture, and the resultant was concentrated to dryness with a rotary evaporator. The obtained residue was suspended and washed with 75 mL of methanol, and the crystal was filtered and separated, thereby obtaining a metallic glossy green crystal of colorant monomer 2-4-A. The amount of the obtained colorant monomer 2-4-A was 16.1 g (yield 85%). Results of mass spectrometric analysis: (m/z)=473 ($[M+1]^+$, 100%). The absorption maximum wavelength of colorant monomer 2-4-A in ethyl acetate was 496.4 nm. The absorption spectrum of colorant monomer 2-4-A in ethyl acetate is shown in FIG. 1.

Subsequently, according to the following synthetic scheme, the colorant monomer 2-4-A and the methacrylic acid were copolymerized by the following methods.

In a 100 mL three necked flask, 14.0 g (0.03 mol) of the colorant monomer 2-4-A and 6.0 g (0.07 mol) of methacrylic acid were placed, and the mixture was dissolved in 60 g of propyleneglycol methyl ether acetate, and heated to 75° C. in a stream of nitrogen. 0.69 g of a polymerization initiator (trade name: V-601; manufactured by Wako Pure Chemical Industries, Ltd.) was added to the solution, and the mixture was heated and stirred for 2 hours. Thereafter, 0.69 g of the polymerization initiator was further added to the mixture and stirred for 2 hours, and then the temperature was raised to 90° C. and stirred for another 2 hours. The remaining amounts of the colorant monomer and methacrylic acid in the solution confirmed by high speed liquid chromatography were 1% by mass or less, respectively. Subsequently, 100 mg of p-methoxyphenol, 0.4 g of dimethyl dodecylamine, and 4.2 g (0.03 mol) of glycidyl methacrylate were added to the reaction

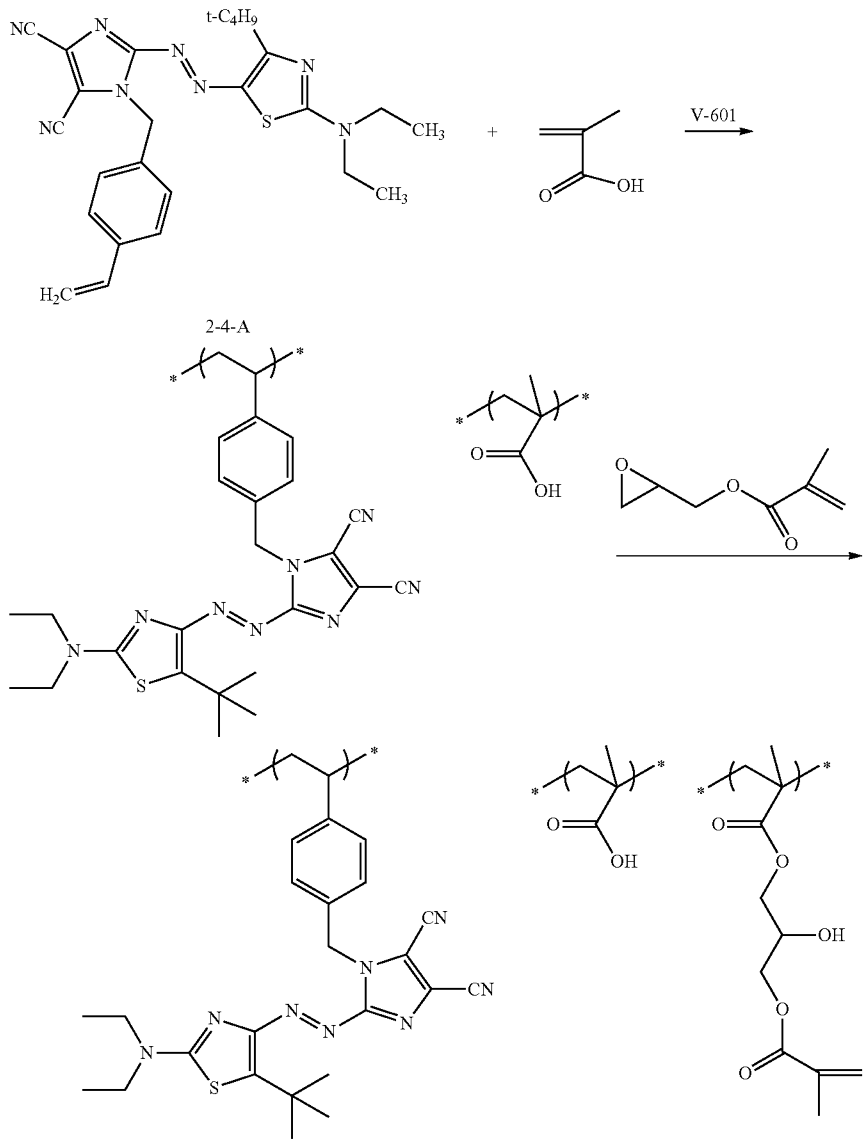

Exemplified Compound 109 liquid, and the temperature was raised to 95° C. The reaction liquid was then stirred for 10 hours in atmosphere, whereby a 30% by mass propyleneglycol methyl ether acetate solution of a colorant multimer having a polymerizable group (Exemplary Compound 109) was synthesized. The remaining amount of glycidyl methacrylate in the solution confirmed by high speed liquid chromatography was 1% by mass or less, respectively. The weight average molecular weight (Mw) of the obtained colorant multimer was 18,000, and the acid value was 90 mgKOH/g.

Other exemplary compounds in Table 11 (Exemplary Compound 101 and the like) can be synthesized based on the above synthetic examples, from a chemical standpoint. Exemplary compounds 105 and 111 in Table 11 can be easily synthesized by reacting a dye containing a diol and carboxylic acid compound with diisocyanate or bis(acid anhydride) to synthesize a polyurethane or polyester, and adding glycidyl methacrylate thereto in a manner similar to the above.

Synthetic Example 2

Synthesis of Exemplary Compound 114

Exemplary Compound 114 of colorant multimer having a polymerizable group was synthesized by the method shown below.

First, Colorant Monomer J-1 was synthesized by the method according to the following synthetic scheme.

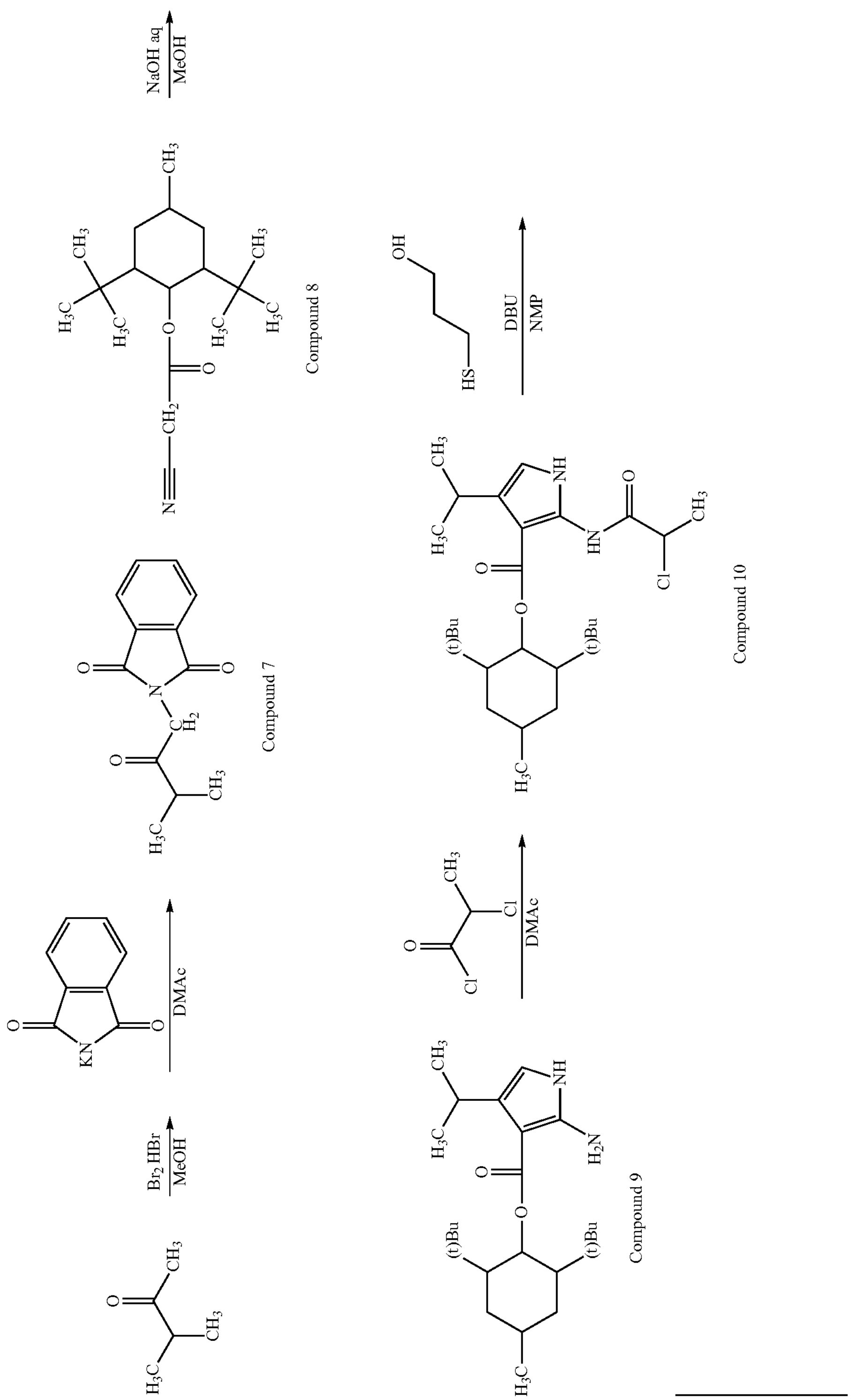
Br2 HBr
MeOH
KN
DMAc
Compound 7
Compound 8
NaOH aq
MeOH
Compound 9
DMAc
Compound 10
DBU
NMP -continued
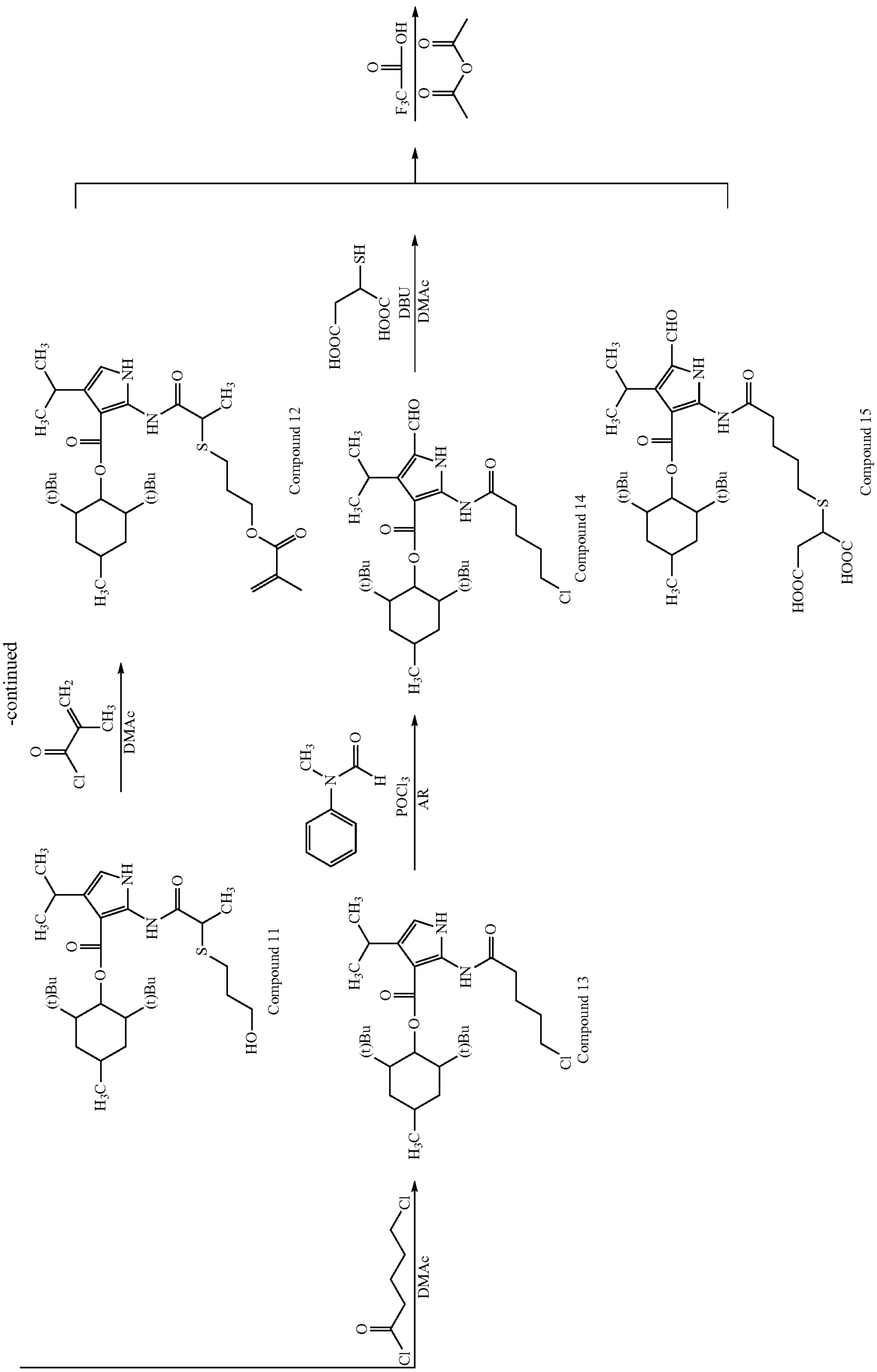

-continued
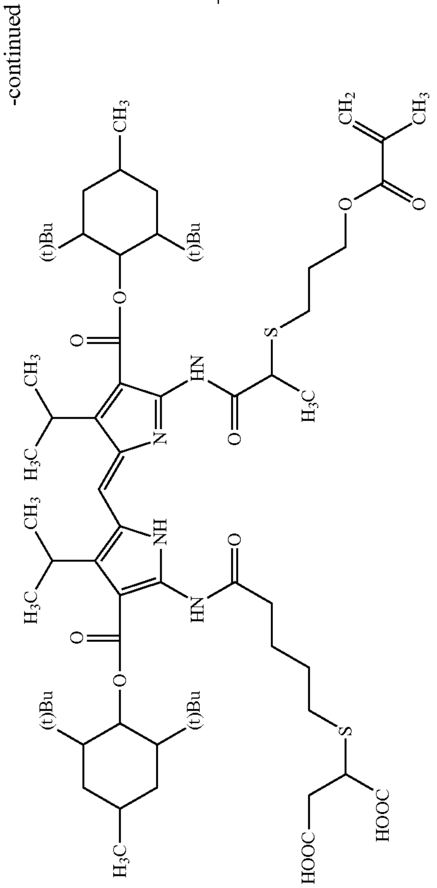
Compound 16
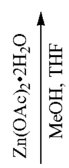
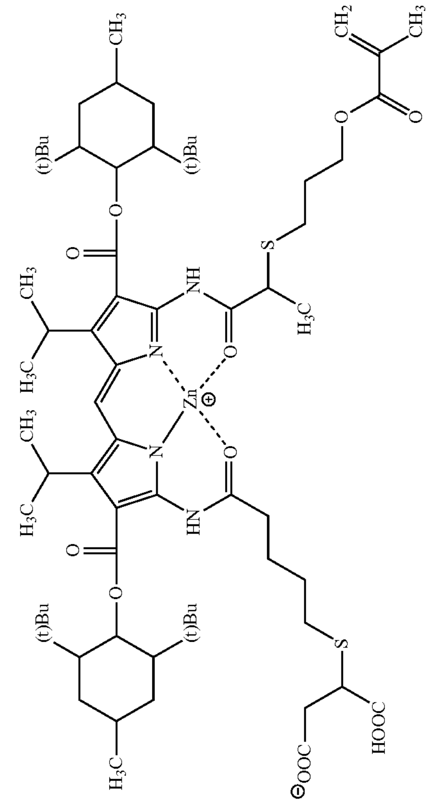
J-1

Synthesis of Compound 7

206.4 g of isopropyl methyl ketone was stirred in 1 L of methanol, and then 7 mL of hydrobromic acid (47% to 49% aqueous solution) was added thereto. Subsequently, bromine was dropped into the mixture at 30° C. to 34° C. over 3 hours. Thereafter, the reaction liquid was stirred at 30° C. for 30 minutes. The reaction liquid was neutralized with an aqueous solution of 124 g of sodium hydrogencarbonate in 1.3 L of water. An aqueous solution of 400 g of sodium chloride in 1.3 L of water was then added to the mixture, thereby isolating a liquid reaction product by phase separation.

The isolated reaction product was dropped into a water-cooled solution, in which 222 g of potassium phthalimide was dissolved while stirring in 800 mL of dimethyl acetamide (DMAc), and the mixture was stirred for 4 hours at room temperature. Thereafter, 720 mL of water was added to the resultant mixture with water-cooling and the precipitated crystal was filtered and separated. The obtained crystal was suspended in 1.5 L of toluene, insoluble substances were filtered off, and the filtrate was concentrated, thereby obtaining 100 g of Compound 7.

Compound 7: $^{1}$H-NMR, 400 MHz, δ ($CDCl_3$) ppm: 1.21-1.23 (6H, d), 2.74-2.79 (1H, m), 4.56 (2H, s), 7.72-7.74 (2H, d), 7.85-7.87 (2H, d).

Synthesis of Compound 8

Compound 8 was synthesized by the method described in Paragraph [0134] of JP-A No. 2008-292970.

Synthesis of Compound 9

293 g of Compound 8 and 231 g of Compound 7 were stirred in 1.4 L of methanol under nitrogen gas atmosphere. Thereafter, a solution of 88 g of sodium hydroxide in 400 mL of water was dropped therein at room temperature. The reaction mixture was then refluxed for 8 hours, and cooled to room temperature. The precipitated crystal was filtered and separated, and washed with 100 mL of methanol, thereby obtaining 299 g of Compound 9.

Compound 9: $^{1}$H-NMR, 400 MHz, δ ($CDCl_3$) ppm: 0.88-0.95 (18H, s), 1.00-1.03 (3H, d), 1.17-1.19 (6H, d), 1.20-1.66 (7H, m), 3.38-3.43 (1H, m), 5.19-5.24 (2H, br), 5.95 (1H, br), 6.00 (1H, s), 7.39-7.45 (1H, br).

Synthesis of Compound 10

80 g of Compound 9 was stirred in 250 mL of DMAc at room temperature, and then 29.2 g of 2-chloropropionyl chloride was dropped therein. The mixture was then stirred at room temperature for 3 hours. The reaction liquid was poured into a mixed liquid of 500 mL of ethyl acetate in 1 L of water, and washed with 500 mL of each of an aqueous saturated sodium bicarbonate solution, water, and saturated sodium chloride solution. The resultant was dried with magnesium sulfate, and concentrated under reduced pressure, thereby obtaining 89.4 g of Compound 10.

Compound 10: $^{1}$H-NMR, 400 MHz, δ ($CDCl_3$) ppm: 0.9 (18H, s), 0.96-1.01 (3H, d), 1.20-1.23 (2H, d), 1.26-1.38 (1H, q), 1.53-1.68 (6H, m), 1.8-1.82 (3H, d), 3.44-3.53 (1H, m) 4.5-4.57 (1H, q), 6.03 (1H, br), 6.27 (1H, s), 10.4-10.45 (1H, br), 11.31-11.42 (1H, br).

Synthesis of Compound 11

372.3 g of Compound 10 and 79.8 g of 3-mercapto-1-propanol were dissolved in 1 L of N-methylpyrrolidone (NMP), and the mixture was stirred at room temperature. 133.4 g of DBU was dropped into the mixture, and the resultant reaction liquid was stirred at room temperature for 2 hours. Thereafter, the reaction liquid was poured into a mixed liquid of 1.5 L of ethyl acetate and 1.5 L of water, and was washed with 1 L of each of a 1N hydrochloric acid, an aqueous saturated sodium bicarbonate solution, water, and saturated sodium chloride solution, and the organic phase was dehydrated with 50 g of magnesium sulfate. After filtration, the filtrate was evaporated to dryness. The residue was dispersed and washed, and the solid was filtered and separated. The resultant washed with 30 mL of acetonitrile, thereby obtaining 317 g of Compound 11.

Compound 11: $^{1}$H-NMR, 400 MHz, δ ($CDCl_3$) ppm: 0.9 (18H, s), 1.02-1.03 (3H, d), 1.21-1.22 (6H, d), 1.23-1.41 (5H, m), 1.56-1.57 (3H, d), 1.6-1.63 (2H, br), 1.79-1.89 (2H, m), 2.72-2.78 (2H, t), 3.43-3.47 (1H, m), 3.51-3.55 (1H, q), 3.78-3.73 (2H, q), 6.0 (1H, s), 6.23 (1H, s), 10.51-10.55 (1H, br), 11.21-11.29 (1H, br).

Synthesis of Compound 12

30 g of Compound 11 and 0.1 mL of nitrobenzene were dissolved in 250 mL of dimethyl acetamide, and 14.1 g of methacrylic acid chloride was dropped therein. The mixture was then stirred at room temperature for 2 hours. The reaction liquid was then added to a solution of 1.5 L of ethyl acetate and 1.5 L of water, and was extracted in an organic phase. The organic phase was washed twice with 400 mL of each of a 1 N hydrochloric acid, an aqueous saturated sodium bicarbonate solution, a saturated sodium chloride solution, and water. The organic phase was dehydrated with 30 g of magnesium sulfate, and was filtrated. The filtrate was concentrated to dryness, thereby obtaining 27.9 g of Compound 12.

Compound 12: $^{1}$H-NMR, 400 MHz, δ ($CDCl_3$) ppm: 0.9 (18H, s), 1.02-1.03 (3H, d), 1.21-1.22 (6H, d), 1.23-1.41 (5H, m), 1.56-1.57 (3H, d), 1.6-1.63 (2H, br), 1.9 (3H, s) 1.93-2.02 (2H, m), 2.6-2.73 (2H, t), 3.42-3.5 (1H, m), 3.51-3.56 (1H, q), 4.06-4.12 (1H, q), 4.14-4.23 (2H, t), 5.5 (1H, s), 6.11-6.15 (2H, m), 6.23 (1H, s), 10.42-10.48 (1H, br), 11.28-11.32 (1H, br).

Synthesis of Compound 13

263.6 g of Compound 9 was stirred in 800 mL of DMAc at room temperature, and then 108.5 g of 5-chlorovaleric acid chloride was dropped therein over 2 hours while cooling with ice. The reaction liquid was stirred at room temperature for 3 hours. The reaction liquid was poured into 18 L of water, and the precipitated crystal was filtered and separated. The obtained crystal was dispersed and washed with 1 L of acetonitrile, thereby obtaining 313 g of Compound 13.

Compound 13: $^{1}$H-NMR, 400 MHz, δ ($CDCl_3$) ppm: 0.9 (18H, s), 0.96-1.01 (3H, d), 1.20-1.75 (17H, m), 1.76-2.00 (2H, m), 2.41-2.53 (2H, m), 3.4-3.58 (1H, m), 3.54-3.60 (2H, m), 6.0 (1H, br), 6.22 (1H, s), 10.55 (2H, br).

Synthesis of Compound 14

75 g of phosphorous oxychloride kept at 5° C. or lower was dropped into a solution of 66.2 g of N-methylformanilide and 330 mL of acetonitrile while stirring at 0° C., and then the reaction liquid was stirred for one hour. Thereafter, 202 g of Compound 13 was added to the reaction liquid, stirred at a room temperature for 3 hours, and then stirred at 40° C. for one hour. The reaction liquid was then poured into 2 L of water, and the precipitated crystal was filtered. The resultant was rinse-washed with 500 mL of water and 500 mL of methanol, thereby obtaining 181 g of Compound 14.

Compound 14: $^{1}$H-NMR, 400 MHz, δ ($CDCl_3$) ppm: 0.9 (18H, s), 0.96-1.21 (3H, d), 1.22-1.76 (17H, m), 1.78-2.22 (2H, m), 2.45-2.55 (2H, m), 3.4-3.58 (1H, m), 3.54-3.60 (2H, m), 6.3 (1H, br), 9.88 (1H, s), 11.09 (1H, br), 11.47 (1H, br).

Synthesis of Compound 15

300 g of Compound 14 and 129 g of thiomalic acid were added to 3 L of dimethyl acetamide, and the mixture was stirred at room temperature. 434 g of DBU was then dropped into the mixture over 30 minutes with the temperature kept at 30° C. or below. Thereafter, the reaction liquid was stirred at 60° C. for 5 hours, and a solution of 103 g of sodium hydroxide in 600 mL of water was dropped into the reaction liquid over 10 minutes. The resultant mixture was cooled to room temperature, and the precipitated crystal was filtered. The resultant was rinse-washed with 1 L of ethyl acetate and then with 200 mL of methanol cooled to 5° C. The obtained crystal was dispersed in a solution of 1 L of ethyl acetate and 1 L of water, and then 220 mL of concentrated hydrochloric acid was added to the dispersion to dissolve the crystal in an organic phase. The organic phase was washed with 1 L of water twice, and 1 L of saturation sodium chloride solution once. The resultant was dried with 80 g of magnesium sulfate, and was filtered. The filtrate was concentrated under reduced pressure, thereby obtaining 255 g of Compound 15.

Compound 15: $^{1}$H-NMR, 400 MHz, δ ($CDCl_3$) ppm: 0.9 (18H, s), 0.96-1.21 (3H, d), 1.22-1.76 (17H, m), 1.78-2.22 (2H, m), 2.45-2.65 (4H, m), 3.35-3.61 (2H, m), 3.54-3.60 (2H, m), 6.3 (1H, br), 9.92 (1H, s), 11.11 (1H, br), 11.81 (1H, br).

Synthesis of Compound 16

8.27 g of Compound 12, 8.92 g of Compound 13 and 45 mL of acetic anhydride were stirred at room temperature, and then 5.39 mL of trifluoroacetic acid was dropped therein while cooling with ice. The resultant mixture was stirred at room temperature for 3 hours. The reaction liquid was dropped into an aqueous solution, which is obtained by stirring 400 mL of water, 60 g of sodium hydrogencarbonate and three drops of pyridine at room temperature, to be neutralized, and the mixture was stirred at room temperature for 3 hours. The precipitated crystal was filtered and separated, and then rinse-washed with water. The resultant was dried with an air blower, thereby obtaining 16 g of Compound 16.

Compound 16: $^{1}$H-NMR, 400 MHz, δ ($CDCl_3$) ppm: 0.92 (36H, s), 0.96-2.0 (44H, m), 2.04 (3H, s), 2.62-2.83 (3H, m), 2.97-3.56 (7H, m), 4.14-4.27 (1H, m), 5.0 (1H, br), 6.05 (3H, br), 7.52-7.56 (111, br), 10.25-10.89 (1H, br), 11:34-11.56 (1H, br).

Synthesis of Colorant Monomer J-1

12.6 g of Compound 16, 150 mL of methanol, and 75 mL of tetrahydrofuran were stirred at room temperature, and then 2.2 g of zinc acetate dihydrate was added thereto and stirred for 2 hours. Thereafter, 500 mL of water was added to the reaction liquid, and the precipitated crystal was filtered. The resultant was dried with air blow, thereby obtaining 13 g of Colorant Monomer J-1.

Colorant Monomer J-1: $^{1}$H-NMR, 400 MHz, δ (DMSO-$d_6$) ppm: 0.97 (36H, s), 0.99-2.05 (47H, m), 2.07-3.05 (8H, m), 4.04-4.4 (3H, m), 5.53 (1H, br), 6.05-6.12 (3H, br), 8.8 (1H, s), 10.97-11.18 (1H, br), 11.91-12.01 (1H, br).

Exemplary compound 114 was synthesized from Colorant Monomer J-1 according to the following synthetic scheme.

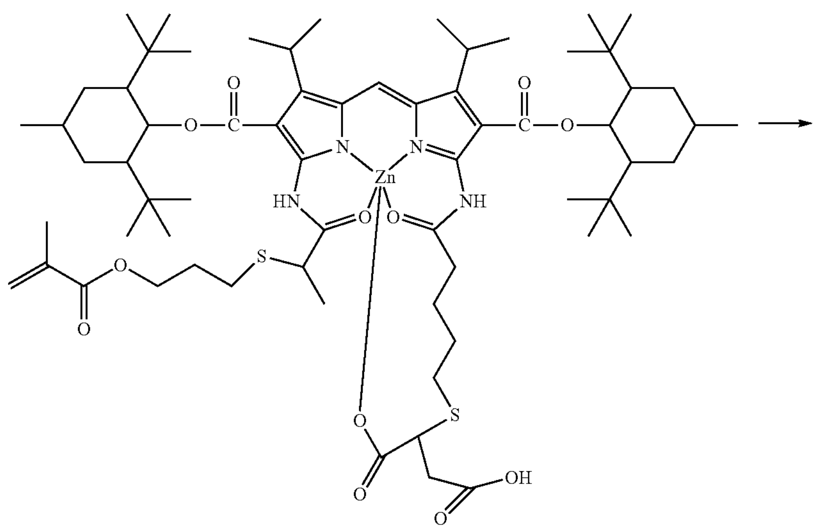

J-1

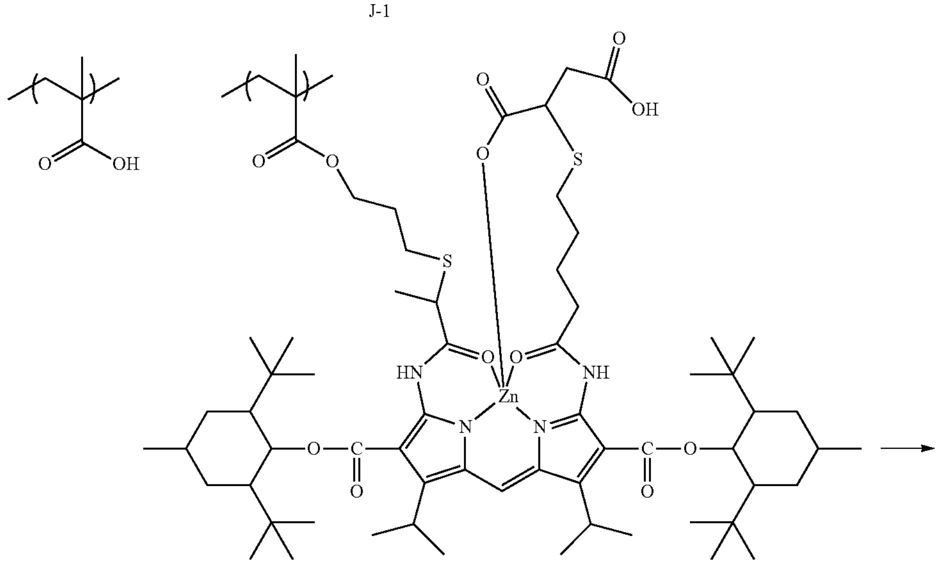

J-2

-continued

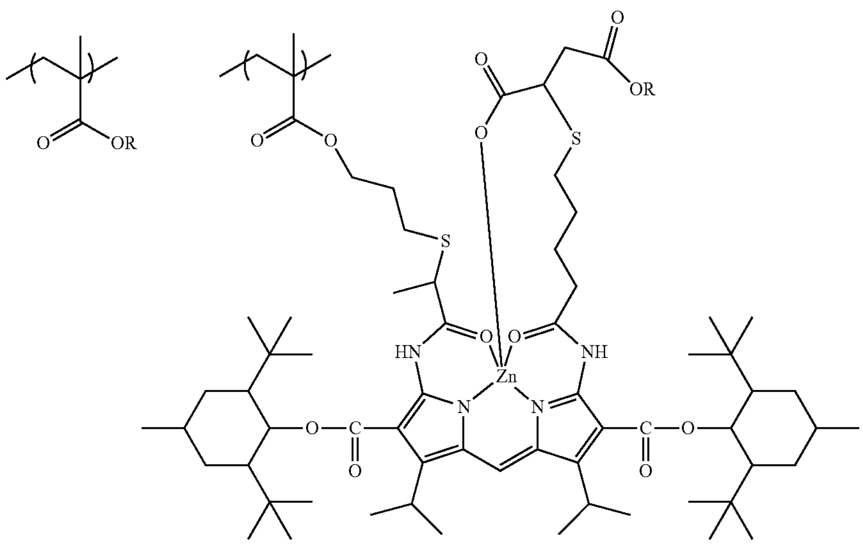

Exemplary Compound 114

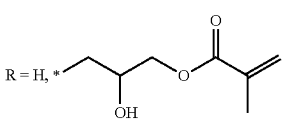 [SMILES: *CC(O)COC(=O)C(=C)C]

11.7 g of Colorant Monomer J-1, 1.58 g of methacrylic acid, 0.56 g of dodecanethiol were dissolved in 75.0 g of propyleneglycol monomethylether acetate (PGMEA). To this solution, while stirring at 85° C., a solution of 23.6 g of Colorant Monomer J-1, 3.16 g of methacrylic acid, 1.11 g of dodecanethiol, and 3.8 g of dimethyl-2,2'-azobis(2-methylpropionate) dissolved in 150 g of propyleneglycol monomethylether acetate (PGMEA), was dropped over 3 hours. 4 hours after the start of the dropping, 1.14 g of dimethyl-2,2'-azobis(2-methylpropionate) was added to this reaction liquid, and then the mixture was further stirred at 85° C. for 2 hours. Thereafter, 811 mL of PGMEA and 1081 mL of methanol were added to the reaction solution, and the reaction liquid was dropped into 4326 mL of acetonitrile while stirring. The precipitated crystal was filtered, and the obtained crystal was dried under reduced pressure, thereby obtaining 13.8 g of Compound J-2.

The structure of Compound J-2 was confirmed by $^{1}$H-NMR by the disappearance of the peak at 5.56-6.12, which corresponds to the polymerizable group moiety of Colorant Monomer J-1, and confirmed by an acid value measurement by confirming the introduction of methacrylic acid.

10.0 g of Compound J-2, 1.14 g of glycidyl methacrylate, 0.21 g of tetrabutylammonium bromide, and 0.01 g of p-methoxyphenol were dissolved in 63.1 g PGMEA, and the mixture was stirred at 100° C. for 5 hours. The resultant was cooled to 30° C. and then dropped into 1200 mL of acetonitrile. The precipitated crystal was filtered, and the obtained crystal was dried under reduced pressure, thereby obtaining 8.8 g of Exemplary Compound 114.

The structure of Exemplary Compound 114 was confirmed by $^{1}$H-NMR by the disappearance of the peak of the polymerizable group moiety of glycidyl methacrylate, and confirmed by an acid value measurement.

Synthetic Example 3

Synthesis of Exemplary Compound 116

Exemplary Compound 116 of colorant multimer having a polymerizable group was synthesized by the method shown below.

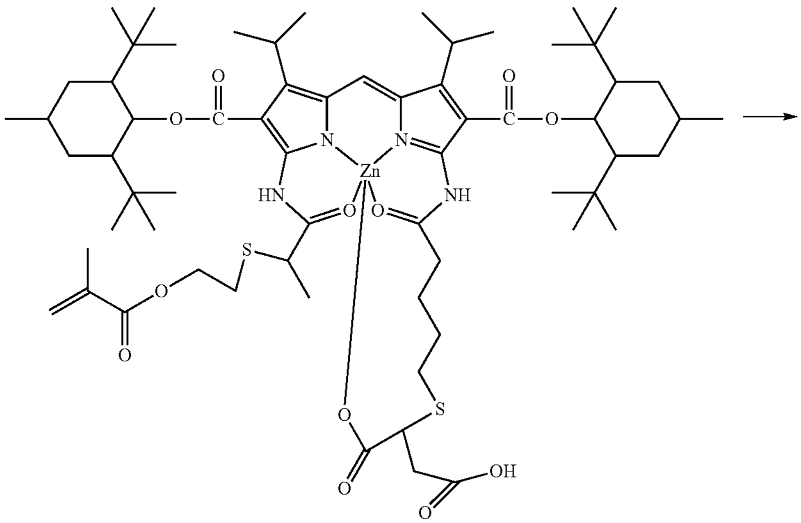
Q-1
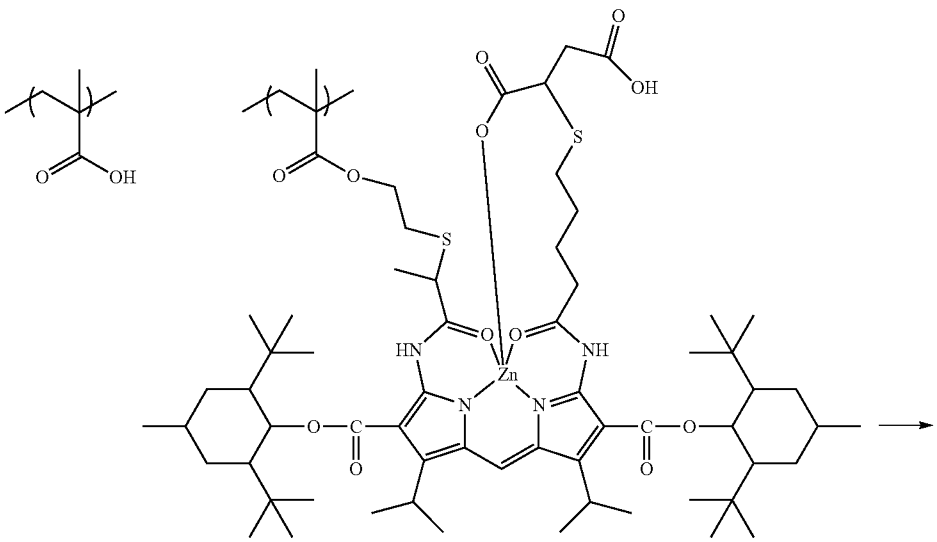
Q-2
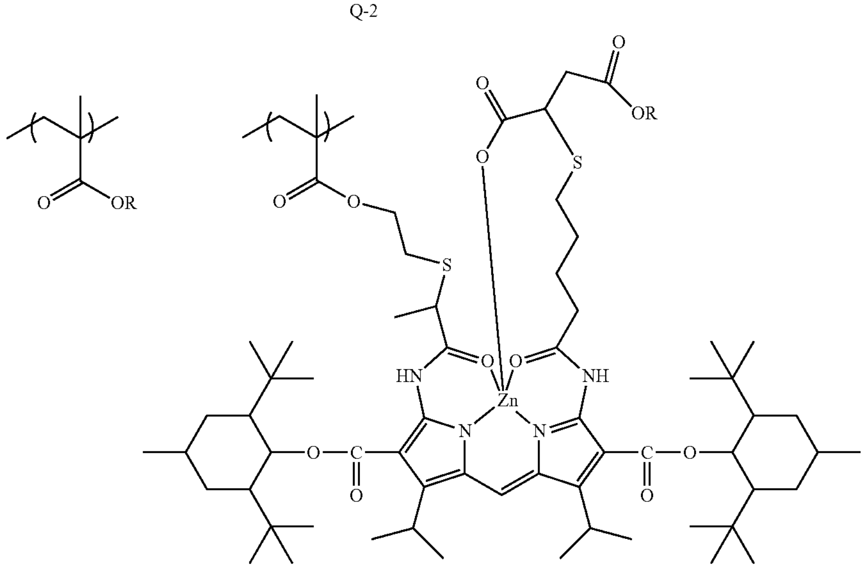
Exemplary Compound 116

-continued

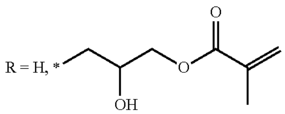 [SMILES: *CC(O)COC(=O)C(=C)C]

Colorant Monomer Q-1 was synthesized in a manner similar to the synthesis of E Colorant Monomer J-1, except that 3-mercapto-1-propanol used in the synthesis of Compound 11, which is an intermediate of Colorant Monomer J-1, was changed to 2-mercapto ethanol. The structure of Q-1 was confirmed by $^1$H-NMR.

Colorant Monomer Q-1: $^1$H-NMR, 400 MHz, δ (DMSO-$d_6$) ppm: 0.91 (36H, s), 1.15 (6H, d), 1.21-2.17 (40H, m), 2.07-3.05 (6H, m), 3.61-3.84 (2H, m), 4.28-4.33 (3H, m), 5.56 (1H, br), 6.01-6.12 (3H, br), 7.78 (1H, s), 11.03 (1H, br), 11.83-12.25 (1H, br).

11.6 g of the obtained Q-1, 1.58 g of methacrylic acid, and 0.56 g of dodecane thiol were dissolved in 75.0 g of PGMEA. To this solution, while stirring at 85° C., a solution of 23.3 g of Q-1, 3.16 g of methacrylic acid, 1.11 g of dodecanethiol, and 3.8 g of dimethyl-2,2'-azobis(2-methylpropionate) dissolved in 150 g of PGMEA, was dropped over 3 hours. 4 hours after the start of the dropping, 1.14 g of dimethyl-2,2'-azobis(2-methylpropionate) was added to this reaction liquid, and the mixture was further stirred at 85° C. for 2 hours. 811 mL of PGMEA and 1081 mL of methanol were added to the reaction solution, and the reaction liquid was dropped into 4326 mL of acetonitrile while stirring. The precipitated crystal was filtered, and the obtained crystal was dried under reduced pressure, thereby obtaining 13.2 g of Compound Q-2.

The structure of Compound Q-2 was confirmed by $^1$H-NMR by the disappearance of the peak at 5.56-6.12, which corresponds to the polymerizable group moiety of Colorant Monomer Q-1, and confirmed by an acid value measurement by confirming the introduction of methacrylic acid.

10.0 g of Compound Q-2, 1.13 g of glycidyl methacrylate, 0.2 g of tetrabutylammonium bromide, and 0.01 g of p-methoxyphenol were dissolved in 63 g PGMEA, and the mixture was stirred at 100° C. for 5 hours. The resultant was cooled to 30° C. and then dropped into 1200 mL of acetonitrile. The precipitated crystal was filtered, and the obtained crystal was dried under reduced pressure, thereby obtaining 8.7 g of Exemplary Compound 116.

The structure of Exemplary Compound 116 was confirmed by $^1$H-NMR by the disappearance of the peak of the polymerizable group moiety of glycidyl methacrylate, and confirmed by an acid value measurement.

Example 3-1

Formation of Colored Pattern Using Colored Curable Composition (1) Preparation of Resist Solution B (Negative-Working Type)

The resist solution B was prepared by mixing and dissolving the following components.

| | |
|---|---|
| propyleneglycol monomethylether acetate | 5.20 parts |
| cyclohexanone | 52.60 parts |
| binder | 30.50 parts |
| (41% cyclohexanone solution of benzyl methacrylate/methacrylic acid/2-hydroxyethyl methacrylate copolymer (molar ratio = 60:20:20), average molecular weight in terms of the equivalent polystyrene molecular weight: 30,200) | |

-continued

| | |
|---|---|
| dipentaerythritol hexaacrylate | 10.20 parts |
| polymerization inhibitor (p-methoxyphenol) | 0.006 parts |
| fluorine-containing surfactant (trade name: F-475; manufactured by DIC Corporation) | 0.80 parts |
| photopolymerization initiator (4-benzoxolane-2,6-bis(trichloromethyl)-s-triazine; trade name: TAZ-107; manufactured by Midori Kagaku Co., Ltd.) | 0.58 parts |

(2) Preparation of Glass Substrate with Undercoat Layer

A glass substrate (trade name: Corning 1737; manufactured by Corning Inc.) was subject to the ultrasonic-cleaning using a 0.5% aqueous NaOH solution, washed with water, and subjected to a dehydration baking treatment (for 20 minute at 200° C.). Subsequently, the resist solution B obtained in item (1) above was coated on the cleaned glass substrate using a spin coater such that the obtained film after drying has a thickness of 2 μm, and then the glass substrate was heated and dried at 220° C. for 1 hour, thereby obtaining a glass substrate with an undercoat layer.

(3) Preparation of Colored Curable Composition

The following components were mixed and dissolved, thereby obtaining a colored curable composition.

| | |
|---|---|
| propyleneglycol monomethylether acetate | 80 parts |
| polymerizable compound: dipentaerythritol hexaacrylate | 14.0 parts |
| polymerization inhibitor: p-methoxy phenol | 0.006 parts |
| fluorine-containing surfactant (trade name: F-475; manufactured by DIC Corporation) | 0.80 parts |
| photopolymerization initiator (trade name: TAZ-107; manufactured by Midori Kagaku Co., Ltd.) | 2.0 parts |
| Exemplary Compound 109 (as 30% by mass solution in propyleneglycol monomethylether acetate) | 4.0 parts |

(4) Formation of Colored Patterns

The colored curable composition obtained in item (3) above was coated on the undercoat layer of the glass substrate obtained in item (2) above using a spin coater such that the obtained film after drying has a thickness of 0.6 μm, and then the film was pre-baked at 100° C. for 120 seconds.

Subsequently, the coated film was irradiated with light having a wavelength of 365 nm through a mask having a pattern with a line width of 2 μm at an exposure dose of 200 mJ/cm' using an exposure machine UX3100-SR (trade name; manufactured by Ushio Inc.). After the exposure, the film was developed with a developer CD-2000 (trade name; manufactured by Fujifilm Electronic Materials Co., Ltd.) under the condition of at 25° C. for 40 seconds. Thereafter, the film was rinsed with running water for 30 seconds, spray dried, and post-baked at 200° C. for 15 minutes.

In this way, a pattern for a red color filter was obtained.

Figure 2:
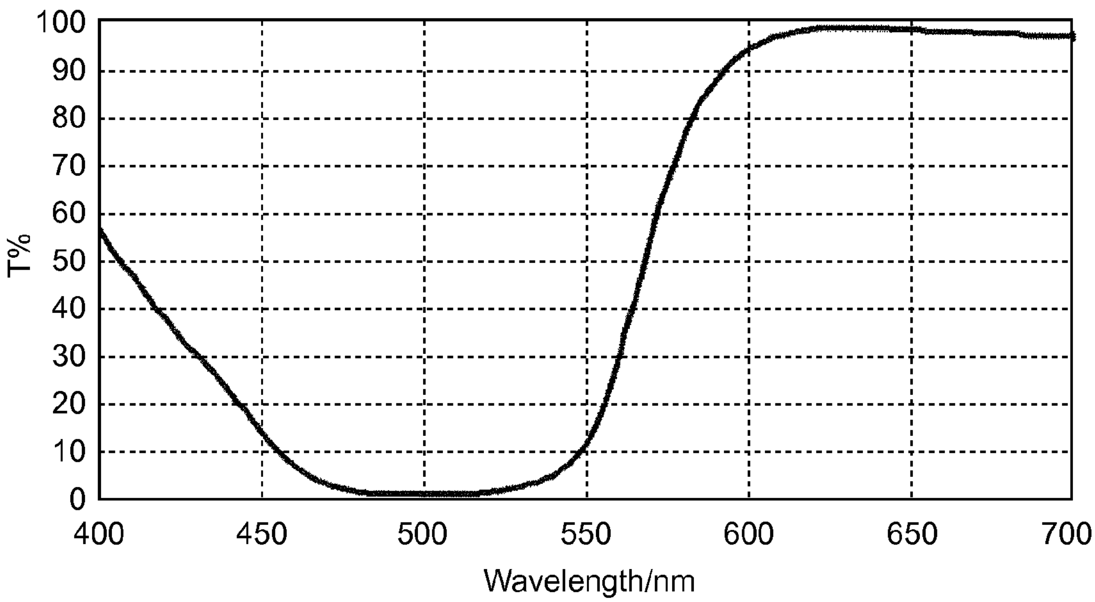
FIG. 2 shoes an example of spectral characteristics of a color filter according to an Example of the second aspect of the present invention.

The transmission spectrum of the prepared red pattern area is shown in FIG. 2.

(5) Evaluation

The storage stability with the passage of time of the colored curable composition prepared above, and the heat resistance, light fastness, solvent resistance and pattern shape of the coated film obtained by applying the colored curable composition on the glass substrate, were evaluated as follows. The evaluation results are shown in the following Table 22.

Storage Stability with the Passage of Time

The colored curable compositions were stored for 1 month at room temperature, and the degree of deposits of foreign matters in the compositions was visually inspected and was evaluated in accordance with the following evaluation criteria.

Evaluation Criteria

A: Deposits were not recognized

B: Deposits were slightly recognized

C: Deposits were recognized

Heat Resistance

The color difference (ΔE*ab value) of the colored curable composition before and after the heating was measured using a colorimeter (trade name: MCPD-1000; manufactured by Otsuka Electronics Co., Ltd.), and an index of the heat resistance was evaluated in accordance with the following evaluation criteria. A smaller ΔE*ab value indicates a better heat resistance. Here, the ΔE*ab value is a value calculated from the following color-difference formula according to CIE 1976 (L*, a*, b*) color space (Color Science Handbook (New edition in 1985); p. 266, edited by the Color Science Association of Japan).

$$\Delta E^*ab=\{(\Delta L^*)^2+(\Delta a^*)^2+(\Delta b^*)^2\}^{1/2}$$

Evaluation Criteria

A: ΔE*ab value is smaller than 3

B: ΔE*ab value is 3 or more and smaller than 5

C: ΔE*ab value is from 5 to 15

D: ΔE*ab value is larger than 15

Light Fastness

A ultraviolet ray cut filter, which cuts off ultraviolet rays of 366 nm or shorter, was placed on the glass substrate on which the colored curable composition was coated, and the coated film was irradiated with light through the ultraviolet ray cut filter using a xenon lamp at an irradiation dose of 100,000 lux for 20 hours (equivalent to 2,000,000 lux·hour). The color difference (ΔE*ab value) of the coated film before and after the xenon lamp irradiation was measured. The color difference (ΔE*ab value) of the coated film before and after the irradiation was measured. The color difference was used as an index of light fastness. A smaller ΔE*ab value indicates a better light fastness. The evaluation criteria are as follows:

Evaluation Criteria

A: ΔE*ab value is smaller than 3

B: ΔE*ab value is 3 or more and smaller than 5

C: ΔE*ab value is from 5 to 12

D: ΔE*ab value is larger than 12

Solvent Resistance

The spectrum of the coated film after the post-baking obtained in item (4) above was measured (spectrum A). On this coated film, the resist solution B obtained in item (1) above was coated such that the obtained film had a thickness of 1 μm, and then the film was pre-baked. Thereafter, the film was developed with a developer CD-2000 (trade name; manufactured by Fujifilm Electronic Materials Co., Ltd.) under the condition of at 23° C. for 120 seconds, and the spectrum was measured again (spectrum B). As an index of solvent resistance, the colorant remaining ratio was calculated based on a difference between the spectrum A and the spectrum B. A value closer to 100% indicates a higher solvent resistance.

Evaluation Criteria

A: Colorant remaining ratio is more than 95%

B: Colorant remaining ratio is more than 90% and 95% or less.

C: Colorant remaining ratio is from 70% to 90%

D: Colorant remaining ratio is less than 70%

Pattern Shape

The developed pattern of the coated film after the post-baking obtained item (4) above was observed under an optical microscope (trade name: digital microscope RX-20; manufactured by Olympus Corporation), and formation of fine pattern was evaluated in accordance with the following evaluation criteria.

Evaluation Criteria

A: Defects at the edge of the pattern were not recognized

B: Fine pattern was formed, but defects at the edge of the pattern were recognized C: Fine pattern was not formed

Examples 3-2 to 3-12

In Examples 3-2 to 3-12, patterns were formed and evaluated in a manner similar to Example 3-1, except that an equal amount of the respective colorants listed in the following Table 22 were used in place of Exemplary Compound 109 in "(3) preparation of colored curable composition" in Example 3-1. The evaluation results are shown in Table 22.

The colorant multimer having a according to the invention had very high solubility in various organic solvents (for example, ethyl lactate, cyclohexanone or the like, which has improved safety) as well as propyleneglycol monomethylether acetate used in Example, and thus were also effective from the viewpoint of work safety and lightening of workload.

Comparative Examples 3-1 and 3-2

In Comparative Examples 3-1 and 3-2, patterns were formed and evaluated in a manner similar to Example 3-1, except that an equal amount of the following Comparative Colorant 3 or Comparative colorant 4 were used in place of Exemplary Compound 109 in "(3) preparation of colored curable composition" in Example 3-1, respectively. The evaluation results are shown in Table 22.

Comparative Colorant 3

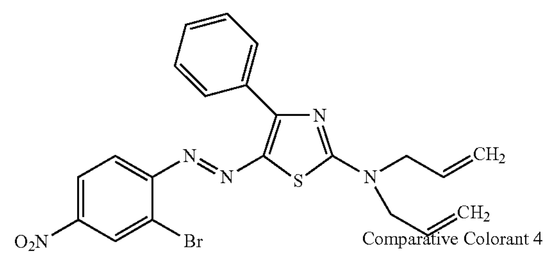

Comparative Colorant 4

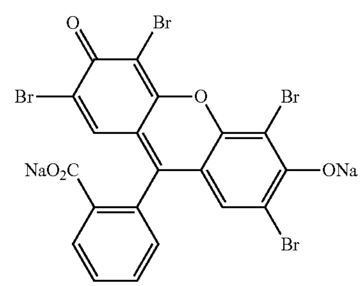

(C.I. Acid Red 87)

TABLE 22

| | Exemplary compound | Storage stability with time | Heat resistance | Light fastness | Solvent resistance | Pattern shape |
|---|---|---|---|---|---|---|
| Example 3-1 | 109 | A | B | B | B | A |
| Example 3-2 | 101 | A | B | B | B | B |
| Example 3-3 | 102 | A | B | B | B | A |
| Example 3-4 | 103 | A | B | B | B | A |

TABLE 22-continued

| | Exemplary compound | Storage stability with time | Heat resis-tance | Light fast-ness | Solvent resis-tance | Pat-tern shape |
|---|---|---|---|---|---|---|
| Example 3-5 | 104 | A | B | B | B | A |
| Example 3-6 | 105 | A | B | B | B | B |
| Example 3-7 | 106 | A | B | B | B | B |
| Example 3-8 | 107 | A | B | B | B | A |
| Example 3-9 | 108 | A | B | B | B | A |
| Example 3-10 | 110 | A | B | B | B | A |
| Example 3-11 | 111 | A | B | B | B | A |
| Example 3-12 | 112 | A | B | B | B | A |
| Comparative Example 3-1 | Comparative Colorant 3 | C | D | C | D | C |
| Comparative Example 3-2 | Comparative Colorant 4 | A | C | D | C | C |

As shown in Table 22, the colored curable compositions in Examples 3-1 to 3-12 according to the invention have excellent storage stability with time, and the films obtained using the colored curable compositions have favorable heat resistance, light fastness, solvent resistance and pattern shape, as compared with the colored curable compositions in Comparative Examples 3-1 and 3-2.

Examples 113 to 126 and Comparative Example 3-13

In Examples 113 to 126, patterns were formed and evaluated in a manner similar to Example 3-1, except that an equal amount of the colorant shown in Table 23 were used in place of Exemplary Compound 109 in "(3) preparation of colored curable composition" in Example 3-1. The evaluation results are shown in Table 23. The structure of the comparative colorant 5 in Table 23 is as follows.

Comparative Colorant 5

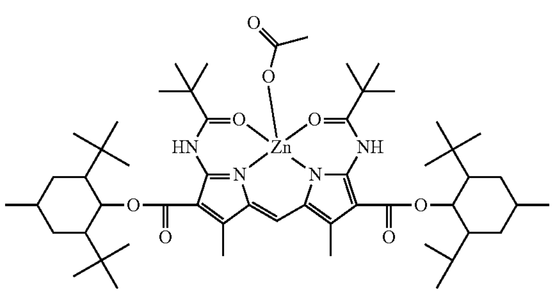

TABLE 23

| | Exemplary compound | Storage stability with time | Heat resis-tance | Light fast-ness | Solvent resis-tance | Pat-tern shape |
|---|---|---|---|---|---|---|
| Example 113 | 113 | A | B | A | B | A |
| Example 114 | 114 | A | B | A | A | A |
| Example 115 | 115 | A | B | A | B | A |
| Example 116 | 116 | A | A | A | A | A |
| Example 117 | 117 | A | B | A | B | B |
| Example 118 | 118 | A | B | A | B | A |
| Example 119 | 119 | A | A | A | A | C |
| Example 120 | 120 | A | B | A | B | B |
| Example 121 | 121 | A | B | B | B | A |
| Example 122 | 122 | A | A | A | B | B |
| Example 123 | 123 | A | B | A | B | B |
| Example 124 | 124 | A | B | B | B | B |
| Example 125 | 125 | A | B | B | B | B |
| Example 126 | 126 | A | B | B | B | B |
| Comparative Example 3-13 | Comparative Colorant 5 | B | C | C | C | C |

As shown in Table 23, the colored curable compositions in Examples 113 to 126 according to the invention have excellent storage stability with time, and the films obtained using the colored curable compositions have favorable heat resistance, light fastness, solvent resistance and pattern shape, as compared with the colored curable compositions in Comparative Example 13.

Examples 3-13 to 3-24, Comparative Examples 3-3 and 3-4, and Examples 3-25 to 3-36, Comparative Examples 3-5 and 3-6

Manufacture of Monochromatic Color Filter

Color filters of Examples 3-13 to 3-24 and Comparative Examples 3-3 and 3-4 were prepared in the following procedures using the colored curable compositions in Examples 3-1 to 3-12 and Comparative Examples 3-1 and 3-2, respectively. The color transfer of the color filters was evaluated. The evaluation results are shown in the following Table 24.

Separately, color filters of Examples 3-25 to 3-36 and Comparative Examples 3-5 and 3-6 were prepared using the colored curable compositions in Examples 3-1 to 3-12 and Comparative Examples 3-1 and 3-2, respectively, similarly to the above, except that the ultraviolet ray irradiation treatment after development was not conducted. The color transfer of the color filters was evaluated. The evaluation results are shown in the following Table 24.

(1) Preparation of Silicon Wafer Substrate with Undercoat Layer

A 6-inch silicon wafer was subjected to heat-treatment at 200° C. for 30 minutes in an oven. Subsequently, on this silicon wafer, the resist solution B prepared in item (1) in Example 3-1 was coated such that the obtained film had a dry film thickness of 1.0 μm, and further dried at 220° C. for 1 hour in an oven to form an undercoat layer, thereby obtaining a silicon wafer substrate with an undercoat layer.

(2) Exposure and Development of Colored Curable Composition

Subsequently, each of the colored curable compositions used in Examples 3-1 to 3-12 and Comparative Examples 3-1 and 3-2 was coated on the undercoat layer of the obtained silicon wafer using a spin coater such that the obtained film had a dry film thickness of 1 μm, and the silicon wafer was pre-baked at 100° C. for 120 seconds to form a colored film thereon. The colored film was exposed through a mask having a 2.0 μm-square pattern arrayed over 4 mm×3 mm area on a substrate at an exposure dose of 200 mJ/cm$^2$ and a illuminance of 1200 mW/cm$^2$ (integrated irradiation illuminance), using an i-line stepper (trade name: FPA-3000i5+; manufactured Canon Inc.) After the exposure, the film was subjected to a paddle development at 23° C. for 60 seconds using a developer CD-2000 (trade name; 60% solution, manufactured by Fujifilm Electronic Materials Co., Ltd.) to form a pattern. The pattern was then rinsed with running water for 20 seconds, and was spray dried. Thereafter, a ultraviolet irradiation treatment after exposure was conducted, in which the entire silicon wafer substrate on which the pattern has been formed was irradiated with ultraviolet rays at an exposure dose of 10000 mJ/cm$^2$ using a high pressure ultraviolet mercury lamp (trade name: UMA-802-HC552FFAL; manufactured by Ushio Inc.). After the irradiation, the substrate on which the pattern has been formed was post-baked at 220° C. for 300 seconds on a hot plate, thereby forming a colored pattern on the silicon wafer. Here, the irradiation illuminance [mW/cm$^2$] of the light at a wavelength of 275 nm or less is 10% with respect to the integral irradiation illuminance of the light over the whole wavelength range of the ultraviolet light.

In this way, monochromatic color filters of Examples 3-13 to 3-24 and Comparative Examples 3-3 and 3-4 were manufactured.

Further, monochromatic color filters of Examples 3-25 to 3-36 and Comparative Examples 3-5 and 3-6 were manufactured similarly to the above, except that the ultraviolet ray irradiation treatment after the development was not conducted.

(3) Evaluation

The color transfer of the color filters manufactured in the above was evaluated in the following manner.

On the surface of the obtained color filter on which colored pattern has been formed, CT-2000L solution (transparent undercoating agent) (trade name; manufacture by Fujifilm Electronic Materials Co., Ltd.) was coated such that the obtained film had a dry film thickness of 1 μm, and the film was dried to form a transparent film. The transparent film was subjected to a heating treatment at 200° C. for 5 minutes. After finishing the heating treatment, the absorbance of the transparent film adjacent to the colored pattern was measured with MCPD-3000 (trade name; manufactured by Otsuka Electronics Co. Ltd.). As an index of color transfer, the ratio (%) of the value of the absorbance of the obtained transparent film to that of the colored pattern measured before the heating was calculated.

Evaluation Criteria

A: The ratio (%) of transfer to adjacent pixel is less than 1%

B: The ratio (%) of color transfer to adjacent pixel is 1% or more and less than 10%

C: The ratio (%) of color transfer to adjacent pixel is 30% or less

D: The ratio (%) of color transfer to adjacent pixel is more than 30%

TABLE 24

| | Exemplary compound | Color transfer (with ultra-violet ray irradiation) | | Exemplary compound | Color transfer (without ultra-violet ray irradiation) |
|---|---|---|---|---|---|
| Example 3-13 | 109 | A | Example 3-25 | 109 | B |
| Example 3-14 | 101 | A | Example 3-26 | 101 | B |
| Example 3-15 | 102 | A | Example 3-27 | 102 | B |
| Example 3-16 | 103 | A | Example 3-28 | 103 | B |
| Example 3-17 | 104 | A | Example 3-29 | 104 | B |
| Example 3-18 | 105 | B | Example 3-30 | 105 | C |
| Example 3-19 | 106 | A | Example 3-31 | 106 | B |
| Example 3-20 | 107 | A | Example 3-32 | 107 | B |
| Example 3-21 | 108 | A | Example 3-33 | 108 | B |
| Example 3-22 | 110 | A | Example 3-34 | 110 | B |
| Example 3-23 | 111 | B | Example 3-35 | 110 | C |
| Example 3-24 | 112 | A | Example 3-36 | 112 | B |
| Comparative Example 3-3 | Comparative Colorant 3 | D | Comparative Example 3-5 | Comparative Colorant 3 | D |
| Comparative Example 3-4 | Comparative Colorant 4 | C | Comparative Example 3-6 | Comparative Colorant 4 | D |

As shown in Table 24, in Examples 3-13 to 3-36 according to the invention, color transfer to an adjacent pixel is suppressed.

Examples 127 to 140, Comparative Example 3-14, and Examples 141 to 154, Comparative Example 3-15

Color filters of Examples 127 to 140 and Comparative Example 3-14 were prepared in a manner similar to Example 3-13 using the colored curable compositions in Examples 113 to 126 and Comparative Example 3-13, respectively. The color transfer of the color filters was evaluated. The evaluation results are shown in the following Table 25.

Separately, color filters of Examples 141 to 154 and Comparative Example 3-15 were prepared using the colored curable compositions in 113 to 126 and Comparative Example 3-13, respectively, similarly to the above, except that the ultraviolet ray irradiation treatment after development was not conducted. The color transfer of the color filters was evaluated. The evaluation results are shown in the following Table 25.

TABLE 25

| | Exemplary compound | Color transfer (with ultra-violet ray irradiation) | | Exemplary compound | Color transfer (without ultra-violet ray irradiation) |
|---|---|---|---|---|---|
| Example 127 | 113 | A | Example 141 | 113 | B |
| Example 128 | 114 | A | Example 142 | 114 | B |
| Example 129 | 115 | A | Example 143 | 115 | B |
| Example 130 | 116 | A | Example 144 | 116 | A |

TABLE 25-continued

| | Exemplary compound | Color transfer (with ultra-violet ray irradiation) | | Exemplary compound | Color transfer (without ultra-violet ray irradiation) |
|---|---|---|---|---|---|
| Example 131 | 117 | A | Example 145 | 117 | B |
| Example 132 | 118 | A | Example 146 | 118 | B |
| Example 133 | 119 | A | Example 147 | 119 | A |
| Example 134 | 120 | A | Example 148 | 120 | B |
| Example 135 | 121 | A | Example 149 | 121 | B |
| Example 136 | 122 | A | Example 150 | 122 | B |
| Example 137 | 123 | A | Example 151 | 123 | B |
| Example 138 | 124 | A | Example 152 | 124 | B |
| Example 139 | 125 | A | Example 153 | 125 | B |
| Example 140 | 126 | A | Example 154 | 126 | B |
| Comparative Example 3-14 | Comparative Colorant 5 | C | Comparative Example 3-15 | Comparative Colorant 5 | D |

As shown in Table 25, in Examples 127 to 154 according to the invention, color transfer to an adjacent pixel is suppressed.

Example 3-37 to 3-48 and Examples 155 to 168

Manufacture of Color Filter for Solid-State Image Sensor (1) Manufacture of Silicon Wafer Substrate with Undercoat Layer A 6-inch silicon wafer was subjected to heat-treatment at 200° C. for 30 minutes in an oven. Subsequently, on this silicon wafer, the resist liquid B prepared by (1) in Example 1 was coated such that the obtained film had a dry film thickness of 1.0 μm. The film was dried at 220° C. for 1 hour in an oven to form an undercoat layer, thereby obtaining a silicon wafer substrate with undercoat layer.

(2) Formation of Pattern on Color Filter for Solid-State Image Sensor

Each of the colored curable compositions used in Examples 3-1 to 3-12 and Examples 113 to 126 was coated on the undercoat layer of the obtained silicon wafer such that the obtained film had a dry film thickness of 0.8 μm to form a photocurable coated film. The silicon wafer was then pre-baked at 100° C. for 120 seconds on a hot plate. The colored film was exposed through a mask having a 0.2 μm-square island-pattern with light at a wavelength of 365 nm at various exposure dose from 100 mJ/cm$^2$ to 2500 mJ/cm$^2$ at an interval of 100 mJ/cm$^2$, using an i-line stepper (trade name: FPA-3000i5+; manufactured Canon Inc.) Thereafter, the silicon wafer, on which the irradiated coated film was formed, was placed on a horizontal rotary table of a spin-shower developing apparatus (trade name: DW-30; manufactured by Chemitronics Co., Ltd.), and subjected to paddle development at 23° C. for 60 seconds using a developer CD-2000 (trade name; 60% solution; manufactured by Fujifilm Electronic Materials Co., Ltd.), thereby forming a colored pattern on the silicon wafer substrate.

The silicon wafer substrate on which the colored pattern was formed was fixed to the horizontal rotary table by a vacuum chuck method. While rotating the silicon wafer substrate by a rotating apparatus at a rotation speed of 50 rpm, a rinsing treatment was conducted by supplying pure water in a shower from an ejection nozzle positioned above the rotational center of the silicone wafer substrate, and then the silicone wafer substrate was spray-dried.

Each of the pattern images obtained using colored curable compositions in Examples 3-1 to 3-12 and Examples 113 to 126 had a square shape and a rectangular cross-sectional profile, which is a favorable pattern profile suitable for solid-state image sensors.

Examples 3-49 to 3-51 and Examples 169 to 172

In Examples 3-49 to 3-51 and Examples 169 to 172, patterns were formed and evaluated in a manner similar to Example 3-1, except that the following oxime photopolymerization initiator (I-1) or (I-2) was used in place of photopolymerization initiator 4-benzoxolane-2,6-bis(trichloromethyl)-s-triazine (trade name: TAZ-107; manufactured by Midori Kagaku Co., Ltd.) in Example 3-1. The evaluation results are shown in Table 26.

(I-1)

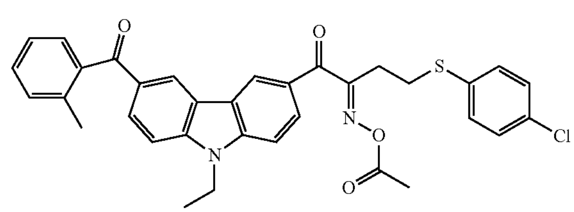

(I-2)

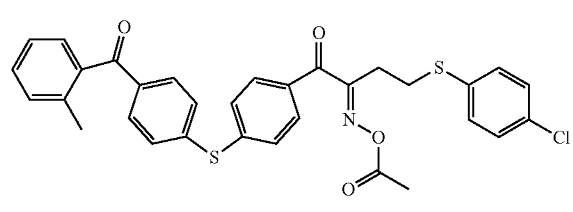

TABLE 26

| | Exemplary compound | photopoly-merization initiator | Storage stability with time | Heat resistance | Light fastness | Solvent resistance | Pattern shape |
|---|---|---|---|---|---|---|---|
| Example 49 | 109 | I-1 | A | A | B | A | A |
| Example 50 | 101 | I-1 | A | A | B | A | A |

TABLE 26-continued

| | Exemplary compound | photopolymerization initiator | Storage stability with time | Heat resistance | Light fastness | Solvent resistance | Pattern shape |
|---|---|---|---|---|---|---|---|
| Example 51 | 101 | I-2 | A | A | A | A | A |
| Example 169 | 114 | I-1 | A | A | A | A | A |
| Example 170 | 114 | I-2 | A | A | A | A | A |
| Example 171 | 116 | I-1 | A | A | A | A | A |
| Example 172 | 116 | I-2 | A | A | A | A | A |

As shown in Table 26, when the oxime photopolymerization initiator is used, heat resistance, light fastness, solvent resistance and pattern shape of the obtained films are improved.

Hereinbelow, the third aspect of the invention is further illustrated below with reference to examples. The materials, reagents, ratio of materials, devices; operation methods in the following examples may be appropriately changed unless departing from the scope of the invention. Therefore, the third aspect of the invention is not limited to these examples. Unless otherwise specified, "%" and "part(s)" are expressed in terms of mass, and the molecular weight is expressed in terms of the weight average molecular weight.

Preparation of Pigment Dispersion P1

10 parts by mass of C. I. Pigment Blue PB 15:6 and 4 parts by mass of SOLSPERSE 24000 GR (dispersion resin) were added to 50 parts by mass of propyleneglycol monomethylether acetate (solvent), and mixed and dispersed using a bead mill (using zirconia beads having a diameter of 0.3 mm) for 3 hours, thereby obtaining a pigment dispersion P1.

Preparation of Pigment Dispersion P2

9.5 parts by mass of C. I. Pigment Blue PB 15:6, 0.5 parts by mass of C.I. Pigment Violet PV23, and 4 parts by mass of SOLSPERSE 24000 GR (dispersion resin) were added to 50 parts by mass of propyleneglycol monomethylether acetate (solvent), and mixed and dispersed using a bead mill (using zirconia beads having a diameter of 0.3 mm) for 3 hours, thereby obtaining a pigment dispersion P2.

Example 4-1

(1) Preparation of Resist Solution C (Negative-Working Type)

The resist solution C was prepared by mixing and dissolving the following components.

| | |
|---|---|
| propyleneglycol monomethylether acetate | 5.20 parts |
| cyclohexanone | 52.6 parts |
| binder<br>(41% cyclohexanone solution of benzyl methacrylate/methacrylic acid/2-hydroxyethyl methacrylate copolymer (molar ratio = 60:20:20), average molecular weight in terms of the equivalent polystyrene molecular weight: 30,200) | 30.5 parts |
| dipentaerythritol hexaacrylate | 10.2 parts |
| polymerization inhibitor (p-methoxyphenol) | 0.006 parts |
| fluorine -containing surfactant (trade name: F-475; manufactured by DIC Corporation) | 0.80 parts |
| photopolymerization initiator (4-benzoxolane-2,6-bis(trichloromethyl)-s-triazine; trade name: TAZ-107; manufactured by Midori Kagaku Co., Ltd.) | 0.58 parts |

(2) Manufacture of Glass Substrate with Undercoat Layer

A glass substrate (trade name: Corning 1737; manufactured by Corning Inc.) was subject to the ultrasonic-cleaning using a 0.5% aqueous NaOH solution, washed with water, and subjected to a dehydration baking treatment (for 20 minute at 200° C.). Subsequently, the resist solution C obtained in item (1) above was coated on the cleaned glass substrate using a spin coater such that the obtained film after drying has a thickness of 2 μm, and then the glass substrate was heated and dried at 220° C. for 1 hour, thereby obtaining a glass substrate with an undercoat layer.

(3) Preparation of Colored Curable Composition

The following components were mixed and dissolved, thereby obtaining a colored curable composition.

| | |
|---|---|
| pigment dispersion P1 or P2 | 150 parts |
| propyleneglycol monomethylether acetate | 80 parts |
| polymerizable compound: dipentaerythritol hexaacrylate | 14.0 parts |
| polymerization inhibitor: p-methoxy phenol | 0.006 parts |
| fluorine-containing surfactant (trade name: F-475; manufactured by DIC Corporation) | 0.80 parts |
| photopolymerization initiator (IRGACURE OXE-01; trade name; manufactured by Ciba Specialty Chemicals Inc.) | 2.0 parts |
| (A) specific resin (Exemplary resins listed in Table 27) | 40.0 parts |

The numbers of (A) the specific resins shown in Table 27 correspond to the numbers of exemplary resins of (A) the specific resins in Table 13.

(4) Exposure and Development (Image Formation) of Colored Curable Composition (4-1) Formation of Coating Film The colored curable composition obtained in item (3) above was coated on the undercoat layer of the glass substrate obtained in item (2) above using a spin coater such that the obtained film had a dry film thickness of 0.6 μm, and then the film was pre-baked at 100° C. for 120 seconds.

(4-2) Formation of Colored Patterns

Subsequently, the coated film was irradiated with light having a wavelength of 365 nm through a mask having a pattern with a line width of 2 μm at an exposure dose of 200 mJ/cm$^2$ using an exposure machine UX3100-SR (trade name; manufactured by Ushio Inc.). After the exposure, the film was developed with a developer CD-2000 (trade name; manufactured by Fujifilm Electronic Materials Co., Ltd.) under the condition of at 25° C. for 40 seconds. Thereafter, the film was rinsed with running water for 30 seconds, spray-dried, and post-baked at 200° C. for 15 minutes.

In this way, a pattern suitable for a red color filter was obtained.

(5) Evaluation

The coating property of the coated film on the glass substrate formed in item (4-1) above, and the pattern shape of the pattern formed in item (4-2) above were evaluated in the following manner. The evaluation results are shown in the following Table 27.

Coating Property

The coating property of the coated film formed in item (4-1) above was evaluated with the naked eye.

Evaluation Criteria

A: Problem was not found on the coated surface

B: Irregularity such as slit or unevenness was found on the coated surface

Pattern Shape

The developed pattern of the coated film after the post-baking obtained in item (4-2) above was observed using an optical microscope (trade name: digital microscope RX-20;

manufactured by Olympus Corporation), and formation of fine pattern was evaluated in accordance with the following evaluation criteria.

Evaluation Criteria

A: Fine pattern was formed

B: Pattern was formed, but the edge of the pattern was not fine

C: Fine pattern was not formed

A: Defects at the edge of the pattern were not recognized

Color Unevenness

The image of the coated film formed in item (4-1) above was obtained using a microscope MX-50 (trade name; manufactured by Olympus Corporation), and analyzed to calculate the ratio (percentage) of pixels that is deviated from the average color density by ±5%. A higher ratio (percentage) of this value indicates a smaller and better color unevenness:

Comparative examples 4-1 and 4-2

In Comparative examples 4-1 and 4-2, evaluation was conducted in a manner similar to the above Examples, except that the specific resins were changed to the following resins (Z-1) and (Z-2), respectively.

(Z-1)

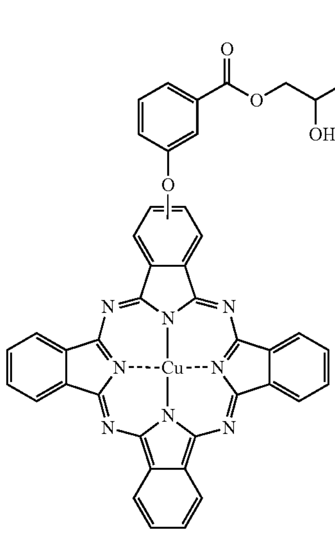

(Z-2)

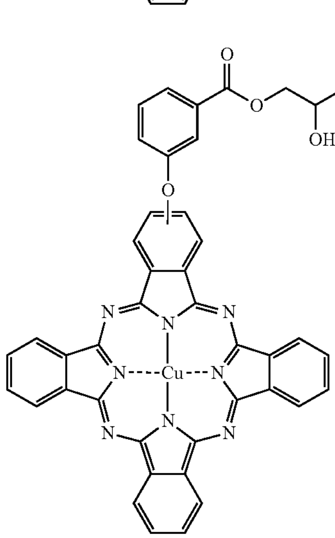

Here, the composition ratio and the molecular weight of the resins (Z-1) and (Z-2) are as follows.

(Z-1): composition ratio (weight ratio) (80/20 from the left); Mw is 18,000

(Z-2): composition ratio (weight ratio) (80/20 from the left); Mw is 17,000

TABLE 27

| Example | (A) Specific resin or comparative resin | Pigment dispersion | Coating property | Pattern shape | Color unevenness |
|---|---|---|---|---|---|
| Example 4-1 | 1 | P1 | A | A | 94 |
| Example 4-2 | 2 | P1 | A | A | 94 |
| Example 4-3 | 3 | P1 | A | A | 93 |
| Example 4-4 | 4 | P1 | A | A | 97 |
| Example 4-5 | 5 | P1 | A | A | 99 |
| Example 4-6 | 6 | P1 | A | A | 99 |
| Example 4-7 | 7 | P2 | A | A | 96 |
| Example 4-8 | 8 | P1 | A | A | 97 |
| Example 4-9 | 9 | P1 | A | A | 96 |
| Example 4-10 | 10 | P2 | A | A | 99 |
| Example 4-11 | 11 | P1 | A | A | 99 |
| Example 4-12 | 12 | P1 | A | A | 99 |
| Example 4-13 | 13 | P1 | A | A | 94 |
| Example 4-14 | 14 | P1 | A | A | 94 |
| Example 4-15 | 15 | P1 | A | A | 99 |
| Example 4-16 | 16 | P1 | A | A | 99 |
| Example 4-17 | 17 | P1 | A | A | 98 |
| Example 4-18 | 18 | P1 | A | A | 99 |
| Example 4-19 | 19 | P1 | A | A | 98 |
| Example 4-20 | 20 | P1 | A | A | 96 |
| Comparative Example 4-1 | Z-1 | P1 | B | C | 90 |
| Comparative Example 4-2 | Z-2 | P1 | B | C | 91 |

As shown in Table 27, it is found that in Examples 4-1 to 4-20, color unevenness is suppressed, and coating property and pattern formability are excellent, as compared with Comparative Examples.

All publications, patent applications, and technical standards mentioned in this specification are herein incorporated by reference to the same extent as if each individual publication, patent application, or technical standard was specifically and individually indicated to be incorporated by reference.

The invention claimed is:

1. A colored curable composition comprising:

(A) a colorant multimer including, as a repeating unit, a constituent unit including a polymerizable group and a constituent unit including a group derived from at least one of an azo colorant or a dipyrromethene colorant; and (B) a polymerizable compound;

wherein the colorant multimer comprises at least two constituent units, each of which is independently represented by the following Formula (A) or (B):

Formula (A)

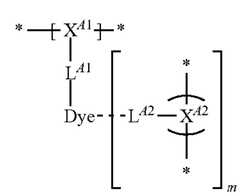

wherein in Formula (A), $X^{A1}$ represents a linking group formed by polymerization;

$L^{A1}$ represents a single bond or a divalent linking group: "Dye" represents a colorant residue formed by removing any one to (m+1) hydrogen atoms from the azo colorant or the dipyrromethene colorant; $X^{A2}$ represents a linking group formed by polymerization; $L^{A2}$ represents a single bond or a divalent linking group; m represents an integer of from 0 to 3; and "Dye" and $L^{A2}$ may be linked to each other by a covalent bond, an ionic bond or a coordinate bond:

Formula (B)

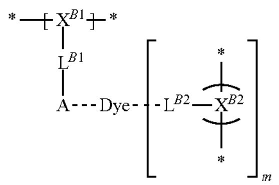

wherein in Formula (B), $X^{B1}$ represents a linking group formed by polymerization; $L^{B1}$ represents a single bond or a divalent linking group; A represents a group that can be bonded to "Dye" via an ionic bond or a coordinate bond; "Dye" represents a colorant residue having a group that can be bonded to A, via an ionic bond or a coordinate bond, on a substituent in the azo colorant or the dipyrromethene colorant; $X^{B2}$ represents a linking group formed by polymerization; $L^{B2}$ represents a single bond or a divalent linking group; m represents an integer of from 0 to 3; and "Dye" and $L^{B2}$ may be linked to each other by a covalent bond, an ionic bond or a coordinate bond;

wherein the dipyrromethene colorant is represented by Formula (a), and the azo colorant is represented by one of Formula (b), (c), (d), (e), or (f):

Formula (a)

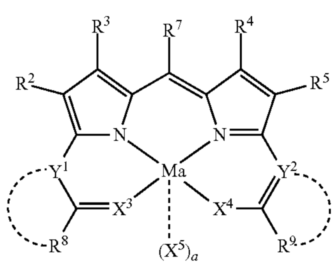

wherein in Formula (a), $R^2$ to $R^5$ each independently represents a hydrogen atom or a monovalent substituent; $R^7$ represents a hydrogen atom, a halogen atom, an alkyl group, an aryl group, or a heterocyclic group; Ma represents a metal or a metal compound; $X^3$ and $X^4$ each independently represents NR, an oxygen atom or a sulfur atom; R represents a hydrogen atom, an alkyl group, an alkenyl group, an aryl group, a heterocyclic group, an acyl group, an alkysulfonyl group, or an arylsulfonyl group; $Y^1$ represents NRc or a nitrogen atom; Rc represents a hydrogen atom, an alkyl group, an alkenyl group, an aryl group, a heterocyclic group, an acyl group, an alkysulfonyl group, or an arylsulfonyl group; $Y^2$ represents a nitrogen atom or a carbon atom; $R^8$ and $R^9$ each independently represents an alkyl group, an alkenyl group, an aryl group, a heterocyclic group, an alkoxy group, an aryloxy group, an alkylamino group, an arylamino group or a heterocyclic amino group; $R^8$ and $Y^1$ may be linked to each other to form a 5-, 6- or 7-membered ring; $R^9$ and $Y^2$ may be linked to each other to form a 5-, 6- or 7-membered ring; $X^5$ represents a group that can be bonded to Ma; and α represents 0, 1, or 2;

Formula (b)

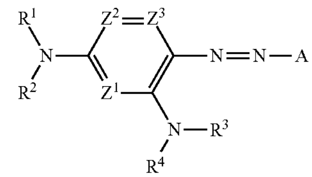

wherein in Formula (b), $R^1$ to $R^4$ each independently represents a hydrogen atom, an alkyl group, an alkenyl group, an aryl group, a heterocyclic group, an acyl group, an alkoxycarbonyl group, an aryloxycarbonyl group, a carbamoyl group, an alkylsulfonyl group or an arylsulfonyl group; A represents an aryl group or an aromatic heterocyclic group; and $Z^1$ to $Z^3$ each independently represents —C($R^5$)= or —N=(wherein $R^5$ represents a hydrogen atom or a substituent);

Formula (c)

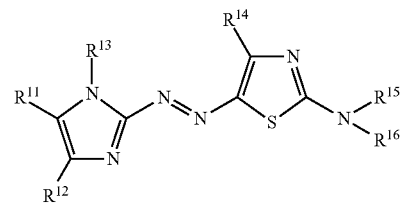

wherein in Formula (c), $R^{11}$ to $R^{16}$ each independently represents a hydrogen atom or a monovalent substituent; $R^{11}$ and $R^{12}$ may be linked to each other to form a ring; and $R^{15}$ and $R^{16}$ may be linked to each other to form a ring;

Formula (d)

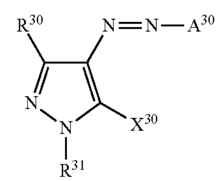

wherein in Formula (d), $R^{30}$ represents a hydrogen atom or a substituent; $R^{31}$ represents a hydrogen atom, an alkyl group, an alkenyl group, an aryl group, a heterocyclic group, an acyl group, an alkoxycarbonyl group or a carbamoyl group; $X^{30}$ represents —OM, or —N($R^{32}$)($R^{33}$), wherein, M represents a hydrogen atom, an alkyl group, or a metal atom or an organic base (cation) required for neutralization of an electric charge; $R^{32}$ and $R^{33}$ each independently represents a hydrogen atom, an alkyl group, an alkenyl group, an aryl group, a heterocyclic group, an acyl group, an alkoxycarbonyl group or a carbamoyl group; and $A^{30}$ represents an aryl group or an aromatic heterocyclic group;

Formula (e)

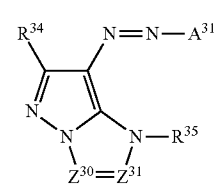

wherein in Formula (e), $R^{34}$ represents a hydrogen atom or a substituent; $R^{35}$ represents a hydrogen atom, an alkyl group, an alkenyl group, an aryl group, a heterocyclic group, an acyl group, an alkoxycarbonyl group or a carbamoyl group; $Z^{30}$ and $Z^{31}$ each independently represents —C($R^{36}$)═ or —N═, wherein $R^{36}$ represents a hydrogen atom or a substituent; and $A^{31}$ represents an aryl group or an aromatic heterocyclic group;

Formula (f)

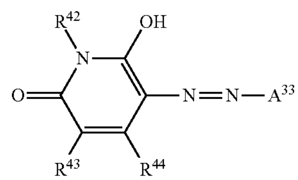

wherein in Formula (f), $R^{42}$ represents a hydrogen atom, an alkyl group, an alkenyl group, an aryl group or a heterocyclic group; $R^{43}$ and $R^{44}$ each independently represents a hydrogen atom or a substituent; and $A^{33}$ represents an aryl group or an aromatic heterocyclic group.

2. The colored curable composition according to claim 1, wherein the polymerizable group is an ethylenically unsaturated group.

3. The colored curable composition according to claim 1, further comprising (C) a polymerization initiator and (D) a solvent.

4. The colored curable composition according to claim 3, wherein the (C) polymerization initiator comprises an oxime compound.

5. A color resist comprising the colored curable composition according to claim 1, which is used for forming a color pixel by a photolithographic method.

6. A color filter formed by using the colored curable composition according to claim 1.

7. A solid-state image sensor having the color filter according to claim 6.

8. An image display device having the color filter according to claim 6.

9. A method of manufacturing a color filter, comprising:

forming a colored layer by coating the colored curable composition according to claim 1 on a support;

exposing the colored layer in a pattern-wise manner through a mask to form a latent image; and developing the colored layer having the latent image therein to form a pattern.

10. The method of manufacturing a color filter according to claim 9, further comprising irradiating the formed pattern after the development with ultraviolet rays.

11. The colored curable composition according to claim 1, wherein the at least one of an azo colorant or a dipyrromethene colorant comprises a dipyrromethene colorant.

12. The colored curable composition according to claim 1, wherein the colorant multimer is formed by polymerization of at least a compound in which a polymerizable group, other than the polymerizable group contained in the colorant multimer, is attached to any one of $R^3$, $R^4$, $R^8$ or $R^9$ in the dypyrromethene colorant represented by Formula (a), and the polymerizable group other than the polymerizable group contained in the colorant multimer is consumed during the polymerization.

* * * * *